US012507587B2

(12) United States Patent
Lee et al.

(10) Patent No.: US 12,507,587 B2
(45) Date of Patent: Dec. 23, 2025

(54) ORGANIC ELECTROLUMINESCENT DEVICE

(71) Applicant: ROHM AND HAAS ELECTRONIC MATERIALS KOREA LTD., Chungcheongnam-do (KR)

(72) Inventors: Dong-Hyung Lee, Gyeonggi-do (KR); Hyun-Woo Kang, Gyeonggi-do (KR); Kyung-Hoon Choi, Gyeonggi-do (KR); Hong-Se Oh, Gyeonggi-do (KR); So-Mi Park, Gyeonggi-do (KR); Doo-Hyeon Moon, Gyeonggi-do (KR); Du-Yong Park, Gyeonggi-do (KR); Hyun-Ju Kang, Gyeonggi-do (KR)

(73) Assignee: DuPont Specialty Materials Korea Ltd. (KR)

( * ) Notice: Subject to any disclaimer, the term of this patent is extended or adjusted under 35 U.S.C. 154(b) by 723 days.

(21) Appl. No.: 17/501,634

(22) Filed: Oct. 14, 2021

(65) Prior Publication Data

US 2022/0231228 A1 Jul. 21, 2022

(30) Foreign Application Priority Data

Oct. 27, 2020 (KR) ........................ 10-2020-0140445

(51) Int. Cl.

*H10K 85/60* (2023.01)
*H10K 50/11* (2023.01)
*H10K 50/15* (2023.01)

(52) U.S. Cl.

CPC ......... *H10K 85/622* (2023.02); *H10K 85/624* (2023.02); *H10K 85/626* (2023.02); *H10K 85/633* (2023.02); *H10K 85/636* (2023.02); *H10K 85/654* (2023.02); *H10K 85/6572* (2023.02); *H10K 85/6574* (2023.02); *H10K 85/6576* (2023.02); *H10K 50/11* (2023.02); *H10K 50/15* (2023.02)

(58) Field of Classification Search

None

See application file for complete search history.

(56) References Cited

U.S. PATENT DOCUMENTS

| | | | |
|---|---|---|---|
| 2018/0351113 A1 | 12/2018 | Ahn | |
| 2020/0013965 A1 | 1/2020 | Yang et al. | |
| 2021/0151693 A1 | 5/2021 | Lee et al. | |
| 2022/0238811 A1* | 7/2022 | Park | H10K 85/615 |

FOREIGN PATENT DOCUMENTS

| | | |
|---|---|---|
| KR | 20190122078 A | 10/2019 |
| WO | 2020045976 A | 3/2020 |

OTHER PUBLICATIONS

Request for the Submission of an Opinion issued from Korea Intellectual Property Office for Korea Patent Application No. 10-2020-0140445; Application Date: Oct. 27, 2020.

* cited by examiner

*Primary Examiner* — Robert S Loewe
(74) *Attorney, Agent, or Firm* — G. Creston Campbell

(57) ABSTRACT

The present disclosure relates to an organic electroluminescent device comprising a light-emitting layer and a hole transport zone. By comprising a combination of the specific light-emitting layer and the specific hole transport zone according to the present disclosure, it is possible to produce an organic electroluminescent device having improved driving voltage, luminous efficiency, and/or lifespan characteristics.

5 Claims, No Drawings

ORGANIC ELECTROLUMINESCENT DEVICE

TECHNICAL FIELD

The present disclosure relates to an organic electroluminescent device comprising a light-emitting layer and a hole transport zone.

BACKGROUND ART

A small molecular green organic electroluminescent device (OLED) was first developed by Tang, et al., of Eastman Kodak in 1987 by using TPD/Alq3 bi-layer consisting of a light-emitting layer and a charge transport layer. Thereafter, the development of OLEDs was rapidly effected and OLEDs have been commercialized. At present, OLEDs primarily use phosphorescent materials having excellent luminous efficiency in panel implementation. An OLED having high luminous efficiency, low driving voltage and/or long lifespan is required for long time use and high resolution of a display.

In order to enhance luminous efficiency, driving voltage and/or lifespan, various materials or concepts for an organic layer of an organic electroluminescent device have been proposed. However, they were not satisfactory in practical use. Therefore, it is required to develop OLEDs having more improved performance, such as improved driving voltage, luminous efficiency, power efficiency, and/or lifespan characteristics, compared to the OLEDs previously disclosed.

Meanwhile, Korean Patent Application Laying-Open No. 2019-0122078 discloses an organic electroluminescent device comprising a compound in which a substituted amino is linked to a benzofluorene moiety in a hole transport zone, and Korean Patent Application Laying-Open No. 2020-0026079 discloses an organic electroluminescent device comprising a plurality of host materials including a compound of a phenanthrene moiety fused with a 5-membered ring and a substituted nitrogen-containing heteroaryl compound, but fail to specifically disclose a specific combination of a hole transport zone compound and a plurality of host materials.

DISCLOSURE OF INVENTION

Technical Problem

An objective of the present disclosure is to provide an organic electroluminescent device having a low driving voltage, high luminous efficiency, high power efficiency, and/or excellent lifespan characteristics by comprising a light-emitting layer and a hole transport zone in which a specific combination of compounds is included.

Solution to Problem

As a result of intensive research to solve the above technical problems, the present inventors found that the above objective can be achieved by an organic electroluminescent device comprising a first electrode; a second electrode facing the first electrode; a light-emitting layer between the first electrode and the second electrode; and a hole transport zone between the first electrode and the light-emitting layer, wherein the hole transport zone comprises the compound represented by the following formula 1 and the light-emitting layer comprises the compound represented by the following formula 2, and an organic electroluminescent device comprising a first electrode; a second electrode facing the first electrode; a light-emitting layer between the first electrode and the second electrode; and a hole transport zone between the first electrode and the light-emitting layer, wherein the hole transport zone comprises the compound represented by the following formula 1, and the light-emitting layer comprises a plurality of host materials containing the first host material comprising the compound represented by the following formula 3 and the second host material comprising the compound represented by the following formula 4.

(1)

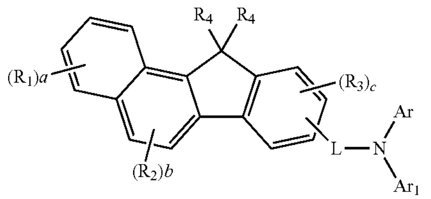

In formula 1, $Ar_1$ and $Ar_2$ each independently represent hydrogen, deuterium, a substituted or unsubstituted (C1-C30)alkyl, a substituted or unsubstituted (C6-C30)aryl, a substituted or unsubstituted (3- to 30-membered)heteroaryl, or $-L_b-N(Ar_a(Ar_b)$, or $Ar_1$ and $Ar_2$ may be linked to each other to form a ring(s), with the proviso that when $Ar_1$ or $Ar_2$ is a (3- to 30-membered)heteroaryl, a carbazole is excluded therefrom;

L represents a single bond, a substituted or unsubstituted (C6-C30)arylene, or a substituted or unsubstituted (3- to 30-membered)heteroarylene;

$R_1$ to $R_3$ each independently represent hydrogen, deuterium, a halogen, a cyano, a substituted or unsubstituted (C1-C30)alkyl, a substituted or unsubstituted (C6-C30) aryl, a substituted or unsubstituted (3- to 30-membered) heteroaryl, a substituted or unsubstituted (C3-C30) cycloalkyl, a substituted or unsubstituted (C1-C30) alkoxy, a substituted or unsubstituted tri(C1-C30) alkylsilyl, a substituted or unsubstituted di(C1-C30) alkyl(C6-C30)arylsilyl, a substituted or unsubstituted (C1-C30)alkyldi(C6-C30)arylsilyl, a substituted or unsubstituted tri(C6-C30)arylsilyl, or $L_b-N(Ar_a)(Ar_b)$;

$R_4$ and $R_5$ each independently represent a substituted or unsubstituted (C1-C30)alkyl, or a substituted or unsubstituted (C6-C30)aryl; and a represents an integer of 1 to 4, b represents an integer of 1 or 2, c represents an integer of 1 to 3, and where if a, b, and c are an integer of 2 or more, each of $R_1$, each of $R_2$, and each of $R_3$ may be the same or different;

(2)

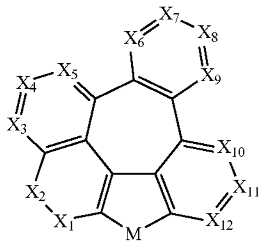

in formula 2,

M represents

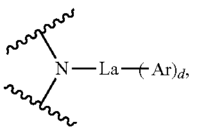

O, or S;

$X_1$ to $X_{12}$ each independently represent N or $CR_6$;

La represents a single bond, a substituted or unsubstituted (C1-C30)alkylene, a substituted or unsubstituted (C6-C30)arylene, a substituted or unsubstituted (3- to 30-membered)heteroarylene, or a substituted or unsubstituted (C3-C30)cycloalkylene;

Ar each independently represents a substituted or unsubstituted pyridyl, a substituted or unsubstituted pyrimidinyl, a substituted or unsubstituted triazinyl, a substituted or unsubstituted quinazolinyl, or a substituted or unsubstituted quinoxalinyl;

$R_6$ each independently represents hydrogen, deuterium, a halogen, a cyano, a substituted or unsubstituted (C1-C30)alkyl, a substituted or unsubstituted (C6-C30)aryl, a substituted or unsubstituted (3- to 30-membered) heteroaryl, a substituted or unsubstituted (C3-C30) cycloalkyl, a substituted or unsubstituted (C1-C30) alkoxy, a substituted or unsubstituted tri(C1-C30) alkylsilyl, a substituted or unsubstituted di(C1-C30) alkyl(C6-C30)arylsilyl, a substituted or unsubstituted (C1-C30)alkyldi(C6-C30)arylsilyl, a substituted or unsubstituted tri(C6-C30)arylsilyl, or $L_b$-N($Ar_a$)($Ar_b$); or may be linked to an adjacent substituent(s) to form a ring(s); and d represents an integer of 1 or 2, and where if d is an integer of 2, each of Ar may be the same or different;

in formulas 1 and 2, $L_b$ each independently represents a single bond, a substituted or unsubstituted (C6-C30)arylene, or a substituted or unsubstituted (3- to 30-membered)heteroarylene; and $Ar_a$ and $Ar_b$ each independently represent hydrogen, a substituted or unsubstituted (C1-C30)alkyl, a substituted or unsubstituted (C2-C30)alkenyl, a substituted or unsubstituted fused ring group of a (C3-C30) aliphatic ring(s) and a (C6-C30) aromatic ring(s), a substituted or unsubstituted (C6-C30)aryl, or a substituted or unsubstituted (3- to 30-membered)heteroaryl.

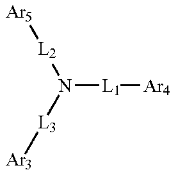

(3)

In formula 3, $L_1$ to $L_a$ each independently represent a single bond, a substituted or unsubstituted (C1-C30)alkylene, a substituted or unsubstituted (C6-C30)arylene, a substituted or unsubstituted (3- to 30-membered)heteroarylene, or a substituted or unsubstituted (C3-C30)cycloalkylene;

$Ar_3$ to $Ar_5$ each independently represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted fused ring group of a (C3-C30) aliphatic ring(s) and a (C6-C30) aromatic ring(s), or $L_b$-N($Ar_a$)($Ar_b$); and with a proviso that the case where all of $L_1$ to $L_3$ are single bonds, and all of $Ar_3$ to $Ar_5$ are hydrogen is excluded;

$$HAr\text{-}(L_4Ar_6)_e \quad (4)$$

in formula 4,

HAr represents a substituted or unsubstituted, nitrogen-containing (3- to 20-membered)heteroaryl;

$L_4$ represents a single bond, or a substituted or unsubstituted (C6-C30)arylene; and $Ar_6$ represents a substituted or unsubstituted (C6-C30) aryl, or any one selected from the following formulas 5 to 7;

(5)

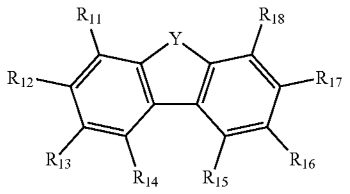

(6)

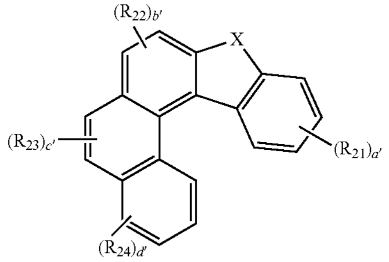

(7)

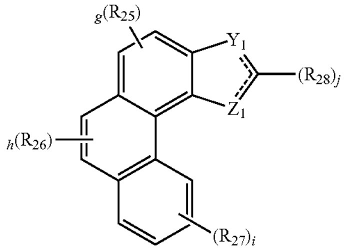

Y represents O, S, N—* or $NR_7$;

X represents O, S, or $CR_8R_9$;

$Y_1$ and $Z_1$ each independently represent —N═, —$NR_{10}$—, —O— or —S—, with a proviso that any one of $Y_1$ and $Z_1$ represents —N═, and the other of $Y_1$ and $Z_1$ represents —$NR_{10}$—, —O— or —S—;

$R_7$ and $R_{10}$ each independently represent a substituted or unsubstituted (C6-C30)aryl;

$R_8$ and $R_9$ each independently represent a substituted or unsubstituted (C1-C30)alkyl, or a substituted or unsubstituted (C6-C30)aryl;

$R_{11}$ to $R_{18}$ and $R_{21}$ to $R_{27}$ each independently represent the position linked to $L_4$; or represent hydrogen, deuterium, a halogen, a cyano, a substituted or unsubstituted (C1-C30)alkyl, a substituted or unsubstituted (C6-C30) aryl, a substituted or unsubstituted (3- to 30-membered) heteroaryl, a substituted or unsubstituted (C3-C30) cycloalkyl, a substituted or unsubstituted (C1-C30) alkoxy, a substituted or unsubstituted tri(C1-C30) alkylsilyl, a substituted or unsubstituted di(C1-C30) alkyl(C6-C30)arylsilyl, a substituted or unsubstituted (C1-C30)alkyldi(C6-C30)arylsilyl, a substituted or unsubstituted tri(C6-C30)arylsilyl, or $L_b$-N($Ar_a$)($Ar_b$); or may be linked to an adjacent substituent(s) to form a ring(s);

$R_{28}$ represents a substituted or unsubstituted (C6-C30) aryl, or a substituted or unsubstituted (3- to 30-membered)heteroaryl;

f represents 1, a', d' and i each independently represent an integer of 1 to 4, b', c', g and h each independently represent an integer of 1 to 2, e represents an integer of 1 to 3, and where if a', b', c', d', e and g to i are an integer of 2 or more, each of $R_{21}$ to each of $R_{27}$ and each of ($L_4$-$Ar_6$) may be the same as or different from each other; and

* represents the position linked to $L_4$;

in formulas 1, 3 and 4, $L_b$ each independently represents a single bond, a substituted or unsubstituted (C6-C30)arylene, or a substituted or unsubstituted (3- to 30-membered)heteroarylene; and $Ar_a$ and $Ar_b$ each independently represent hydrogen, a substituted or unsubstituted (C1-C30)alkyl, a substituted or unsubstituted (C2-C30)alkenyl, a substituted or unsubstituted fused ring group of a (C3-C30) aliphatic ring(s) and a (C6-C30) aromatic ring(s), a substituted or unsubstituted (C6-C30)aryl, or a substituted or unsubstituted (3- to 30-membered)heteroaryl.

Advantageous Effects of Invention

According to the present disclosure, an organic electroluminescent device having excellent driving voltage, luminous efficiency, and/or lifespan characteristics is provided, and a display system or a lighting system can be manufactured using the organic electroluminescent device.

MODE FOR THE INVENTION

Hereinafter, the present disclosure will be described in detail. However, the following description is intended to explain the present disclosure, and is not meant to restrict the scope of the present disclosure.

The term "organic electroluminescent compound" in the present disclosure means a compound that may be used in an organic electroluminescent device. The organic electroluminescent compound may be comprised in any layer constituting an organic electroluminescent device, as necessary.

The term "organic electroluminescent material" in the present disclosure means a material that may be used in an organic electroluminescent device, and may comprise at least one compound. The organic electroluminescent material may be comprised in any layer constituting an organic electroluminescent device, as necessary. For example, the organic electroluminescent material may be a hole injection material, a hole transport material, a hole auxiliary material, a light-emitting auxiliary material, an electron blocking material, a light-emitting material (including a host material and a dopant material), an electron buffer material, a hole blocking material, an electron transport material, an electron injection material, etc.

The term "a plurality of organic electroluminescent materials" in the present disclosure means an organic electroluminescent material comprising a combination of at least two compounds, which may be comprised in any layer constituting an organic electroluminescent device. It may mean both a material before being comprised in an organic electroluminescent device (for example, before vapor deposition) and a material after being comprised in an organic electroluminescent device (for example, after vapor deposition). For example, a plurality of organic electroluminescent materials may be a combination of at least two compounds, which may be comprised in at least one layer of a hole injection layer, a hole transport layer, a hole auxiliary layer, a light-emitting auxiliary layer, an electron blocking layer, a light-emitting layer, an electron buffer layer, a hole blocking layer, an electron transport layer, and an electron injection layer. Such at least two compounds may be comprised in the same layer or different layers, and may be mixture-evaporated or co-evaporated, or may be individually evaporated.

The term "a plurality of host materials" in the present disclosure means an organic electroluminescent material comprising a combination of at least two host materials. It may mean both a material before being comprised in an organic electroluminescent device (for example, before vapor deposition) and a material after being comprised in an organic electroluminescent device (for example, after vapor deposition). A plurality of host materials of the present disclosure may be comprised in any light-emitting layer constituting an organic electroluminescent device, and at least two compounds comprised in the plurality of host materials of the present disclosure may be comprised together in one light-emitting layer or may respectively be comprised in different light-emitting layers. When at least two host materials are comprised in one layer, for example, they may be mixture-evaporated to form a layer, or may be separately co-evaporated at the same time to form a layer.

An organic electroluminescent device according to the present disclosure comprises a first electrode; a second electrode facing the first electrode; and a light-emitting layer between the first electrode and the second electrode, and may comprise a hole transport zone between the first electrode and the light-emitting layer, and may comprise an electron transport zone between the light-emitting layer and the second electrode. One of the first electrode and the second electrode may be an anode, and the other may be a cathode.

The hole transport zone means a region in which holes move between a first electrode and a light emitting layer. For example, the hole transport zone may comprise at least one of a hole injection layer, a hole transport layer, a hole auxiliary layer, a light-emitting auxiliary layer, and an electron blocking layer. The hole injection layer, the hole transport layer, the hole auxiliary layer, the light-emitting auxiliary layer, and the electron blocking layer may each be a single layer or a multi-layer in which two or more layers are stacked. According to one embodiment of the present disclosure, the hole transport zone may comprise a first hole transport layer and a second hole transport layer. The second hole transport layer may be at least one of a plurality of hole transport layers, and may comprise at least one of a hole auxiliary layer, a light-emitting auxiliary layer, and an electron blocking layer. In addition, according to another embodiment of the present disclosure, the hole transport zone may comprise a first hole transport layer and a second hole transport layer, wherein the first hole transport layer may be placed between a first electrode and a light-emitting layer, the second hole transport layer may be placed between the first hole transport layer and the light-emitting layer, and the second hole transport layer may be a layer serving as a hole transport layer, a light-emitting auxiliary layer, a hole auxiliary layer, and/or an electron blocking layer. In addition, the hole injection layer may be doped with a p-dopant.

The hole transport layer is placed between an anode (or a hole injection layer) and a light-emitting layer, allows the holes transported from the anode to smoothly move to the light emitting layer, and blocks electrons transported from a cathode to stay in the light-emitting layer. The light-emitting auxiliary layer may be a layer positioned between an anode and a light-emitting layer, or between a cathode and a light-emitting layer. When the light-emitting auxiliary layer is positioned between the anode and the light-emitting layer, it may be used to facilitate the injection and/or transportation of holes or blocking the overflow of electrons. When the light-emitting auxiliary layer is positioned between the cathode and the light-emitting layer, it may also be used to facilitate the injection and/or transportation of electrons or blocking an overflow of holes. In addition, the hole auxiliary layer is placed between the hole transport layer (or the hole injection layer) and the light-emitting layer, and can exhibit an effect of facilitating or blocking the transport rate (or injection rate) of holes, thereby controlling charge balance. In addition, the electron blocking layer is positioned between the hole transport layer (or the hole injection layer) and the light-emitting layer, and blocks overflow of electrons from the light-emitting layer to confine excitons in the light-emitting layer, thereby preventing light-emitting leakage. When an organic electroluminescent device includes two or more hole transport layers, the hole transport layer further included may be used as a light-emitting auxiliary layer, a hole auxiliary layer, or an electron blocking layer. The light-emitting auxiliary layer, the hole auxiliary layer, and/or the electron blocking layer may have an effect of improving luminous efficiency and/or lifespan of an organic electroluminescent device.

The electron transport zone is placed between a light-emitting layer and a cathode, wherein the electron transport zone may comprise at least one of an electron buffer layer, a hole blocking layer, an electron transport layer, and an electron injection layer. The electron buffer layer is a layer that can improve a problem that the current characteristics in the device are changed when exposed to high temperature in the panel manufacturing process, which can cause the problem of deformation of light-emitting luminance, and can control the flow characteristics of charges. The electron buffer layer may be a multi-layer for the purpose of controlling the electron injection and improving interfacial properties between the light-emitting layer and the electron injection layer, and each layer may comprise two compounds simultaneously. The hole blocking layer or the electron transport layer may be a multi-layer, and a plurality of compounds may be used for each layer. In addition, the electron injection layer may be doped with an n-dopant.

Herein, the term "(C1-C30)alkyl" in the present disclosure is meant to be a linear or branched alkyl having 1 to 30 carbon atoms constituting the chain, in which the number of carbon atoms is preferably 1 to 20, and more preferably 1 to 10. The above alkyl may include methyl, ethyl, n-propyl, isopropyl, n-butyl, isobutyl, tert-butyl, sec-butyl, etc. The term "(C2-C30)alkenyl" in the present disclosure is meant to be a linear or branched alkenyl having 2 to 30 carbon atoms constituting the chain, in which the number of carbon atoms is preferably 2 to 20, and more preferably 2 to 10. The above alkenyl may include vinyl, 1-propenyl, 2-propenyl, 1-butenyl, 2-butenyl, 3-butenyl, 2-methylbut-2-enyl, etc. The term "(C2-C30)alkynyl" in the present disclosure is meant to be a linear or branched alkynyl having 2 to 30 carbon atoms constituting the chain, in which the number of carbon atoms is preferably 2 to 20, and more preferably 2 to 10. The above alkynyl may include ethynyl, 1-propynyl, 2-propynyl, 1-butynyl, 2-butynyl, 3-butynyl, 1-methylpent-2-ynyl, etc. The term "(C3-C30)cycloalkyl" is meant to be a mono- or polycyclic hydrocarbon having 3 to 30 ring backbone carbon atoms, in which the number of carbon atoms is preferably 3 to 20, and more preferably 3 to 7. The above cycloalkyl may include cyclopropyl, cyclobutyl, cyclopentyl, cyclohexyl, cyclopentylmethyl, cyclohexylmethyl, etc. The term "(3- to 7-membered)heterocycloalkyl" in the present disclosure is meant to be a cycloalkyl having 3 to 7, preferably 5 to 7 ring backbone atoms, and including at least one heteroatom selected from the group consisting of B, N, O, S, Si, and P, preferably at least one heteroatom selected from the group consisting of O, S, and N. The above heterocycloalkyl may include tetrahydrofuran, pyrrolidine, thiolane, tetrahydropyran, etc. The term "(C6-C30)aryl(ene)" in the present disclosure is meant to be a monocyclic or fused ring radical derived from an aromatic hydrocarbon having 6 to 30 ring backbone carbon atoms, and may be partially saturated. The number of ring backbone carbon atoms is preferably 6 to 25, and more preferably 6 to 18. The above aryl may comprise a spiro structure. The above aryl may include phenyl, biphenyl, terphenyl, naphthyl, binaphthyl, phenylnaphthyl, naphthylphenyl, phenylterphenyl, fluorenyl, phenylfluorenyl, benzofluorenyl, dibenzofluorenyl, phenanthrenyl, phenylphenanthrenyl, anthracenyl, indenyl, triphenylenyl, pyrenyl, tetracenyl, perylenyl, chrysenyl, naphthacenyl, fluoranthenyl, spirobifluorenyl, azulenyl, tetramethyldihydrophenanthrenyl, etc. Specifically, the aryl may include phenyl, 1-naphthyl, 2-naphthyl, 1-anthryl, 2-anthryl, 9-anthryl, benzanthryl, 1-phenanthryl, 2-phenanthryl, 3-phenanthryl, 4-phenanthryl, 9-phenanthryl, naphthacenyl, pyrenyl, 1-chrysenyl, 2-chrysenyl, 3-chrysenyl, 4-chrysenyl, 5-chrysenyl, 6-chrysenyl, benzo[c]phenanthryl, benzo[g]chrysenyl, 1-triphenylenyl, 2-triphenylenyl, 3-triphenylenyl, 4-triphenylenyl, 1-fluorenyl, 2-fluorenyl, 3-fluorenyl, 4-fluorenyl, 9-fluorenyl, benzo[a]fluorenyl, benzo[b]fluorenyl, benzo[c]fluorenyl, dibenzofluorenyl, 2-biphenylyl, 3-biphenylyl, 4-biphenylyl, o-terphenyl, m-terphenyl-4-yl, m-terphenyl-3-yl, m-terphenyl-2-yl, p-terphenyl-4-yl, p-terphenyl-3-yl, p-terphenyl-2-yl, M-quaterphenyl, 3-fluoranthenyl, 4-fluoranthenyl, 8-fluoranthenyl, 9-fluoranthenyl, benzofluoranthenyl, o-tolyl, m-tolyl, p-tolyl, 2,3-xylyl, 3,4-xylyl, 2,5-xylyl, mesityl, o-cumenyl, m-cumenyl, p-cumenyl, p-tert-butylphenyl, p-(2-phenylpropyl)phenyl, 4'-methylbiphenylyl, 438-tert-butyl-p-terphenyl-4-yl, 9,9-dimethyl-1-fluorenyl, 9,9-dimethyl-2-fluorenyl, 9,9-dimethyl-3-fluorenyl, 9,9-dimethyl-4-fluorenyl, 9,9-diphenyl-1-fluorenyl, 9,9-diphenyl-2-fluorenyl, 9,9-diphenyl-3-fluorenyl, 9,9-diphenyl-4-fluorenyl, 11,11-dimethyl-1-benzo[a]fluorenyl, 11,11-dimethyl-2-benzo[a]fluorenyl, 11,11-dimethyl-3-benzo[a]fluorenyl, 11,11-dimethyl-4-benzo[a]fluorenyl, 11,11-dimethyl-5-benzo[a]fluorenyl, 11,11-dimethyl-6-benzo[a]fluorenyl, 11,11-dimethyl-7-benzo[a]fluorenyl, 11,11-dimethyl-8-benzo[a]fluorenyl, 11,11-dimethyl-9-benzo[a]fluorenyl, 11,11-dimethyl-10-benzo[a]

fluorenyl, 11,11-dimethyl-1-benzo[b]fluorenyl, 11,11-dimethyl-2-benzo[b]fluorenyl, 11,11-dimethyl-3-benzo[b]fluorenyl, 11,11-dimethyl-4-benzo[b]fluorenyl, 11,11-dimethyl-5-benzo[b]fluorenyl, 11,11-dimethyl-6-benzo[b]fluorenyl, 11,11-dimethyl-7-benzo[b]fluorenyl, 11,11-dimethyl-8-benzo[b]fluorenyl, 11,11-dimethyl-9-benzo[b]fluorenyl, 11,11-dimethyl-10-benzo[b]fluorenyl, 11,11-dimethyl-1-benzo[c]fluorenyl, 11,11-dimethyl-2-benzo[c]fluorenyl, 11,11-dimethyl-3-benzo[c]fluorenyl, 11,11-dimethyl-4-benzo[c]fluorenyl, 11,11-dimethyl-5-benzo[c]fluorenyl, 11,11-dimethyl-6-benzo[c]fluorenyl, 11,11-dimethyl-7-benzo[c]fluorenyl, 11,11-dimethyl-8-benzo[c]fluorenyl, 11,11-dimethyl-9-benzo[c]fluorenyl, 11,11-dimethyl-10-benzo[c]fluorenyl, 11,11-diphenyl-1-benzo[a]fluorenyl, 11,11-diphenyl-2-benzo[a]fluorenyl, 11,11-diphenyl-3-benzo[a]fluorenyl, 11,11-diphenyl-4-benzo[a]fluorenyl, 11,11-diphenyl-5-benzo[a]fluorenyl, 11,11-diphenyl-6-benzo[a]fluorenyl, 11,11-diphenyl-7-benzo[a]fluorenyl, 11,11-diphenyl-8-benzo[a]fluorenyl, 11,11-diphenyl-9-benzo[a]fluorenyl, 11,11-diphenyl-10-benzo[a]fluorenyl, 11,11-diphenyl-1-benzo[b]fluorenyl, 11,11-diphenyl-2-benzo[b]fluorenyl, 11,11-diphenyl-3-benzo[b]fluorenyl, 11,11-diphenyl-4-benzo[b]fluorenyl, 11,11-diphenyl-5-benzo[b]fluorenyl, 11,11-diphenyl-6-benzo[b]fluorenyl, 11,11-diphenyl-7-benzo[b]fluorenyl, 11,11-diphenyl-8-benzo[b]fluorenyl, 11,11-diphenyl-9-benzo[b]fluorenyl, 11,11-diphenyl-10-benzo[b]fluorenyl, 11,11-diphenyl-1-benzo[c]fluorenyl, 11,11-dphenyl-2-benzo[c]fluorenyl, 11,11-diphenyl-3-benzo[c]fluorenyl, 11,11-diphenyl-4-benzo[c]fluorenyl, 11,11-diphenyl-5-benzo[c]fluorenyl, 11,11-diphenyl-6-benzo[c]fluorenyl, 11,11-diphenyl-7-benzo[c]fluorenyl, 11,11-diphenyl-8-benzo[c]fluorenyl, 11,11-diphenyl-9-benzo[c]fluorenyl, 11,11-diphenyl-10-benzo[c]fluorenyl, 9,9,10,10-tetramethyl-9,10-dihydro-1-phenanthrenyl, 9,9,10,10-tetramethyl-9,10-dihydro-2-phenanthrenyl, 9,9,10,10-tetramethyl-9,10-dihydro-3-phenanthrenyl, 9,9,10,10-tetramethyl-9,10-dihydro-4-phenanthrenyl, etc.

The term "(3- to 30-membered)heteroaryl" in the present disclosure is meant to be an aryl having 3 to 30 ring backbone atoms and including at least one heteroatom(s) selected from the group consisting of B, N, O, S, Si, and P. The number of heteroatoms is preferably 1 to 4. The above heteroaryl may be a monocyclic ring or a fused ring condensed with at least one benzene ring; may be partially saturated; may be one formed by linking at least one heteroaryl or aryl group to a heteroaryl group via a single bond(s); and may comprise a spiro structure. The above heteroaryl may include a monocyclic ring-type heteroaryl such as furyl, thiophenyl, pyrrolyl, imidazolyl, pyrazolyl, thiazolyl, thiadiazolyl, isothiazolyl, isoxazolyl, oxazolyl, oxadiazolyl, triazinyl, tetrazinyl, triazolyl, tetrazolyl, furazanyl, pyridyl, pyrazinyl, pyrimidinyl, pyridazinyl, etc., and a fused ring-type heteroaryl such as benzofuranyl, benzothiophenyl, isobenzofuranyl, dibenzofuranyl, dibenzothiophenyl, dibenzoselenophenyl, naphthobenzofuranyl, naphthobenzothiophenyl, benzofuroquinolinyl, benzofuroquinazolinyl, benzofuronaphthyridinyl, benzofuropyrimidinyl, naphthofuropyrimidinyl, benzothienoquinolinyl, benzothienoquinazolinyl, benzothienonaphthyridinyl, benzothienopyrimidinyl, naphthothienopyrimidinyl, pyrimidoindolyl, benzopyrimidoindolyl, benzofuropyrazinyl, naphthofuropyrazinyl, benzothienopyrazinyl, naphthothienopyrazinyl, pyrazinoindolyl, benzopyrazinoindolyl, benzimidazolyl, benzothiazolyl, benzoisothiazolyl, benzoisoxazolyl, benzoxazolyl, isoindolyl, indolyl, benzoindolyl, indazolyl, benzothiadiazolyl, quinolyl, isoquinolyl, cinnolinyl, quinazolinyl, benzoquinazolinyl, quinoxalinyl, benzoquinoxalinyl, naphthyridinyl, carbazolyl, benzocarbazolyl, dibenzocarbazolyl, phenoxazinyl, phenothiazinyl, phenanthridinyl, benzodioxolyl, dihydroacridinyl, benzotriazolephenazinyl, imidazopyridinyl, chromenoquinazolinyl, thiochromenoquinazolinyl, dimethylbenzoperimidinyl, indolocarbazolyl, indenocarbazolyl, etc. More specifically, the heteroaryl may include 1-pyrrolyl, 2-pyrrolyl, 3-pyrrolyl, pyrazinyl, 2-pyridyl, 2-pyrimidinyl, 4-pyrimidinyl, 5-pyrimidinyl, 6-pyrimidinyl, 1,2,3-triazin-4-yl, 1,2,4-triazin-3-yl, 1,3,5-triazin-2-yl, 1-imidazolyl, 2-imidazolyl, 1-pyrazolyl, 1-indolidinyl, 2-indolidinyl, 3-indolidinyl, 5-indolidinyl, 6-indolidinyl, 7-indolidinyl, 8-indolidinyl, 2-imidazopyridyl, 3-imidazopyridyl, 5-imidazopyridyl, 6-imidazopyridyl, 7-imidazopyridyl, 8-imidazopyridyl, 3-pyridyl, 4-pyridyl, 1-indolyl, 2-indolyl, 3-indolyl, 4-indolyl, 5-indolyl, 6-indolyl, 7-indolyl, 1-isoindolyl, 2-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, 2-quinolyl, 3-quinolyl, 4-quinolyl, 5-quinolyl, 6-quinolyl, 7-quinolyl, 6-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 9-carbazolyl, azacarbazolyl-1-yl, azacarbazolyl-2-yl, azacarbazolyl-3-yl, azacarbazolyl-4-yl, azacarbazolyl-5-yl, azacarbazolyl-6-yl, azacarbazolyl-7-yl, azacarbazolyl-6-yl, azacarbazolyl-9-yl, 1-phenanthridinyl, 2-phenanthridinyl, 3-0.1 phenanthridinyl, 4-phenanthridinyl, 6-phenanthridinyl, 7-phenanthridinyl, 8-phenanthridinyl, 9-phenanthridinyl, 10-phenanthridinyl, 1-acridinyl, 2-acridinyl, 3-acridinyl, 4-acridinyl, 9-acridinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrol-1-yl, 2-methylpyrrol-3-yl, 2-methylpyrrol-4-yl, 2-methylpyrrol-5-yl, 3-methylpyrrol-1-yl, 3-methylpyrrol-2-yl, 3-methylpyrrol-4-yl, 3-methylpyrrol-5-yl, 2-tert-butylpyrrol-4-yl, 3-(2-phenylpropyl)pyrrol-1-yl, 2-methyl-1-indolyl, 4-methyl-1-indolyl, 2-methyl-3-indolyl, 4-methyl-3-indolyl, 2-tert-butyl-1-indolyl, 4-tert-butyl-1-indolyl, 2-tert-butyl-3-indolyl, 4-tert-butyl-3-indolyl, 1-dibenzofuranyl, 2-dibenzofuranyl, 3-dibenzofuranyl, 4-dibenzofuranyl, 1-dibenzothiophenyl, 2-dibenzothiophenyl, 3-dibenzothiophenyl, 4-dibenzothiophenyl, 1-naphtho-[1,2-b]-benzofuranyl, 2-naphtho-[1,2-b]-benzofuranyl, 3-naphtho-[1,2-b]-benzofuranyl, 4-naphtho-[1,2-b]-benzofuranyl, 5-naphtho-[1,2-b]-benzofuranyl, 6-naphtho-[1,2-b]-benzofuranyl, 7-naphtho-[1,2-b]-benzofuranyl, 8-naphtho-[1,2-b]-benzofuranyl, 9-naphtho-[1,2-b]-benzofuranyl, 10-naphtho-[1,2-b]-benzofuranyl, 1-naphtho-[2,3-b]-benzofuranyl, 2-naphtho-[2,3-b]-benzofuranyl, 3-naphtho-[2,3-b]-benzofuranyl, 4-naphtho-[2,3-b]-benzofuranyl, 5-naphtho-[2,3-b]-benzofuranyl, 6-naphtho-[2,3-b]-benzofuranyl, 7-naphtho-[2,3-b]-benzofuranyl, 8-naphtho-[2,3-b]-benzofuranyl, 9-naphtho-[2,3-b]-benzofuranyl, 1-naphtho-[2,3-b]-benzofuranyl, 1-naphtho-[2,1-b]-benzofuranyl, 2-naphtho-[2,1-b]-benzofuranyl, 3-naphtho-[2,1-b]-benzofuranyl, 4-naphtho-[2,1-b]-benzofuranyl, 5-naphtho-[2,1-b]-benzofuranyl, 6-naphtho-[2,1-b]-benzofuranyl, 7-naphtho-[2,1-b]-benzofuranyl, 8-naphtho-[2,1-b]-benzofuranyl, 9-naphtho-[2,1-b]-benzofuranyl, 1-naphtho-[2,1-b]-benzofuranyl, 1-naphtho-[1,2-b]-benzothiophenyl, 2-naphtho-[1,2-b]-benzothiophenyl, 3-naphtho-[1,2-b]-benzothiophenyl, 4-naphtho-[1,2-b]-benzothiophenyl, 5-naphtho-[1,2-b]-benzothiophenyl, 6-naphtho-[1,2-b]-benzothiophenyl, 7-naphtho-[1,2-b]-benzothiophenyl, 8-naphtho-[1,2-b]-benzothiophenyl, 9-naphtho-[1,2-b]-benzothiophenyl, 10-naphtho-[1,2-b]-benzothiophenyl, 1-naphtho-[2,3-b]-benzothiophenyl, 2-naphtho-[2,3-b]-benzothiophenyl, 3-naphtho-[2,3-b]-benzothiophenyl, 4-naphtho-[2,3-b]-benzothiophenyl, 5-naphtho-[2,3-b]-benzothiophenyl, 1-naphtho-[2,1-b]-benzothiophenyl, 2-naphtho-[2,1-b]-benzothiophenyl, 3-naphtho-[2,1-b]-benzothiophenyl, 4-naphtho-[2,1-b]-benzothiophenyl, 5-naphtho-[2,1-b]-benzothiophenyl, 6-naphtho-[2,1-b]-benzothiophenyl, 7-naphtho-[2,1-b]-benzothiophenyl, 8-naphtho-[2,1-b]-benzothiophenyl, 9-naphtho-[2,1-b]-benzothiophenyl, 1-naphtho-[2,1-b]-benzothiophenyl, 2-benzofuro[3,2-d]pyrimidinyl, 6-benzofuro[3,2-d]pyrimidinyl, 7-benzofuro[3,2-d]pyrimidinyl, 8-benzofuro[3,2-d]pyrimidinyl, 9-benzofuro[3,2-d]pyrimidinyl, 2-benzothio[3,2-d]pyrimidinyl, 6-benzothio[3,2-d]pyrimidinyl, 7-benzothio[3,2-d]pyrimidinyl, 8-benzothio[3,2-d]pyrimidinyl, 9-benzothio[3,2-d]pyrimidinyl, 2-benzofuro[3,2-d]pyrazinyl, 6-benzofuro[3,2-d]pyrazinyl, 7-benzofuro[3,2-d]pyrazinyl, 8-benzofuro[3,2-d]pyrazinyl, 9-benzofuro[3,2-d]pyrazinyl, 2-benzothio[3,2-d]pyrazinyl, 6-benzothio[3,2-d]pyrazinyl, 7-benzothio[3,2-d]pyrazinyl, 8-benzothio[3,2-d]pyrazinyl, 9-benzothio[3,2-d]pyrazinyl, 1-silafluorenyl, 2-silafluorenyl, 3-silafluorenyl, 4-silafluorenyl, 1-germafluorenyl, 2-germafluorenyl, 3-germafluorenyl, 4-germafluorenyl, 1-dibenzoselenophenyl, 2-dibenzoselenophenyl, 3-dibenzoselenophenyl, 4-dibenzoselenophenyl, etc. In the present disclosure, the term "halogen" includes F, C1, Br, and I.

In addition, "ortho (o-)", "eta (m-)", and "para (p-)" are prefixes, which represent the relative positions of substituents, respectively. Ortho indicates that two substituents are adjacent to each other, and for example, when two substituents in a benzene derivative occupy positions 1 and 2, it is called an ortho position. Meta indicates that two substituents are at positions 1 and 3, and for example, when two substituents in a benzene derivative occupy positions 1 and 3, it is called a meta position. Para indicates that two substituents are at positions 1 and 4, and for example, when two substituents in a benzene derivative occupy positions 1 and 4, it is called a para position.

In addition, "substituted" in the expression "substituted or unsubstituted" in the present disclosure means that a hydrogen atom in a certain functional group is replaced with another atom or another functional group (i.e., a substituent), and also includes that hydrogen atom is replaced with a group to which two or more substituents are connected among the substituents. For example, "a substituent to which two or more substituents are connected" may be pyridine-triazine. That is, pyridine-triazine may be interpreted as one heteroaryl substituent, or as substituents in which two heteroaryl substituents are linked. Herein, the substituent(s) of the substituted alkyl, the substituted alkylene, the substituted alkenyl, the substituted aryl, the substituted arylene, the substituted heteroaryl, the substituted heteroarylene, the substituted nitrogen-containing heteroaryl, the substituted cycloalkyl, the substituted cycloalkylene, the substituted alkoxy, the substituted trialkylsilyl, the substituted dialkylarylsilyl, the substituted alkyldiarylsilyl, the substituted triarylsilyl, and the substituted fused ring group of an aliphatic ring(s) and an aromatic ring(s), the substituted pyridyl, the substituted pyrimidinyl, the substituted triazinyl, the substituted quinazolinyl, and the substituted quinoxalinyl, each independently, represents at least one selected from the group consisting of deuterium; a halogen; a cyano; a carboxyl; a nitro; a hydroxyl; a phosphine oxide; a (C1-C30)alkyl; a halo(C1-C30)alkyl; a (C2-C30)alkenyl; a (C2-C30)alkynyl; a (C1-C30)alkoxy; a (C1-C30)alkylthio; a (C3-C30)cycloalkyl; a (C3-C30)cycloalkenyl; a (3- to 7-membered)heterocycloalkyl; a (C6-C30)aryloxy; a (C6-C30)arylthio; a (3- to 30-membered)heteroaryl unsubstituted or substituted with a (C6-C30)aryl(s); a (C6-C30)aryl unsubstituted or substituted with at least one of a (C1-C30) alkyl(s), a (C6-C30)aryl(s) and a (3- to 30-membered) heteroaryl(s); a tri(C1-C30)alkylsilyl; a tri(C6-C30)arylsilyl; a di(C1-C30)alkyl(C6-C30)arylsilyl; a (C1-C30)alkyldi(C6-C30)arylsilyl; a fused ring group of a (C3-C30) aliphatic ring(s) and a (C6-C30) aromatic ring(s); an amino; a mono- or di-(C1-C30)alkylamino; a mono- or di-(C2-C30) alkenylamino; a (C1-C30)alkyl(C2-C30)alkenylamino; a mono- or di-(C6-C30)arylamino; a (C1-C30)alkyl(C6-C30) arylamino; a mono- or di-(3- to 30-membered)heteroarylamino; a (C1-C30)alkyl(3- to 30-membered)heteroarylamino; a (C2-C30)alkenyl(C6-C30)arylamino; a (C2-C30) alkenyl(3- to 30-membered)heteroarylamino; a (C6-C30) aryl(3- to 30-membered)heteroarylamino; a (C1-C03) alkylcarbonyl; a (C1-C30)alkoxycarbonyl; a (C6-C30) arylcarbonyl; a (C6-C30)arylphosphine; a di(C6-C30) arylboronyl; a di(C1-C30)alkylboronyl; a (C1-C30)alkyl (C6-C30)arylboronyl; a (C6-C30)aryl(C1-C30)alkyl; and a (C1-C30)alkyl(C6-C30)aryl. According to one embodiment of the present disclosure, the substituent(s), each independently, represents at least one selected from the group consisting of deuterium; a (C1-C20)alkyl; a (5- to 25-membered)heteroaryl unsubstituted or substituted with a (C6-C25)aryl(s); and a (C6-C25)aryl unsubstituted or substituted with a (C6-C25)aryl(s). According to another embodiment of the present disclosure, the substituent(s), each independently, represents at least one selected from the group consisting of deuterium; a (C1-C10)alkyl; a (5- to 15-membered)heteroaryl unsubstituted or substituted with a (C6-C12)aryl(s); and a (C6-C15)aryl unsubstituted or substituted with a (C6-C12)aryl(s). Specifically, the substituent(s), may each independently, represent deuterium; a methyl; a phenyl; a naphthyl; a biphenyl; a phenylfluorenyl; a phenanthrenyl; a pyridyl; a diphenyltriazinyl, etc.

In the formulas of the present disclosure, a ring formed by a linkage of adjacent substituents means that at least two adjacent substituents are linked to each other to form a substituted or unsubstituted, mono or polycyclic, (3- to 30-membered) alicyclic ring or aromatic ring, or the combination thereof. In addition, the formed ring may comprise at least one heteroatom selected from B, N, O, S, Si, and P, preferably at least one heteroatom selected from N, O, and S. According to one embodiment of the present disclosure, the number of the ring backbone atoms is 5 to 20. According to another embodiment of the present disclosure, the number of the ring backbone atoms is 5 to 15.

In the present disclosure, heteroaryl, heteroarylene, and heterocycloalkyl may each independently comprise at least one heteroatom selected from B, N, O, S, Si, and P. In addition, the heteroatom may be bonded to at least one selected from the group consisting of hydrogen, deuterium, a halogen, a cyano, a substituted or unsubstituted (C1-C30) alkyl, a substituted or unsubstituted (C6-C30)aryl, a substituted or unsubstituted (5- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, and a substituted or unsubstituted (C1-C30)alkyl(C6-C30)arylamino.

According to one embodiment of the present disclosure, the hole transport zone of the present disclosure, for example, at least one of a light-emitting auxiliary layer, a hole auxiliary material, and a second hole transport layer, may comprise the compound represented by formula 1.

Hereinafter, the compound represented by formula 1 will be described in more detail.

In formula 1, $Ar_1$ and $Ar_2$ each independently represent hydrogen, deuterium, a substituted or unsubstituted (C1-C30)alkyl, a substituted or unsubstituted (C6-C30)aryl, a substituted or unsubstituted (3- to 30-membered)heteroaryl, or $-L_b-N(Ar_a)(Ar_b)$, or $Ar_1$ and $Ar_2$ may be linked to each other to form a ring(s), with the proviso that when $Ar_1$ or $Ar_2$ are a (3- to 30-membered)heteroaryl, a carbazole is excluded therefrom. According to one embodiment of the present disclosure, $Ar_1$ and $Ar_2$ each independently represent a substituted or unsubstituted (C6-C30)aryl or a substituted or unsubstituted (5- to 20-membered)heteroaryl. According to another embodiment of the present disclosure, $Ar_1$ and $Ar_2$ each independently represent a (C6-C30)aryl unsubstituted or substituted with at least one of a (C1-C6)alkyl(s) and a (C6-C12)aryl(s), or an unsubstituted (5- to 20-membered) heteroaryl. Specifically, $Ar_1$ and $Ar_2$ may each independently represent a phenyl, a biphenyl, a naphthylphenyl, a phenylnaphthyl, a terphenyl, a dimethylfluorenyl, a diphenylfluorenyl, a spirobifluorenyl, a dimethylbenzofluorenyl, a dibenzofuranyl, a dibenzothiophenyl, a benzonaphthofuranyl, a benzonaphthothiophenyl, etc.

In formula 1, L represents a single bond, a substituted or unsubstituted (C6-C30)arylene, or a substituted or unsubstituted (3- to 30-membered)heteroarylene. According to one embodiment of the present disclosure, L represents a single bond, a substituted or unsubstituted (C6-C12)arylene, or a substituted or unsubstituted (5- to 15-membered)heteroarylene. According to another embodiment of the present disclosure, L represents a single bond, an unsubstituted (C6-C12)arylene, or a (5- to 15-membered)heteroarylene unsubstituted or substituted with a (C6-C12)aryl(s). Specifically, L may represent a single bond, a phenylene, a naphthylene, etc.

In formula 1, $R_1$ to $R_3$ each independently represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30) cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, or $L_b-N(Ar_a)(Ar_b)$. According to one embodiment of the present disclosure, $R_1$ to $R_3$ each independently represent hydrogen, a substituted or unsubstituted (C6-C20)aryl, or a substituted or unsubstituted (5- to 15-membered)heteroaryl. According to another embodiment of the present disclosure, $R_1$ to $R_3$ each independently represent hydrogen.

In formula 1, $R_4$ and $R_5$ each independently represent a substituted or unsubstituted (C1-C30)alkyl, or a substituted or unsubstituted (C6-C30)aryl. According to one embodiment of the present disclosure, $R_4$ and $R_5$ each independently represent a substituted or unsubstituted (C1-C6)alkyl, or a substituted or unsubstituted (C6-C12)aryl. According to another embodiment of the present disclosure, $R_4$ and $R_5$ each independently represent an unsubstituted (C1-C6)alkyl, or an unsubstituted (C6-C12)aryl. Specifically, $R_4$ and $R_5$ may each independently represent methyl, phenyl, etc.

In formula 1, a represents an integer of 1 to 4, b represents an integer of 1 or 2, c represents an integer of 1 to 3, and where if a, b, and c are an integer of 2 or more, each of $R_1$, each of $R_2$, and each of $R_3$ may be the same or different.

According to one embodiment of the present disclosure, an organic electroluminescent device according to the present disclosure comprises the compound represented by formula 2 in a light-emitting layer.

Hereinafter, the compound represented by formula 2 will be described in more detail.

In formula 2, M represents

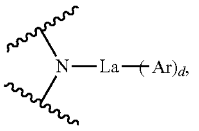

O, or S.

In formula 2, $X_1$ to $X_{12}$ each independently represent N or $CR_6$. According to one embodiment of the present disclosure, all of $X_1$ to $X_{12}$ may be $CR_6$. According to other embodiment of the present disclosure, any one of $X_1$ to $X_{12}$ may be N. According to another embodiment of the present disclosure, two of $X_1$ to $X_{12}$ may be N.

In formula 2, La represents a single bond, a substituted or unsubstituted (C1-C30)alkylene, a substituted or unsubstituted (C6-C30)arylene, a substituted or unsubstituted (3- to 30-membered)heteroarylene, or a substituted or unsubstituted (C3-C30)cycloalkylene. According to one embodiment of the present disclosure, La represents a single bond, a substituted or unsubstituted (C6-C25)arylene, or a substituted or unsubstituted (5- to 25-membered)heteroarylene. According to another embodiment of the present disclosure, La represents a single bond; a (C6-C18)arylene unsubstituted or substituted with at least one of a (C1-C6)alkyl(s), a (C6-C12)aryl(s), and a (5- to 15-membered)heteroaryl; or a (5- to 18-membered)heteroarylene unsubstituted or substituted with a (C6-C12)aryl(s). The heteroarylene may comprise at least one of nitrogen, oxygen and sulfur, Specifically, La represents a single bond, a phenylene, a naphthylene, a biphenylene, a phenylene substituted with a phenyl(s), a phenylene substituted with a pyridyl(s), a -phenylene-pyridylene-, a dimethylfluorenylene, a diphenylfluorenylene, a pyridylene, a pyridylene substituted with a phenyl (s), a -pyridylene-phenylene-, a pyrimidinylene, a quinolinylene, a isoquinolinylene, a dibenzofuranylene, a dibenzothiophenylene, etc.

In formula 2, Ar each independently represents a substituted or unsubstituted pyridyl, a substituted or unsubstituted pyrimidinyl, a substituted or unsubstituted triazinyl, a substituted or unsubstituted quinazolinyl, or a substituted or unsubstituted quinoxalinyl. According to one embodiment of the present disclosure, Ar each independently represents a pyridyl, a pyrimidinyl, a triazinyl, a quinazolinyl, or a quinoxalinyl, unsubstituted or substituted with at least one of deuterium, a (C6-C20)aryl(s) unsubstituted or substituted with deuterium, and (5- to 15-membered)heteroaryl. Specifically, Ar may each independently represent a triazinyl substituted with at least one of a phenyl(s), a naphthyl(s), a biphenyl(s), a phenanthrenyl(s), a phenyl(s) substituted with deuterium, a dibenzofuranyl(s) and a dibenzothiophenyl(s); a pyridyl unsubstituted or substituted with a phenyl(s); a pyrimidinyl unsubstituted or substituted with at least one of a phenyl(s), a naphthyl(s), and a phenyl(s) substituted with deuterium; a quinazolinyl substituted with a naphthyl(s); a quinoxalinyl substituted with a phenyl(s), etc.

In formula 2, $R_6$ each independently represents hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, or $L_b$-N($Ar_a$)($Ar_b$); or may be linked to an adjacent substituent(s) to form a ring(s). According to one embodiment of the present disclosure, $R_6$ each independently represents hydrogen, a substituted or unsubstituted (C6-C25)aryl, or a substituted or unsubstituted (5- to 25-membered)heteroaryl; or an adjacent $R_6$ may be linked to each other to form a substituted or unsubstituted, monocyclic or polycyclic, (5- to 25-membered) alicyclic ring(s), aromatic ring(s), or the combination(s) thereof, and a carbon atom of the ring in the formed alicyclic ring(s), aromatic ring(s) or the combination(s) thereof may be replaced with at least one of heteroatoms selected from nitrogen, oxygen and sulfur. According to another embodiment of the present disclosure, $R_6$ each independently represents hydrogen, a (C6-C12)aryl unsubstituted or substituted with a (5- to 15-membered) heteroaryl(s) substituted with a (C6-C12)aryl(s), or (5- to 15-membered)heteroaryl unsubstituted or substituted with a (C6-C12)aryl(s); or adjacent $R_6$'s may be linked to each other to form a substituted or unsubstituted, monocyclic or polycyclic, (5- to 15-membered) aromatic ring(s), and the carbon atom in the formed aromatic ring(s) may be replaced with at least one of heteroatoms selected from nitrogen, oxygen and sulfur. Specifically, $R_6$ each independently represents hydrogen, a phenyl, a phenyl substituted with a diphenyltriazinyl(s), pyridyl, diphenyltriazinyl, etc.; or adjacent $R_6$'s may be linked to each other to form an unsubstituted benzene ring, a indene ring substituted with at least one of a methyl(s) and a phenyl(s), an unsubstituted pyridine ring, an unsubstituted benzofuran ring, an unsubstituted benzothiophene ring, an indole ring substituted with a phenyl(s), etc.

In formula 2, d represents an integer of 1 or 2, and where if d is an integer of 2, each of Ar may be the same or different.

According to one embodiment of the present disclosure, an organic electroluminescent device according to the present disclosure comprises a plurality of host materials containing the first host material comprising the compound represented by formula 3 and the second host material comprising the compound represented by formula 4 in a light-emitting layer.

Hereinafter, the compound represented by formula 3 will be described in more detail.

In formula 3, $L_1$ to $L_3$ each independently represent a single bond, a substituted or unsubstituted (C1-C30)alkylene, a substituted or unsubstituted (C6-C30)arylene, a substituted or unsubstituted (3- to 30-membered)heteroarylene, or a substituted or unsubstituted (C3-C30)cycloalkylene. According to one embodiment of the present disclosure, $L_1$ to $L_3$ each independently represent a single bond, or a substituted or unsubstituted (C6-C12)arylene. According to another embodiment of the present disclosure, $L_1$ to $L_3$ each independently represent a single bond, or an unsubstituted (C6-C12)arylene. For example, $L_1$ to $L_3$ may each independently represent a single bond, a phenylene, a naphthylene, etc.

In formula 3, $Ar_3$ to $Ar_5$ each independently represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30) cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted fused ring group of a (C3-C30) aliphatic ring(s) and a (C6-C30) aromatic ring(s), or $L_b$-N($Ar_a$)($Ar_b$). According to one embodiment of the present disclosure, $Ar_3$ to $Ar_5$ each independently represent a substituted or unsubstituted (C6-C30)aryl, a substituted or unsubstituted (3- to 30-membered)heteroaryl, a substituted or unsubstituted (C3-C10)cycloalkyl, or $L_b$-N($Ar_a$)($Ar_b$). According to another embodiment of the present disclosure, $Ar_3$ to $Ar_5$ each independently represent a (C6-C30)aryl unsubstituted or substituted with at least one of deuterium, a (C1-C6)alkyl(s) and a (C6-C20)aryl(s); a (3- to 30-membered)heteroaryl unsubstituted or substituted with a (C6-C15)aryl(s); an unsubstituted (C3-C10)cycloalkyl; or $L_b$N($Ar_a$)($Ar_b$). For example, $Ar_3$ to $Ar_5$ may each independently represent a phenyl, a phenyl substituted with deuterium, a phenyl substituted with a methyl(s), a phenyl substituted with a tert-butyl(s), a phenyl substituted with a phenylfluorenyl(s), a naphthyl, a phenylnaphthyl, a biphenyl, a terphenyl, an anthracenyl, a phenanthrenyl, a fluoranthenyl, a tetramethyltetrahydrophenanthrenyl, a dimethylfluorenyl, a methylphenylfluorenyl, a diphenylfluorenyl, a dimethylbenzofluorenyl, a spirobifluorenyl, a (C22)aryl, a phenylpyridyl, a benzofuranyl, a benzimidazolyl substituted with a phenyl (s), a dibenzofuranyl, a dibenzothiophenyl, a dibenzofuranyl substituted with a phenyl(s), a carbazolyl substituted with a phenyl(s), a dibenzocarbazolyl, a benzonaphthofuranyl, a benzonaphthothiophenyl, a phenoxazinyl, a phenanthrooxazolyl, a phenanthrooxazolyl substituted with a phenyl(s), a phenanthrooxazolyl substituted with a phenanthrenyl(s), a phenanthrothiazolyl substituted with a phenyl(s), a phenantrothiazolyl substituted with a biphenyl(s), a benzene fused phenanthrooxazolyl substituted with a phenyl(s), a nitrogen-containing (14-membered)heteroaryl substituted with a methyl(s), a nitrogen-containing (23-membered)heteroaryl unsubstituted or substituted with a phenyl(s), a benzene fused nitrogen-containing (23-membered)heteroaryl, a nitrogen-containing (26-membered)heteroaryl substituted with a phenyl(s), a benzene fused nitrogen-containing (26-membered)heteroaryl, a diphenylamino, etc.

In formula 3, the case where all of $L_1$ to $L_3$ are single bond, and all of $Ar_3$ to $Ar_5$ are hydrogen is excluded.

According to one embodiment of the present disclosure, formula 3 is represented by at least one of the following formulas 3-1 to 3-13.

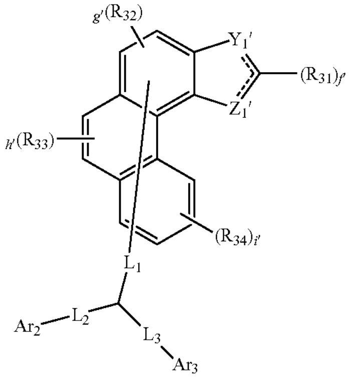
(3-2)
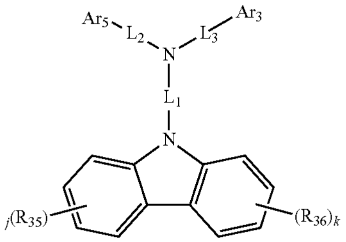
(3-3)
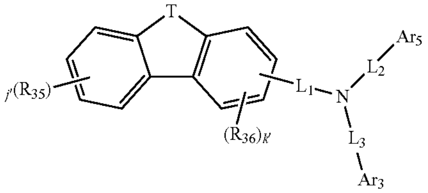
(3-4)
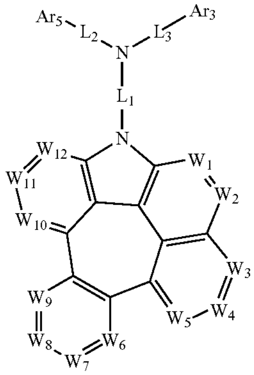
(3-5)
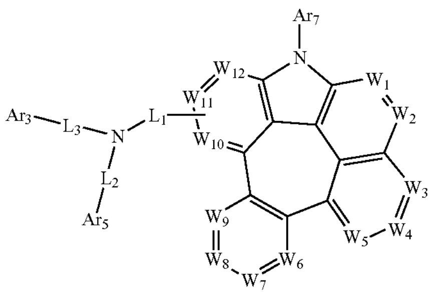
-continued
(3-6)
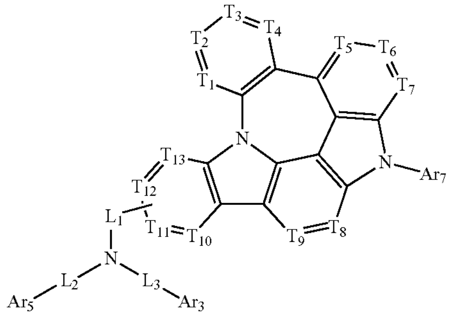
(3-7)
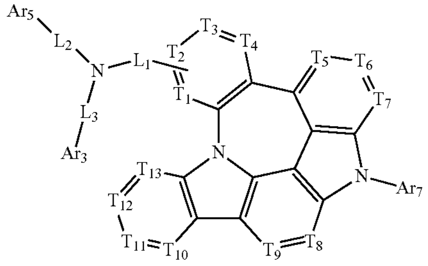
(3-8)
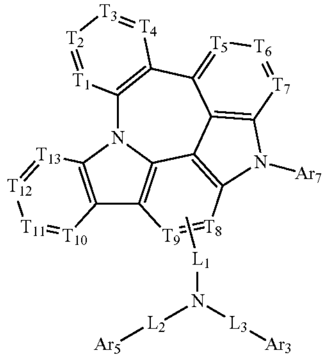
(3-9)
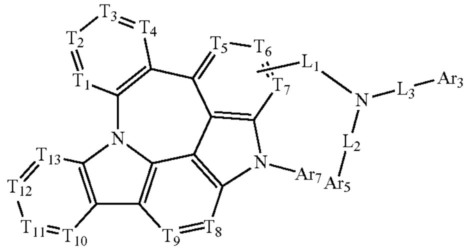
(3-10)
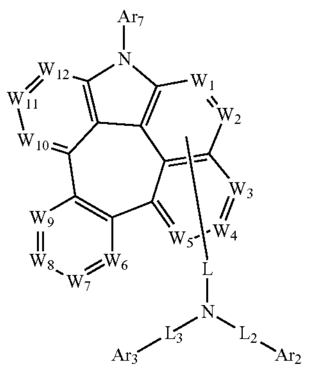

-continued (3-11)

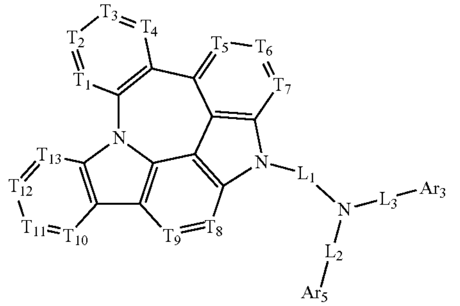

(3-12)

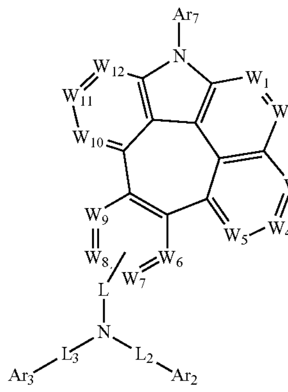

(3-13)

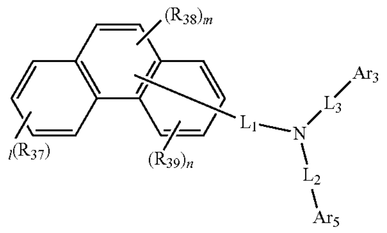

In formulas 3-1 to 3-13, $Y_1$' and $Z_1$' each independently represent —N═, —$NR_{41}$—, —O— or —S—, with a proviso that any one of $Y_1$' and $Z_1$' represents —N═, and the other of $Y_1$' and $Z_1$' represents —$NR_{41}$—, —O— or —S—;

T represents $CR_{42}R_{43}$, $NR_{44}$, O, or S;

$T_1$ to $T_{13}$ and $W_1$ to $W_{12}$ each independently represent N or $CV_1$;

$R_{31}$ represents a substituted or unsubstituted (C6-C30) aryl, or a substituted or unsubstituted (3- to 30-membered)heteroaryl;

$R_{32}$ to $R_{39}$, $R_{41}$ to $R_{44}$ and $V_1$ each independently represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted fused ring group of a (C3-C30) aliphatic ring(s) and a (C6-C30) aromatic ring(s), or -$L_bN(Ar_a)(Ar_b)$, or may be linked to an adjacent substituent(s) to form a ring(s);

$L_b$ each independently represents a single bond, a substituted or unsubstituted (C6-C30)arylene, or a substituted or unsubstituted (3- to 30-membered)heteroarylene;

$Ar_a$ and $Ar_b$ each independently represent hydrogen, a substituted or unsubstituted (C1-C30)alkyl, a substituted or unsubstituted (C2-C30)alkenyl, a substituted or unsubstituted fused ring group of a (C3-C30) aliphatic ring(s) and a (C6-C30) aromatic ring(s), a substituted or unsubstituted (C6-C30)aryl, or a substituted or unsubstituted (3- to 30-membered)heteroaryl;

$Ar_7$ represents a substituted or unsubstituted (C6-C30) aryl, or a substituted or unsubstituted (3- to 30-membered)heteroaryl;

f' represents 1, g', h' and m each independently represent an integer of 1 or 2, i', j, j', k, l and n each independently represent an integer of 1 to 4, k' represents an integer of 1 to 3, and where if g', h', i', j, k, j', k', and l to n are an integer of 2 or more, each of $R_{32}$ to each of $R_{39}$ may be the same as or different from each other; and $Ar_3$, $Ar_5$, and $L_1$ to $L_3$ are as defined in formula 3.

The compound represented by formula 4 will be described in more detail.

In formula 4, HAr represents a substituted or unsubstituted, nitrogen-containing (3- to 20-membered)heteroaryl. According to one embodiment of the present disclosure, HAr represents a substituted or unsubstituted, nitrogen-containing (3- to 15-membered)heteroaryl. Specifically, HAr may represent a pyridyl, a pyrimidinyl, a triazinyl, etc.

In formula 4, $L_4$ represents a single bond, or a substituted or unsubstituted (C6-C30)arylene. According to one embodiment of the present disclosure, $L_4$ represents a single bond, or a substituted or unsubstituted (C6-C20)arylene. According to another embodiment of the present disclosure, $L_4$ represents a single bond, or an unsubstituted (C6-C20) arylene. Specifically, $L_4$ may represent a single bond, a phenylene, a naphthylene, a biphenylene, a -phenylene-naphthylene-, a -naphthylene-phenylene-, etc.

In formula 4, $Ar_6$ represents a substituted or unsubstituted (C6-C30)aryl, or any one selected from formulas 5 to 7. According to one embodiment of the present disclosure, $Ar_6$ represents a (C6-C30)aryl substituted with a (C1-C6) alkyl(s), a (C6-C30)aryl substituted with a (C6-C12)aryl(s), an unsubstituted (C6-C30)aryl, or any one selected from formulas 5 to 7. Specifically, $Ar_6$ may represent a phenyl, a naphthyl, a biphenyl, a terphenyl, a naphthylphenyl, a dimethylfluorenyl, a diphenylfluorenyl, a dimethylbenzofluorenyl, a spirobifluorenyl, or any one selected from formulas 5 to 7. According to another embodiment of the present disclosure, at least one of $Ar_6$ may be selected from formulas 5 to 7.

In formula 5, Y represents O, S, N—* or $NR_7$.

In formula 6, X represents O, S, or $CR_8R_9$.

In formula 7, $Y_1$ and $Z_1$ each independently represent —N═, —$NR_{10}$—, —O— or —S—, with a proviso that any one of $Y_1$ and $Z_1$ represents —N═, and the other of $Y_1$ and $Z_1$ represents —$NR_{10}$—, —O— or —S—.

Herein, $R_7$ and $R_{10}$ each independently represent a substituted or unsubstituted (C6-C30)aryl. According to one embodiment of the present disclosure, $R_7$ and $R_{10}$ each independently represent a substituted or unsubstituted (C6-C12)aryl. According to another embodiment of the present disclosure, $R_7$ and $R_{10}$ each independently represent an unsubstituted (C6-C12)aryl. Specifically, $R_7$ and $R_{10}$ may each independently represent phenyl, etc.

Herein, $R_8$ and $R_9$ each independently represent a substituted or unsubstituted (C1-C30)alkyl, or a substituted or unsubstituted (C6-C30)aryl. According to one embodiment of the present disclosure, $R_8$ and $R_9$ each independently represent a substituted or unsubstituted (C1-C6)alkyl, or a substituted or unsubstituted (C6-C12)aryl. According to another embodiment of the present disclosure, $R_8$ and $R_9$ each independently represent an unsubstituted (C1-C6)alkyl. Specifically, $R_8$ and $R_9$ may each independently represent methyl, etc.

In formulas 5 to 7, $R_{11}$ to $R_{18}$ and $R_{21}$ to $R_{27}$ each independently represent the position linked to $L_4$; or represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30) alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30) arylsilyl, or $L_b$-N($Ar_a$)($Ar_b$); or may be linked to an adjacent substituent(s) to form a ring(s). According to one embodiment of the present disclosure, $R_{11}$ to $R_{18}$ and $R_{21}$ to $R_{27}$ each independently represent the position linked to $L_4$, or represent hydrogen. According to another embodiment of the present disclosure, any one of $R_{11}$ to $R_{18}$ may represent the position linked to $L_4$, any one of $R_{24}$'s may represent the position linked to $L_4$, and any one of $R_{27}$'s may represent the position linked to $L_4$.

In formula 7, $R_{28}$ represents a substituted or unsubstituted (C6-C30)aryl, or a substituted or unsubstituted (3- to 30-membered)heteroaryl. According to one embodiment of the present disclosure, $R_{28}$ represents a substituted or unsubstituted (C6-C20)aryl, or a substituted or unsubstituted (5- to 15-membered)heteroaryl. According to another embodiment of the present disclosure, $R_{28}$ represents a (C6-C20)aryl unsubstituted or substituted with a (C1-C6)alkyl(s), or an unsubstituted (5- to 15-membered)heteroaryl. Specifically, $R_{28}$ may represent a phenyl, a naphthyl, a biphenyl, a dimethylfluorenyl, a pyridyl, a dibenzothiophenyl, etc.

In formulas 4 to 7, f represents 1, a, d' and i each independently represent an integer of 1 to 4, b, c', g and h each independently represent an integer of 1 to 2, e represents an integer of 1 to 3, and where if a', b', c', d', e and g to i are an integer of 2 or more, each of $R_{21}$ to each of $R_{27}$ and each of ($L_4$-$Ar_6$) may be the same as or different from each other.

In formula 5, * represents the position linked to $L_4$.

In formulas 1 to 4, $L_b$ each independently represents a single bond, a substituted or unsubstituted (C6-C30)arylene, or a substituted or unsubstituted (3- to 30-membered)heteroarylene.

In formulas 1 to 4, $Ar_a$ and $Ar_b$ each independently represent hydrogen, a substituted or unsubstituted (C1-C30) alkyl, a substituted or unsubstituted (C2-C30)alkenyl, a substituted or unsubstituted fused ring group of a (C3-C30) aliphatic ring(s) and a (C6-C30) aromatic ring(s), a substituted or unsubstituted (C6-C30)aryl, or a substituted or unsubstituted (3- to 30-membered)heteroaryl.

The compound represented by formula 1 may be at least one selected from the following compounds, but is not limited thereto.

P-1

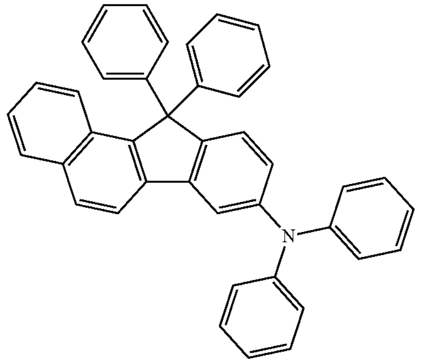

P-2

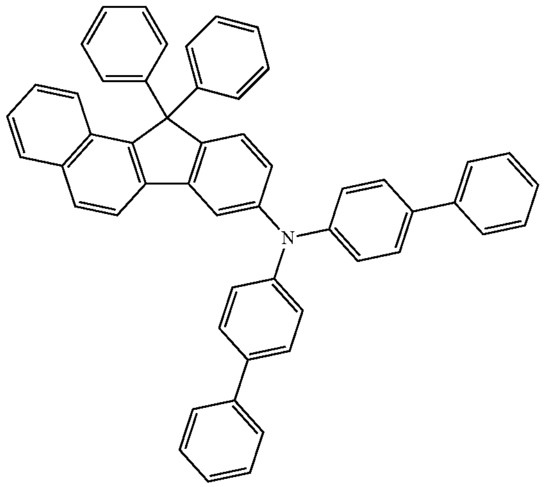

P-3

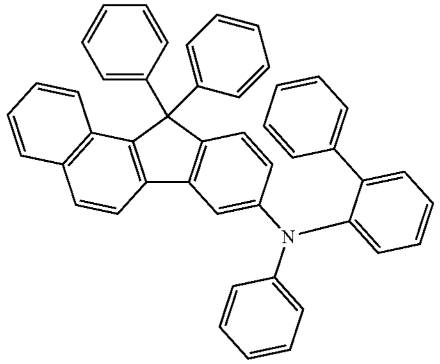

P-4

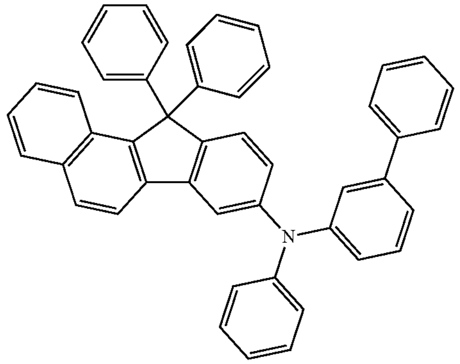

-continued
P-5
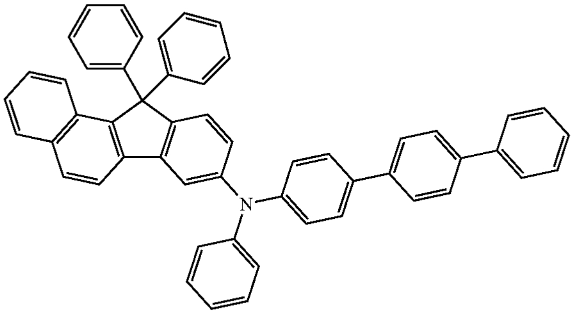
P-6
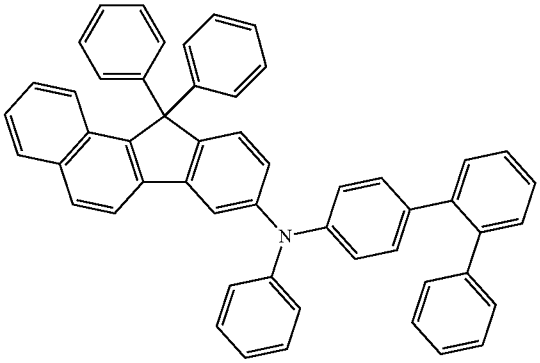
P-7
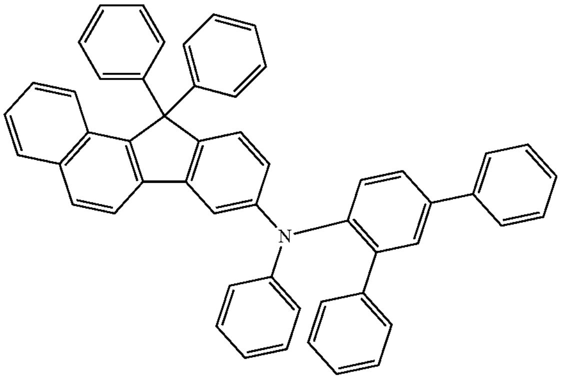
P-8
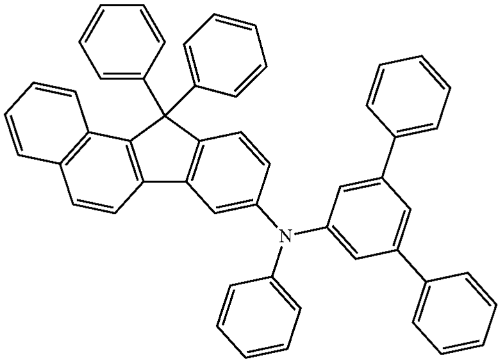
-continued
P-9
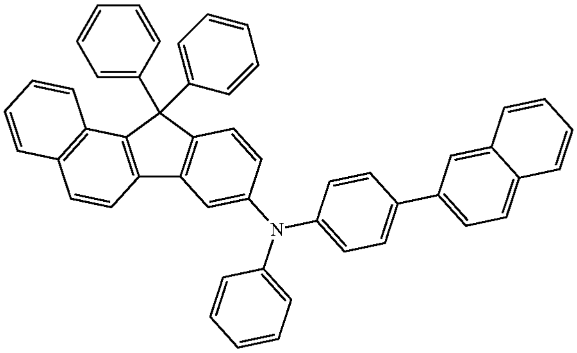
P-10
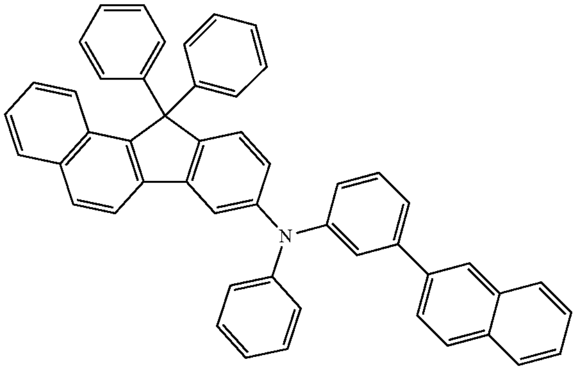
P-11
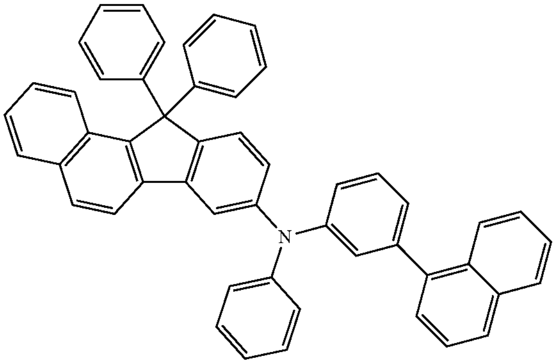
P-12
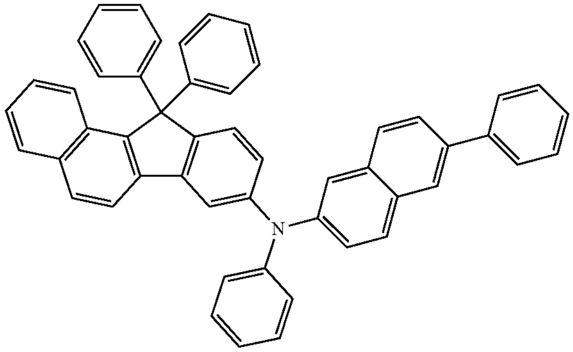

-continued
P-13
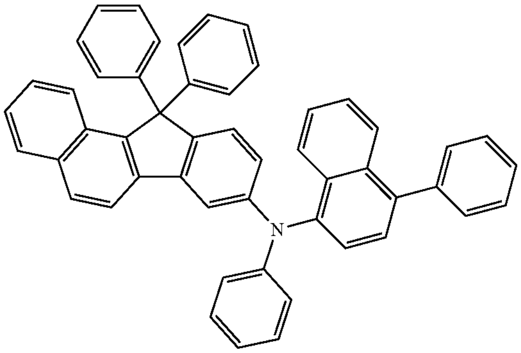
P-14
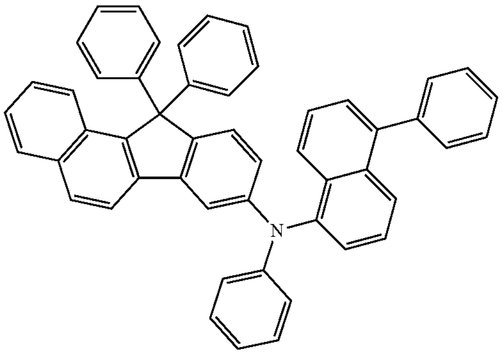
P-15
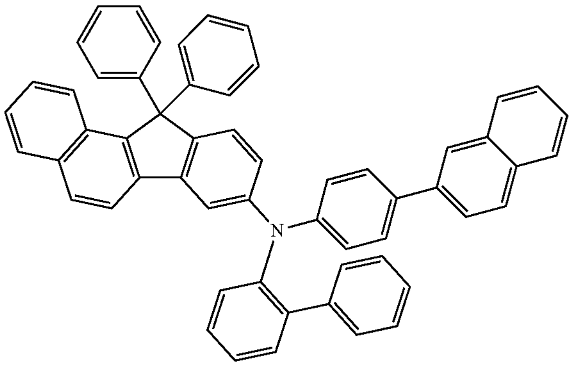
P-16
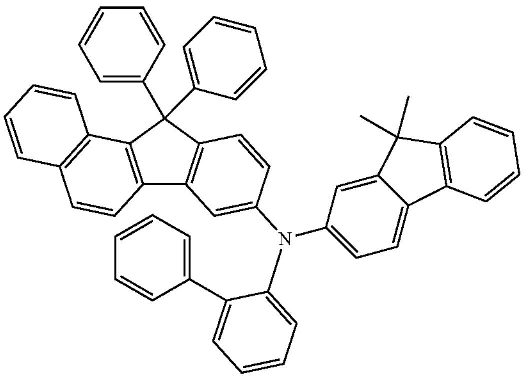
-continued
P-17
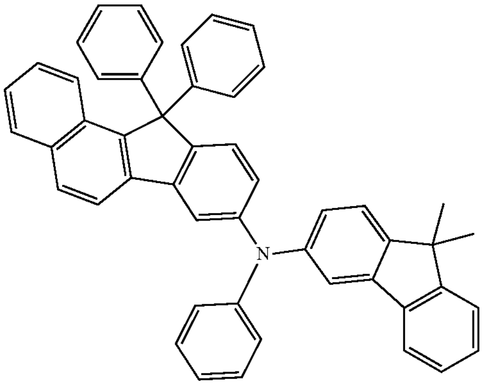
P-18
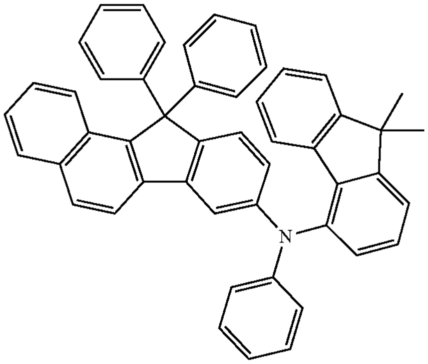
P-19
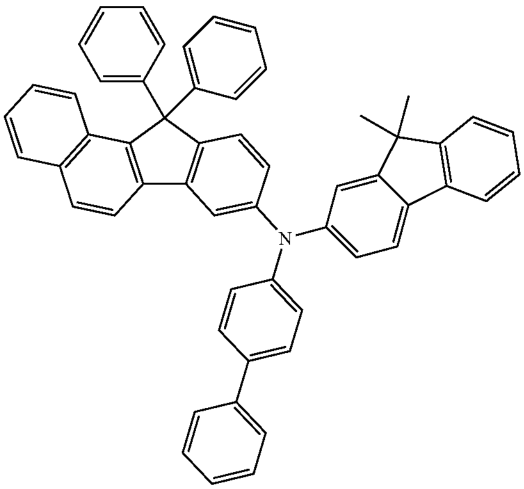

-continued
P-20
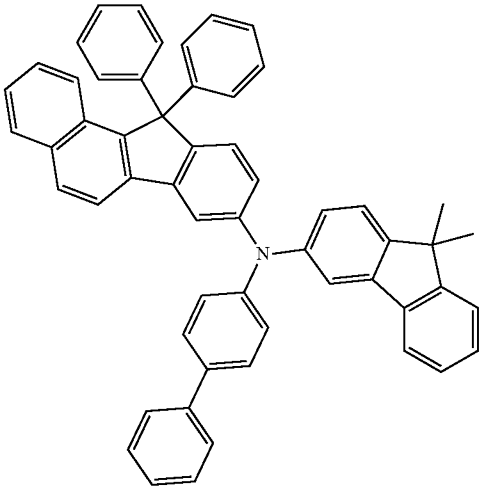
P-21
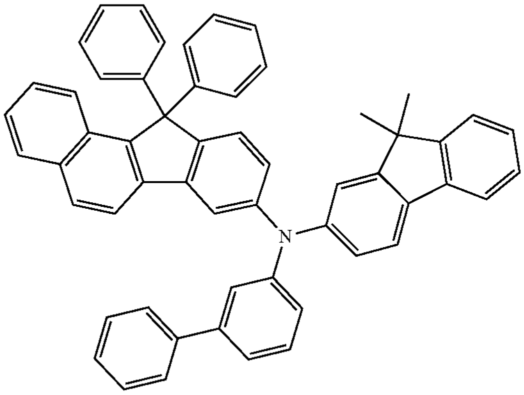
P-22
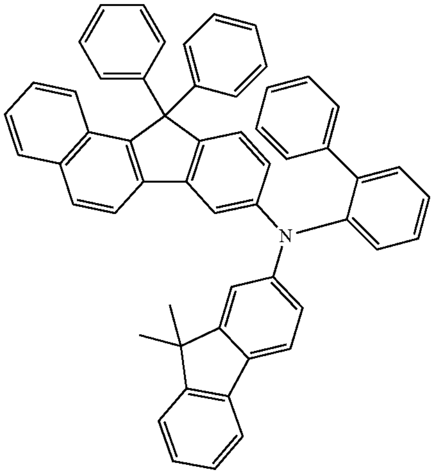
-continued
P-23
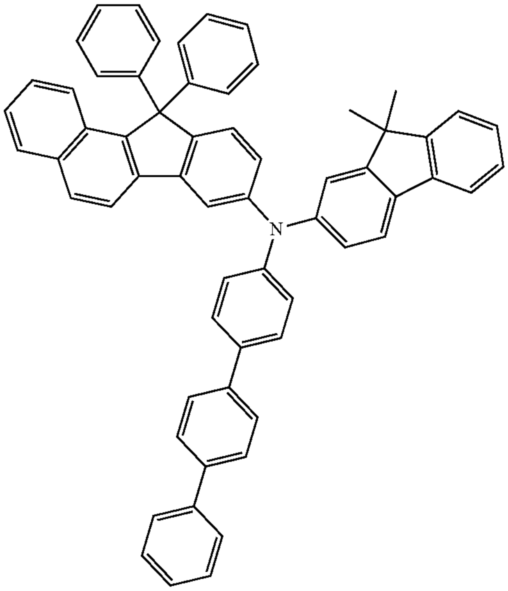
P-24
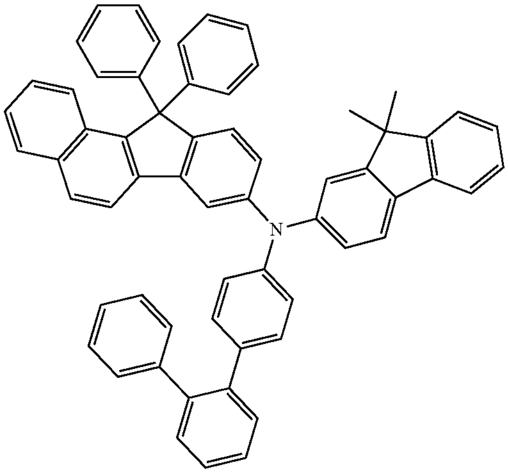
P-25
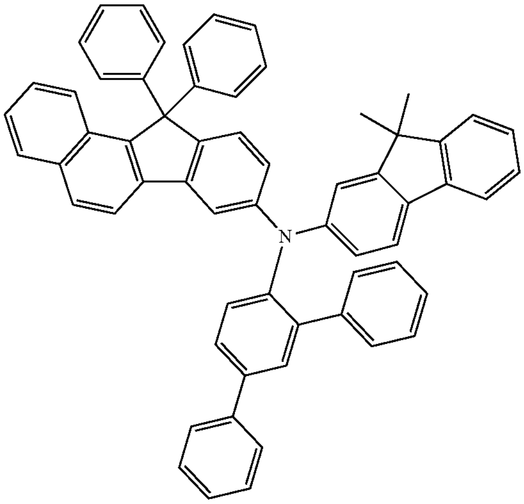

-continued
P-26
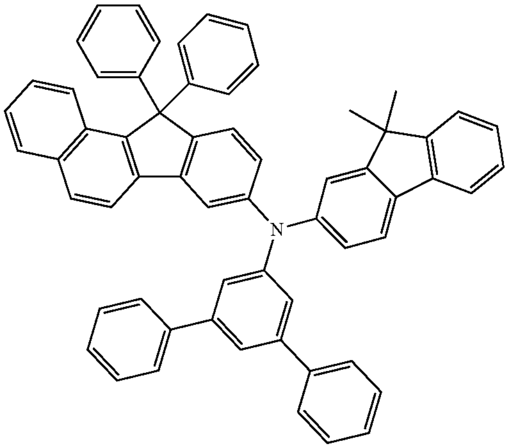
P-27
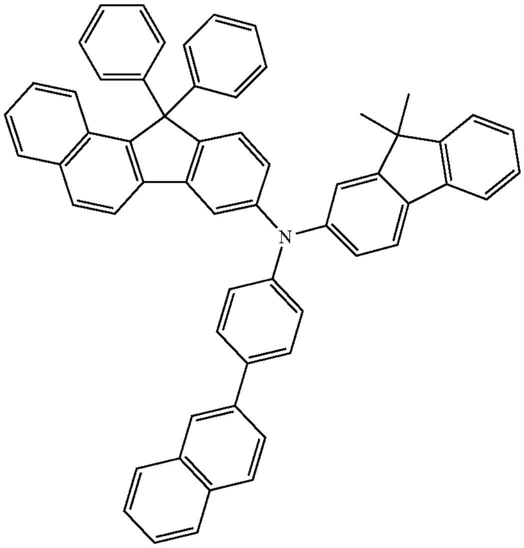
P-28
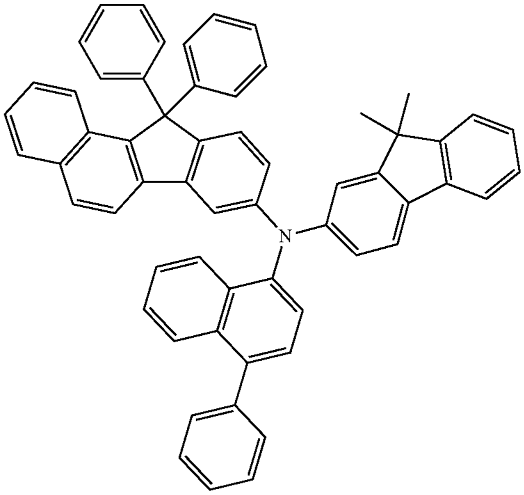
-continued
P-29
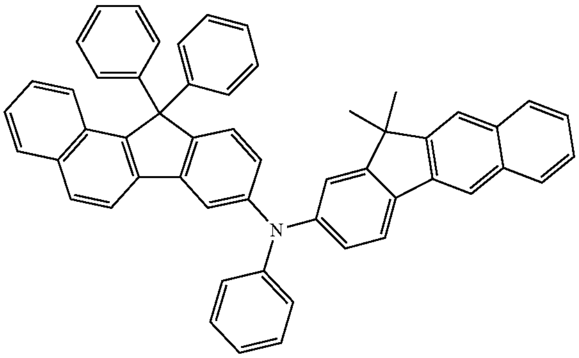
P-30
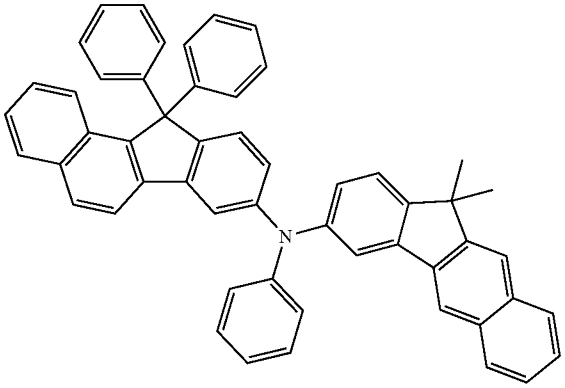
P-31
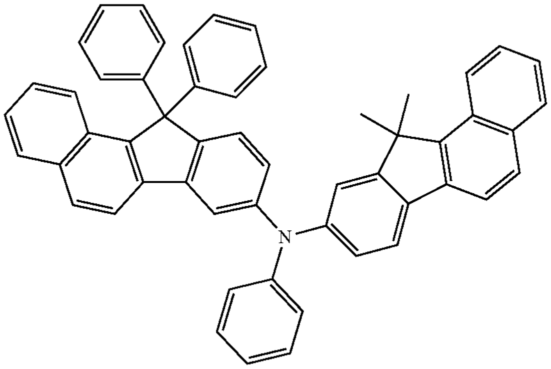
P-32
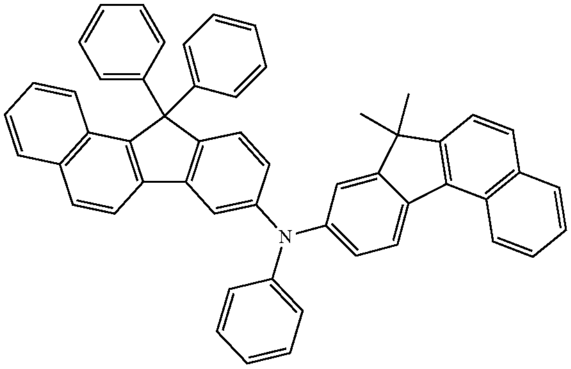

-continued
P-33
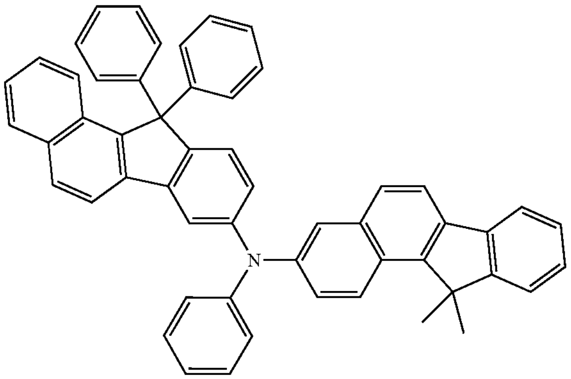
P-34
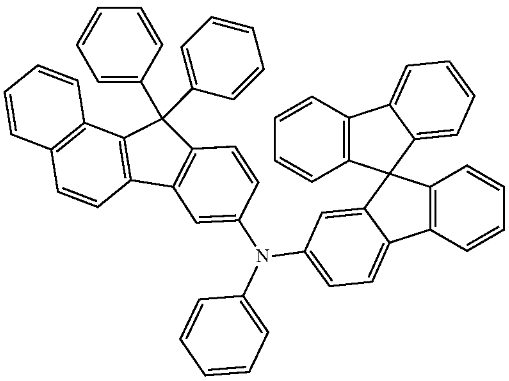
P-35
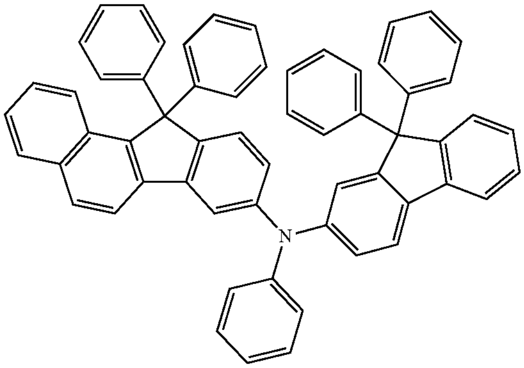
P-36
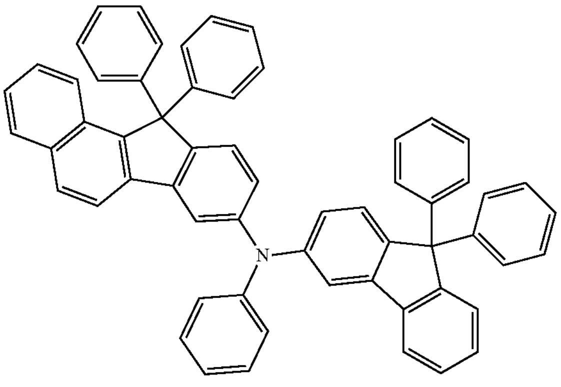
-continued
P-37
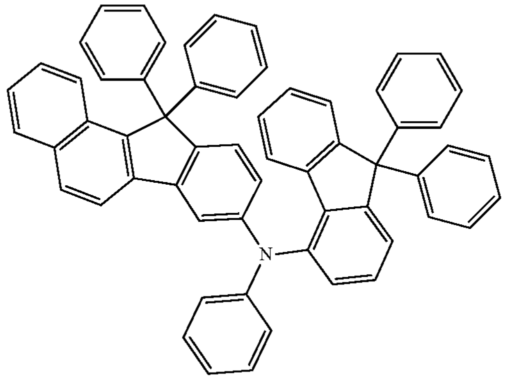
P-38
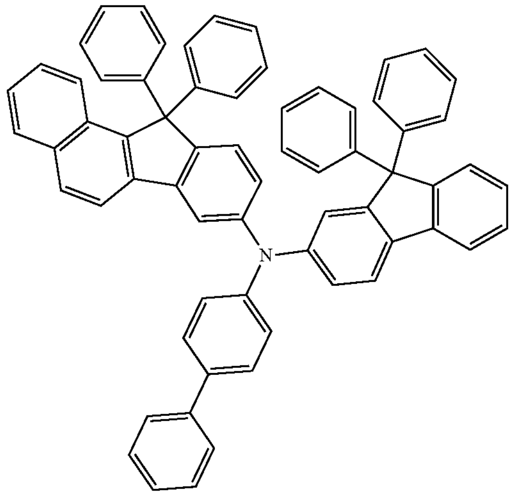
P-39
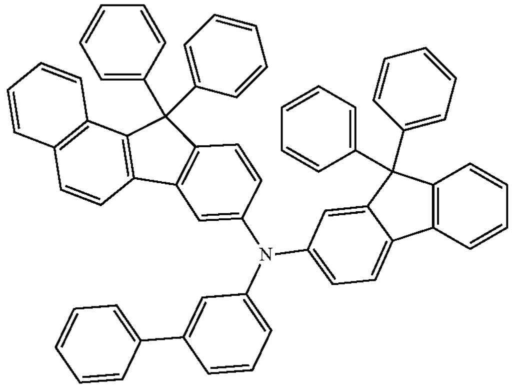

-continued
P-40
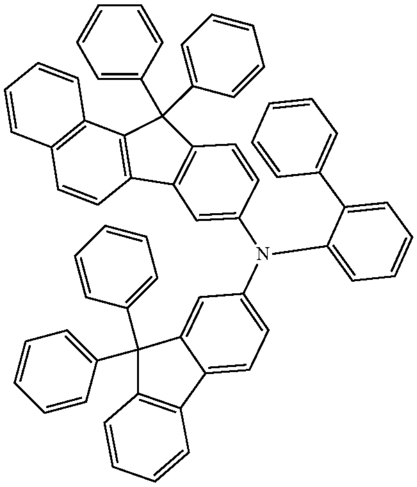
P-41
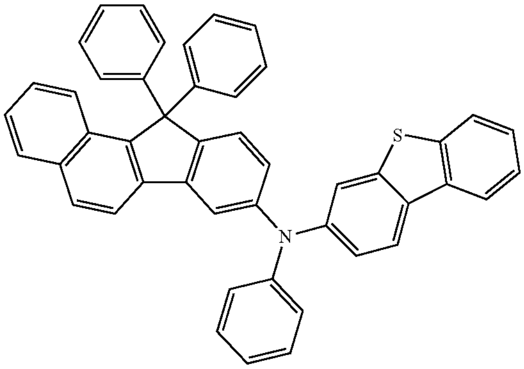
P-42
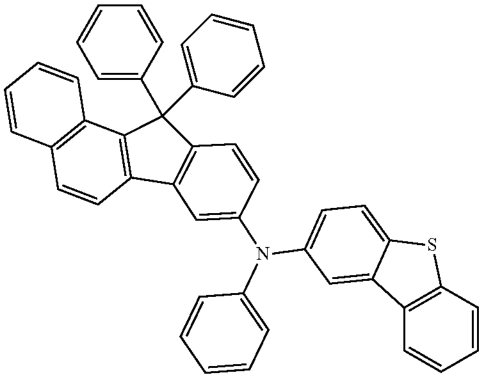
-continued
P-43
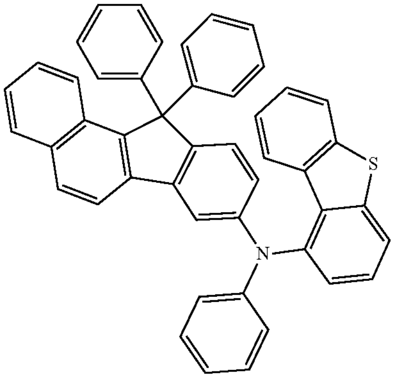
P-44
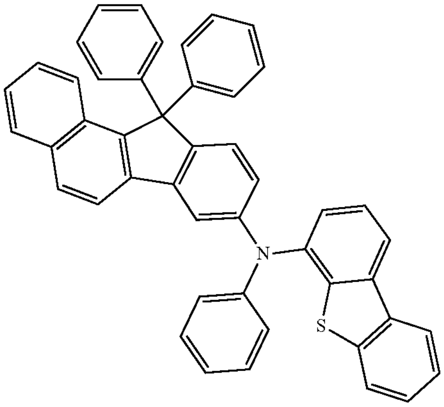
P-45
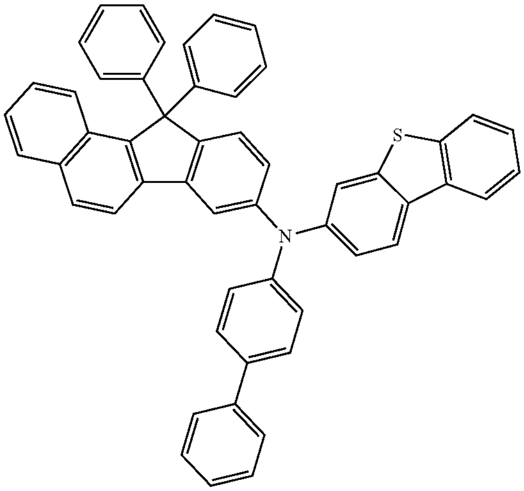

-continued
P-46
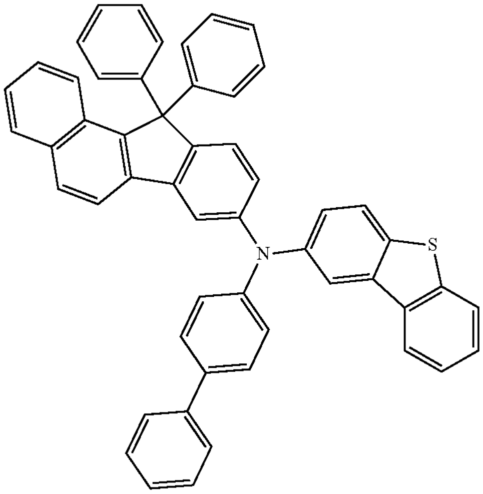
P-47
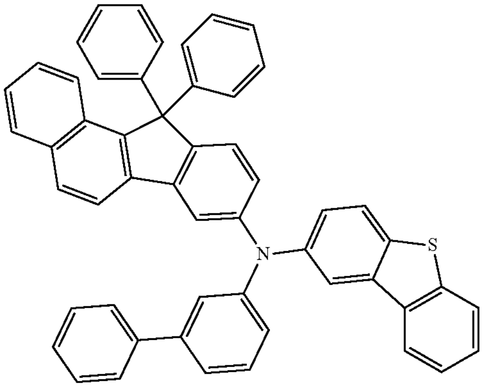
P-48
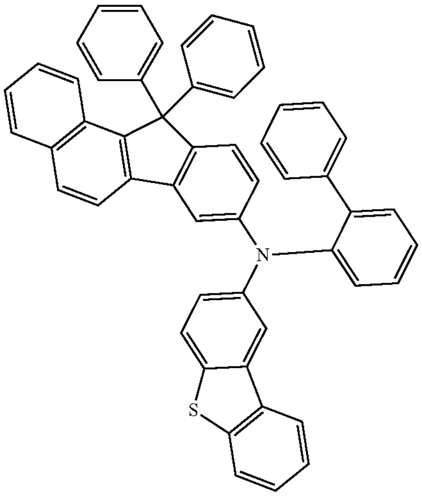
-continued
P-49
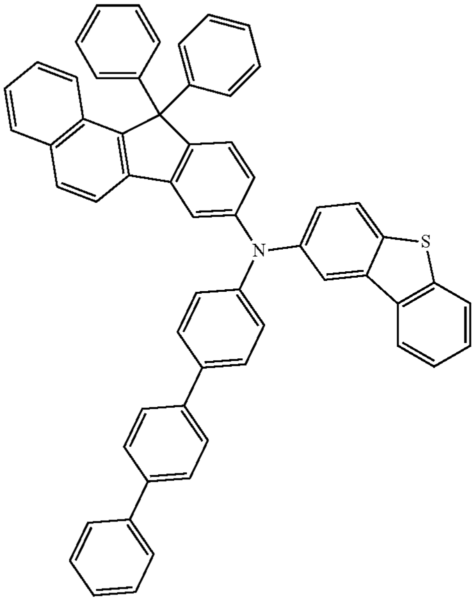
P-50
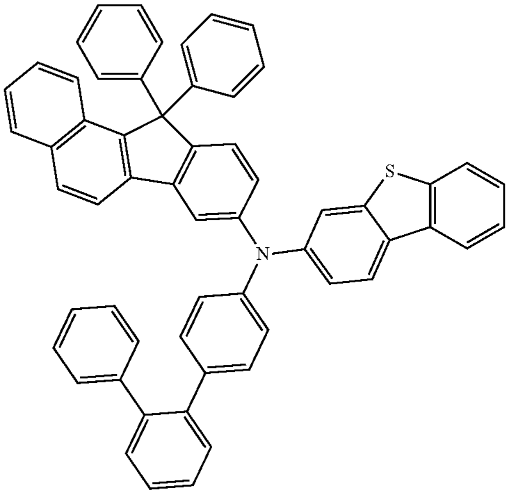
P-51
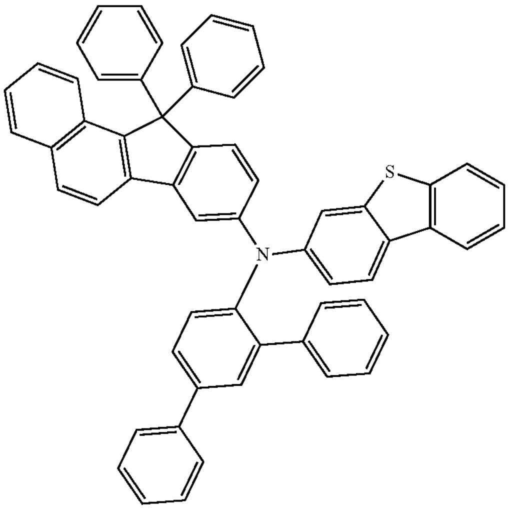

-continued
P-52
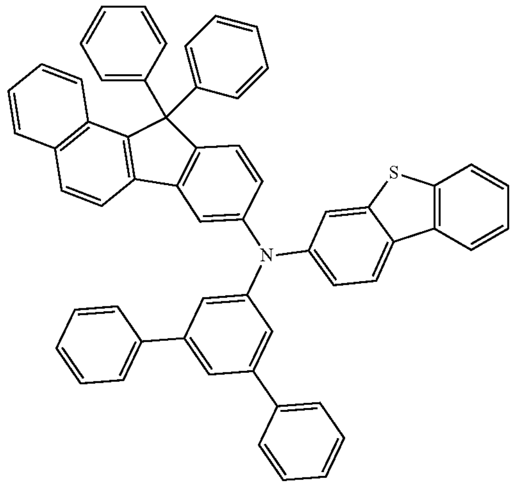
P-53
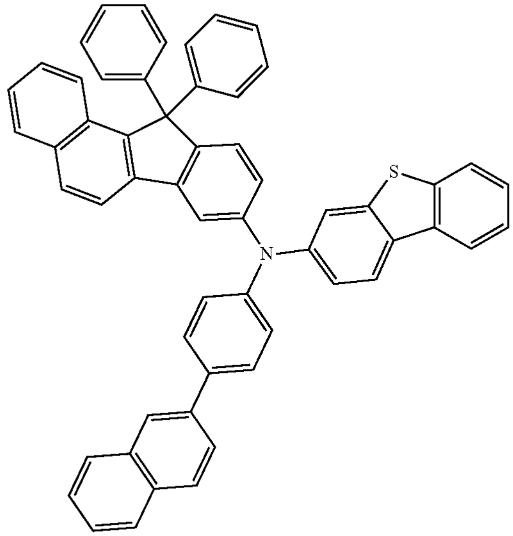
P-54
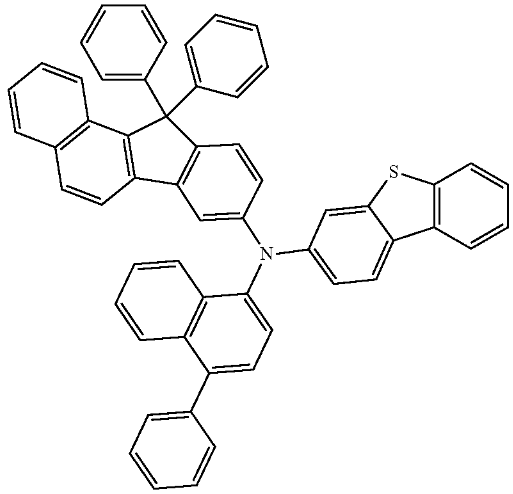
-continued
P-55
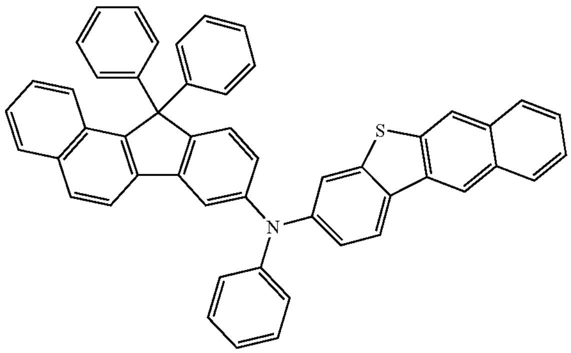
P-56
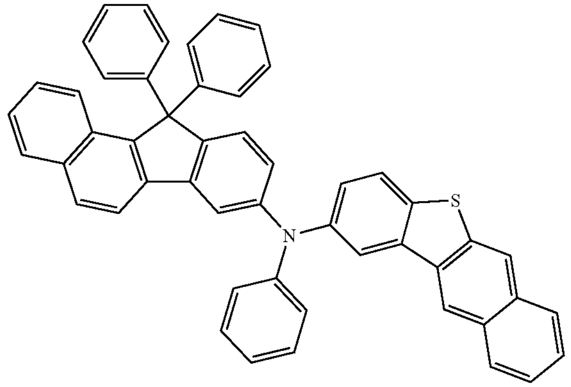
P-57
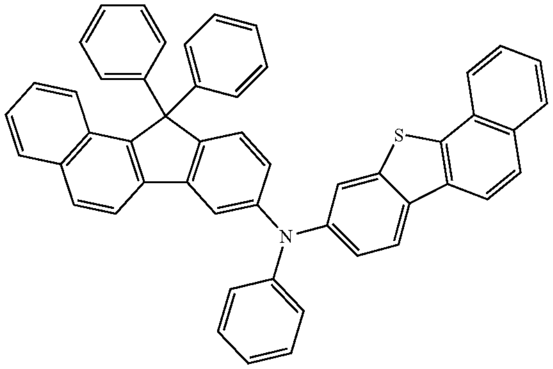
P-58
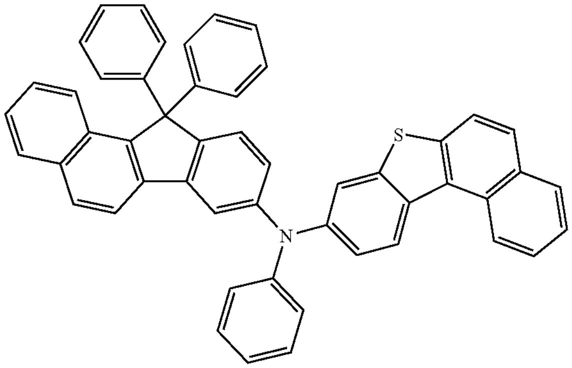

-continued
P-59
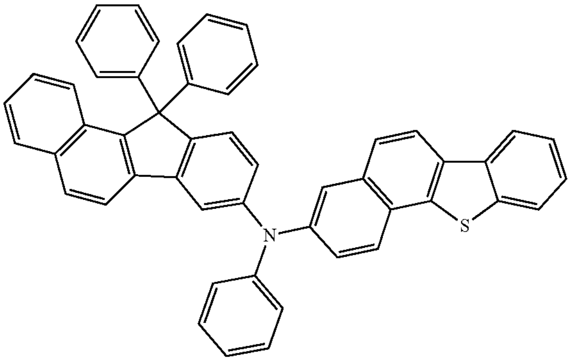
P-60
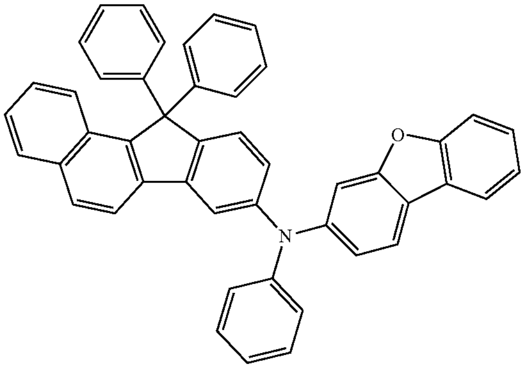
P-61
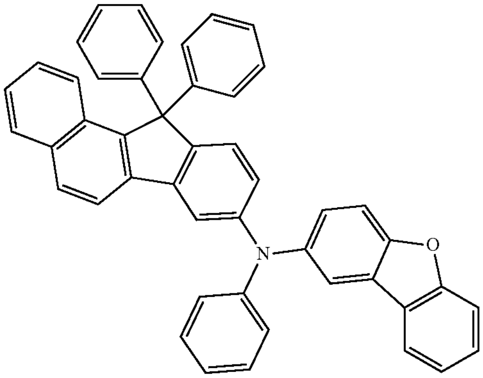
P-62
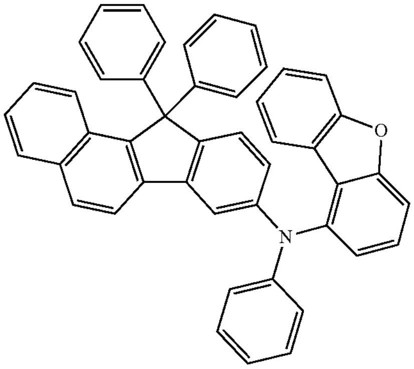
-continued
P-63
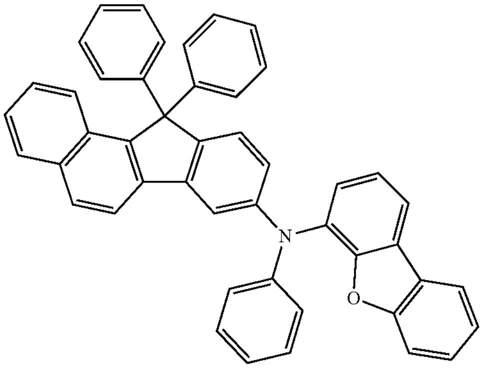
P-64
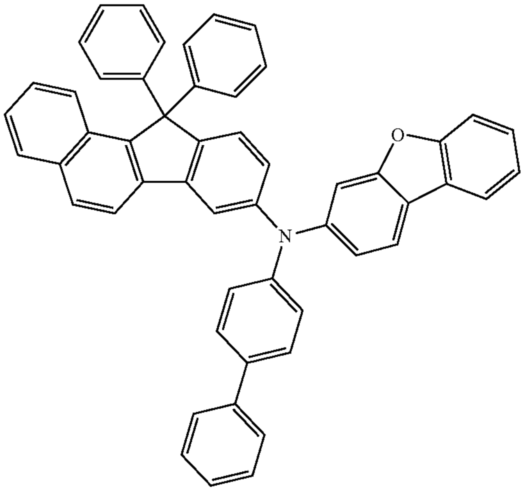
P-65
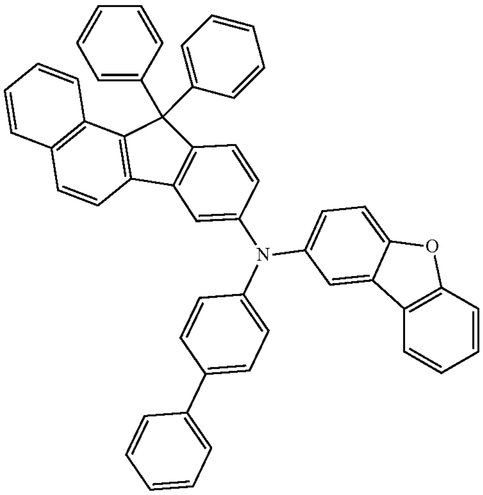

-continued
P-66
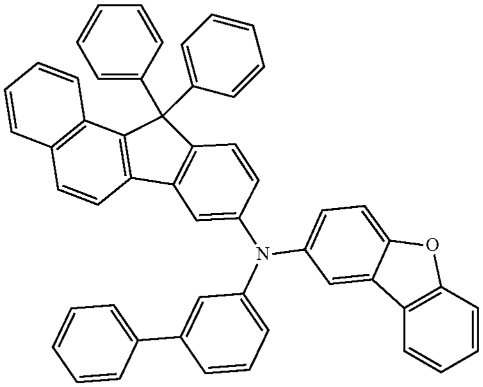
P-67
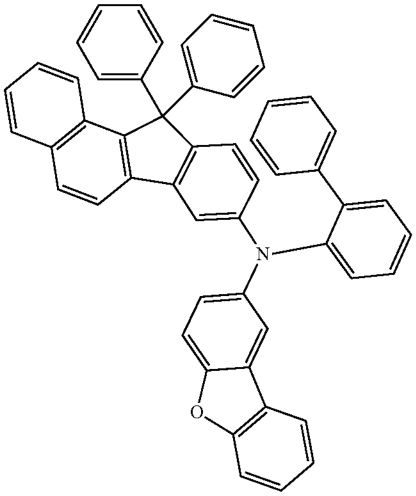
P-68
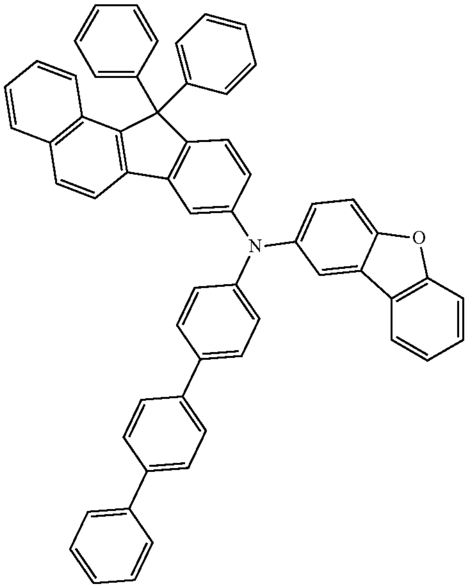
-continued
P-69
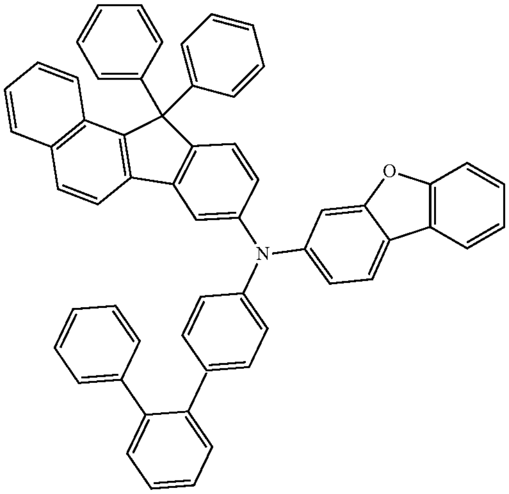
P-70
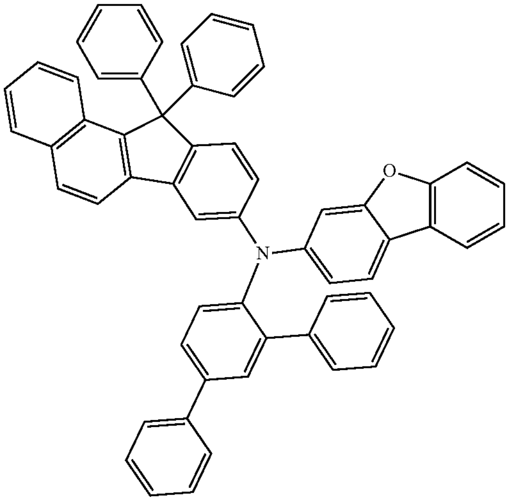
P-71
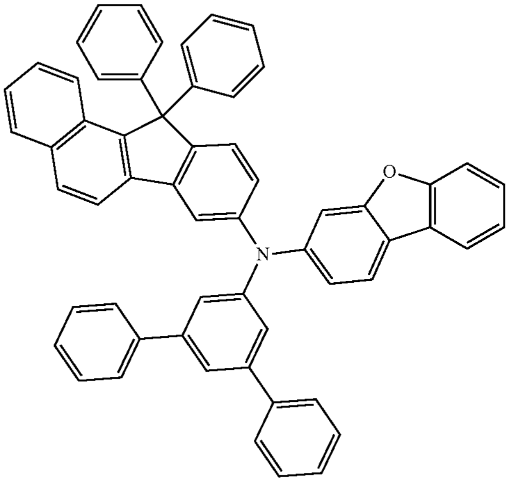

-continued
P-72
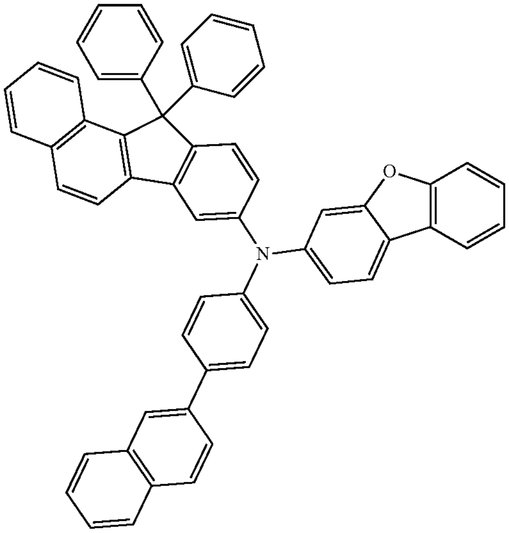
P-73
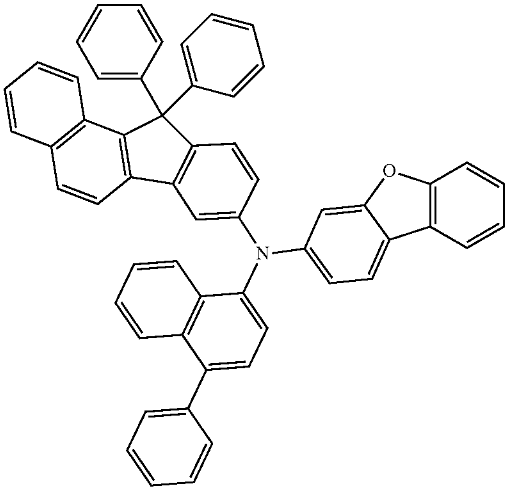
P-74
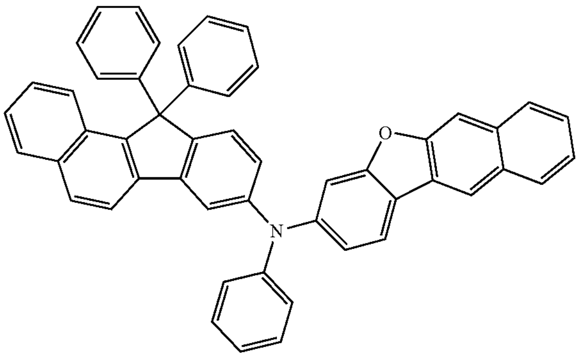
-continued
P-75
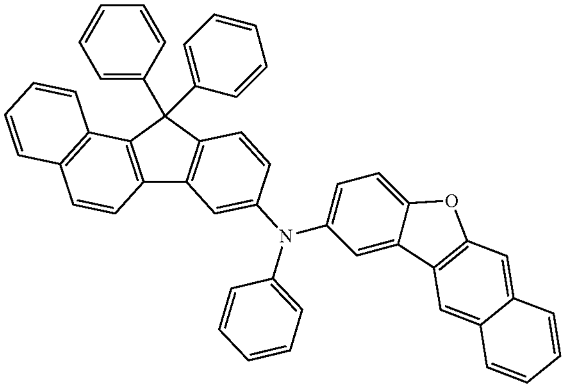
P-76
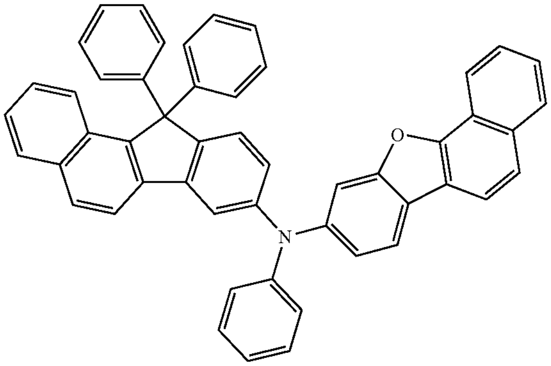
P-77
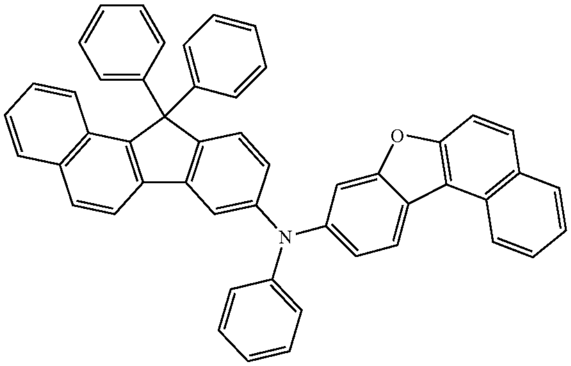
P-78
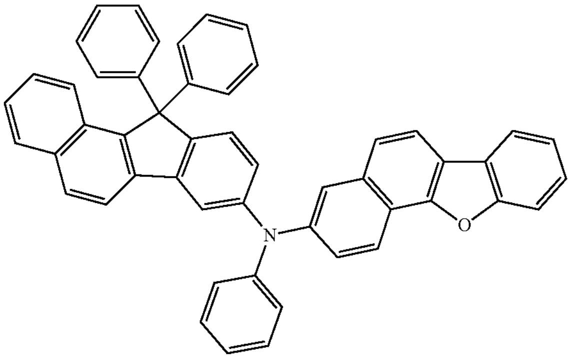

-continued
P-79
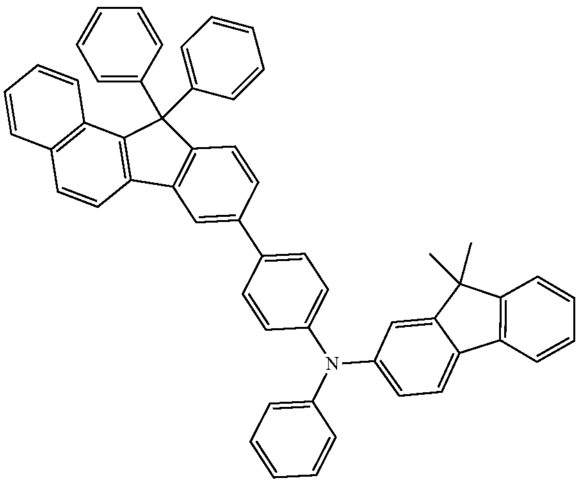
P-80
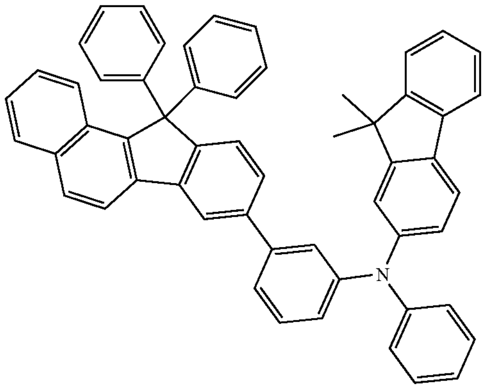
P-81
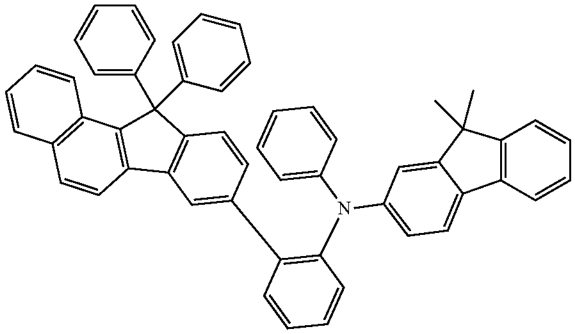
-continued
P-82
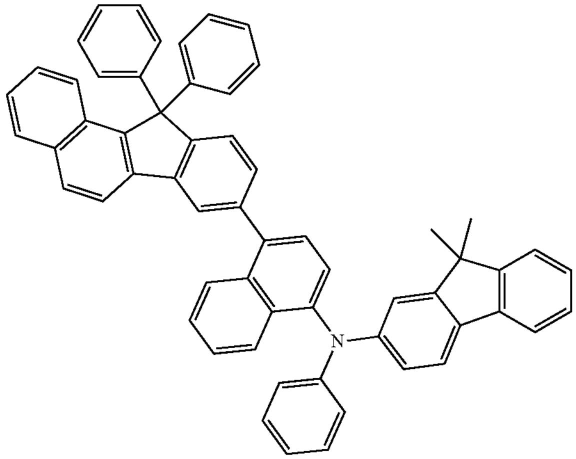
P-83
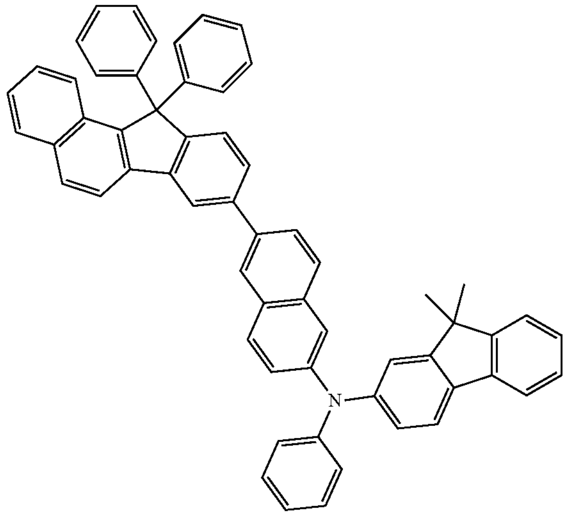
P-84
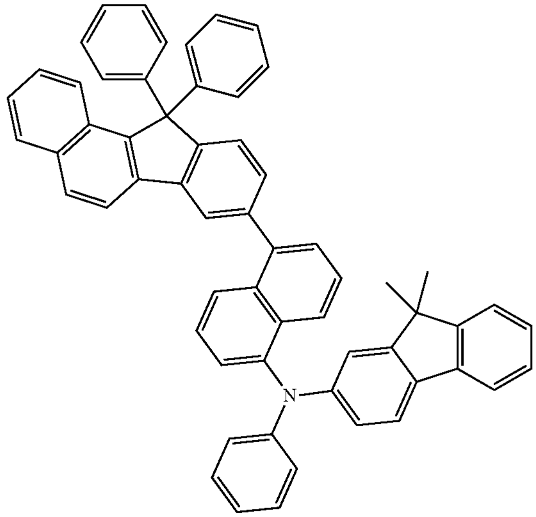

-continued
P-85
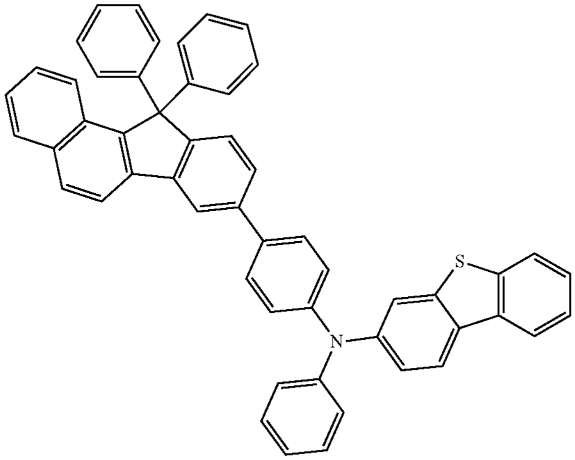
P-86
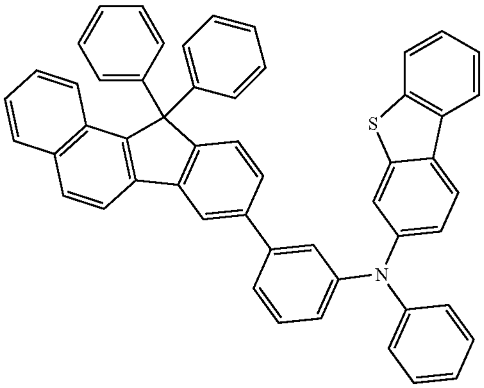
P-87
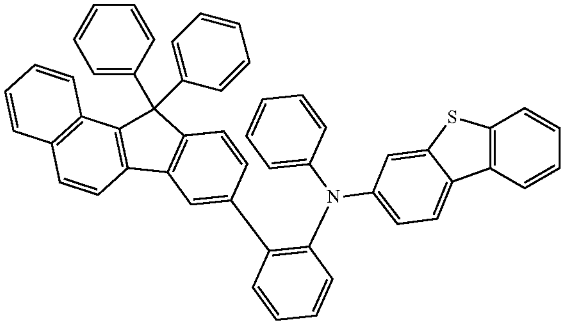
-continued
P-88
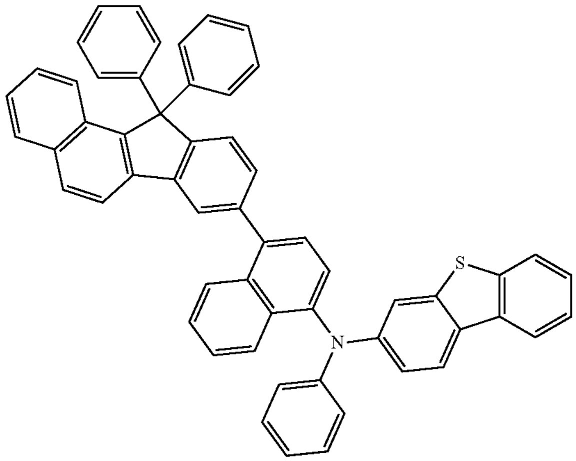
P-89
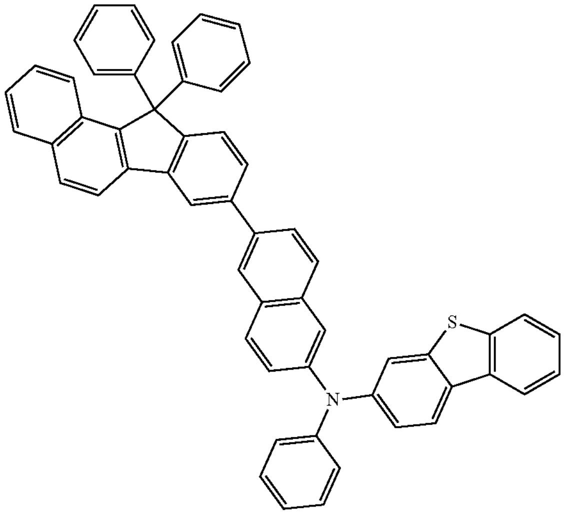
P-90
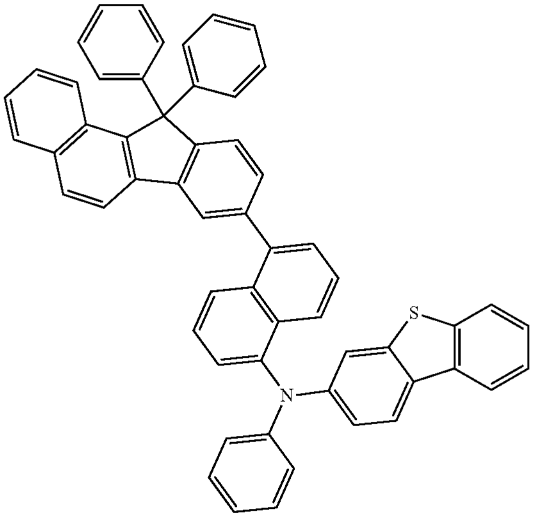

-continued
P-91
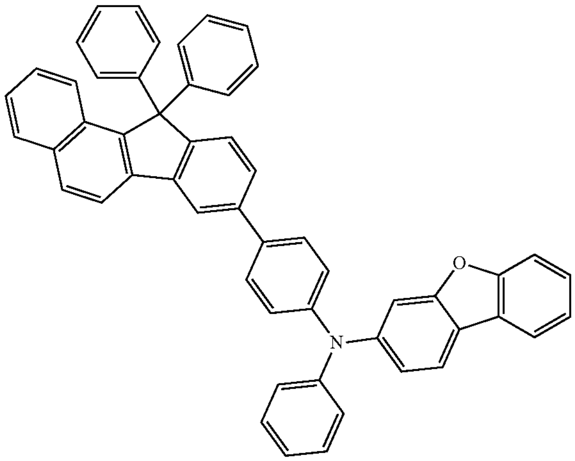
P-92
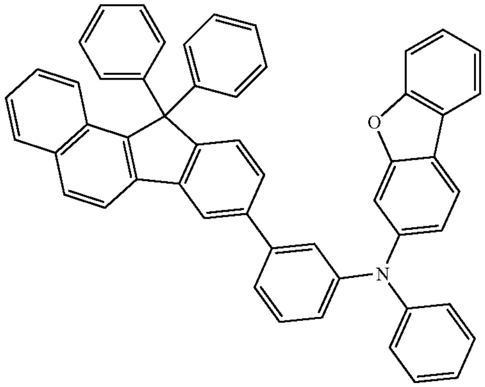
P-93
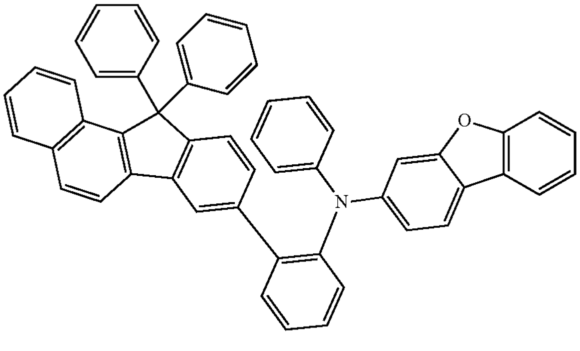
-continued
P-94
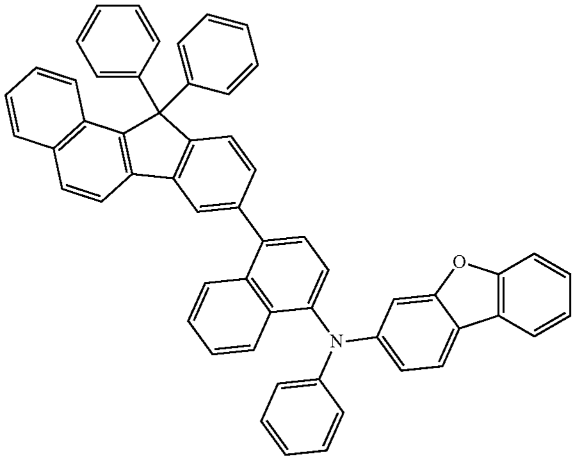
P-95
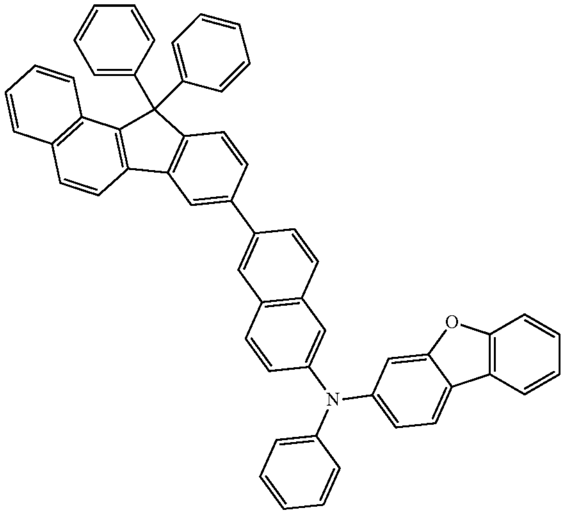
P-96
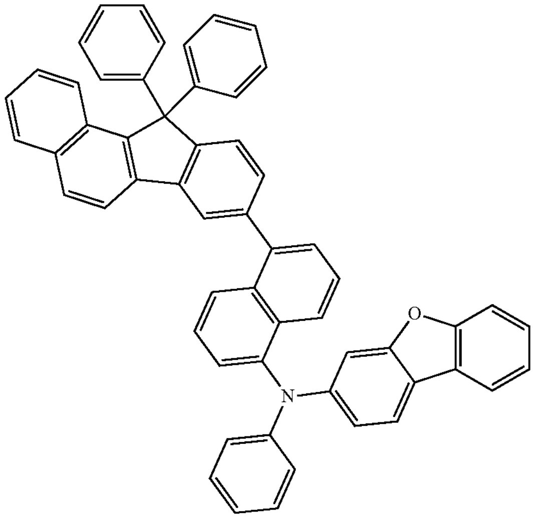

-continued
P-97
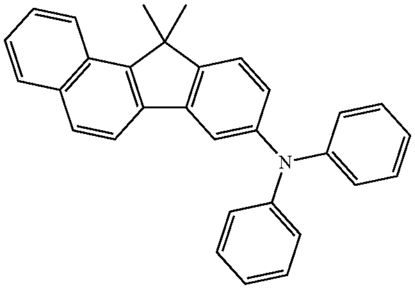
P-98
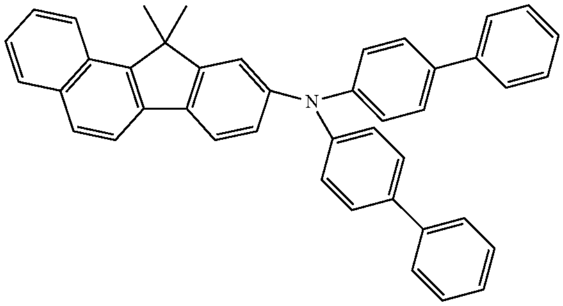
P-99
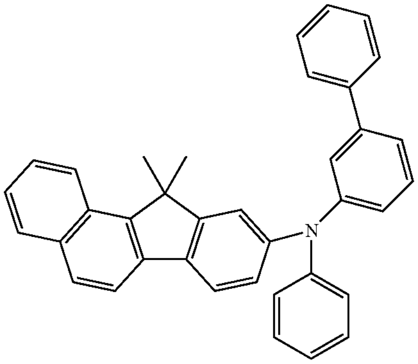
P-100
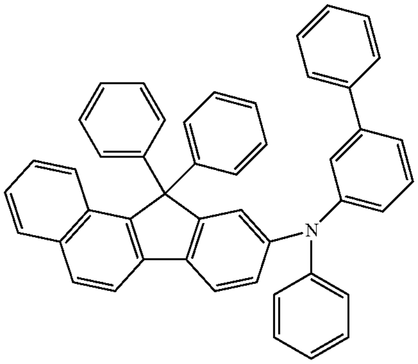
P-101
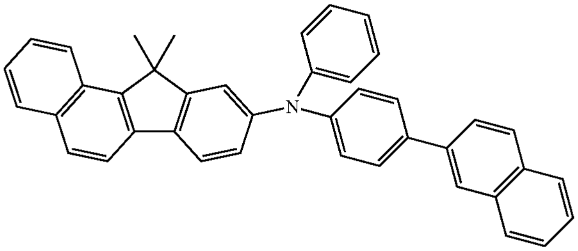
-continued
P-102
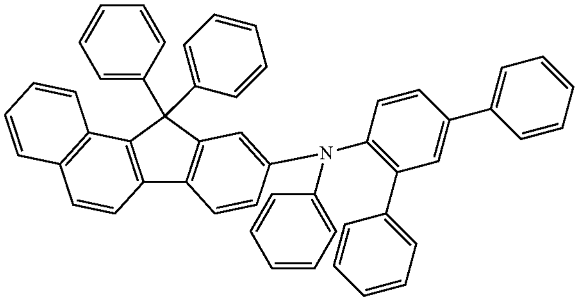
P-103
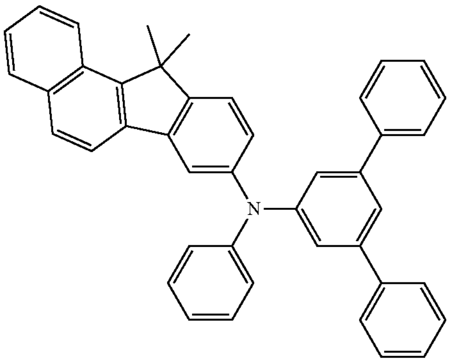
P-104
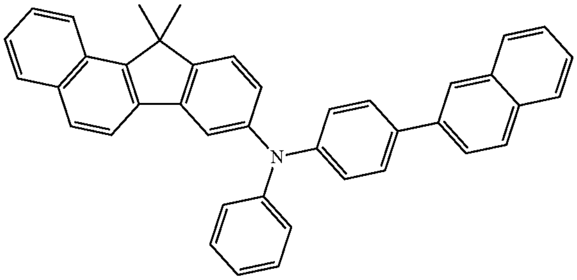
P-105
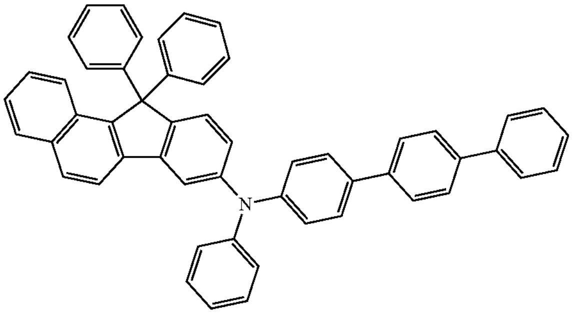

-continued
P-106
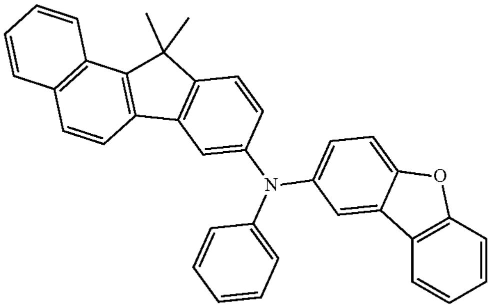
P-107
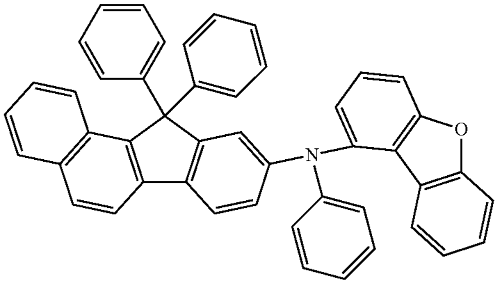
P-108
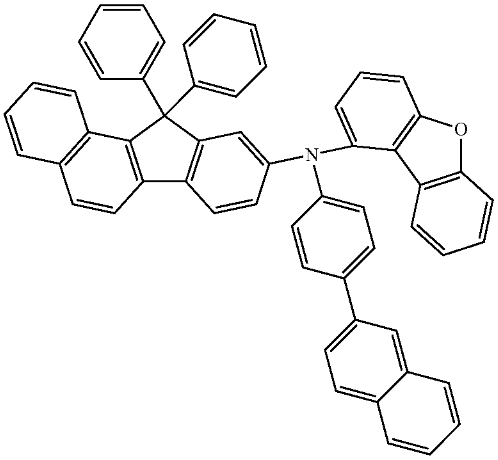
P-109
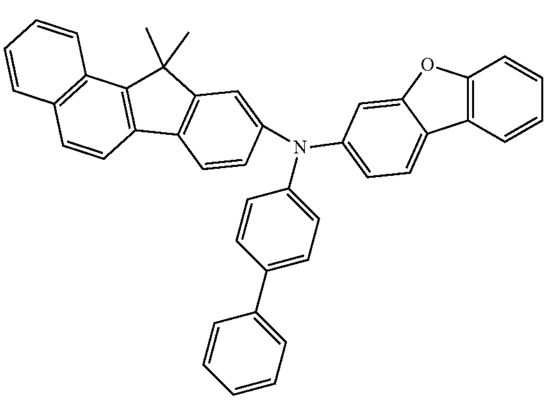
-continued
P-110
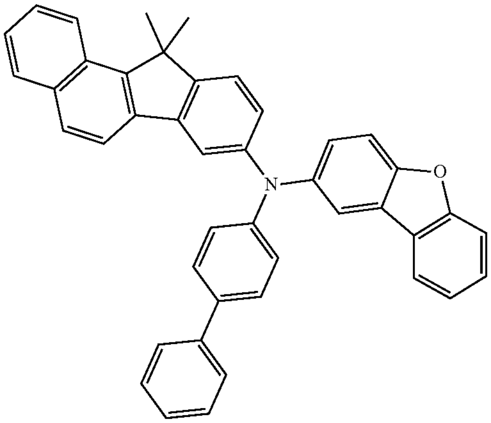
P-111
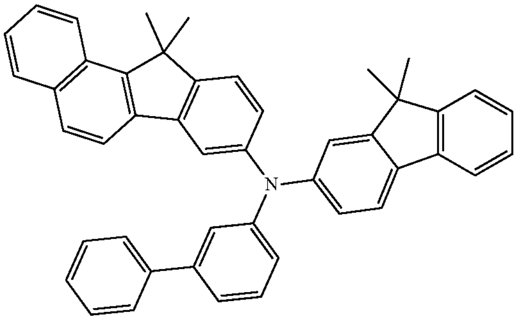
P-112
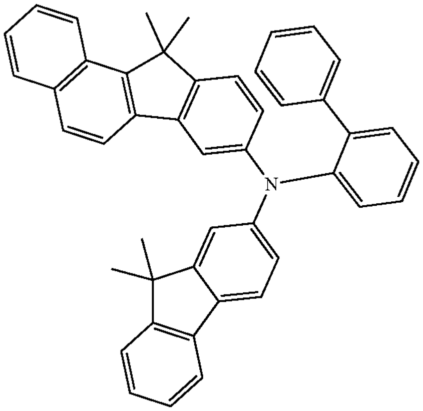

P-113
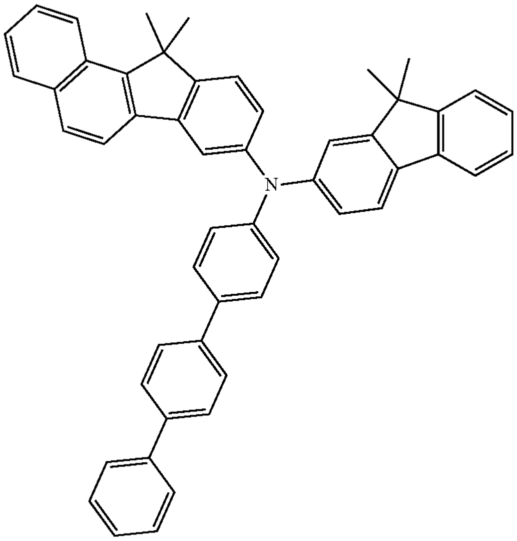
P-114
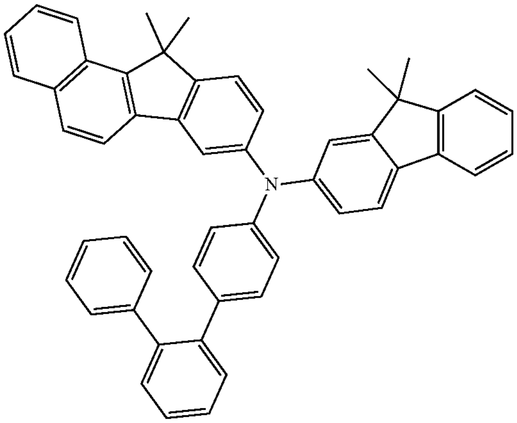
P-115
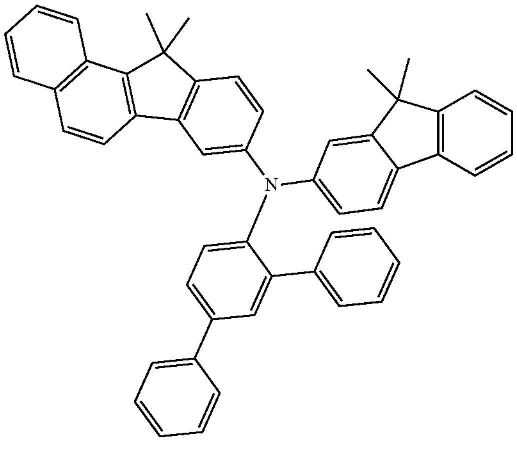
P-116
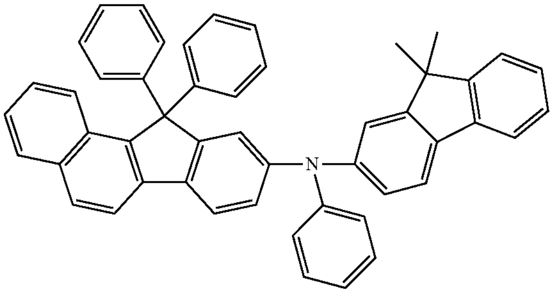
P-117
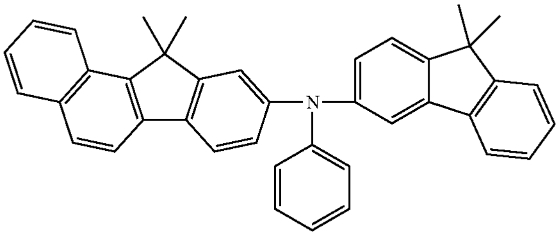
P-118
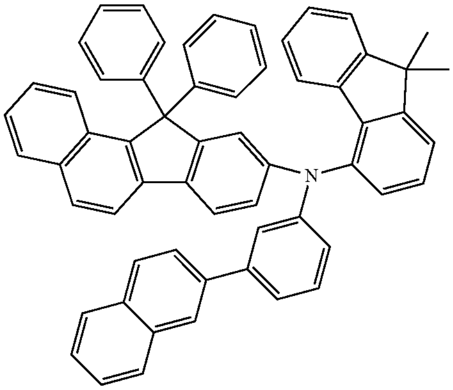
P-119
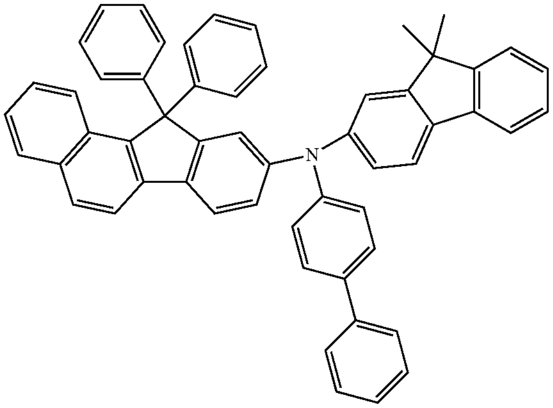

-continued
P-120
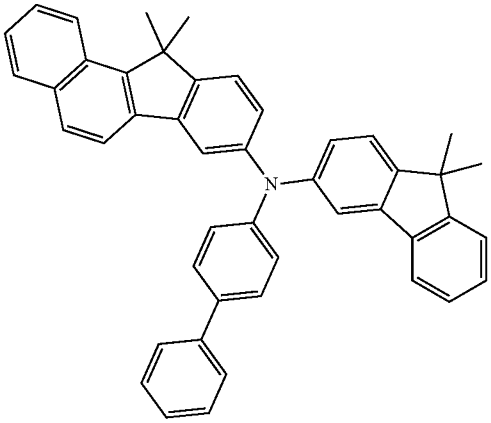
P-121
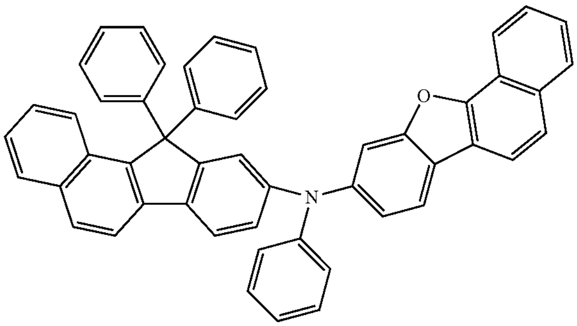
P-122
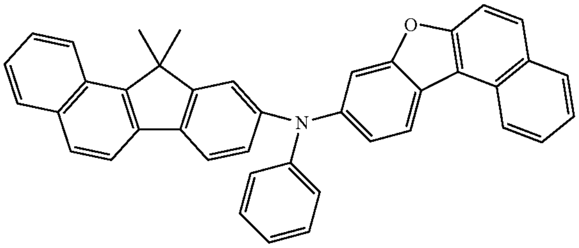
P-123
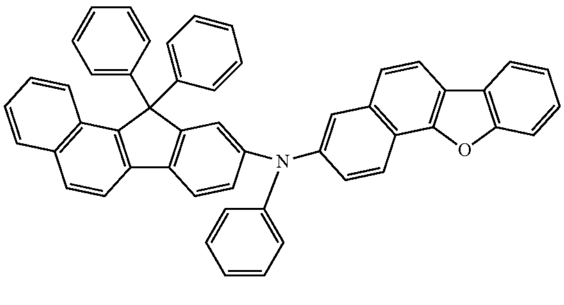
-continued
P-124
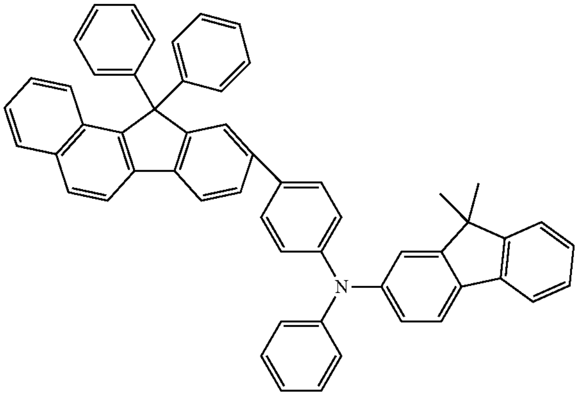
P-125
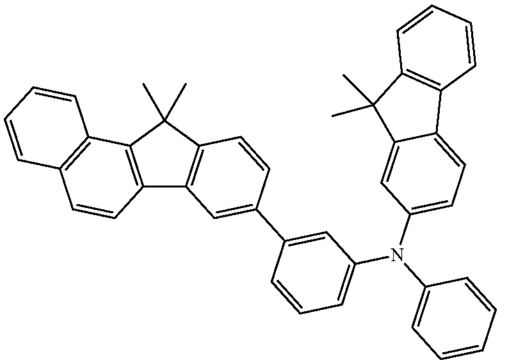
The compound represented by formula 2 may be at least one selected from the following compounds, but is not limited thereto.
C1-1
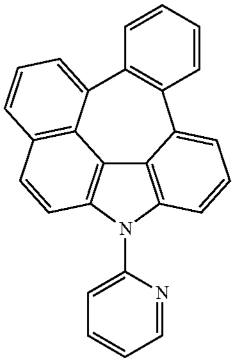

-continued
C1-2
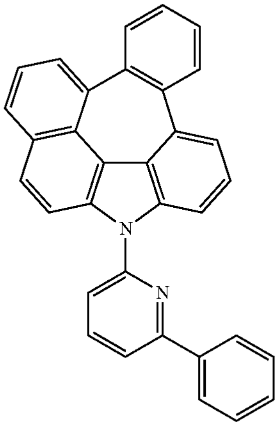
C1-3
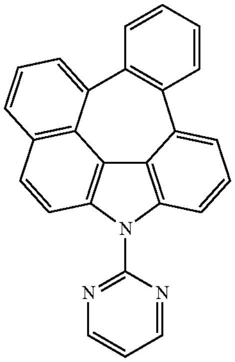
C1-4
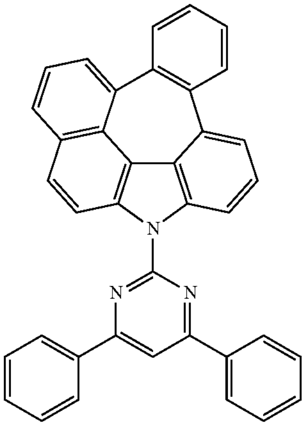
C1-5
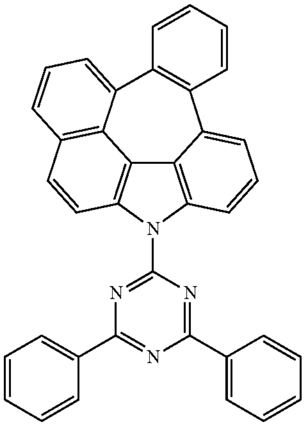
-continued
C1-6
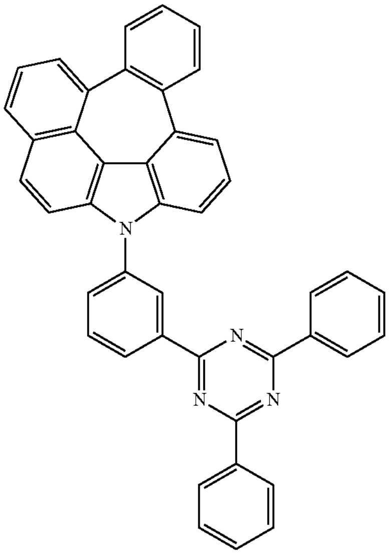
C1-7
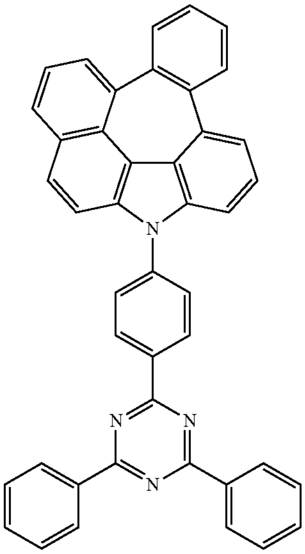
C1-8
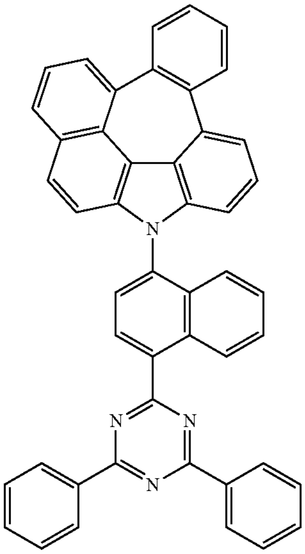

-continued
C1-9
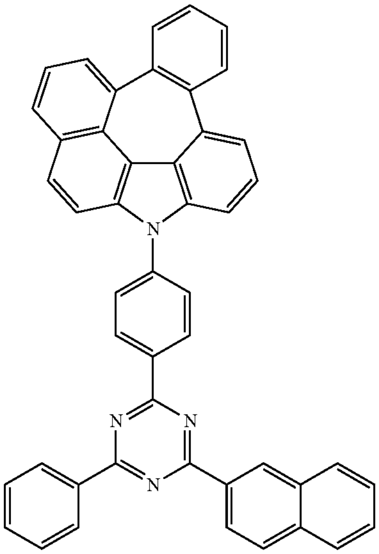
C1-10
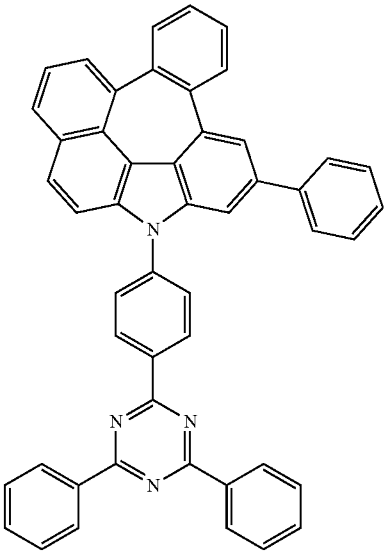
C1-11
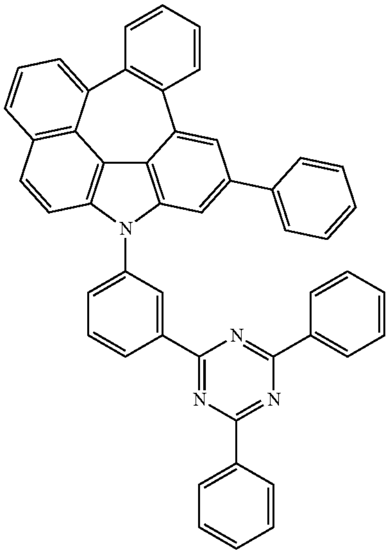
-continued
C1-12
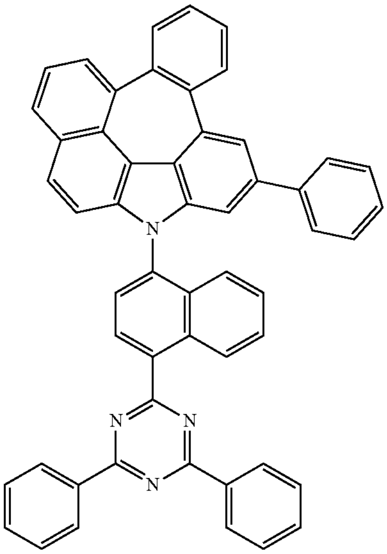
C1-13
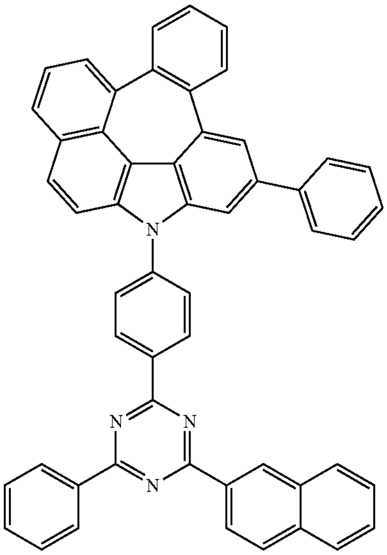
C1-14
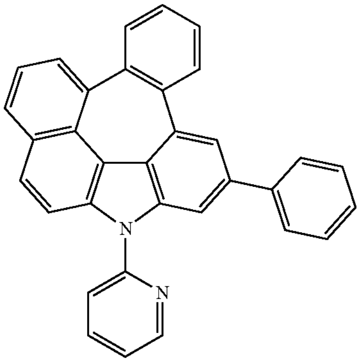

-continued
C1-15
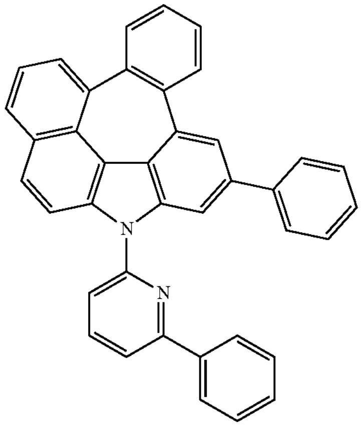
C1-16
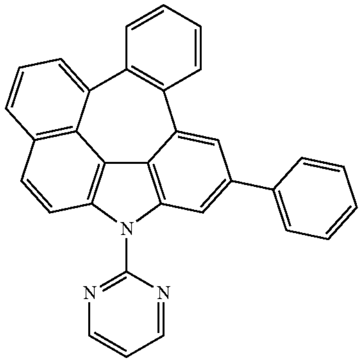
C1-17
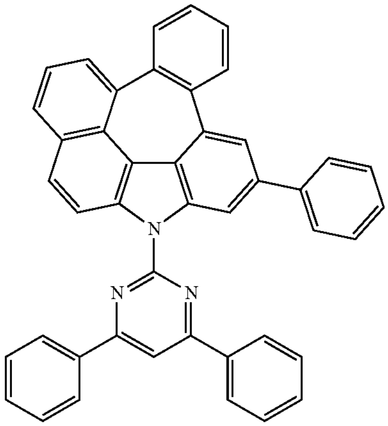
C1-18
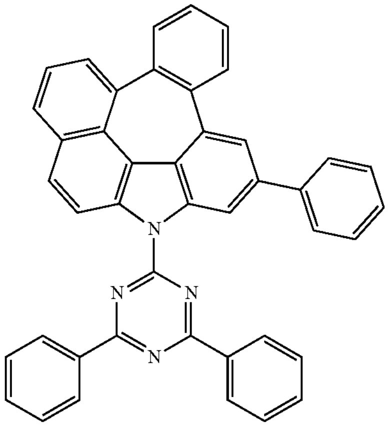
-continued
C1-19
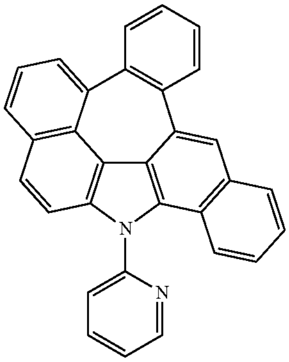
C1-20
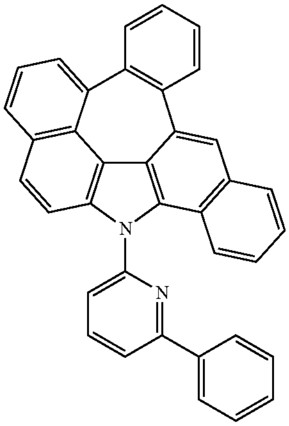
C1-21
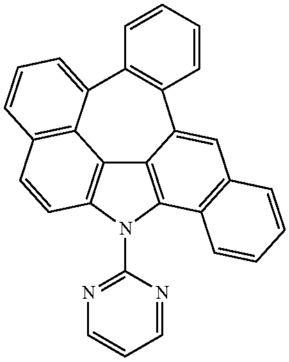
C1-22
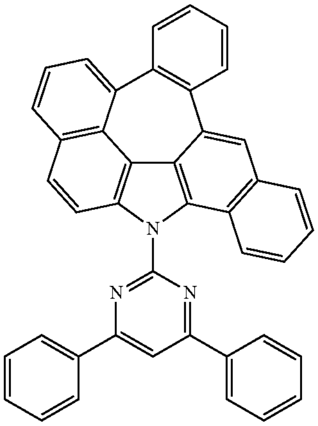

-continued
C1-23
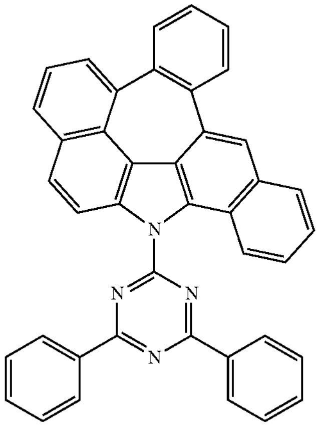
C1-24
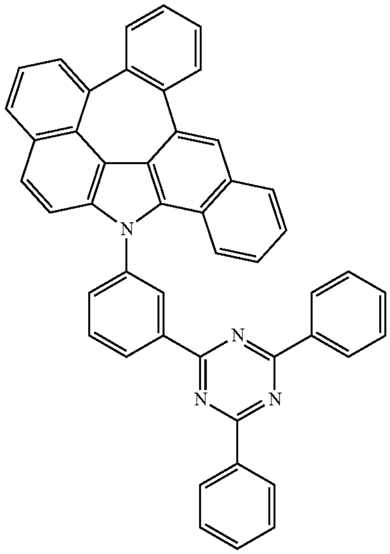
C1-25
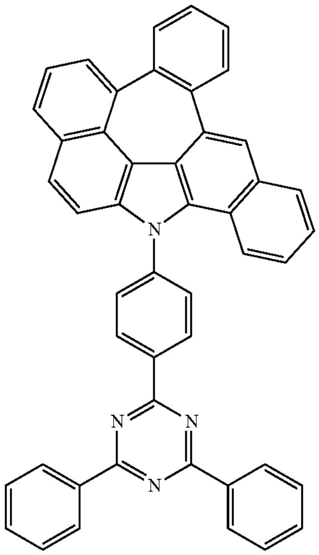
-continued
C1-26
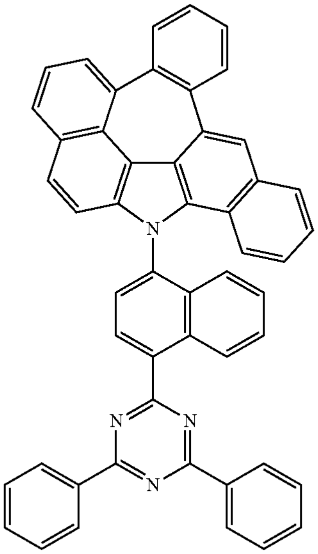
C1-27
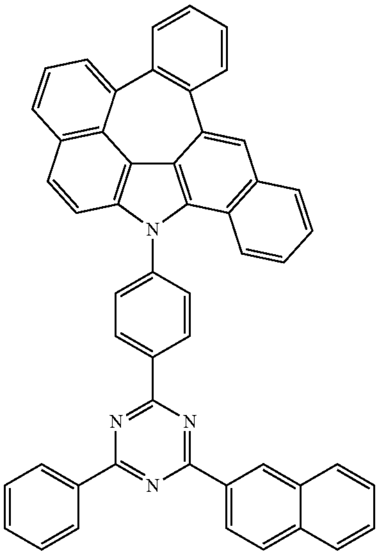
C1-28
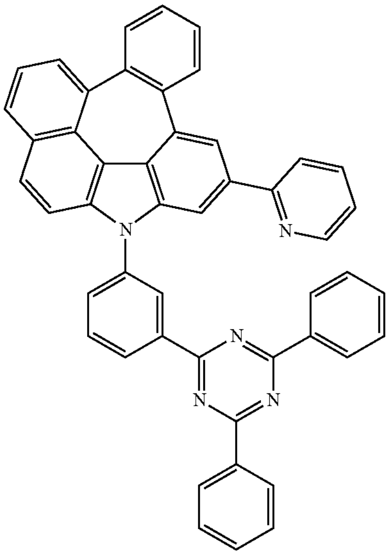

-continued
C1-29
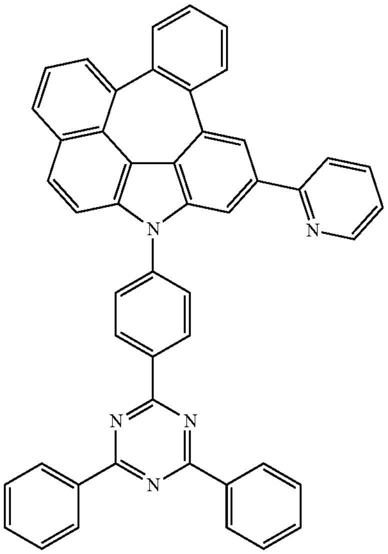
C1-30
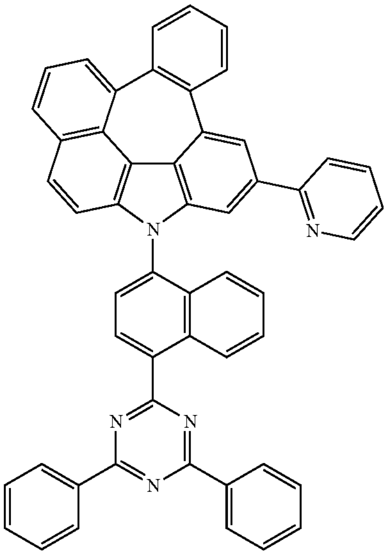
C1-31
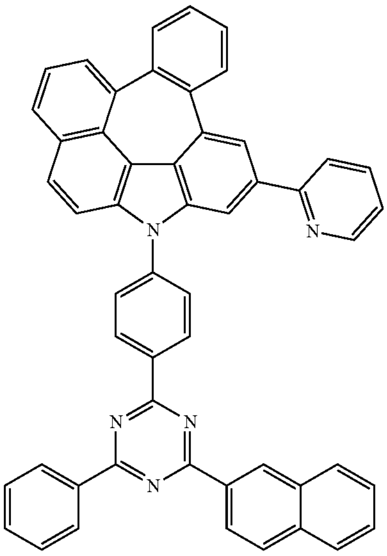
-continued
C1-33
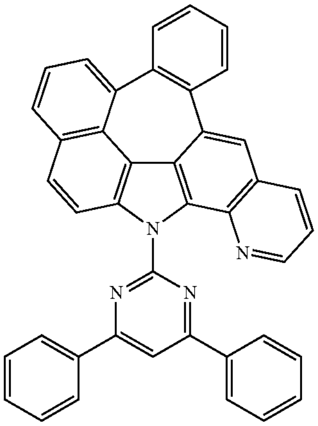
C1-34
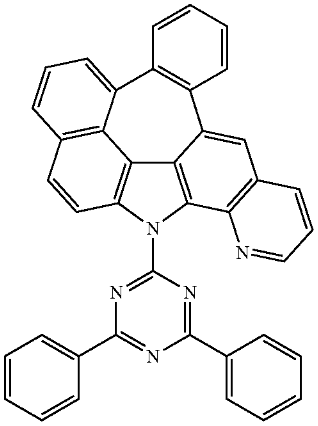
C1-35
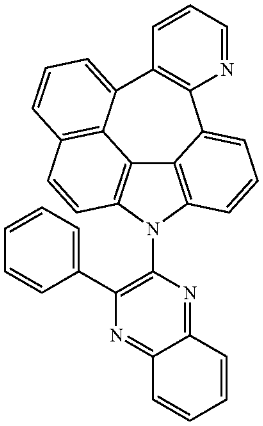

-continued
C1-36
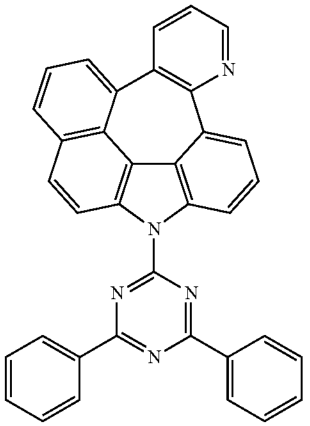
C1-37
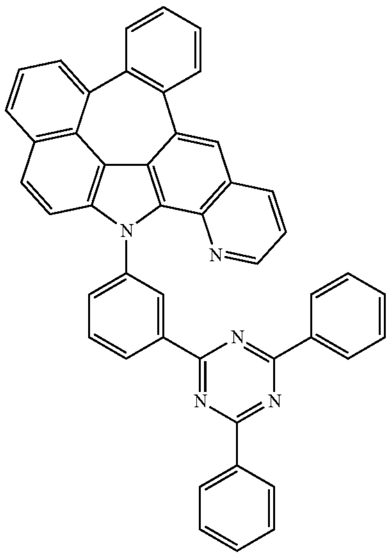
C1-38
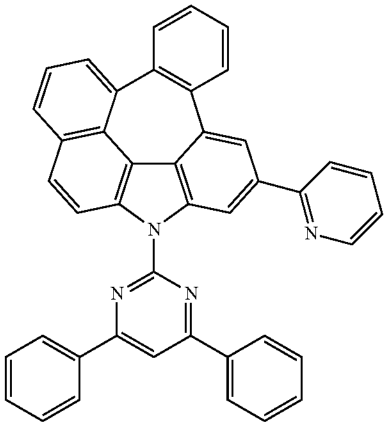
-continued
C1-39
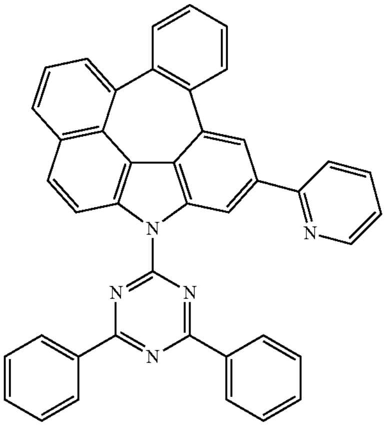
C1-40
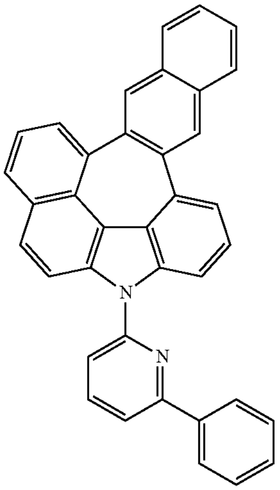
C1-41
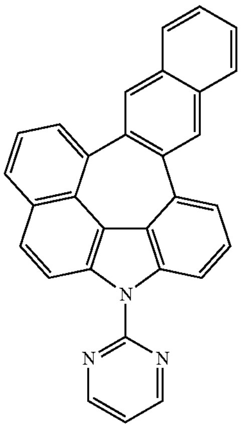

-continued
C1-42
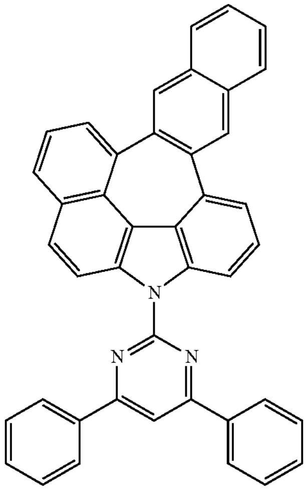
C1-43
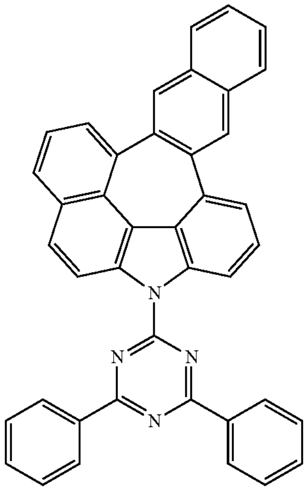
C1-44
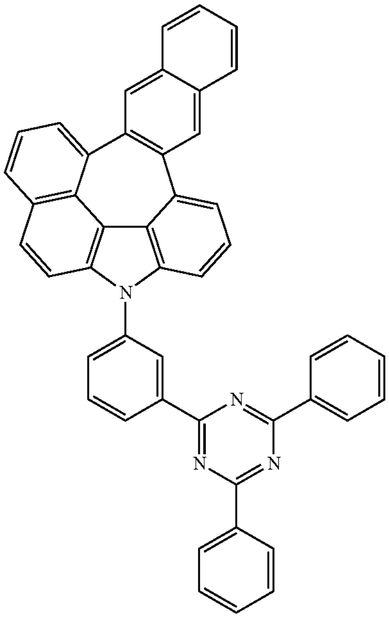
-continued
C1-45
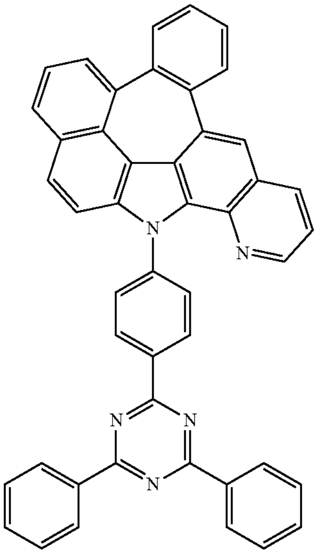
C1-46
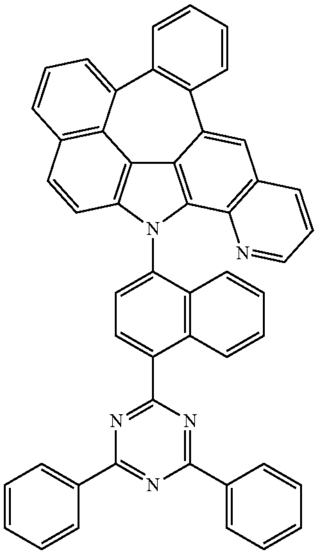
C1-47
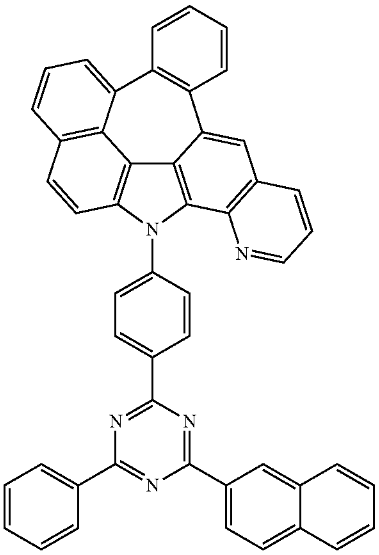

C1-48
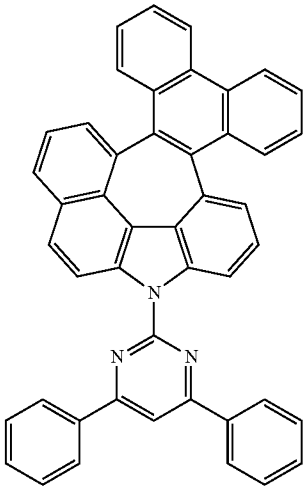
C1-49
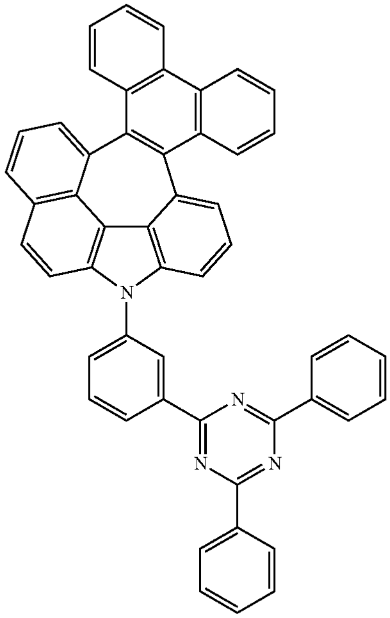
C1-50
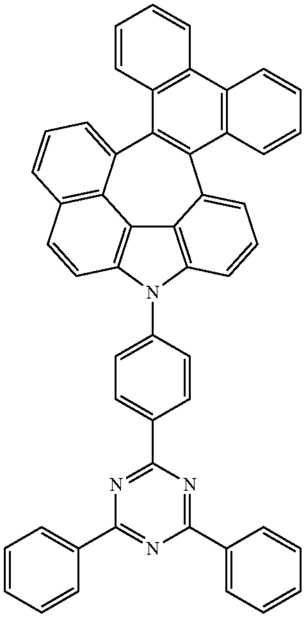
C1-51
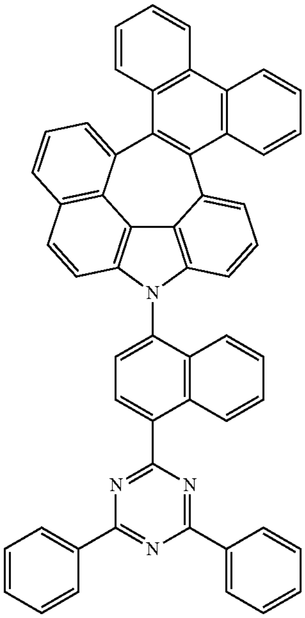

-continued
C1-52
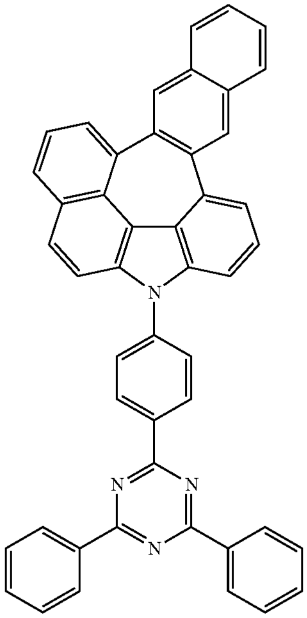
C1-53
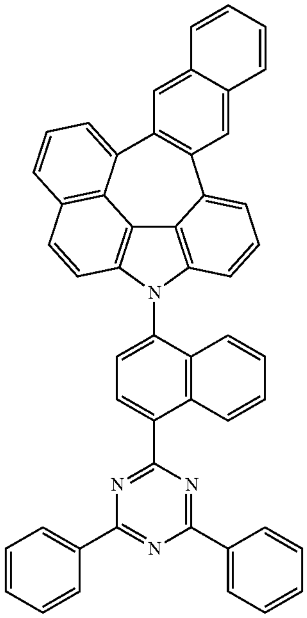
-continued
C1-54
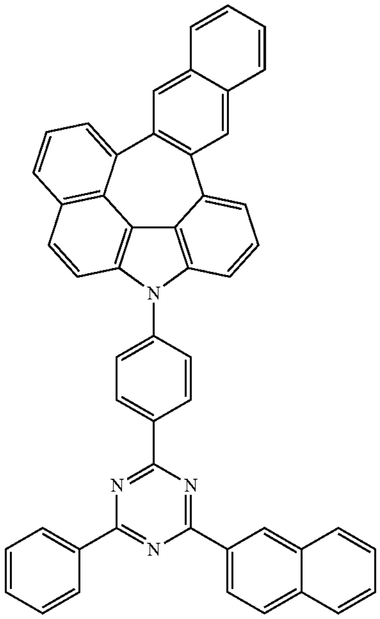
C1-55
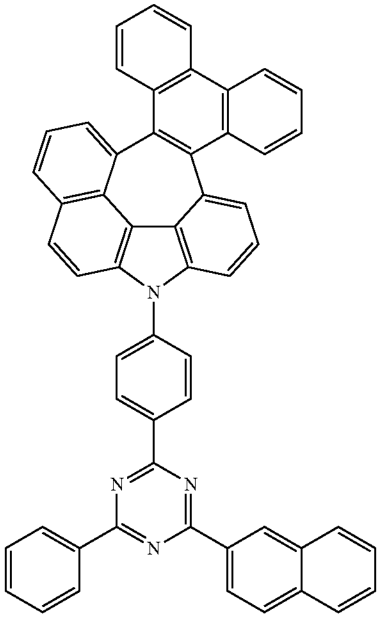

-continued
C1-56
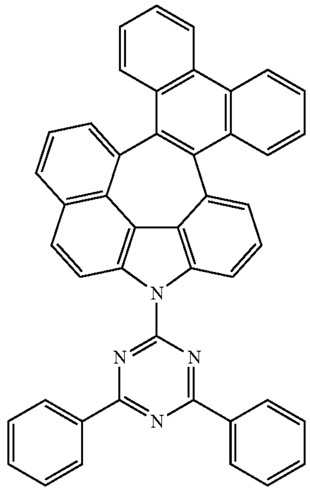
C1-57
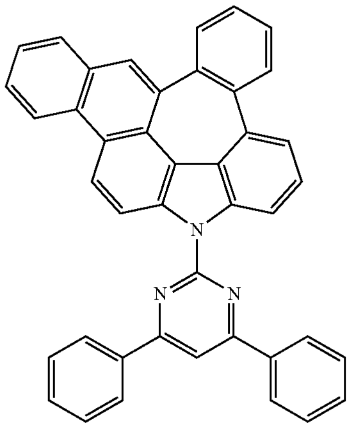
C1-58
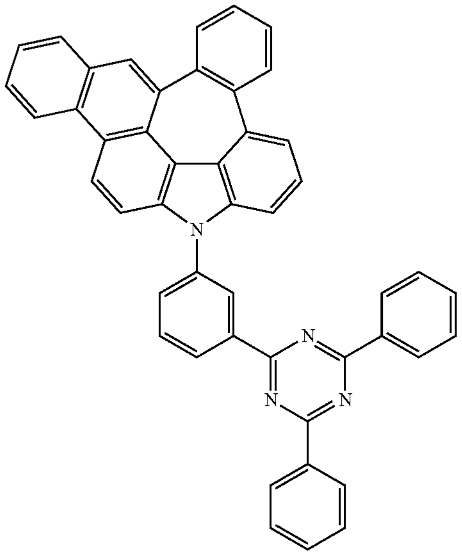
-continued
C1-59
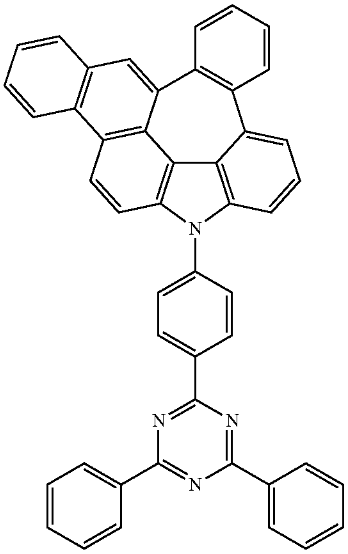
C1-60
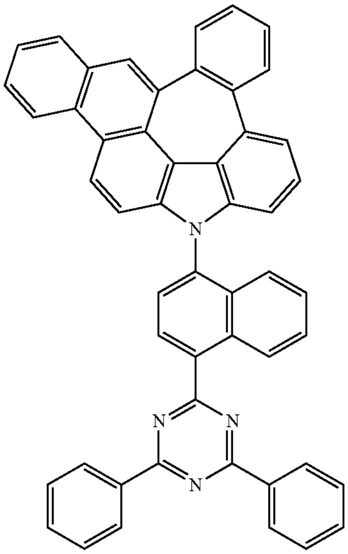
C1-61
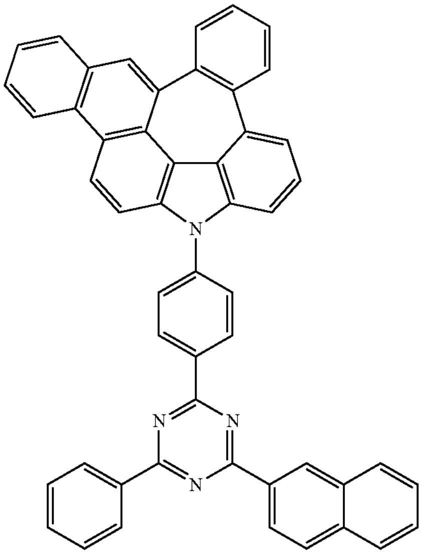

-continued
C1-62
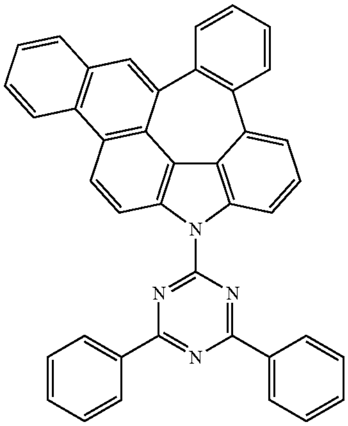
C1-63
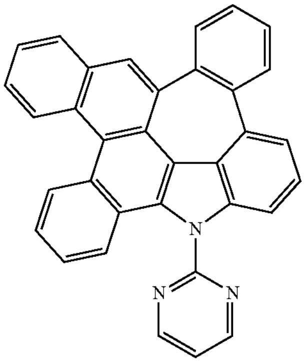
C1-64
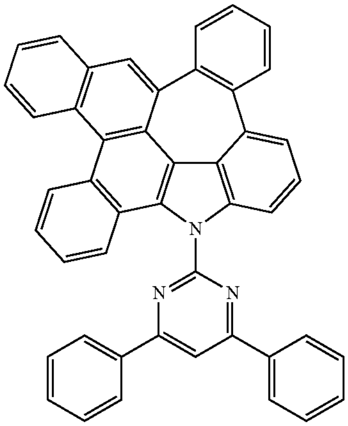
C1-65
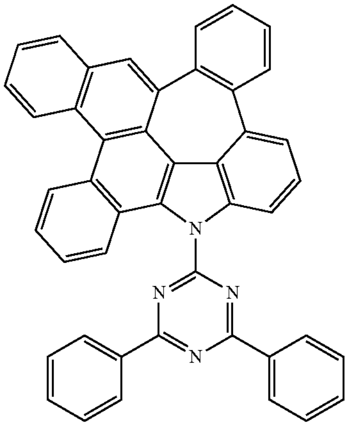
-continued
C1-66
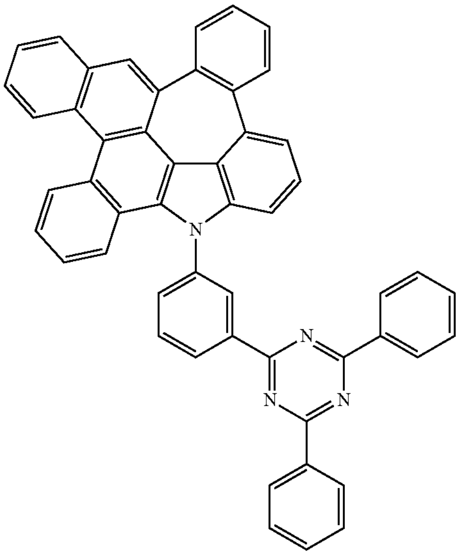
C1-67
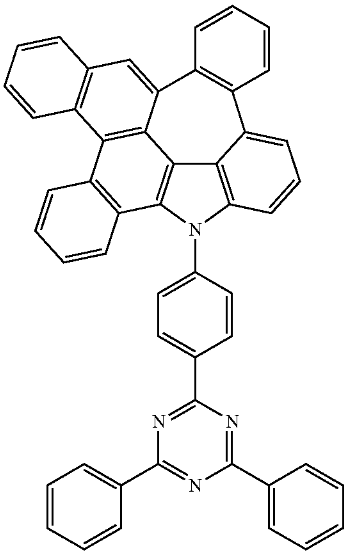
C1-68
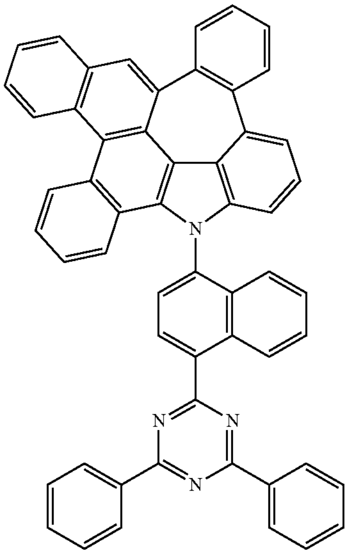

-continued
C1-69
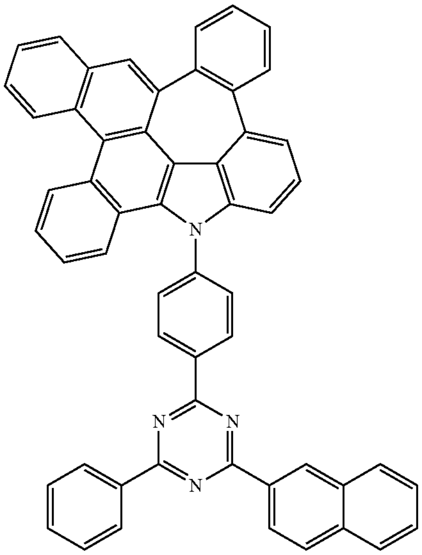
C1-70
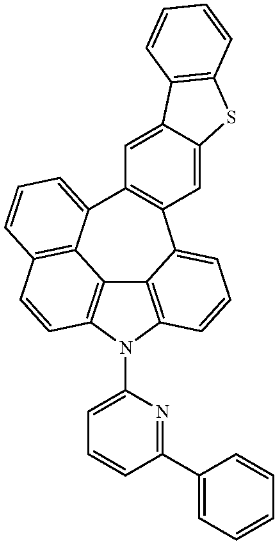
C1-71
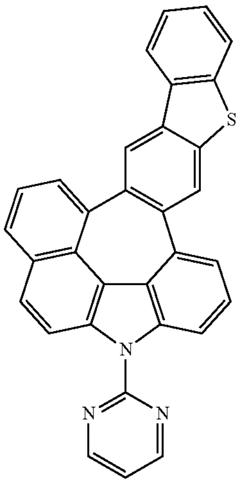
-continued
C1-72
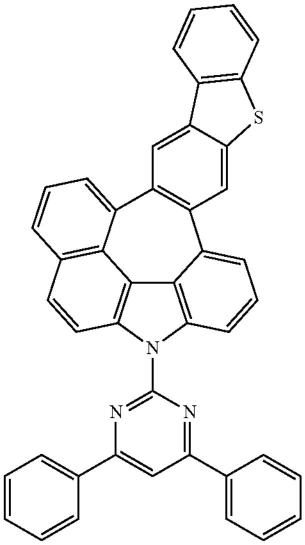
C1-73
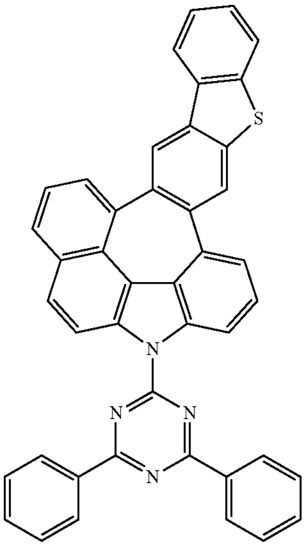

-continued
C1-74
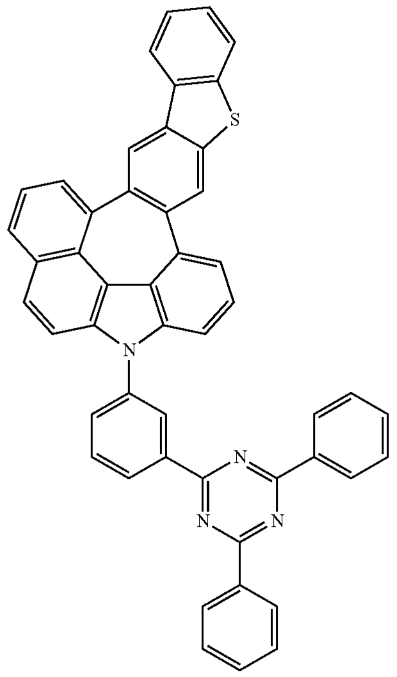
C1-75
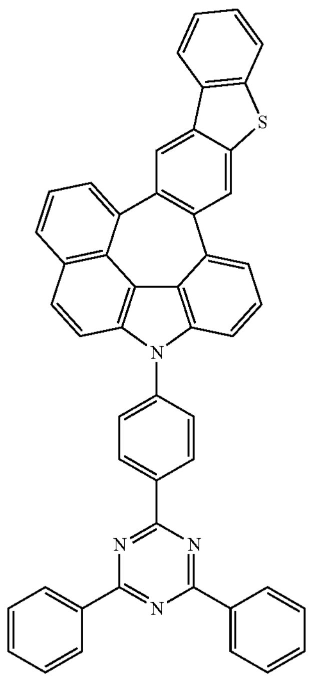
-continued
C1-76
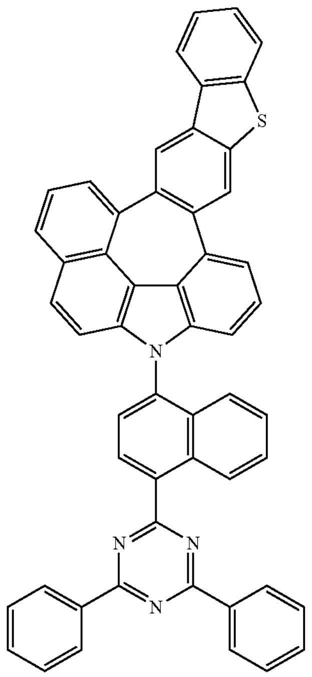
C1-77
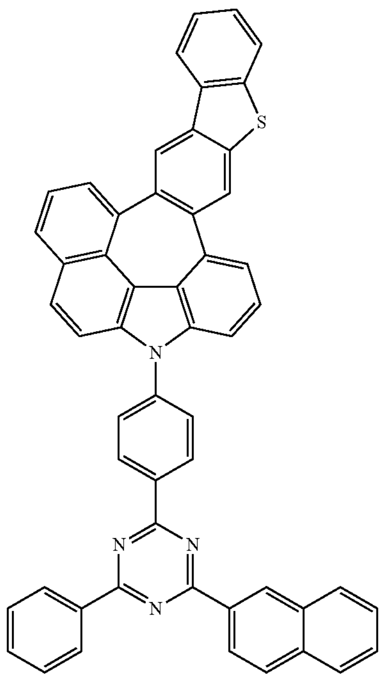

-continued
C1-78
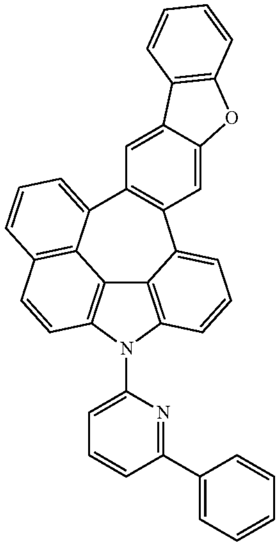
C1-79
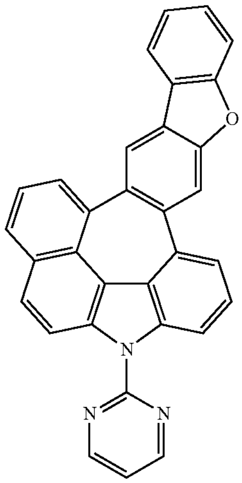
C1-80
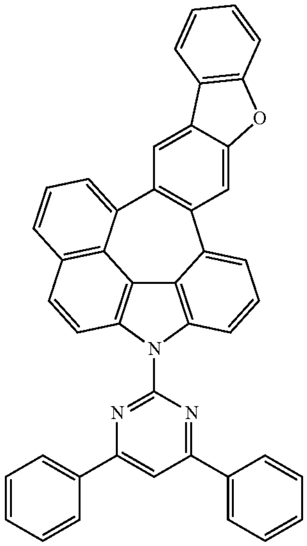
-continued
C1-81
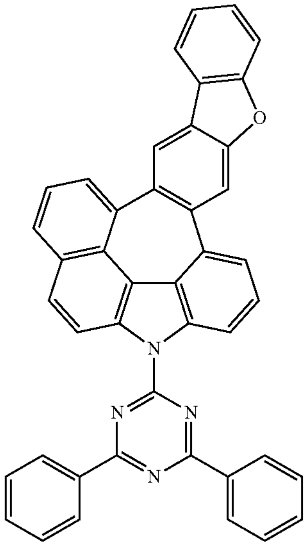
C1-82
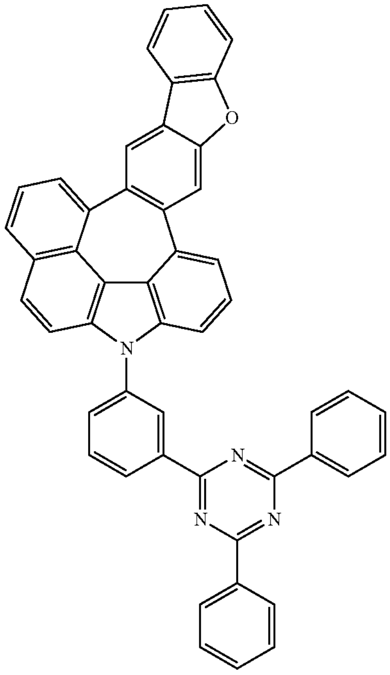

-continued
C1-83
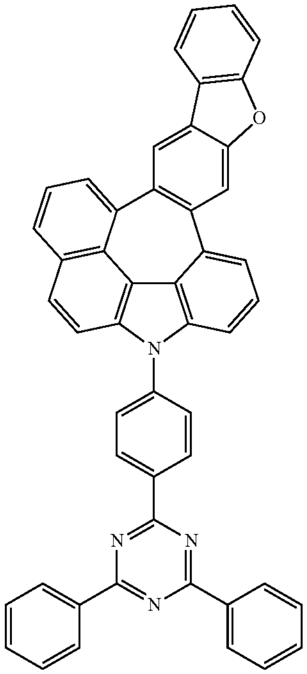
C1-84
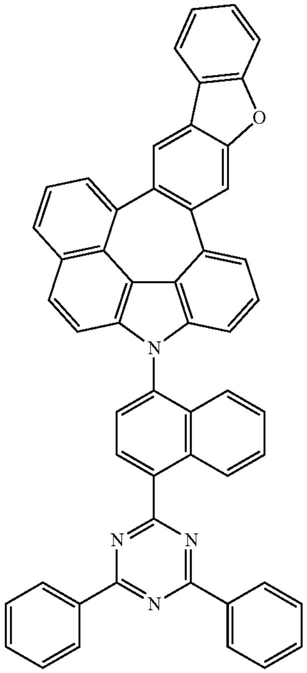
-continued
C1-85
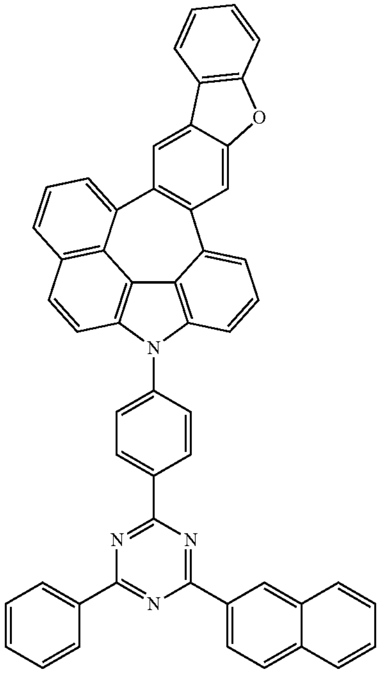
C1-86
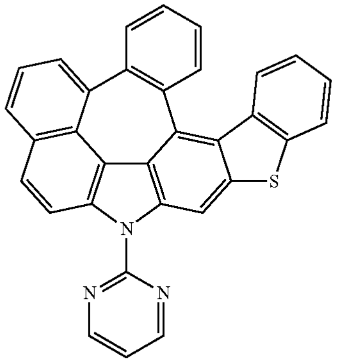
C1-87
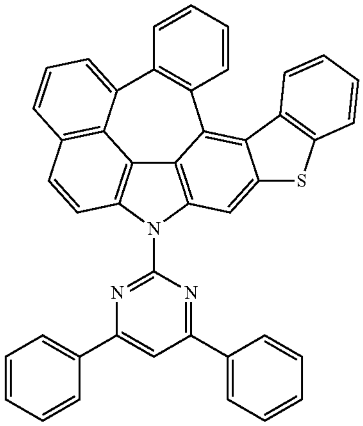

-continued
C1-88
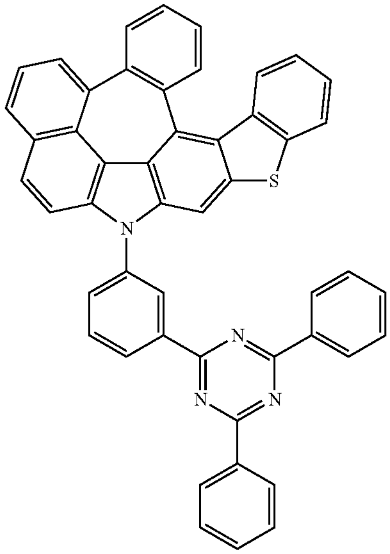
C1-89
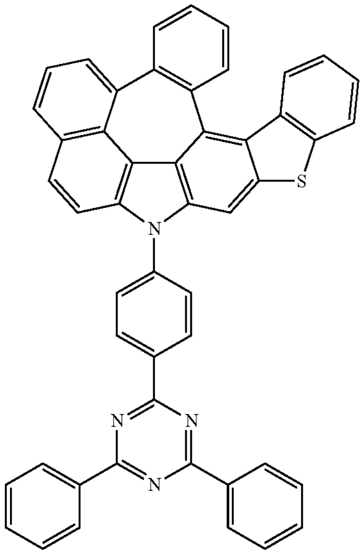
C1-90
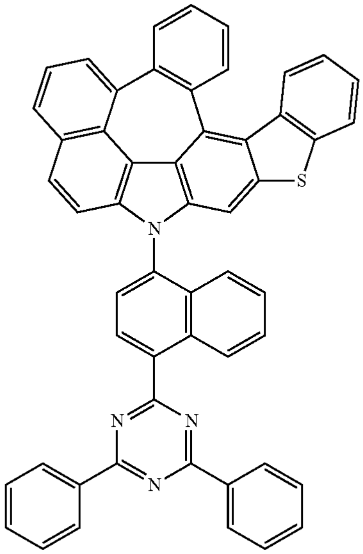
-continued
C1-91
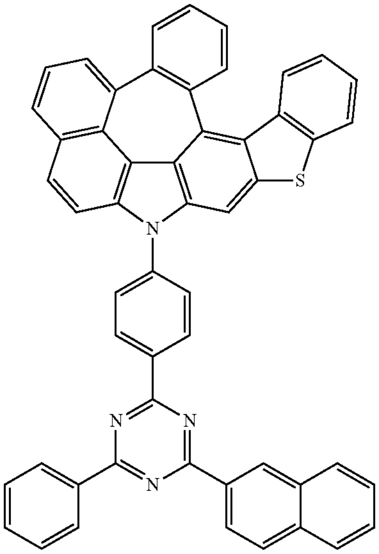
C1-92
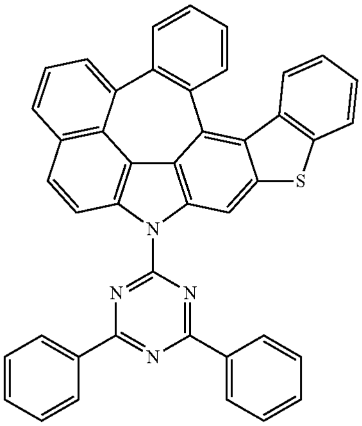
C1-93
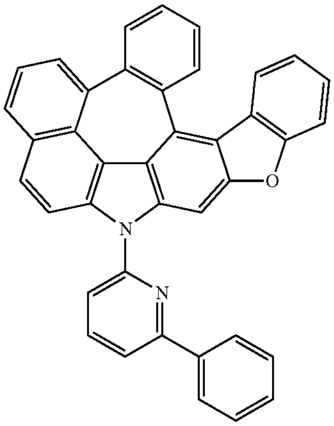

-continued
C1-94
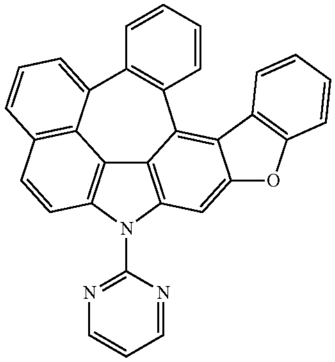
C1-95
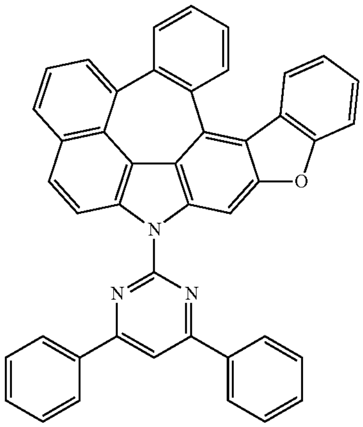
C1-96
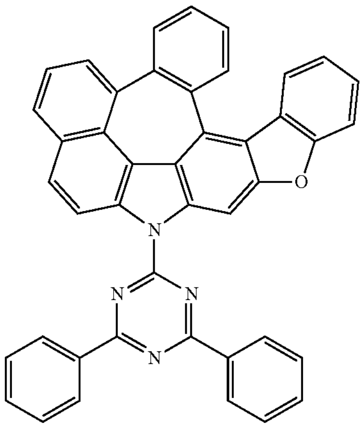
-continued
C1-97
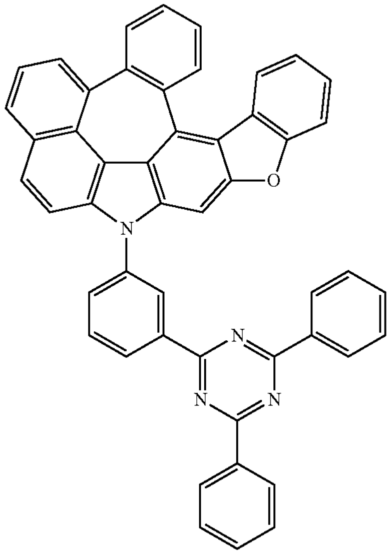
C1-98
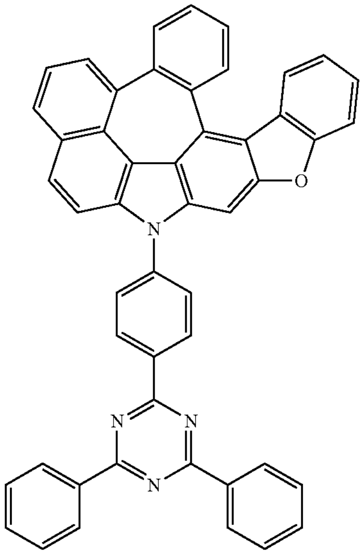
C1-99
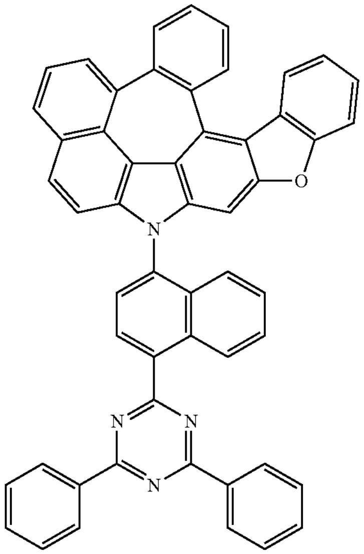

-continued
C1-100
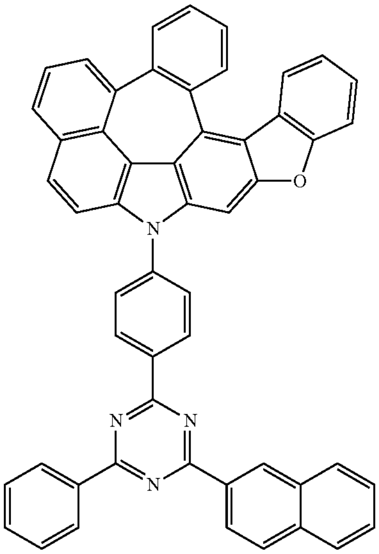
C1-101
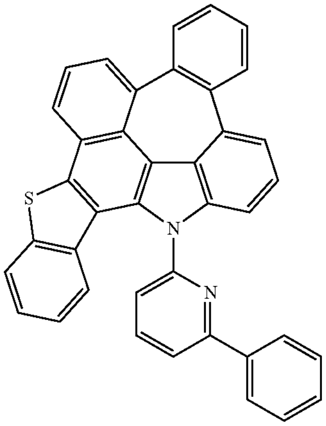
C1-102
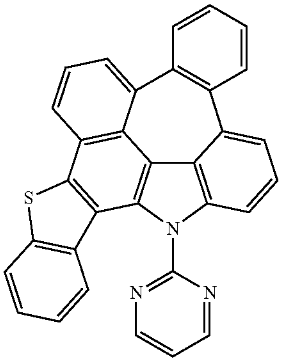
-continued
C1-103
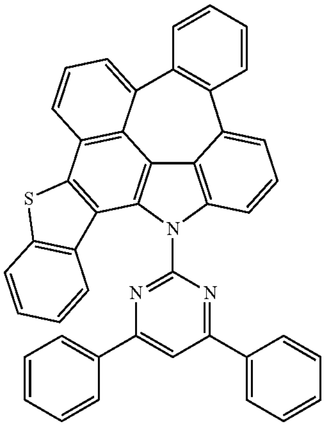
C1-104
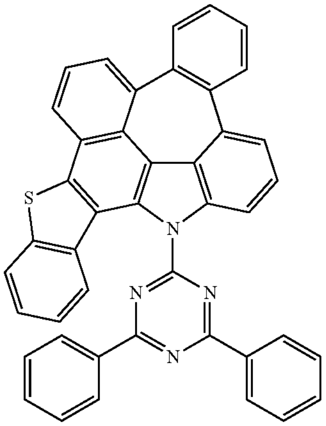
C1-105
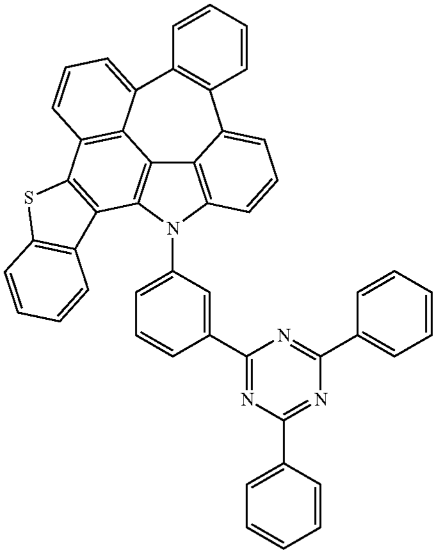

-continued
C1-106
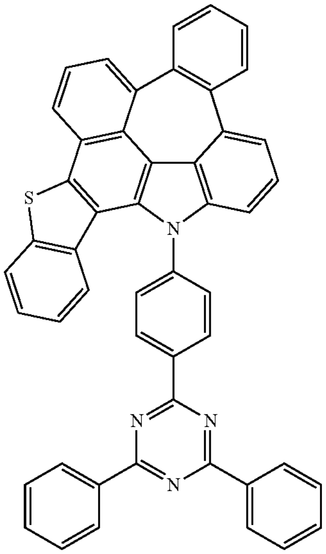
C1-107
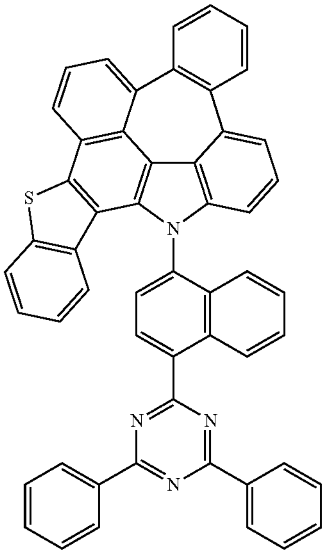
C1-108
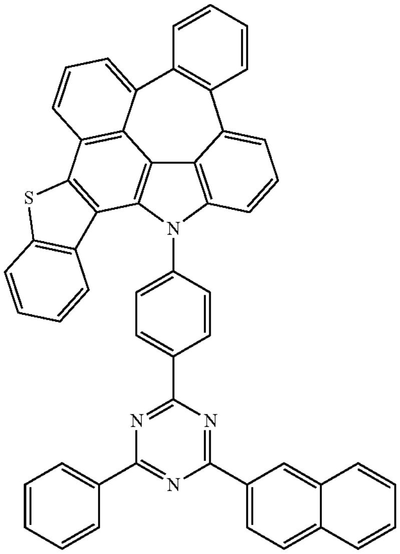
-continued
C1-109
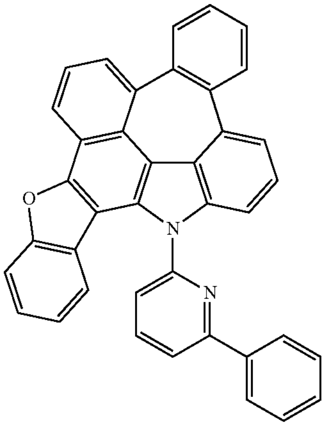
C1-110
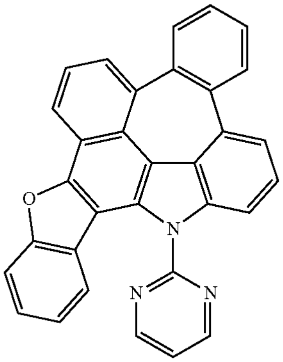
C1-111
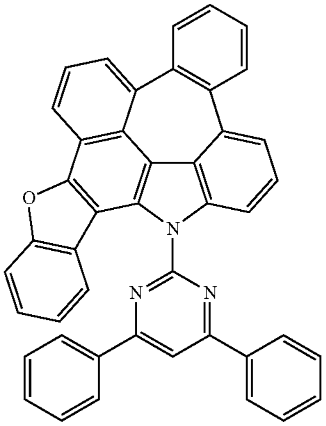
C1-112
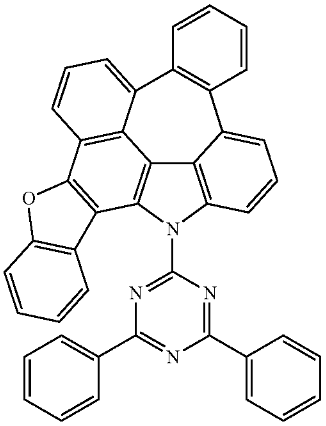

-continued
C1-113
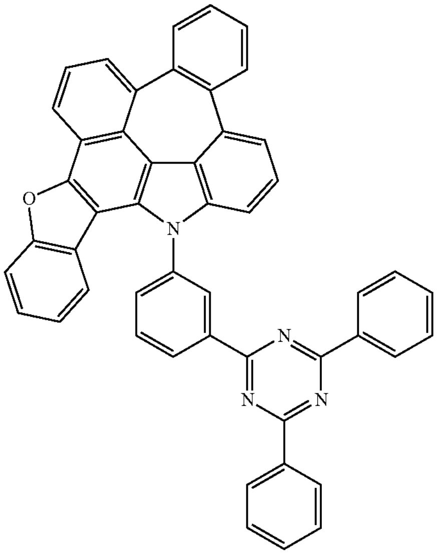
C1-114
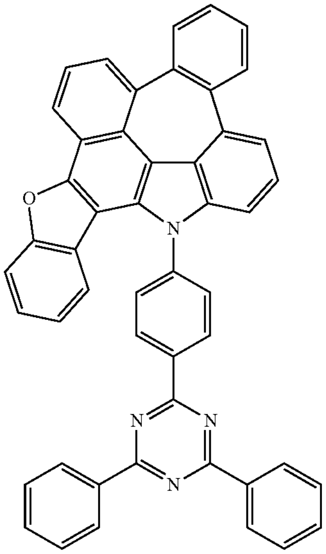
C1-115
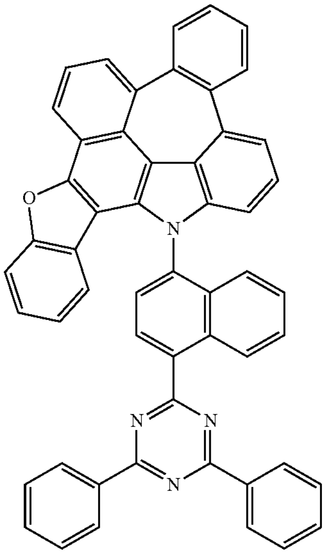
-continued
C1-116
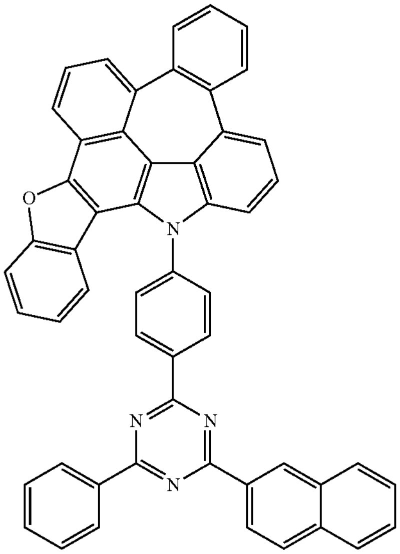
C1-117
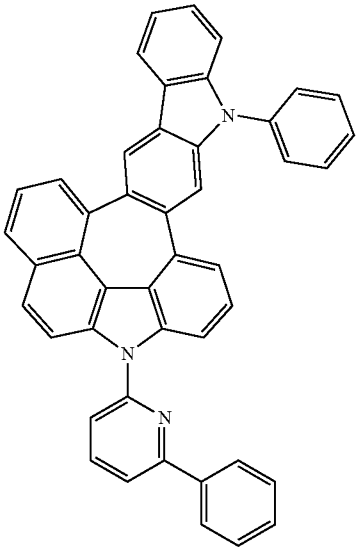

-continued
C1-118
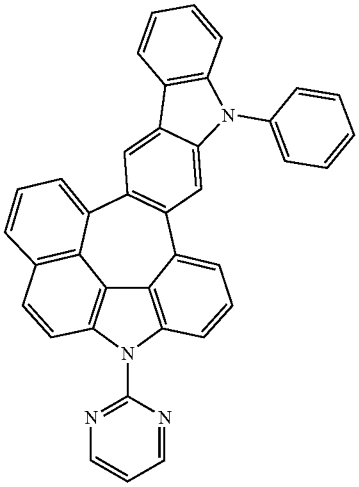
C1-119
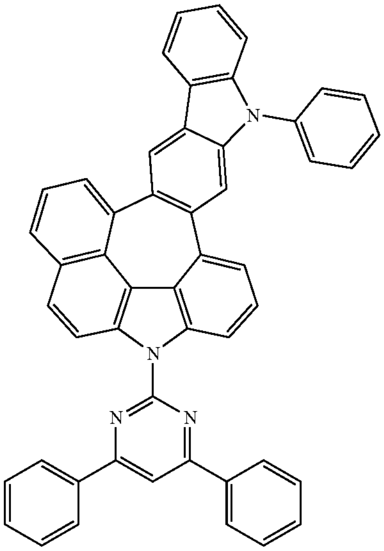
C1-120
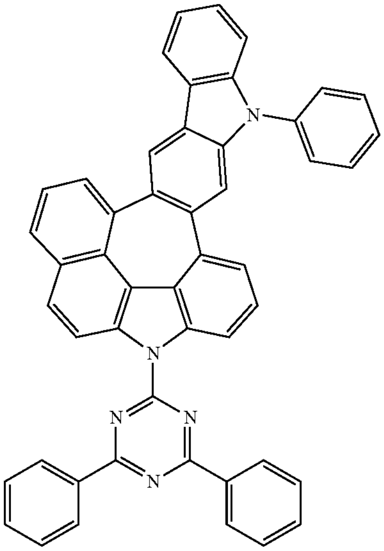
-continued
C1-121
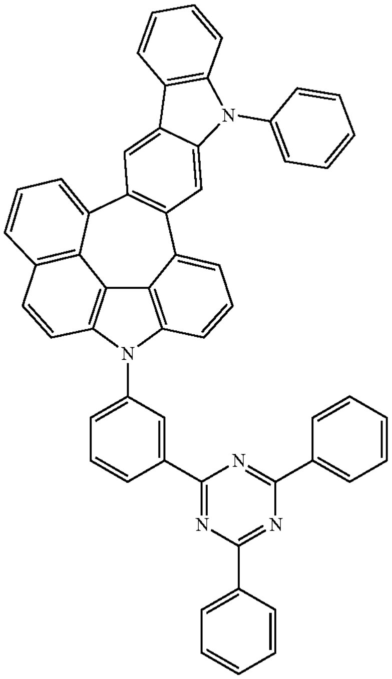
C1-122
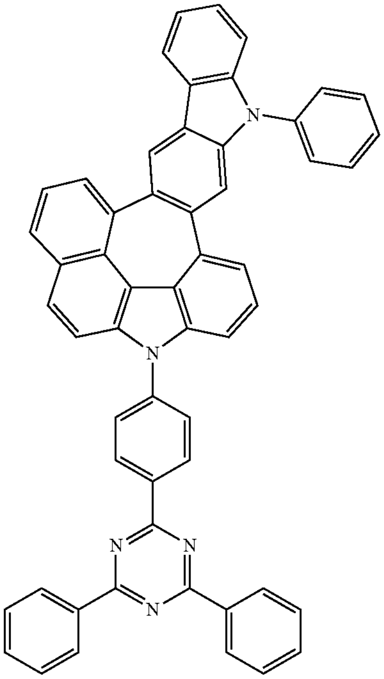

-continued
C1-123
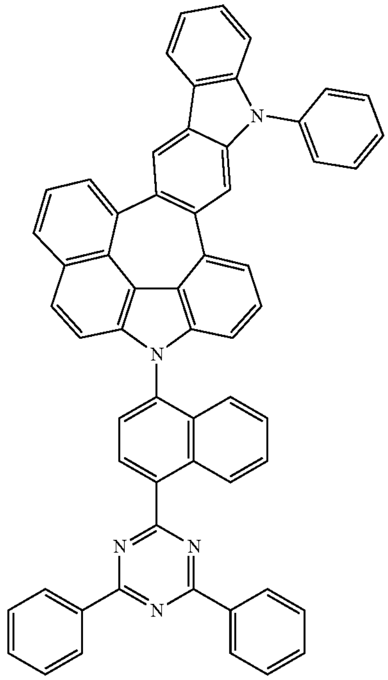
C1-124
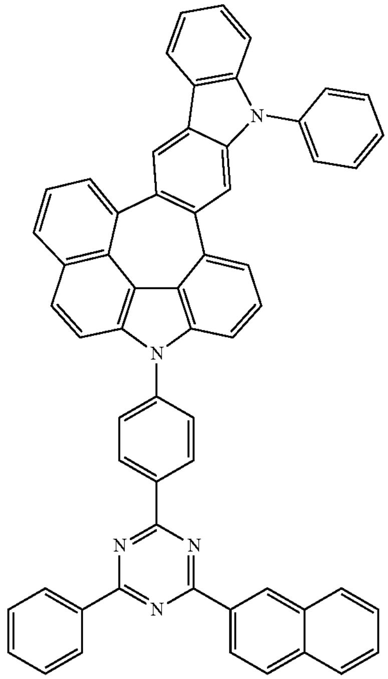
-continued
C1-125
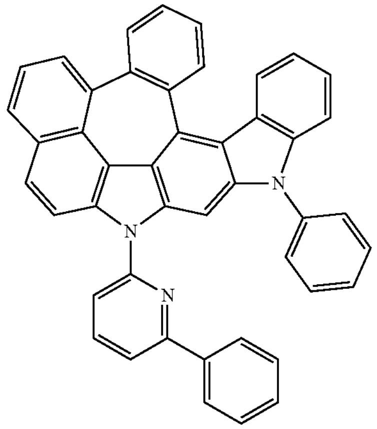
C1-126
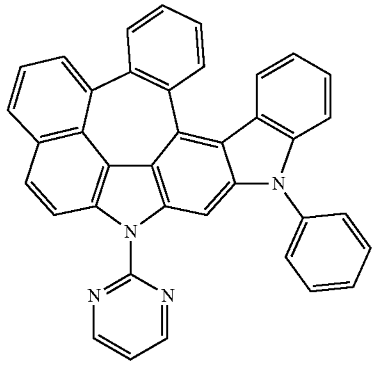
C1-127
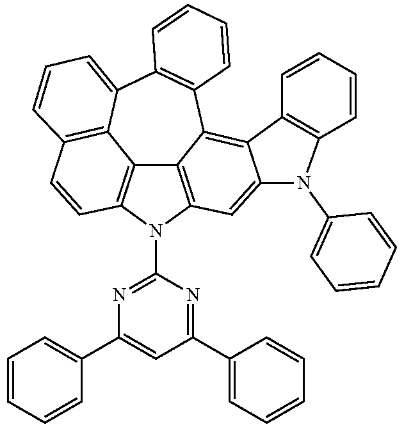
C1-128
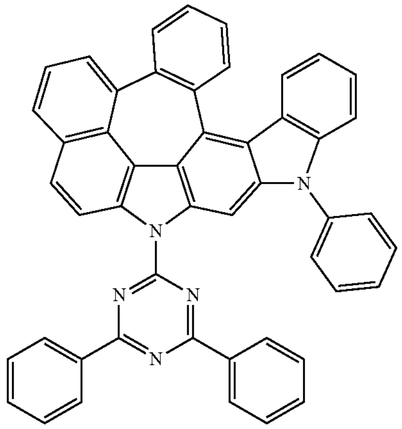

C1-129
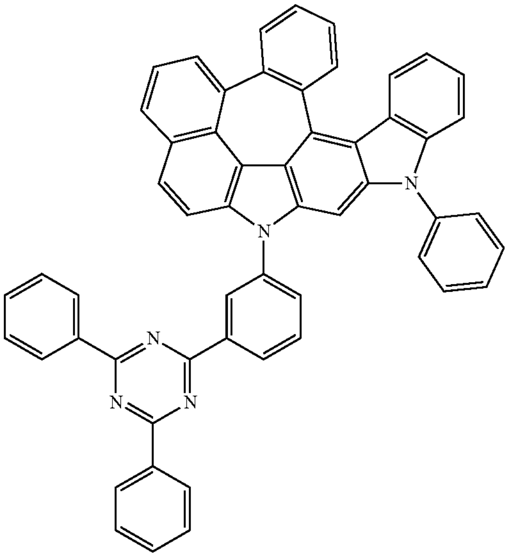
C1-130
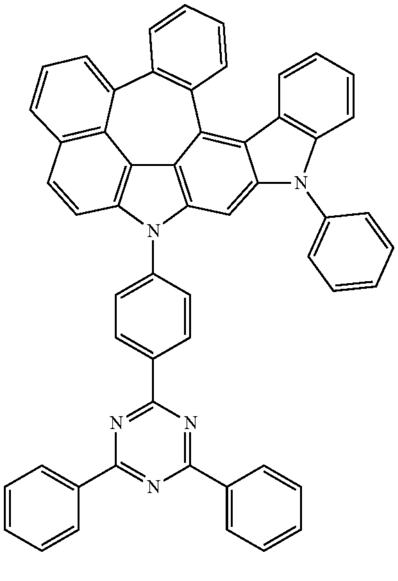
C1-131
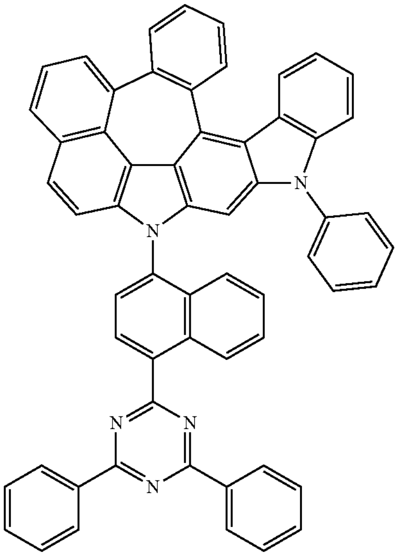
C1-132
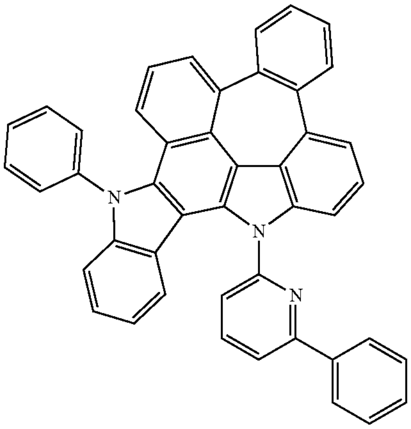
C1-133
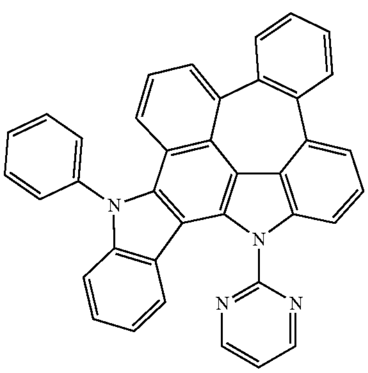

-continued
C1-134
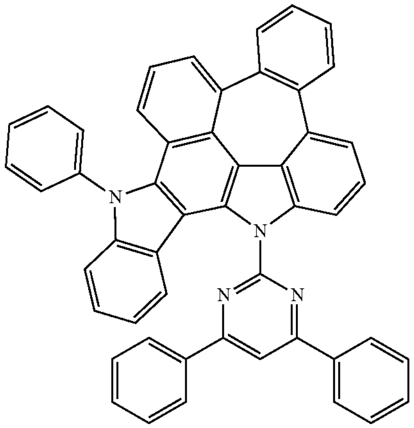
C1-135
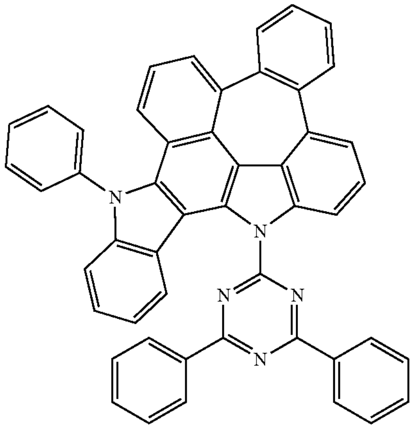
C1-136
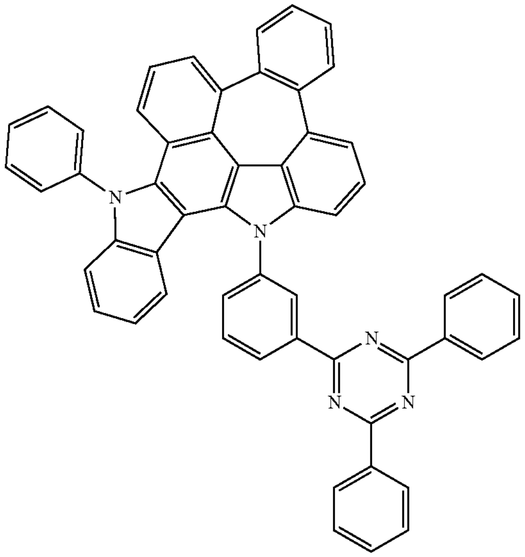
-continued
C1-137
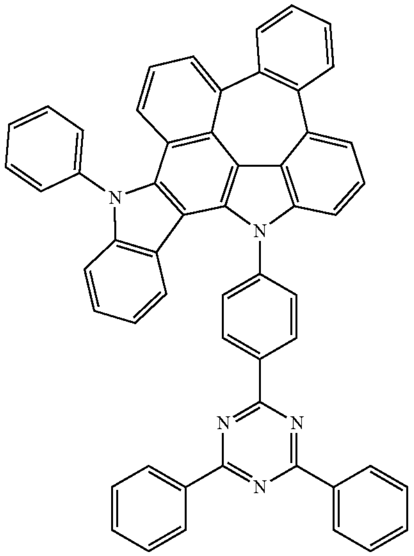
C1-138
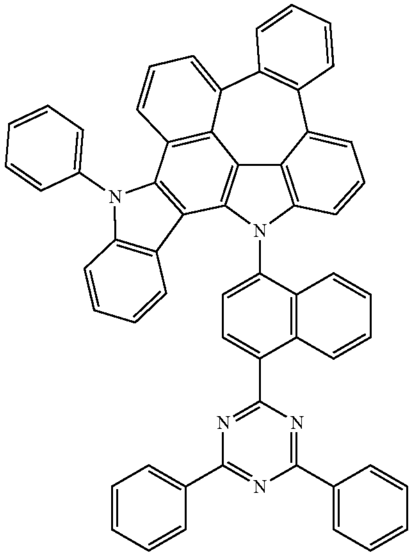
C1-139
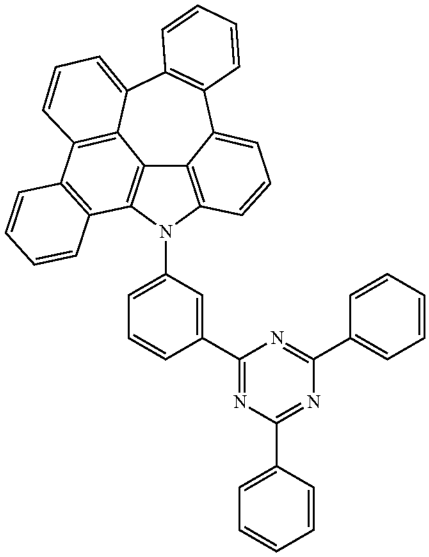

-continued
C1-140
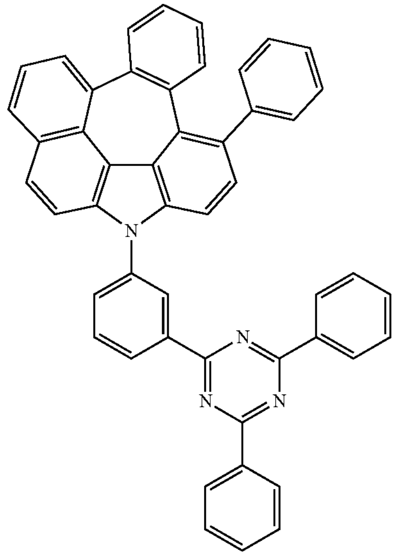
C1-141
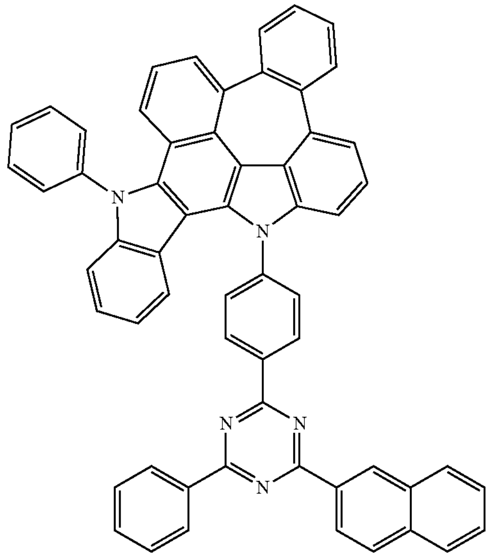
-continued
C1-142
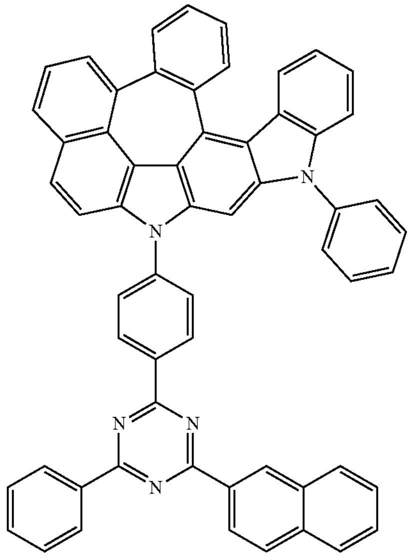
C1-143
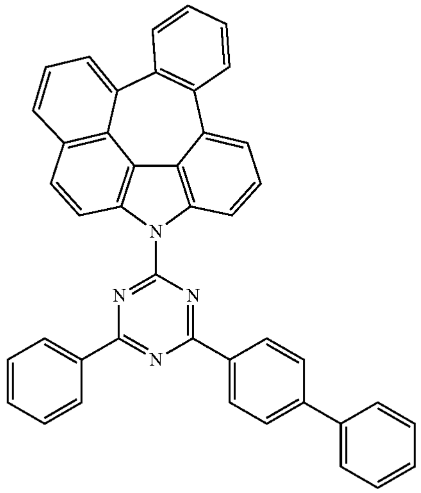
C1-144
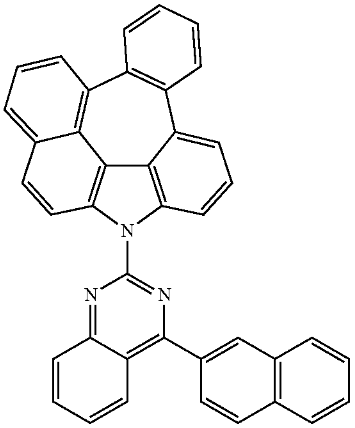

-continued
C1-145
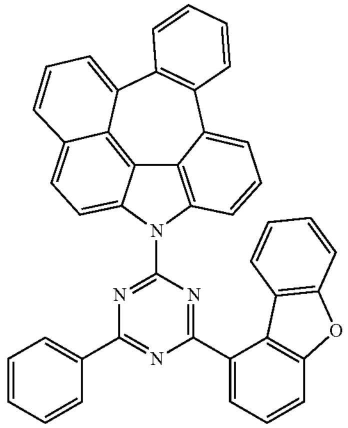
C1-146
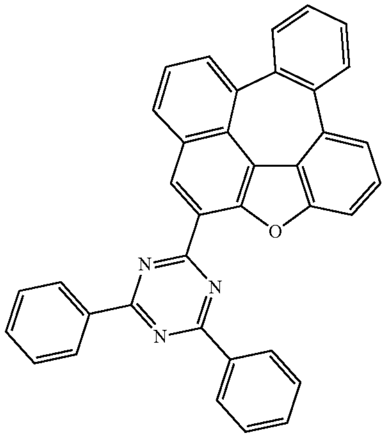
C1-147
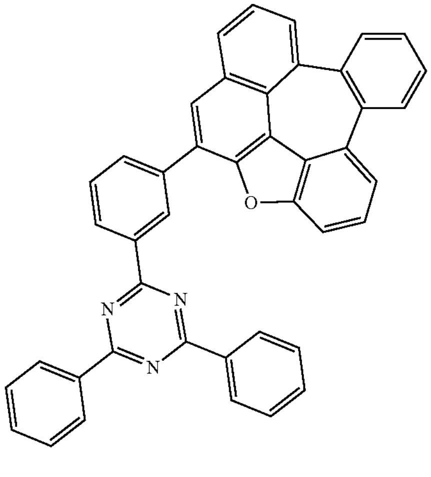
-continued
C1-148
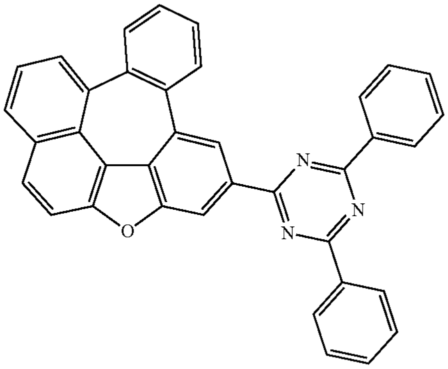
C1-149
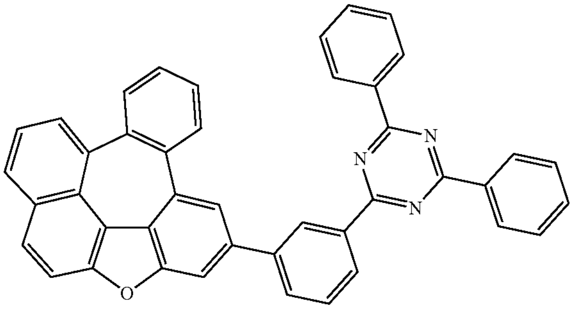
C1-150
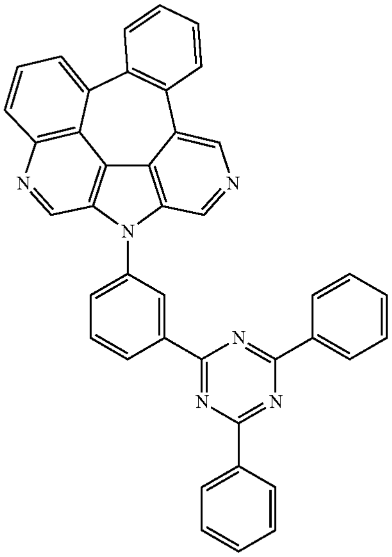

-continued
C1-151
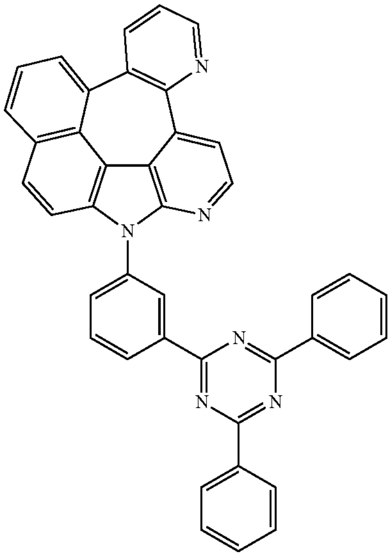
C1-152
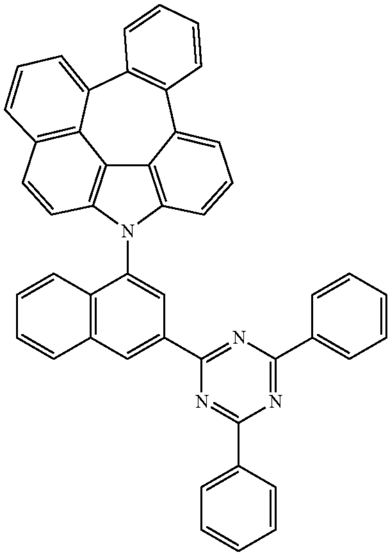
-continued
C1-153
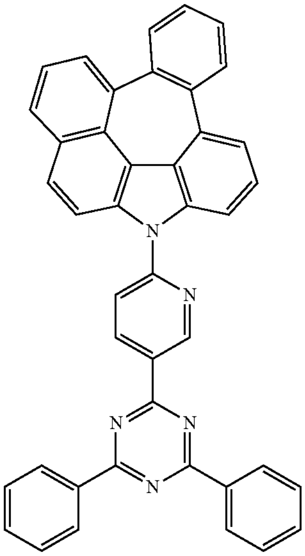
C1-154
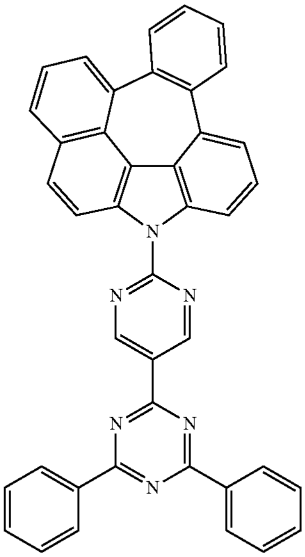
C1-155
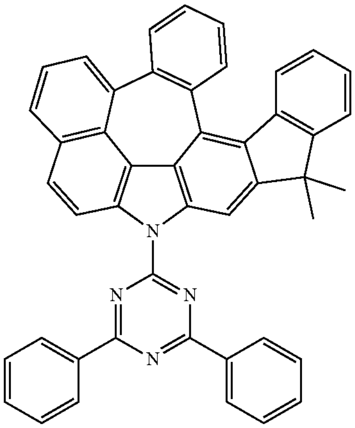

-continued
C1-156
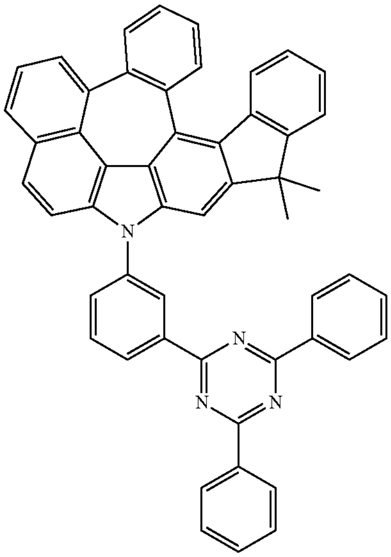
C1-157
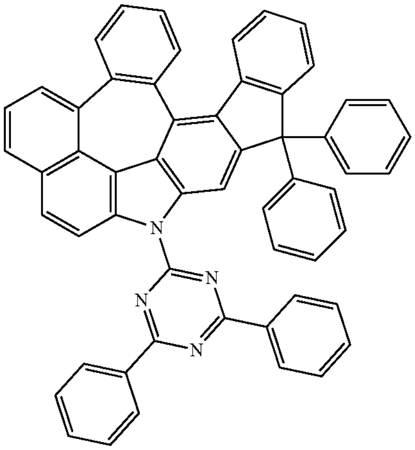
C1-158
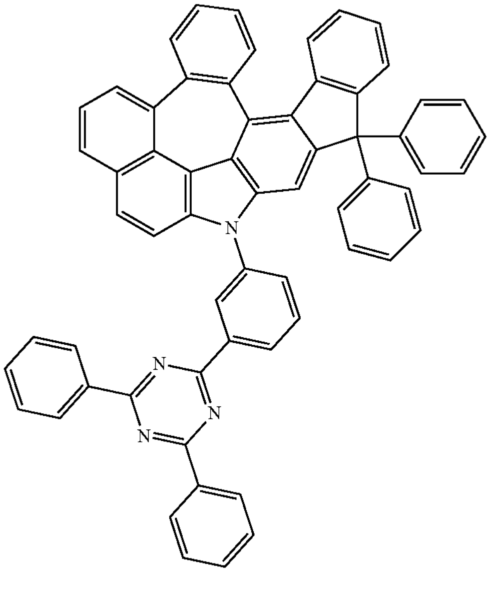
-continued
C1-159
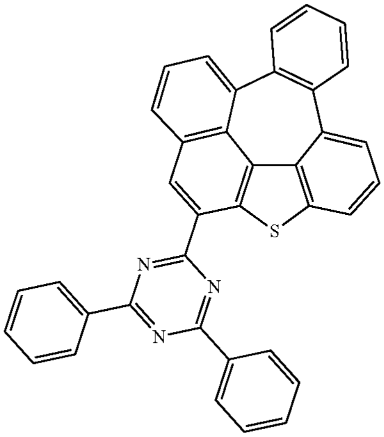
C1-160
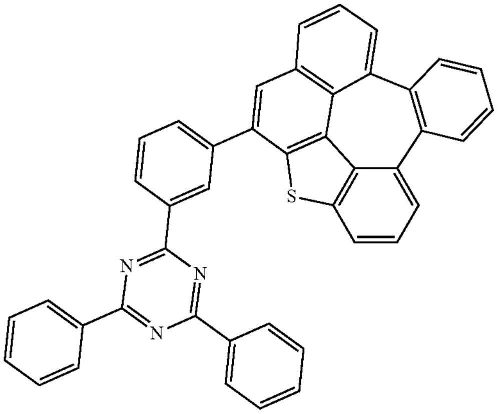
C1-161
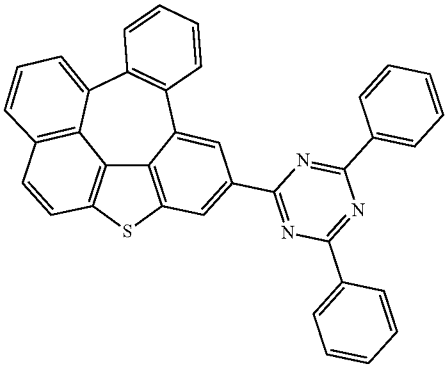
C1-162
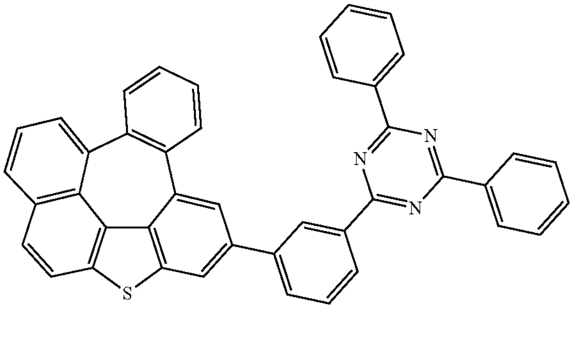

C1-163
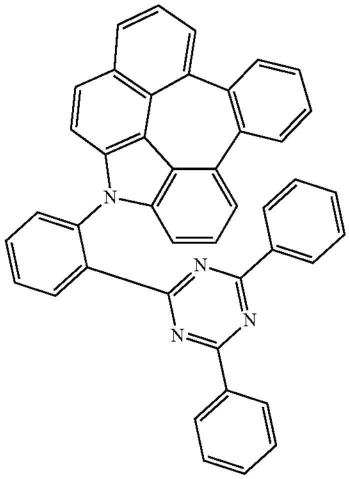
C1-164
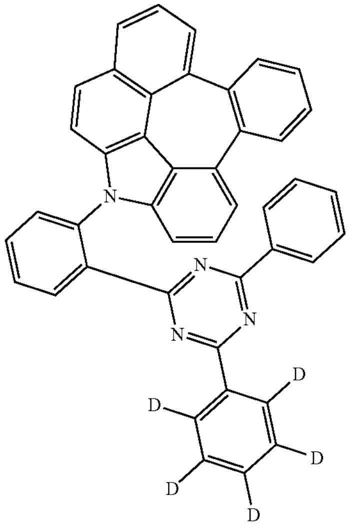
C1-165
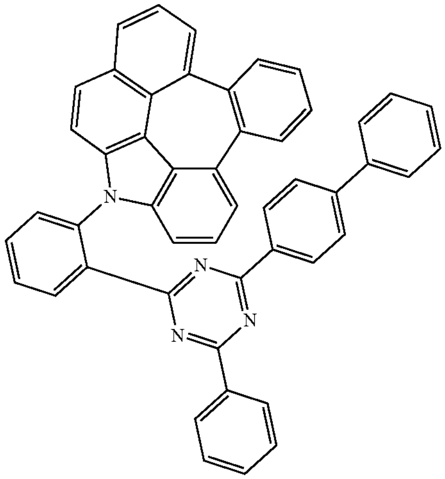
C1-166
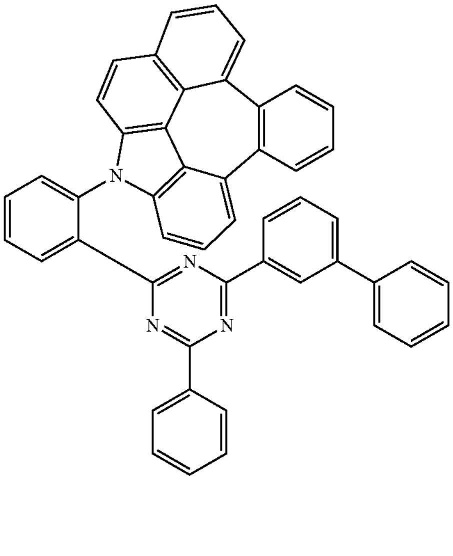
C1-167
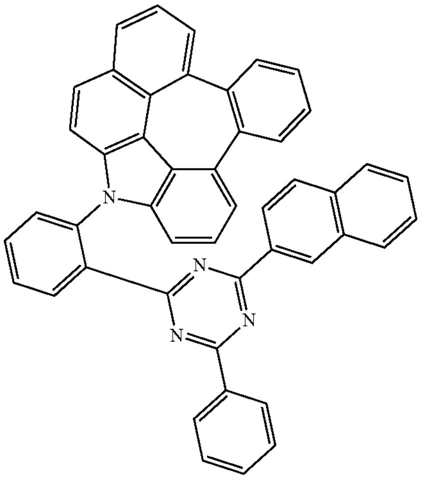
C1-168
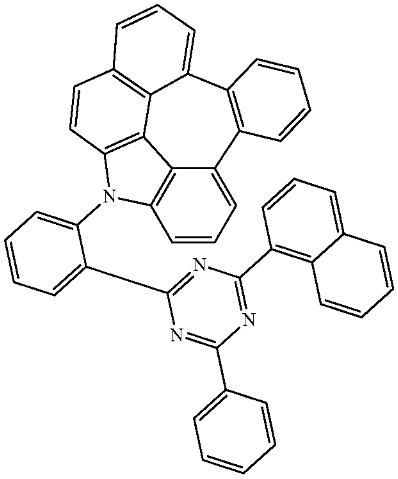

C1-169
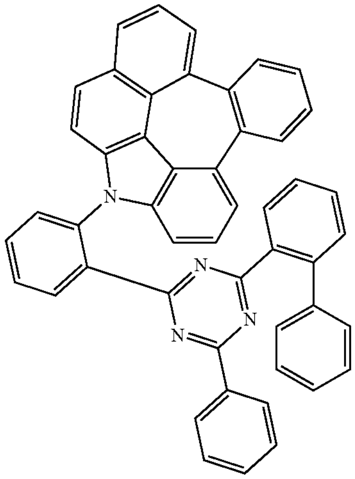
C1-170
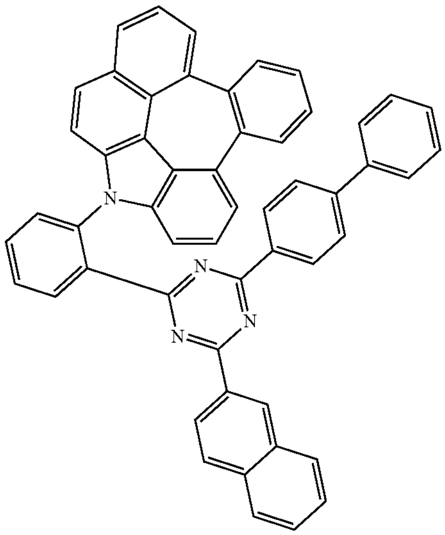
C1-171
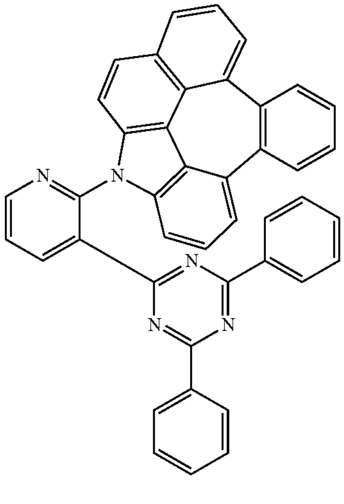
C1-172
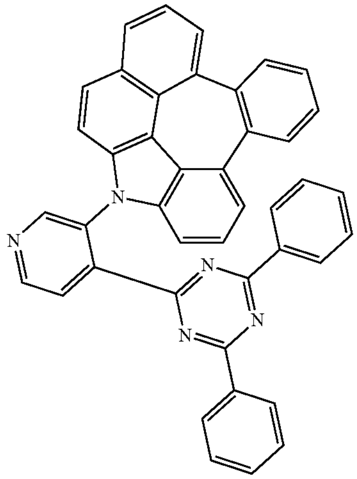
C1-173
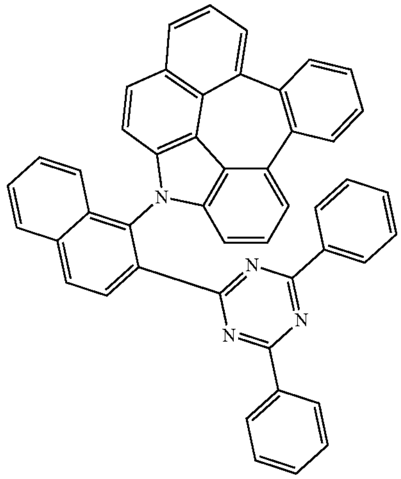
C1-174
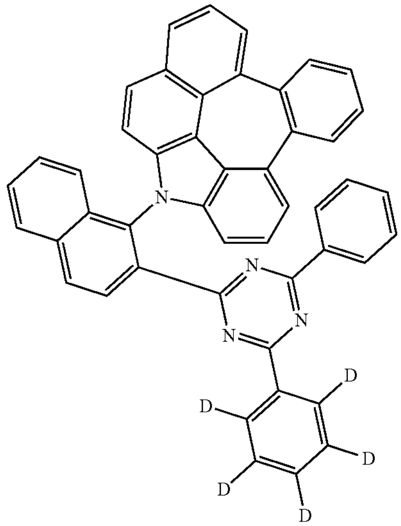

-continued
C1-175
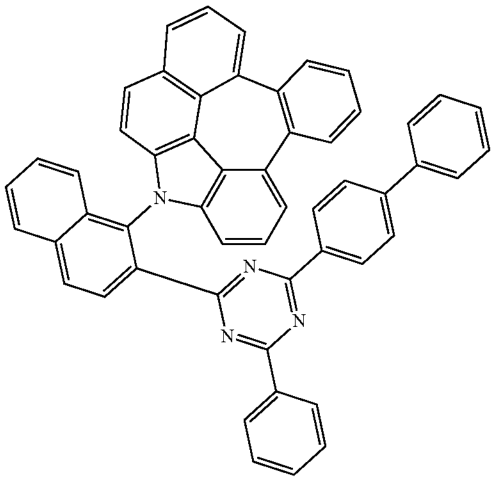
C1-176
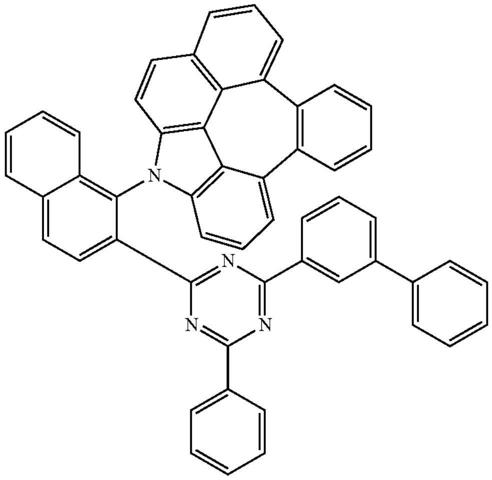
C1-177
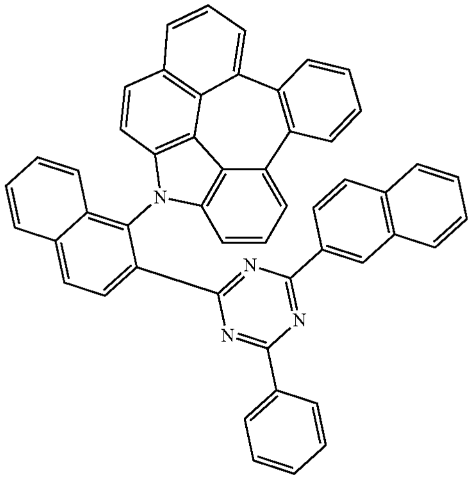
-continued
C1-178
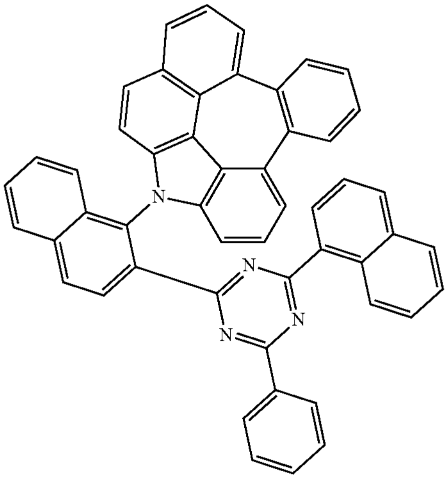
C1-179
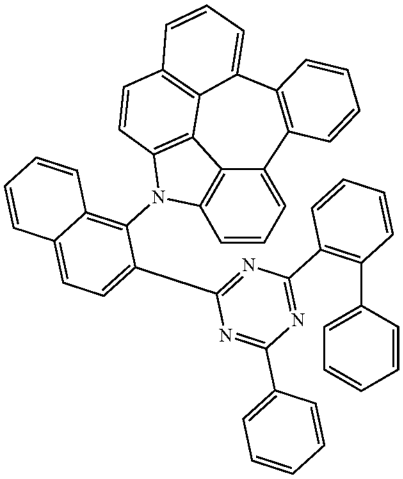
C1-180
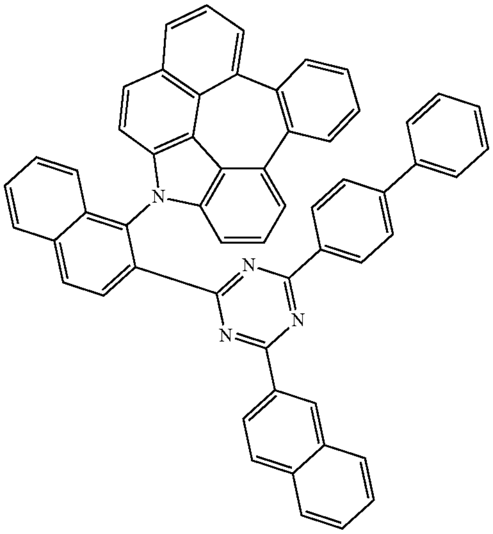

-continued
C1-181
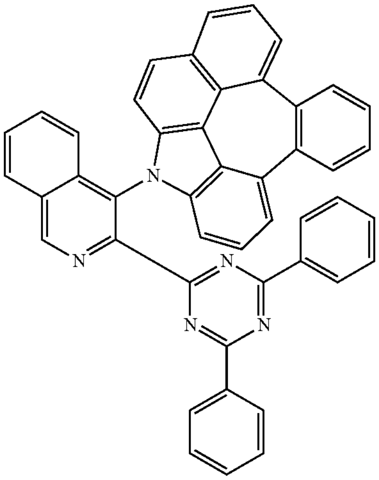
C1-182
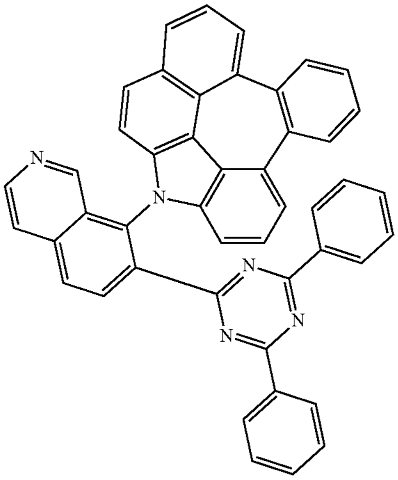
C1-183
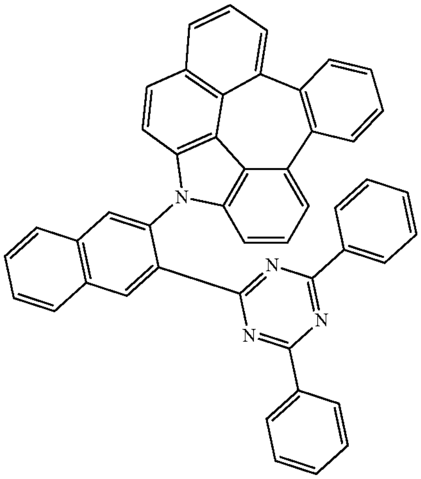
-continued
C1-184
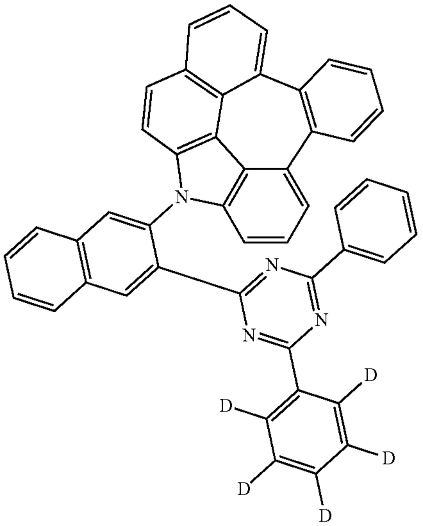
C1-185
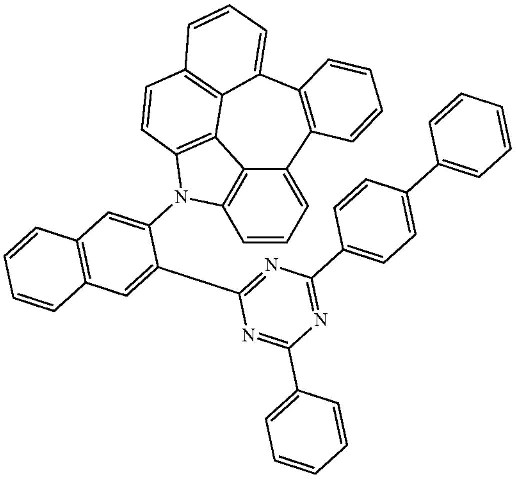
C1-186
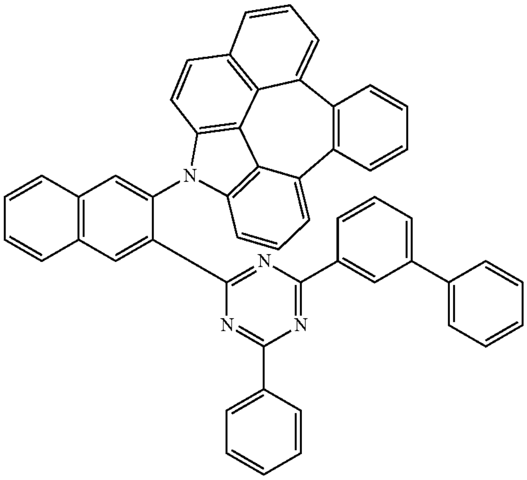

-continued
C1-187
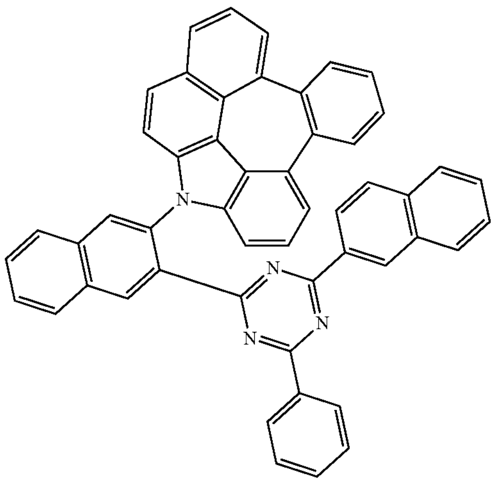
C1-188
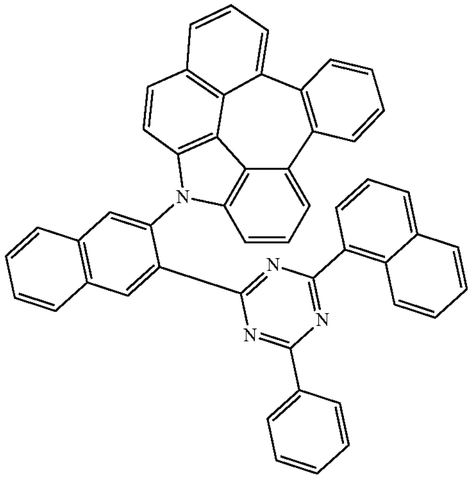
C1-189
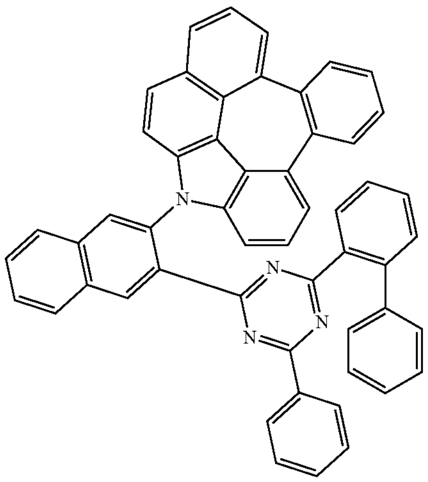
-continued
C1-190
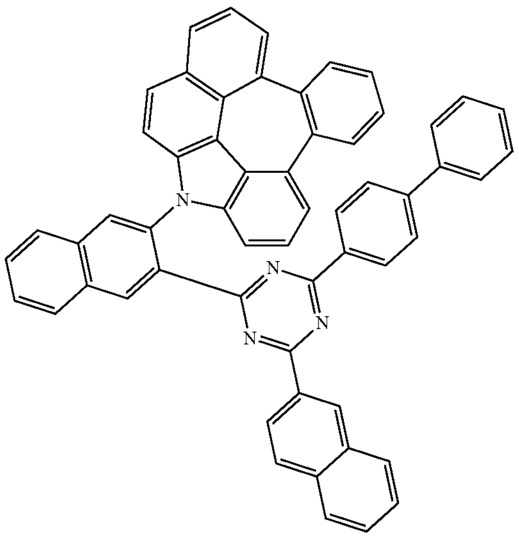
C1-191
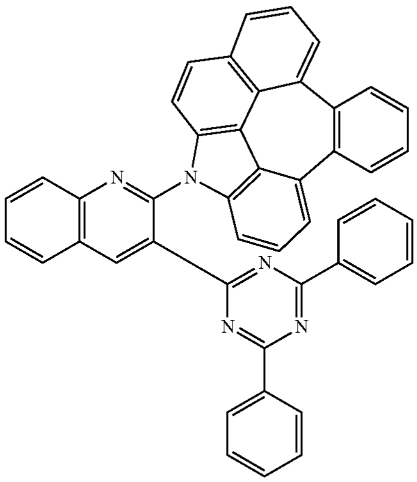
C1-192
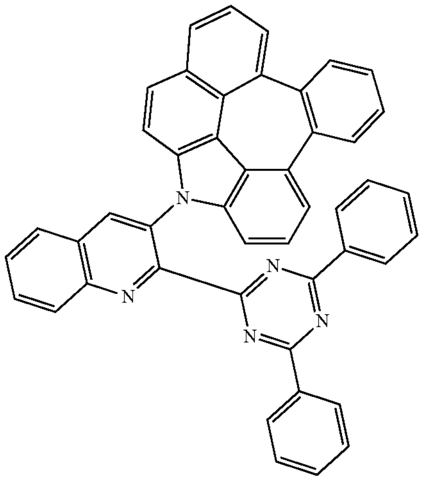

-continued
C1-193
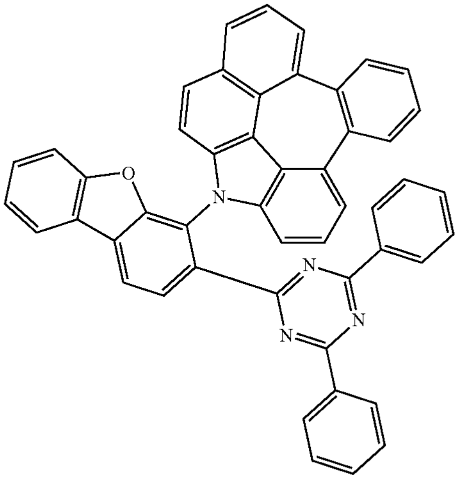
C1-194
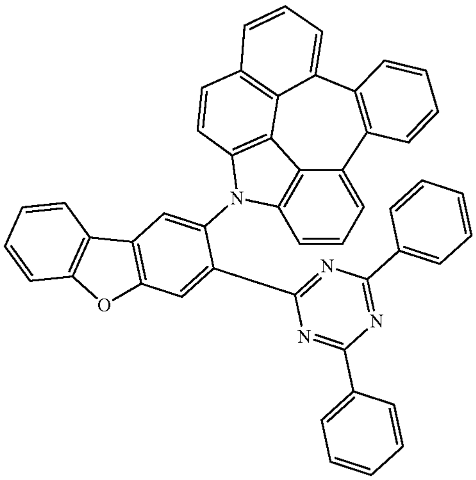
C1-195
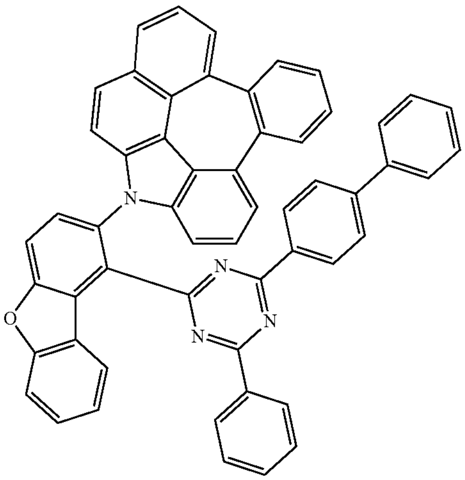
-continued
C1-196
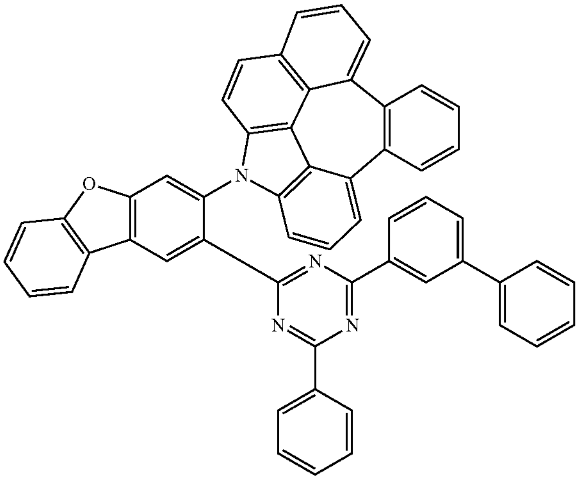
C1-197
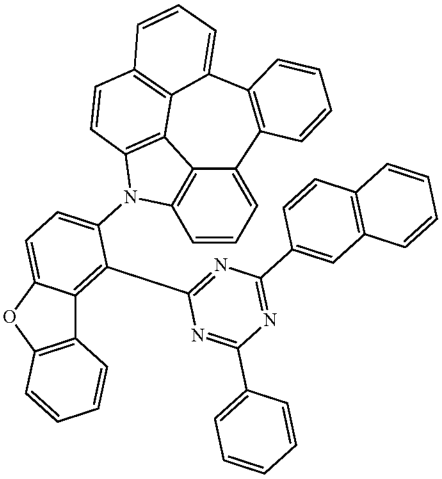
C1-198
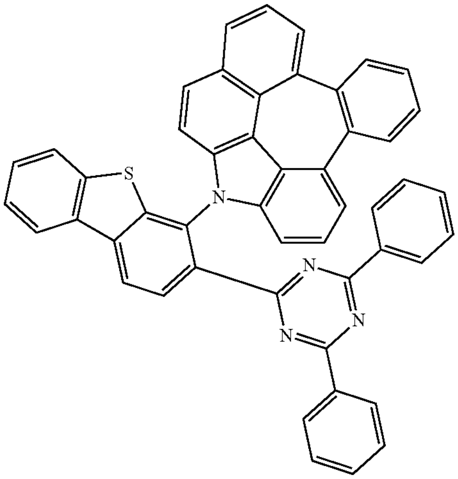

-continued
C1-199
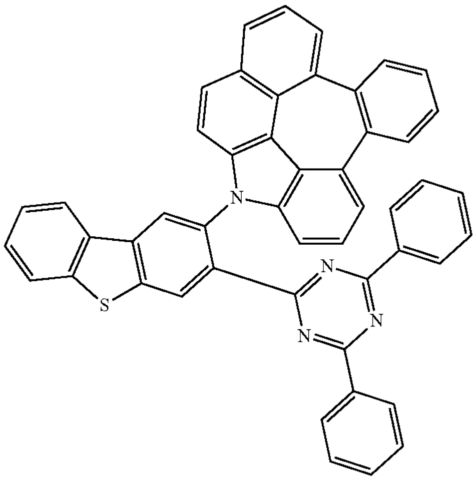
C1-200
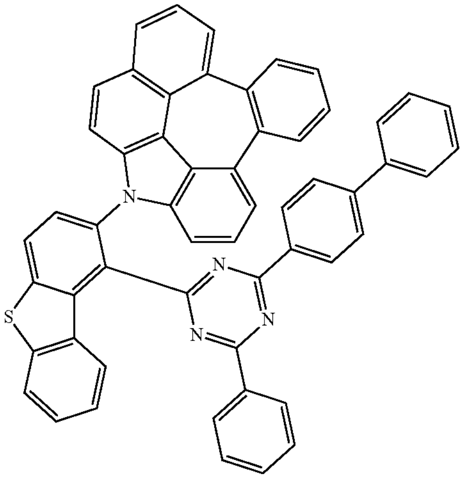
C1-201
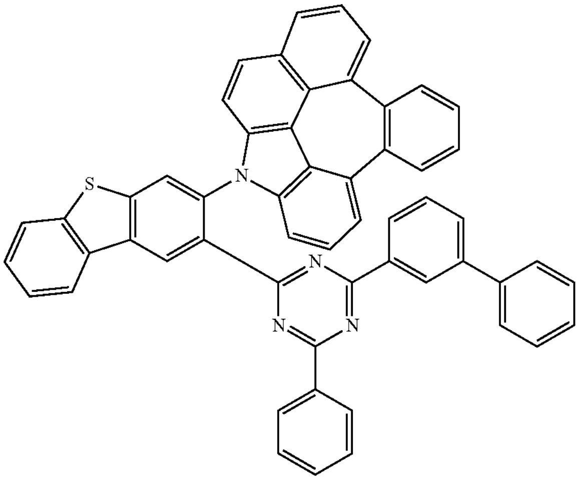
-continued
C1-202
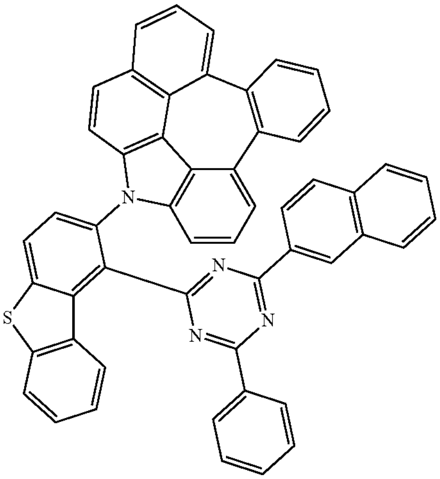
C1-203
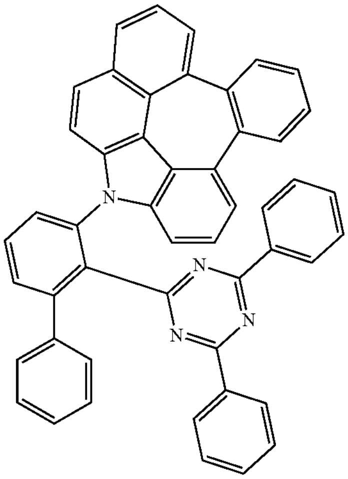
C1-204
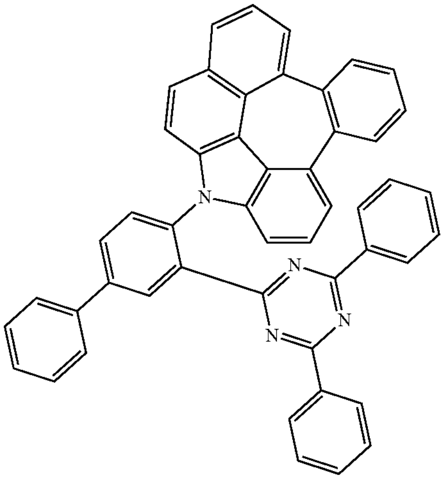

-continued
C1-205
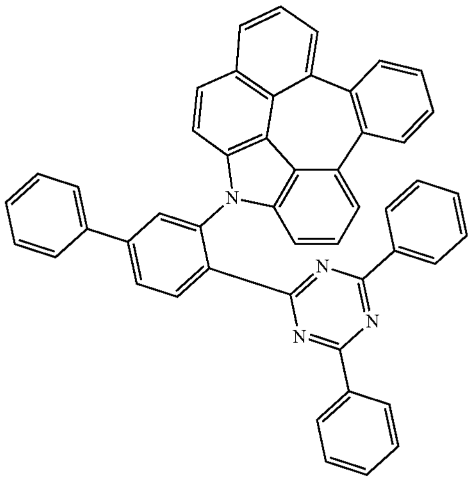
C1-206
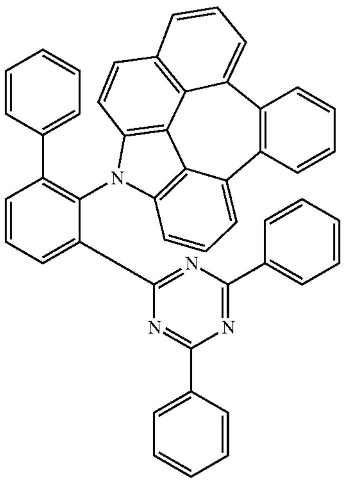
C1-207
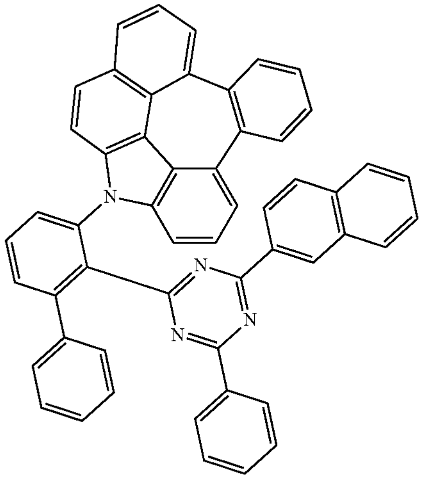
-continued
C1-208
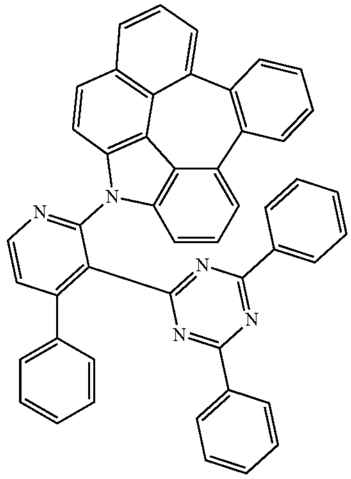
C1-209
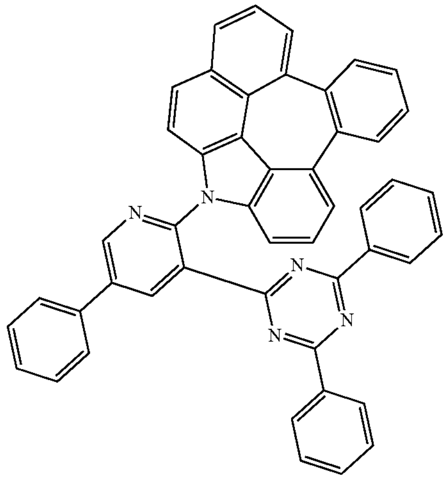
C1-210
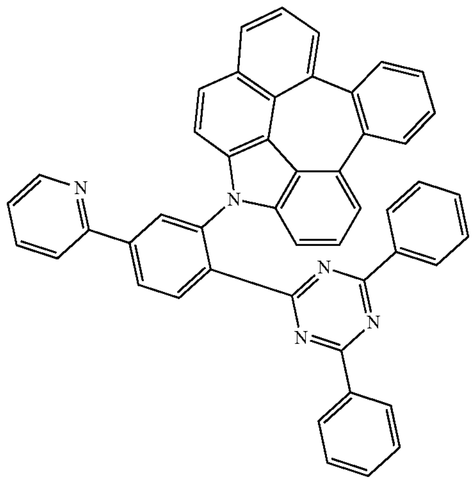

-continued
C1-211
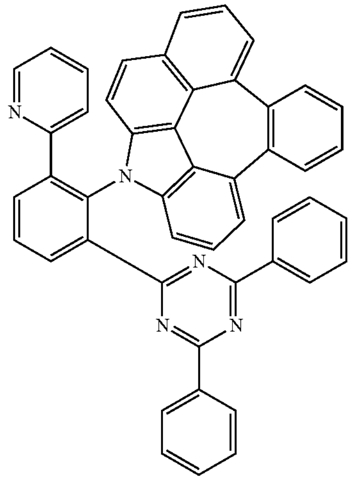
C1-212
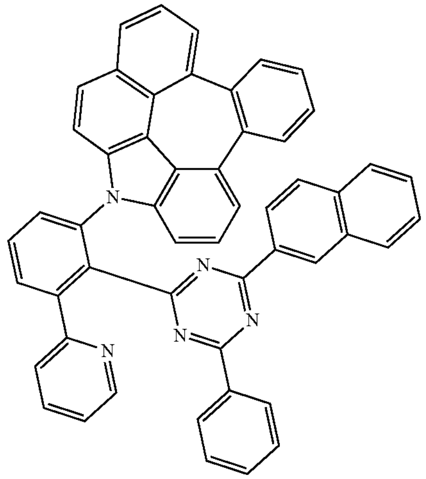
C1-213
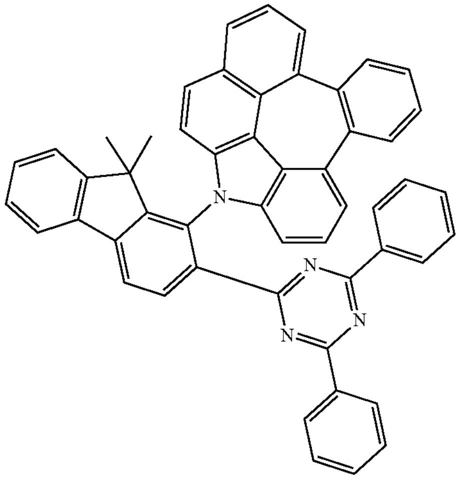
-continued
C1-214
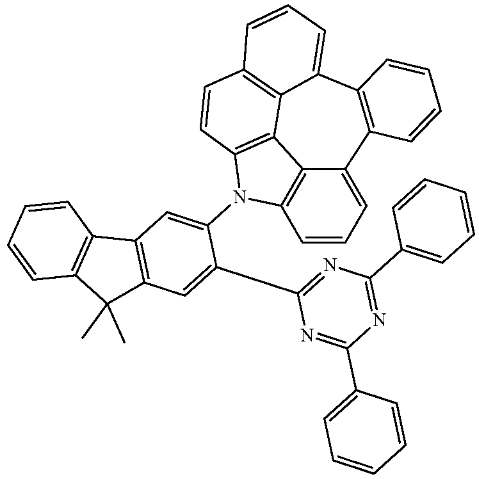
C1-215
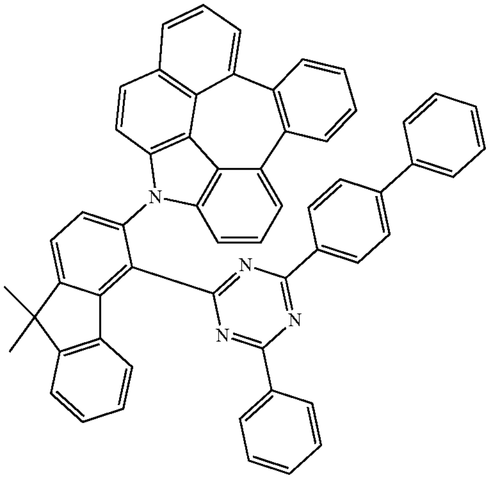
C1-216
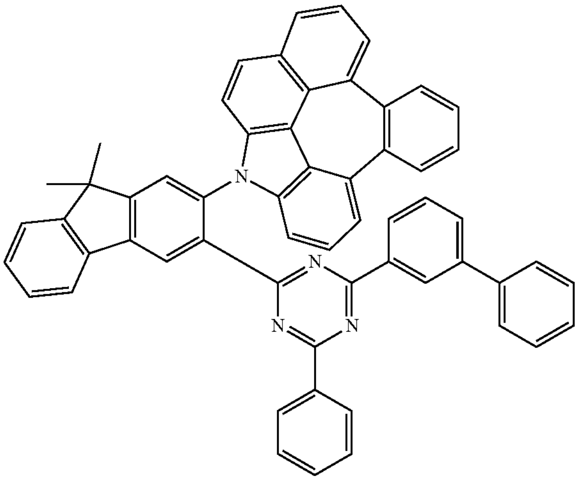

-continued
C1-217
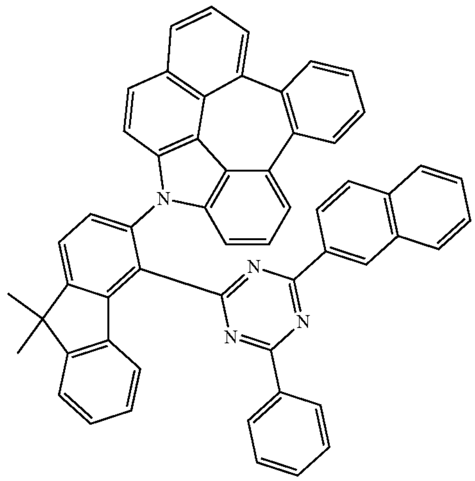
C1-218
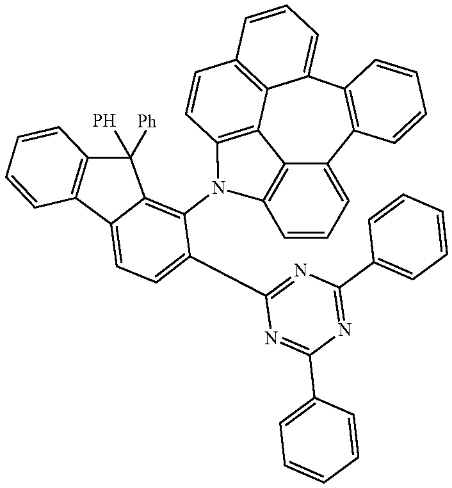
C1-219
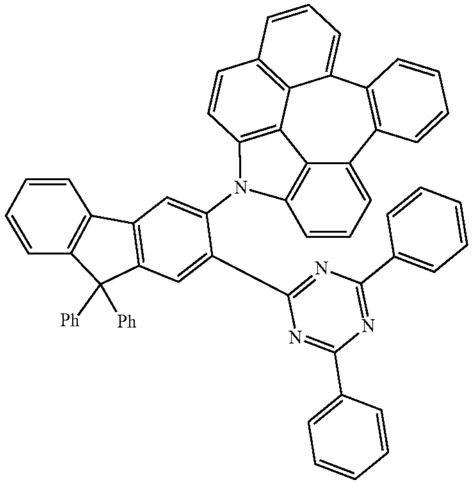
-continued
C1-220
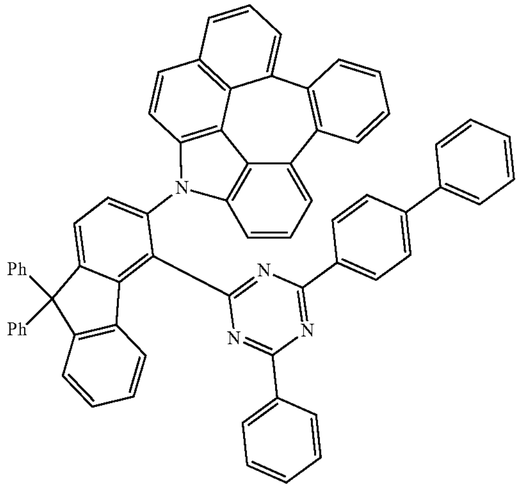
C1-221
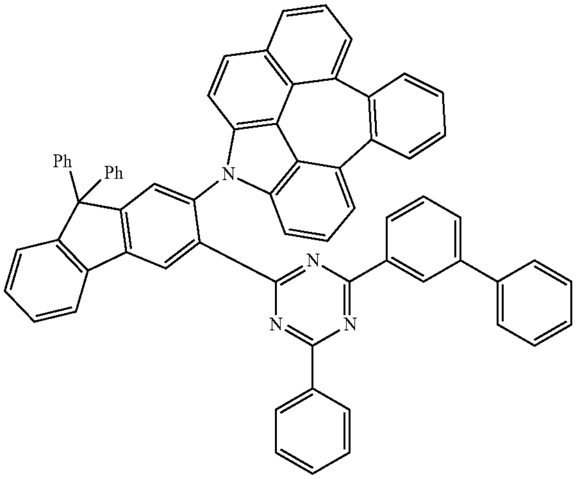
C1-222
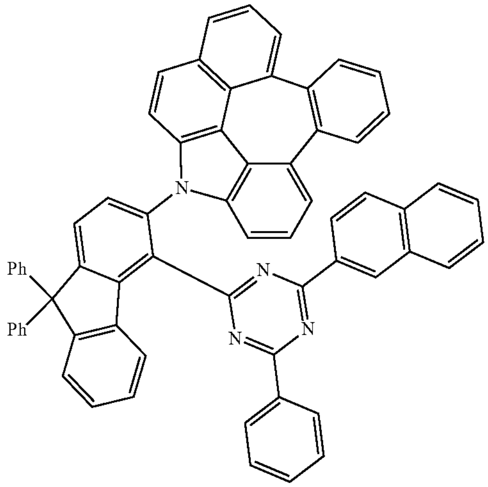

-continued
C1-223
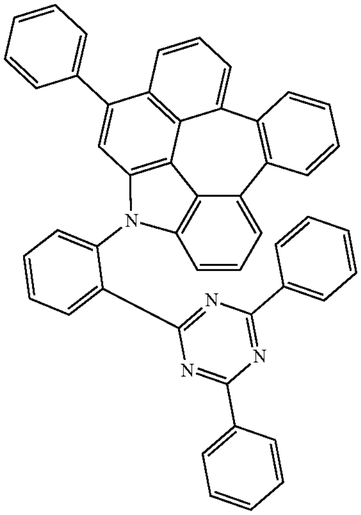
C1-224
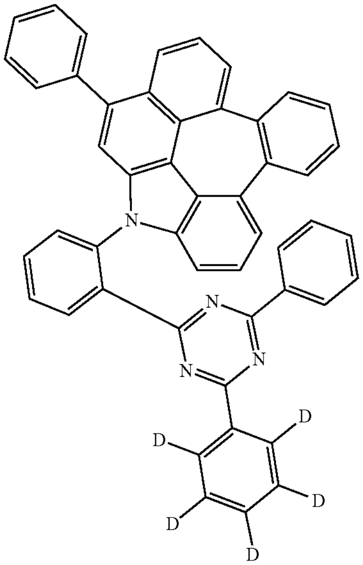
C1-225
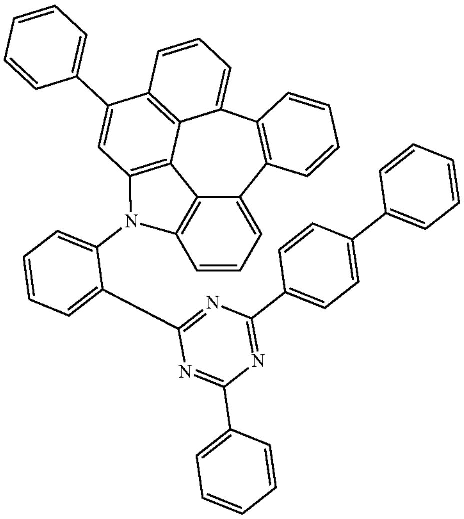
-continued
C1-226
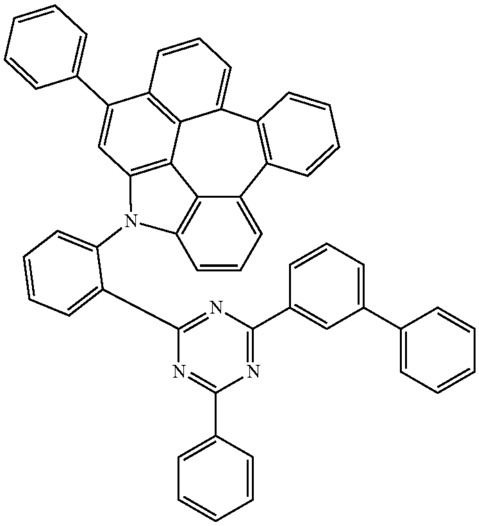
C1-227
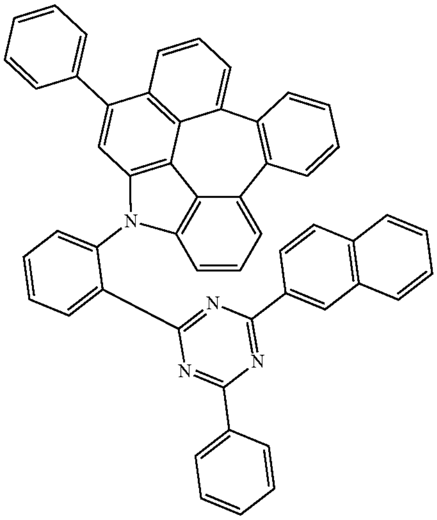
C1-228
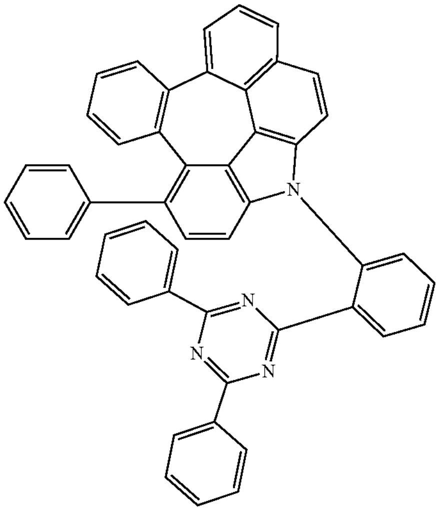

-continued
C1-229
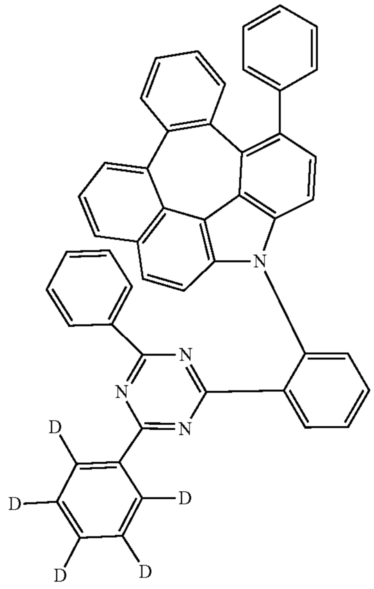
C1-230
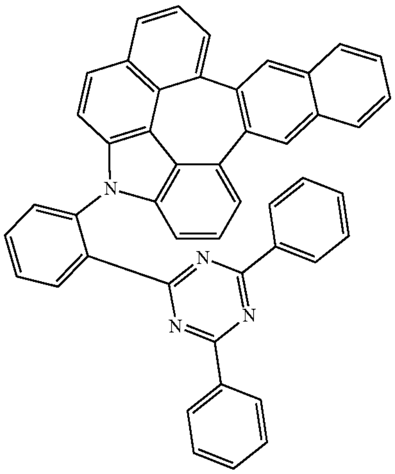
C1-231
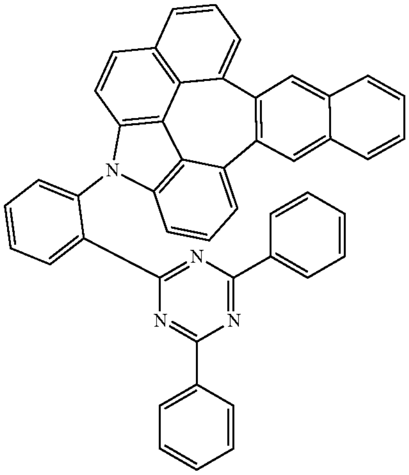
-continued
C1-232
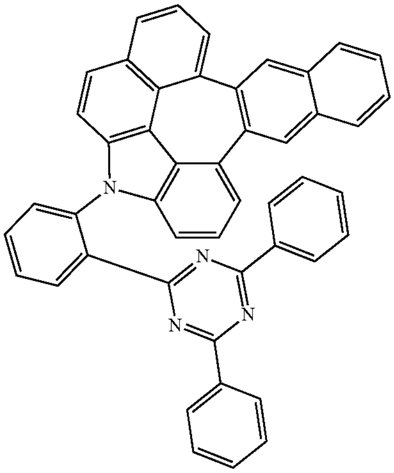
C1-233
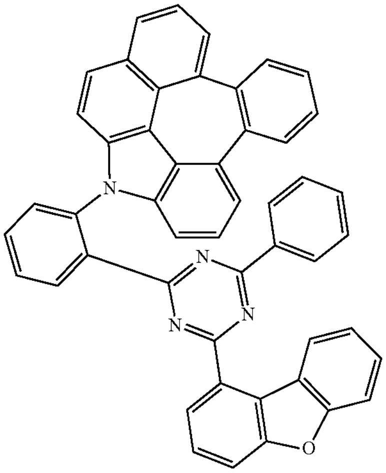
C1-234
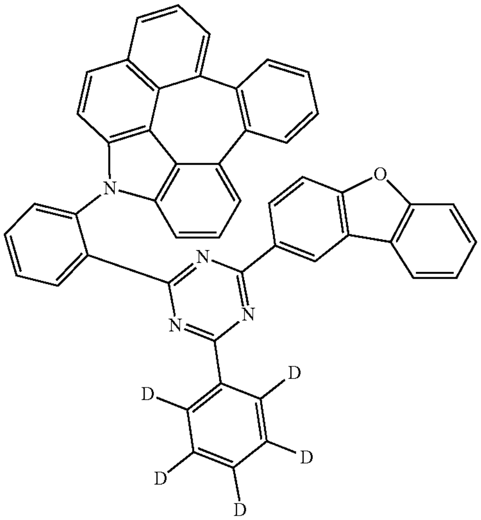

-continued
C1-235
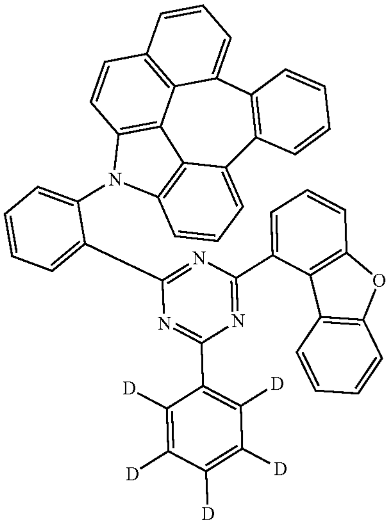
C1-236
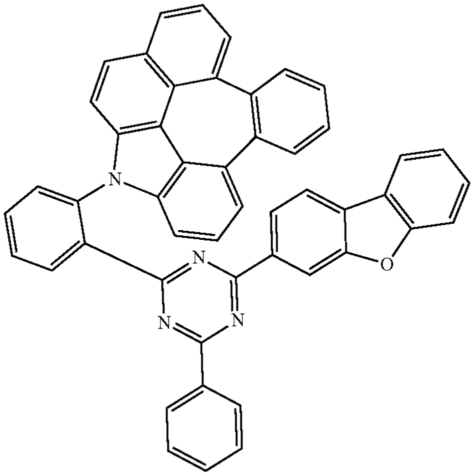
C1-237
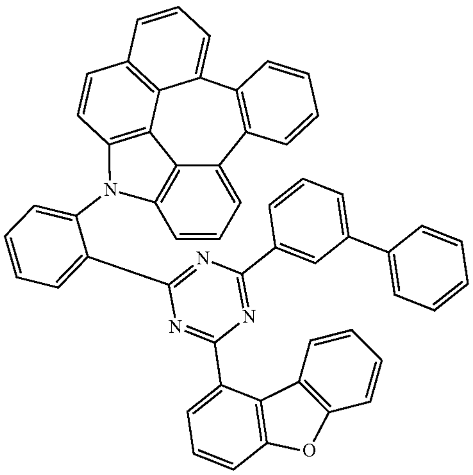
-continued
C1-238
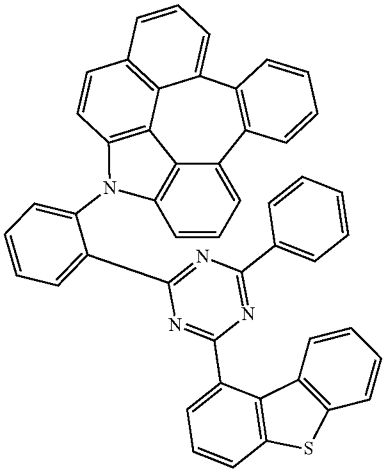
C1-239
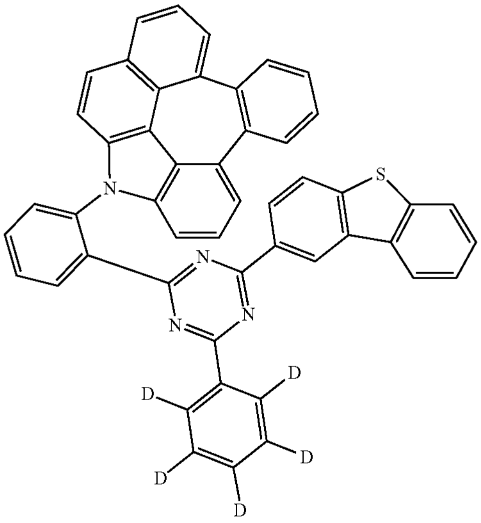
C1-240
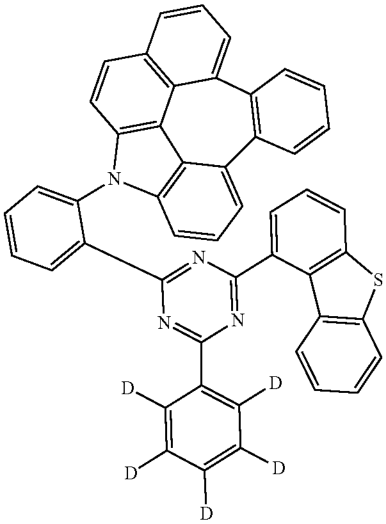

-continued
C1-241
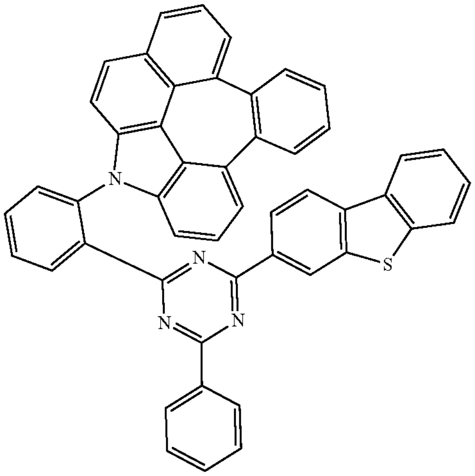
C1-242
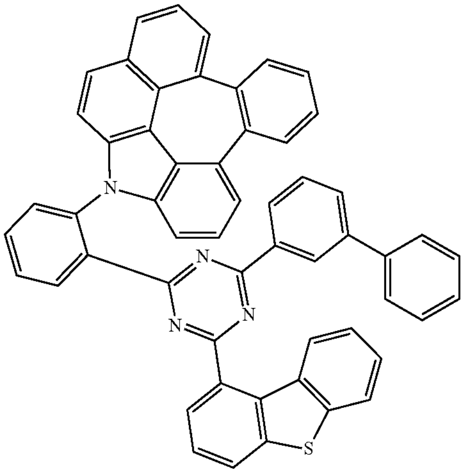
C1-243
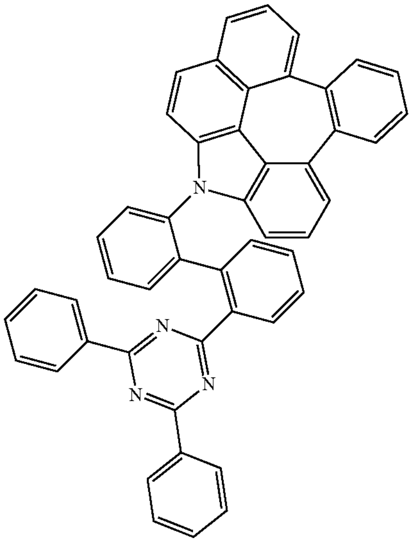
-continued
C1-244
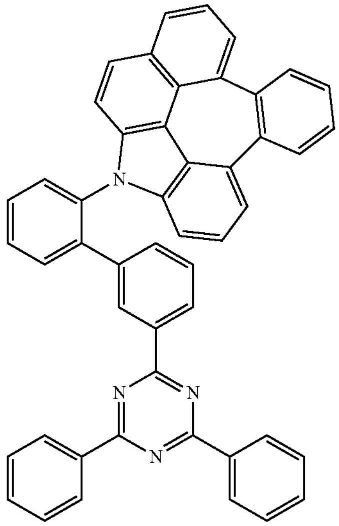
C1-245
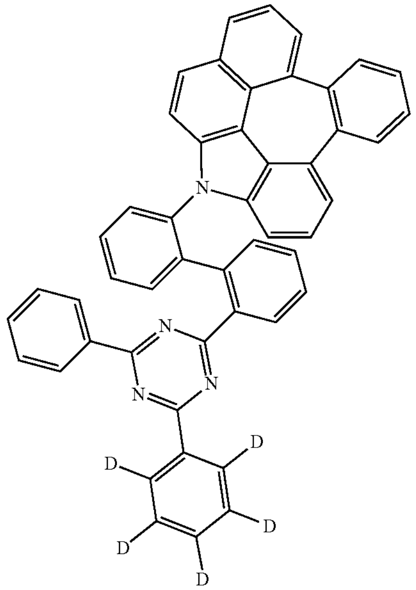
C1-246
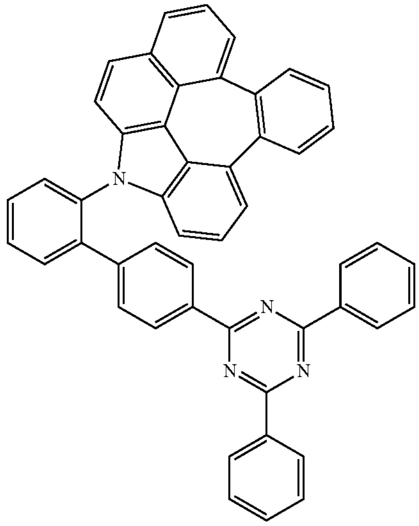

-continued
C1-247
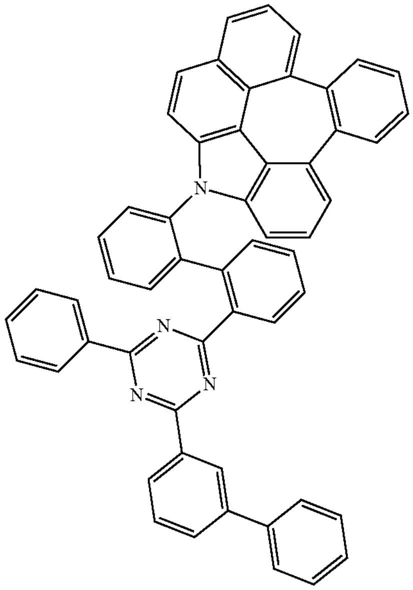
C1-248
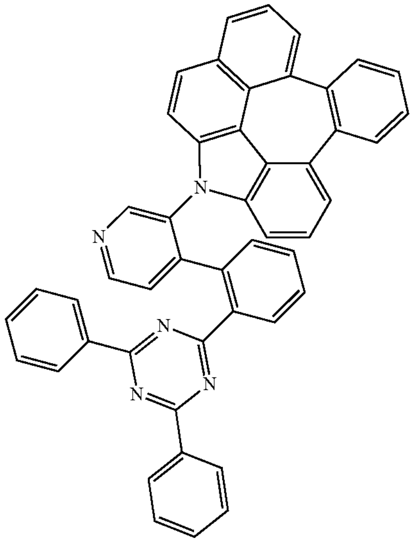
C1-249
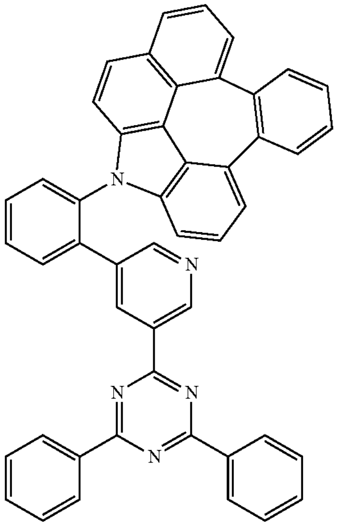
-continued
C1-250
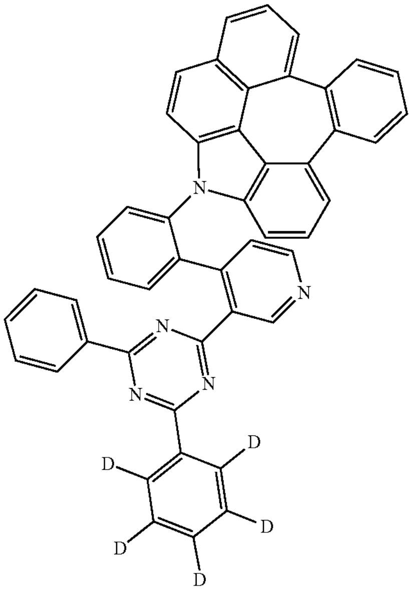
C1-251
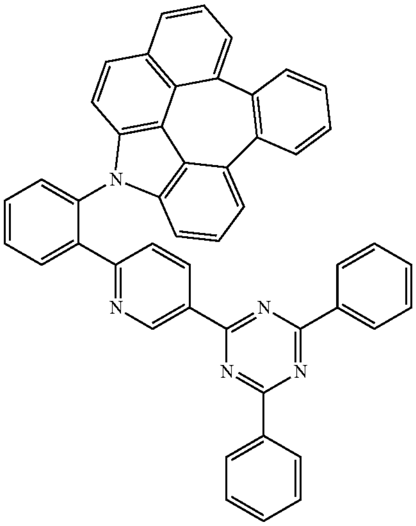

-continued
C1-252
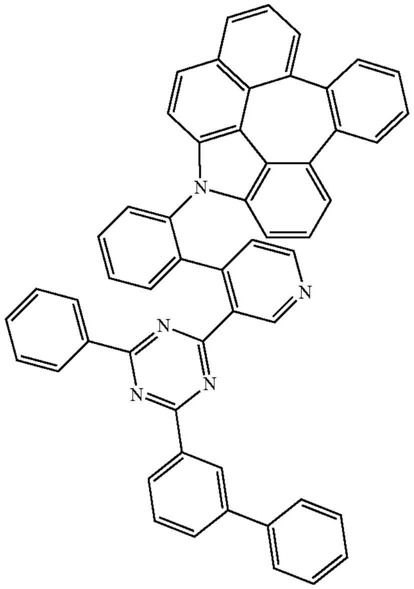
C1-253
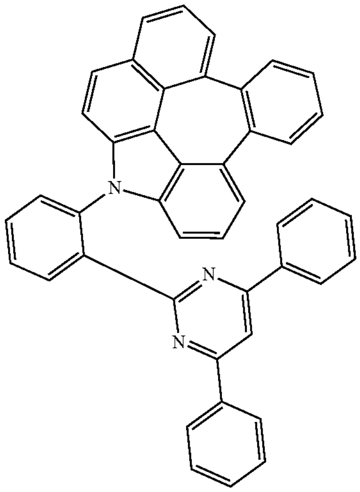
C1-254
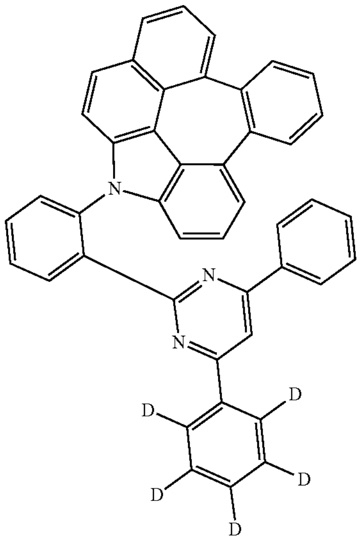
-continued
C1-255
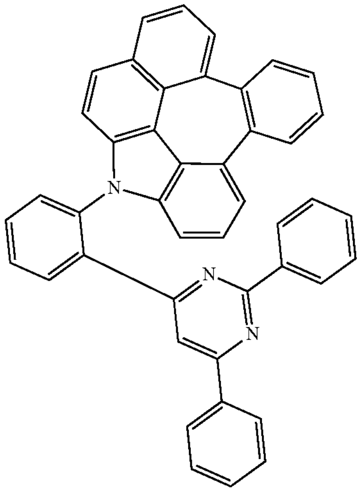
C1-256
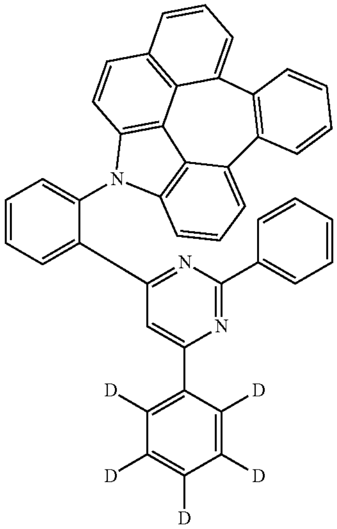
C1-257
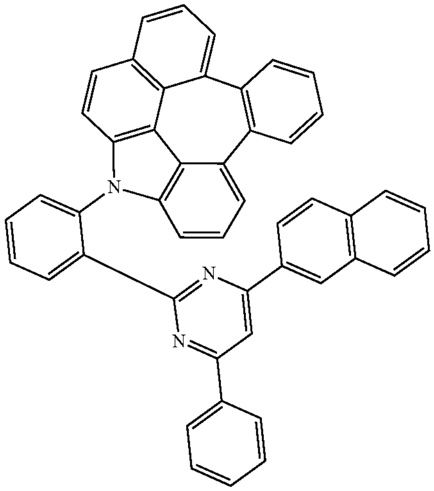

-continued
C1-258
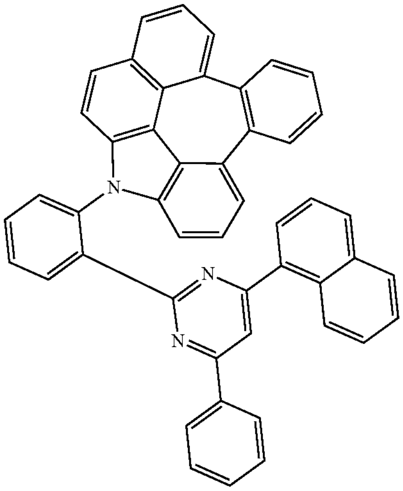
C1-259
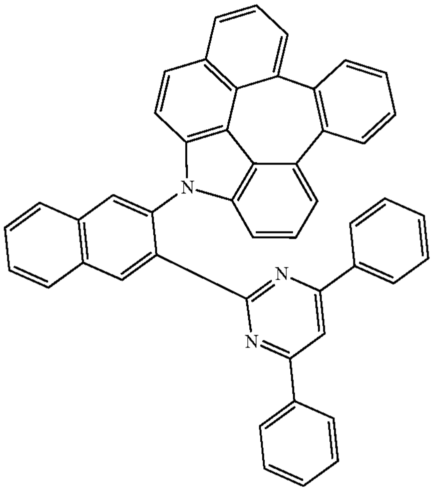
C1-260
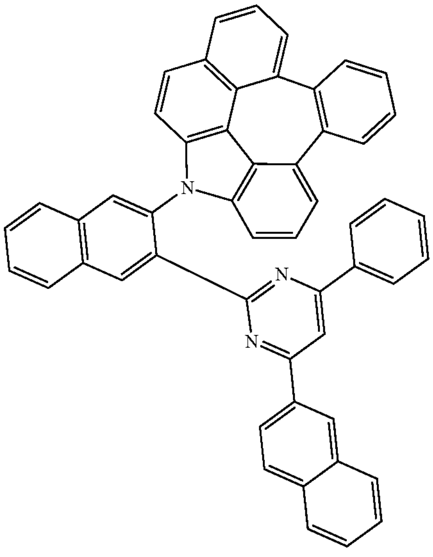
-continued
C1-261
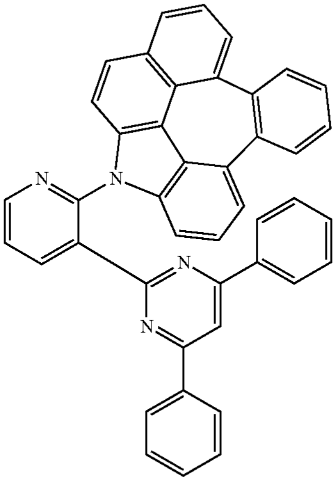
C1-262
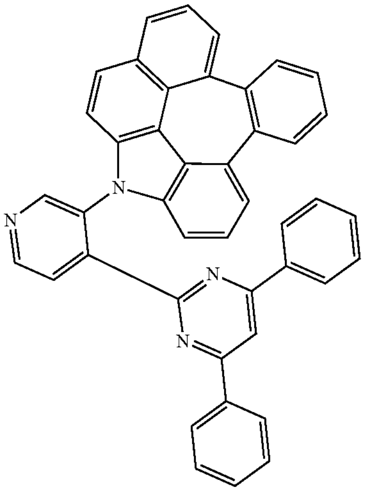
C1-263
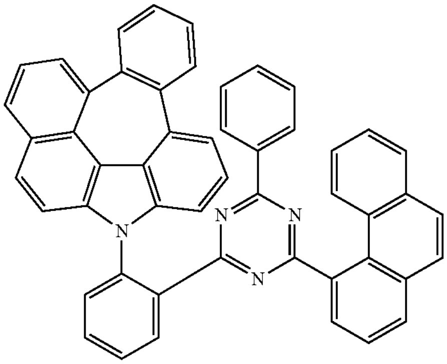

-continued
C1-264
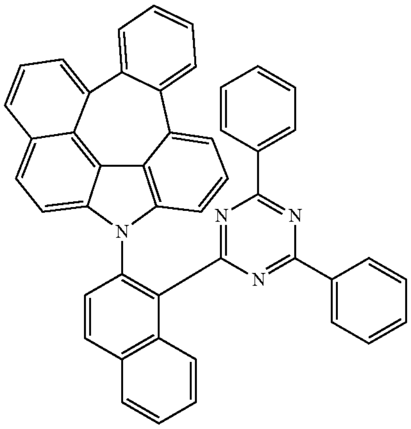
C1-265
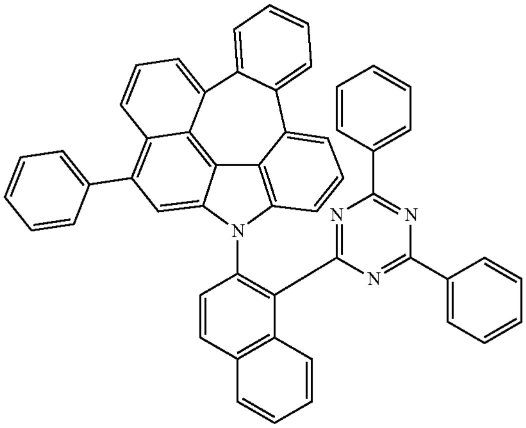
-continued
C1-266
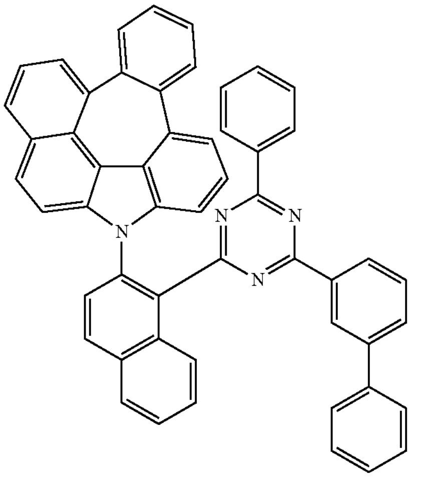
C1-267
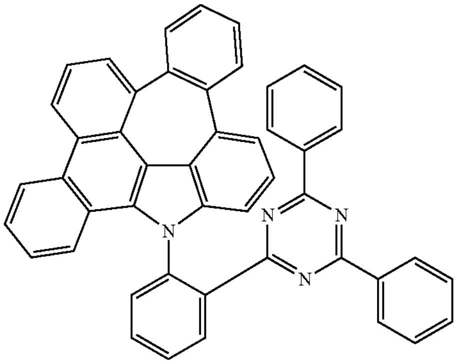
The compound represented by formula 3 may be at least one selected from the following compounds, but is not limited thereto.
H1-1
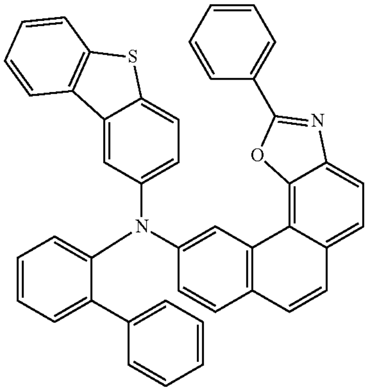
H1-2
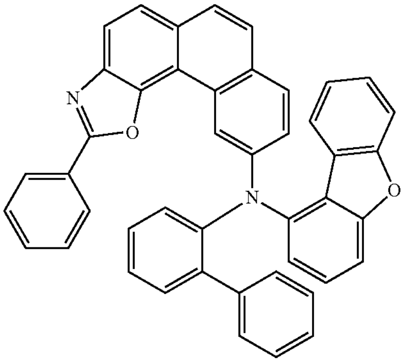

-continued
H1-3
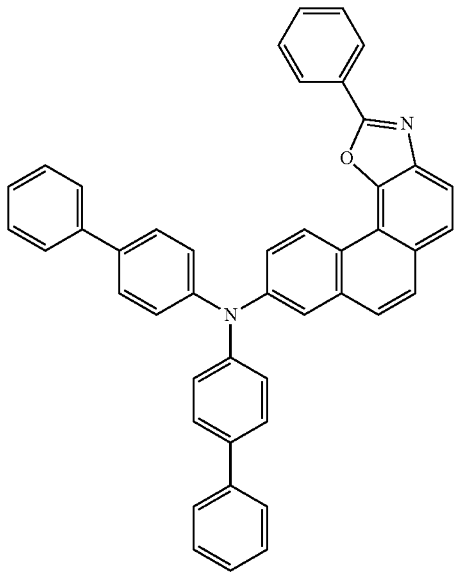
H1-4
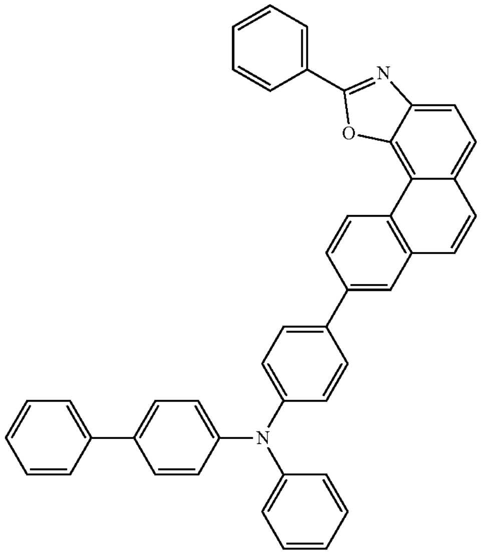
H1-5
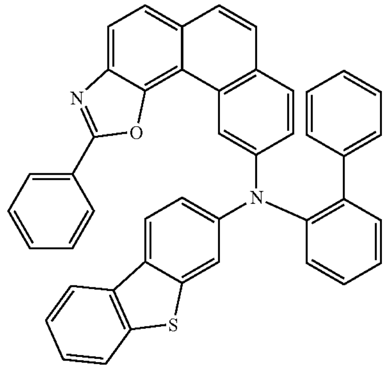
H1-6
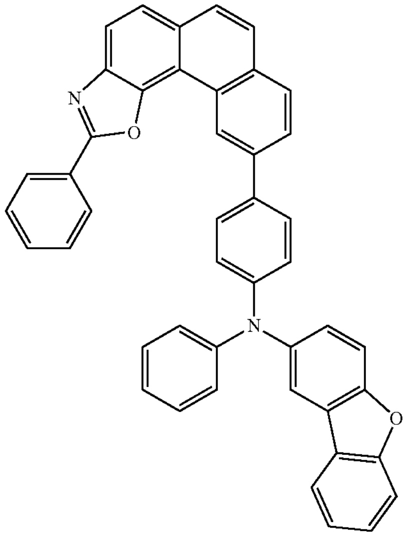
H1-7
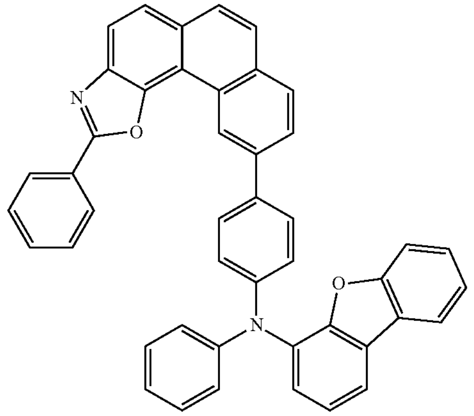
H1-8
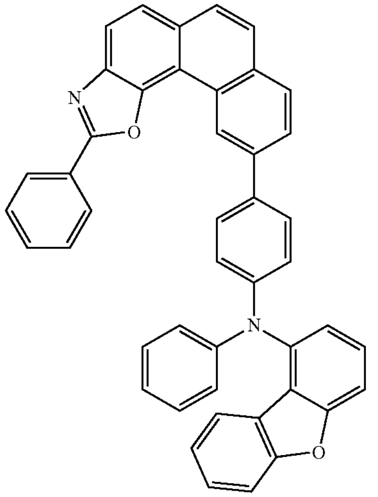

-continued
H1-9
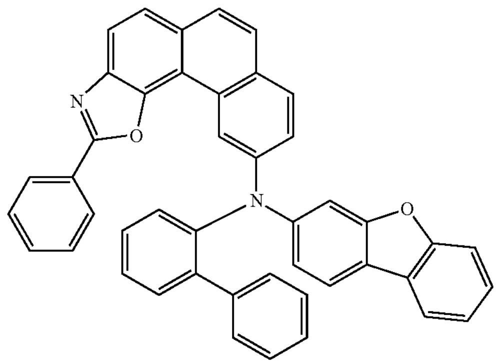
H1-10
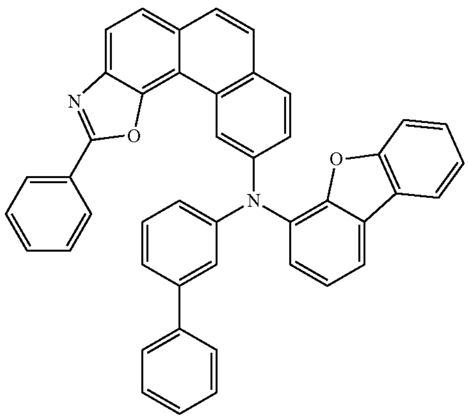
H1-11
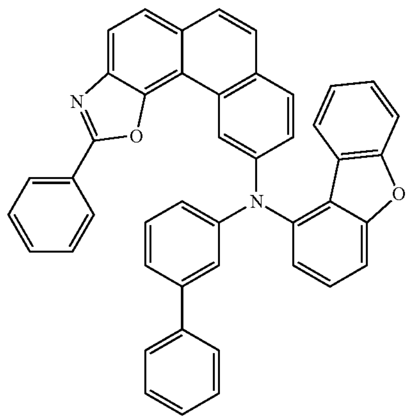
H1-12
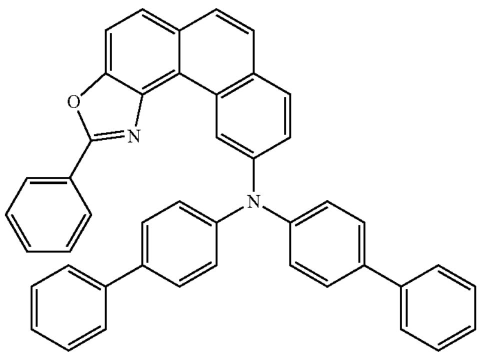
H1-13
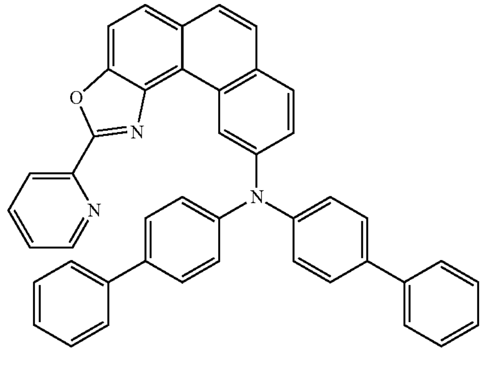
H1-14
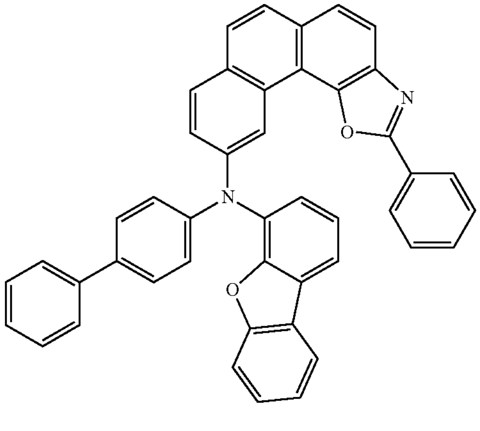

-continued
H1-15
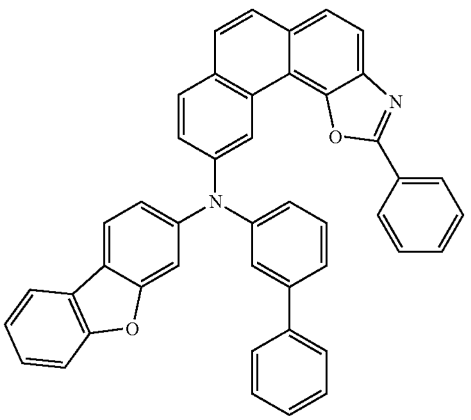
H1-16
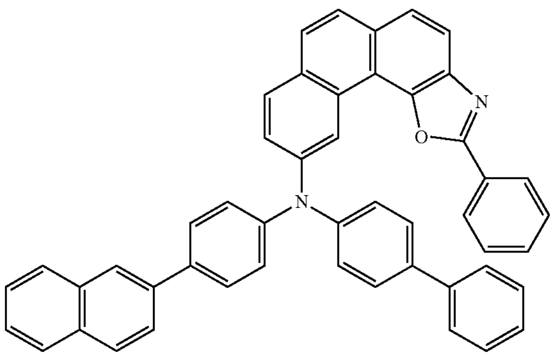
H1-17
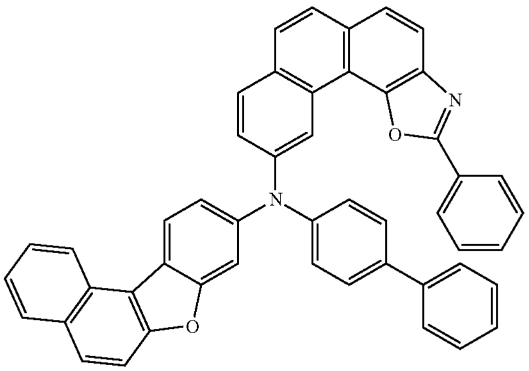
H1-18
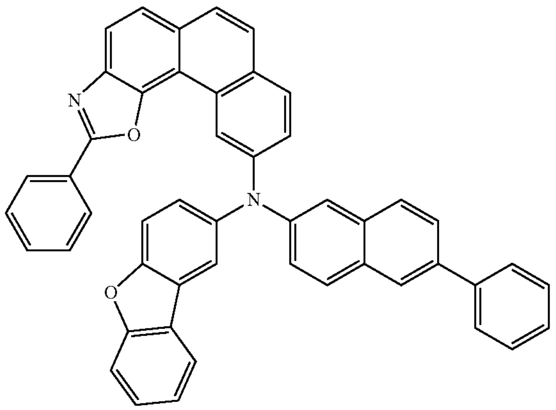
H1-19
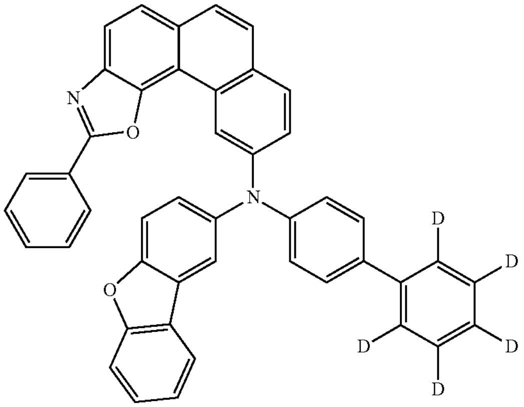
H1-20
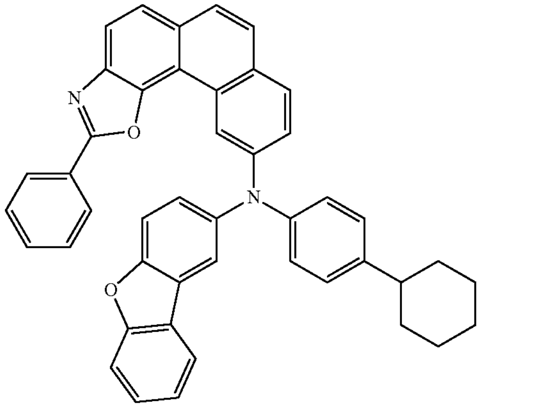

-continued
H1-21
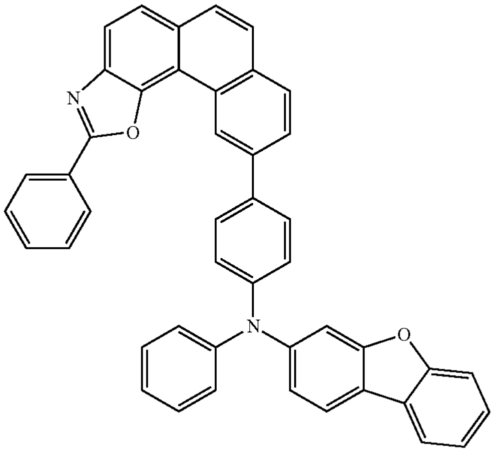
H1-22
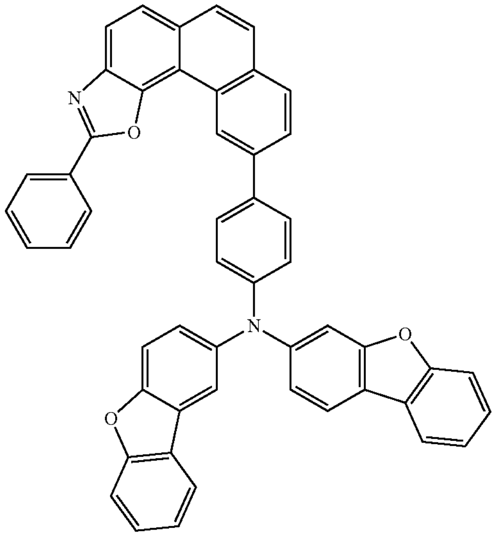
H1-23
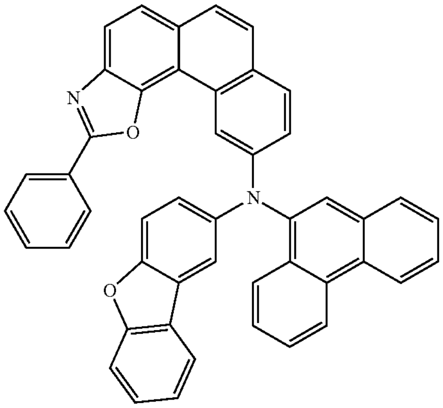
H1-24
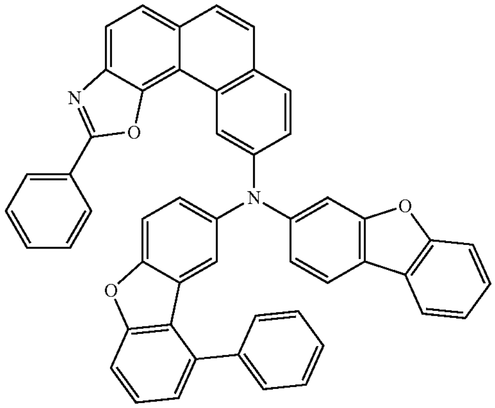
H1-25
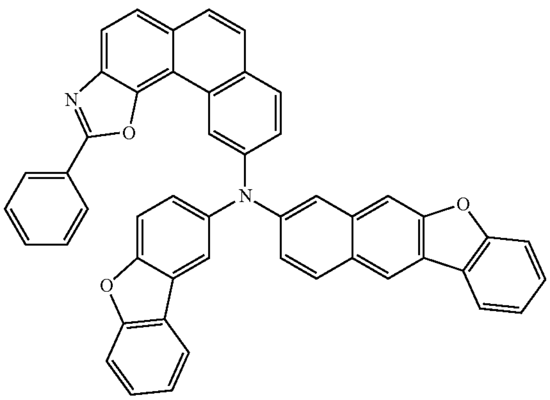
H1-26
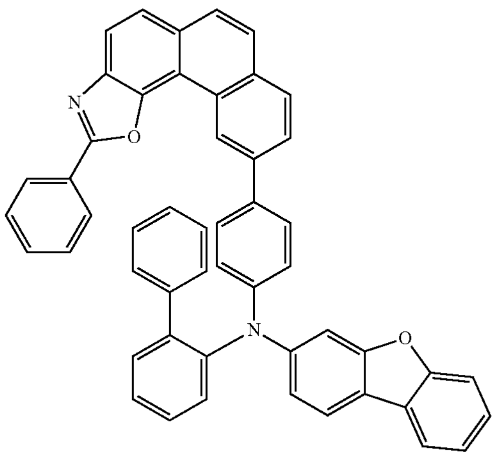

-continued
H1-27
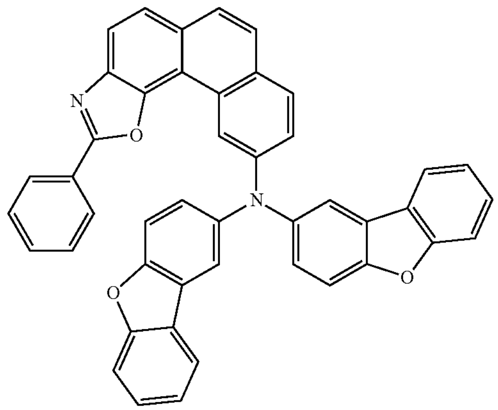
H1-28
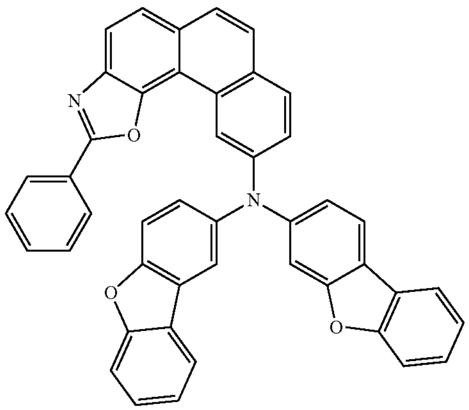
H1-29
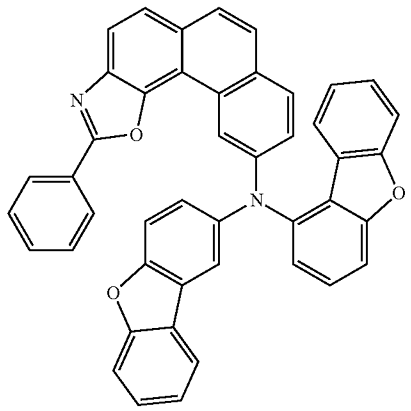
H1-30
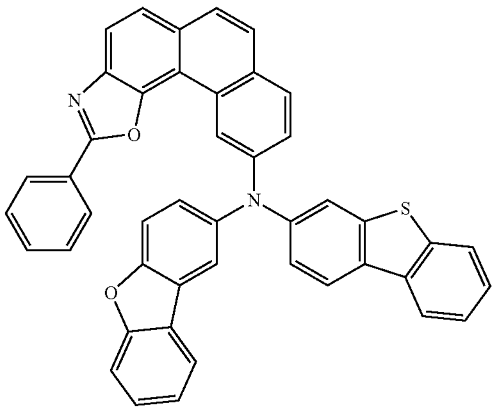
H1-31
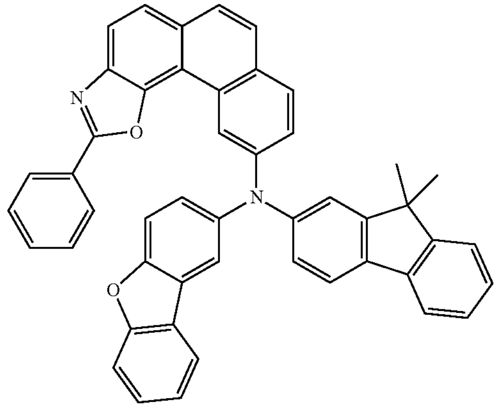
H1-32
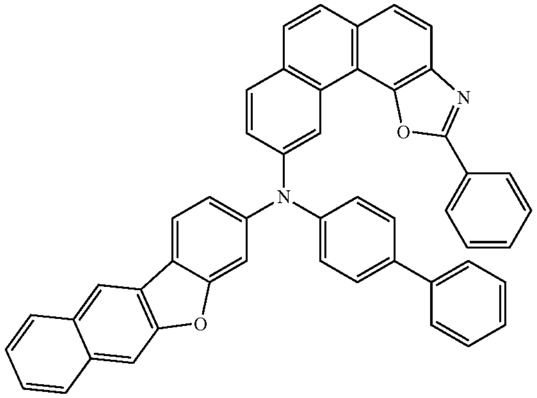

-continued
H1-33
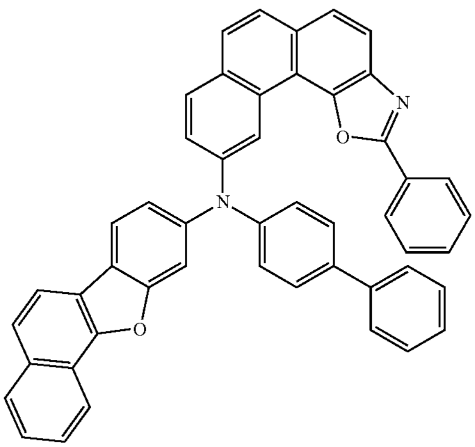
H1-34
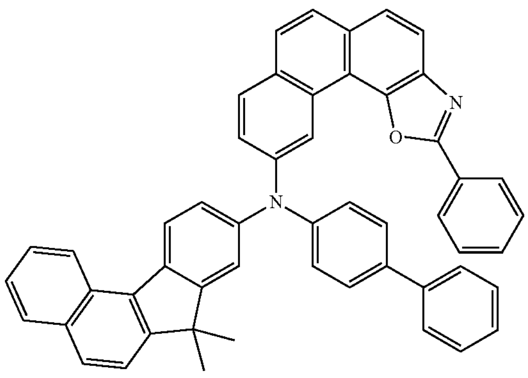
H1-35
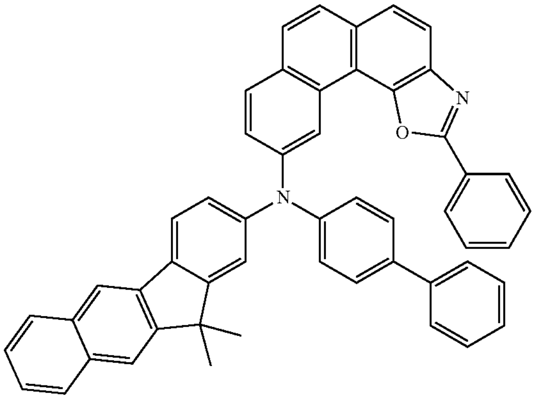
H1-36
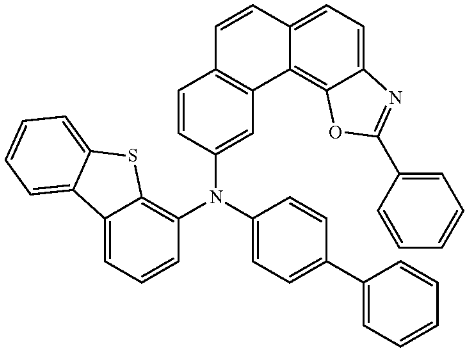
H1-37
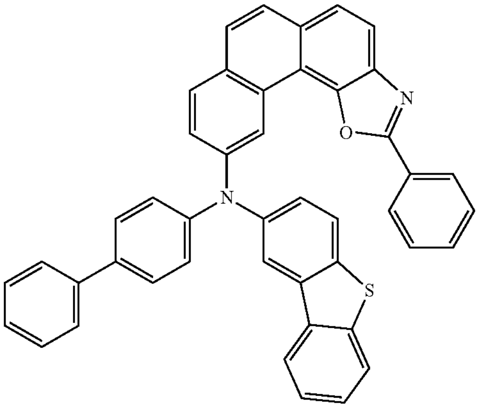
H1-38
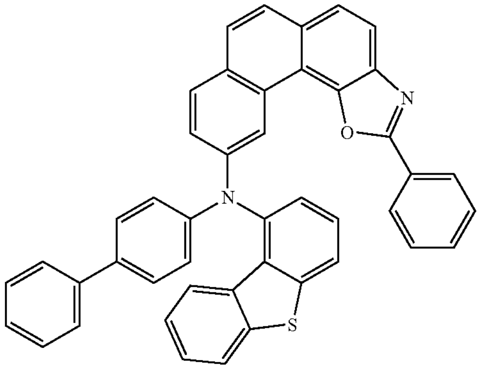

-continued
H1-39
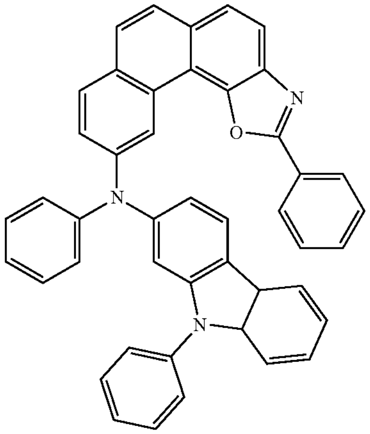
H1-40
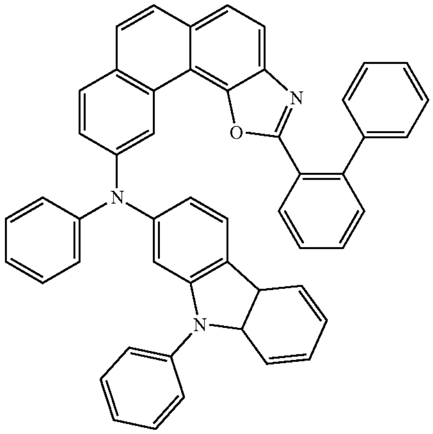
H1-41
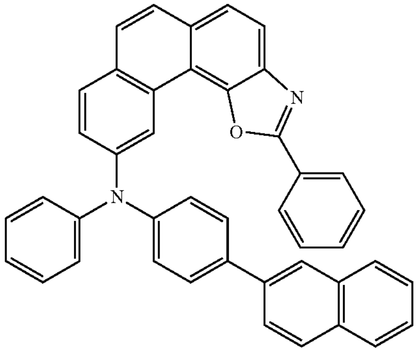
H1-42
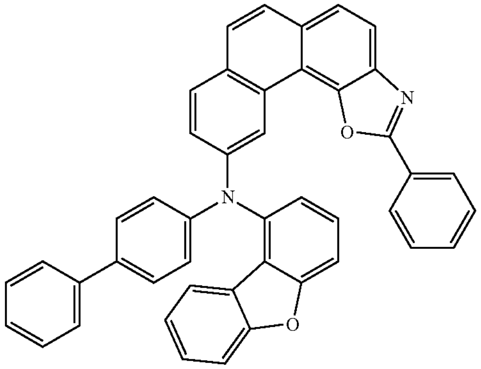
H1-43
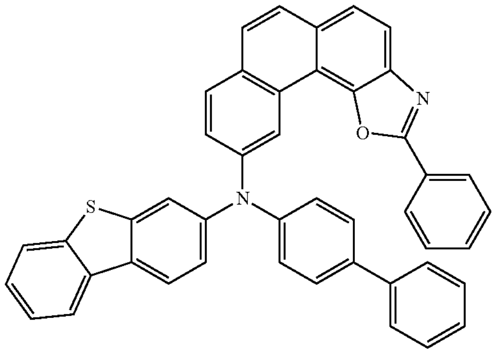
H1-44
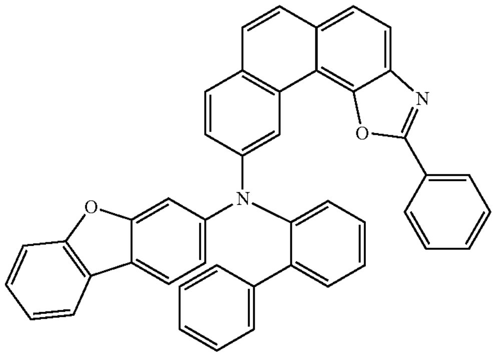
H1-45
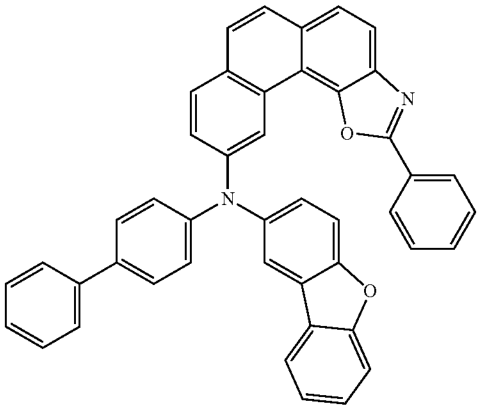
H1-46
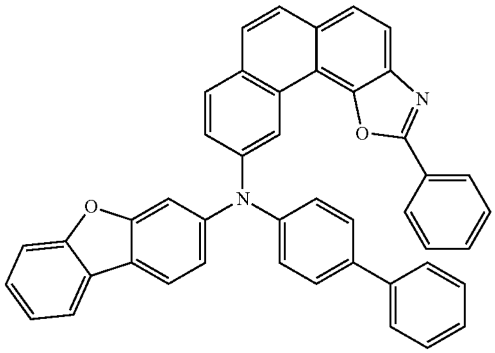

-continued
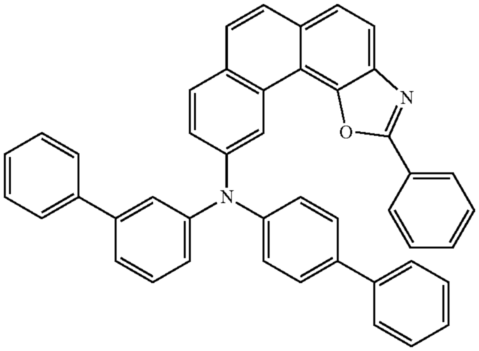
H1-47
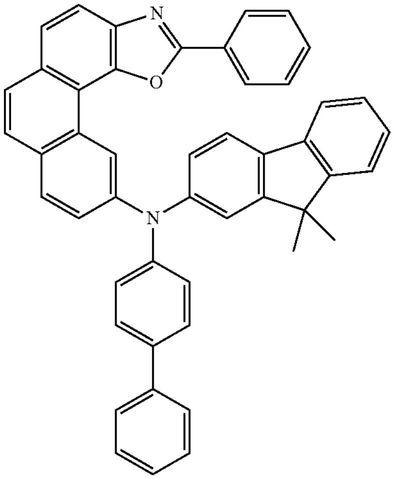
H1-48
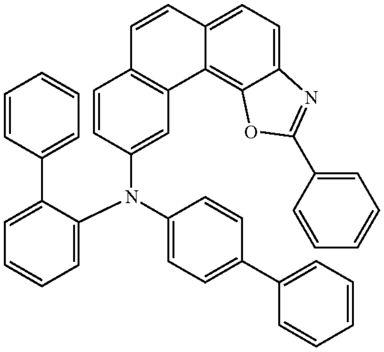
H1-49
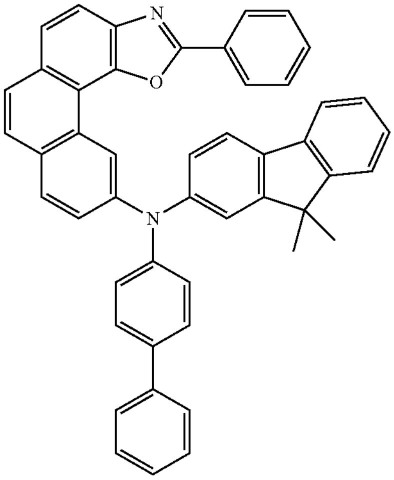
H1-50
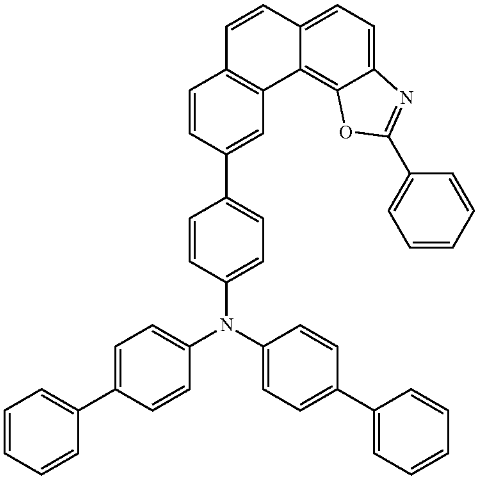
H1-51
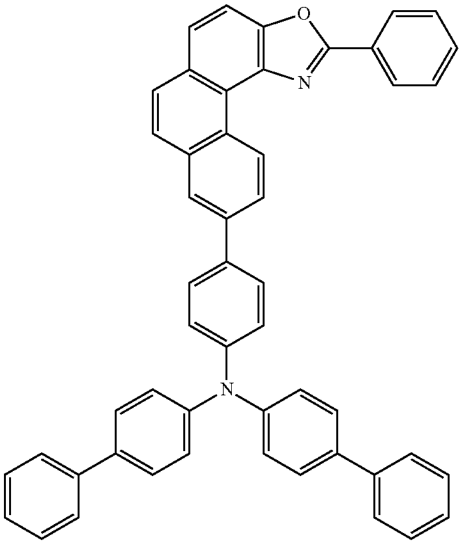
H1-52

-continued
H1-53
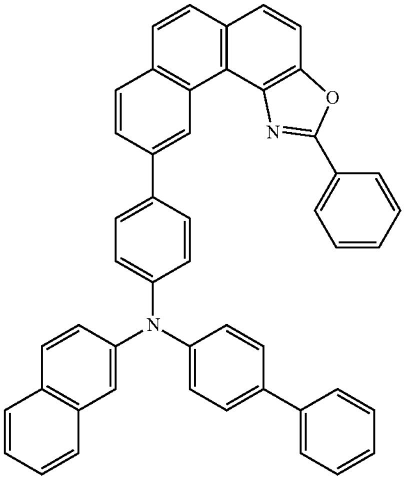
H1-54
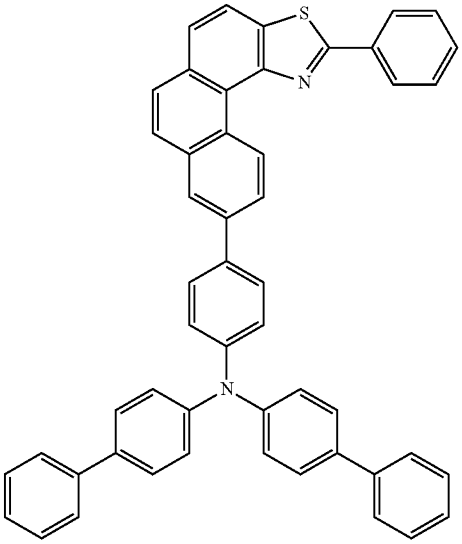
H1-55
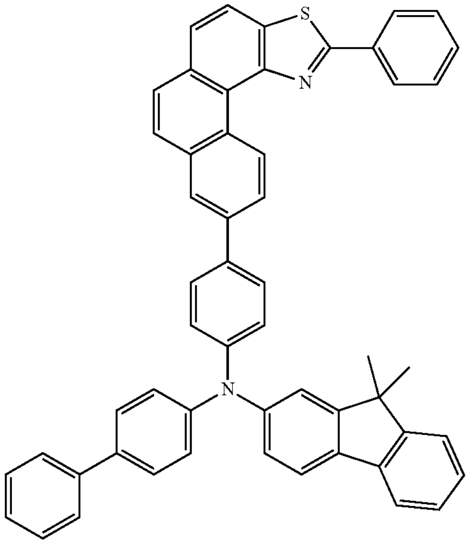
H1-56
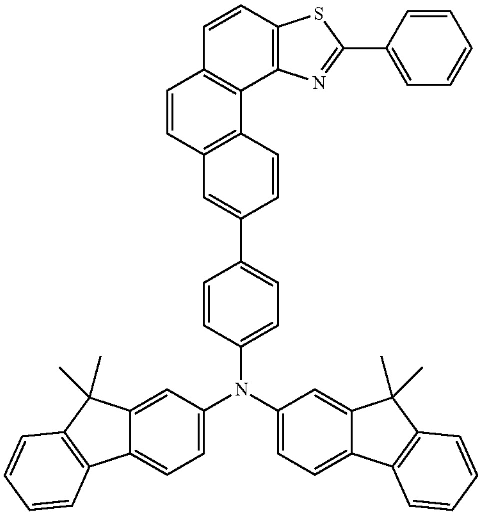
H1-57
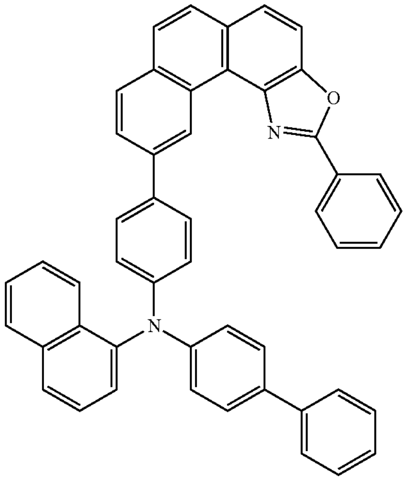
H1-58
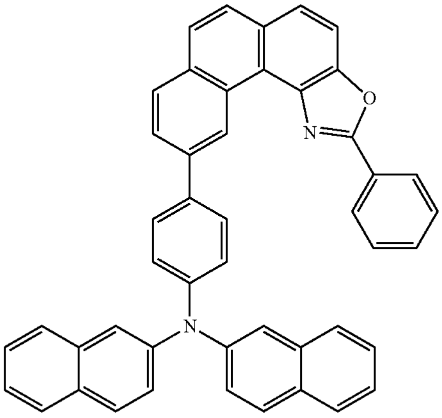

-continued
H1-59
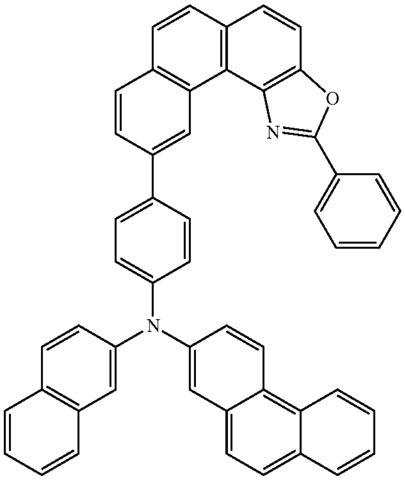
H1-60
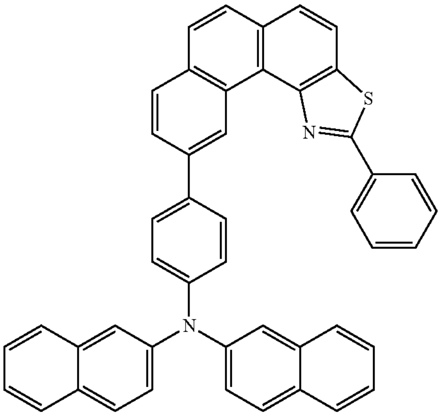
H1-61
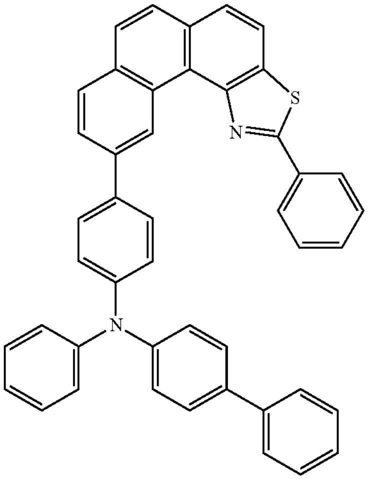
H1-62
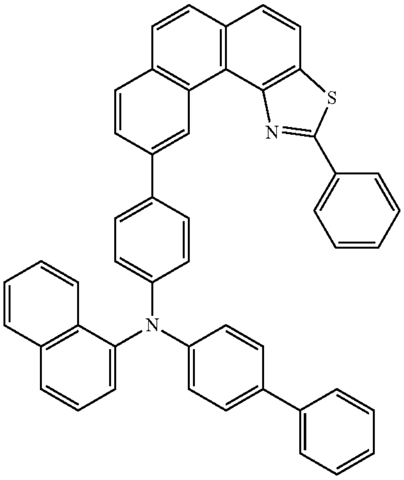
H1-63
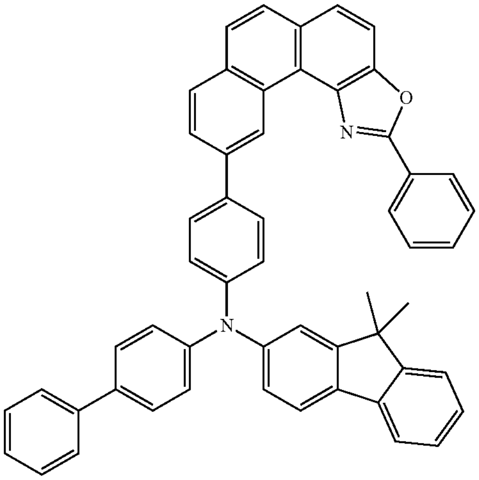
H1-64
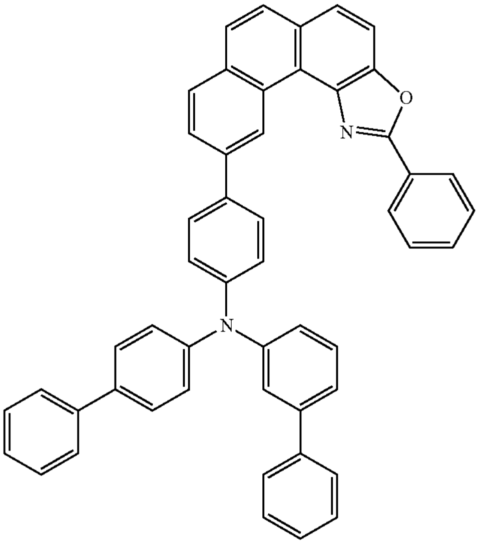

-continued
H1-65
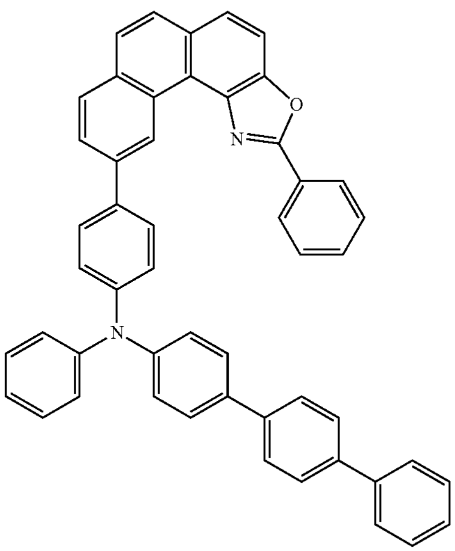
H1-66
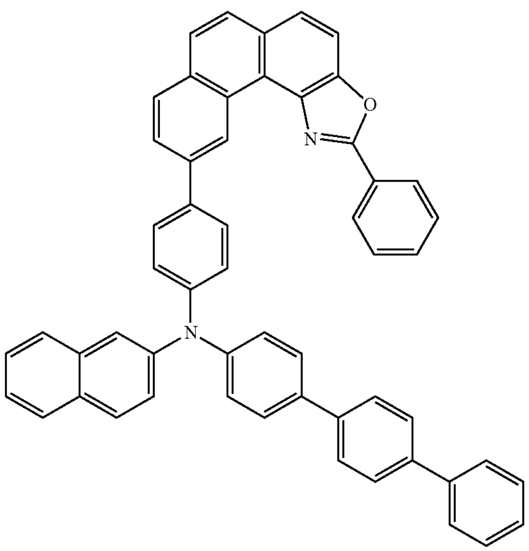
H1-67
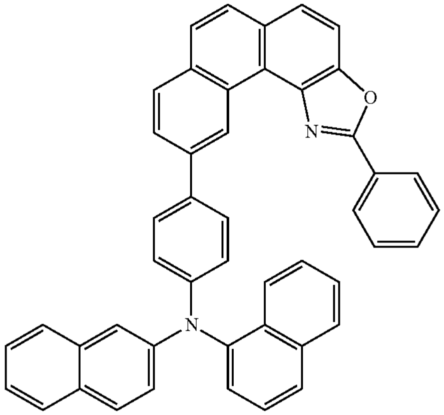
H1-68
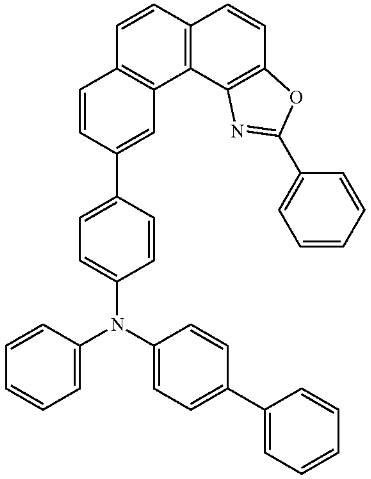
H1-69
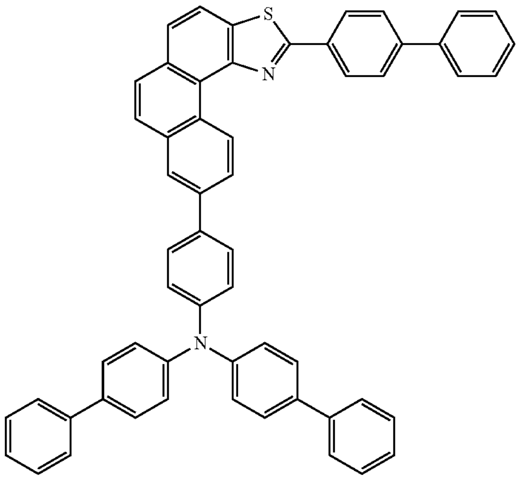
H1-70
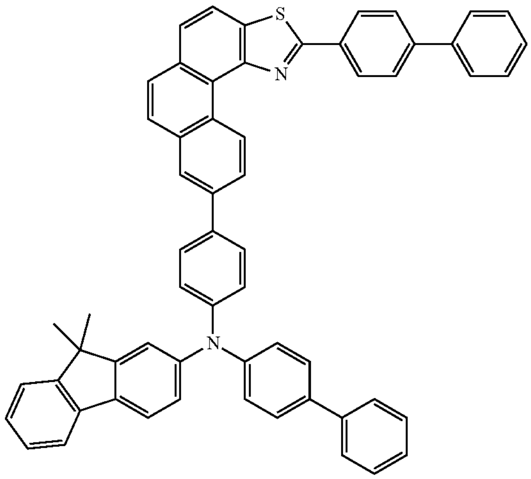

-continued
H1-71
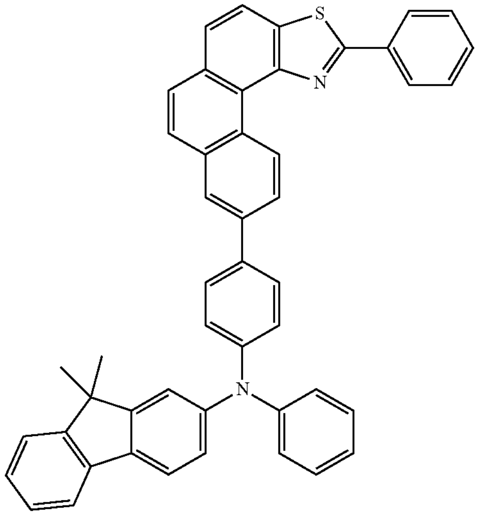
H1-72
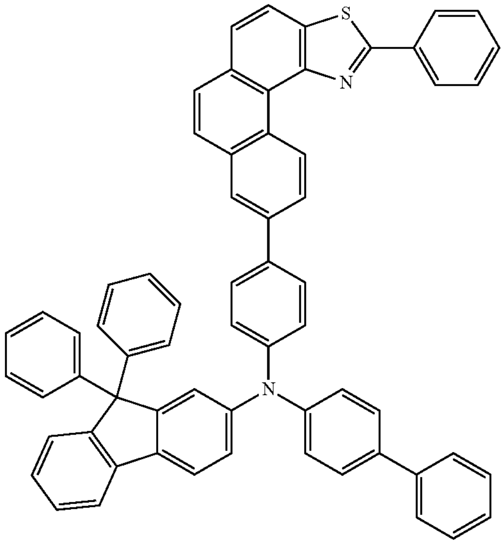
H1-73
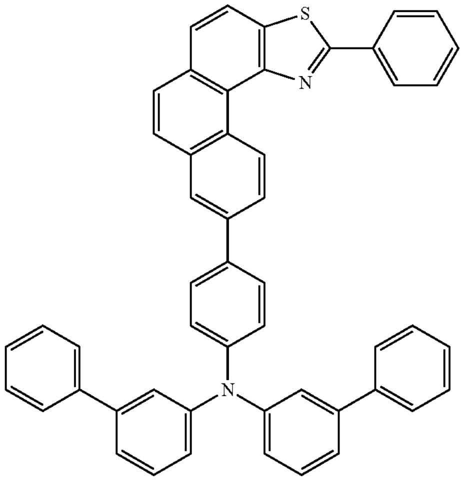
H1-74
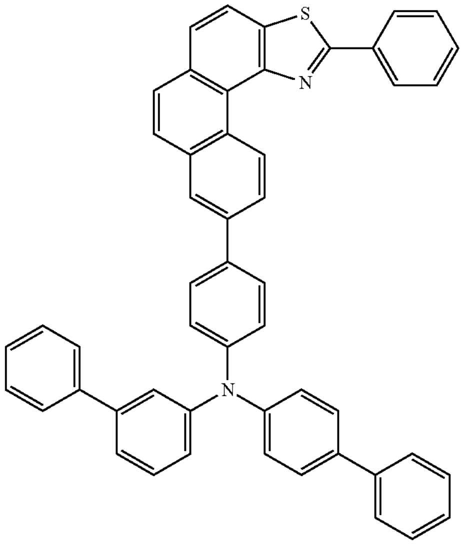
H1-75
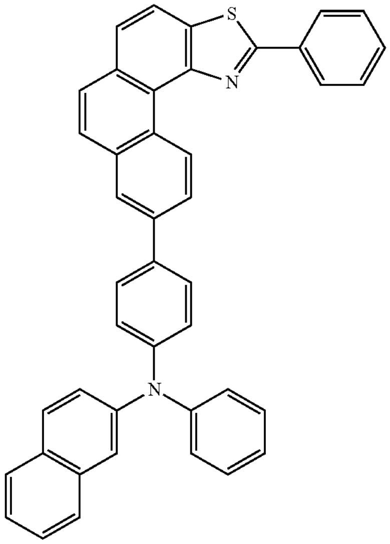
H1-76
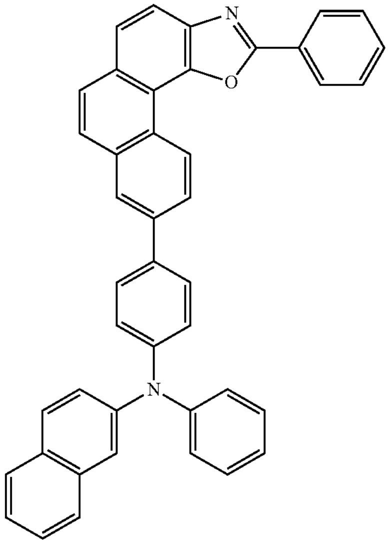

-continued
H1-77
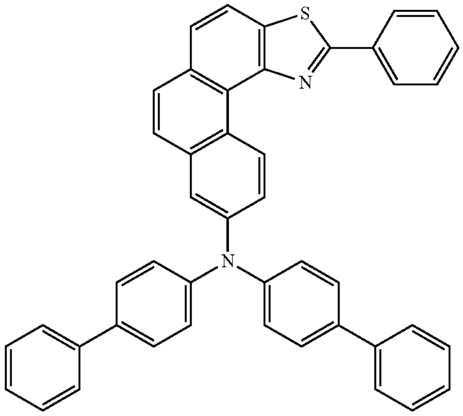
H1-78
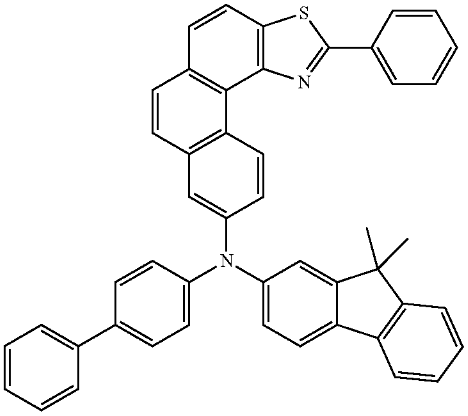
H1-79
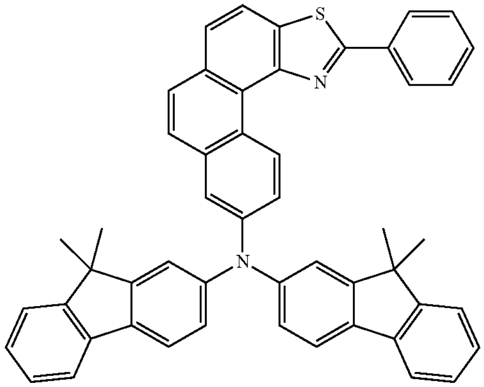
H1-80
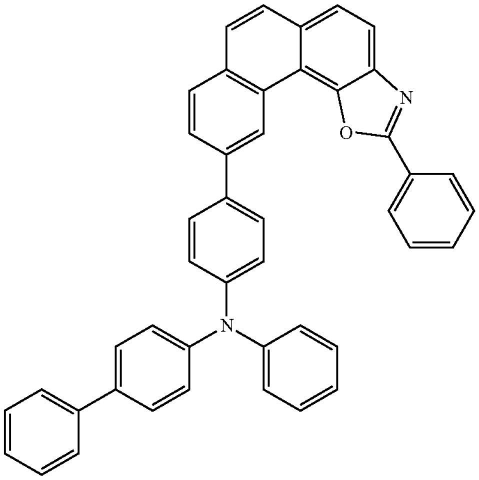
H1-81
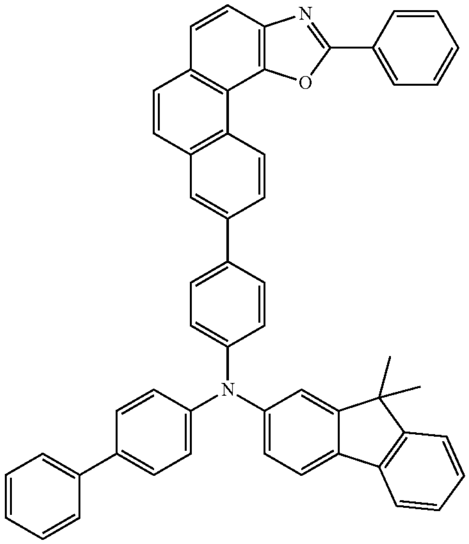
H1-82
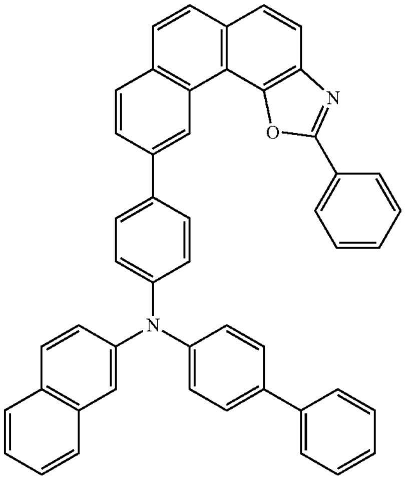

-continued
H1-83
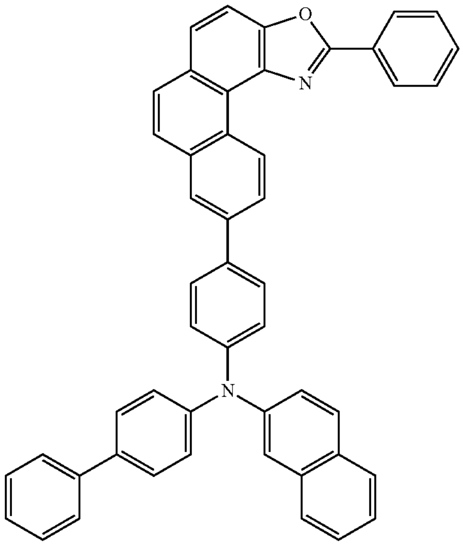
H1-84
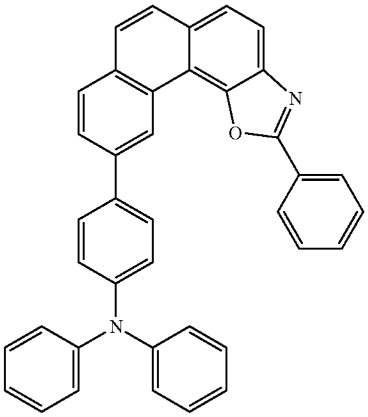
H1-85
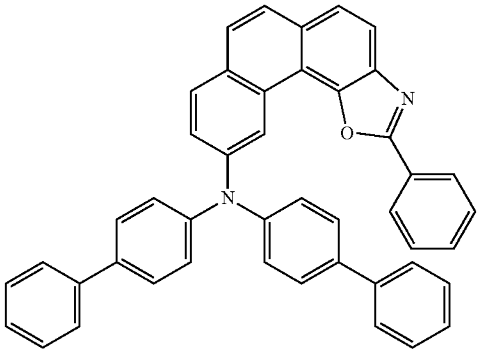
H1-86
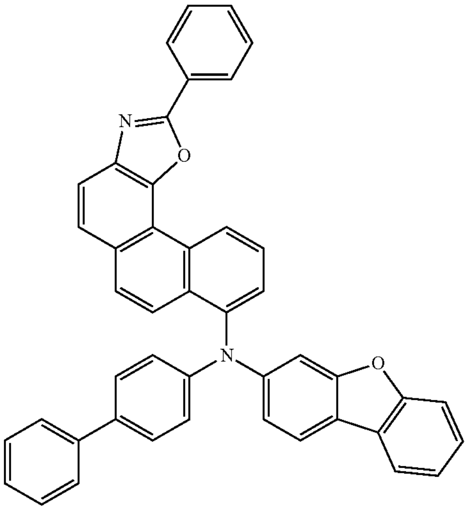
H1-87
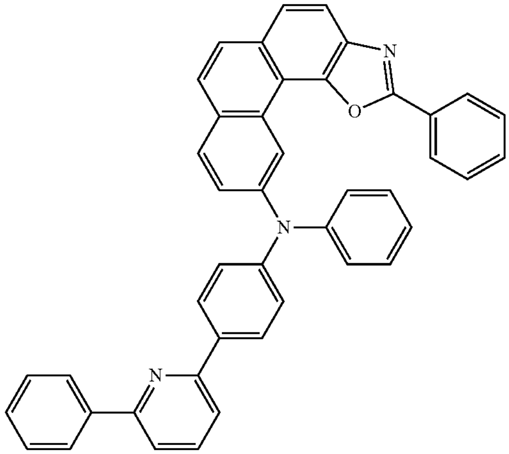
H1-88
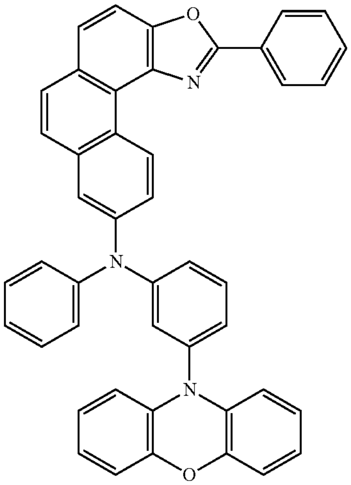

-continued
H1-89
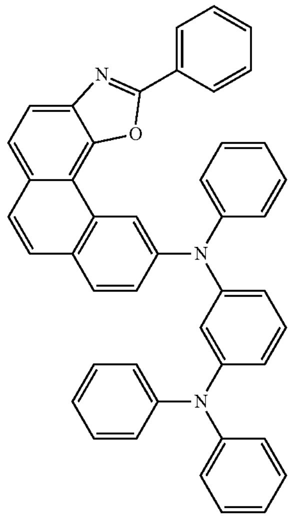
H1-90
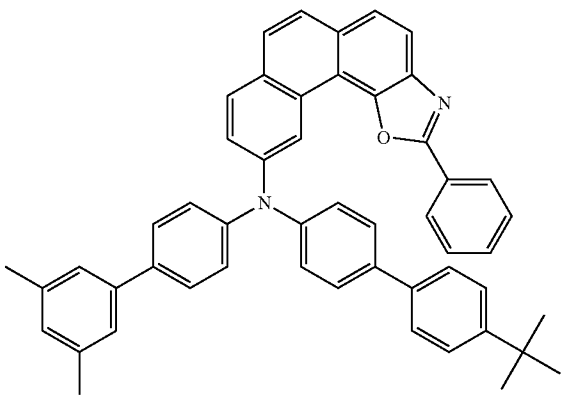
H1-91
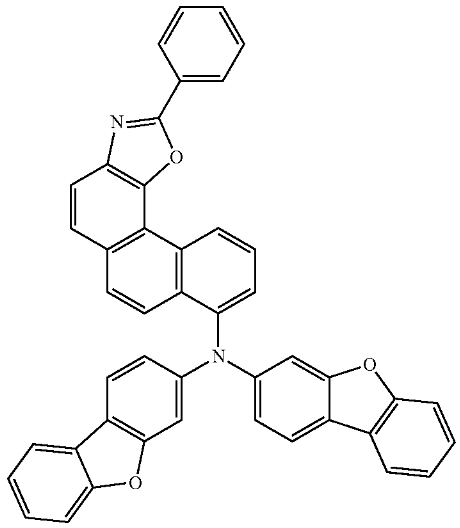
H1-92
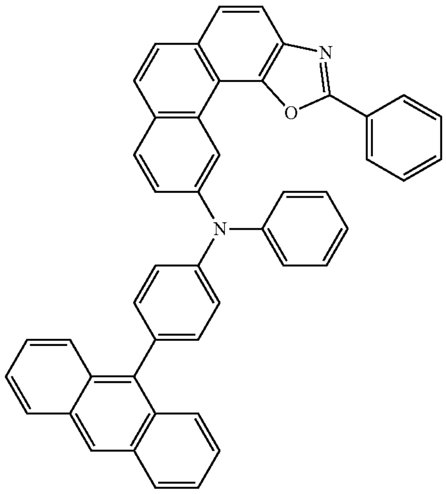
H1-93
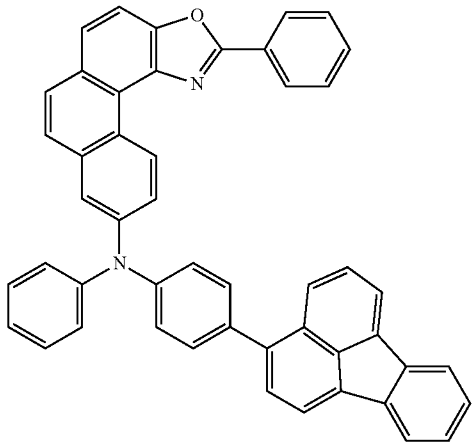
H1-94
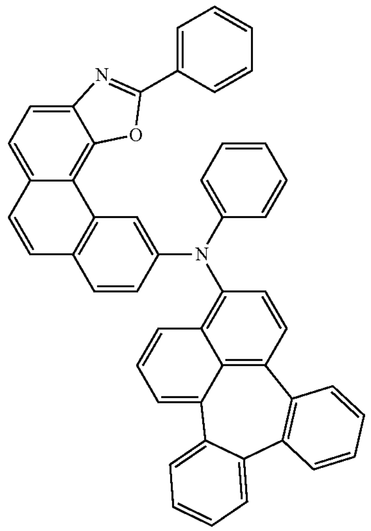

-continued
H1-95
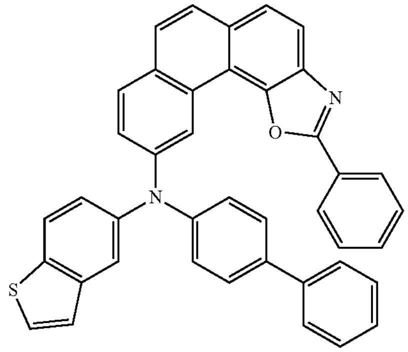
H1-96
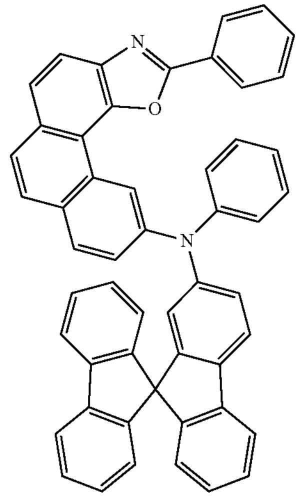
H1-97
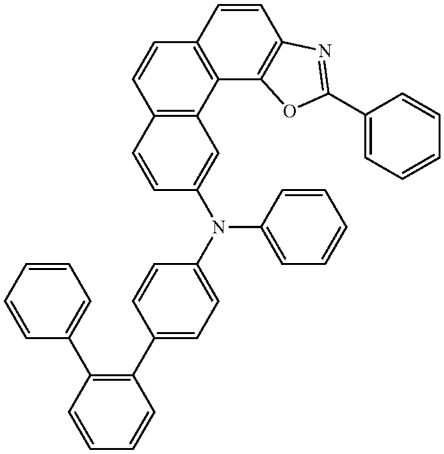
H1-98
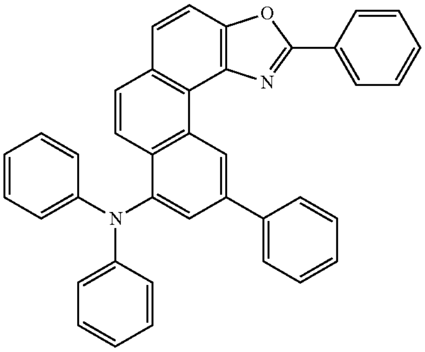
H1-99
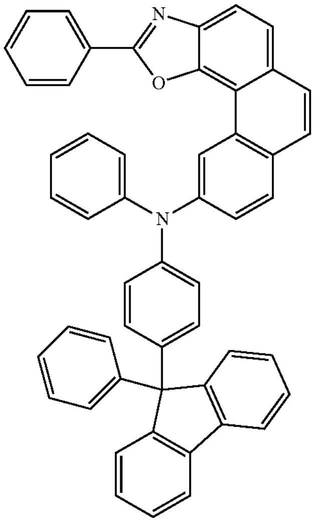
H1-100
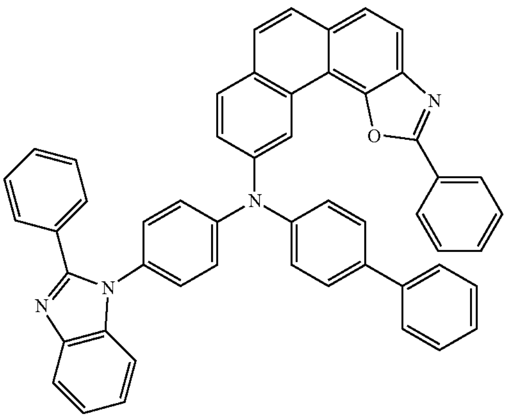

-continued
H1-101
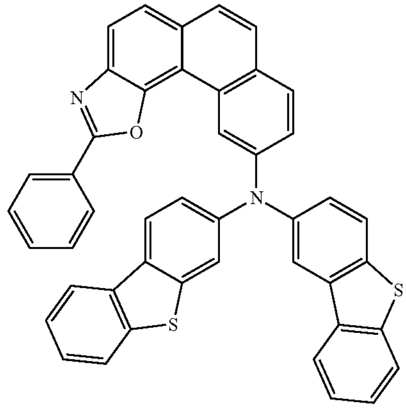
H1-102
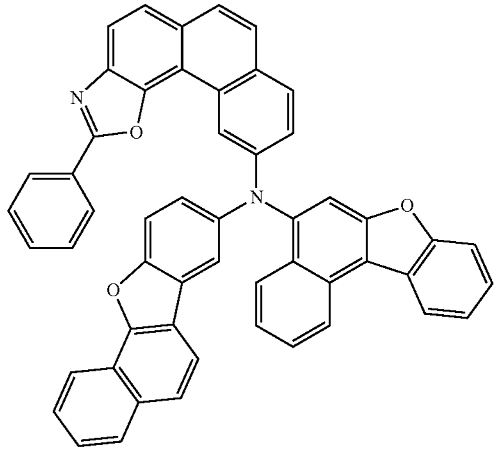
H1-103
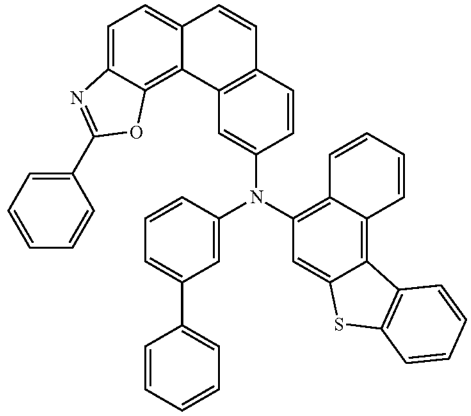
H1-104
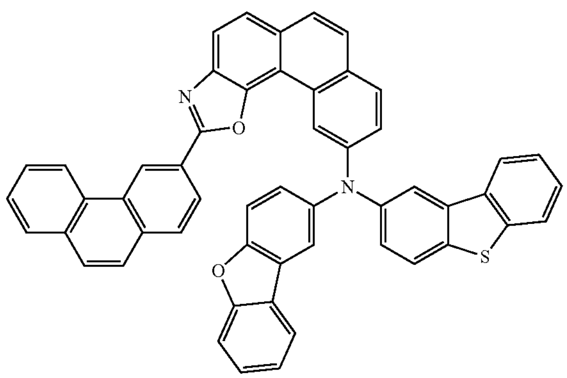
H1-105
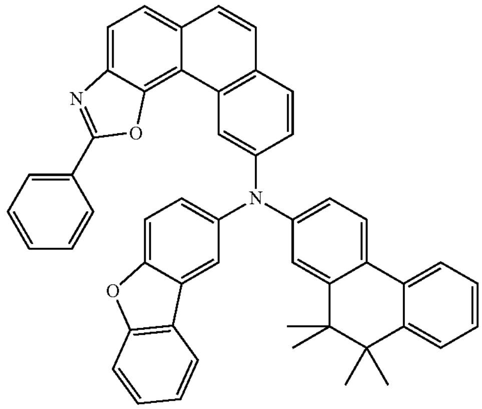
H1-106
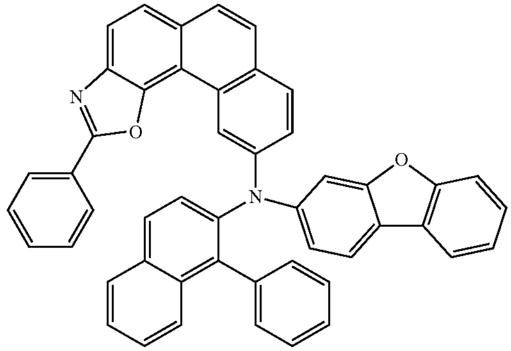

-continued
H1-107
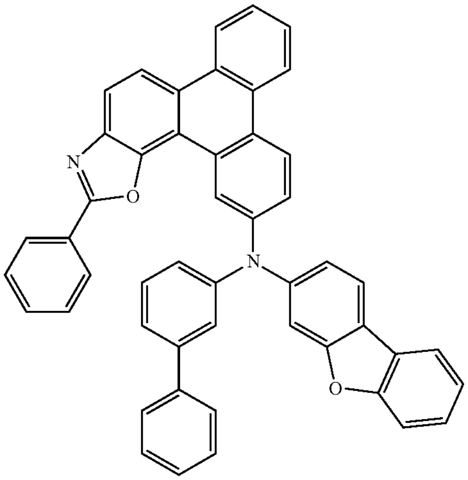
H1-108
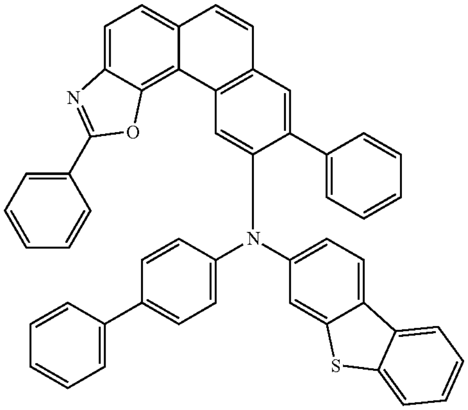
H1-109
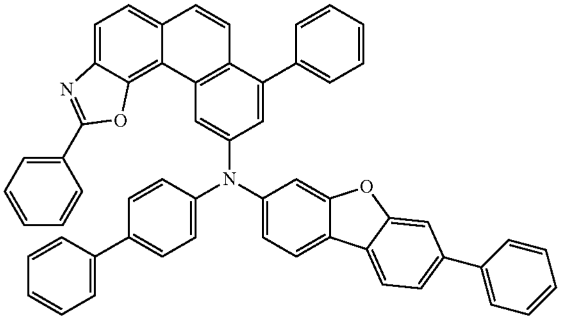
-continued
H1-110
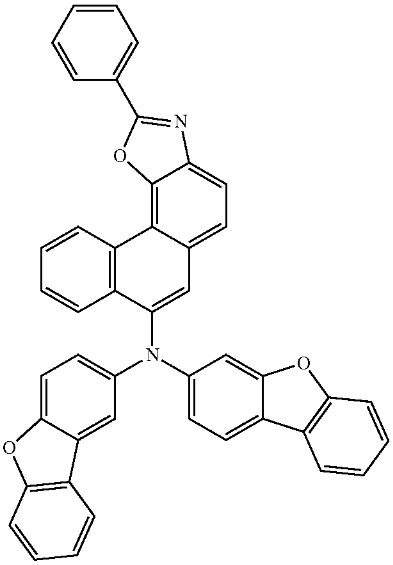
H1-116
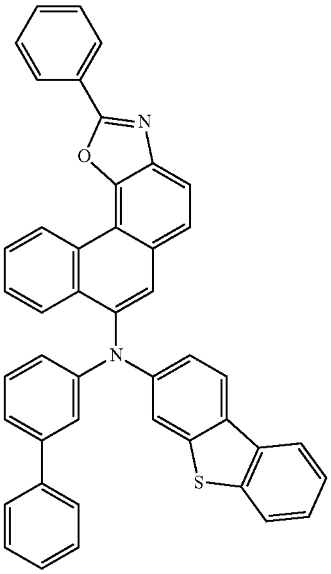

-continued
H1-117
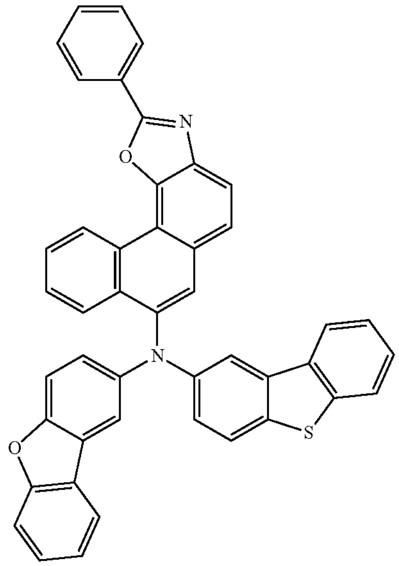
H1-118
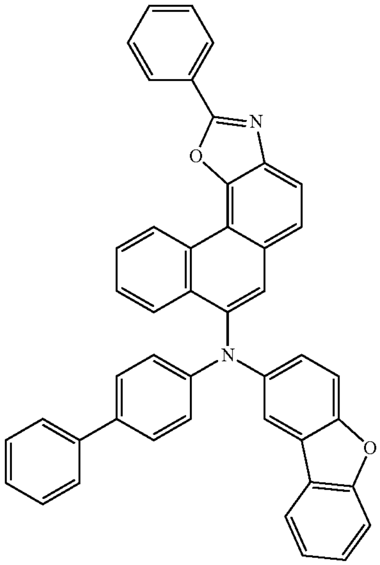
-continued
H1-119
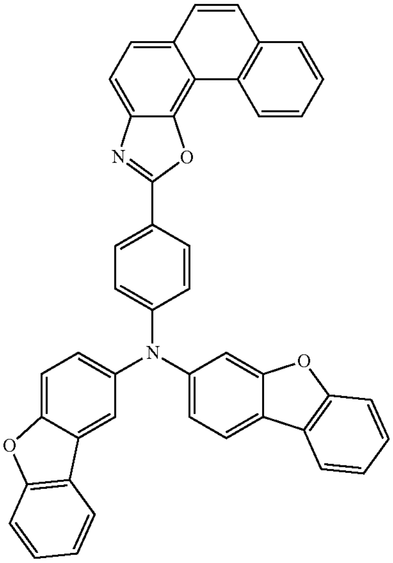
H1-120
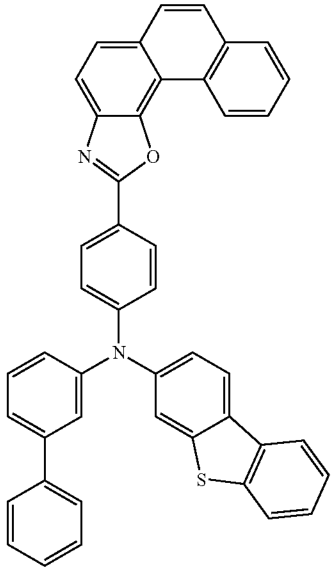

-continued
H1-121
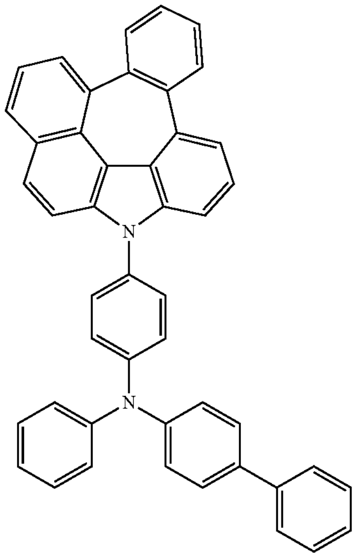
H1-122
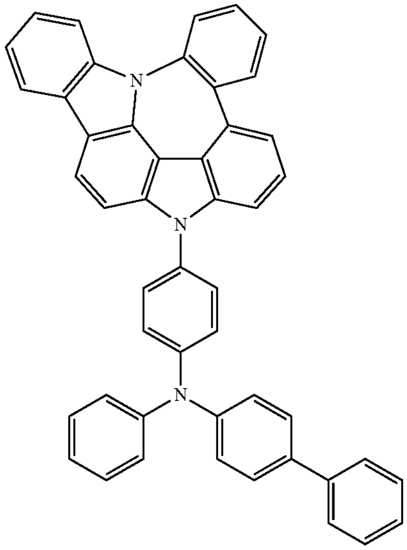
H1-123
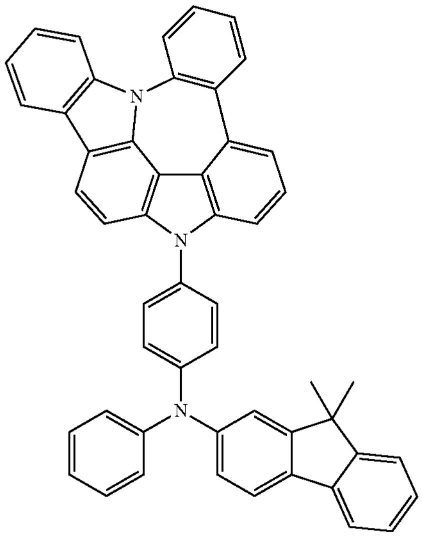
-continued
H1-124
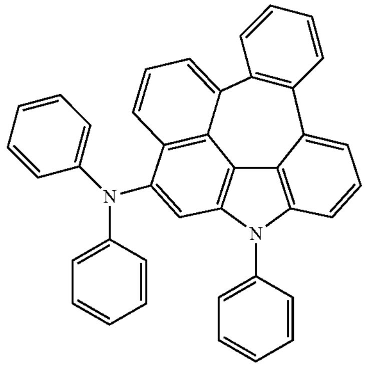
H1-125
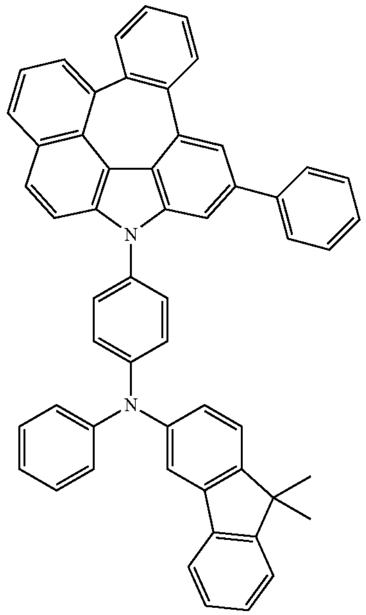
H1-126
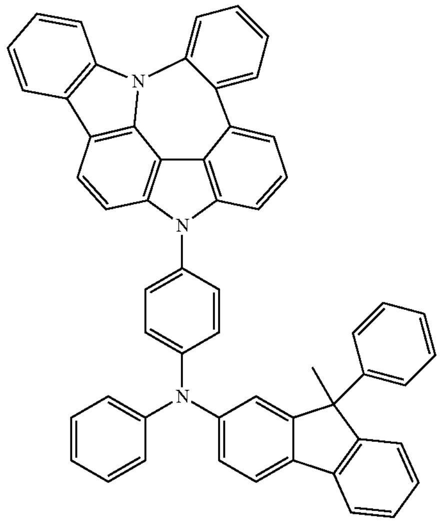

H1-127
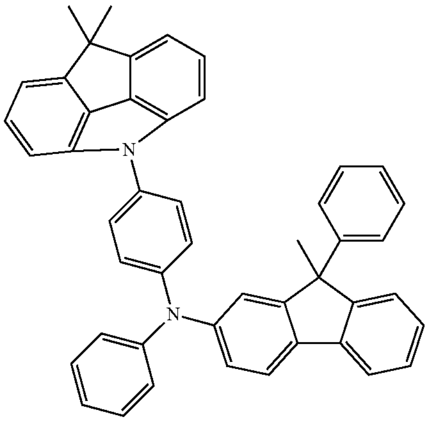
H1-128
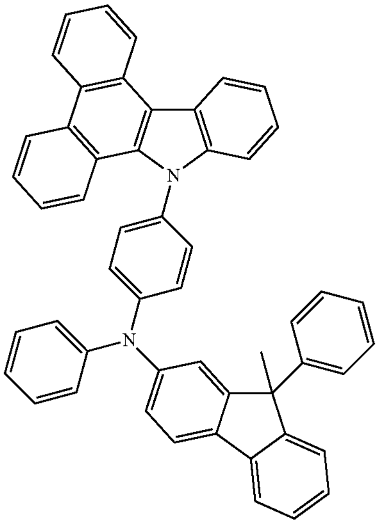
H1-129
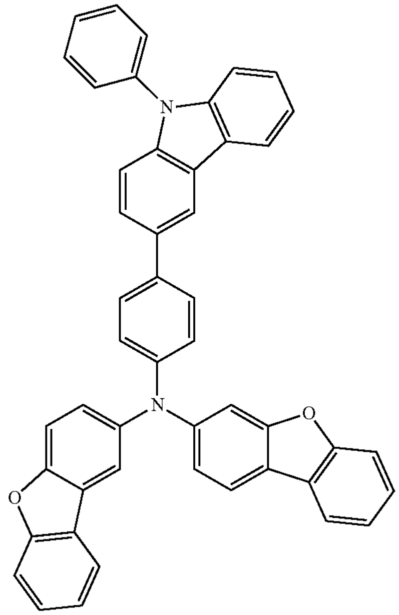
H1-130
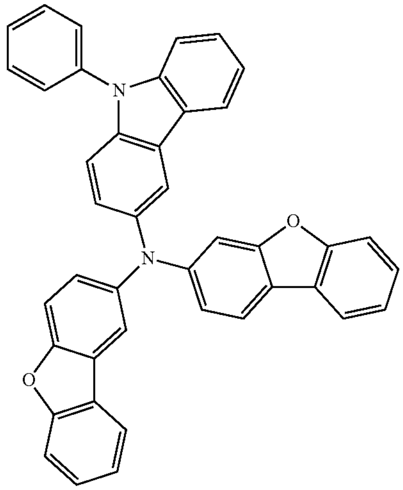
H1-131
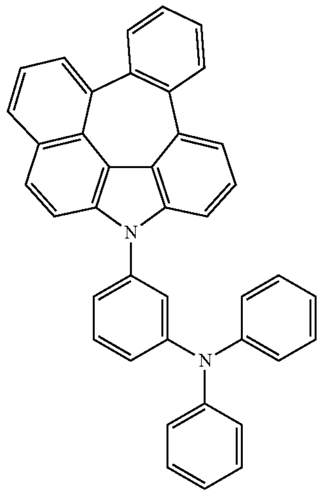
H1-132
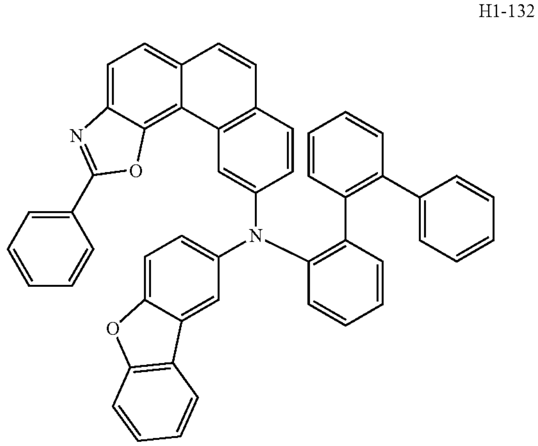

-continued
H1-133
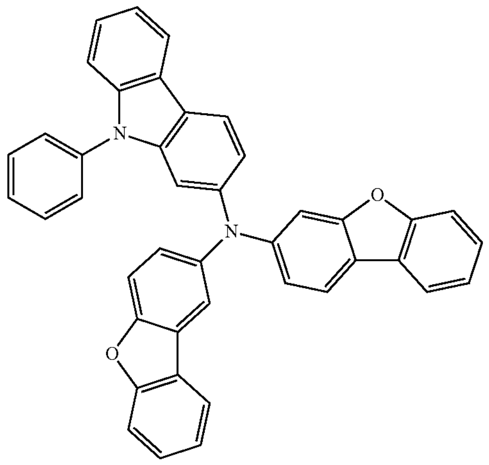
H1-134
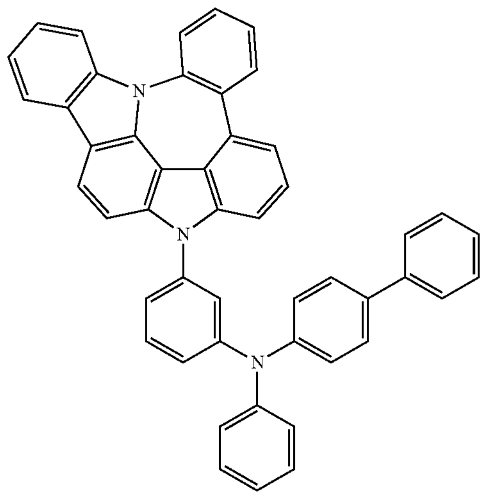
H1-135
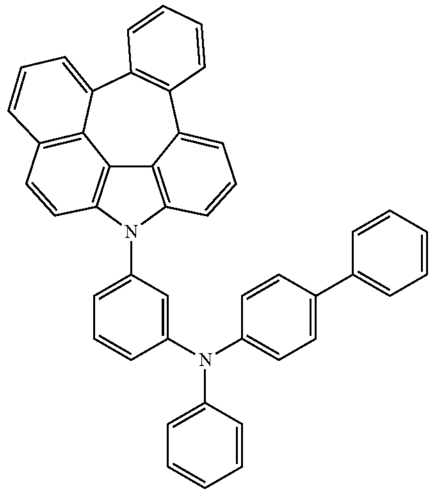
-continued
H1-136
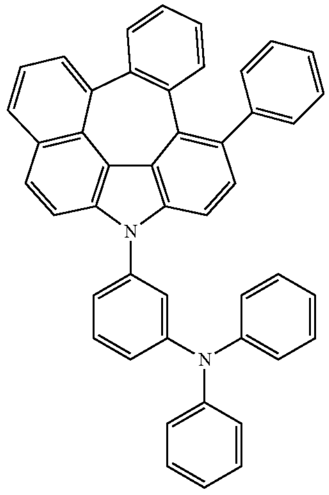
H1-137
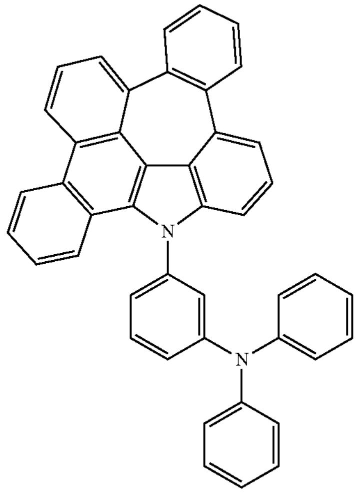
H1-138
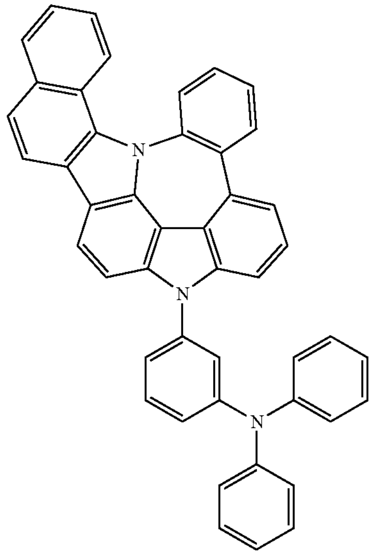

-continued
H1-139
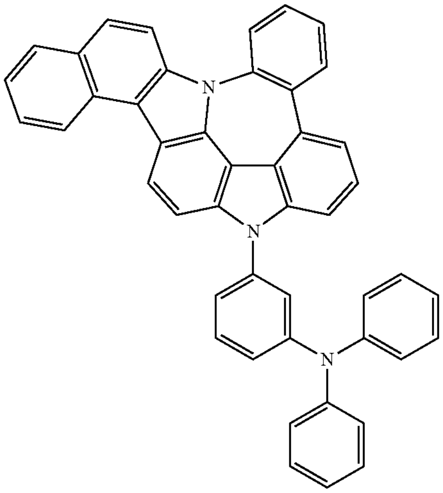
H1-140
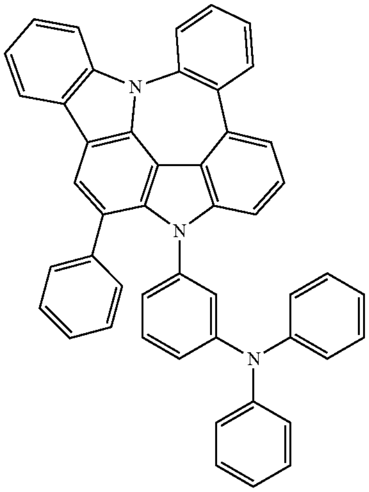
H1-141
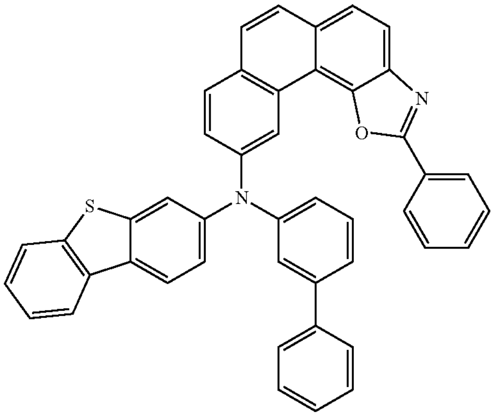
-continued
H1-142
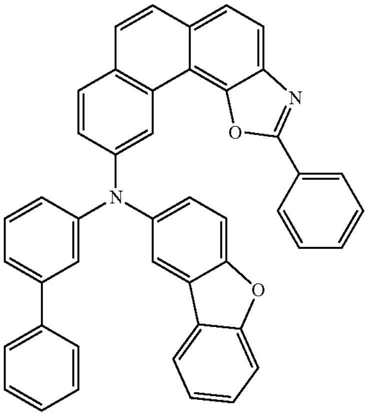
H1-143
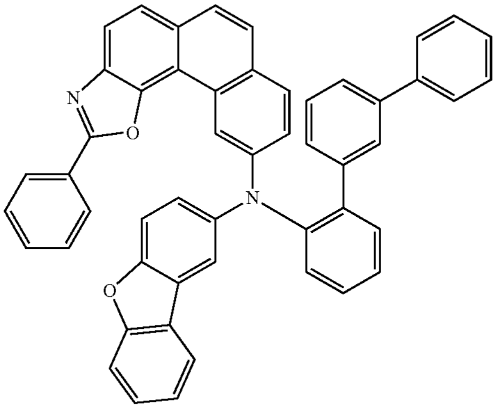
H1-144
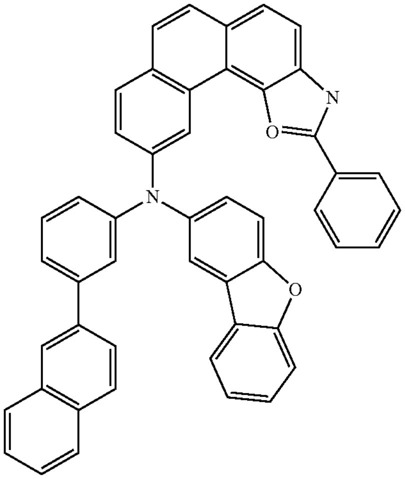

-continued
H1-145
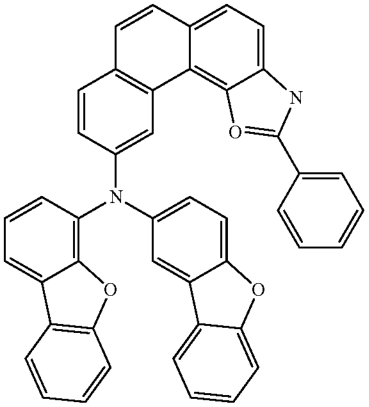
H1-146
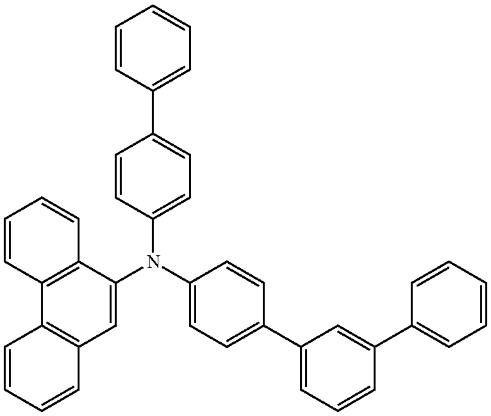
H1-147
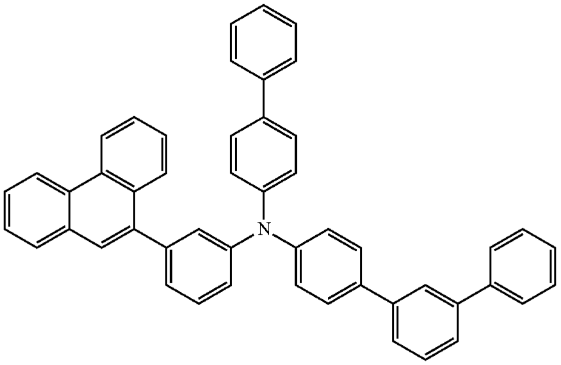
H1-148
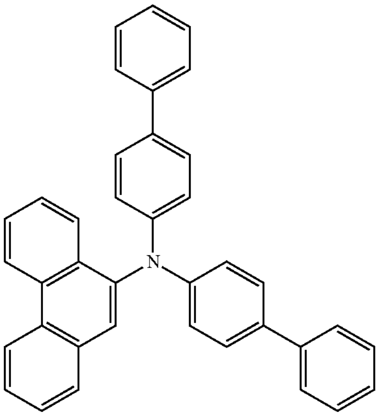
-continued
H1-149
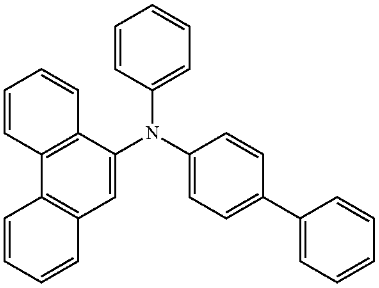
H1-150
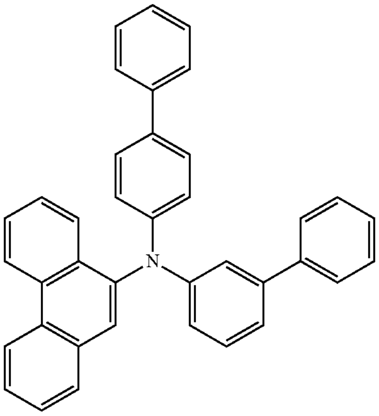
H1-151
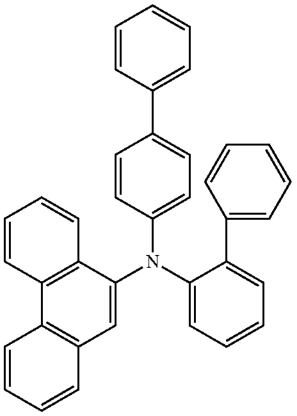
H1-152
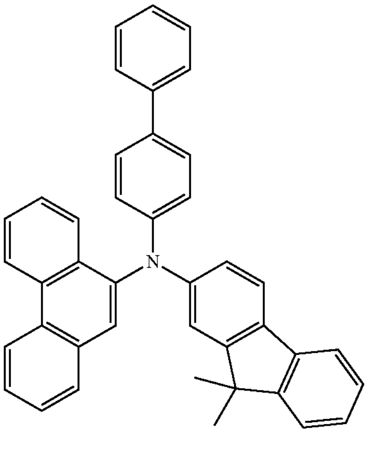

-continued
H1-153
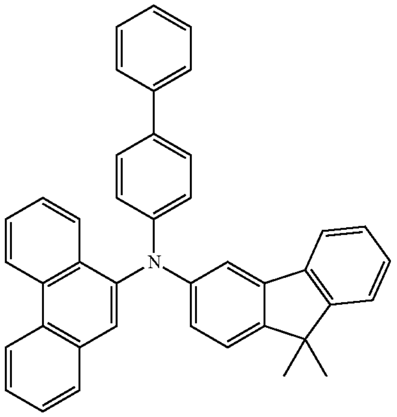
H1-154
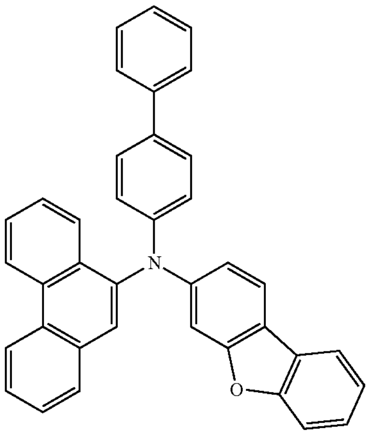
H1-155
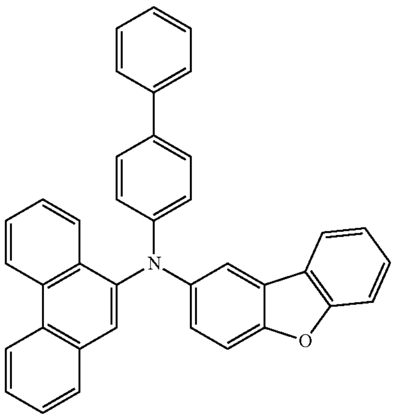
-continued
H1-156
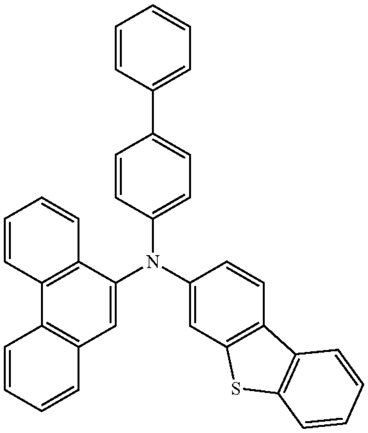
H1-157
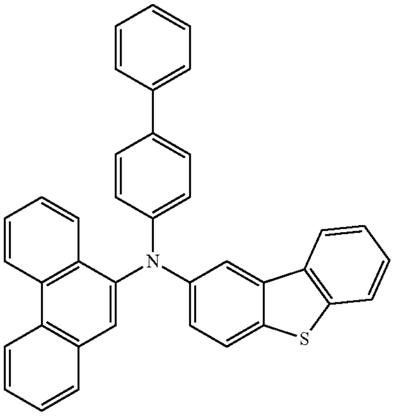
H1-158
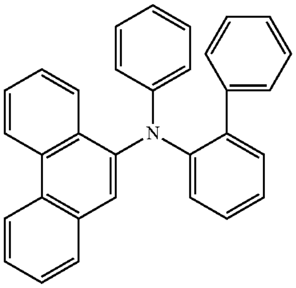
H1-159
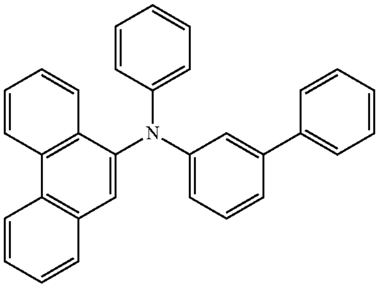

-continued
H1-160
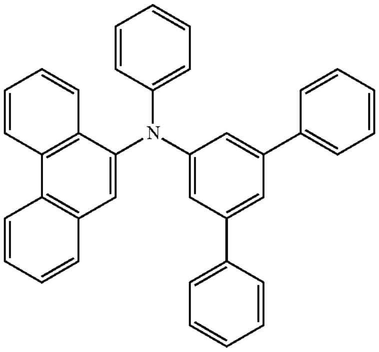
H1-161
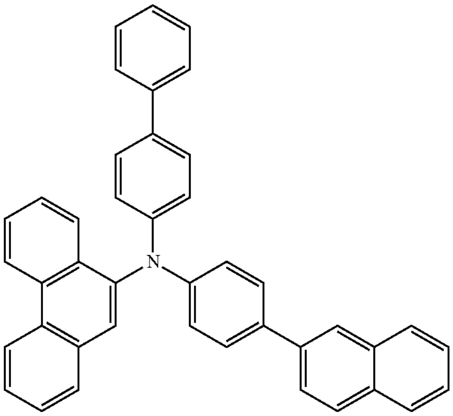
H1-162
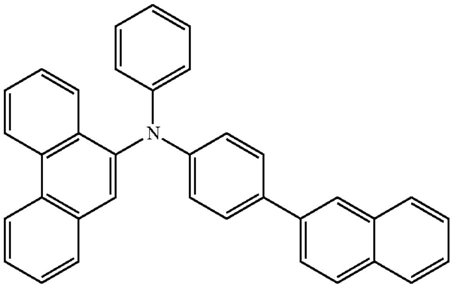
H1-163
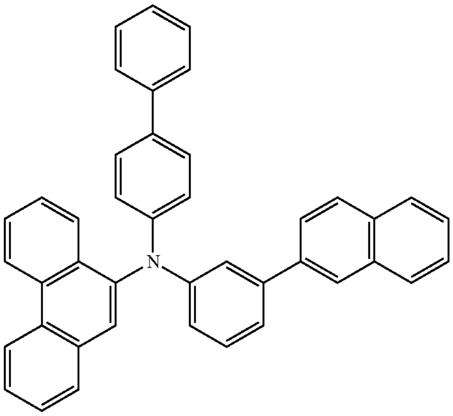
-continued
H1-164
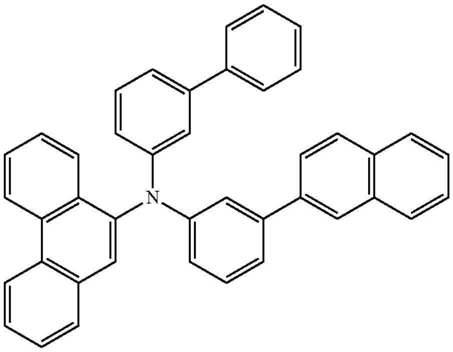
H1-165
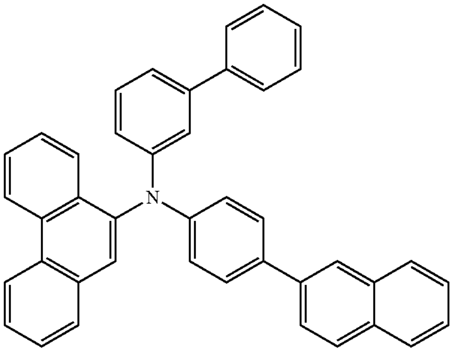
H1-166
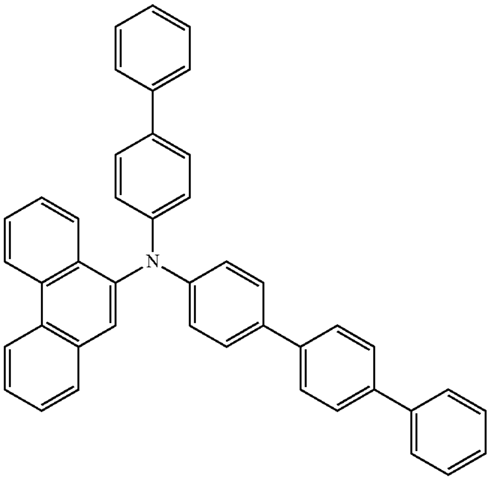
H1-167
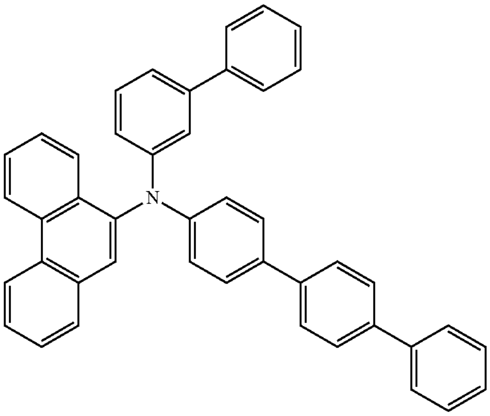

-continued
H1-168
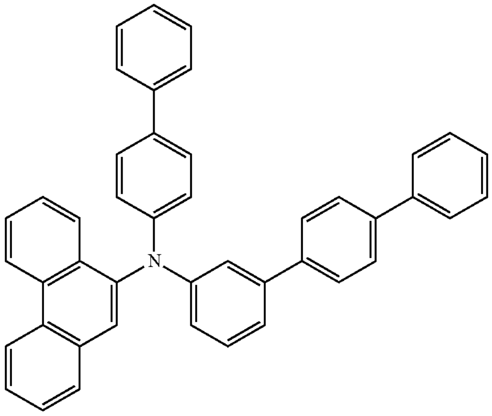
H1-169
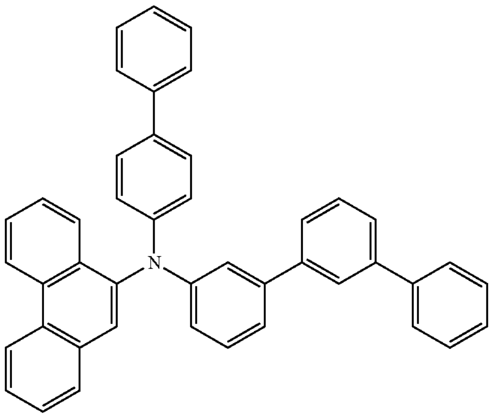
H1-170
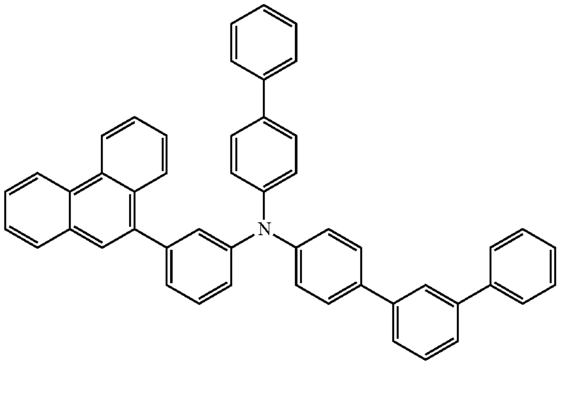
-continued
H1-171
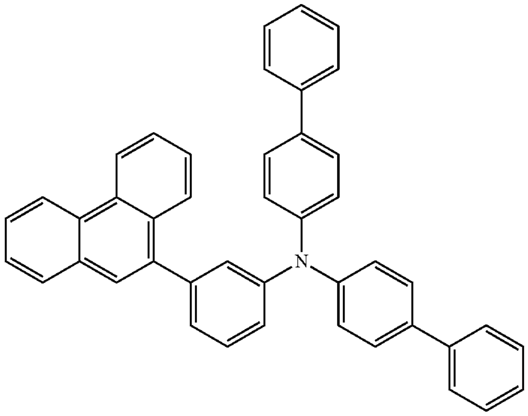
H1-172
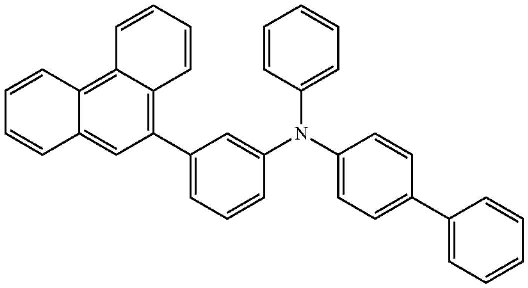
H1-173
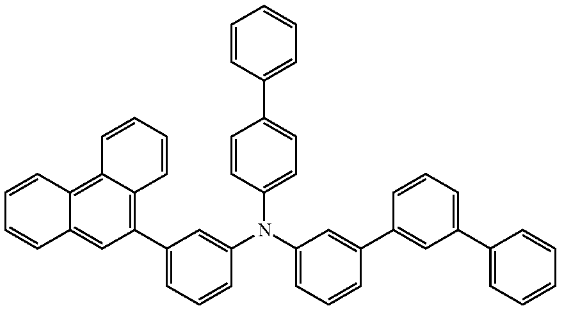
H1-174
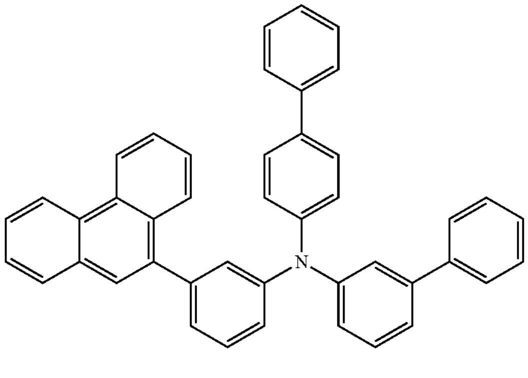

-continued
H1-175
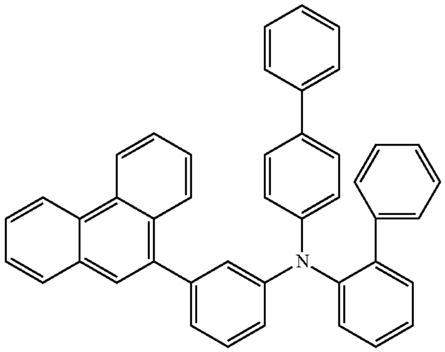
H1-176
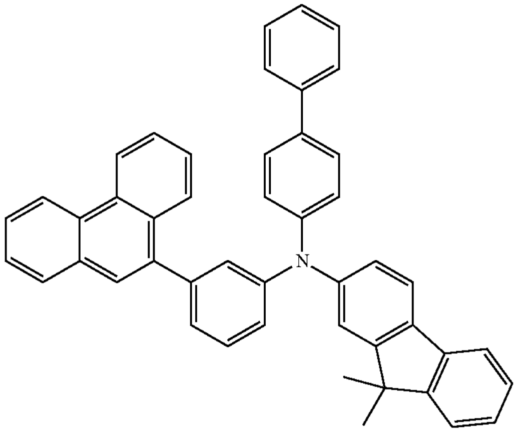
H1-177
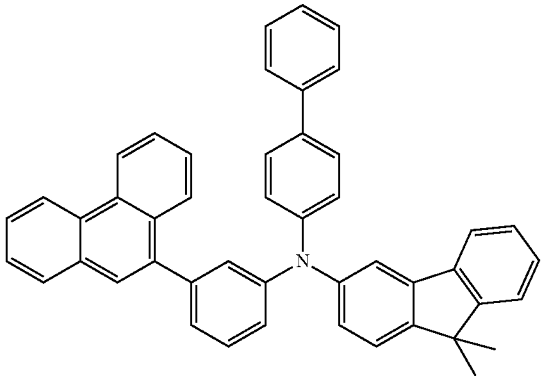
-continued
H1-178
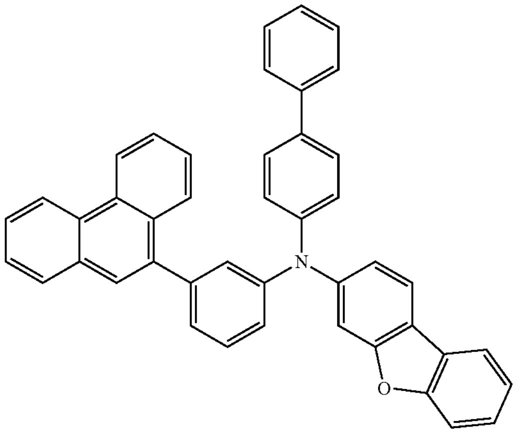
H1-179
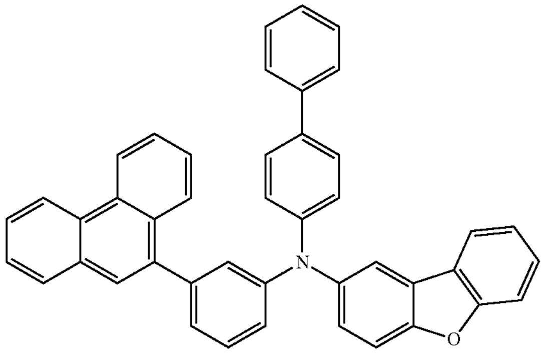
H1-180
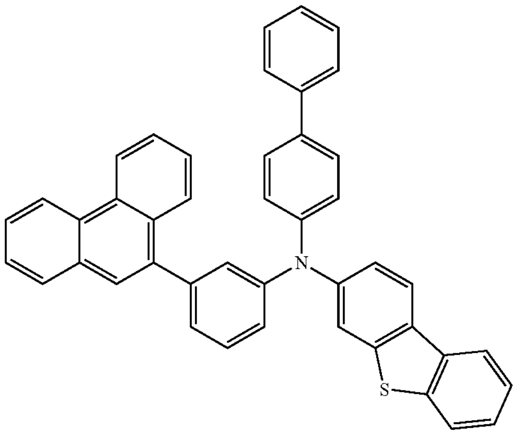

-continued
H1-181
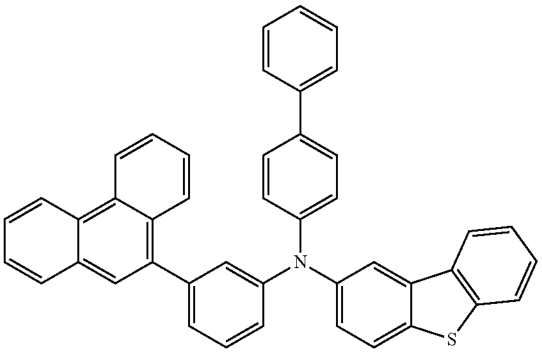
H1-182
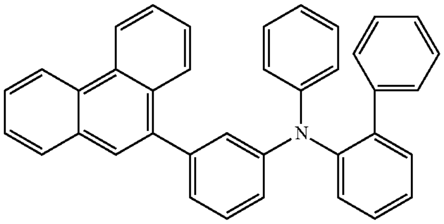
H1-183
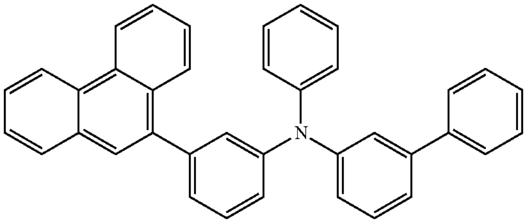
H1-184
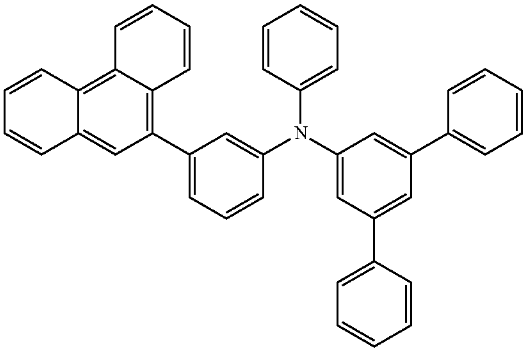
H1-185
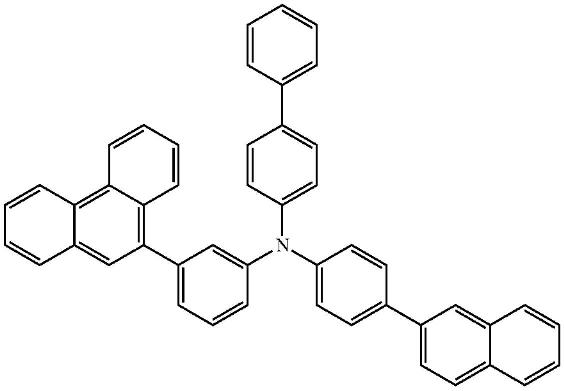
-continued
H1-186
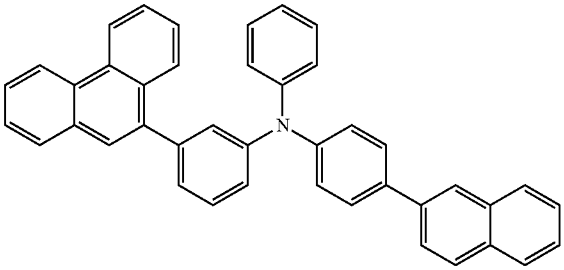
H1-187
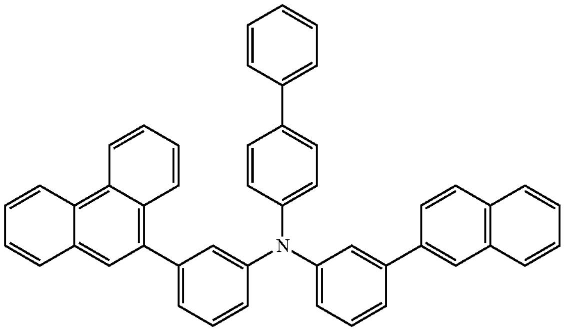
H1-188
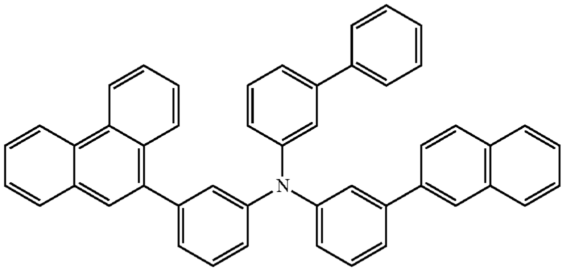
H1-189
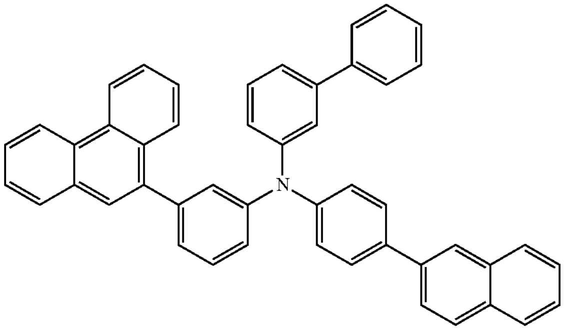

-continued
H1-190
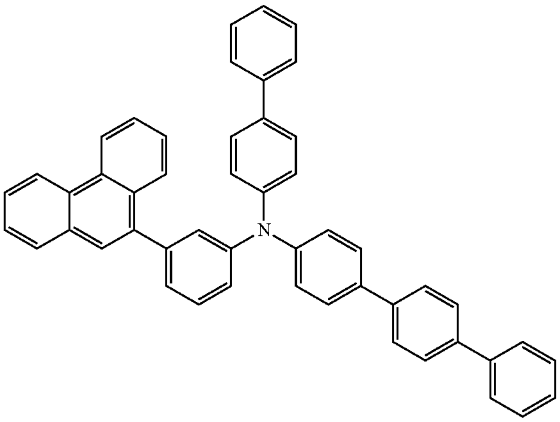
H1-191
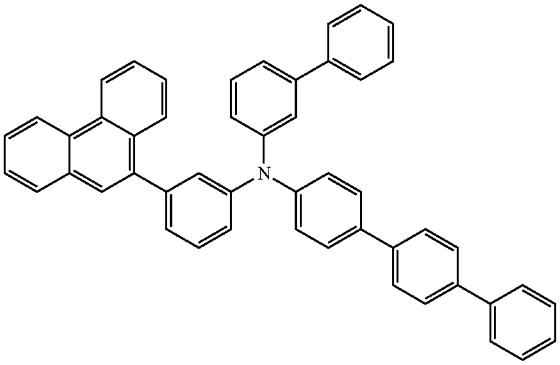
H1-192
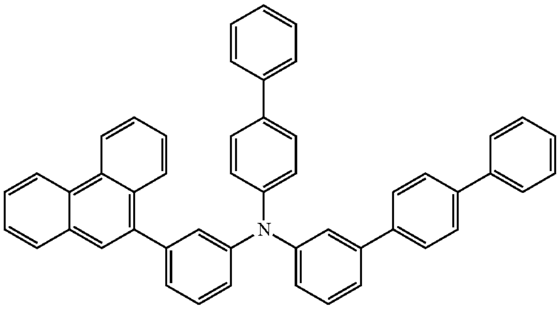
H1-193
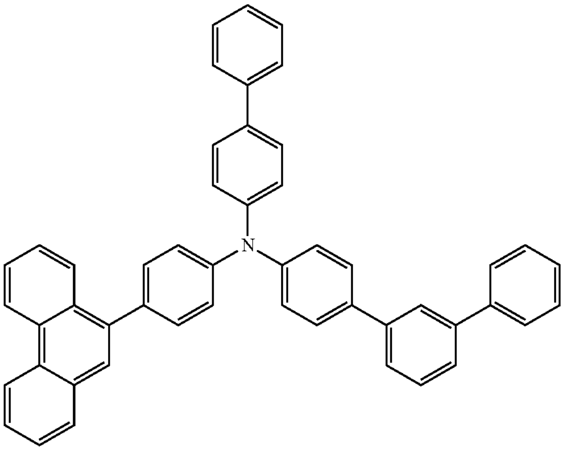
The compound represented by formula 4 may be at least one selected from the following compounds, but is not limited thereto.
H2-1
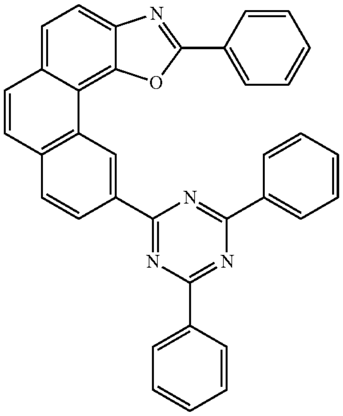
H2-2
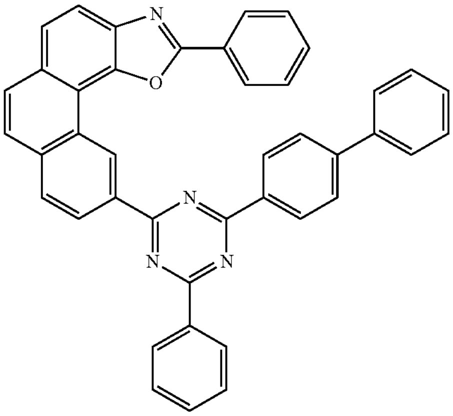
H2-3
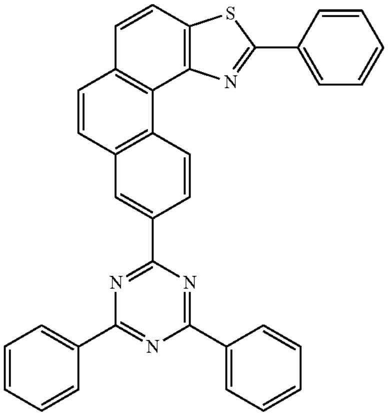

-continued
H2-4
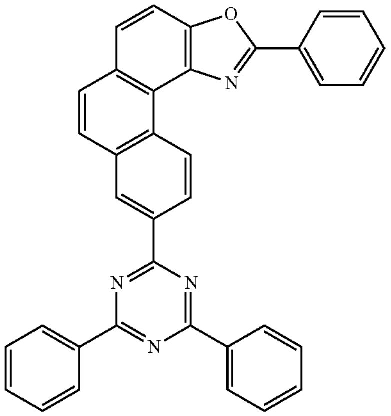
H2-5
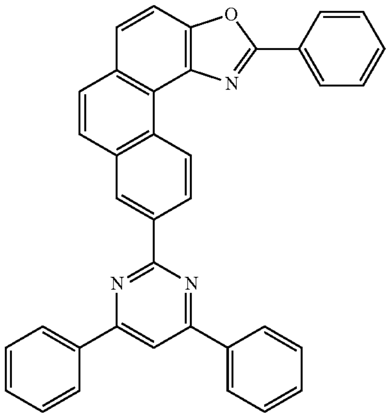
H2-6
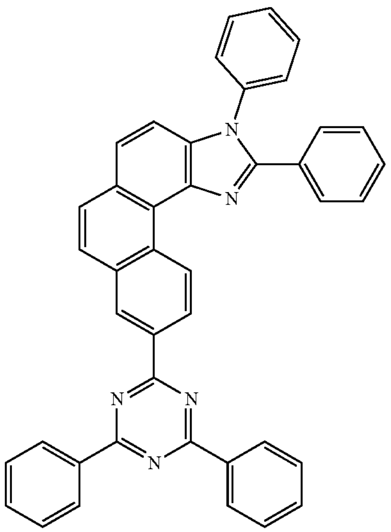
-continued
H2-7
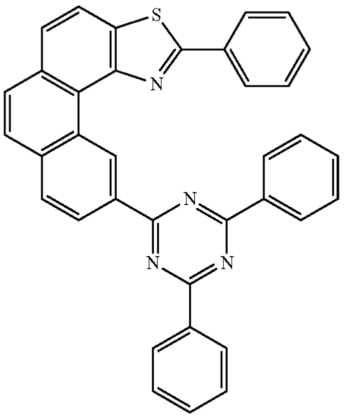
H2-8
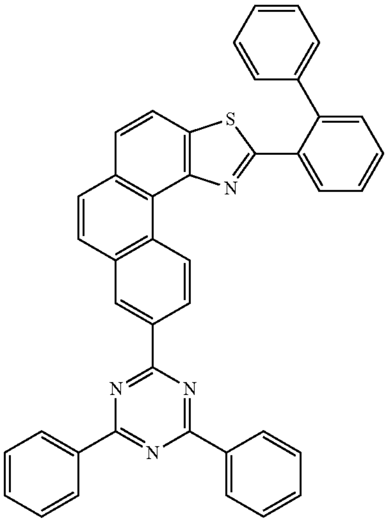
H2-9
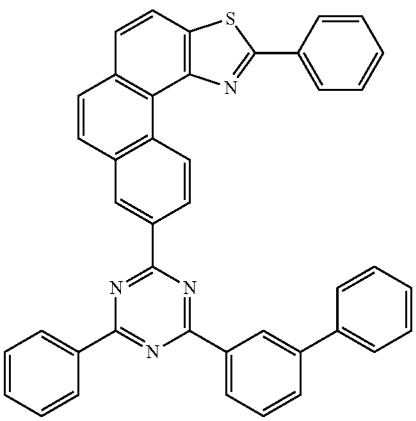

H2-10
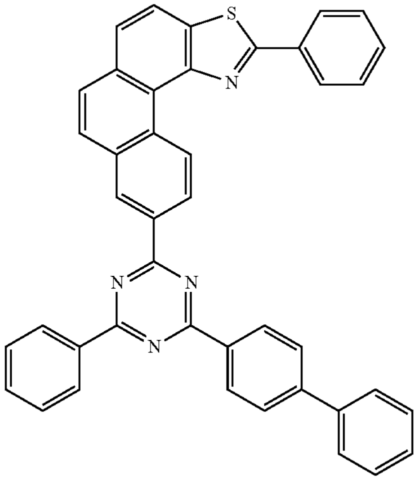
H2-11
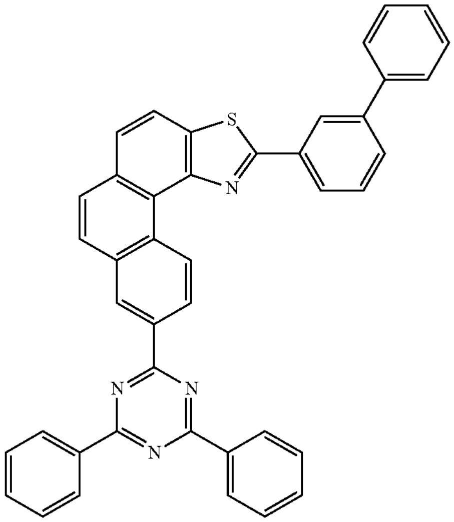
H2-12
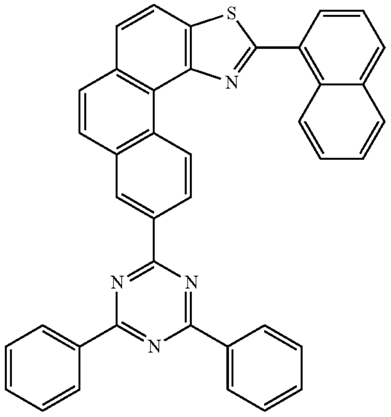
H2-13
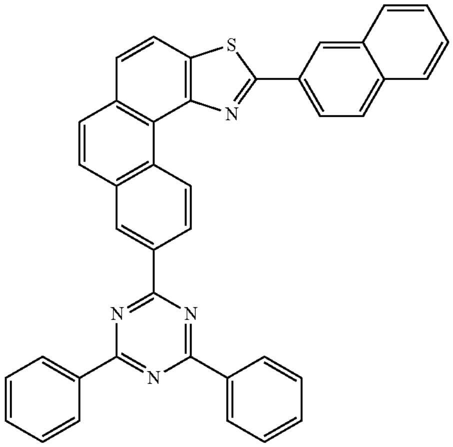
H2-14
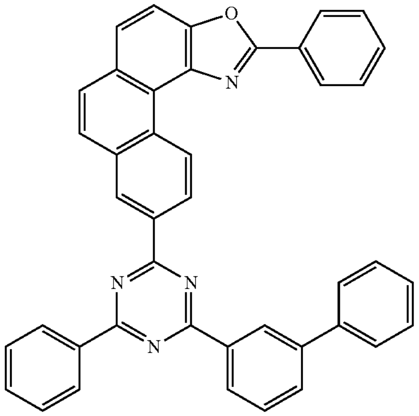
H2-15
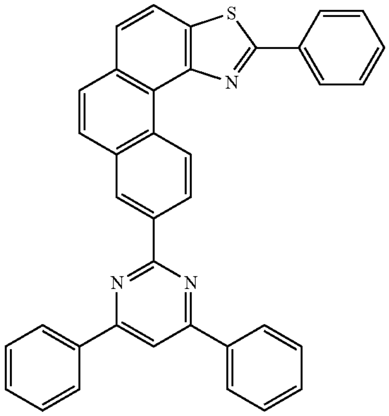

-continued
H2-16
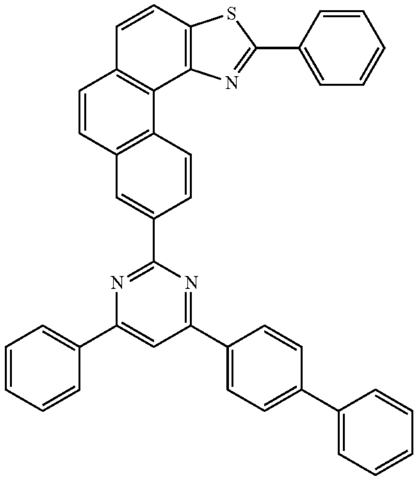
H2-17
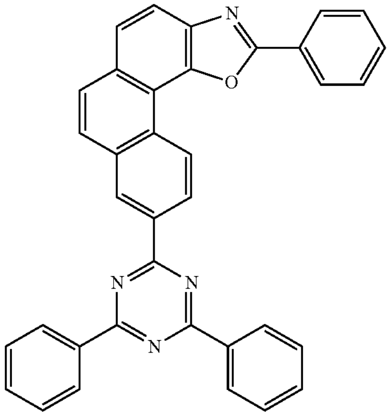
H2-18
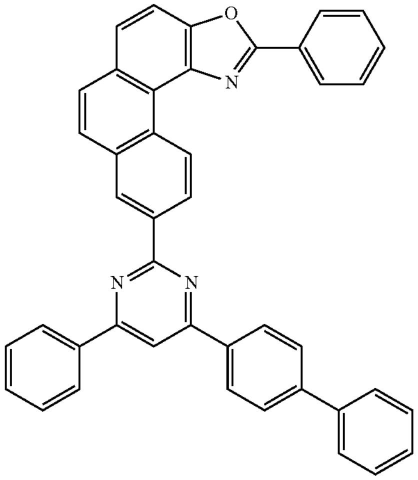
-continued
H2-19
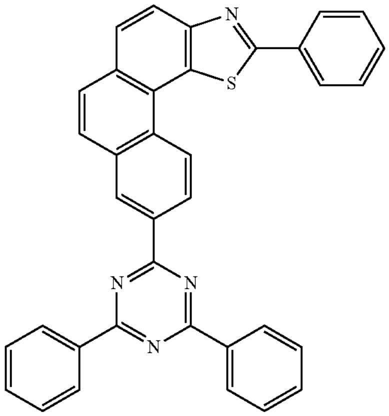
H2-20
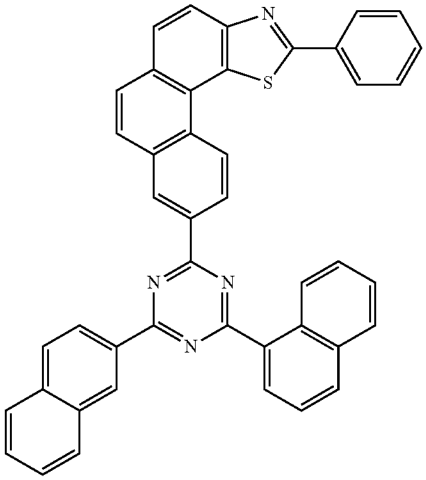
H2-21
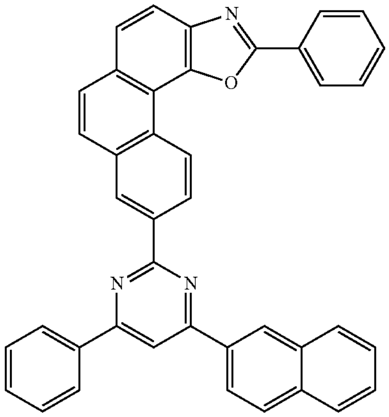

H2-22
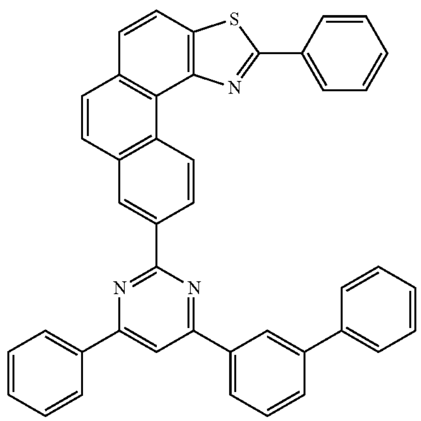
H2-23
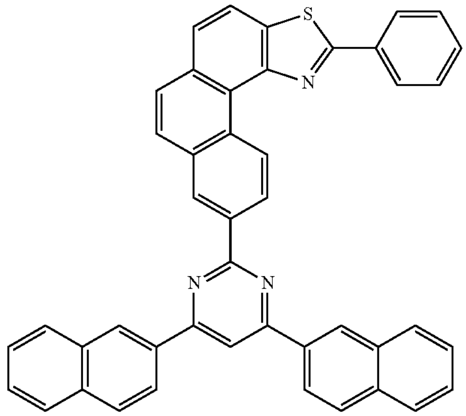
H2-24
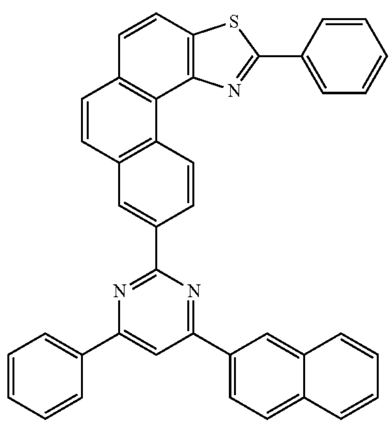
H2-25
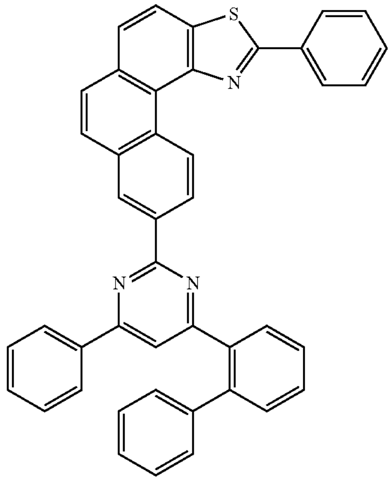
H2-26
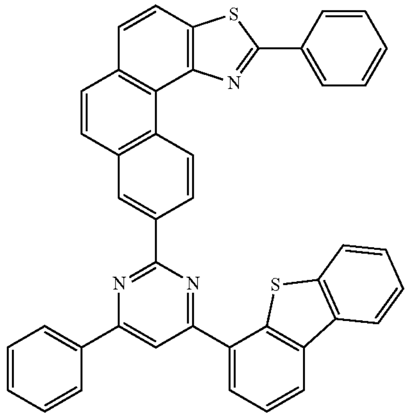
H2-27
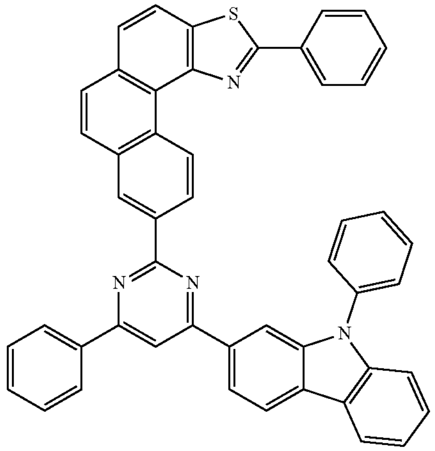

-continued
H2-28
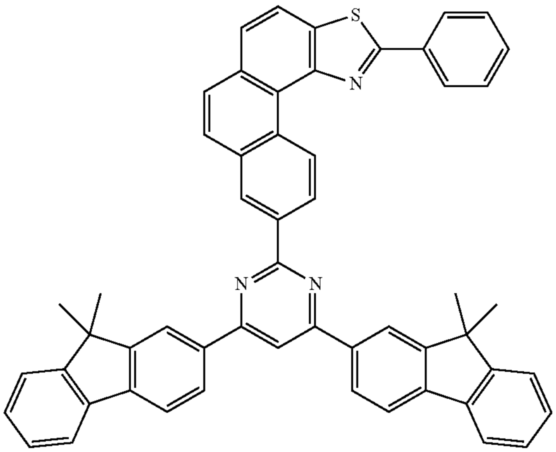
H2-29
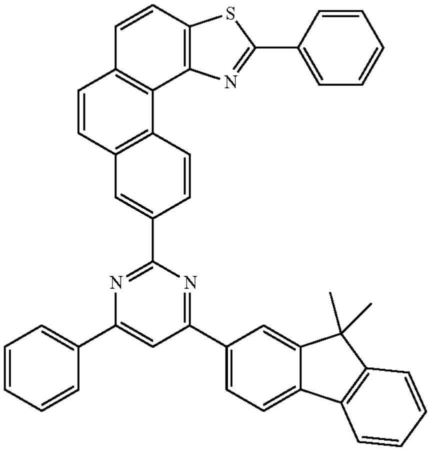
H2-30
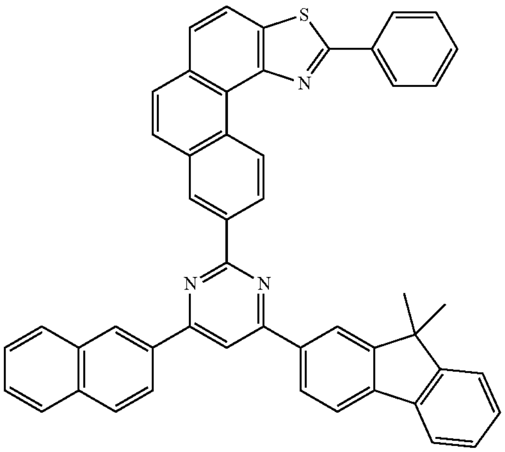
-continued
H2-31
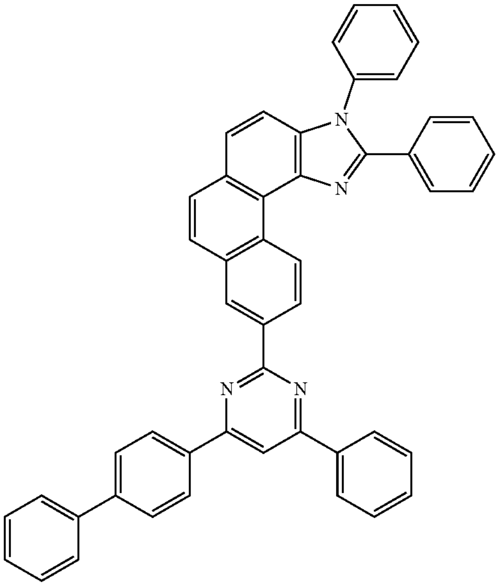
H2-32
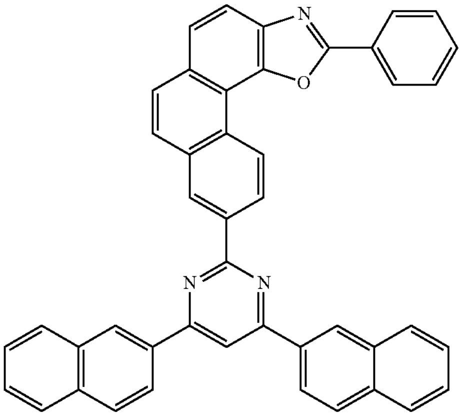
H2-33
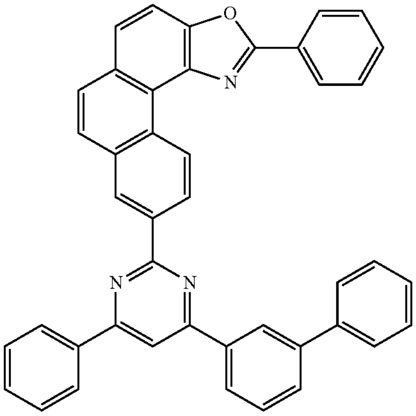

-continued
H2-34
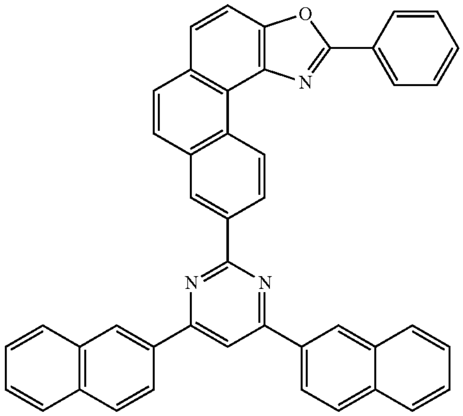
H2-35
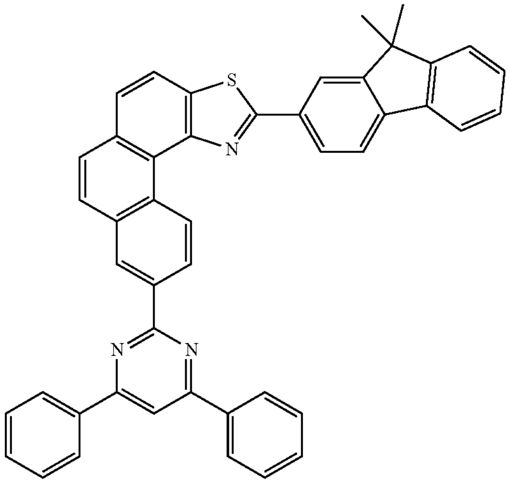
H2-36
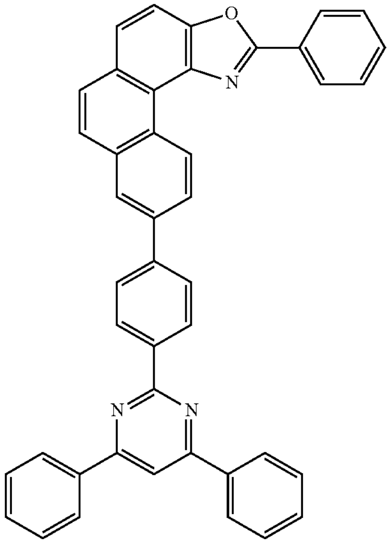
-continued
H2-37
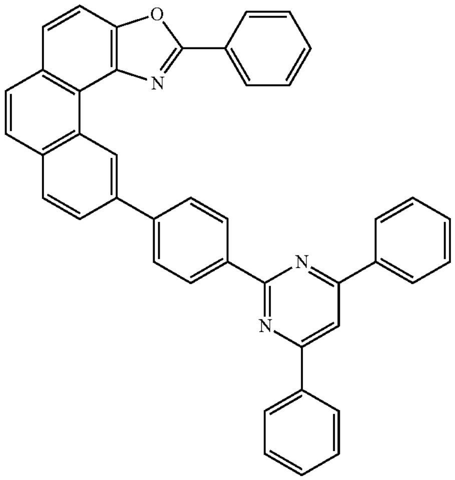
H2-38
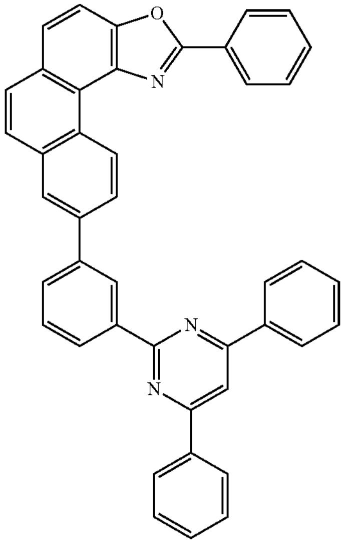
H2-39
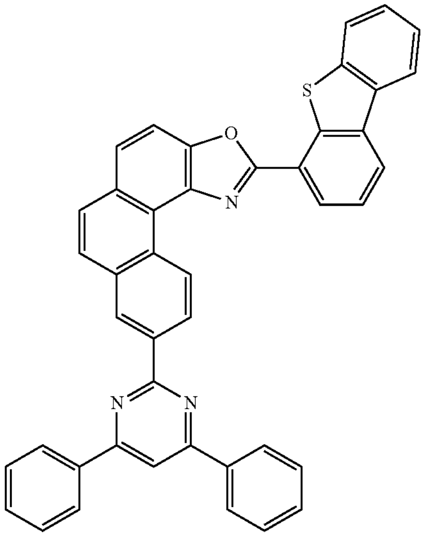

-continued
H2-40
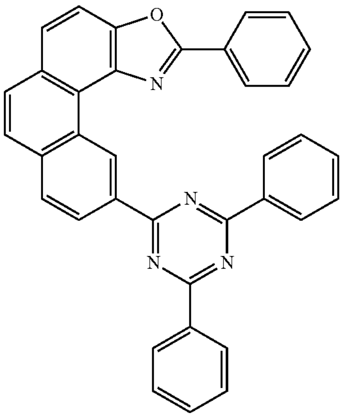
H2-41
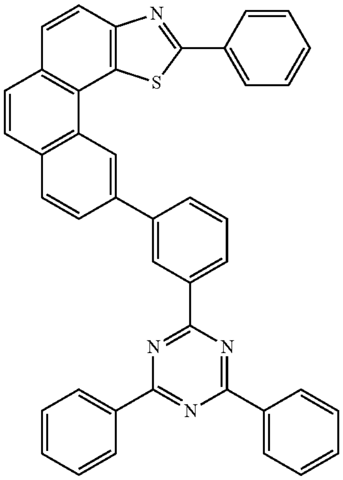
H2-42
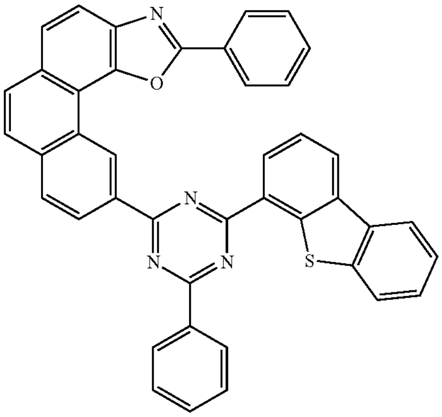
-continued
H2-43
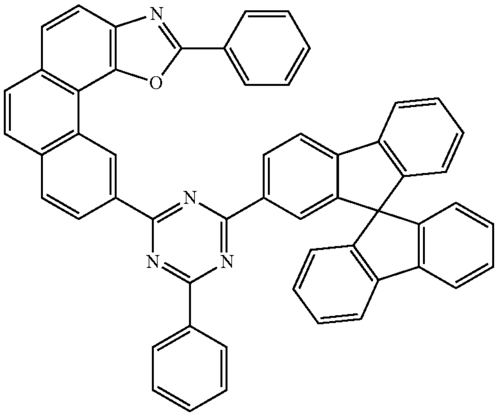
H2-44
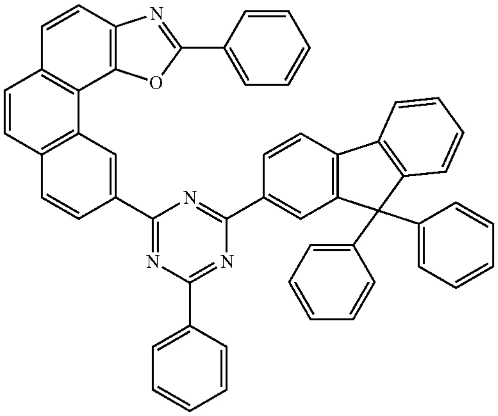
H2-45
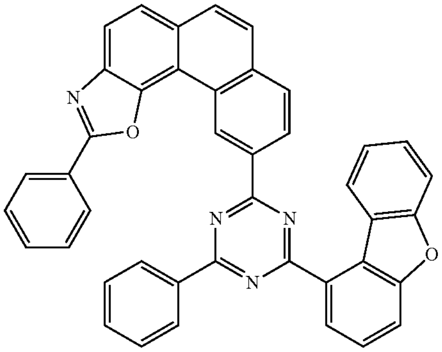
H2-46
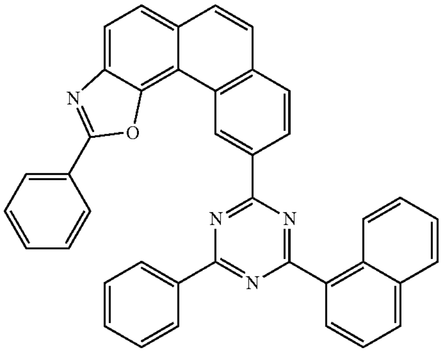

-continued
H2-47
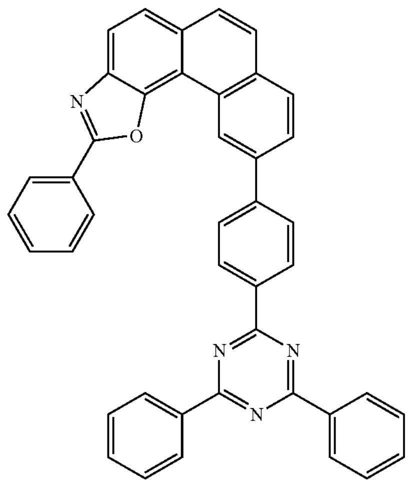
H2-48
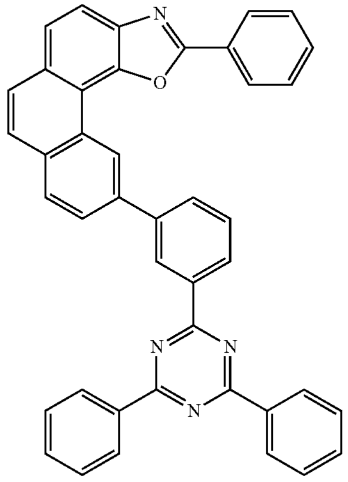
H2-49
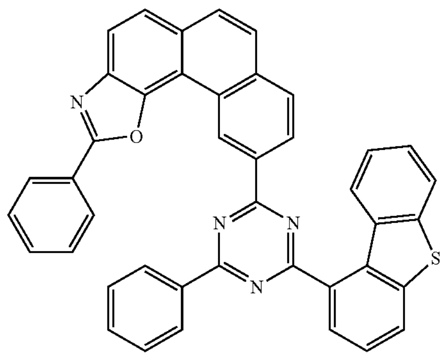
-continued
H2-50
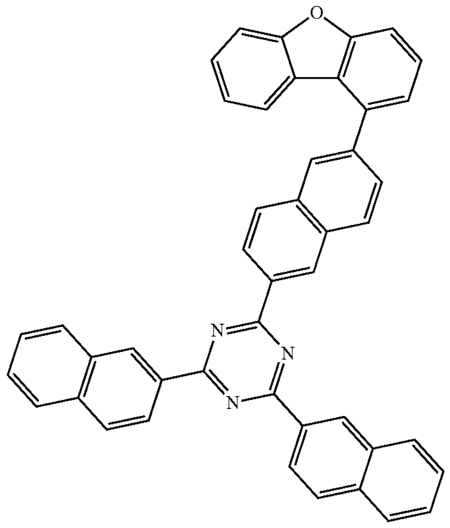
H2-51
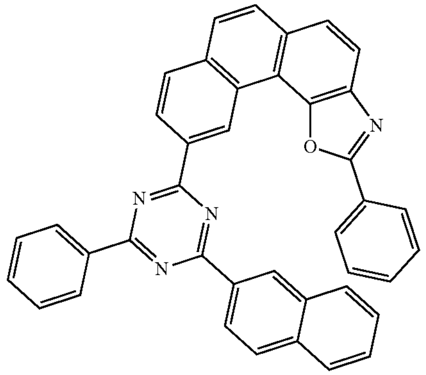
H2-52
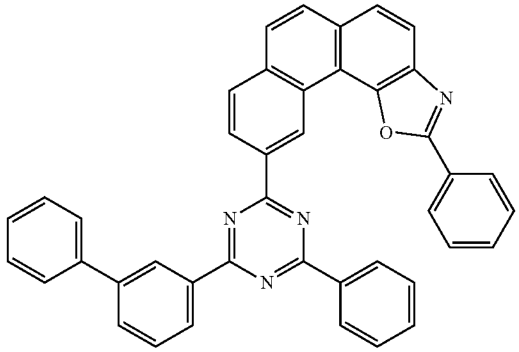
H2-53
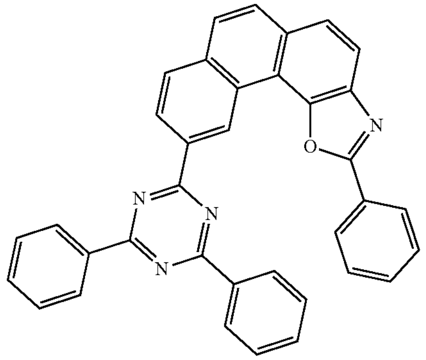

-continued
H2-54
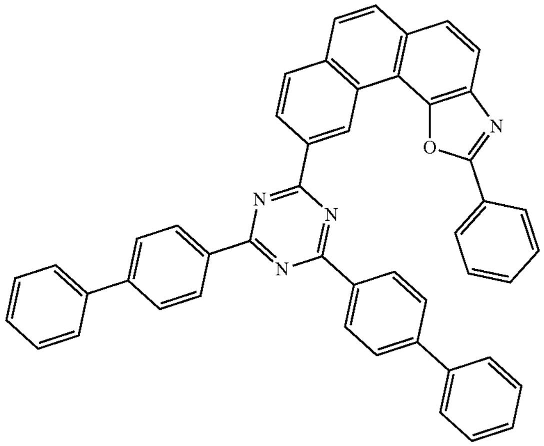
H2-55
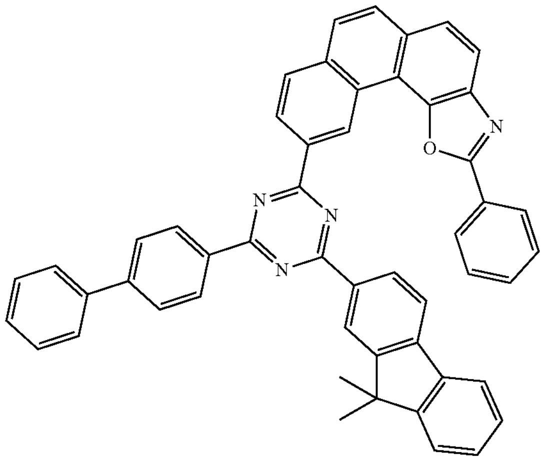
H2-56
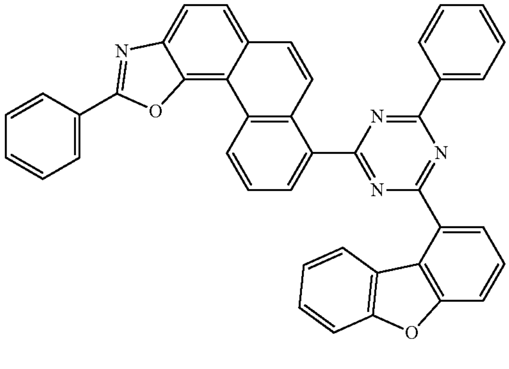
-continued
H2-57
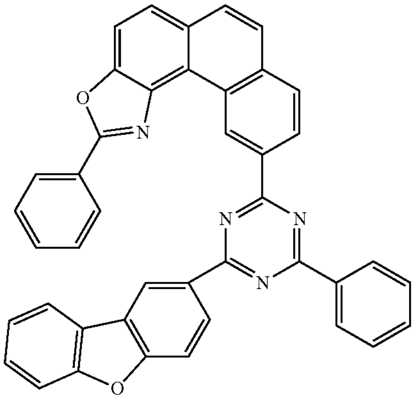
H2-58
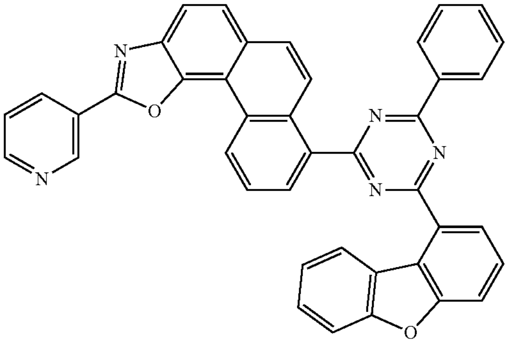
H2-59
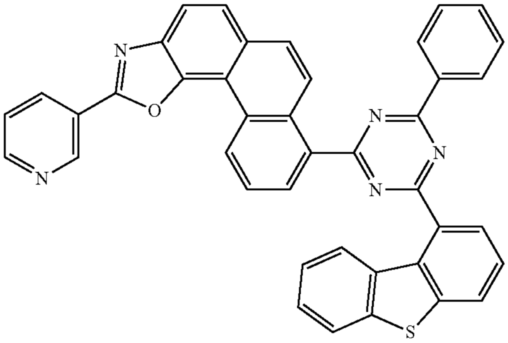

-continued
H2-60
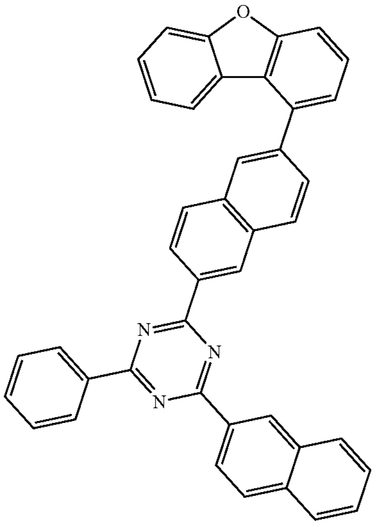
H2-61
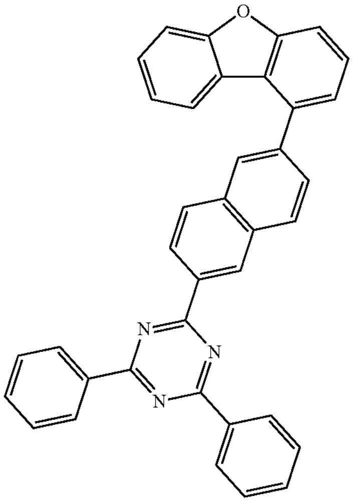
H2-62
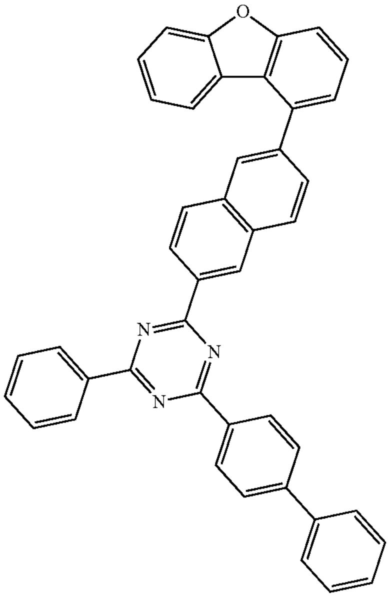
-continued
H2-63
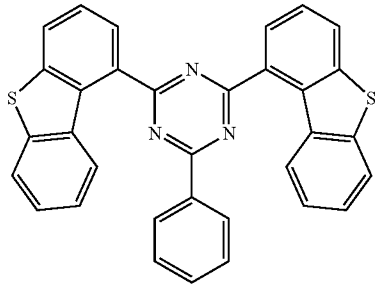
H2-64
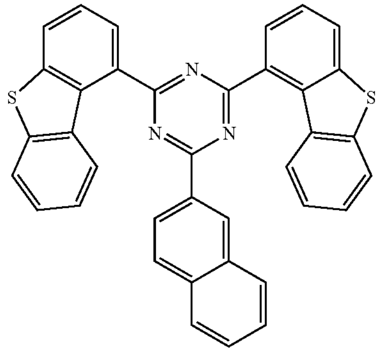
H2-65
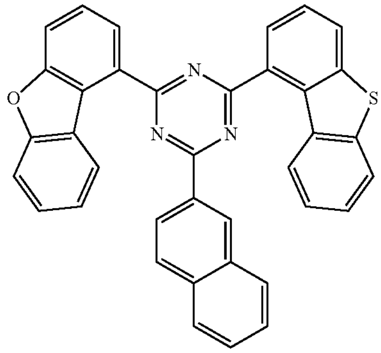
H2-66
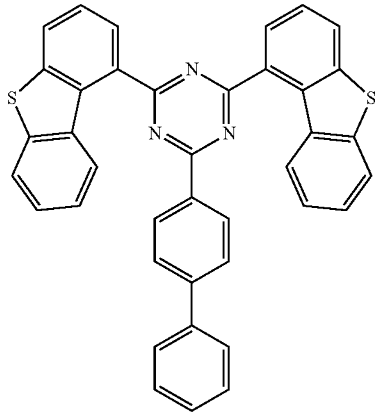

-continued
H2-67
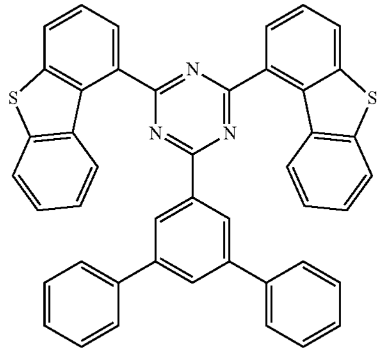
H2-68
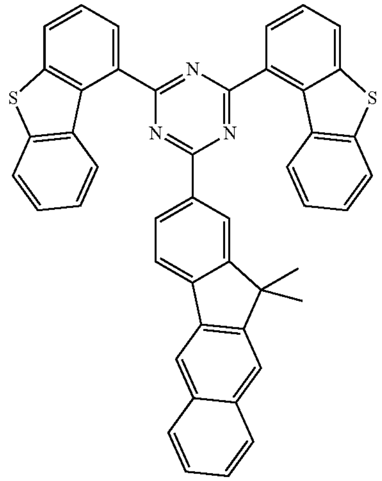
H2-69
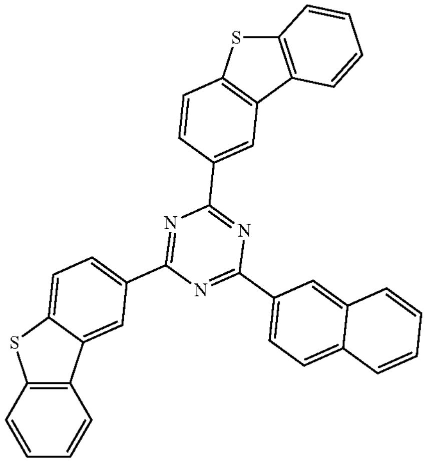
-continued
H2-70
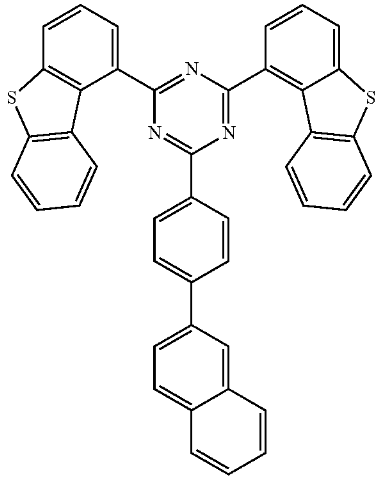
H2-71
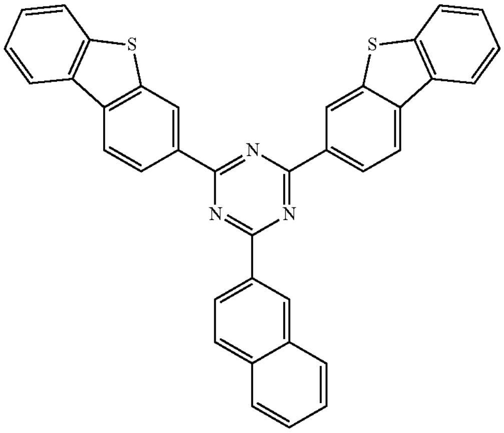
H2-72
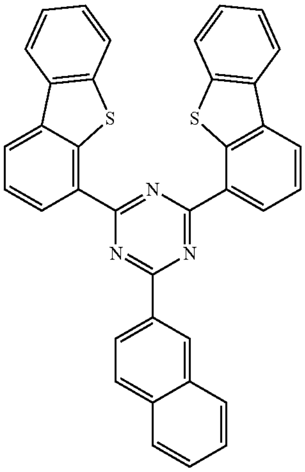

-continued
H2-73
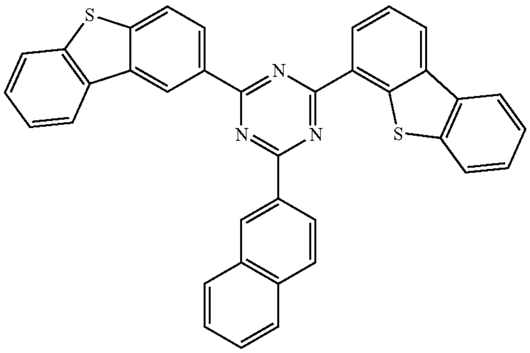
H2-74
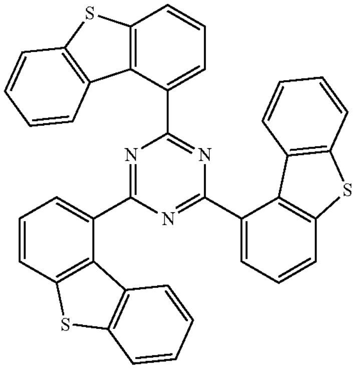
H2-75
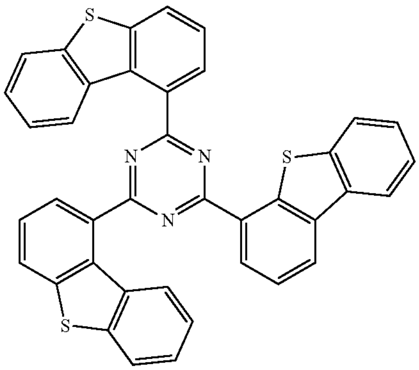
-continued
H2-76
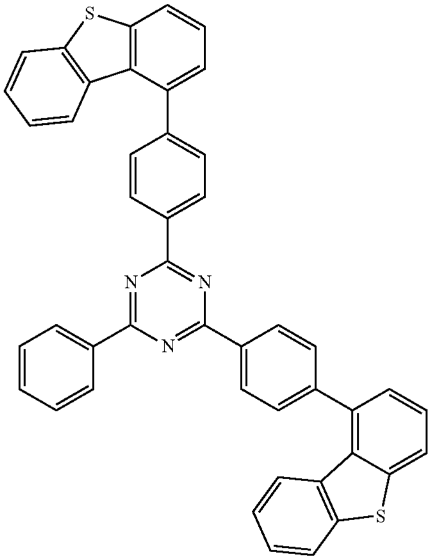
H2-77
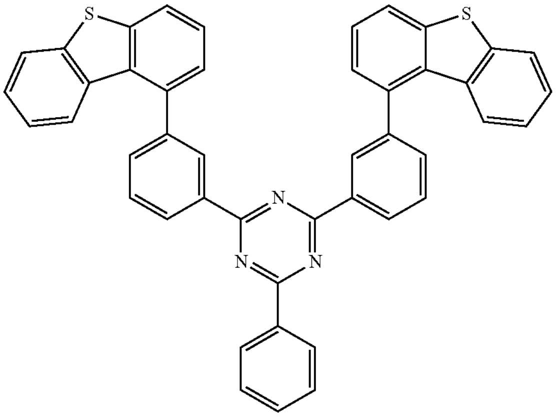
H2-78
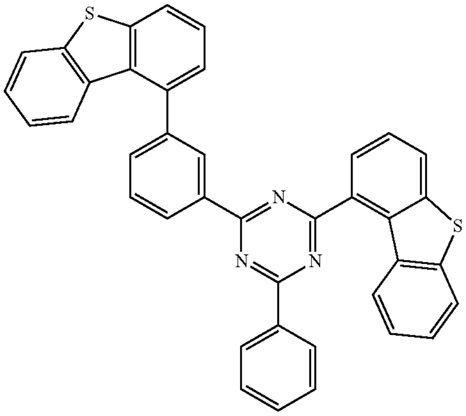

-continued
H2-79
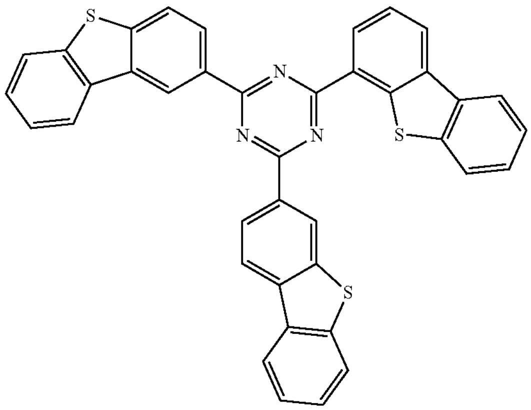
H2-80
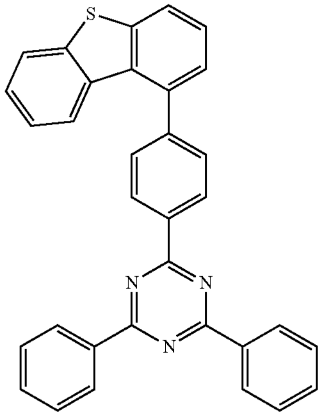
H2-81
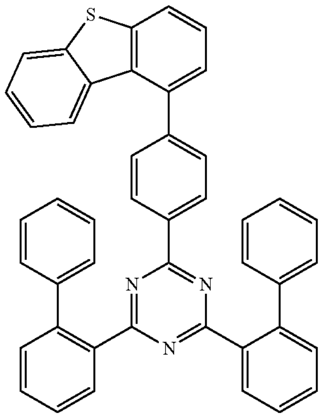
-continued
H2-82
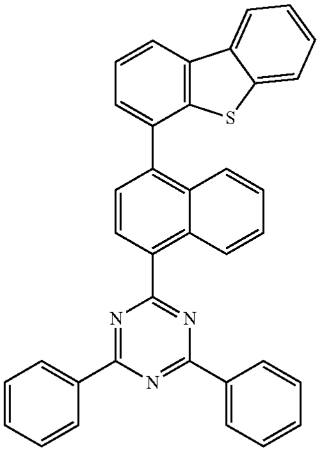
H2-83
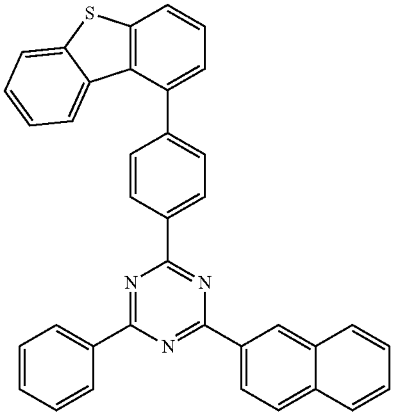
H2-84
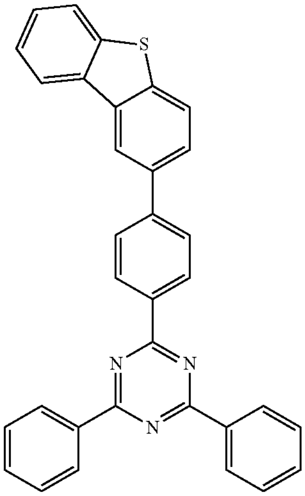

-continued
H2-85
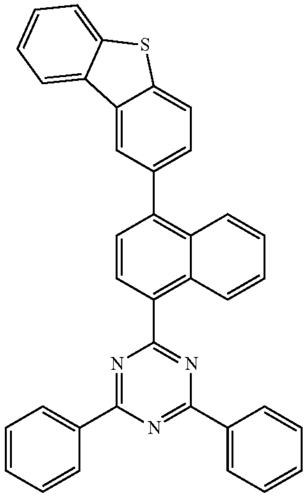
H2-86
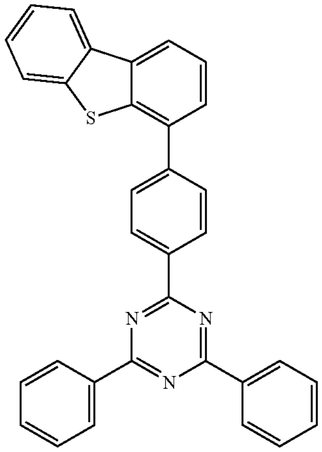
H2-87
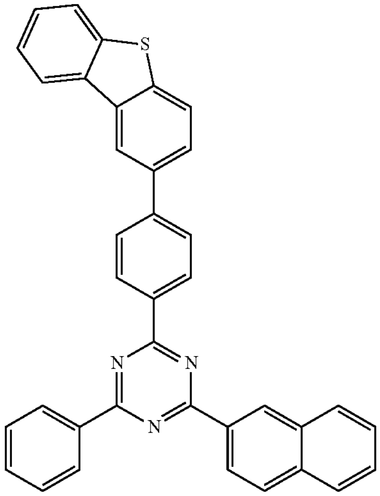
-continued
H2-88
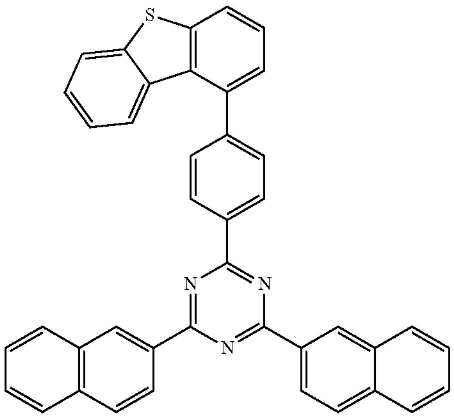
H2-89
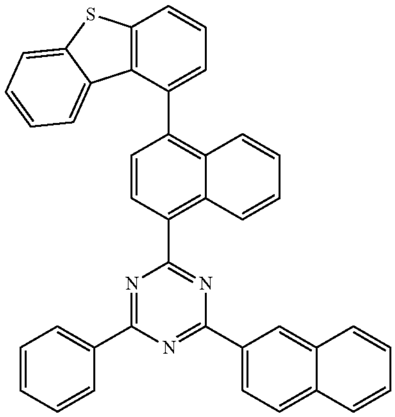
H2-90
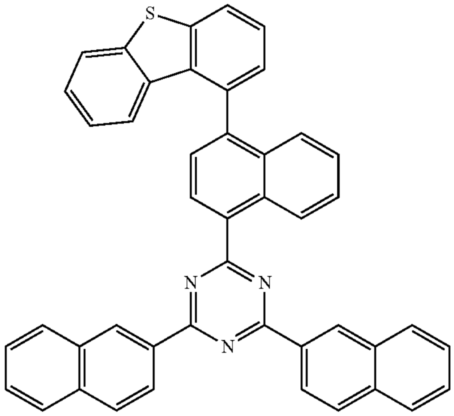

-continued
H2-91
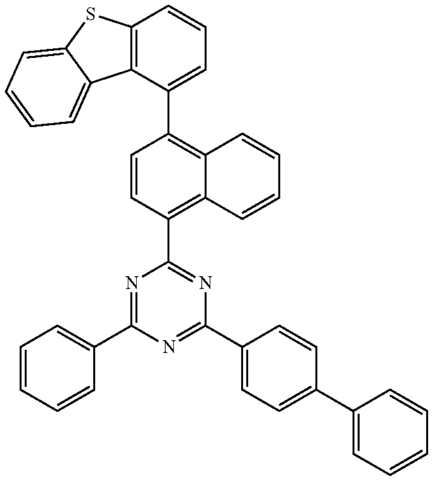
H2-92
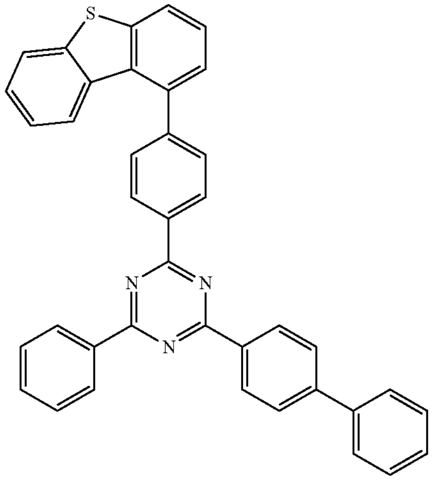
H2-93
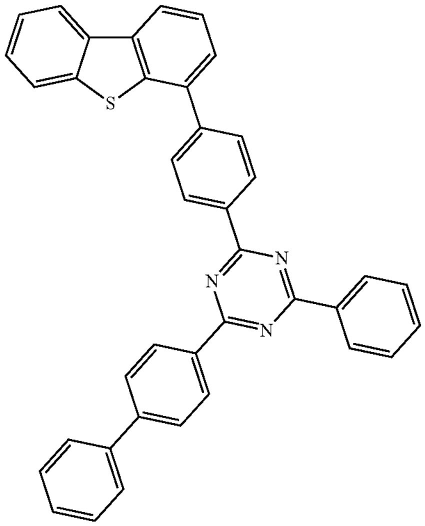
-continued
H2-94
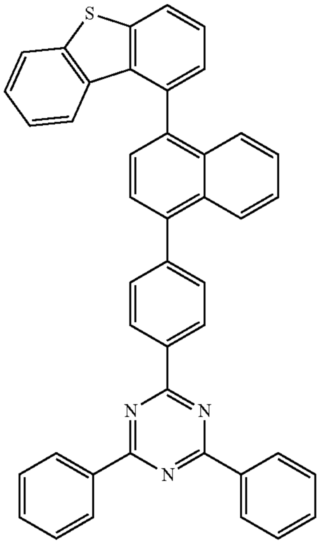
H2-95
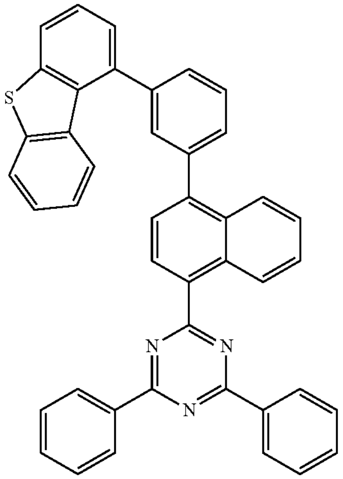
H2-96
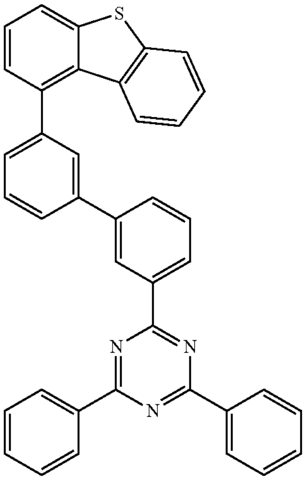

-continued
H2-97
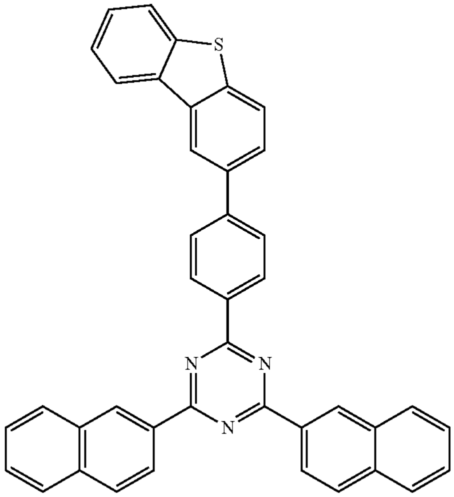
H2-98
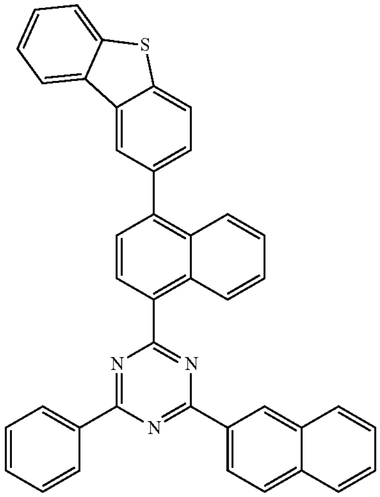
H2-99
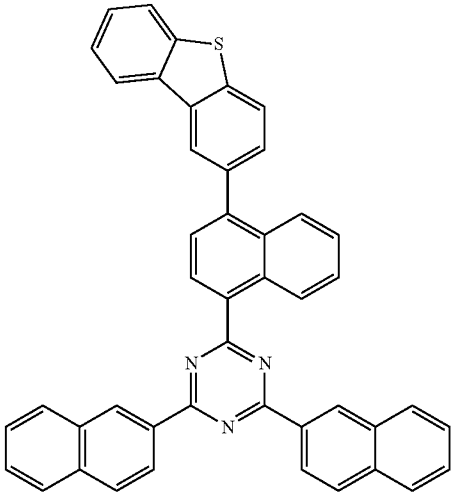
-continued
H2-100
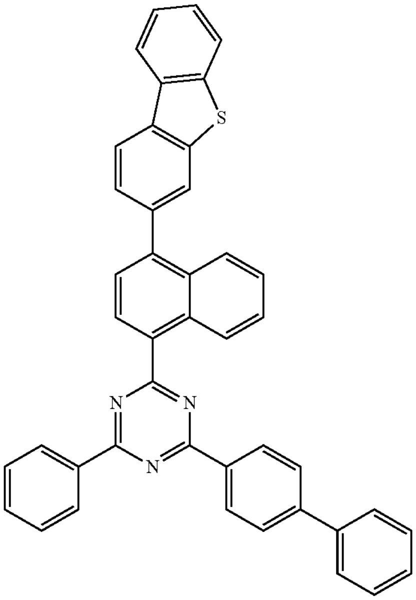
H2-101
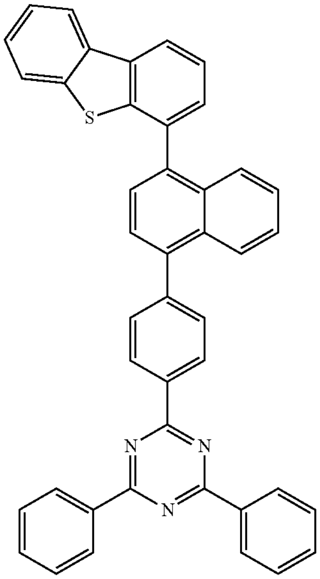
H2-102
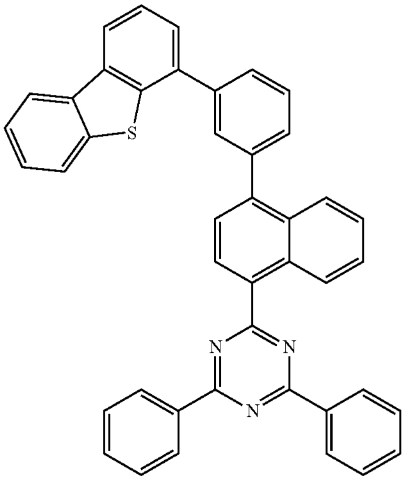

-continued
H2-103
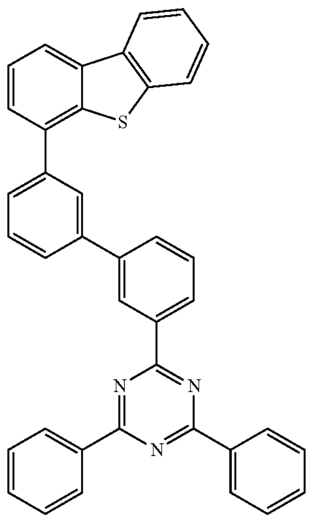
H2-104
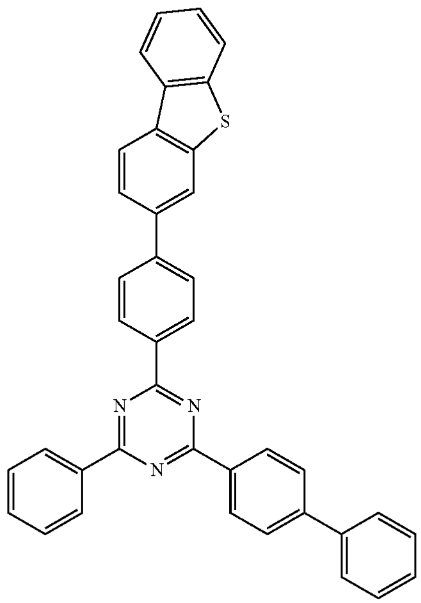
-continued
H2-105
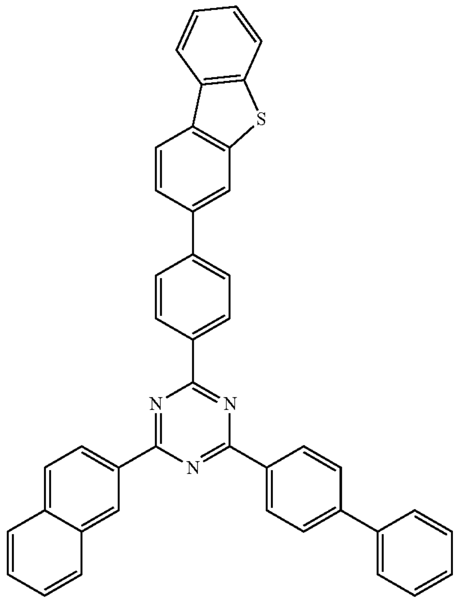
H2-106
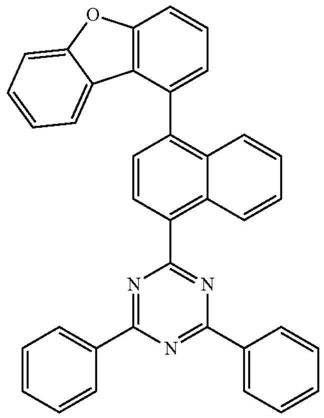
H2-107
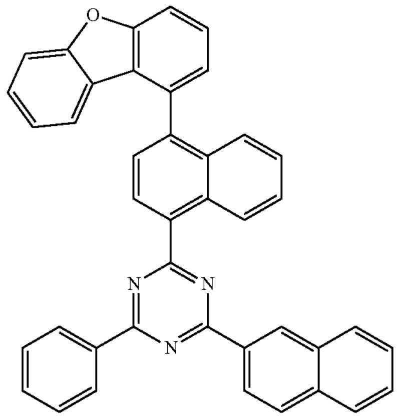

-continued
H2-108
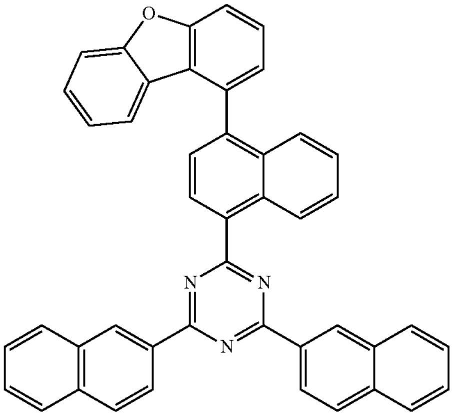
H2-109
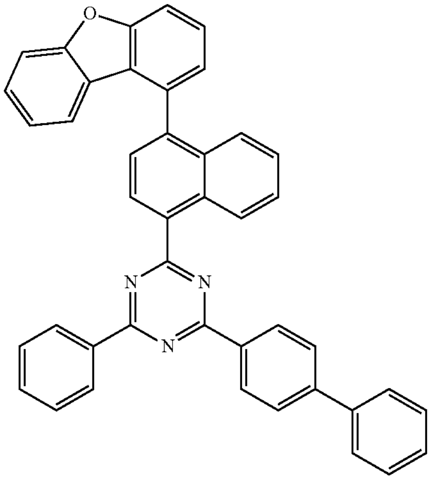
H2-110
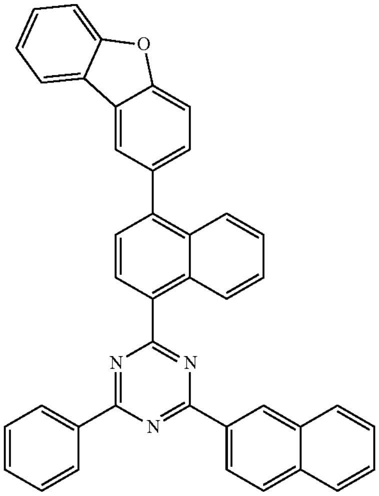
-continued
H2-111
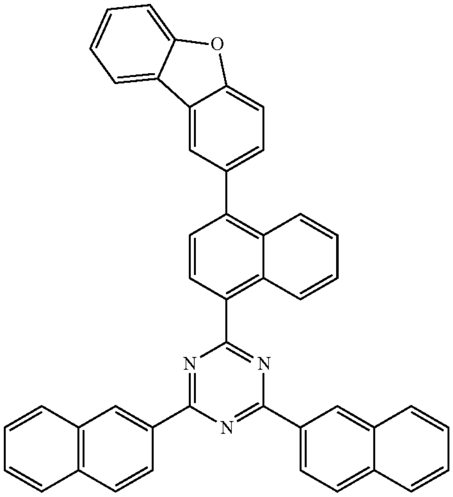
H2-112
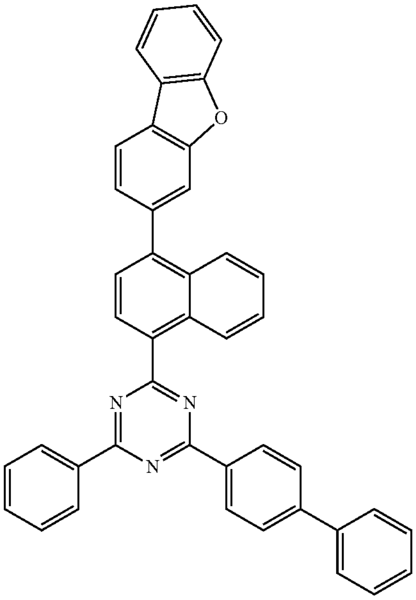
H2-113
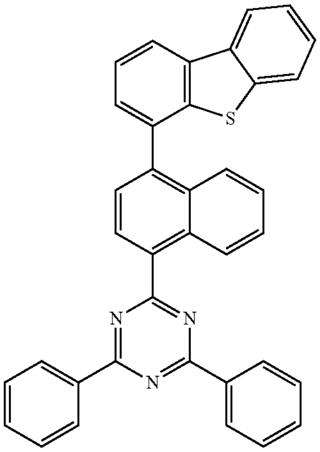

-continued
H2-114
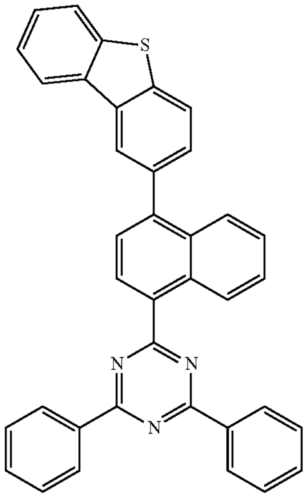
H2-115
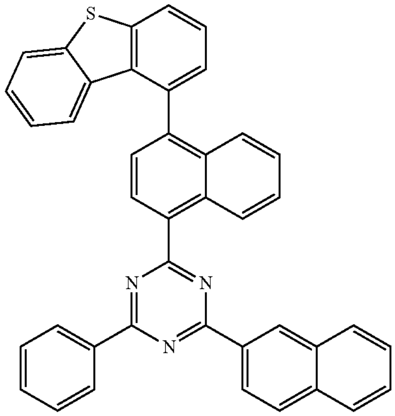
H2-116
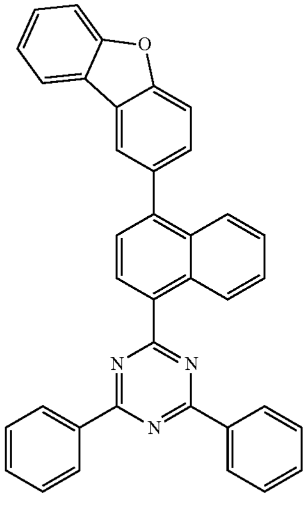
-continued
H2-117
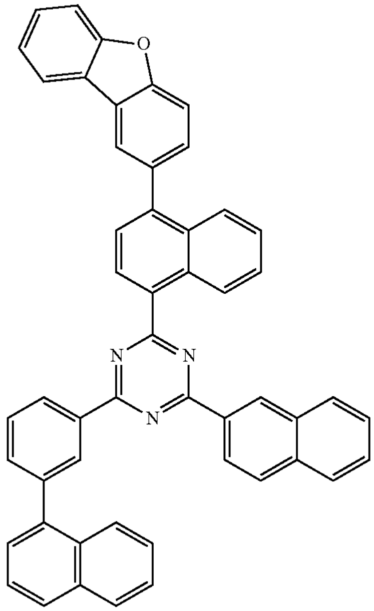
H2-118
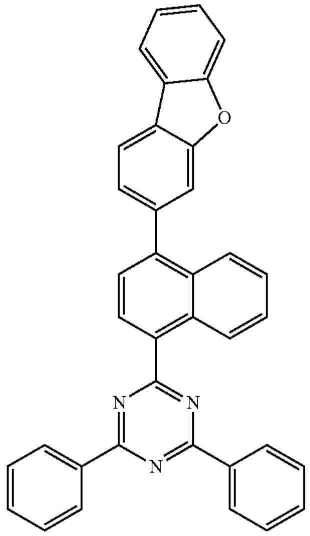

-continued
H2-119
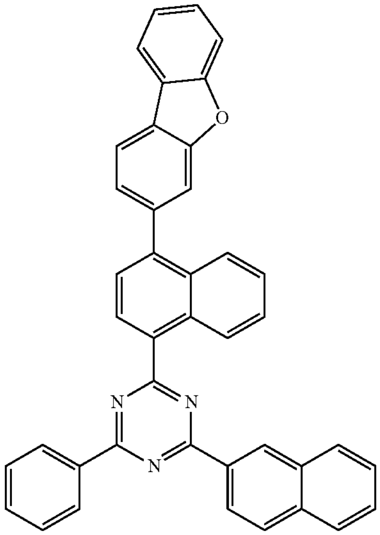
H2-120
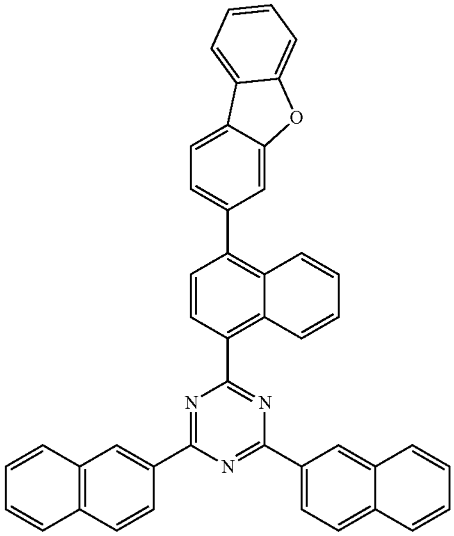
H2-121
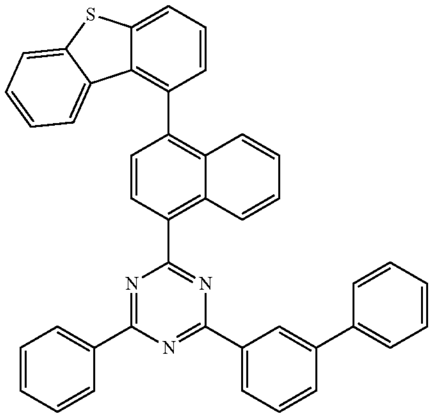
-continued
H2-122
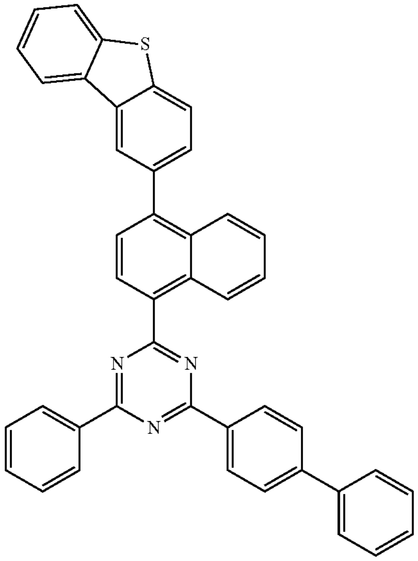
H2-123
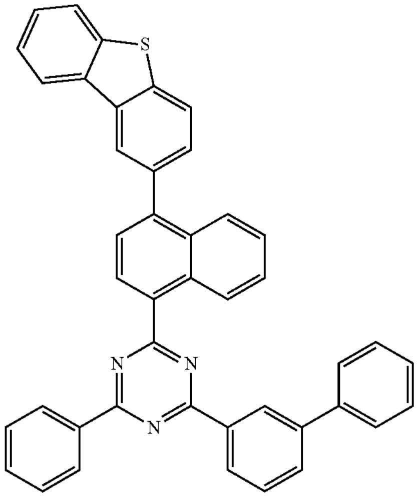
H2-124
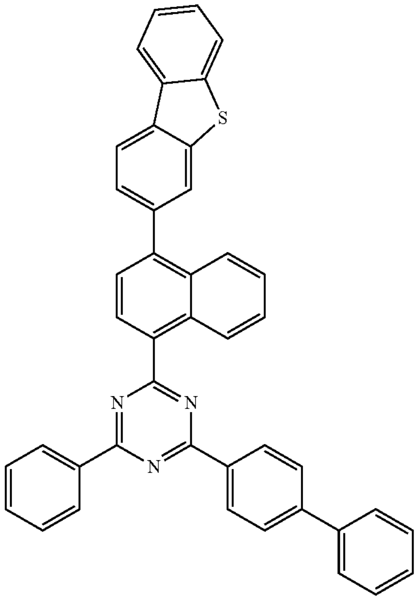

-continued
H2-125
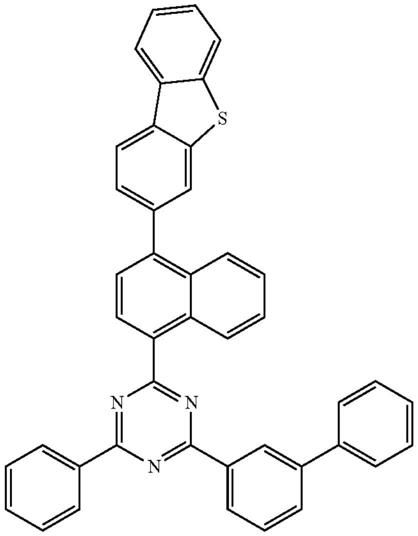
H2-126
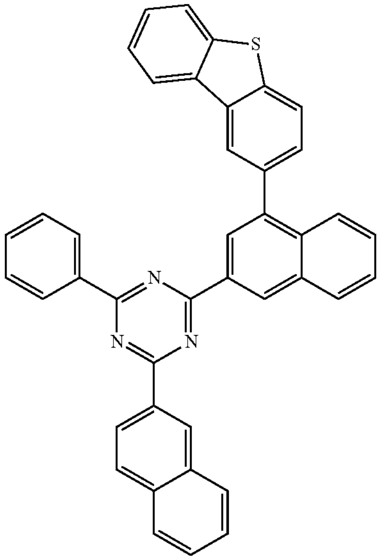
H2-127
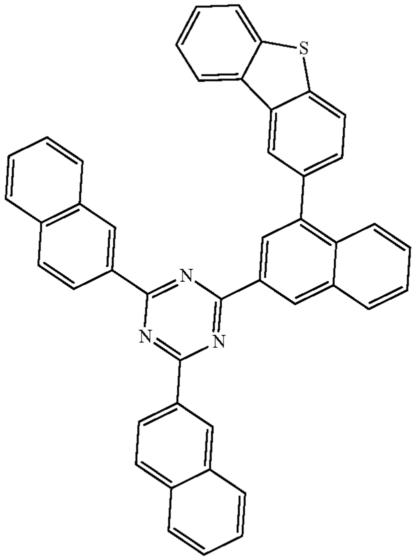
-continued
H2-128
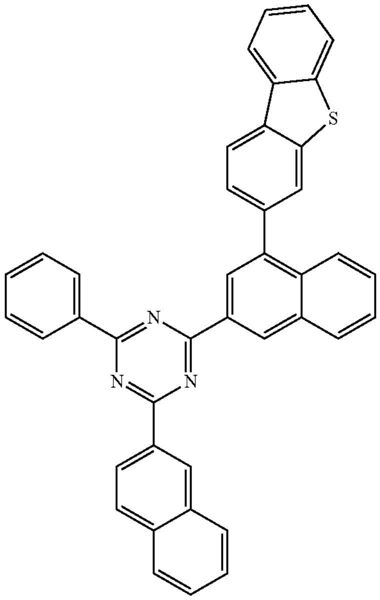
H2-129
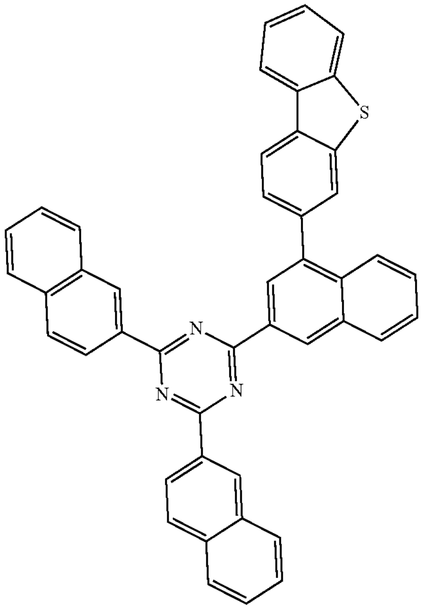

-continued
H2-130
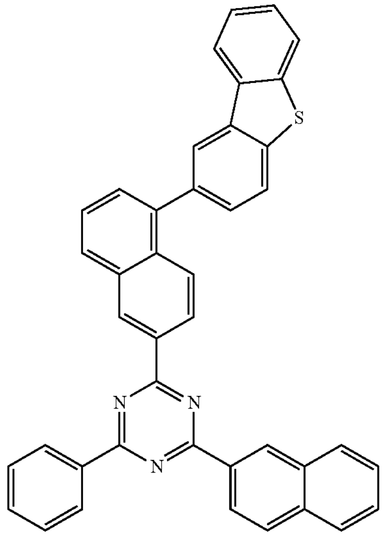
H2-131
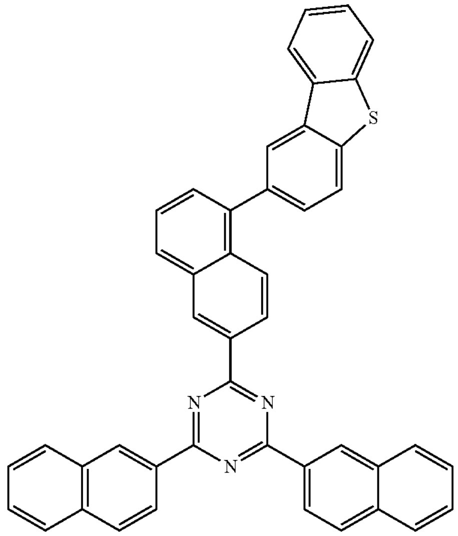
H2-132
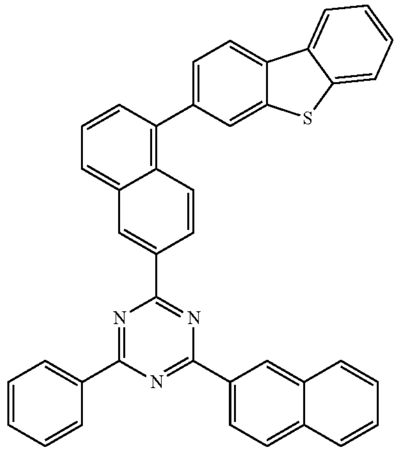
-continued
H2-133
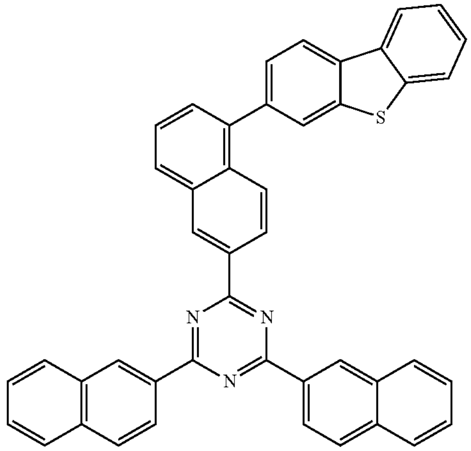
H2-134
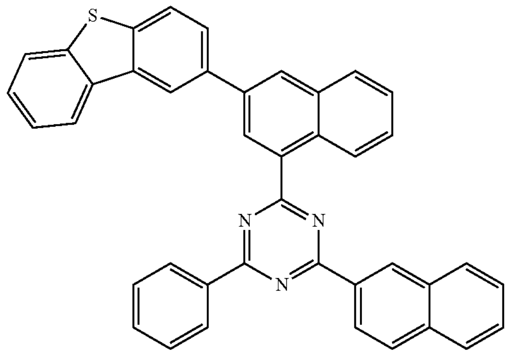
H2-135
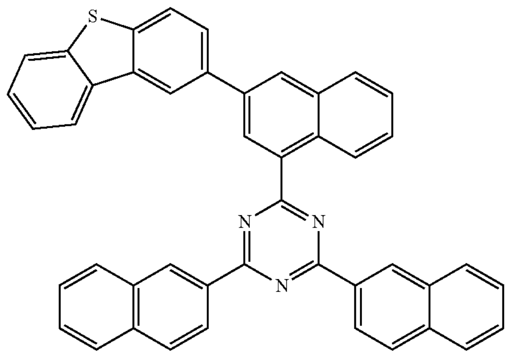

-continued
H2-136
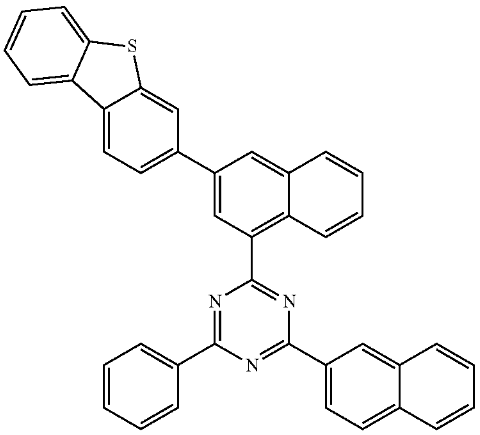
H2-137
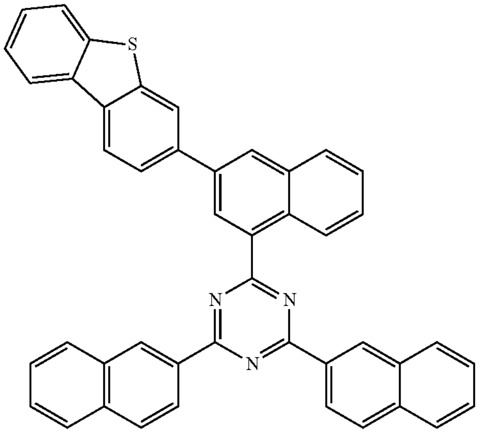
H2-138
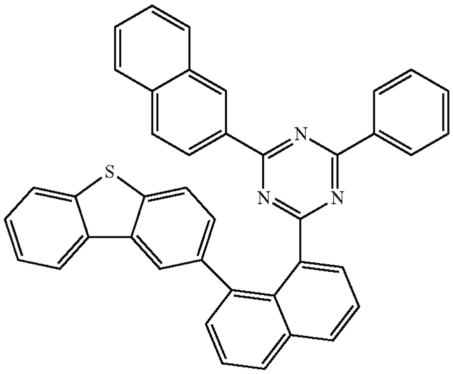
-continued
H2-139
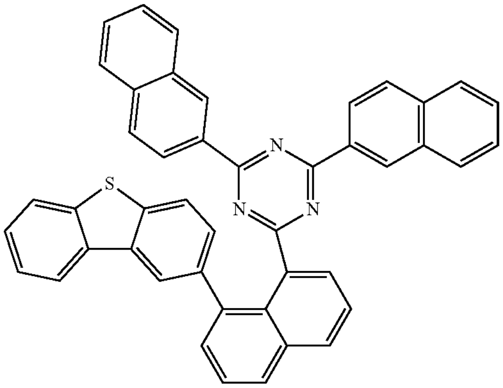
H2-140
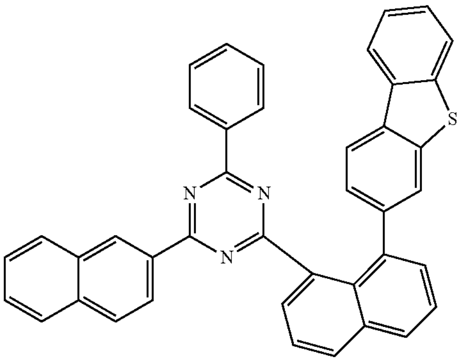
H2-141
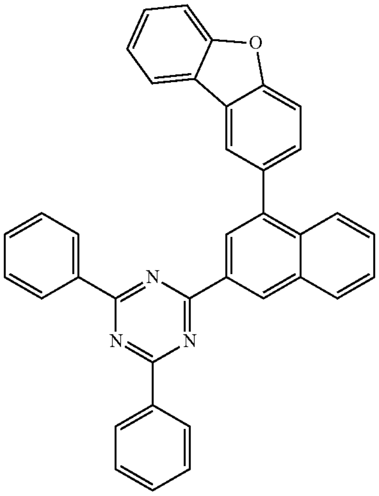

-continued
H2-142
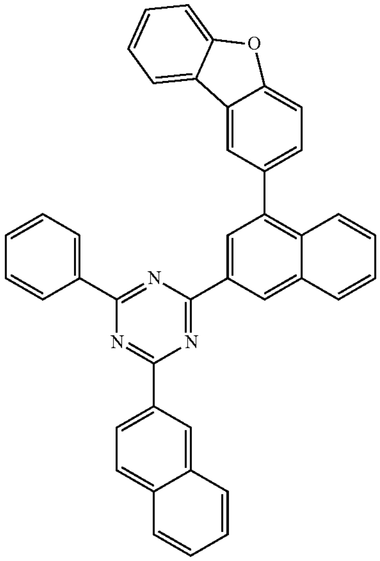
H2-143
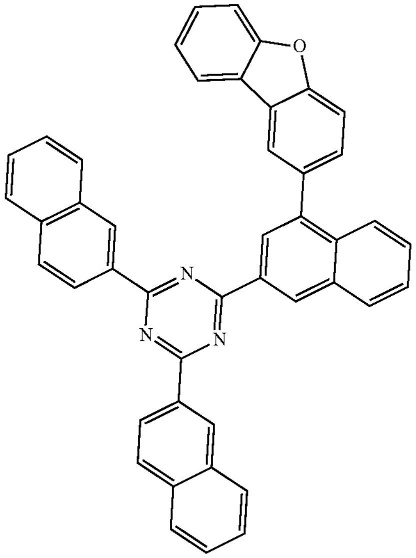
H2-144
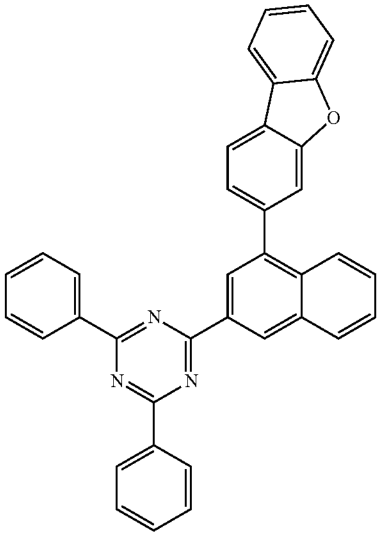
-continued
H2-145
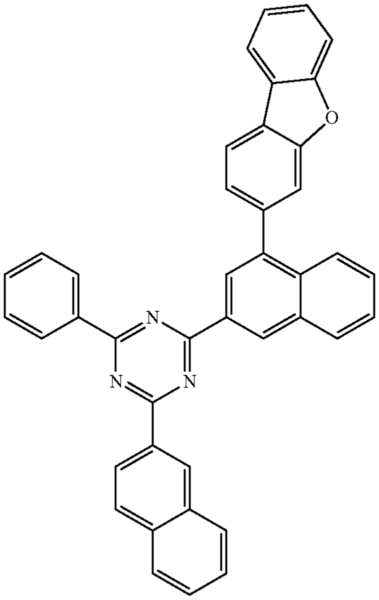
H2-146
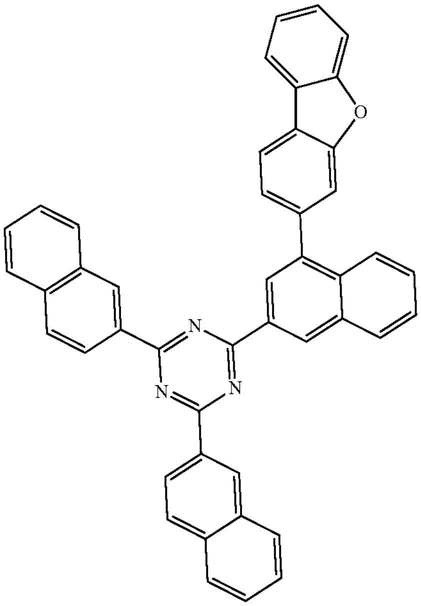

-continued
H2-147
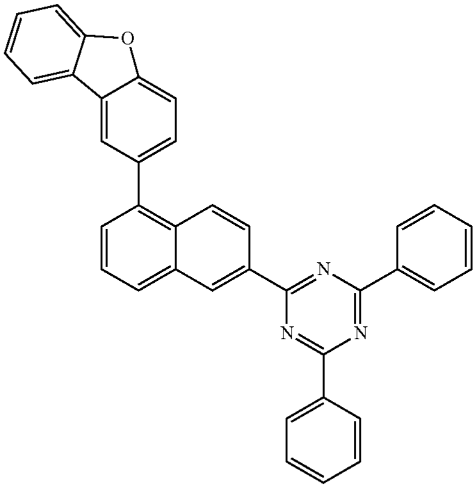
H2-148
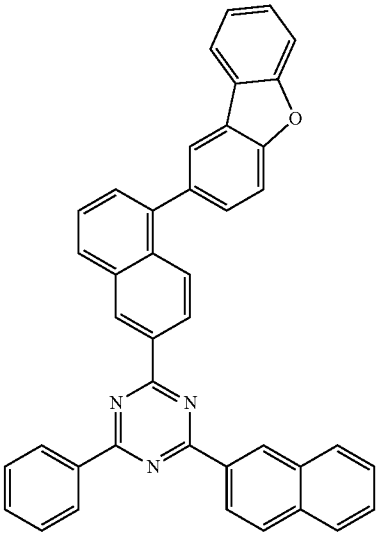
H2-149
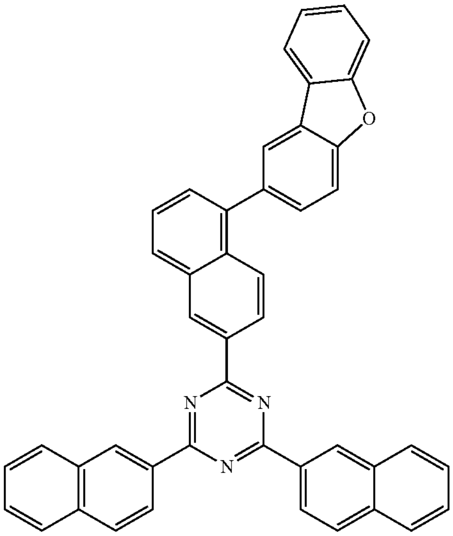
-continued
H2-150
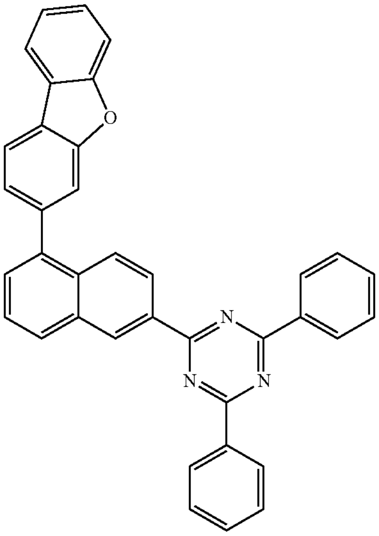
H2-151
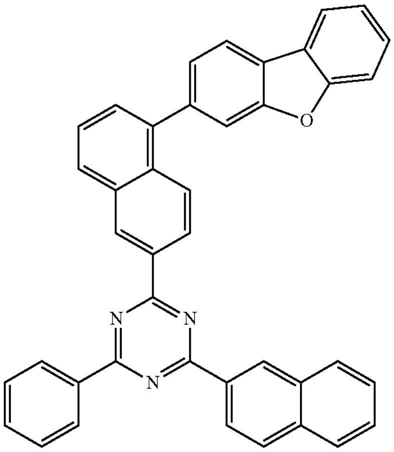
H2-152
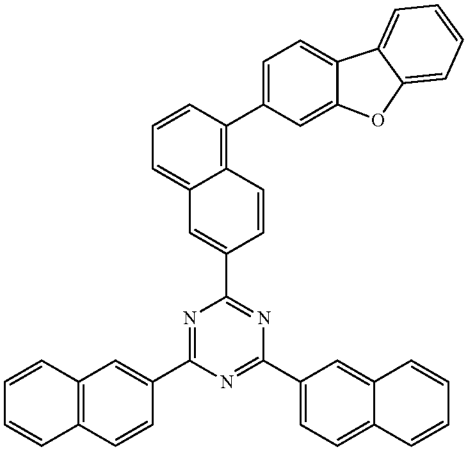

-continued
H2-153
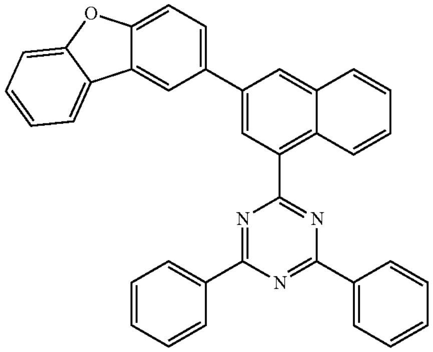
H2-154
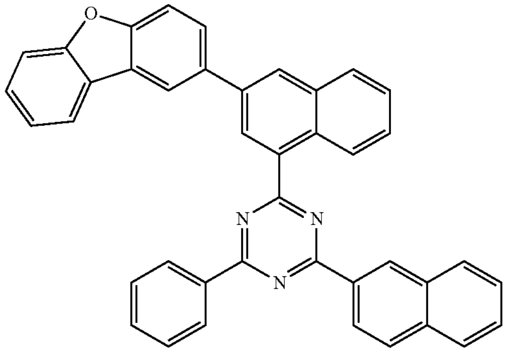
H2-155
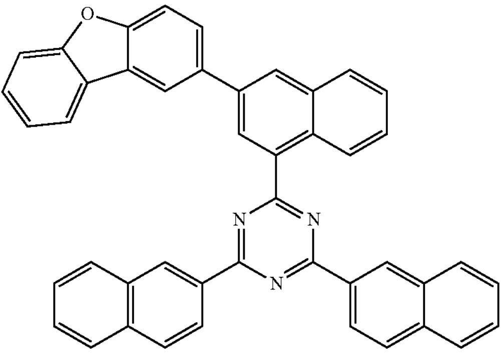
H2-156
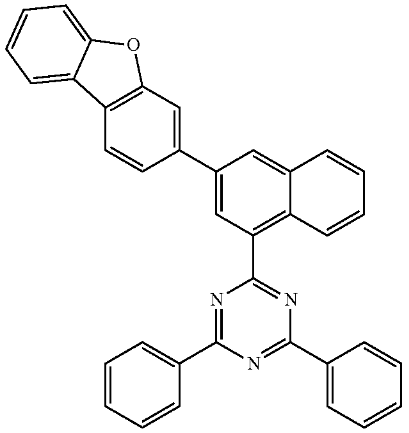
-continued
H2-157
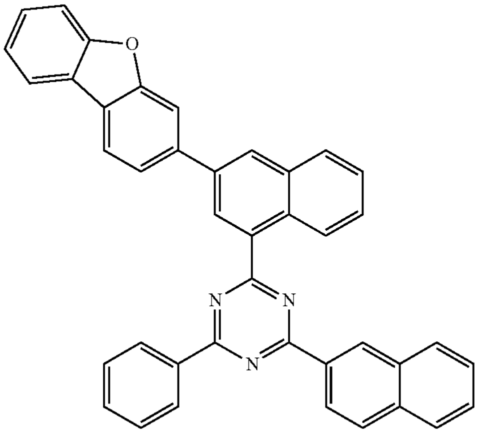
H2-158
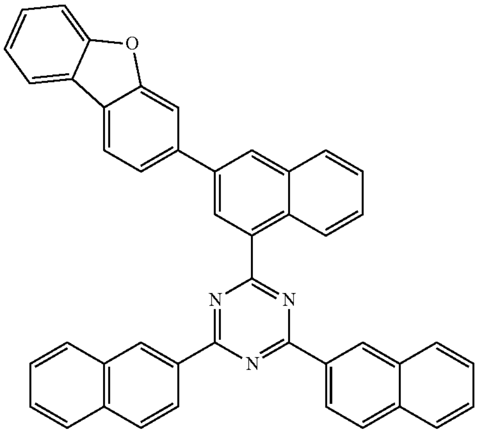
H2-159
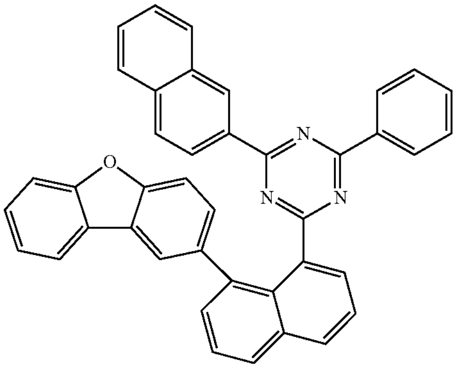

-continued
H2-160
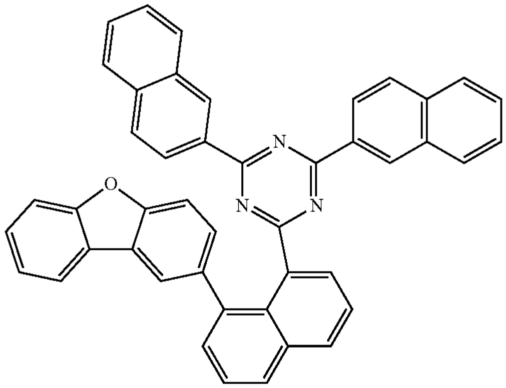
H2-161
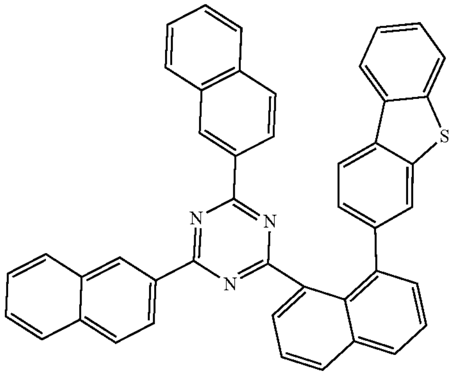
H2-162
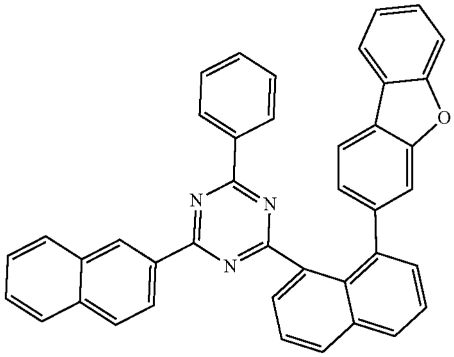
H2-163
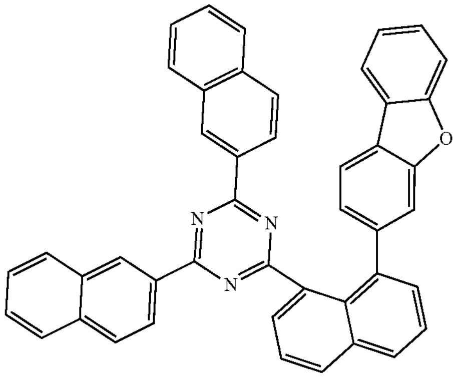
-continued
H2-164
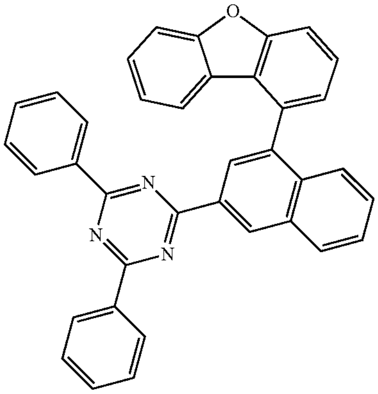
H2-165
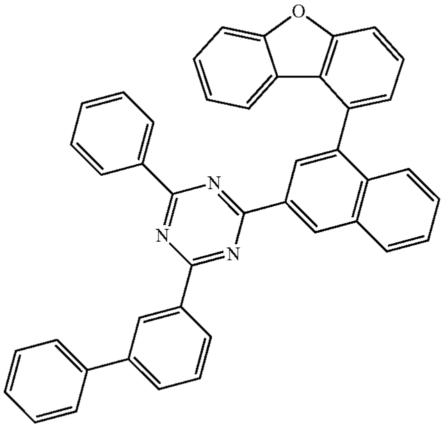
H2-166
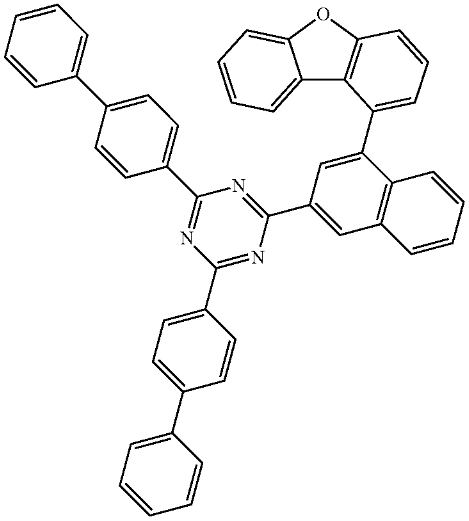

-continued
H2-167
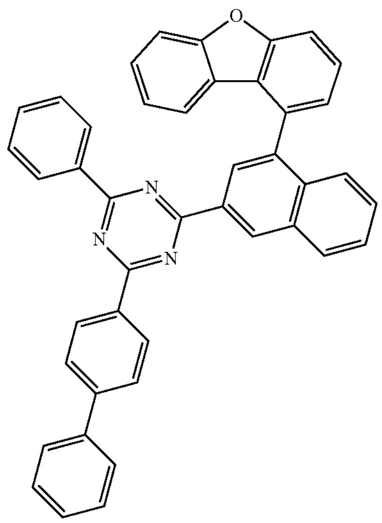
H2-168
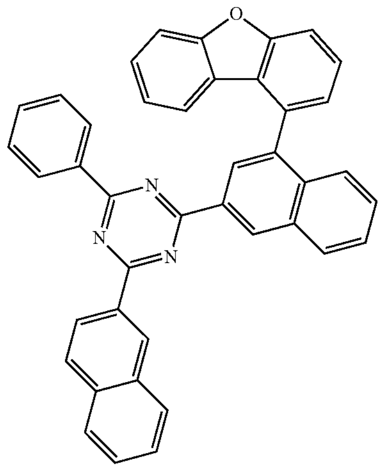
H2-169
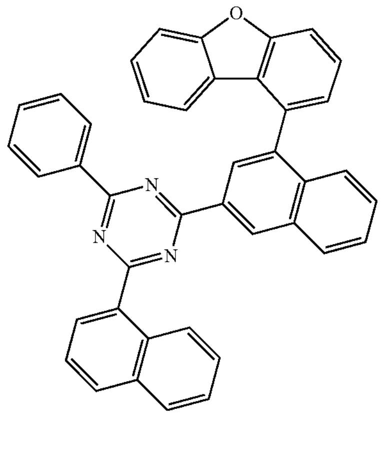
-continued
H2-170
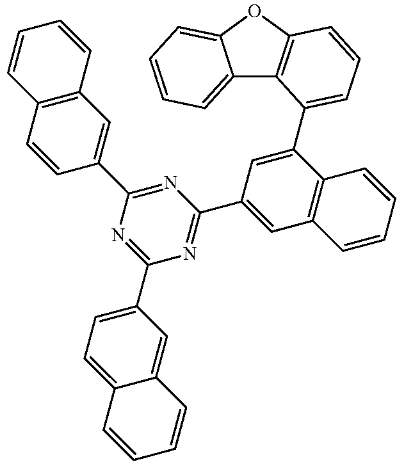
H2-171
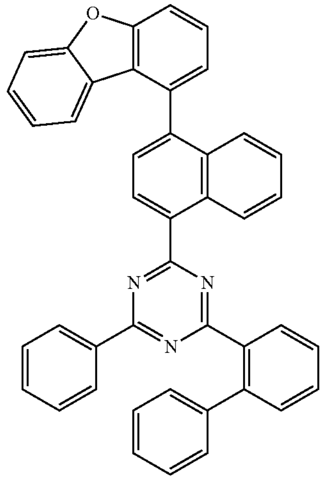
H2-172
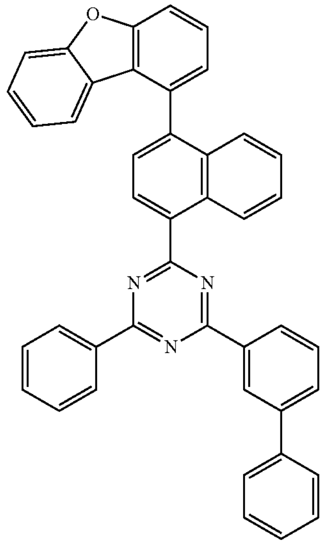

-continued
H2-173
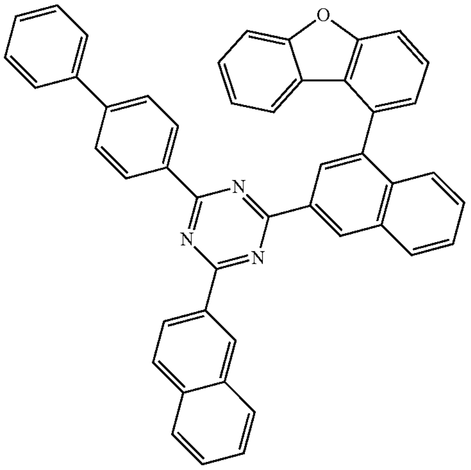
H2-174
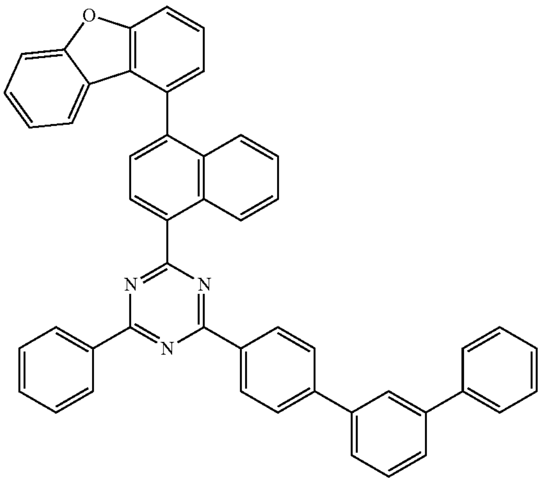
H2-175
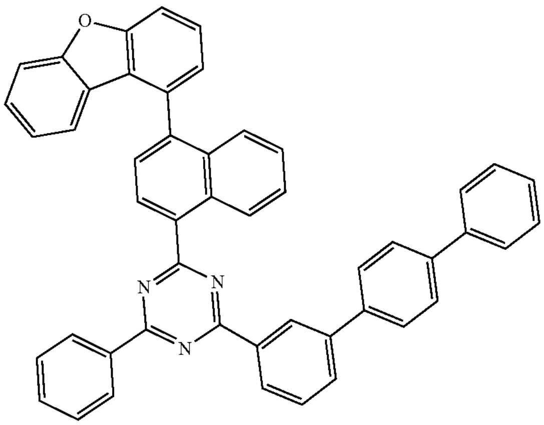
-continued
H2-176
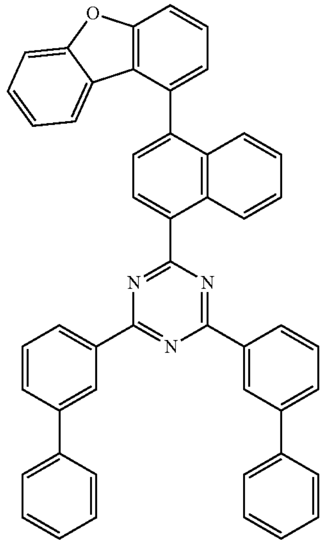
H2-177
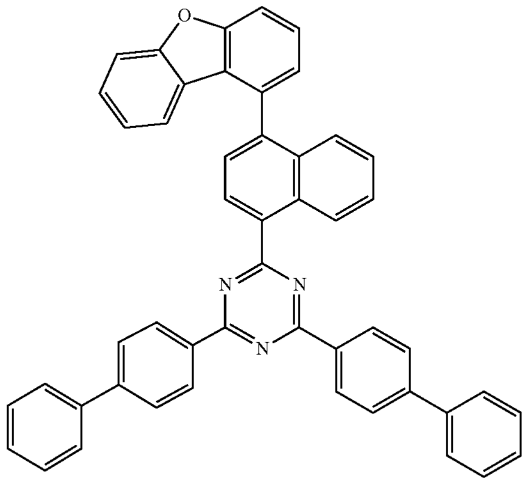
H2-178
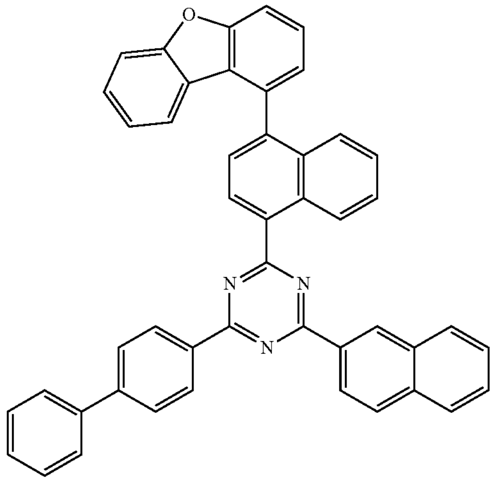

-continued
H2-179
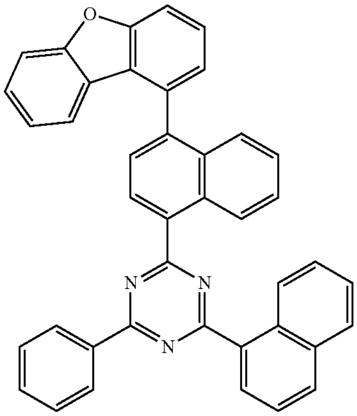
H2-180
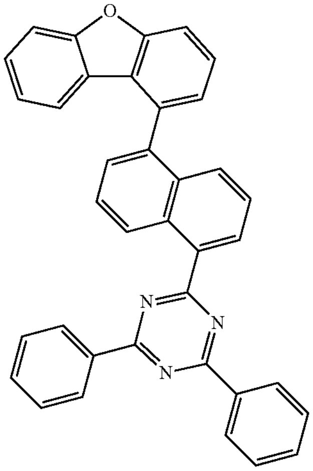
H2-181
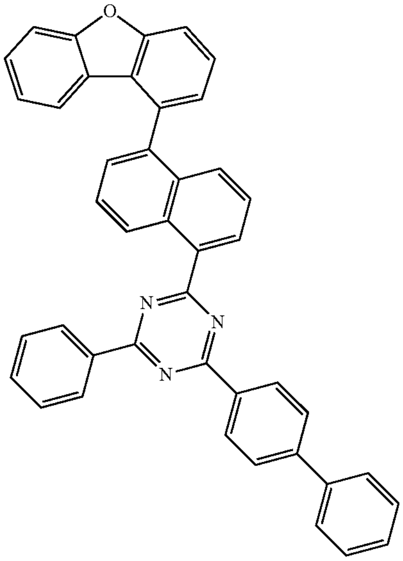
-continued
H2-182
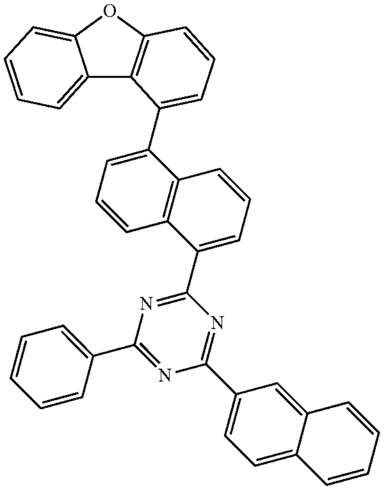
H2-183
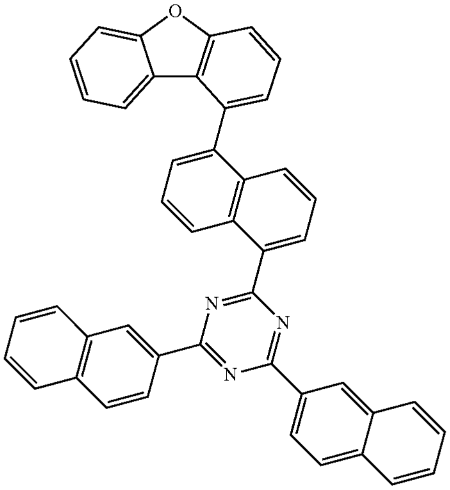
H2-184
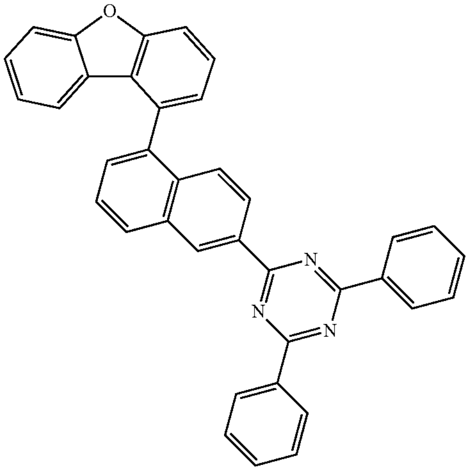

-continued
H2-185
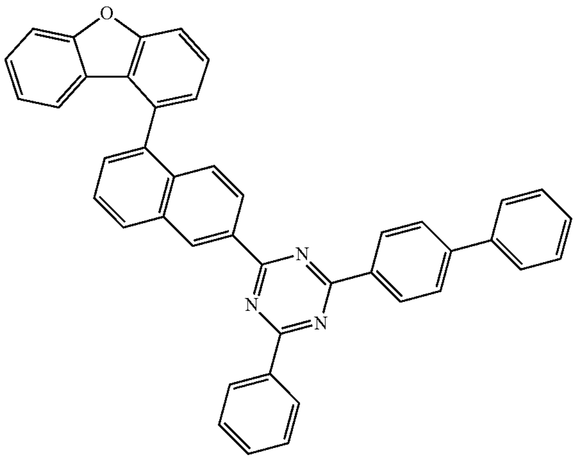
H2-186
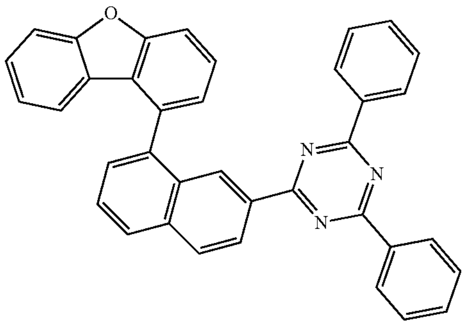
H2-187
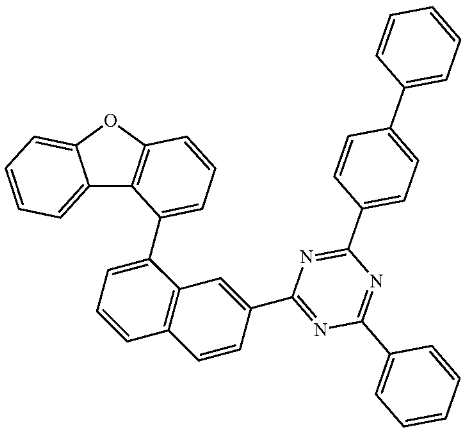
-continued
H2-188
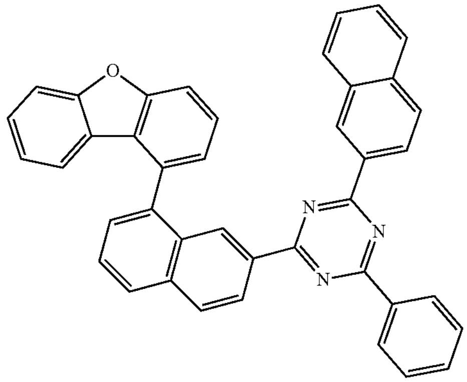
H2-189
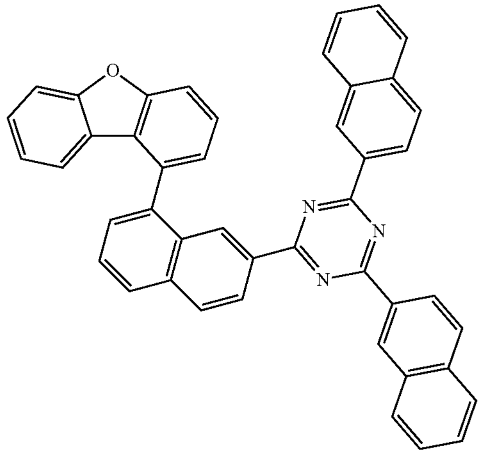
H2-190
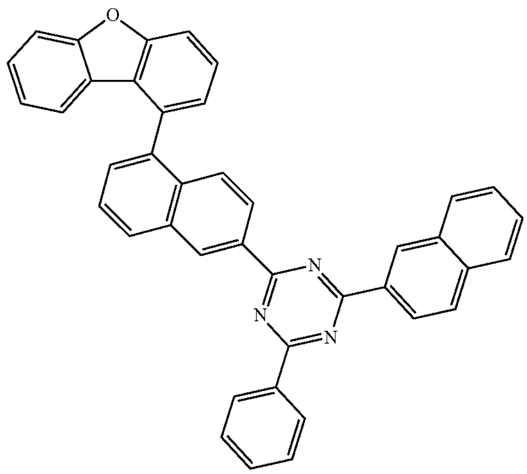

-continued
H2-191
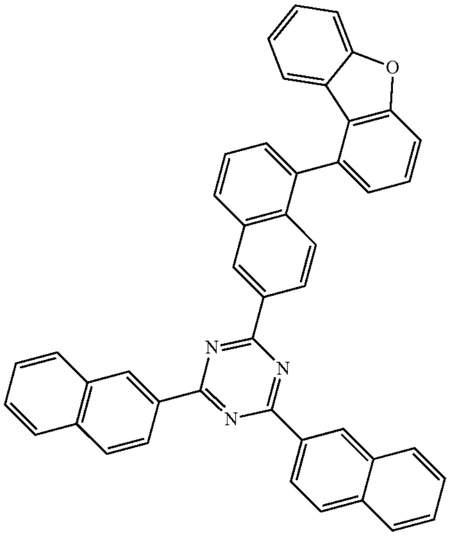
H2-192
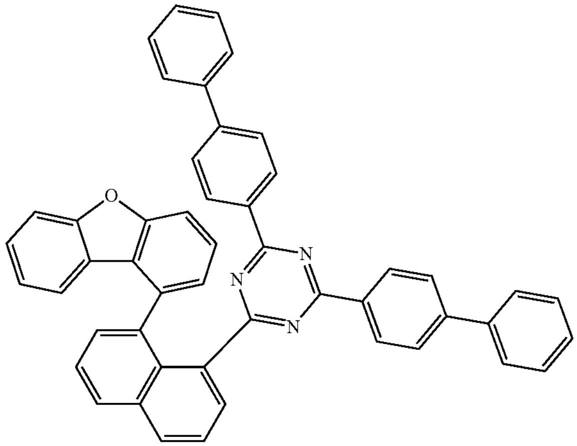
H2-193
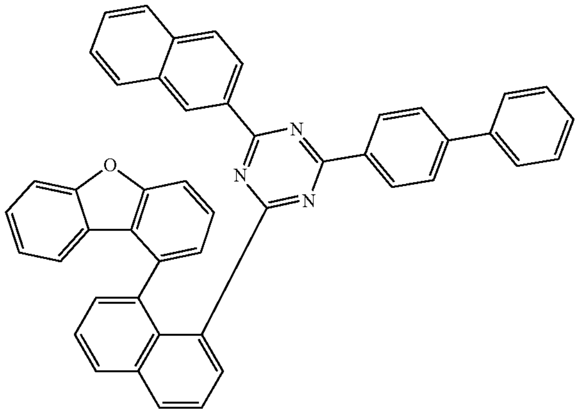
-continued
H2-194
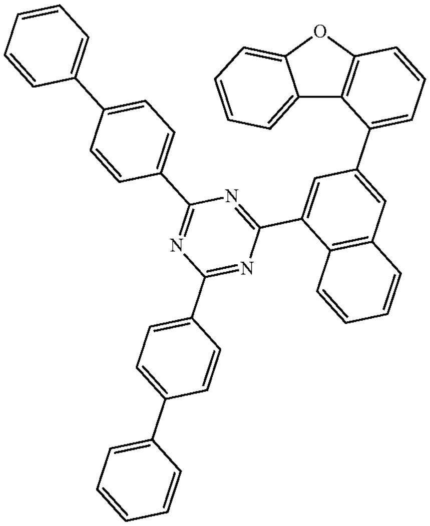
H2-195
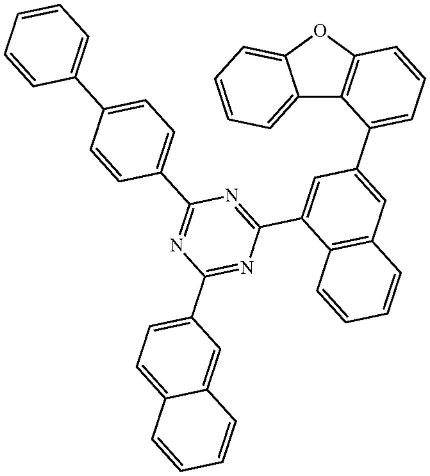
H2-196
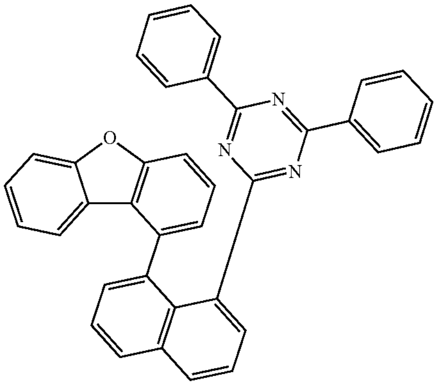

-continued
H2-197
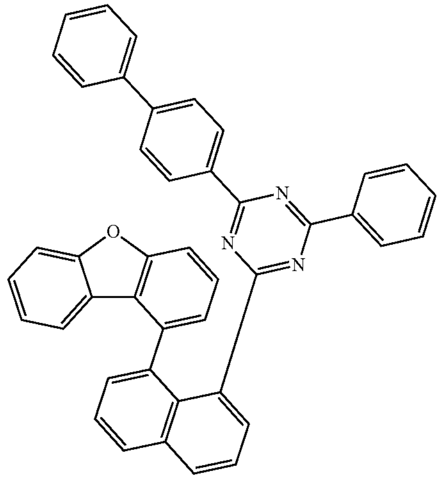
H2-198
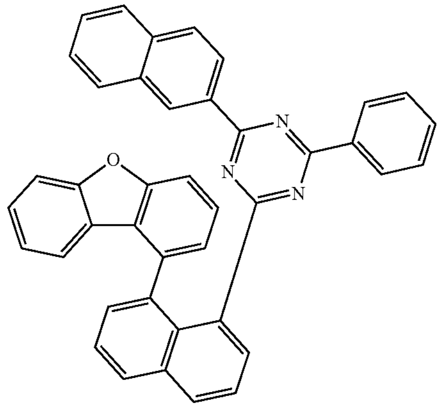
H2-199
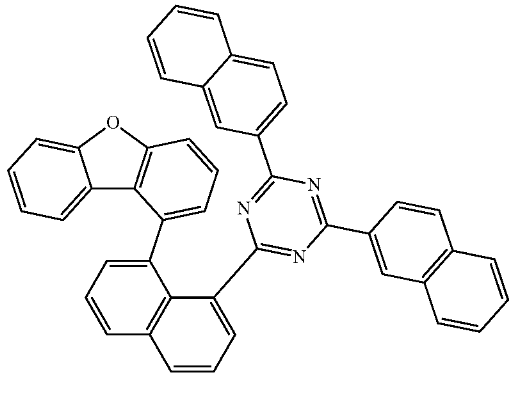
-continued
H2-200
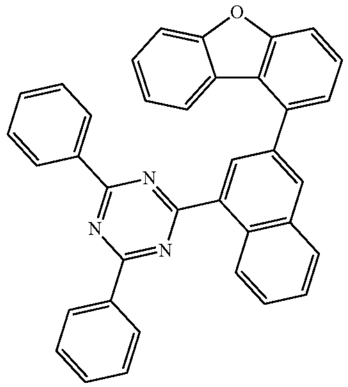
H2-201
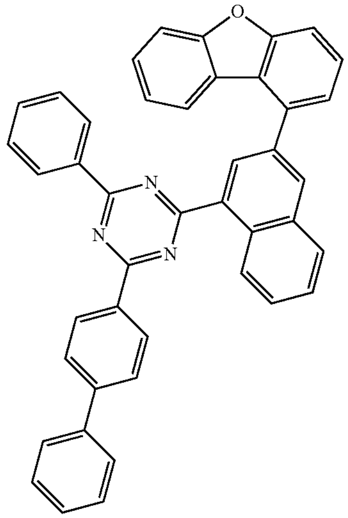
H2-202
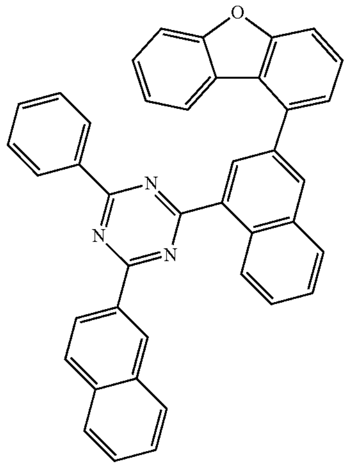

-continued
H2-203
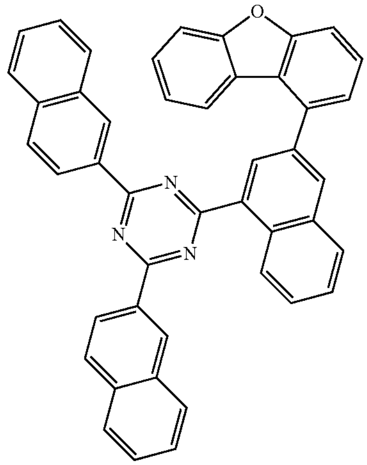
H2-204
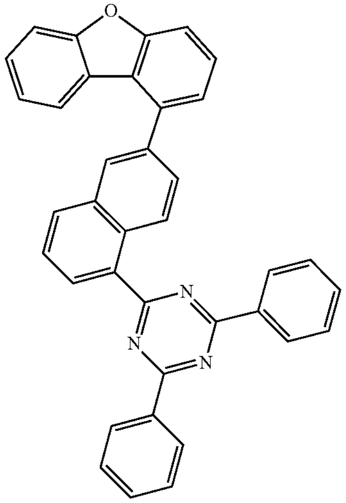
H2-205
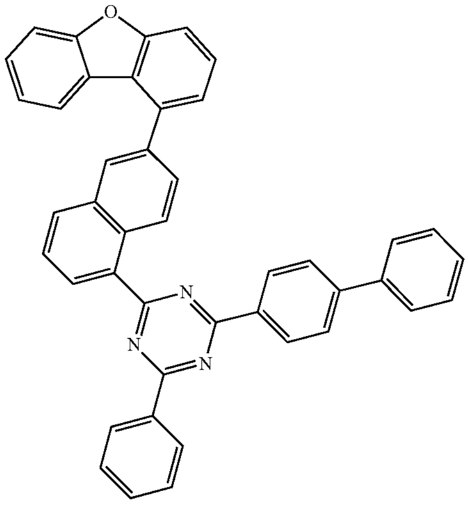
-continued
H2-206
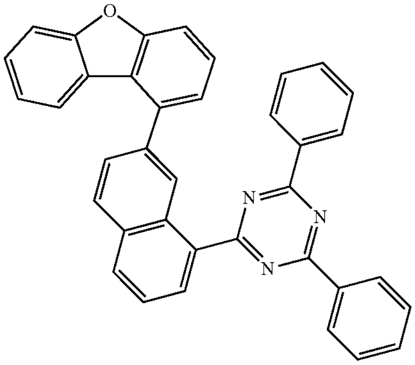
H2-207
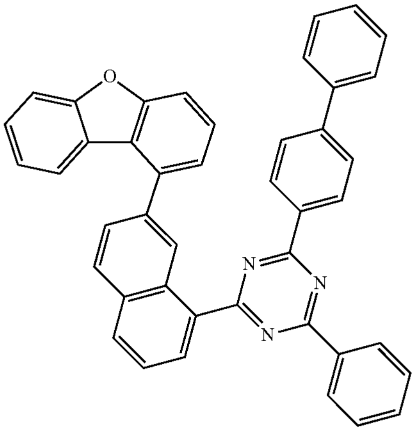
H2-208
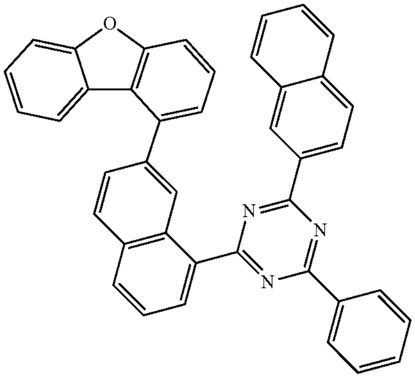
H2-209
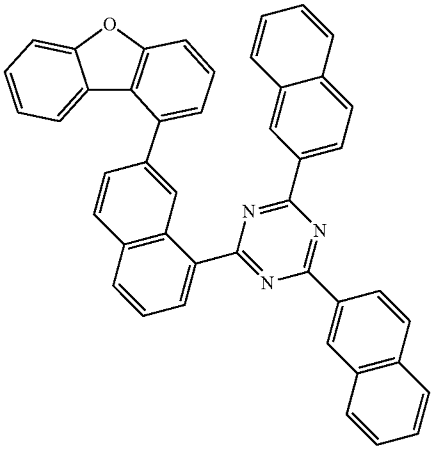

-continued
H2-210
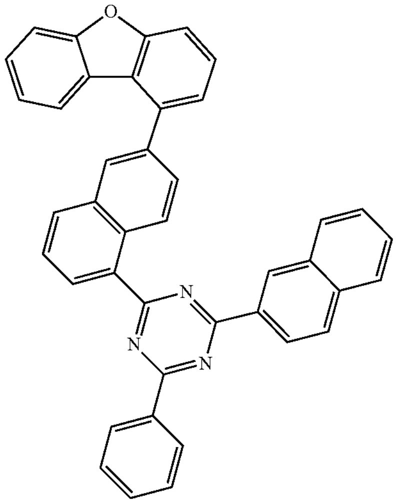
H2-211
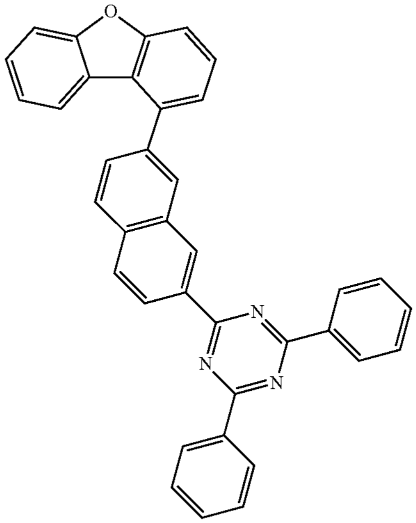
H2-212
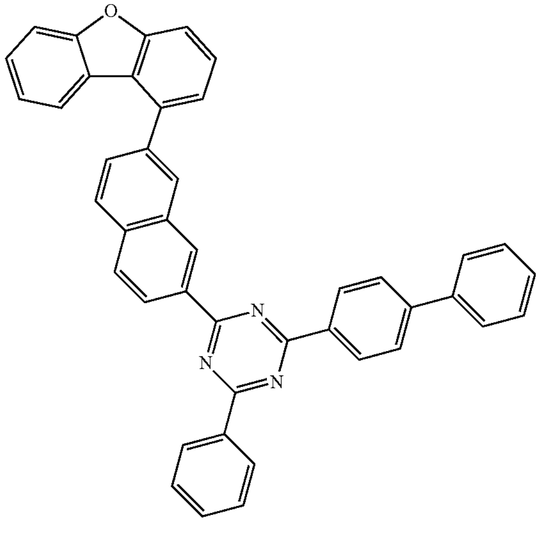
-continued
H2-213
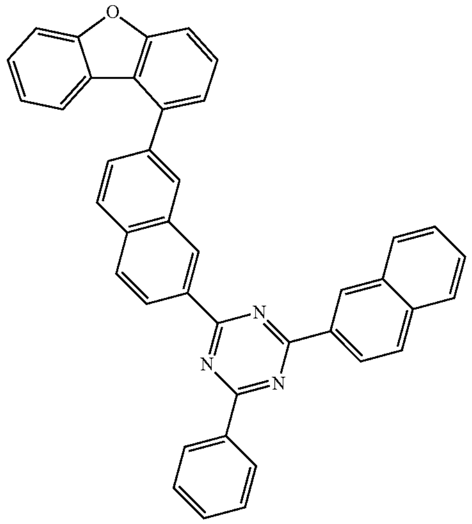
H2-214
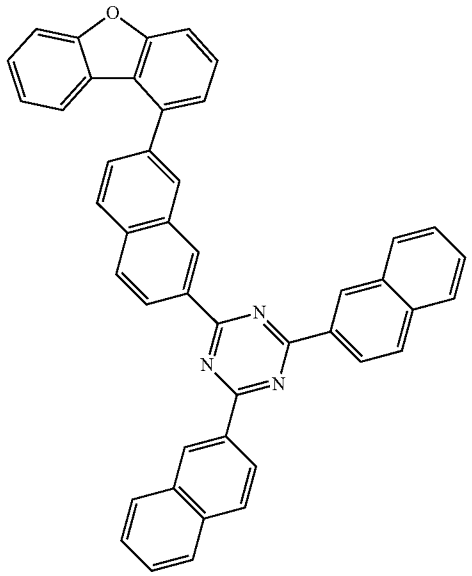

-continued
H2-215
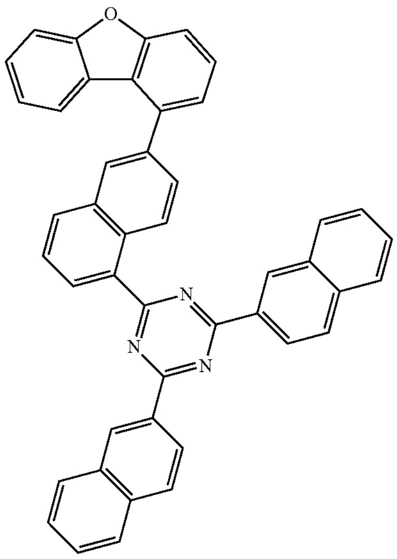
H2-216
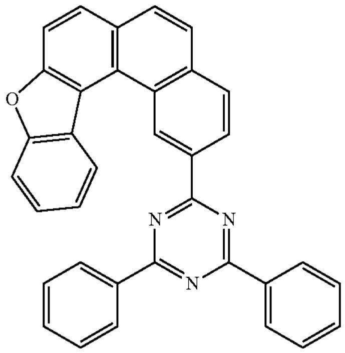
H2-217
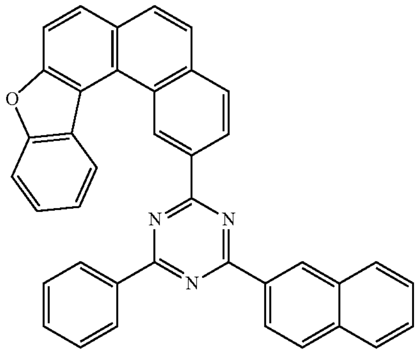
H2-218
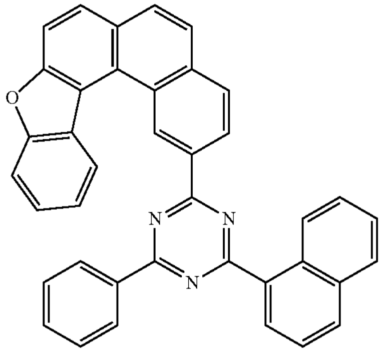
-continued
H2-219
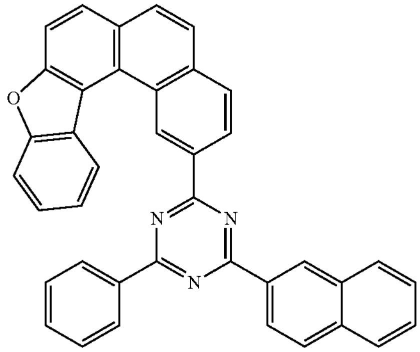
H2-220
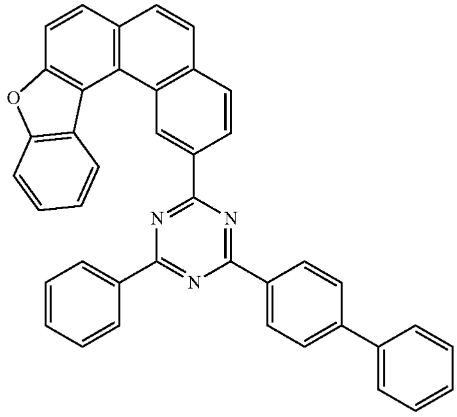
H2-221
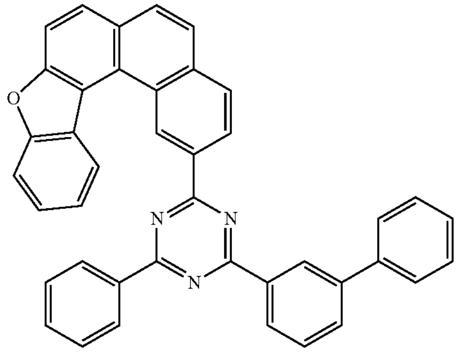
H2-222
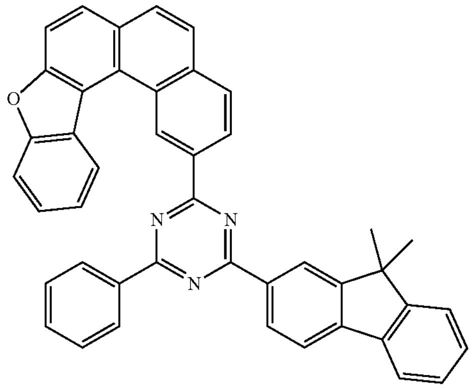

-continued
H2-223
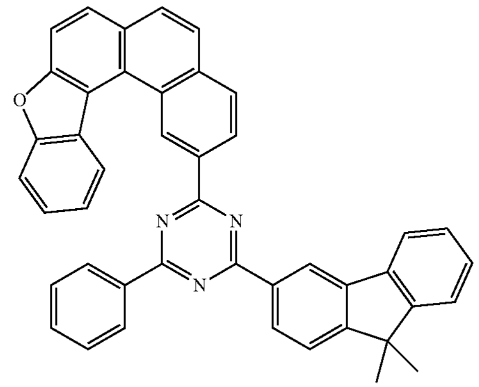
H2-224
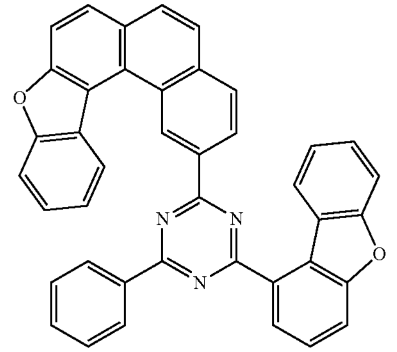
H2-225
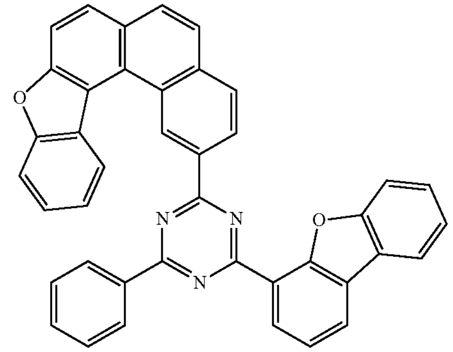
H2-226
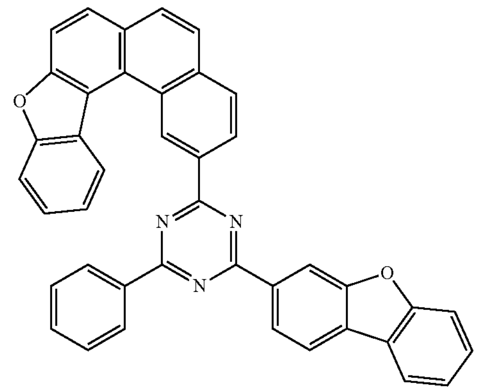
-continued
H2-227
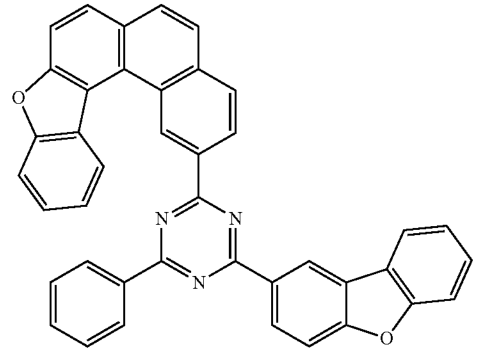
H2-228
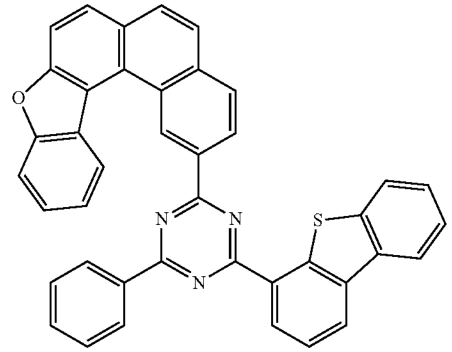
H2-229
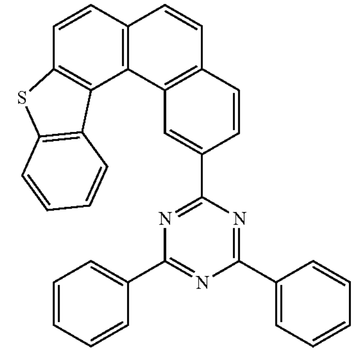
H2-230
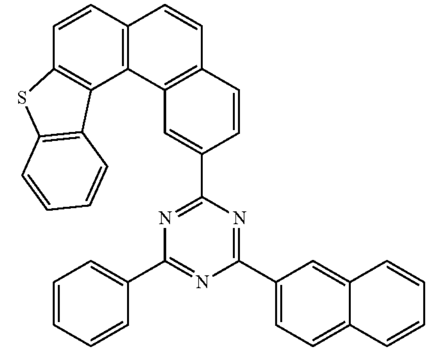

-continued
H2-231
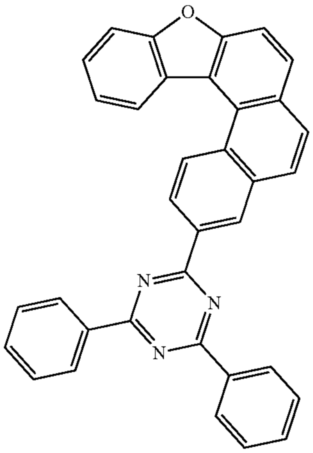
H2-232
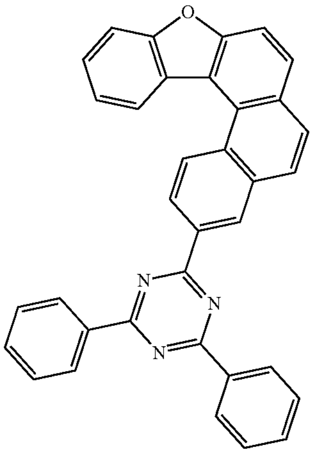
H2-233
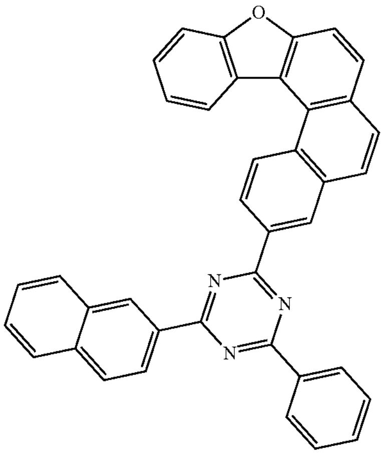
-continued
H2-234
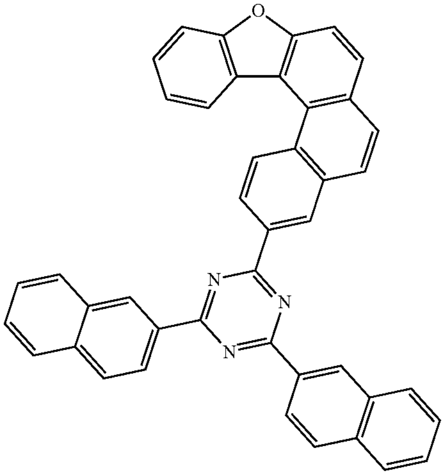
H2-235
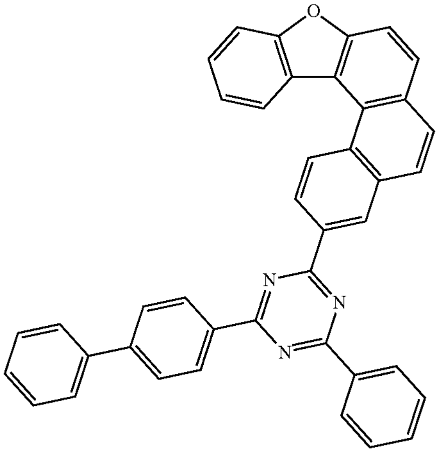
H2-236
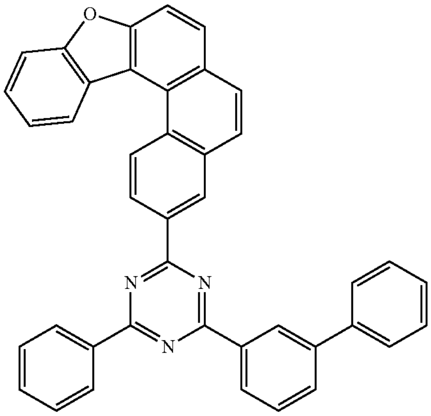

-continued
H2-237
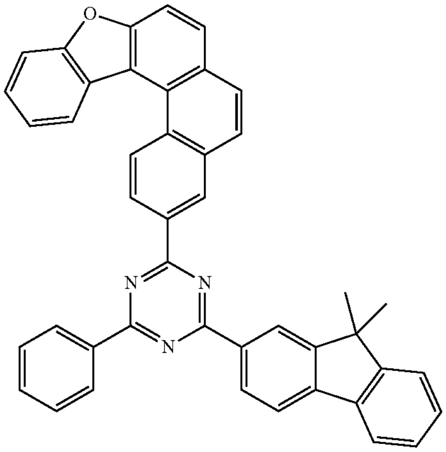
H2-238
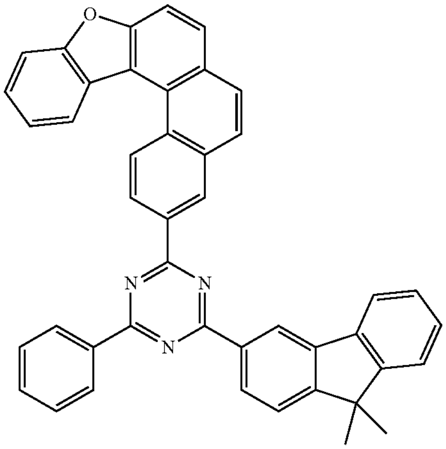
H2-239
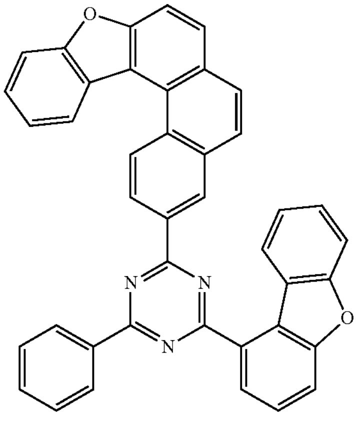
-continued
H2-240
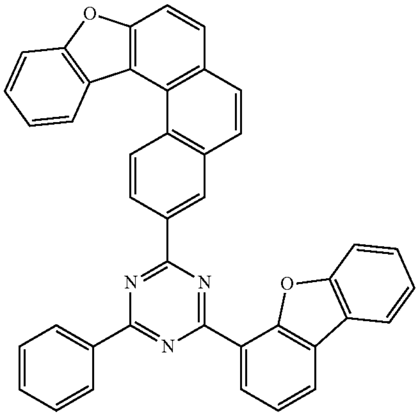
H2-241
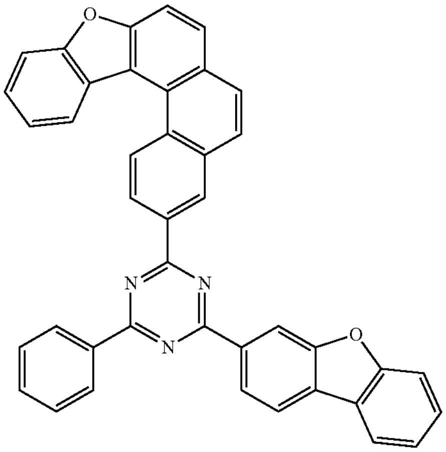
H2-242
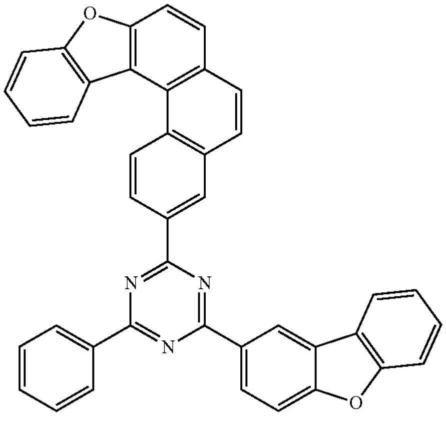

-continued
H2-243
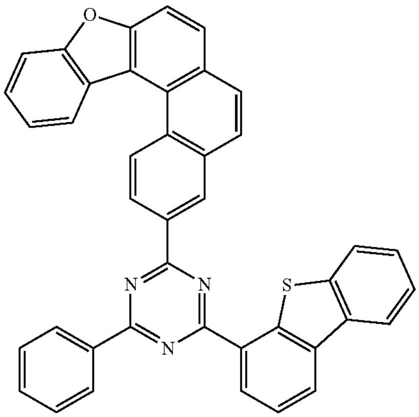
H2-244
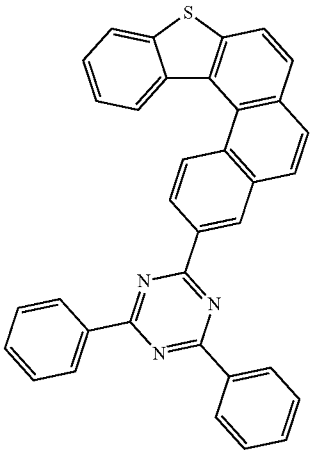
H2-245
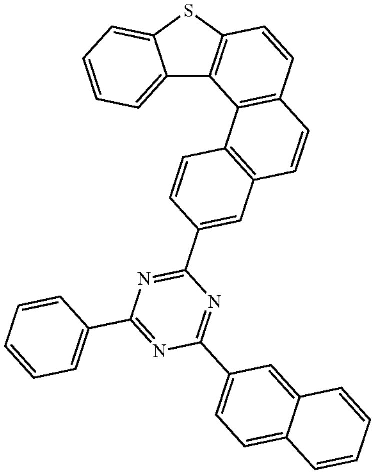
-continued
H2-246
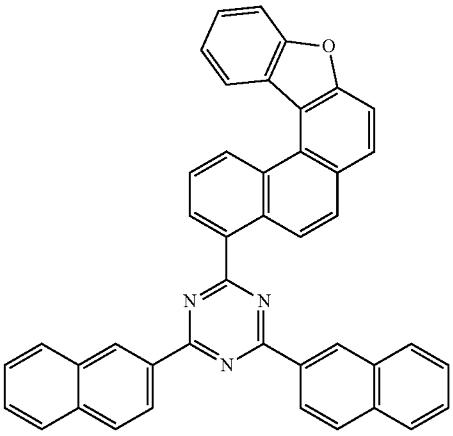
H2-247
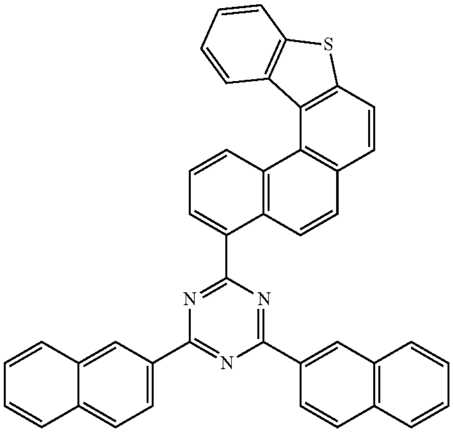
H2-248
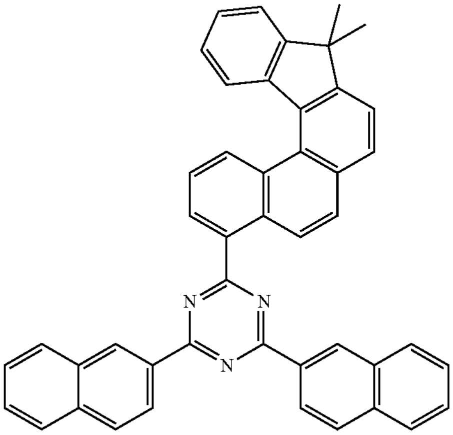

-continued
H2-249
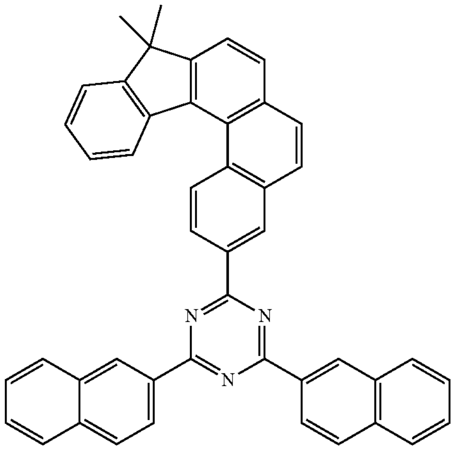
H2-250
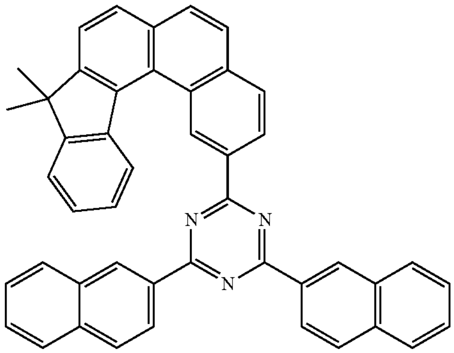
H2-251
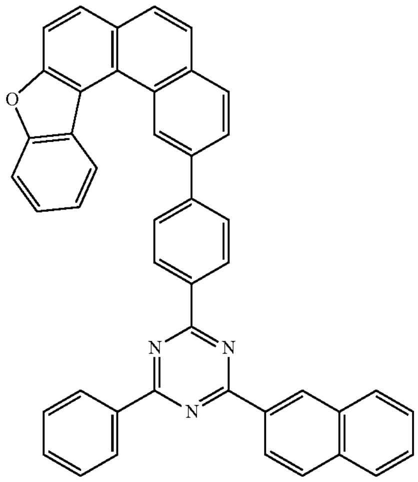
-continued
H2-252
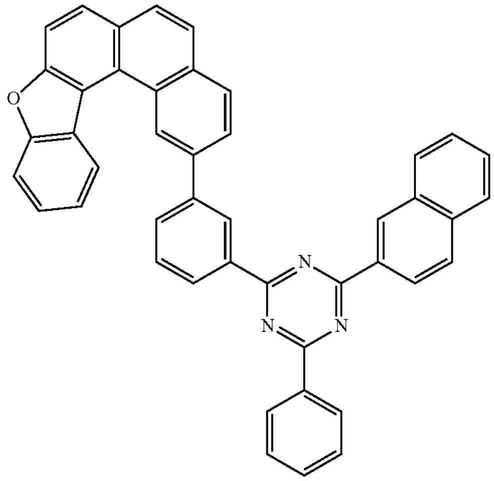
H2-253
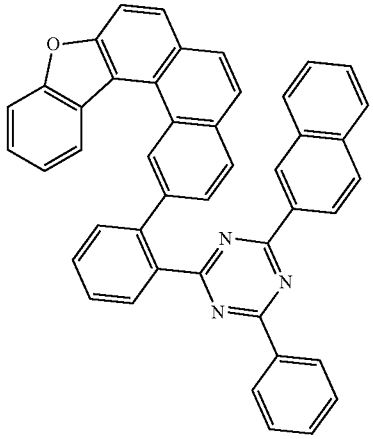
H2-254
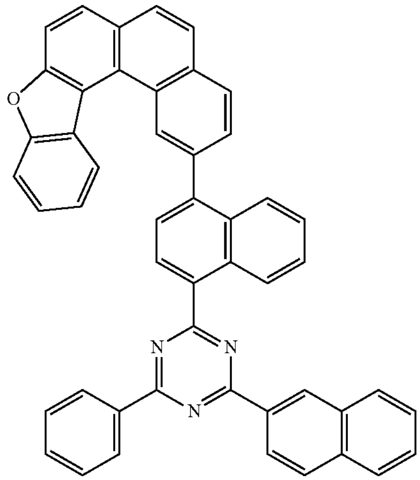

-continued
H2-255
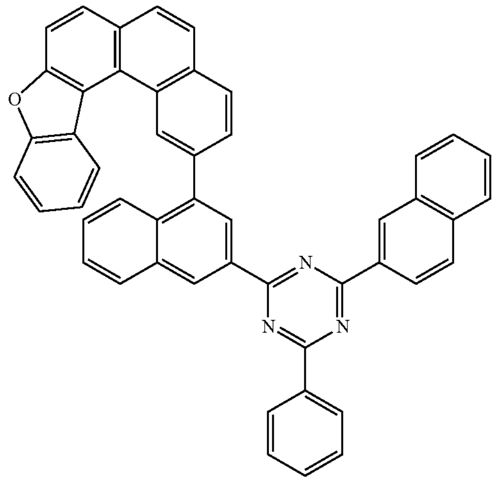
H2-256
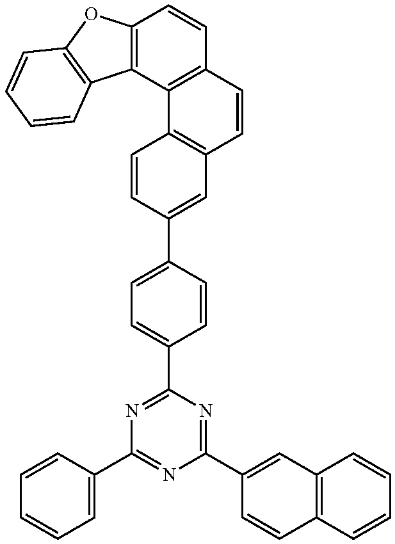
H2-257
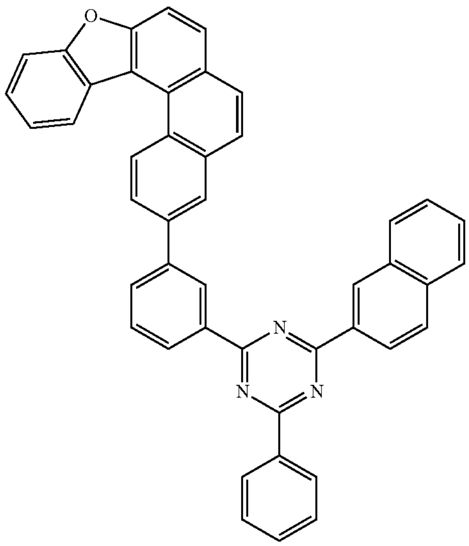
-continued
H2-258
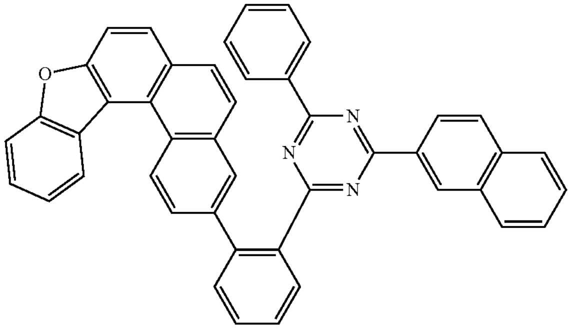
H2-259
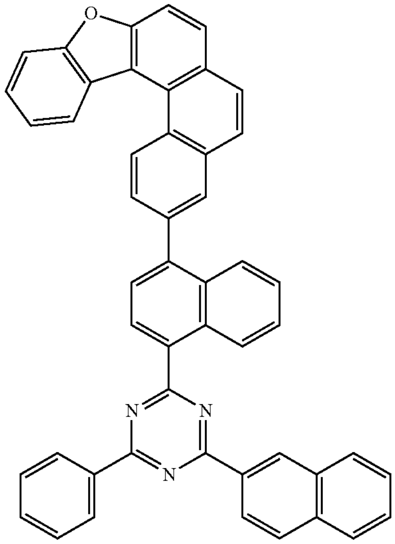
H2-260
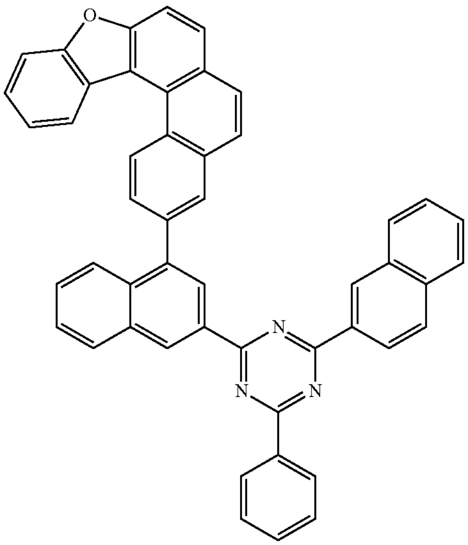

-continued
H2-261
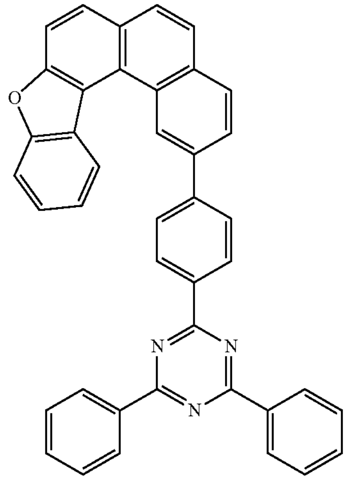
H2-262
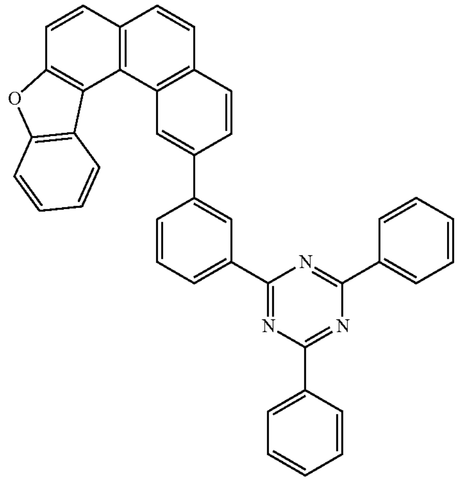
H2-263
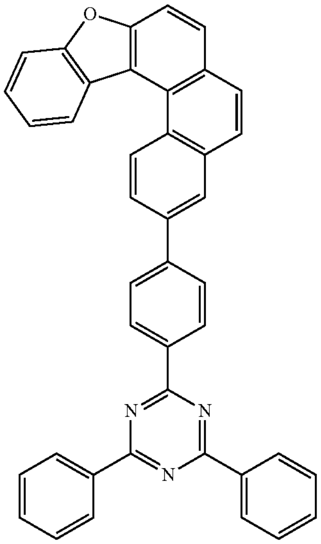
-continued
H2-264
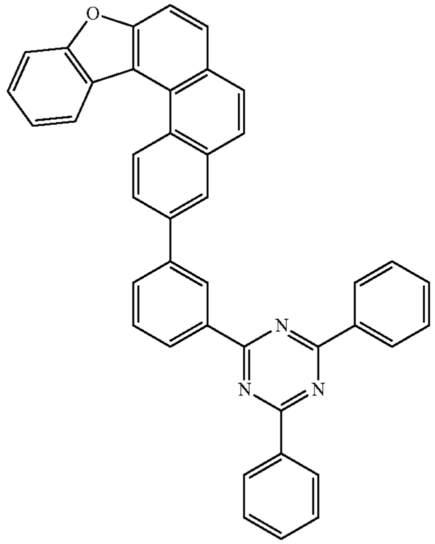
H2-265
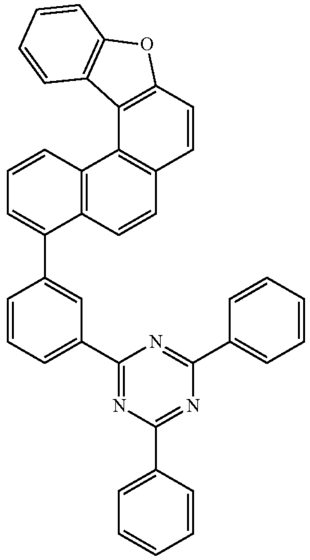
H2-266
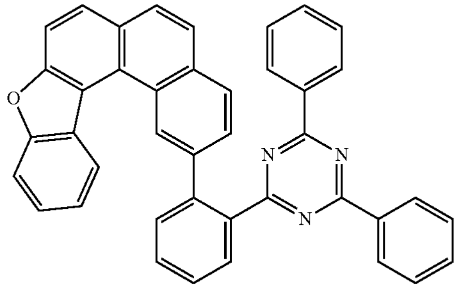

-continued
H2-267
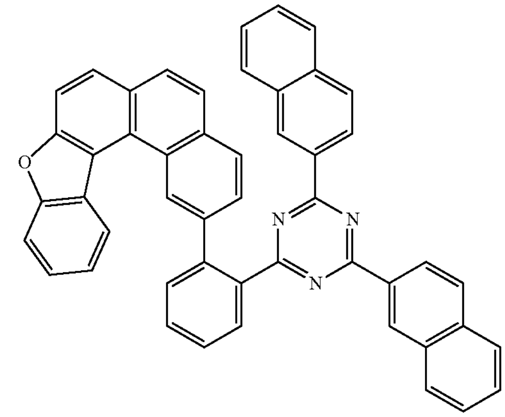
H2-268
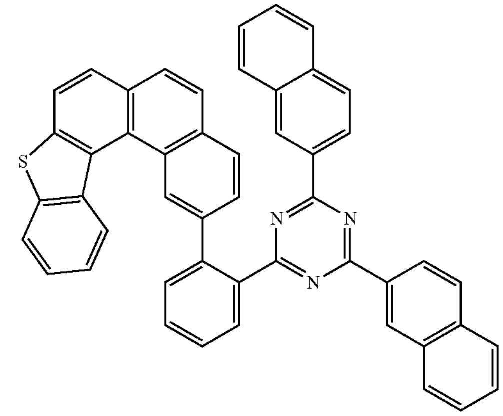
H2-269
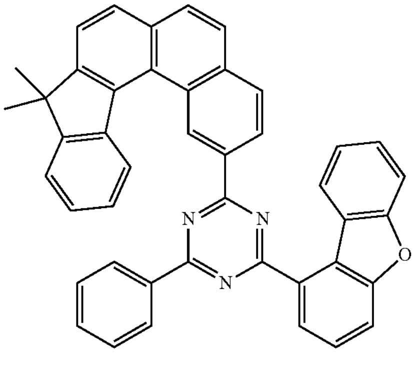
-continued
H2-270
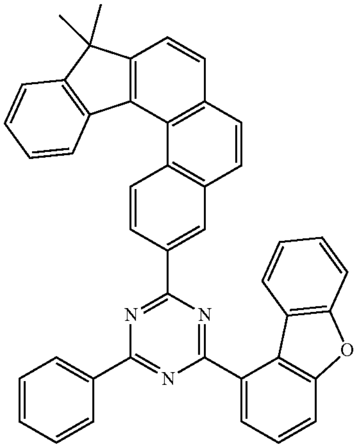
H2-271
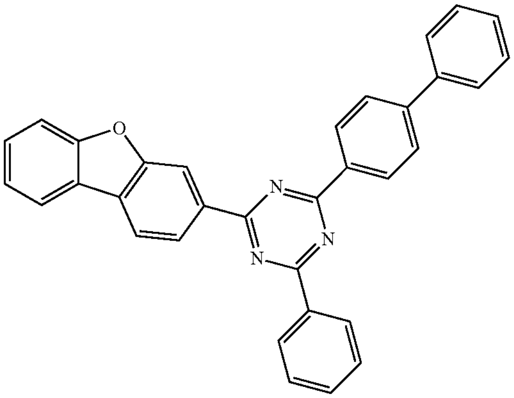
H2-272
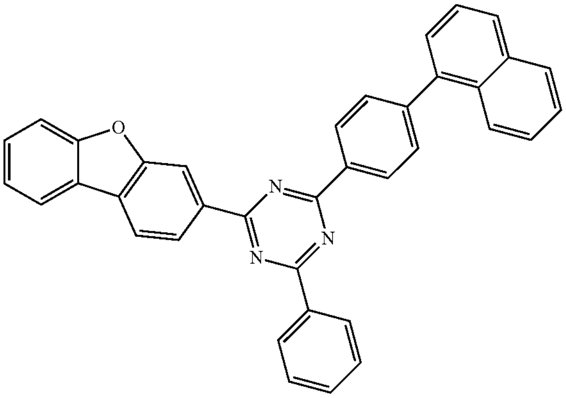

-continued
H2-273
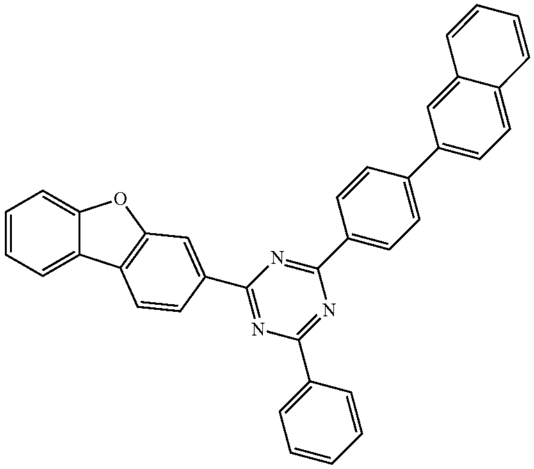
H2-274
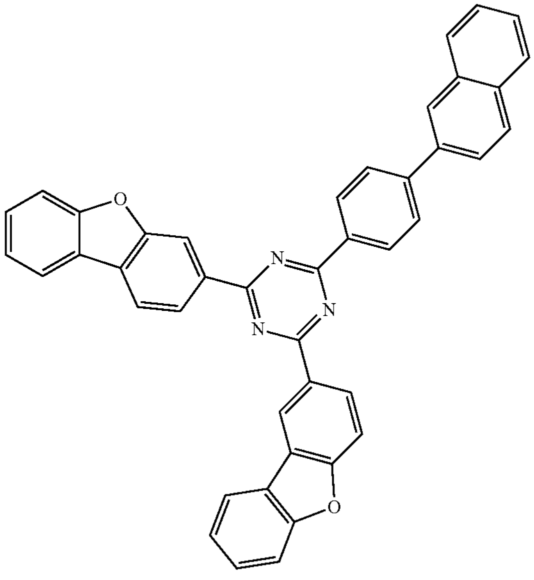
-continued
H2-275
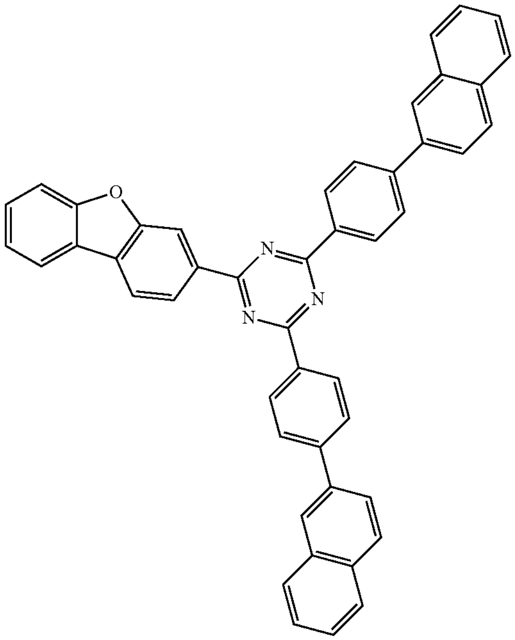
H2-276
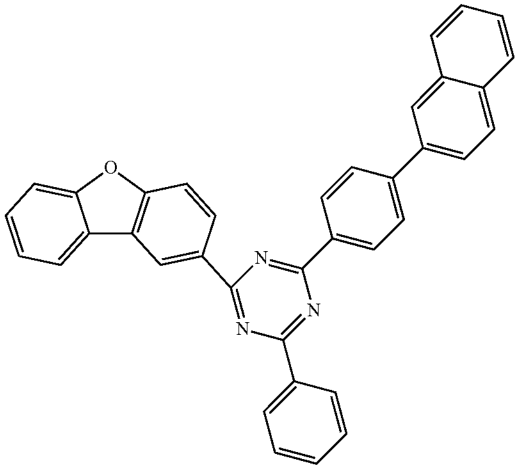
H2-277
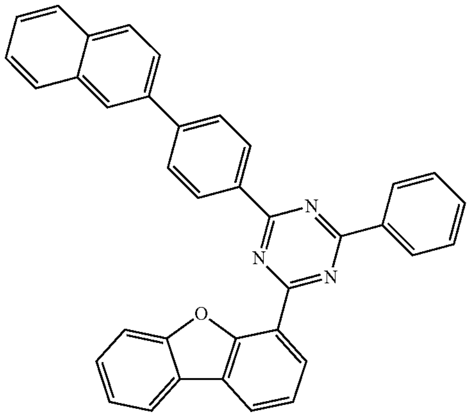

-continued
H2-278
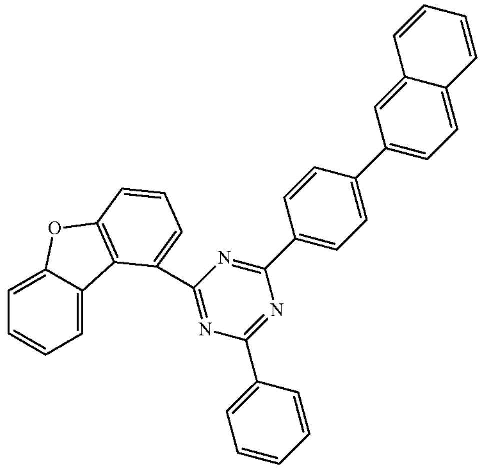
H2-279
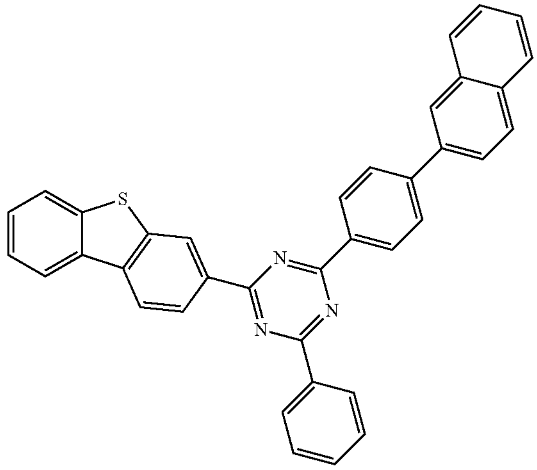
H2-280
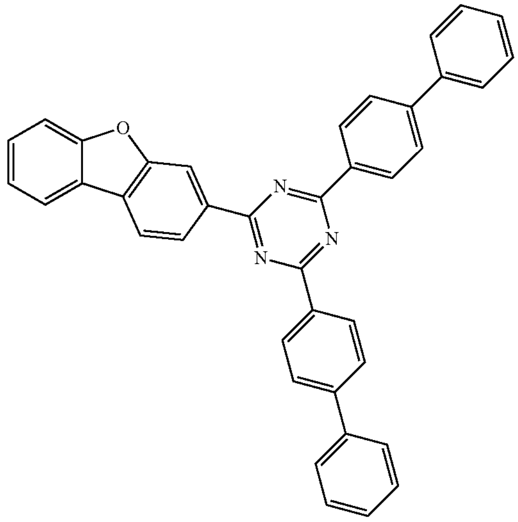
-continued
H2-281
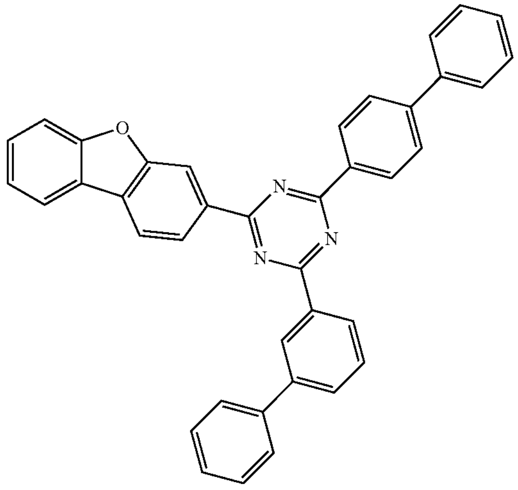
H2-282
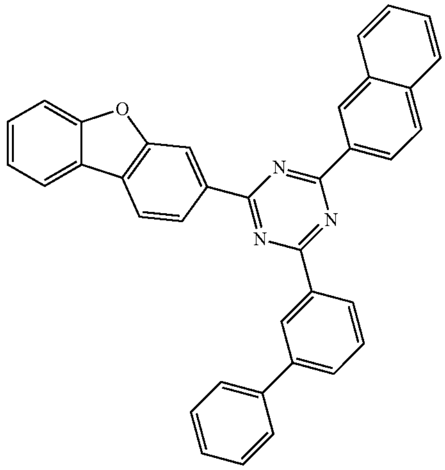
H2-283
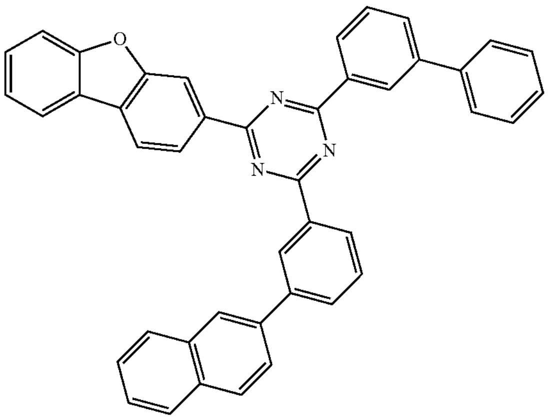

-continued
H2-284
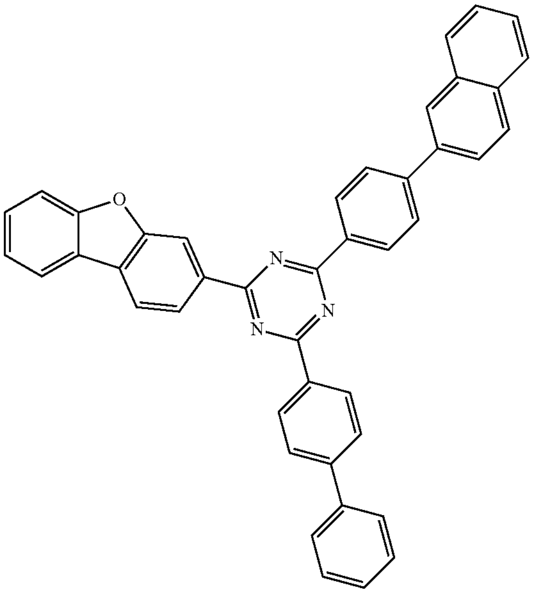
H2-285
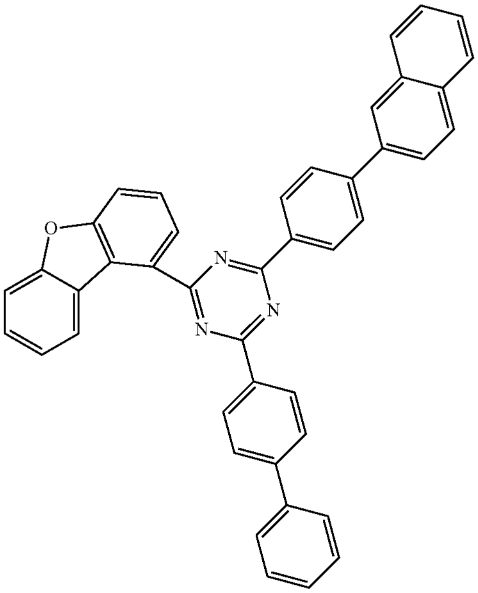
H2-286
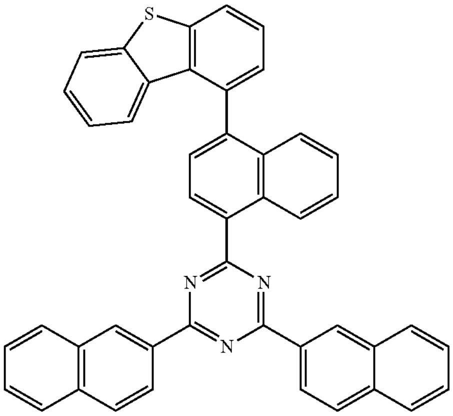
-continued
H2-287
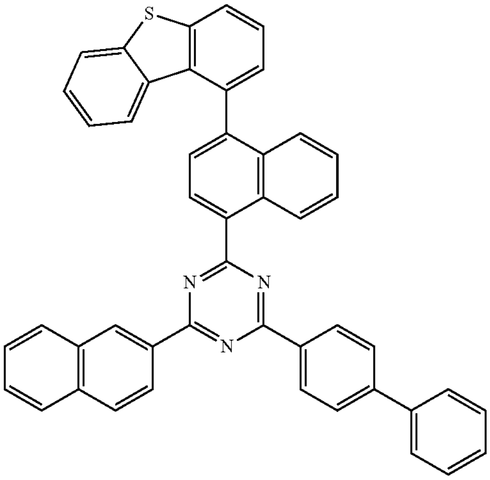
H2-288
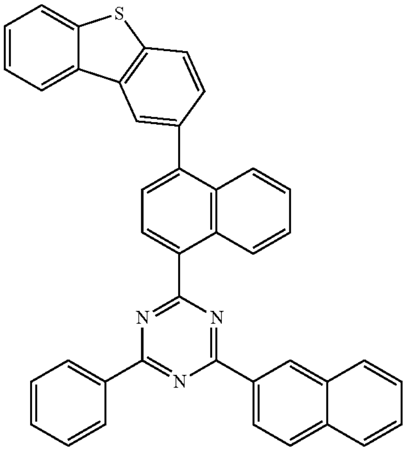
H2-289
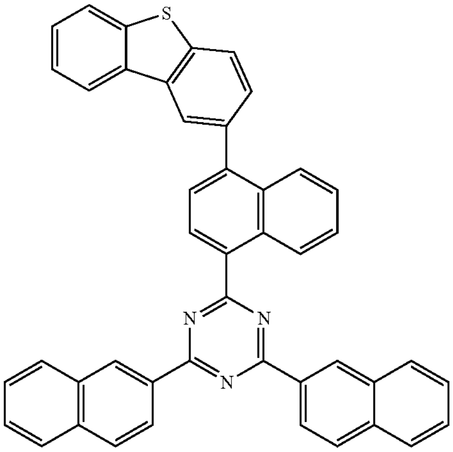

-continued
H2-290
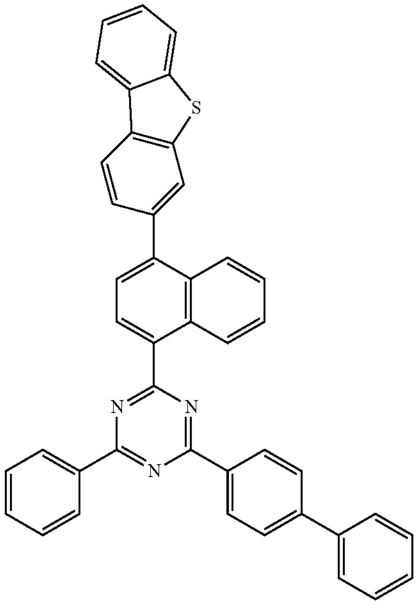
H2-291
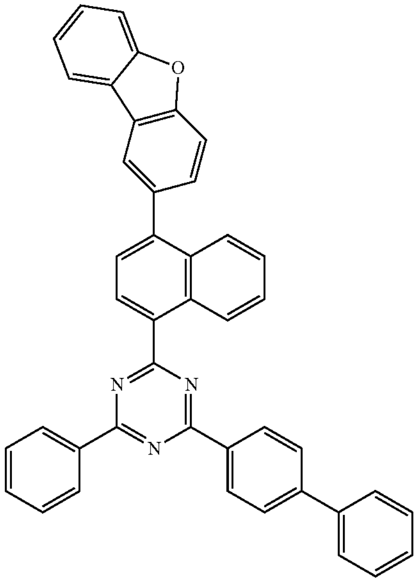
-continued
H2-292
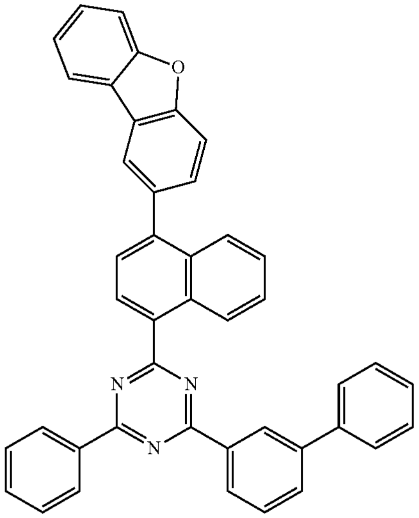
H2-293
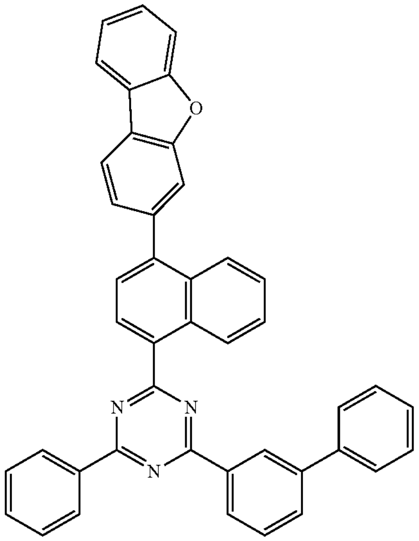
H2-294
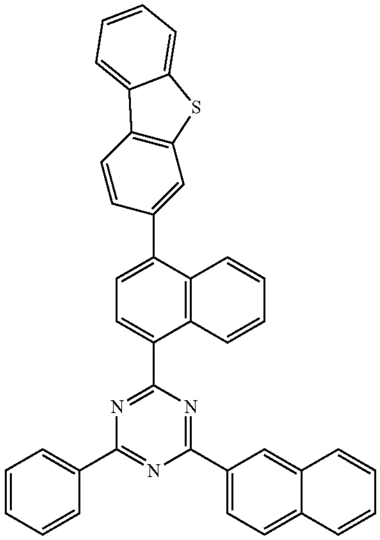

-continued

H2-295

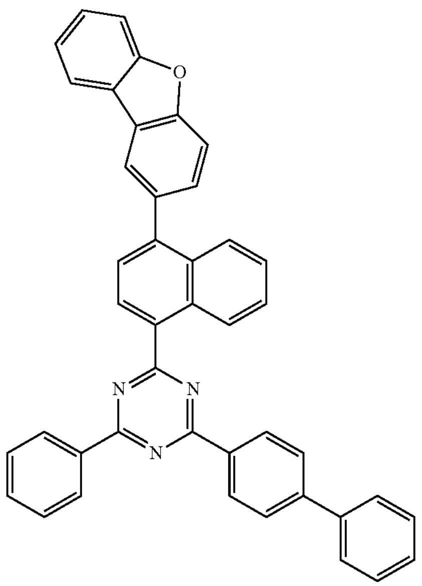

The compounds represented by formulas 1 to 4 according to the present disclosure may be prepared by referring to a synthetic method known to one skilled in the art. For example, the compounds represented by formulas 1 to 4 can be prepared by referring to Korean Patent Application Laying-Open Nos. 10-2018-0099510 (published on Sep. 5, 2018), 10-2017-0043439 (published on Apr. 21, 2017), 10-2019-0122078 (published on Oct. 29, 2019), 10-2020-0026079 (published on Mar. 10, 2020), etc., but is not limited thereto.

The light-emitting layer includes a host and a dopant, in which the host may include a plurality of host materials, and the compound represented by formula 3 may be included as the first host compound of the plurality of host materials, and the compound represented by formula 4 may be included as the second host compound of the plurality of host materials.

Herein, the weight ratio of the first host compound and the second host compound is about 1:99 to about 99:1, preferably about 10.90 to about 90:10, more preferably about 30:70 to about 70:30, even more preferably about 40:60 to about 60:40, and still more preferably about 50:50.

Herein, the light-emitting layer is a layer from which light is emitted, and may be a single layer or a multi-layer in which two or more layers are stacked. In the plurality of host materials of the present disclosure, all of the first host material and the second host material may be included in one layer, or the first host material and the second host material may be included in respective different light-emitting layers. According to one embodiment of the present disclosure, the doping concentration of the dopant compound with respect to the host compound(s) in the light-emitting layer may be less than 20 wt %, The organic electroluminescent device of the present disclosure may further comprise at least one layer selected from a hole injection layer, a hole transport layer, a hole auxiliary layer, a light-emitting auxiliary layer, an electron transport layer, an electron injection layer, an interlayer, an electron buffer layer, a hole blocking layer, and an electron blocking layer.

According to one embodiment of the present disclosure, the organic electroluminescent device of the present disclosure may further comprise an amine-based compound as at least one of a hole injection material, a hole transport material, a hole auxiliary material, a light-emitting material, a light-emitting auxiliary material, and an electron blocking material. In addition, according to one embodiment of the present disclosure, the organic electroluminescent device of the present disclosure may further comprise an azine-based compound as at least one of an electron transport material, an electron injection material, an electron buffer material, and a hole blocking material.

The host materials according to the present disclosure may be used as a light-emitting material for a white organic light-emitting device. The white organic light-emitting device has been suggested to have various structures such as a side-by-side method, or a stacking method depending on the arrangement of R (Red), G (Green) or YG (yellowish green), and B (blue) light-emitting units, or CCM (color conversion material) method, etc. In addition, the host materials according to one embodiment of the present disclosure may also be applied to the organic electroluminescent device comprising a QD (quantum dot).

Dopants comprised in the organic electroluminescent device of the present disclosure may be at least one phosphorescent or fluorescent dopant, preferably a phosphorescent dopant. The phosphorescent dopant materials applied to the organic electroluminescent device according to the present disclosure are not particularly limited, but may be a metallated complex compound(s) of a metal atom(s) selected from iridium (Ir), osmium (Os), copper (Cu), and platinum (Pt), and in some case, may be preferably an ortho-metallated complex compound(s) of a metal atom(s) selected from iridium (Ir), osmium (Os), copper (Cu), and platinum (Pt), and in some case, may be more preferably an ortho-metallated iridium complex compound(s).

The dopant comprised in the organic electroluminescent device of the present disclosure may be the compound represented by the following formula 101, but is not limited thereto.

(101)

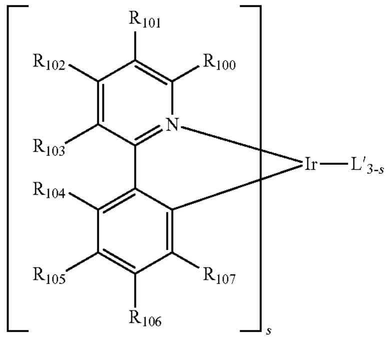

In formula 101,

L' is selected from the following structures 1 to 3:

[Structure 1]

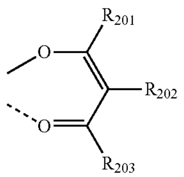

-continued

[Structure 2]

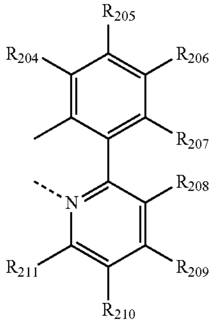

[Structure 3]

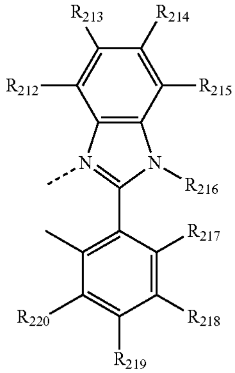

$R_{100}$ to $R_{103}$ each independently represent hydrogen, deuterium, a halogen, a (C1-C30)alkyl unsubstituted or substituted with deuterium and/or a halogen(s), a substituted or unsubstituted (03-030)cycloalkyl, a substituted or unsubstituted (C6-C30)aryl, a cyano, a substituted or unsubstituted (3- to 30-membered)heteroaryl, or a substituted or unsubstituted (C1-C30)alkoxy; or may be linked to an adjacent substituent(s) to form a ring(s), e.g., a substituted or unsubstituted quinoline, a substituted or unsubstituted isoquinoline, a substituted or unsubstituted benzofuropyridine, a substituted or unsubstituted benzothienopyridine, a substituted or unsubstituted indenopyridine, a substituted or unsubstituted benzofuroquinoline, a substituted or unsubstituted benzothienoquinoline, or a substituted or unsubstituted indenoquinoline, together with pyridine;

$R_{104}$ to $R_{107}$ each independently represent hydrogen, deuterium, a halogen, a (01-C30)alkyl unsubstituted or substituted with deuterium and/or a halogen(s), a substituted or unsubstituted (C3-C30)cycloalkyl, a substituted or unsubstituted (C6-C30)aryl, a substituted or unsubstituted (3- to 30-membered)heteroaryl, a cyano, or a substituted or unsubstituted (C1-C30)alkoxy; or may be linked to an adjacent substituent(s) to form a ring(s), e.g., a substituted or unsubstituted naphthalene, a substituted or unsubstituted fluorene, a substituted or unsubstituted dibenzothiophene, a substituted or unsubstituted dibenzofuran, a substituted or unsubstituted indenopyridine, a substituted or unsubstituted benzofuropyridine, or a substituted or unsubstituted benzothienopyridine, together with benzene;

$R_{201}$ to $R_{220}$ each independently represent hydrogen, deuterium, a halogen, a (C1-C30)alkyl unsubstituted or substituted with deuterium and/or a halogen(s), a substituted or unsubstituted (C3-C30)cycloalkyl, or a substituted or unsubstituted (C6-C30)aryl; or may be linked to an adjacent substituent(s) to form a ring(s); and s represents an integer of 1 to 3.

The specific examples of the dopant compound are as follows, but are not limited thereto.

D-1

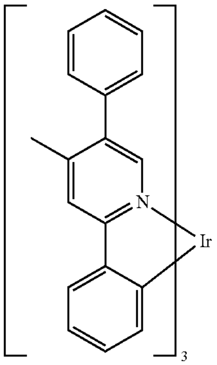

D-2

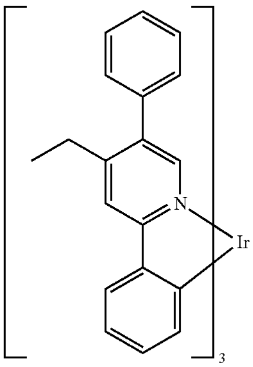

D-3

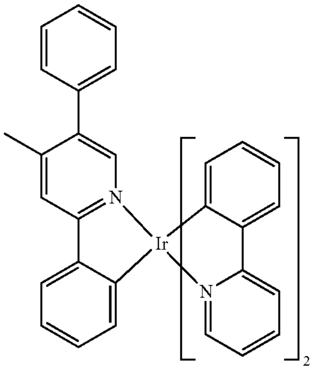

D-4

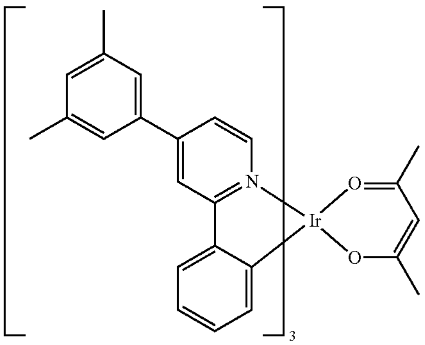

-continued
D-5
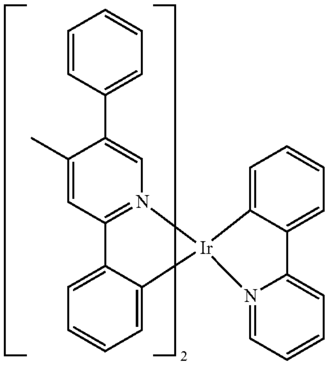
D-6
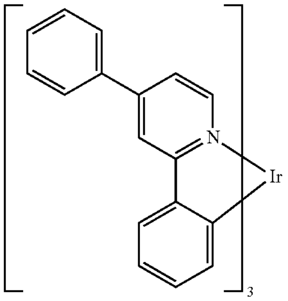
D-7
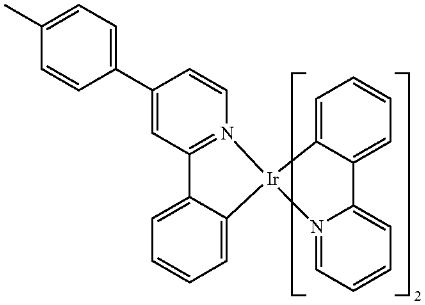
D-8
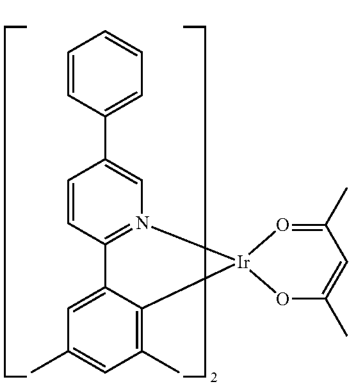
-continued
D-9
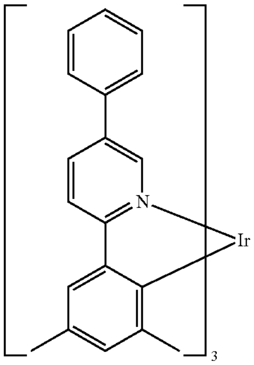
D-10
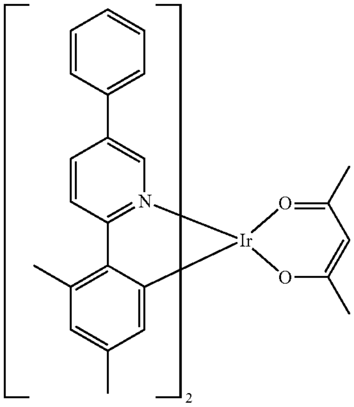
D-11
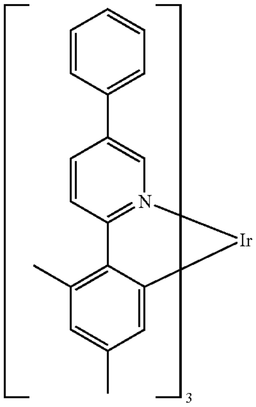
D-12
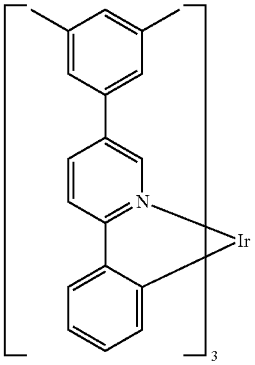

-continued
D-13
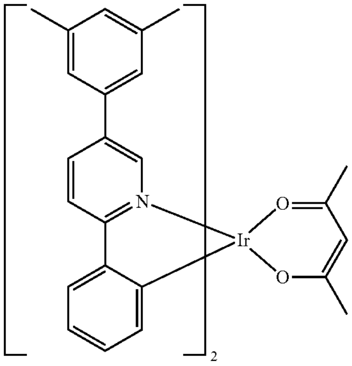
D-14
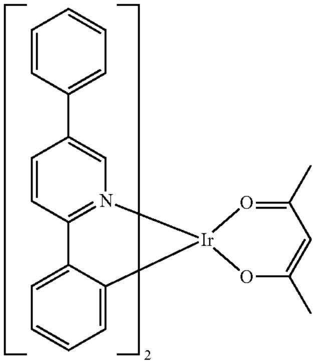
D-15
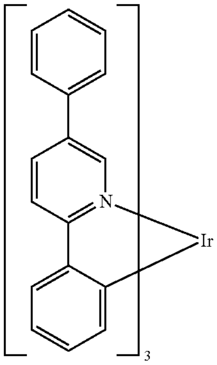
D-16
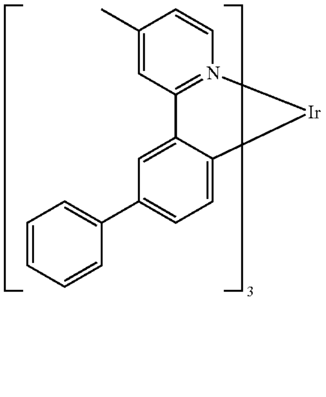
-continued
D-17
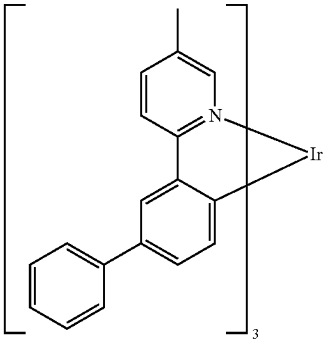
D-18
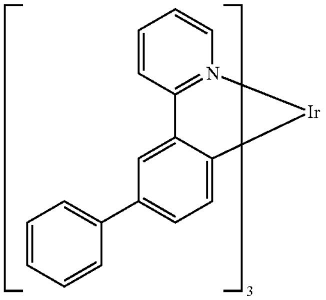
D-19
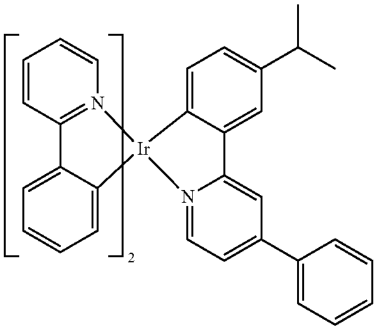
D-20
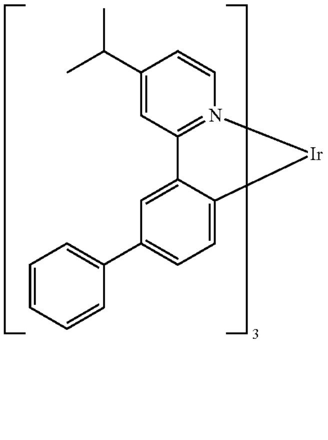

-continued
D-21
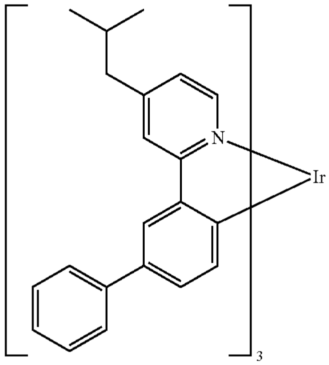
D-22
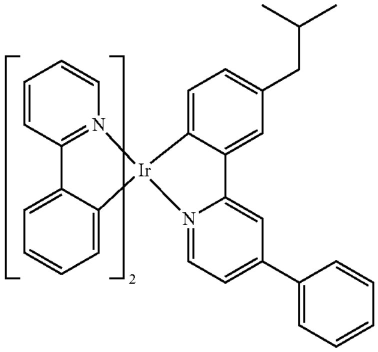
D-23
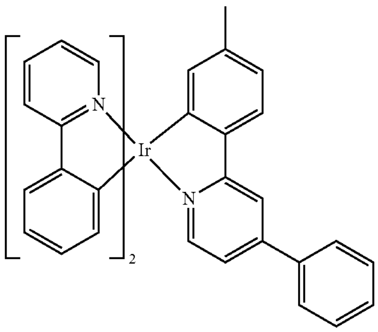
D-24
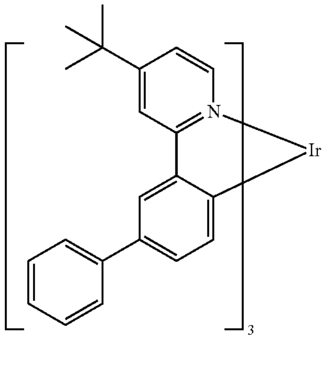
-continued
D-25
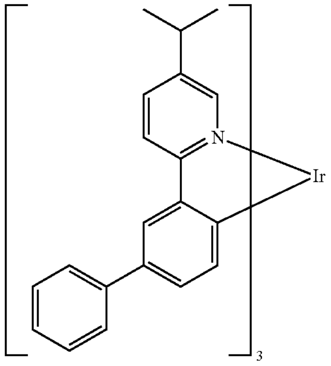
D-26
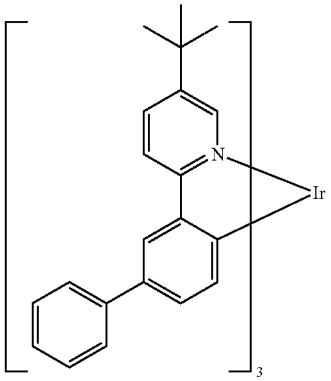
D-27
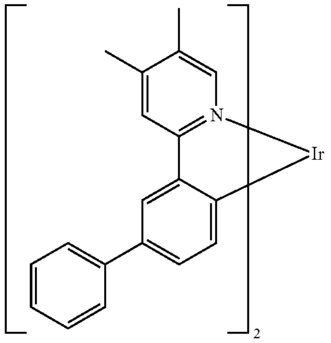
D-28
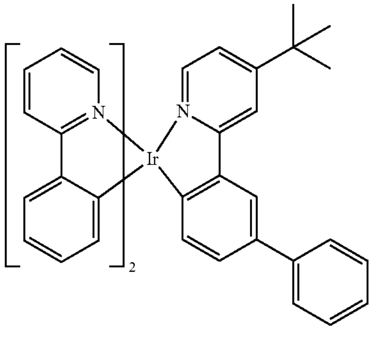

-continued
D-29
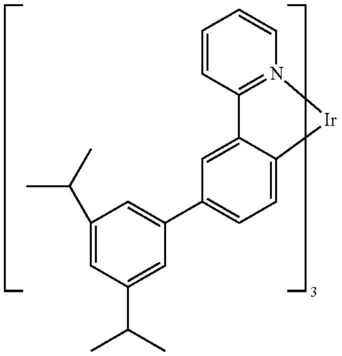
D-30
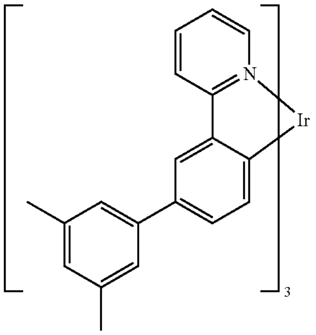
D-31
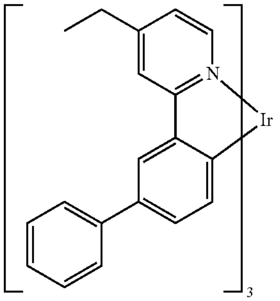
D-32
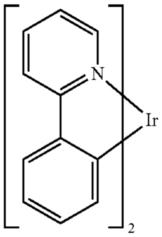
D-33
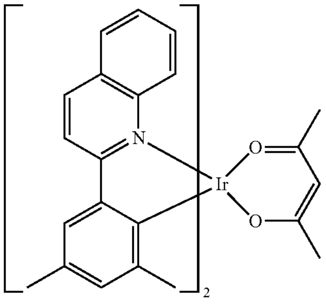
-continued
D-34
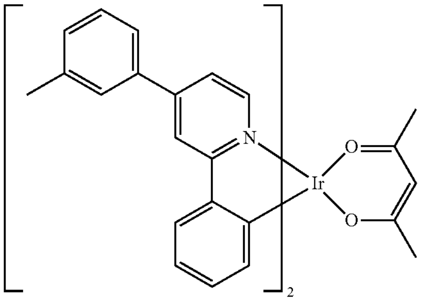
D-35
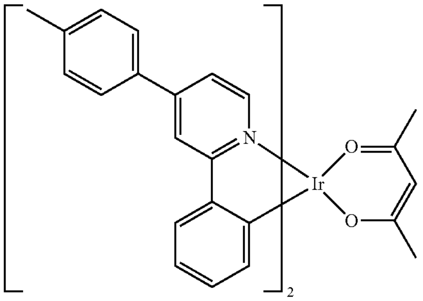
D-36
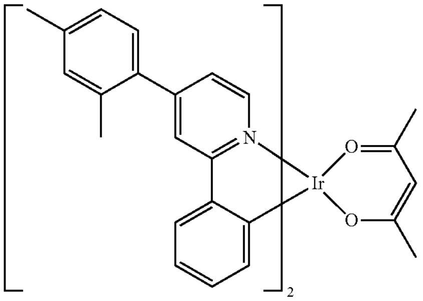
D-37
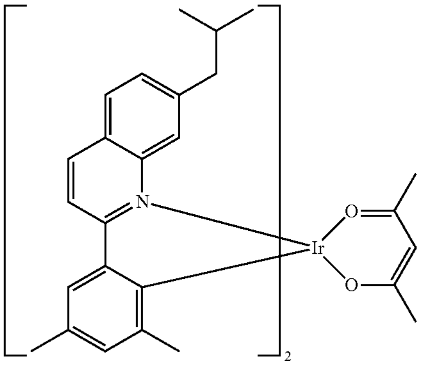
D-38
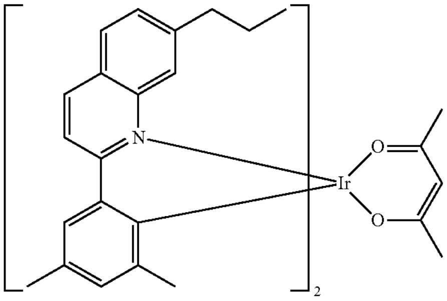

-continued
D-39
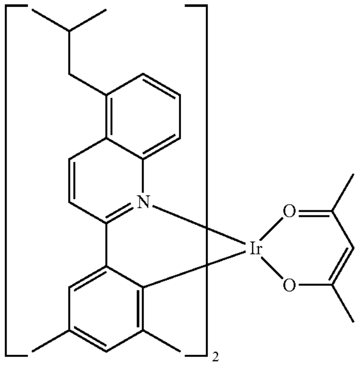
D-40
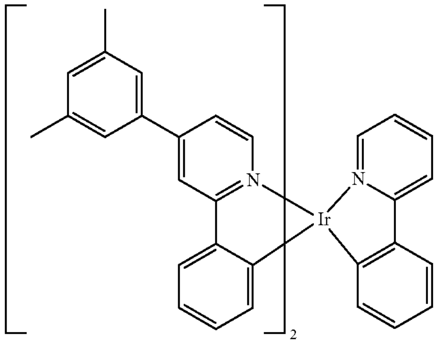
D-41
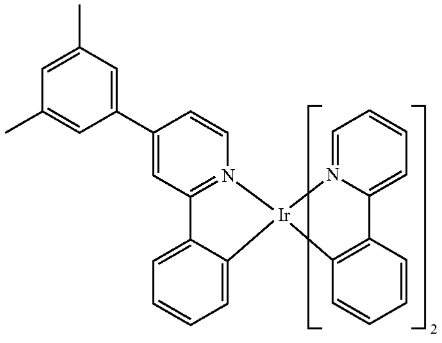
D-42
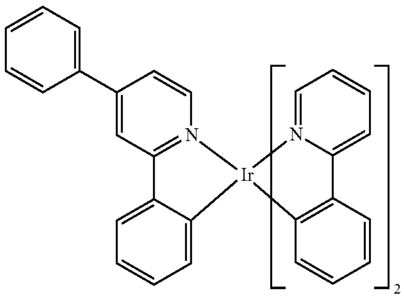
-continued
D-43
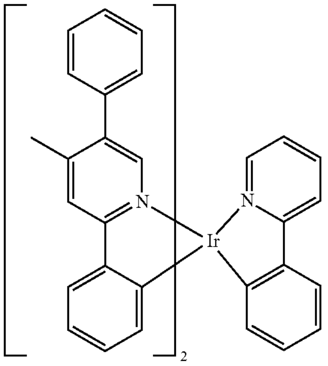
D-44
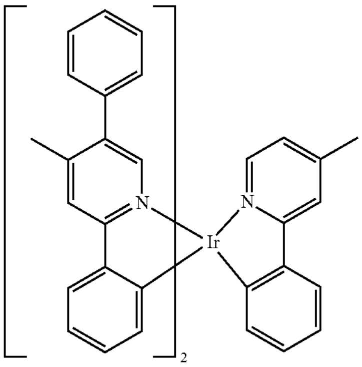
D-45
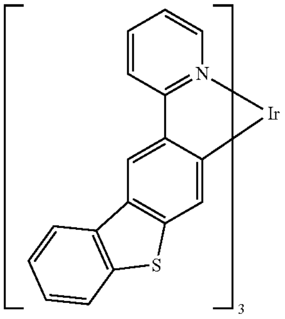
D-46
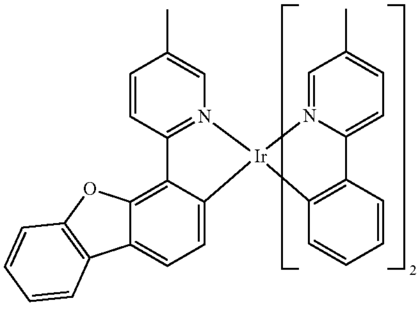

-continued
D-47
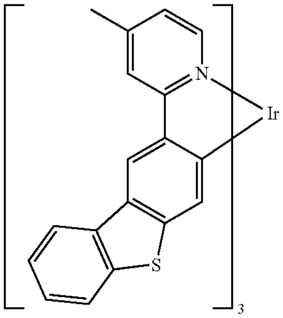
D-48
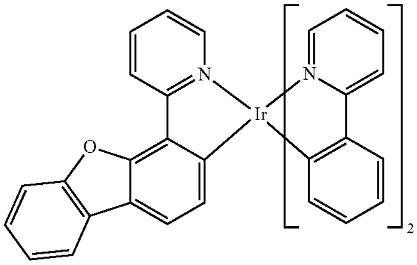
D-49
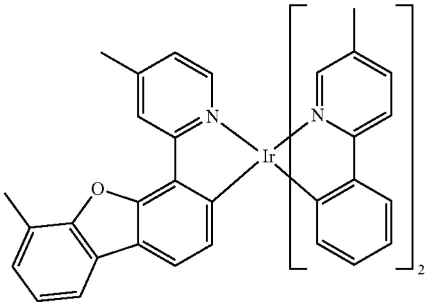
D-50
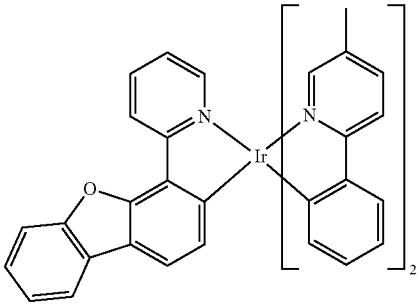
D-51
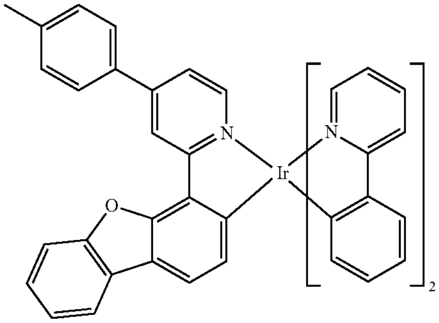
-continued
D-52
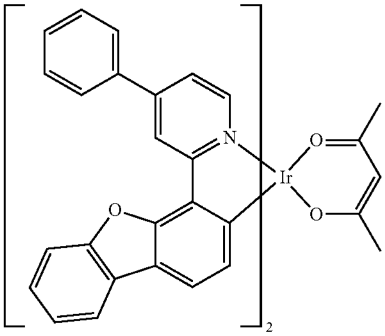
D-53
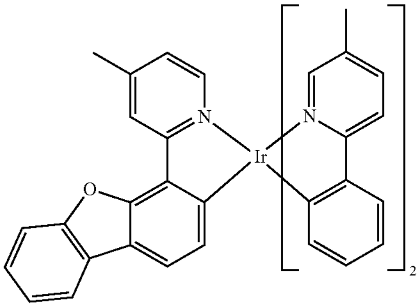
D-54
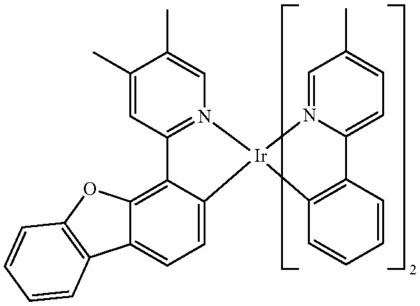
D-55
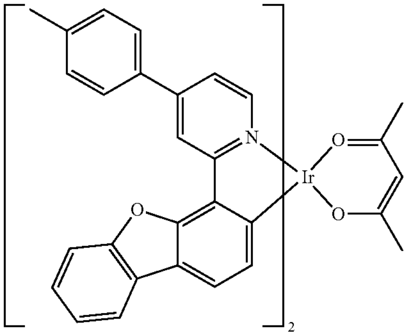
D-56
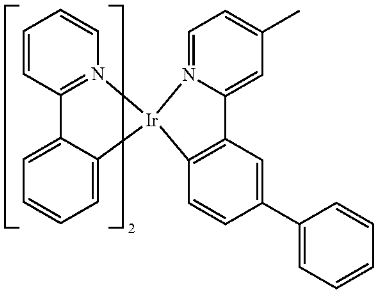

-continued
D-57
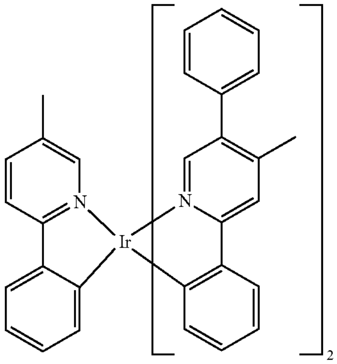
D-58
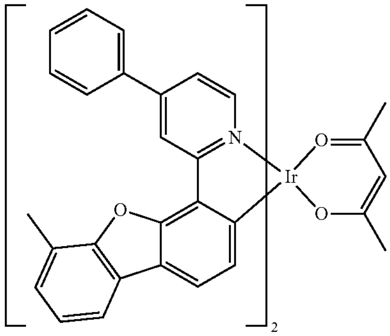
D-59
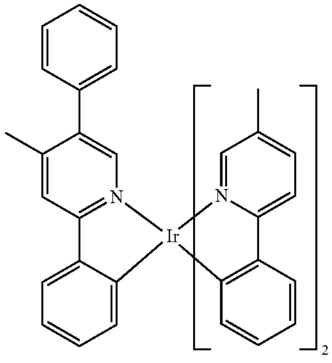
D-60
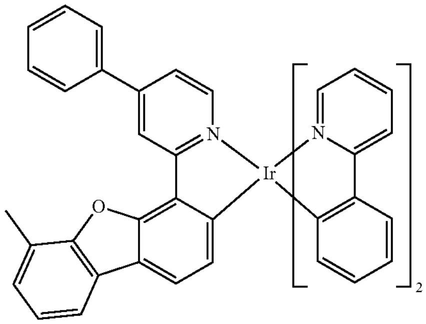
-continued
D-61
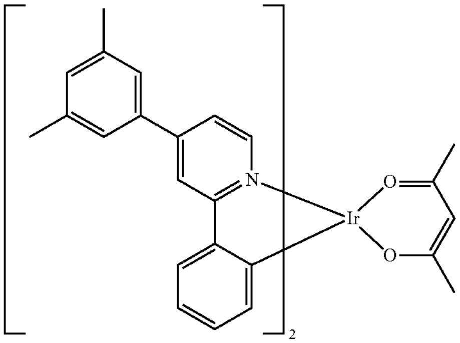
D-62
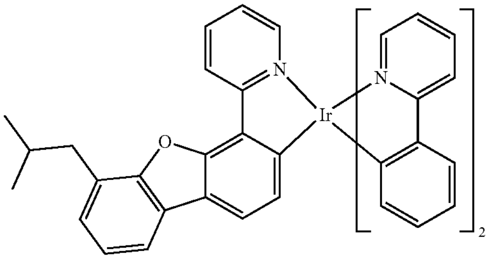
D-63
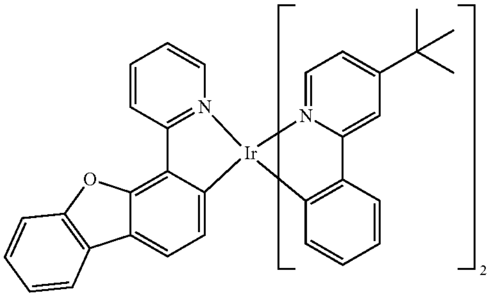
D-64
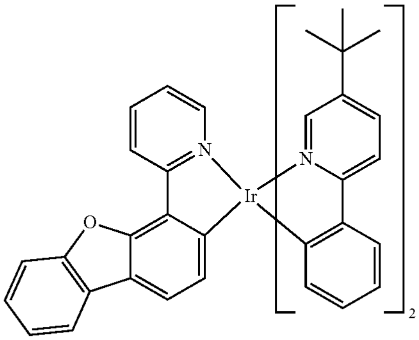
D-65
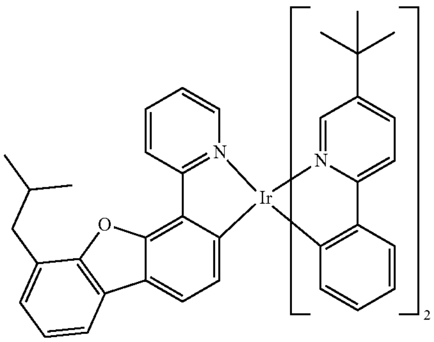

D-66
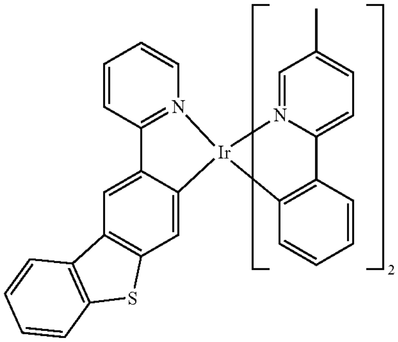
D-67
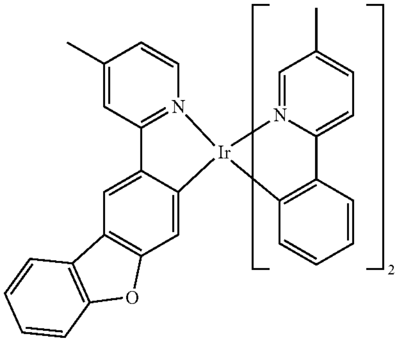
D-68
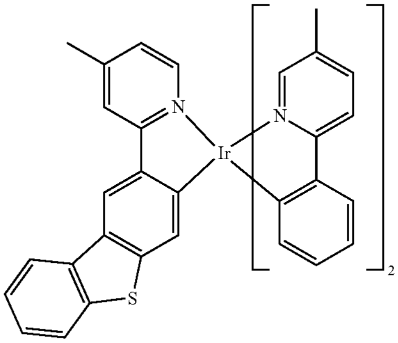
D-69
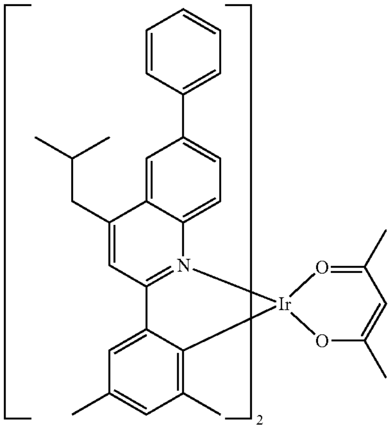
D-70
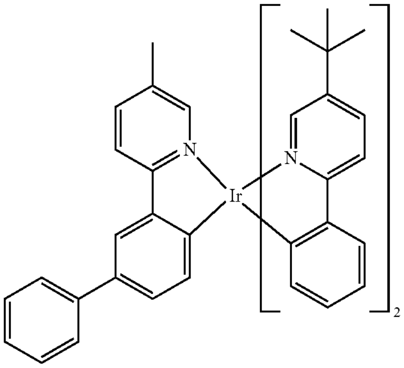
D-71
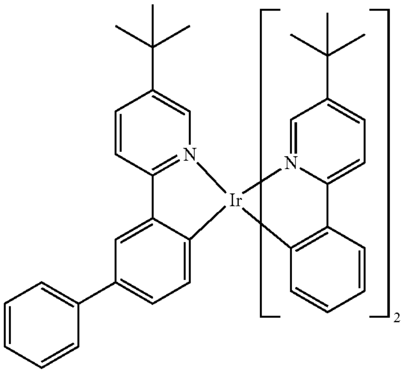
D-72
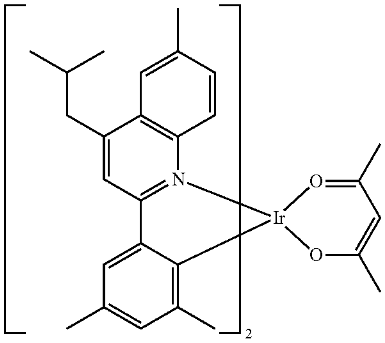
D-73
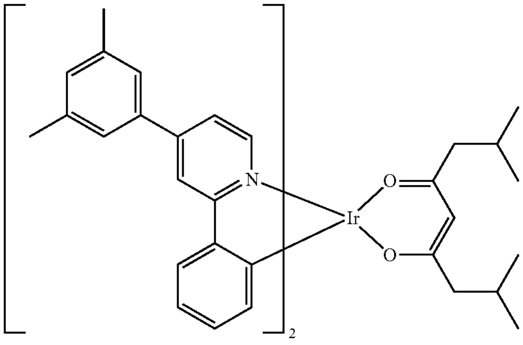

-continued
D-74
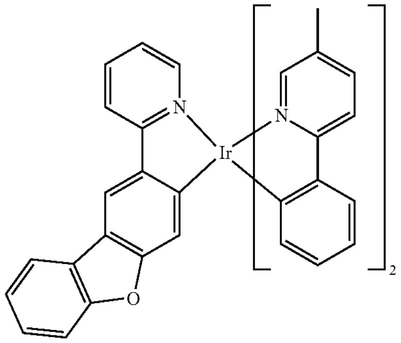
D-75
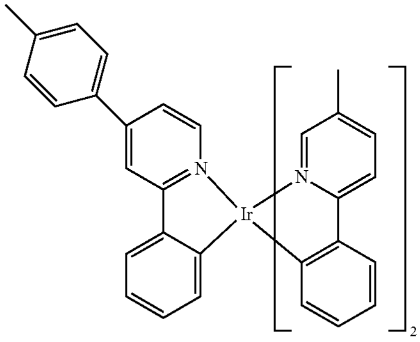
D-76
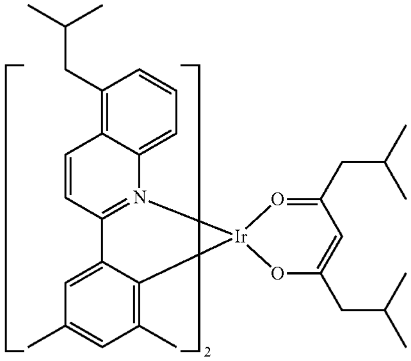
D-77
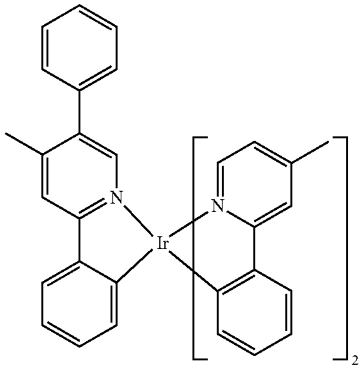
-continued
D-78
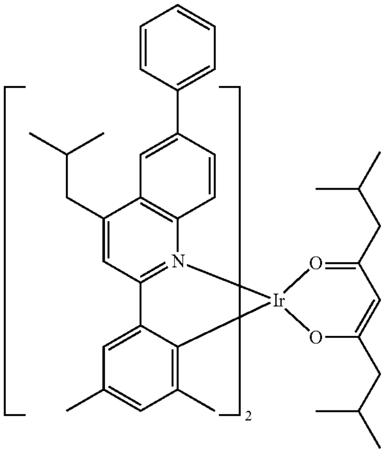
D-79
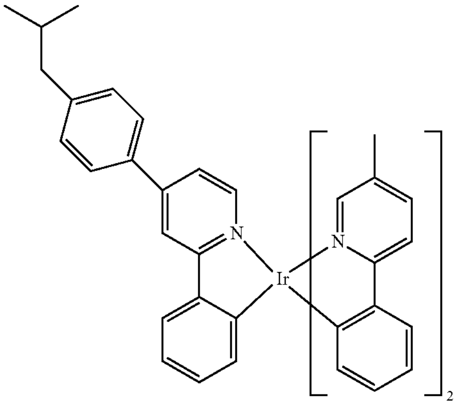
D-80
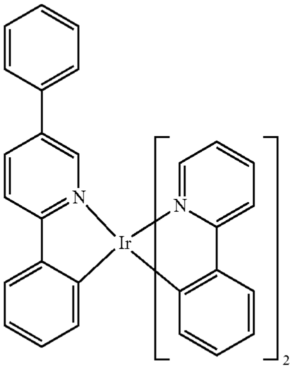

-continued
D-81
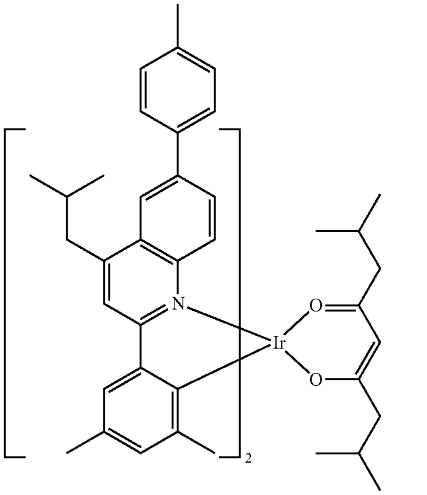
D-82
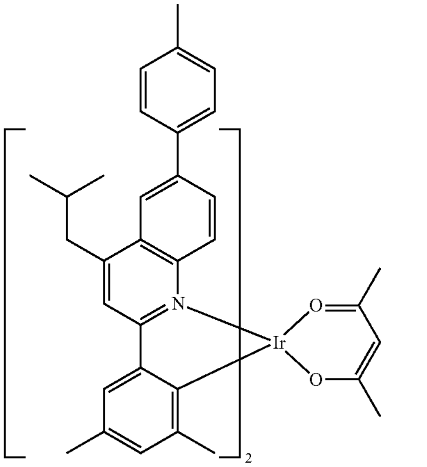
D-83
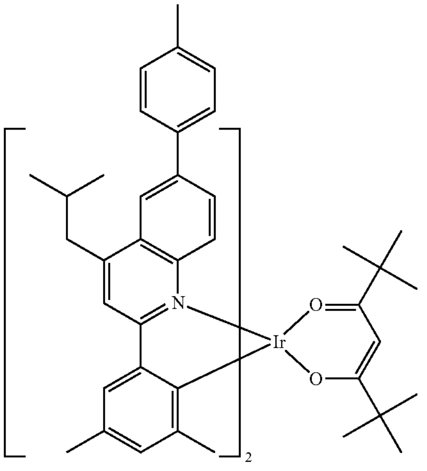
-continued
D-84
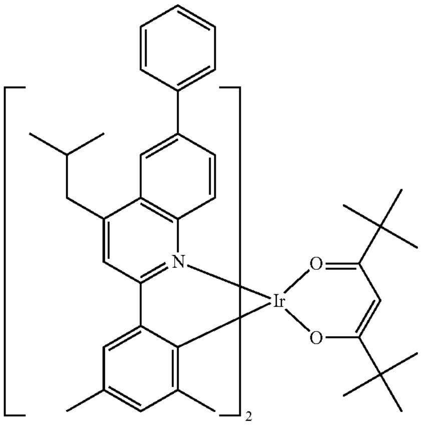
D-85
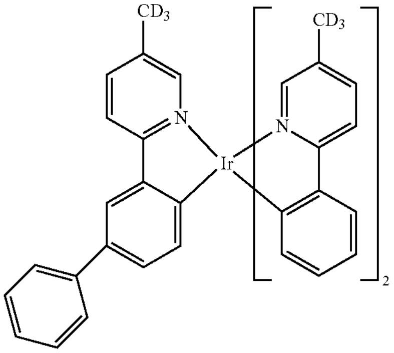
D-86
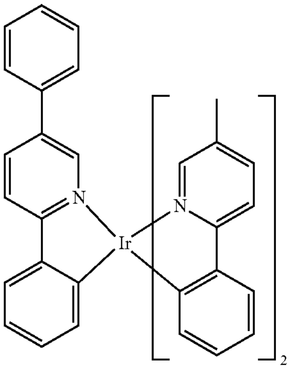
D-87
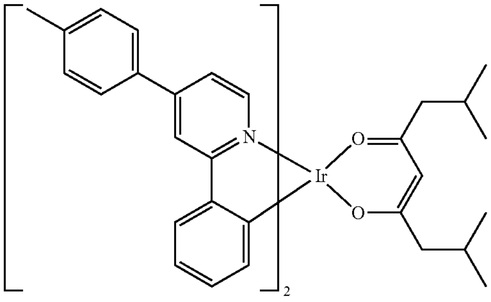

-continued
D-88
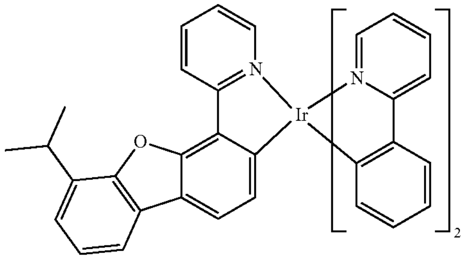
D-89
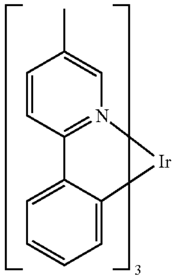
D-90
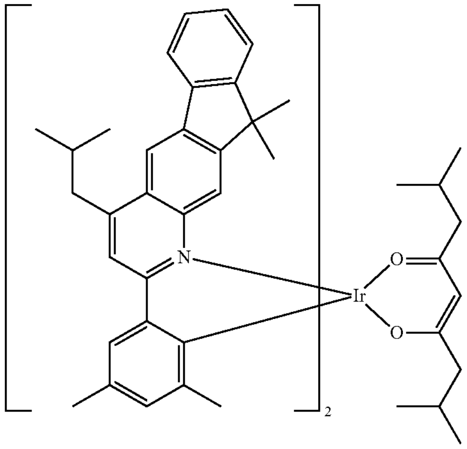
D-91
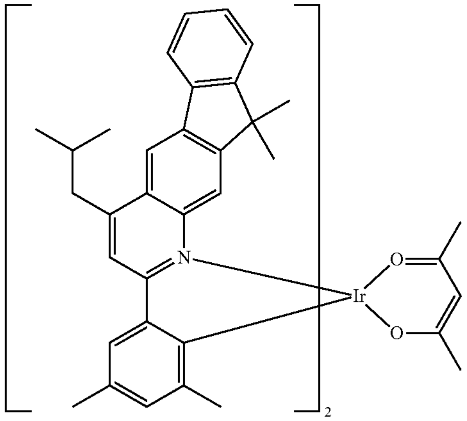
-continued
D-92
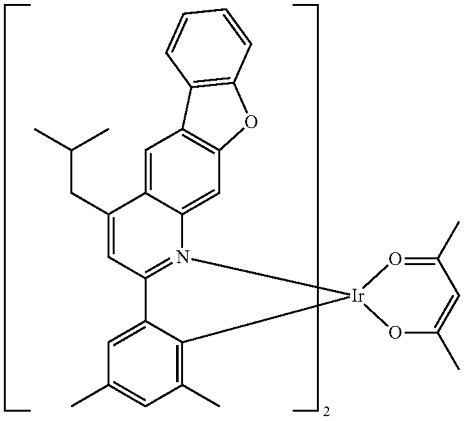
D-93
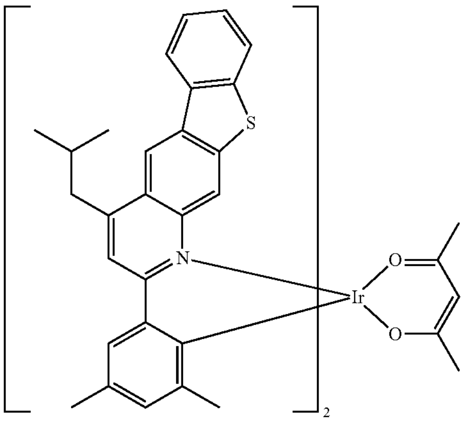
D-94
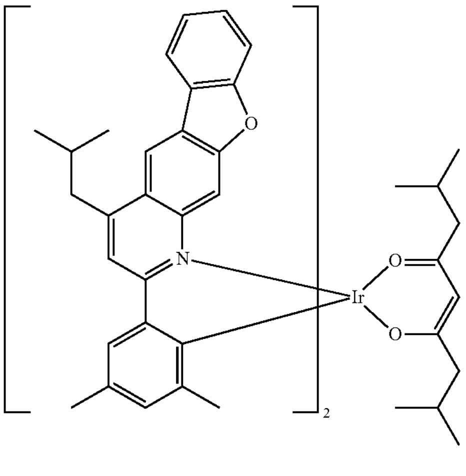

-continued
D-95
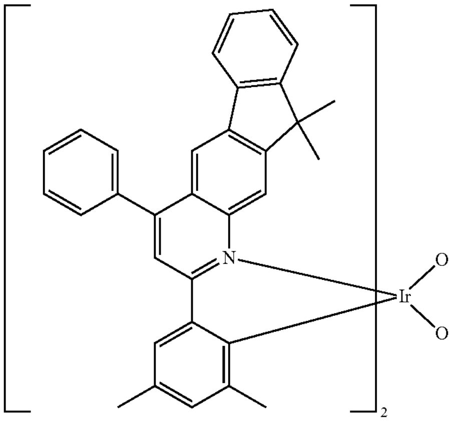
D-96
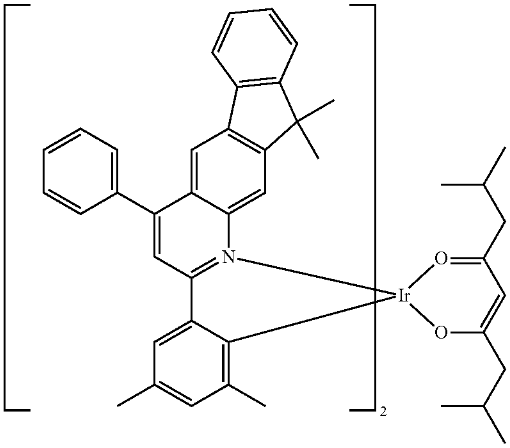
D-97
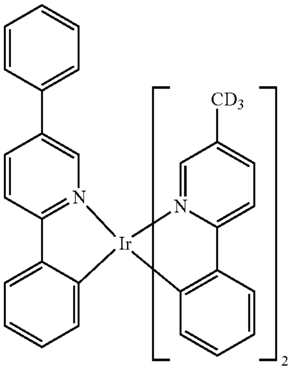
D-98
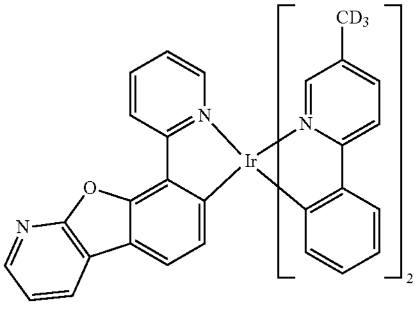
-continued
D-99
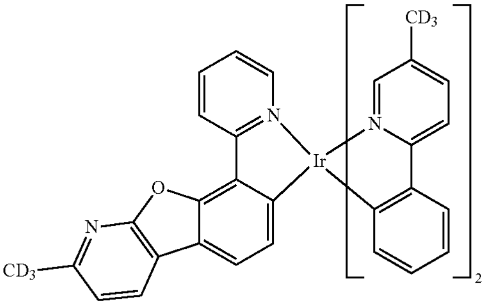
D-100
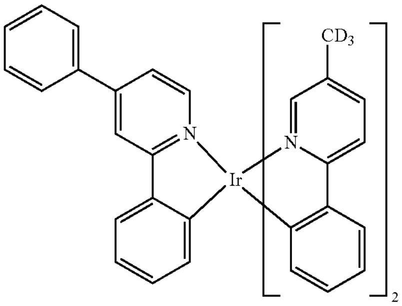
D-101
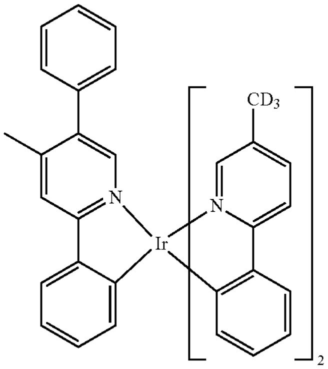
D-102
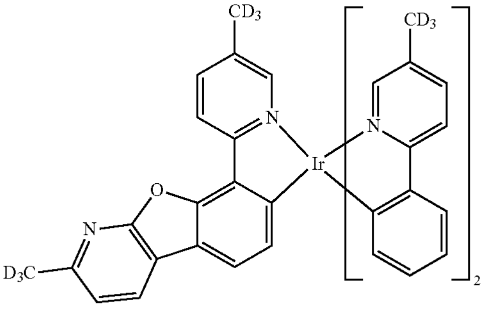

-continued
D-103
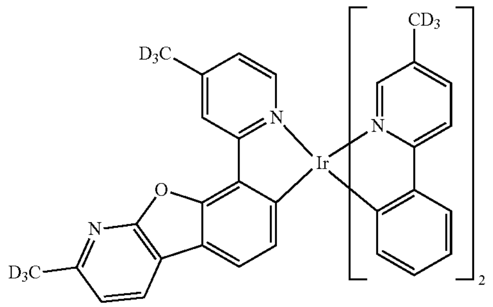
D-104
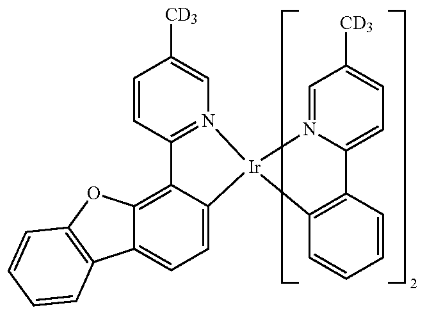
D-105
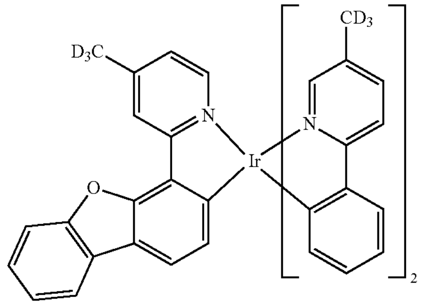
D-106
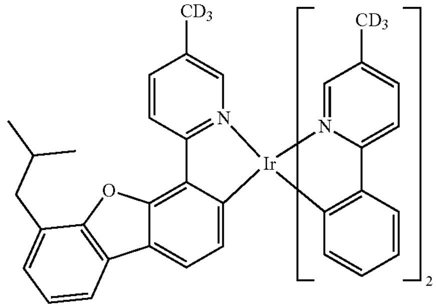
D-107
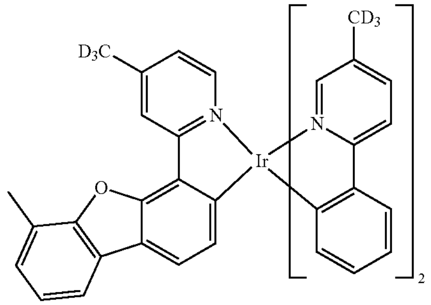
-continued
D-108
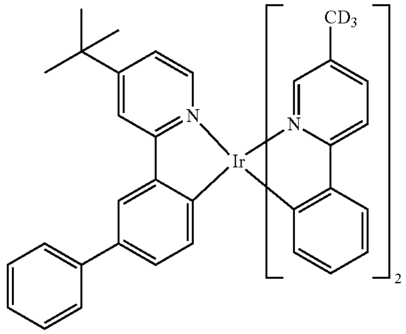
D-109
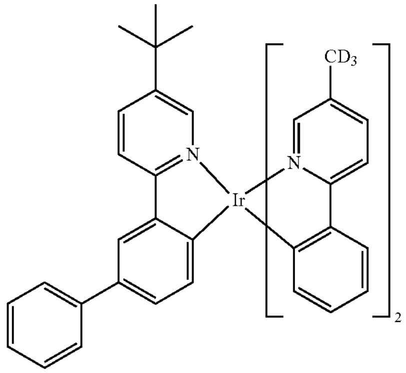
D-110
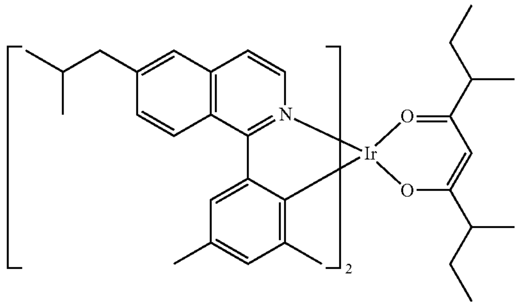
D-111
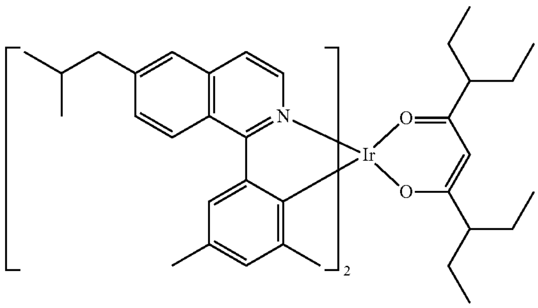

-continued
D-112
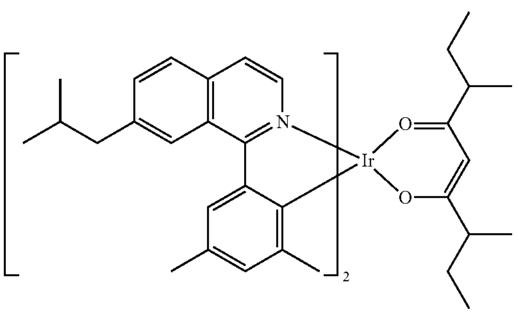
D-113
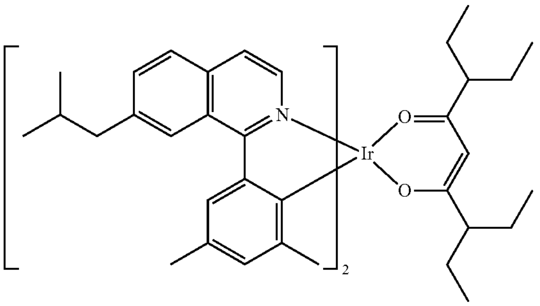
D-114
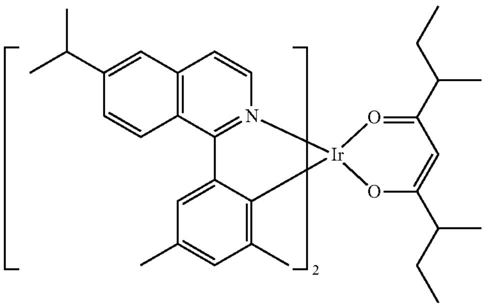
D-115
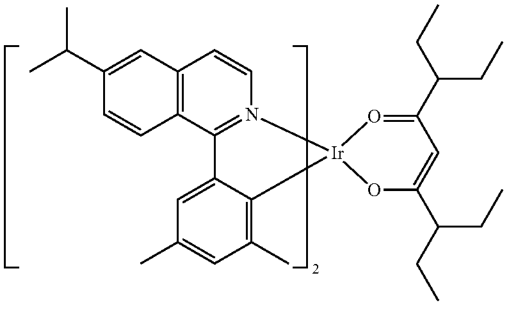
-continued
D-116
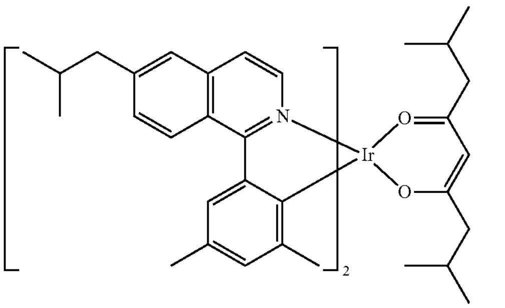
D-117
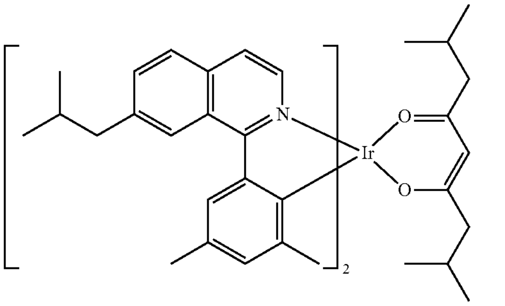
D-118
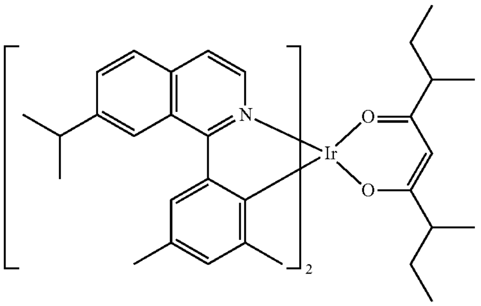
D-119
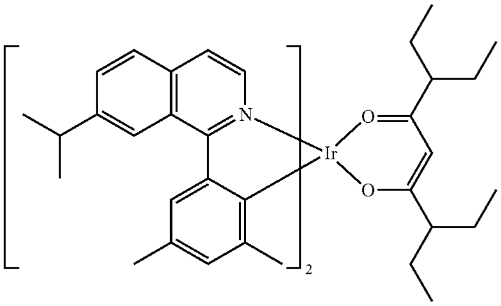

-continued
D-120
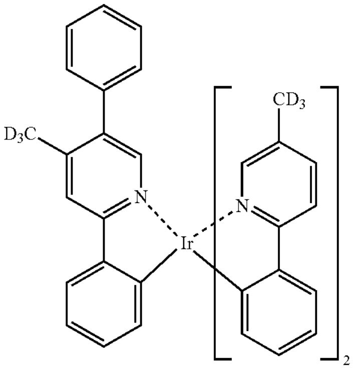
D-121
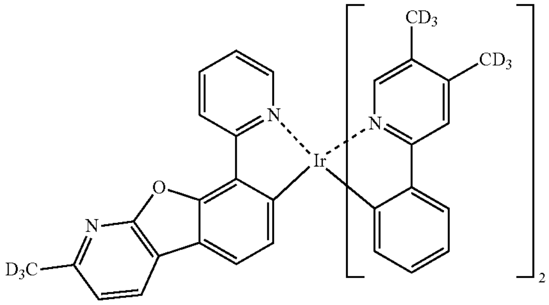
D-122
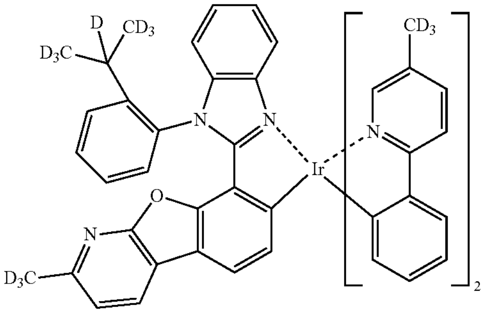
D-123
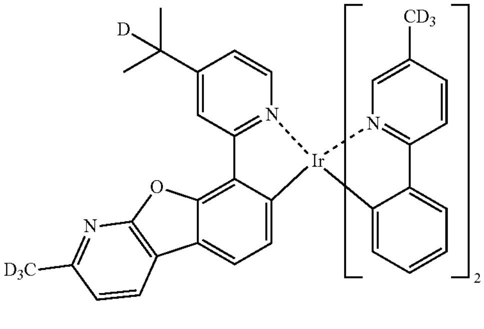
-continued
D-124
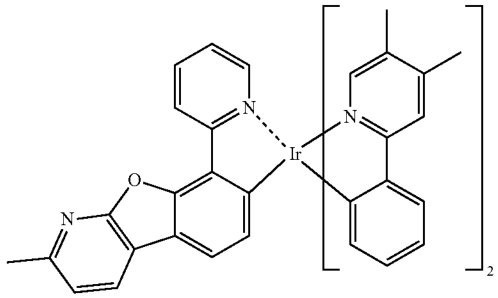
D-125
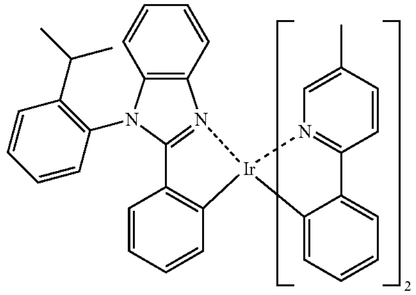
D-126
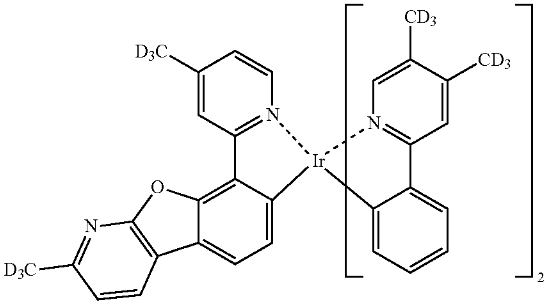
D-127
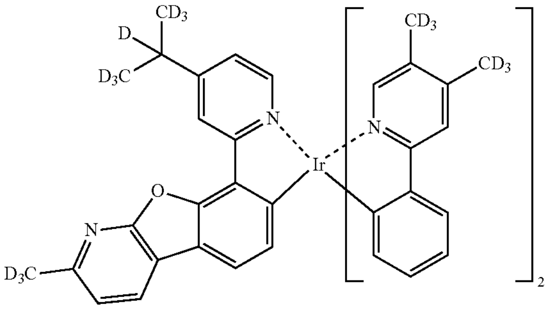
D-128
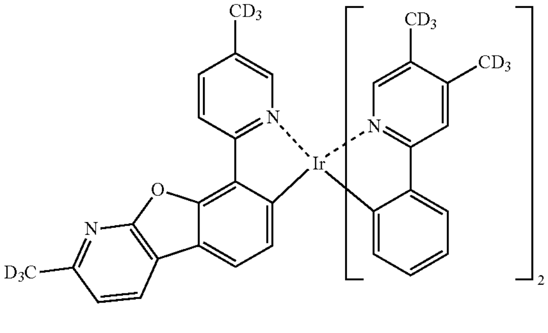

-continued
D-129
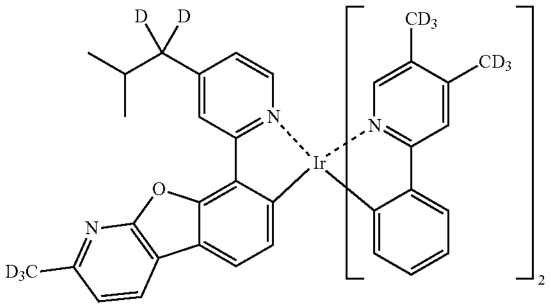
D-130
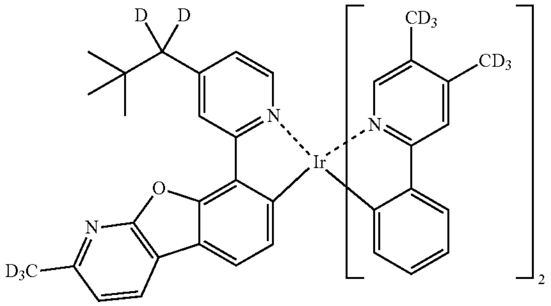
D-131
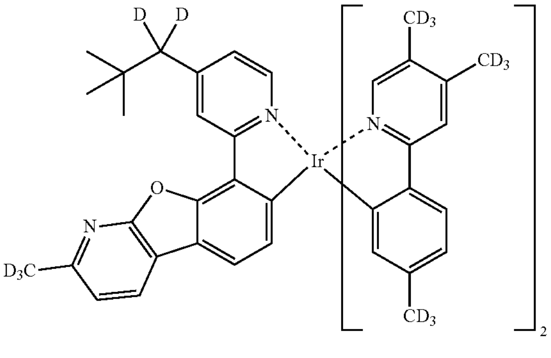
D-132
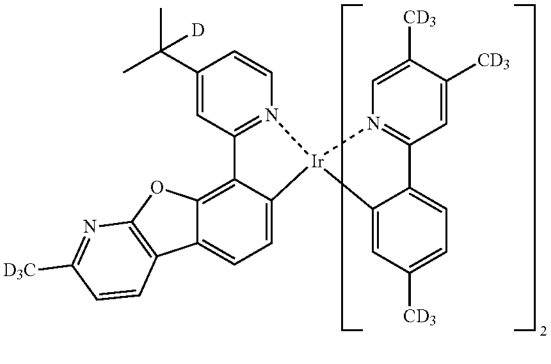
-continued
D-133
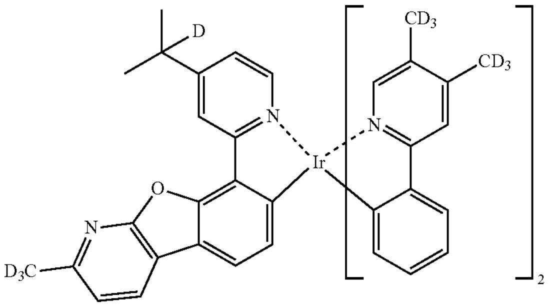
D-134
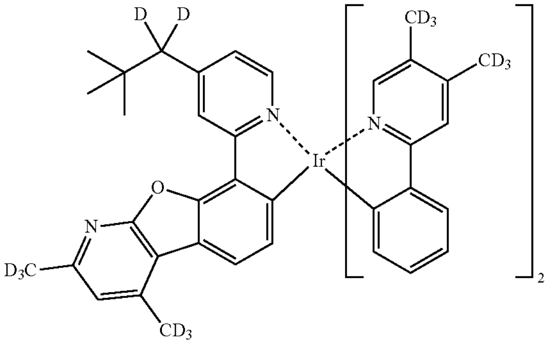
D-135
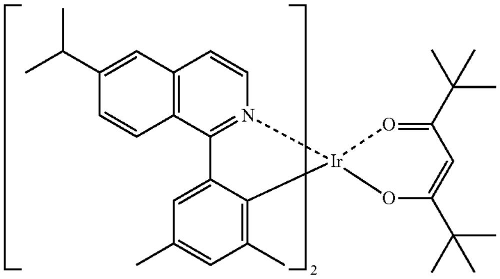
D-136
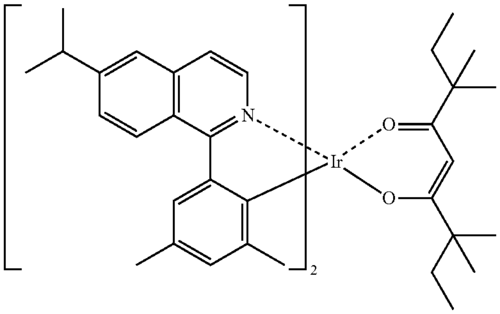

-continued
D-137
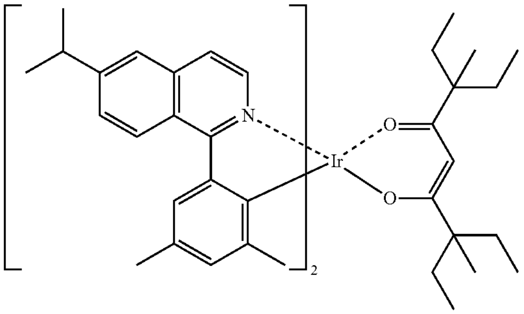
D-138
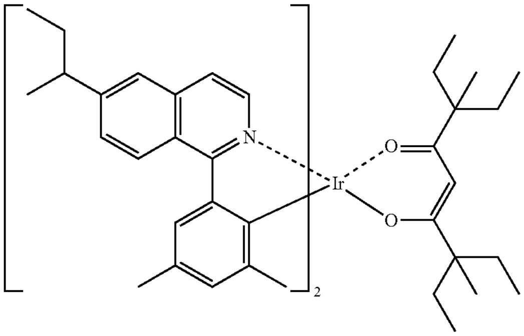
D-139
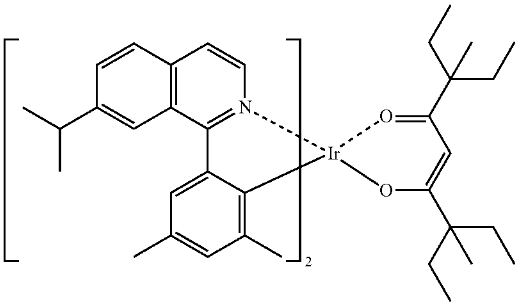
D-140
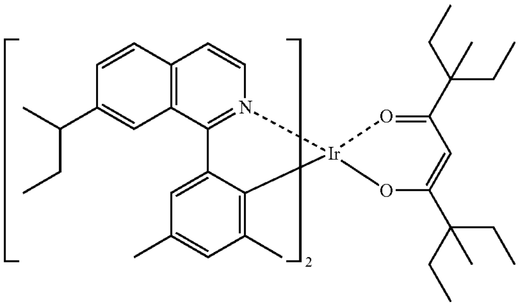
-continued
D-141
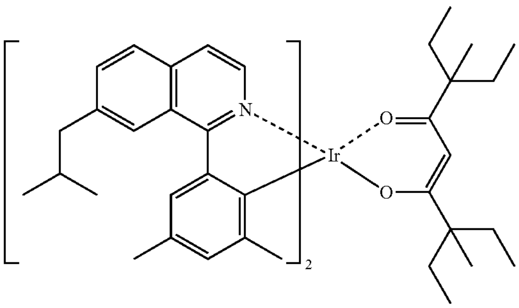
D-142
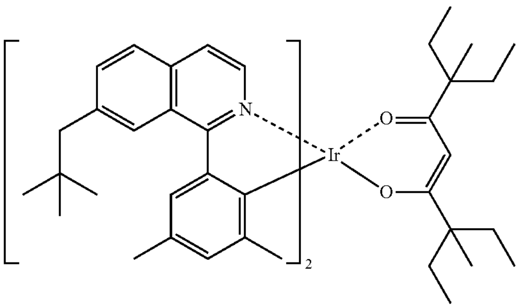
D-143
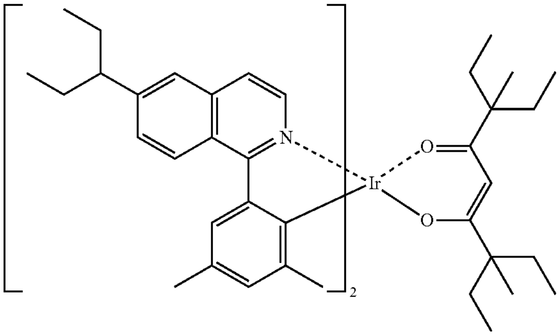
D-144
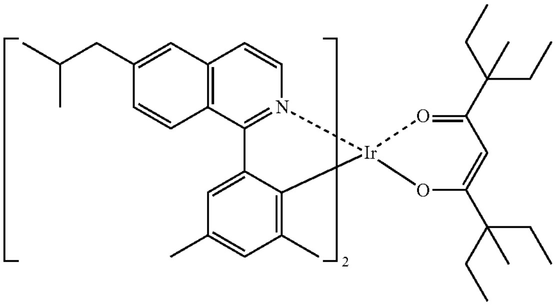

-continued

D-145

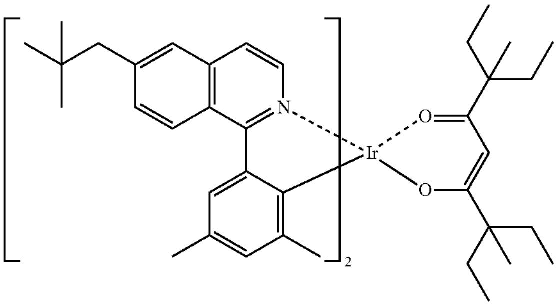

D-146

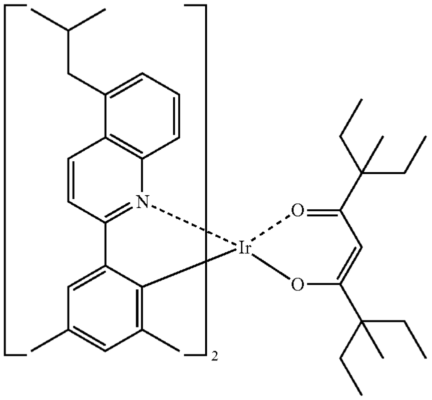

D-147

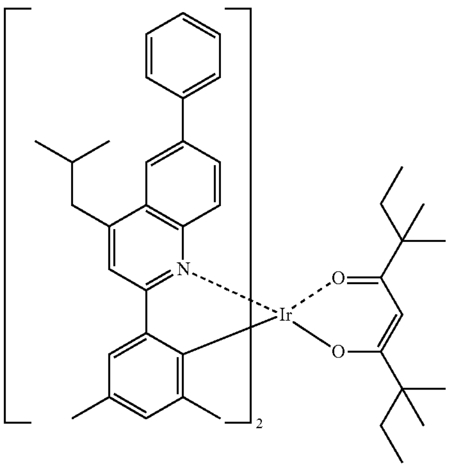

-continued

D-148

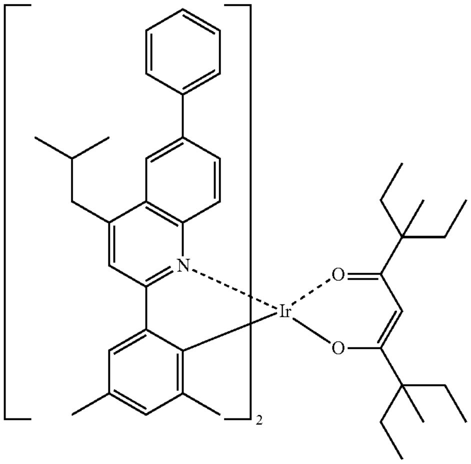

D-149

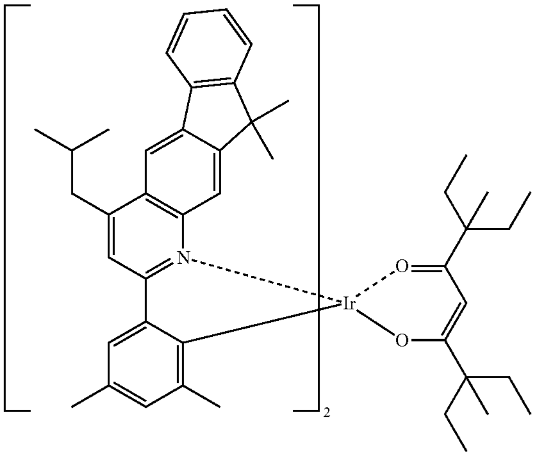

An organic electroluminescent device according to the present disclosure comprises a hole transport zone between a first electrode and a light-emitting layer, wherein the hole transport zone comprises the compound represented by formula 1. According to one embodiment of the present disclosure, an organic electroluminescent device may comprise a first hole transport layer between the first electrode and the light-emitting layer, and a second hole transport layer between the first hole transport layer and the light-emitting layer, wherein the second hole transport layer comprises the compound represented by formula 1. Herein, the second hole transport layer may be a single layer or a multi-layer and the second hole transport layer may be a layer serving as a hole transport layer, a light-emitting auxiliary layer, a hole auxiliary layer, and/or an electron blocking layer.

Each layer of the OLED of the present disclosure can be formed by either dry film-forming methods such as vacuum evaporation, sputtering, plasma, ion plating, etc., or wet film-forming methods such as ink jet printing, nozzle printing, slot coating, spin coating, dip coating, flow coating, etc.

When using a wet film-forming method, a thin film can be formed by dissolving or diffusing the materials forming each layer into any suitable solvent such as ethanol, chloroform, tetrahydrofuran, dioxane, etc. The solvent is not particularly limited as long as the material forming each layer is soluble or dispersible in the solvents, which do not cause any problems in forming a film.

The present disclosure may provide a display system comprising the organic electroluminescent device of the present disclosure. That is, it is possible to produce a display system and a lighting system by using the organic electroluminescent device of the present disclosure. Specifically, a display system, for example, a display system for white organic light emitting devices, smart phones, tablets, notebooks, PCs, TVs, or cars; or a lighting system, for example, an outdoor or indoor lighting system, can be produced by using the organic electroluminescent device of the present disclosure.

Hereinafter, the preparation method of the compound of the present disclosure, and the properties thereof, and the properties of the organic electroluminescent device of the present disclosure will be explained in detail with reference to the representative compounds of the present disclosure. However, the following examples are only to describe the characteristics of the organic electroluminescent device according to the present disclosure for a detailed understanding of the present disclosure, but the present disclosure is not limited to the following examples.

Device Example 1-1: Producing an OLED According to the Present Disclosure

An OLED according to the present disclosure was produced. A transparent electrode indium tin oxide (ITO) thin film (10 Ω/sq) on a glass substrate for an OLED (GEOMATEC CO., LTD., Japan) was subjected to an ultrasonic washing with acetone, ethanol and distilled water sequentially, and then was stored in isopropanol. The ITO substrate was then mounted on a substrate holder of a vacuum vapor deposition apparatus. Compound HT-1 was introduced into a cell of the vacuum vapor deposition apparatus, and compound HI-1 was introduced into another cell. The two materials were evaporated at different rates, and compound HI-1 was deposited in an amount of 3 wt % based to the total amount of compound HT-1 and compound HI-1 to form a hole injection layer. Subsequently, compound HT-1 was deposited as a first hole transport layer with a thickness of 90 nm on the hole injection layer. Subsequently, compound P-16 was introduced into another cell of the vacuum vapor deposition apparatus and was evaporated by applying an electric current to the cell, thereby depositing a second hole transport layer with a thickness of 60 nm on the first hole transport layer. After forming the hole injection layer and the hole transport layers, a light-emitting layer was deposited thereon as follows. Compound C1-6 was introduced into a cell of the vacuum vapor deposition apparatus as a host, and compound D-39 was introduced into another cell as a dopant. The dopant was deposited in a doping amount of 2 wt % based on the total amount of the host and the dopant to form a light-emitting layer having a thickness of 40 nm on the second hole transport layer. Subsequently, compound ETL-1 and compound EIL-1 were evaporated at a weight ratio of 1:1 in each of two other cells to deposit an electron transport layer having a thickness of 35 nm on the light-emitting layer. After depositing compound EIL-1 as an electron injection layer having a thickness of 2 nm on the electron transport layer, an Al cathode having a thickness of 80 nm was deposited by another vacuum vapor deposition apparatus. Thus, an OLED was produced.

Device Example 1-2: Producing an OLED According to the Present Disclosure

An OLED was produced in the same manner as in Device Example 1-1, except that compound C-163 was used as a host material in the light-emitting layer.

Comparative Example 1-1: Producing an OLED not in Accordance with the Present Disclosure An OLED was produced in the same manner as in Device Example 1-1, except that compound B-1 was used as a host material in the light-emitting layer.

Comparative Example 1-2: Producing an OLED not in Accordance with the Present Disclosure An OLED was produced in the same manner as in Device Example 1-1, except that compound A-1 was used as the second hole transport layer material.

The minimum time taken for luminance to decrease from 100% to 95% at a luminance of 10,000 nit of the OLEDs produced in Device Examples 1-1 and 1-2, and Comparative Examples 1-1 and 1-2 are provided in Table 1 below.

TABLE 1

| | Second Hole Transport Layer | Host | Lifespan (T95, hr) |
|---|---|---|---|
| Device Example 1-1 | P-16 | C1-6 | 408 |
| Device Example 1-2 | P-16 | C1-163 | 359 |
| Comparative Example 1-1 | P-16 | B-1 | 134 |
| Comparative Example 1-2 | A-1 | C1-6 | 206 |

From Table 1 above, it can be seen that the OLEDs according to present disclosure have excellent lifespan properties compared to the conventional OLEDs.

Device Example 2-1: Producing an OLED According to the Resent Disclosure

An OLED was produced in the same manner as in Device Example 1-1, except that compound HI-9 as a first host and compound H2-107 as a second host were used as host materials in the light-emitting layer.

Device Example 2-2: Producing an OLED According to the Resent Disclosure

An OLED was produced in the same manner as in Device Example 1-1, except that compound HI-9 as a first host and compound H2-182 as a second host were used as host materials in the light-emitting layer.

Comparative Example 2-1: Producing an OLED not in Accordance with the Resent Disclosure An OLED was produced in the same manner as in Device Example 2-1, except that compound A-2 was used as the second hole transport layer material.

Comparative Example 2-2: Producing an OLED not in Accordance with the Present Disclosure An OLED was produced in the same manner as in Device Example 2-2, except that compound A-2 was used as the second hole transport layer material.

The driving voltage, current efficiency, and a CIE color coordinate at a luminance of 1,000 nit, and the minimum time taken for luminance to decrease from 100% to 95% at a luminance of 10,000 nit of the OLEDs produced in Device Examples 2-1 and 2-2, and Comparative Examples 2-1 and 2-2 are provided in Table 2 below.

TABLE 2

| | Second Hole Transport Layer | Host | @ 1,000 nit Driving voltage (V) | Current Efficiency (cd/A) | CIE Color Coordinate (x, y) | @ 10,000 nit Lifespan (T95, hr) |
|---|---|---|---|---|---|---|
| Device Example 2-1 | P-16 | H1-9: H2-107 | 3,3 | 33.3 | 0.661, 0.338 | 408 |
| Device Example 2-2 | P-16 | H1-9: H2-182 | 3.3 | 34.7 | 0.662, 0.338 | 359 |
| Comparative Example 2-1 | A-2 | H1-9: H2-107 | 2.9 | 31.5 | 0.661, 0.338 | 134 |
| Comparative Example 2-2 | A-2 | H1-9: H2-182 | 2.9 | 31.1 | 0.659, 0.340 | 206 |

From Table 2 above, it can be seen that the OLEDs according to present disclosure have excellent current efficiency and lifespan properties compared to the conventional OLEDs.

The compounds used in the Device Examples and the Comparative Examples are shown in Table 3 below.

TABLE 3

| | |
|---|---|
| Hole Injection Layer/ First Hole Transport Layer | 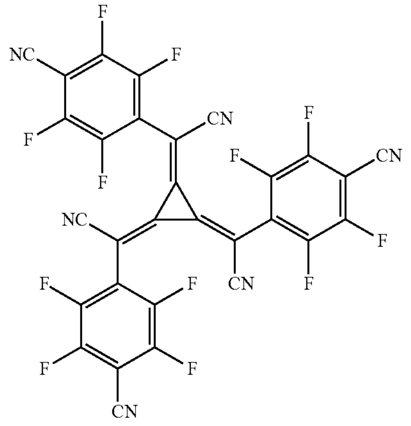 [SMILES: N#CC(=C1C(=C(C#N)c2c(F)c(F)c(C#N)c(F)c2F)C1=C(C#N)c1c(F)c(F)c(C#N)c(F)c1F)c1c(F)c(F)c(C#N)c(F)c1F] HI-1 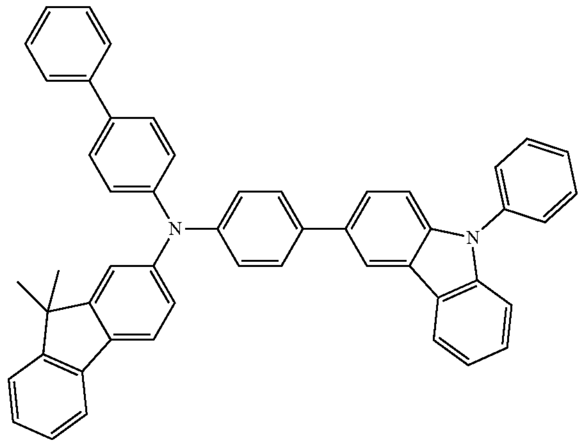 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21] HT-1 |

TABLE 3-continued
| | |
|---|---|
| Second Hole Transport Layer | 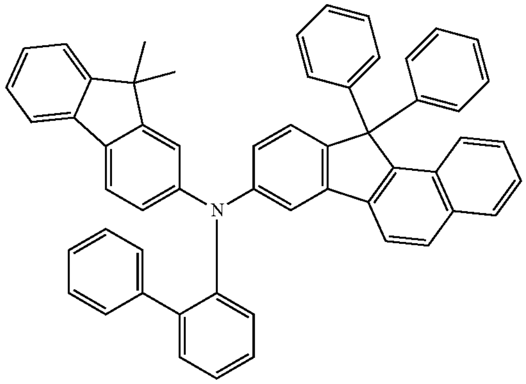 [SMILES: CC1(C)c2ccccc2-c2ccc(N(c3ccc4c(c3)-c3ccc5ccccc5c3C4(c3ccccc3)c3ccccc3)c3ccccc3-c3ccccc3)cc21]<br>P-16<br>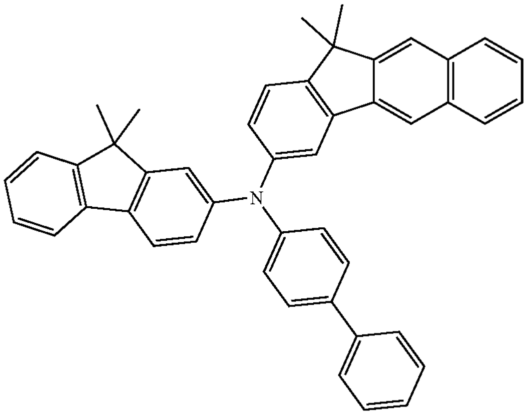 [SMILES: CC1(C)c2ccccc2-c2ccc(N(c3ccc(-c4ccccc4)cc3)c3ccc4c(c3)-c3cc5ccccc5cc3C4(C)C)cc21]<br>A-1<br>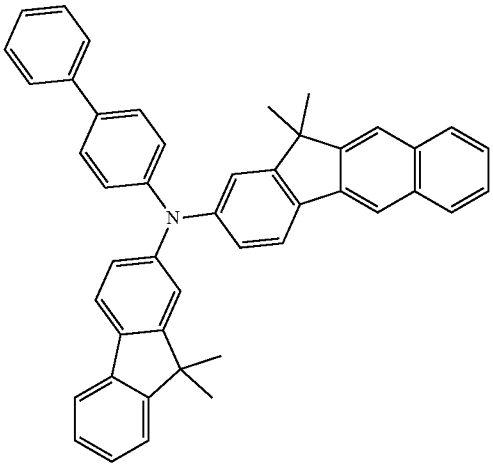 [SMILES: CC1(C)c2ccccc2-c2ccc(N(c3ccc(-c4ccccc4)cc3)c3ccc4c(c3)C(C)(C)c3cc5ccccc5cc3-4)cc21]<br>A-2 |

TABLE 3-continued
Light-Emitting Layer
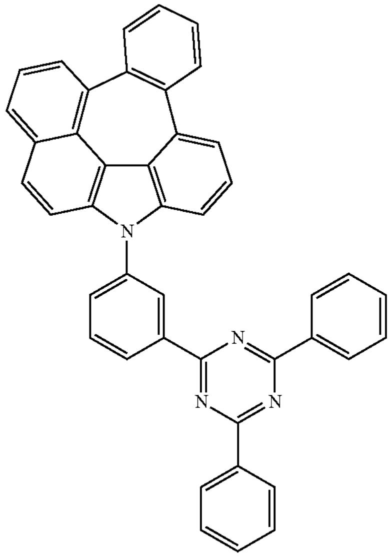 [SMILES: c1ccc(-c2nc(-c3ccccc3)nc(-c3cccc(-n4c5cccc6c5c5c7c(cccc7ccc54)-c4ccccc4-6)c3)n2)cc1]
C1-6
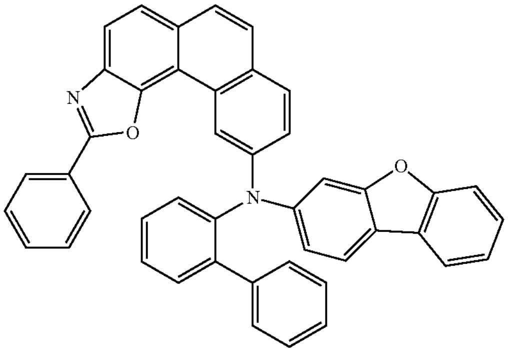 [SMILES: c1ccc(-c2nc3ccc4ccc5ccc(N(c6ccc7c(c6)oc6ccccc67)c6ccccc6-c6ccccc6)cc5c4c3o2)cc1]
H1-9
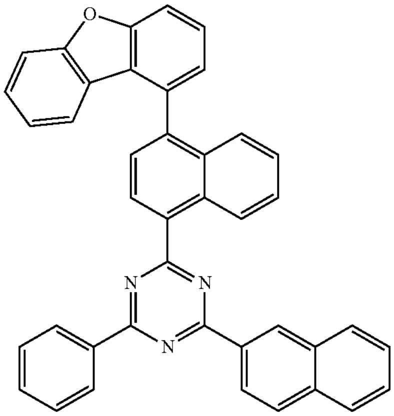 [SMILES: c1ccc(-c2nc(-c3ccc4ccccc4c3)nc(-c3ccc(-c4cccc5oc6ccccc6c45)c4ccccc34)n2)cc1]
H2-107

TABLE 3-continued
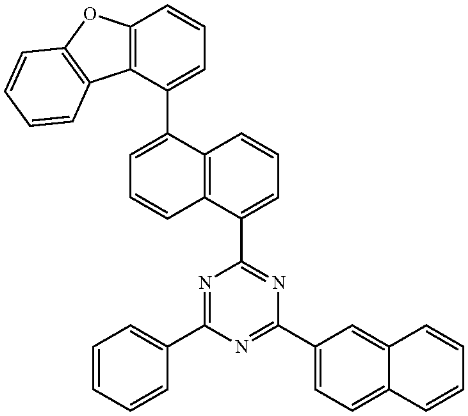 [SMILES: c1ccc(-c2nc(-c3ccc4ccccc4c3)nc(-c3cccc4c(-c5cccc6oc7ccccc7c56)cccc34)n2)cc1]
H2-182
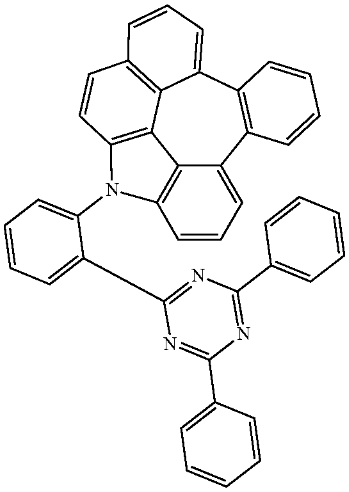 [SMILES: c1ccc(-c2nc(-c3ccccc3)nc(-c3ccccc3-n3c4cccc5c4c4c6c(cccc6ccc43)-c3ccccc3-5)n2)cc1]
C1-163
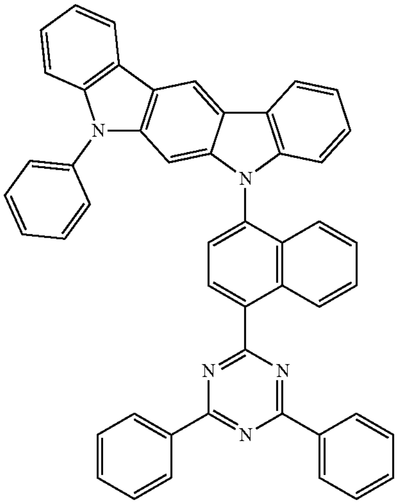 [SMILES: c1ccc(-c2nc(-c3ccccc3)nc(-c3ccc(-n4c5ccccc5c5cc6c7ccccc7n(-c7ccccc7)c6cc54)c4ccccc34)n2)cc1]
B-1

TABLE 3-continued

| | |
|---|---|
| | 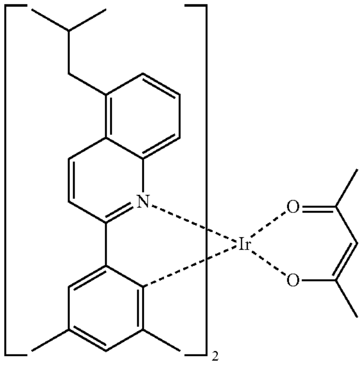<br>D-39 |
| Electron Transport Layer/ Electron Injection Layer | 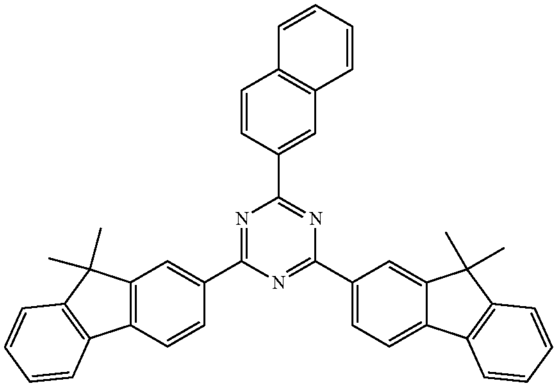 [SMILES: CC1(C)c2ccccc2-c2ccc(-c3nc(-c4ccc5c(c4)C(C)(C)c4ccccc4-5)nc(-c4ccc5ccccc5c4)n3)cc21]<br>ETL-1<br>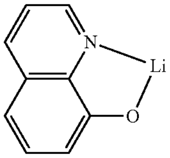<br>EIL-1 |

The invention claimed is:

1. An organic electroluminescent device comprising a first electrode; a second electrode facing the first electrode; a light-emitting layer between the first electrode and the second electrode; and a hole transport zone between the first electrode and the light-emitting layer, wherein the hole transport zone comprises the compound represented by the following formula 1, and the light-emitting layer comprises a plurality of host materials containing the first host material comprising the compound represented by the following formula 3-1, 3-2 and 3-4 to 3-13 and the second host material comprising the compound represented by the following formula 4:

(1)

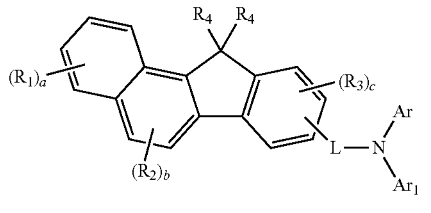

in formula 1, $Ar_1$ and $Ar_2$ each independently represent hydrogen, deuterium, a substituted or unsubstituted (C1-C30)alkyl, a substituted or unsubstituted (C6-C30)aryl, a substituted or unsubstituted (3- to 30-membered) heteroaryl, or $-L_b-N(Ar_a)(Ar_b)$, or $Ar_1$ and $Ar_2$ may be linked to each other to form a ring(s), with the proviso that when $Ar_1$ or $Ar_2$ are a substituted or unsubstituted (3- to 30-membered) heteroaryl, a carbazole is excluded therefrom;

L represents a single bond, a substituted or unsubstituted (C6-C30)arylene, or a substituted or unsubstituted (3- to 30-membered) heteroarylene;

$R_1$ to $R_3$ each independently represent hydrogen, deuterium, a halogen, a cyano, a substituted or unsubstituted (C1-C30)alkyl, a substituted or unsubstituted (C6-C30) aryl, a substituted or unsubstituted (3- to 30-membered) heteroaryl, a substituted or unsubstituted (C3-C30) cycloalkyl, a substituted or unsubstituted (C1-C30) alkoxy, a substituted or unsubstituted tri(C1-C30)alkylsilyl, a substituted or unsubstituted di(C1-C30)alkyl (C6-C30)arylsilyl, a substituted or unsubstituted (C1-C30)alkyldi(C6-C30)arylsilyl, a substituted or unsubstituted tri(C6-C30)arylsilyl, or $L_b-N(Ar_a)$ $(Ar_b)$;

$R_4$ and $R_5$ each independently represent a substituted or unsubstituted (C1-C30)alkyl, or a substituted or unsubstituted (C6-C30)aryl; and a represents an integer of 1 to 4, b represents an integer of 1 or 2, c represents an integer of 1 to 3, and where if a, b, and c are an integer of 2 or more, each of $R_1$, each of $R_2$, and each of $R_3$ may be the same or different;

(3-1)

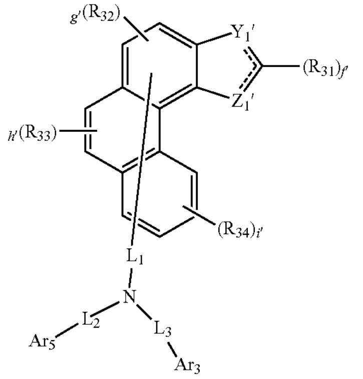

-continued (3-2)

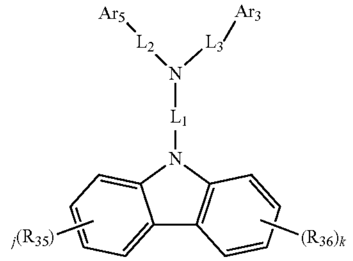

(3-4)

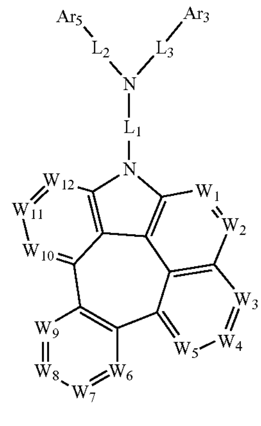

(3-5)

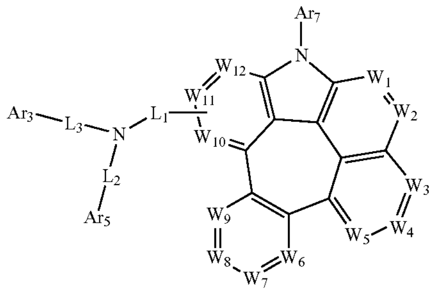

(3-6)

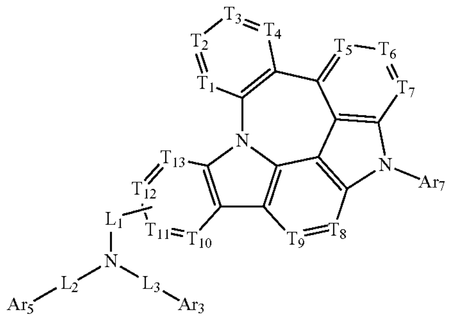

(3-7)

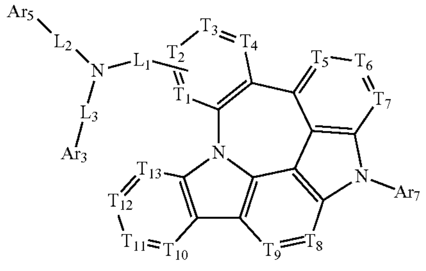

-continued (3-8)

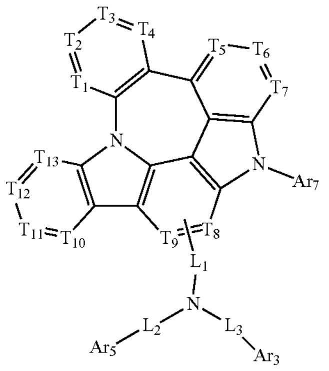

(3-9)

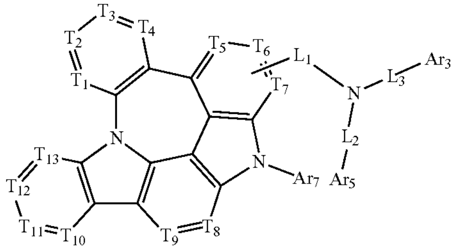

(3-10)

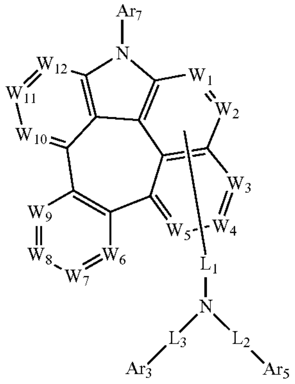

(3-11)

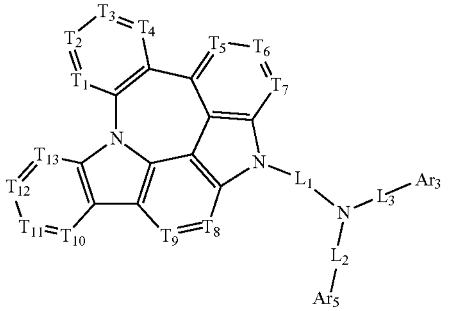

-continued (3-12)

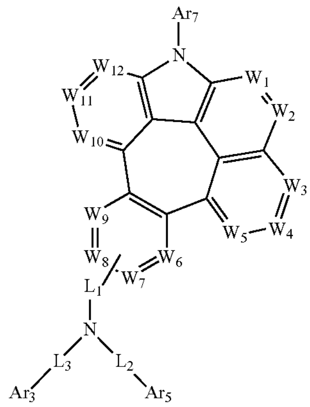

(3-13)

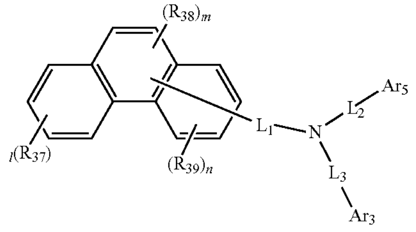

in formula 3-1, 3-2 and 3-4 to 3-13, $L_1$ to $L_3$ each independently represent a single bond, a substituted or unsubstituted (C1-C30)alkylene, a substituted or unsubstituted (C6-C30)arylene, a substituted or unsubstituted (3- to 30-membered) heteroarylene, or a substituted or unsubstituted (C3-C30)cycloalkylene;

$Ar_3$ and $Ar_5$ each independently represent hydrogen, deuterium, a halogen, a cyano, a substituted or unsubstituted (C1-C30)alkyl, a substituted or unsubstituted (C6-C30)aryl, a substituted or unsubstituted (3- to 30-membered) heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted fused ring group of a (C3-C30) aliphatic ring(s) and a (C6-C30) aromatic ring(s), or $L_b$-N($Ar_a$) ($Ar_b$);

$Y_1$' and $Z_1$' each independently represent —N═, —$NR_{41}$—, —O—, or —S—, with a proviso that any one of $Y_1$' and $Z_1$' represents —N═, and the other of $Y_1$' and $Z_1$' represents-$NR_{41}$—, —O—, or—S—;

$T_1$ to $T_{13}$ and $W_1$ to $W_{12}$ each independently represent N or $CV_1$;

$R_{31}$ represents a substituted or unsubstituted (C6-C30) aryl, or a substituted or unsubstituted (3- to 30-membered) heteroaryl;

$R_{32}$ to $R_{34}$, $R_{37}$ to $R_{39}$, $R_{41}$ to $R_{44}$, and $V_1$ each independently represent hydrogen, deuterium, a halogen, a cyano, a substituted or unsubstituted (C1-C30)alkyl, a substituted or unsubstituted (C6-C30)aryl, a substituted or unsubstituted (3- to 30-membered) heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)

arylsilyl, a substituted or unsubstituted tri(C6-C30)arylsilyl, a substituted or unsubstituted fused ring group of a (C3-C30) aliphatic ring(s) and a (C6-C30) aromatic ring(s), or $-L_b-N(Ar_a)(Ar_b)$, or may be linked to an adjacent substituent(s) to form a ring(s);

$Ar_7$ represents a substituted or unsubstituted (C6-C30) aryl, or a substituted or unsubstituted (3- to 30-membered) heteroaryl;

f' represents 1, g', h', and m each independently represent an integer of 1 or 2, i', i, k, l, and n each independently represent an integer of 1 to 4, and where if g', h', i', i, k, and l to n are an integer of 2 or more, each of $R_{32}$ to $R_{34}$, each of $R_{37}$ to $R_{39}$ may be the same as or different from each other; and $$HAr-(L_4-Ar_6)_e— \quad (4)$$

in formula 4,

HAr represents a substituted or unsubstituted, nitrogen-containing (3- to 20-membered) heteroaryl;

$L_4$ represents a single bond, or a substituted or unsubstituted (C6-C30)arylene; and $Ar_6$ represents a substituted or unsubstituted (C6-C30) aryl, or any one selected from the following formulas 5 to 7;

(5)

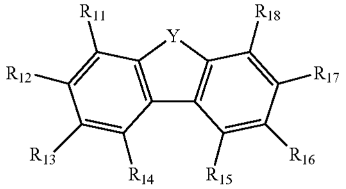

(6)

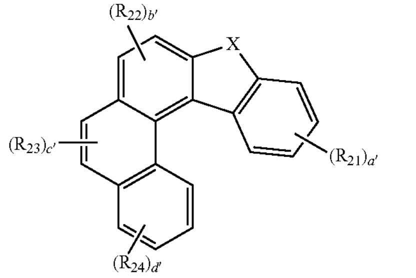

(7)

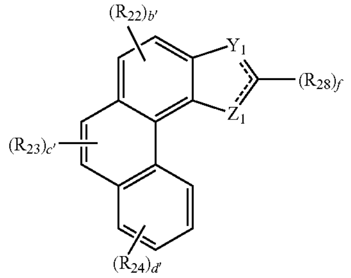

Y represents O, S, N—*, or $NR_7$;

X represents O, S, or $CR_8R_9$;

$Y_1$ and $Z_1$ each independently represent —N═, —$NR_{10}$—, —O—, or—S—, with a proviso that any one of $Y_1$ and $Z_1$ represents —N═, and the other of $Y_1$ and $Z_1$ represents —$NR_{10}$—, —O—, or —S—;

$R_7$ and $R_{10}$ each independently represent a substituted or unsubstituted (C6-C30)aryl;

$R_8$ and $R_9$ each independently represent a substituted or unsubstituted (C1-C30)alkyl, or a substituted or unsubstituted (C6-C30)aryl;

$R_{11}$ to $R_{18}$ and $R_{21}$ to $R_{27}$ each independently represent the position linked to $L_4$; or represent hydrogen, deuterium, a halogen, a cyano, a substituted or unsubstituted (C1-C30)alkyl, a substituted or unsubstituted (C6-C30) aryl, a substituted or unsubstituted (3- to 30-membered) heteroaryl, a substituted or unsubstituted (C3-C30) cycloalkyl, a substituted or unsubstituted (C1-C30) alkoxy, a substituted or unsubstituted tri(C1-C30)alkylsilyl, a substituted or unsubstituted di(C1-C30)alkyl (C6-C30)arylsilyl, a substituted or unsubstituted (C1-C30)alkyldi(C6-C30)arylsilyl, a substituted or unsubstituted tri(C6-C30)arylsilyl, or $L_b-N(Ar_a)(Ar_b)$; or may be linked to an adjacent substituent(s) to form a ring(s);

$R_{28}$ represents a substituted or unsubstituted (C6-C30) aryl, or a substituted or unsubstituted (3- to 30-membered) heteroaryl;

f represents 1, a', d' and i each independently represent an integer of 1 to 4, b', c', g and h each independently represent an integer of 1 to 2, e represents an integer of 1 to 3, and where if a', b', c', d', e and g to i are an integer of 2 or more, each of $R_{21}$ to each of $R_{27}$ and each of $(L_4-Ar_6)$ may be the same as or different from each other; and

* represents the position linked to $L_4$;

in formulas 1, 3-1, 3-2 and 3-4 to 3-13 and 4, $L_b$ each independently represents a single bond, a substituted or unsubstituted (C6-C30)arylene, or a substituted or unsubstituted (3- to 30-membered) heteroarylene; and $Ar_a$ and $Ar_b$ each independently represent hydrogen, a substituted or unsubstituted (C1-C30)alkyl, a substituted or unsubstituted (C2-C30)alkenyl, a substituted or unsubstituted fused ring group of a (C3-C30) aliphatic ring(s) and a (C6-C30) aromatic ring(s), a substituted or unsubstituted (C6-C30)aryl, or a substituted or unsubstituted (3- to 30-membered) heteroaryl.

2. The organic electroluminescent device according to claim 1, wherein the substituent(s) of the substituted alkyl, the substituted alkylene, the substituted alkenyl, the substituted aryl, the substituted arylene, the substituted heteroaryl, the substituted heteroarylene, the substituted nitrogen-containing heteroaryl, the substituted cycloalkyl, the substituted cycloalkylene, the substituted alkoxy, the substituted trialkylsilyl, the substituted dialkylarylsilyl, the substituted alkyldiarylsilyl, the substituted triarylsilyl, and the substituted fused ring group of an aliphatic ring(s) and an aromatic ring(s), the substituted pyridyl, the substituted pyrimidinyl, the substituted triazinyl, the substituted quinazolinyl, and the substituted quinoxalinyl, each independently, are at least one selected from the group consisting of deuterium; a halogen; a cyano; a carboxyl; a nitro; a hydroxyl; a phosphine oxide; a (C1-C30)alkyl; a halo(C1-C30)alkyl; a (C2-C30)alkenyl; a (C2-C30)alkynyl; a (C1-C30)alkoxy; a (C1-C30)alkylthio; a (C3-C30)cycloalkyl; a (C3-C30) cycloalkenyl; a (3- to 7-membered) heterocycloalkyl; a (C6-C30)aryloxy; a (C6-C30)arylthio; a (3- to 30-membered) heteroaryl unsubstituted or substituted with a (C6-C30)aryl(s); a (C6-C30)aryl unsubstituted or substituted with at least one of a (C1-C30)alkyl(s), a (C6-C30)aryl(s) and a (3- to 30-membered) heteroaryl(s); a tri(C1-C30) alkylsilyl; a tri(C6-C30)arylsilyl; a di(C1-C30)alkyl(C6-C30)arylsilyl; a (C1-C30)alkyldi(C6-C30)arylsilyl; a fused ring group of a (C3-C30) aliphatic ring(s) and a (C6-C30)

aromatic ring(s); an amino; a mono- or di-(C1-C30)alkylamino; a mono- or di-(C2-C30)alkenylamino; a (C1-C30) alkyl(C2-C30)alkenylamino; a mono- or di-(C6-C30)arylamino; a (C1-C30)alkyl(C6-C30)arylamino; a mono- or di-(3- to 30-membered) heteroarylamino; a (C1-C30)alkyl (3- to 30-membered) heteroarylamino; a (C2-C30)alkenyl (C6-C30)arylamino; a (C2-C30)alkenyl(3- to 30-membered) heteroarylamino; a (C6-C30)aryl(3- to 30-membered) heteroarylamino; a (C1-C30)alkylcarbonyl; a (C1-C30)alkoxycarbonyl; a (C6-C30)arylcarbonyl; a (C6-C30)arylphosphine; a di(C6-C30)arylboronyl; a di(C1-C30) alkylboronyl; a (C1-C30)alkyl(C6-C30)arylboronyl; a (C6-C30)aryl(C1-C30)alkyl; and a (C1-C30)alkyl(C6-C30)aryl.

3. The organic electroluminescent device according to claim 1, wherein formula 1 represents at least one selected from the following compounds:

P-1

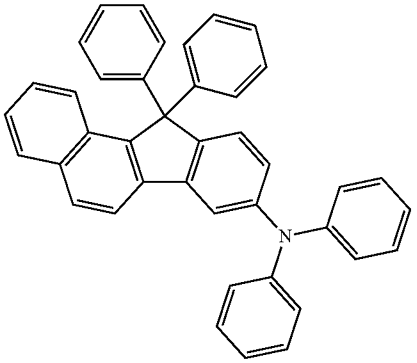

P-2

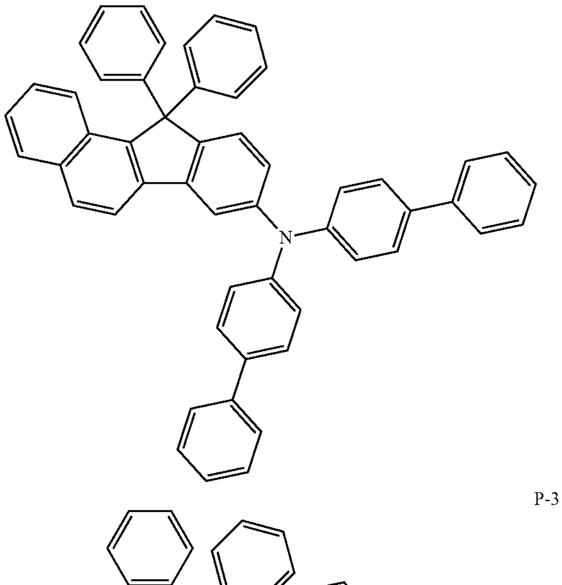

P-3

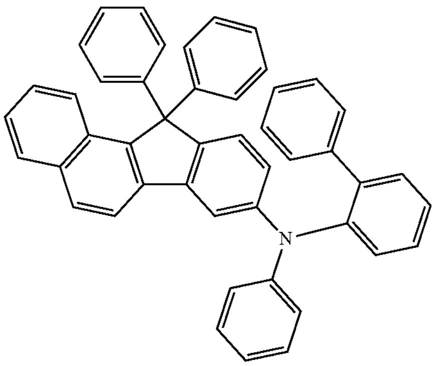

-continued

P-4

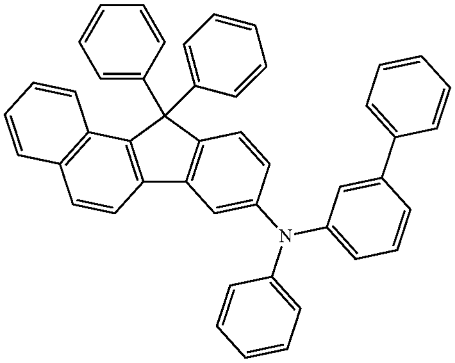

P-5

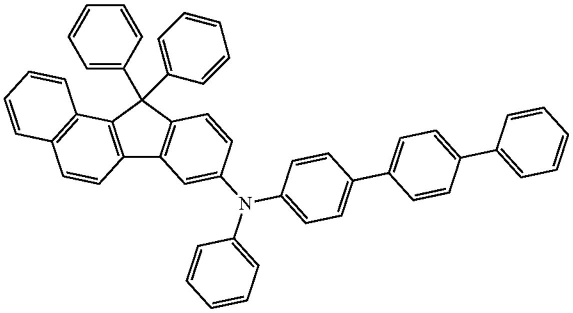

P-6

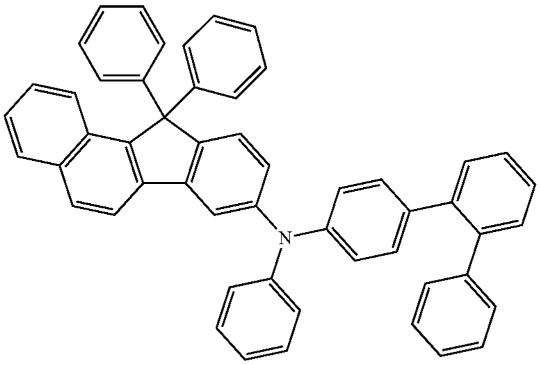

P-7

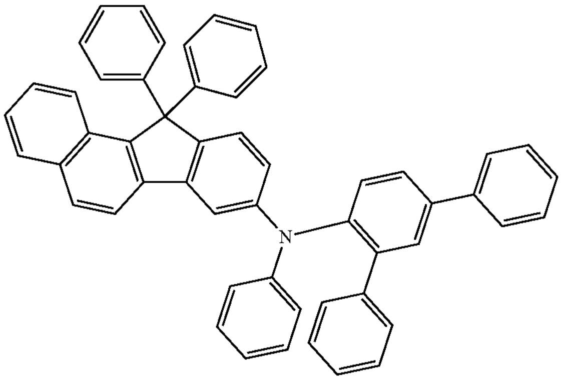

-continued
P-8
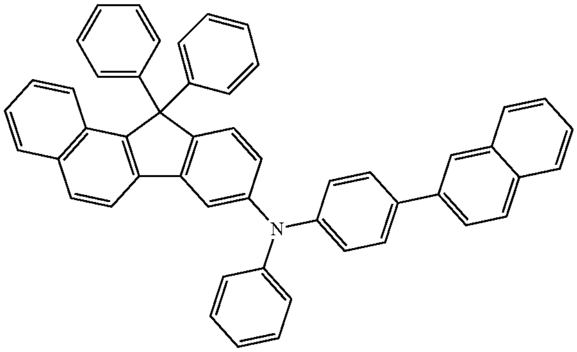
P-9
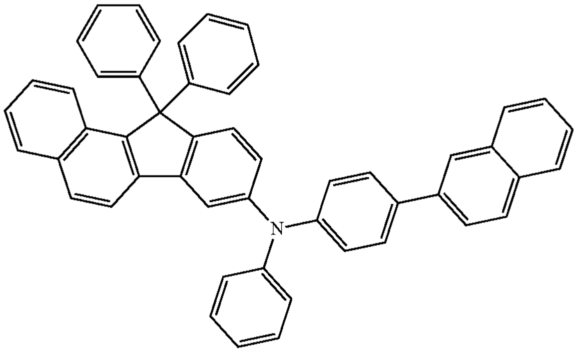
P-10
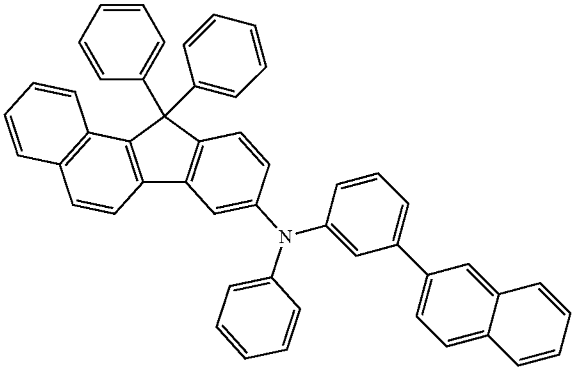
P-11
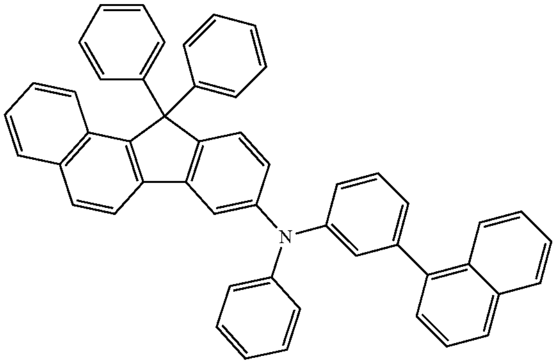
-continued
P-12
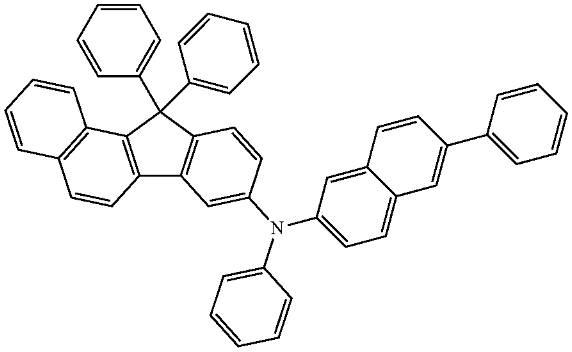
P-13
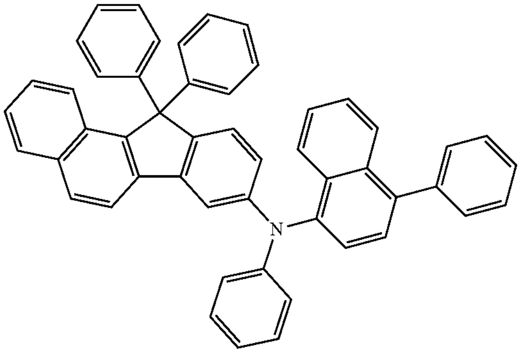
P-14
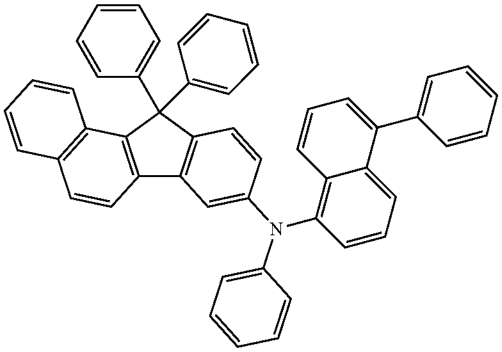
P-15
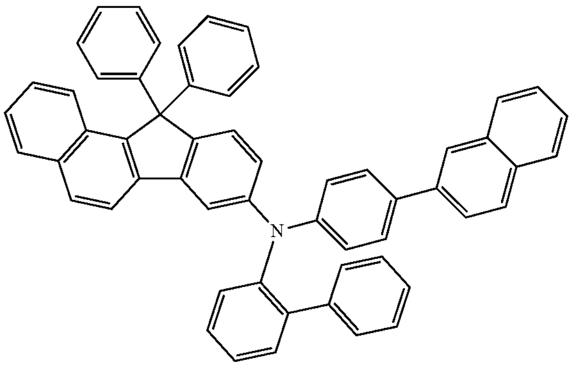

-continued
P-16
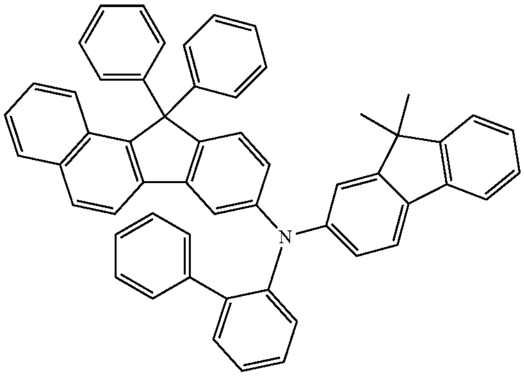
P-17
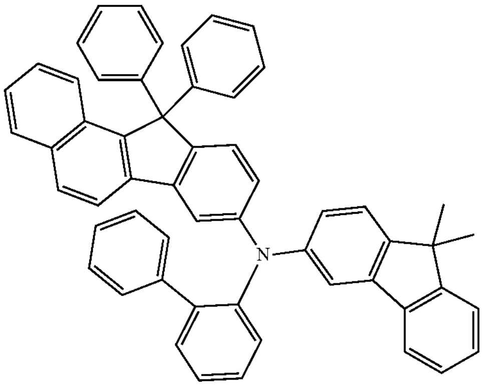
P1-18
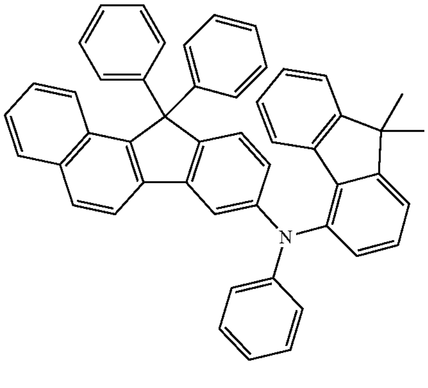
-continued
P-19
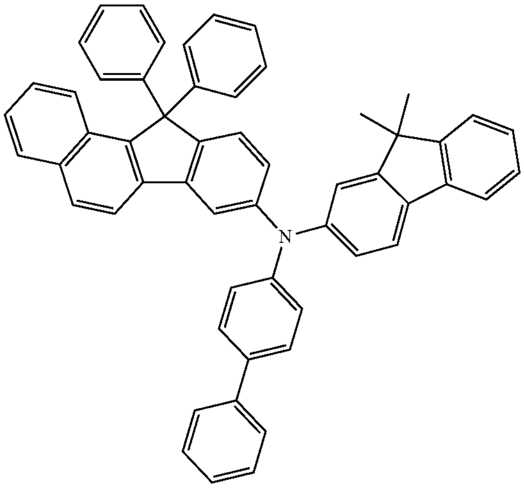
P-20
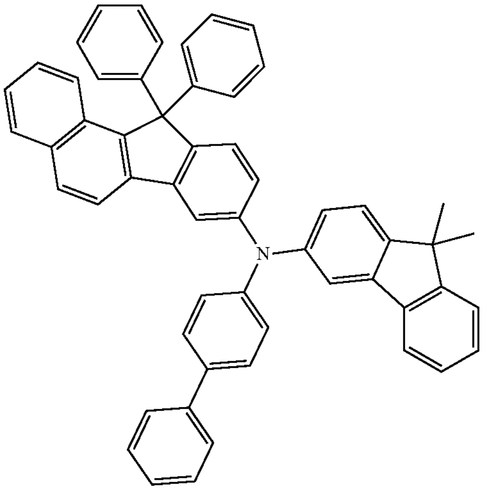
P-21
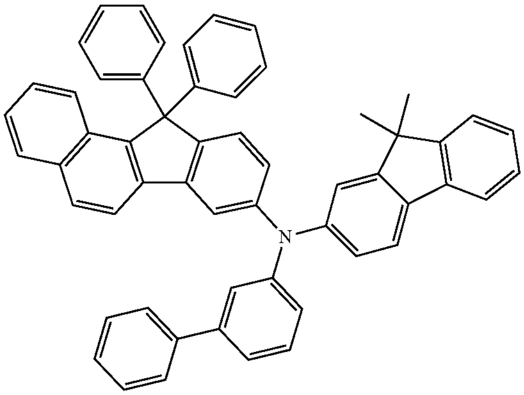

-continued
P-22
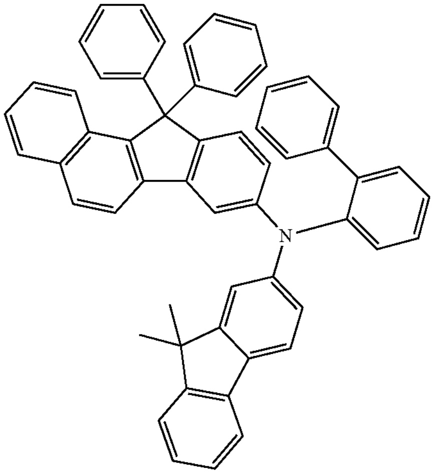
P-23
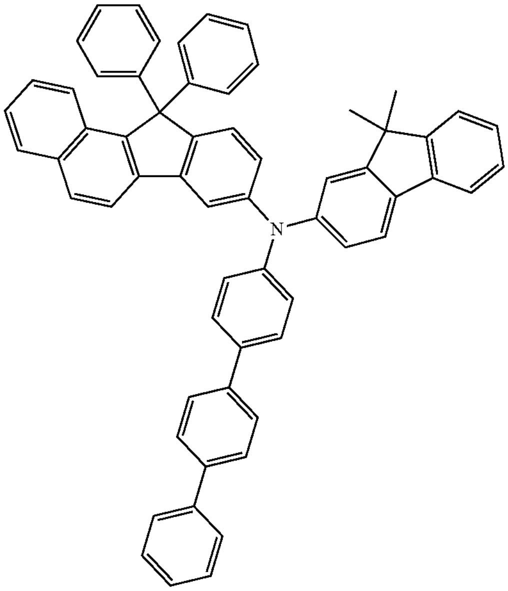
P-24
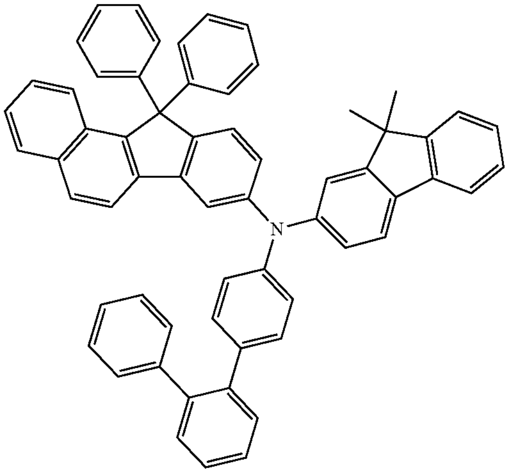
-continued
P-25
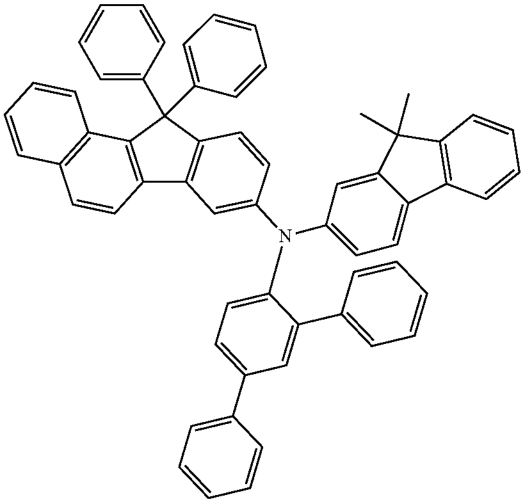
P-26
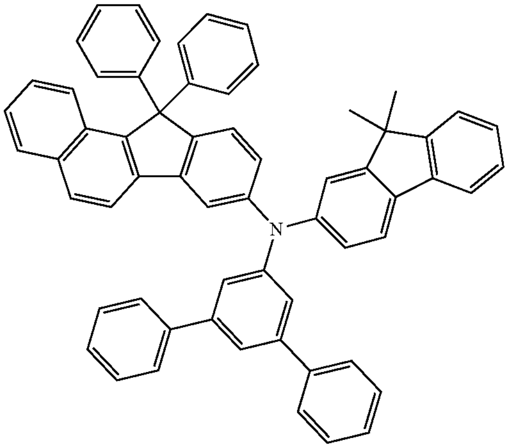
P-27
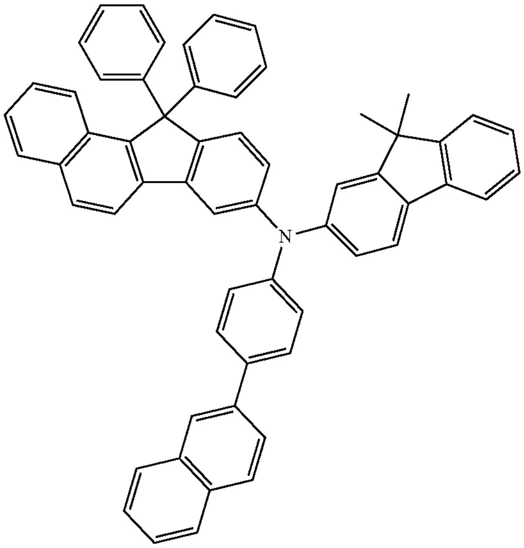

-continued
P-28
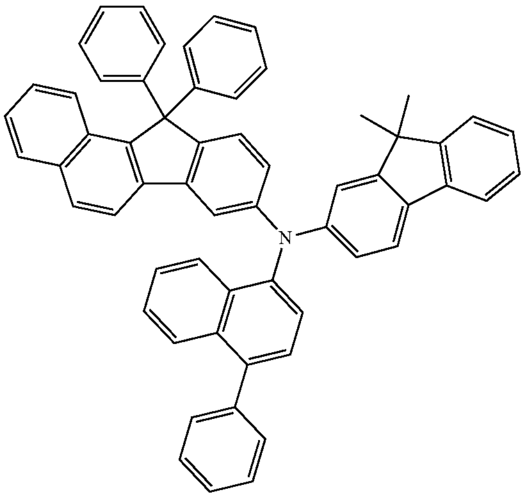
P-29
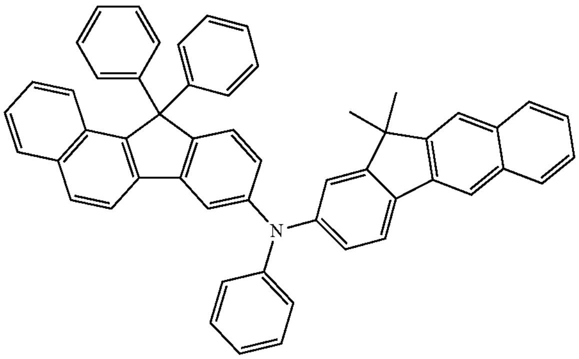
P-30
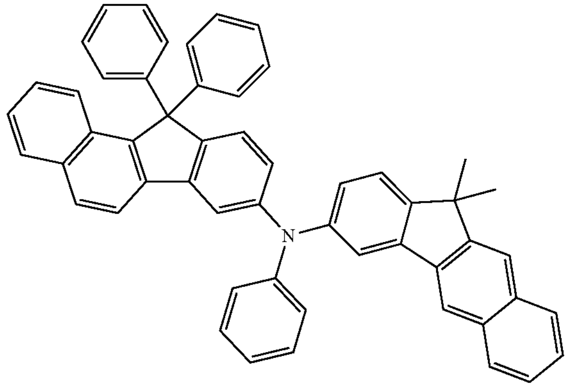
-continued
P-31
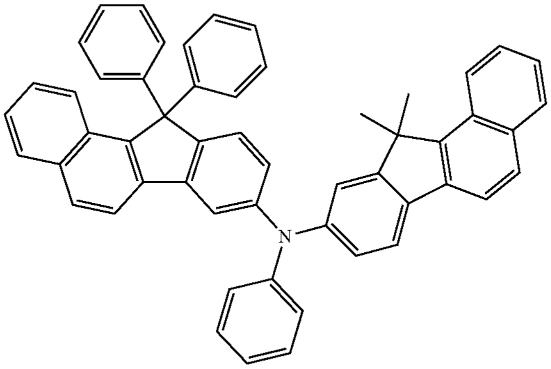
P-32
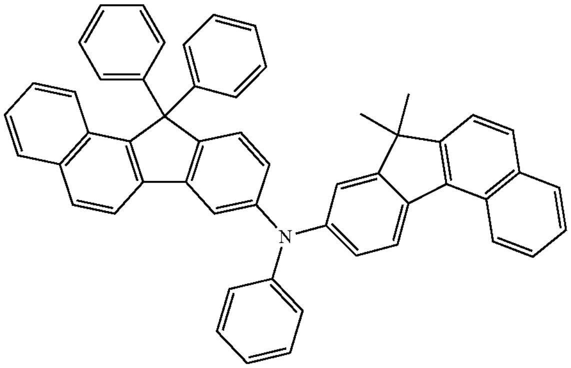
P-33
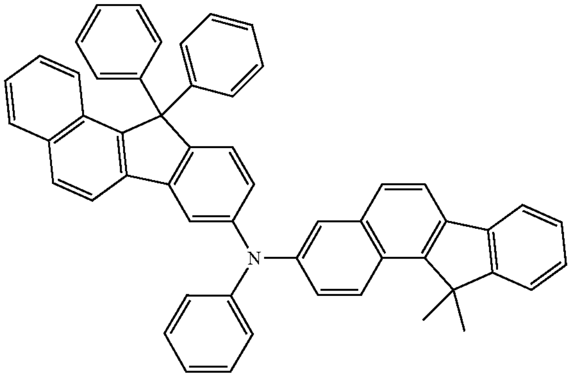
P-34
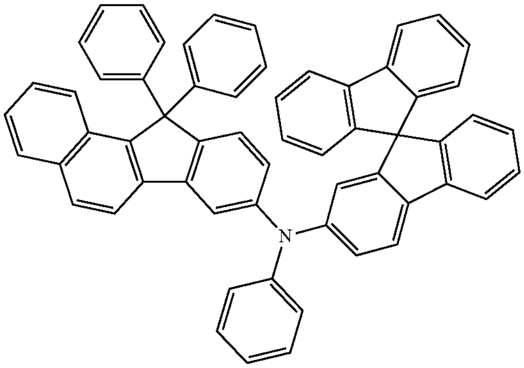

P-35
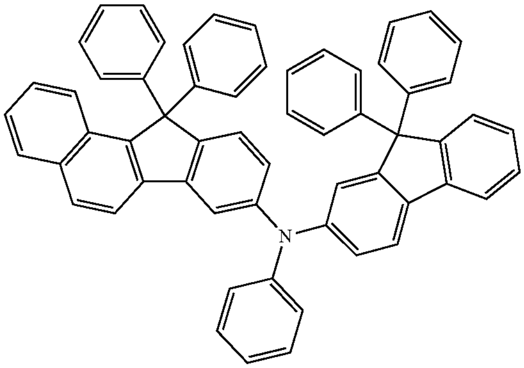
P-36
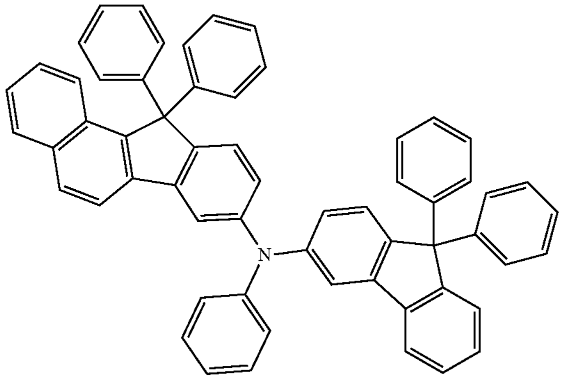
P-37
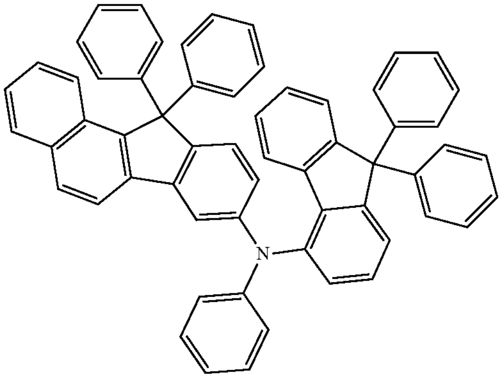
P-38
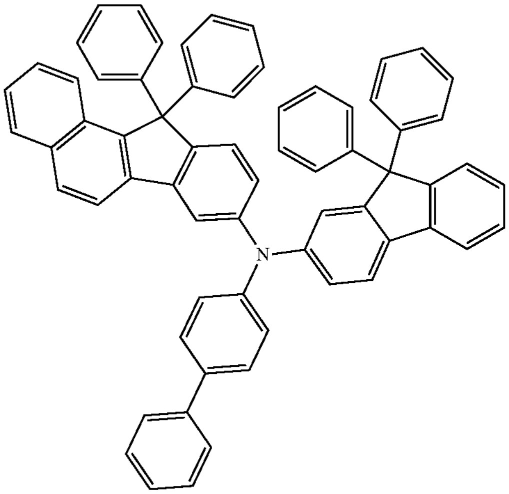
P-39
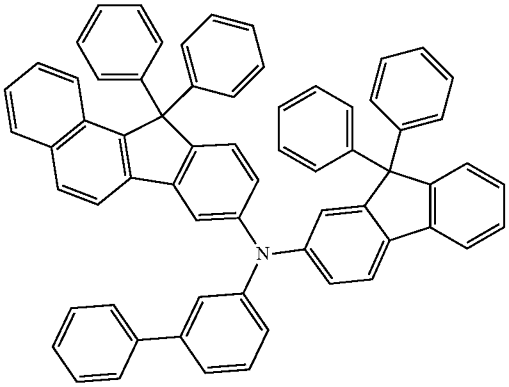
P-40
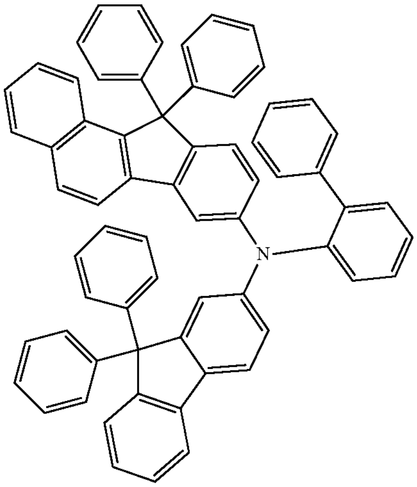

-continued
P-41
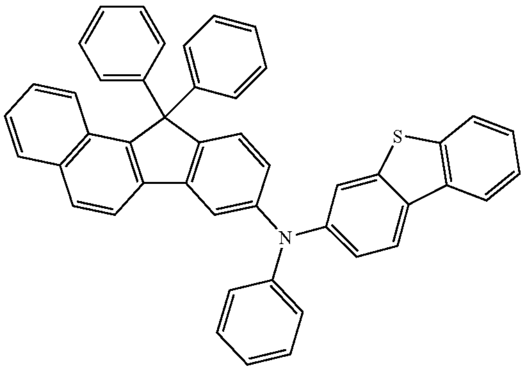
P-42
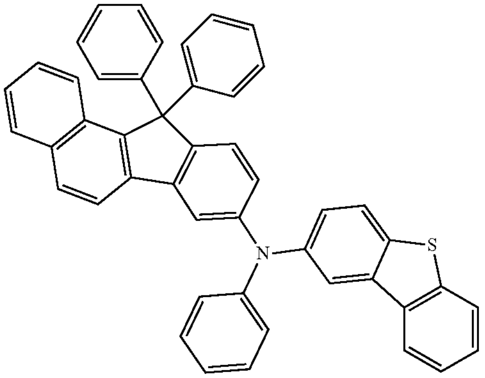
P-43
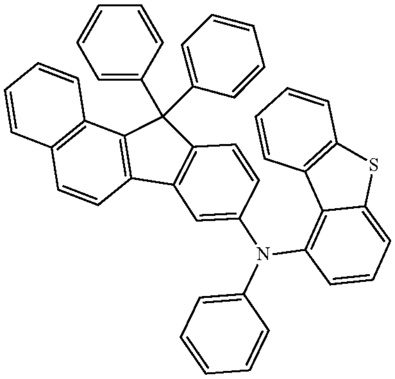
P-44
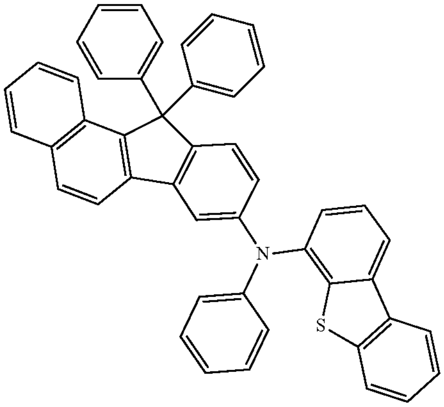
-continued
P-45
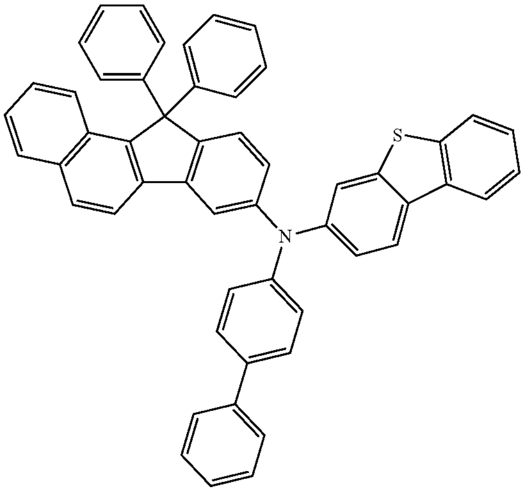
P-46
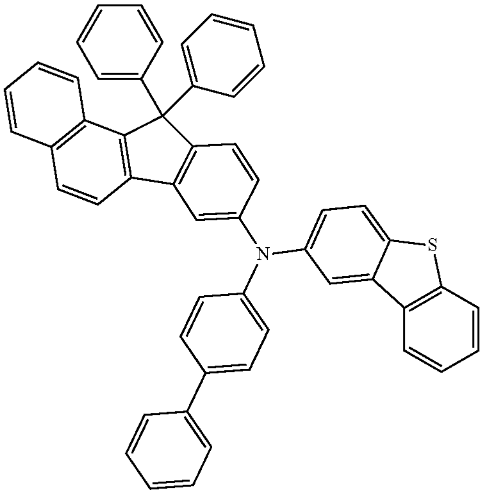
P-47
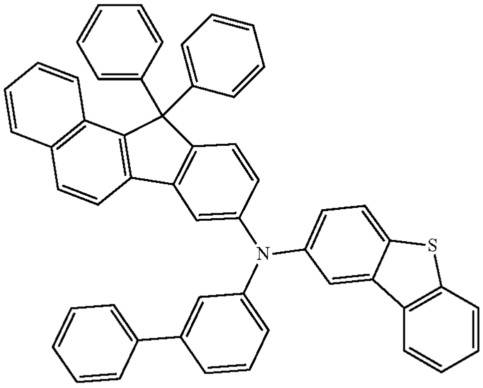

-continued
P-48
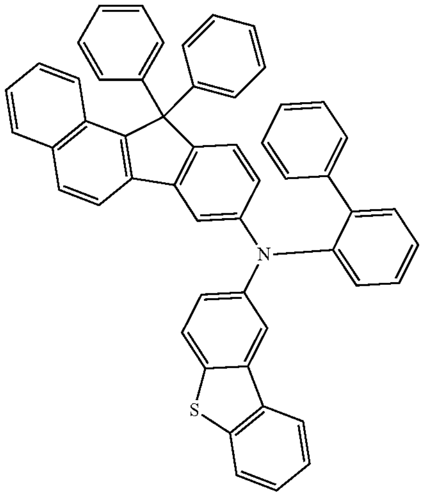
P-49
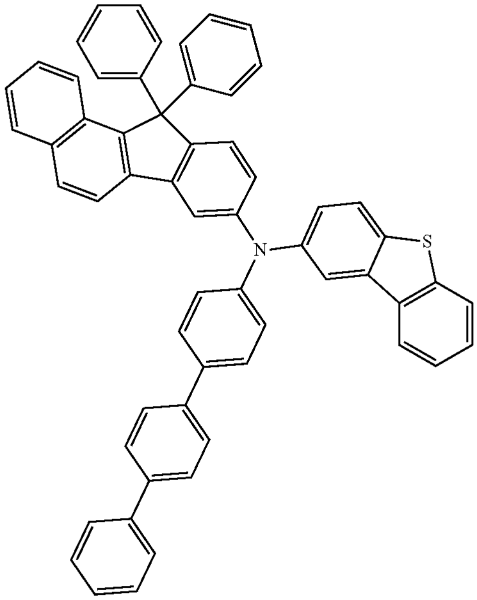
P-50
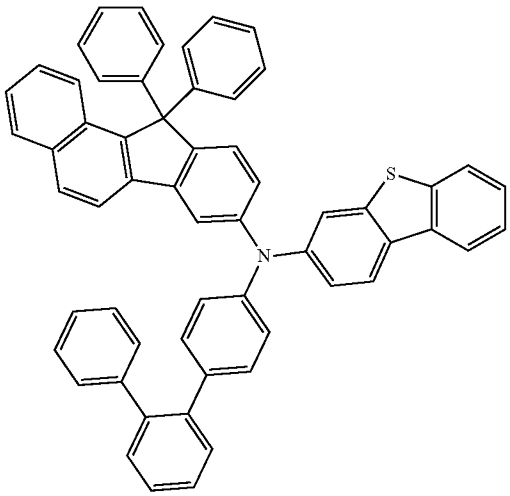
-continued
P-51
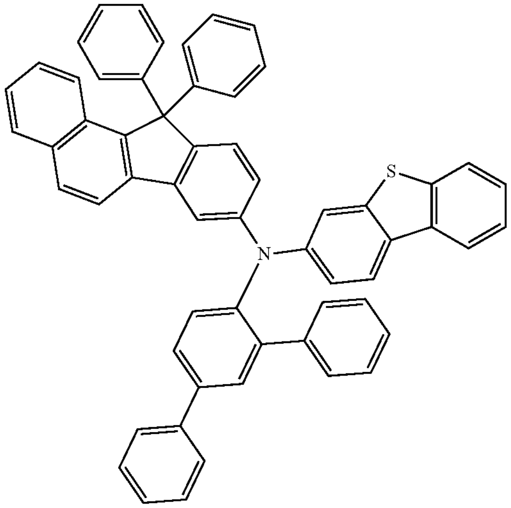
P-52
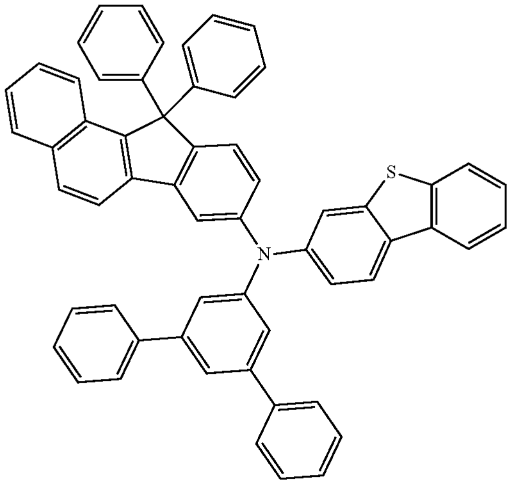
P-53
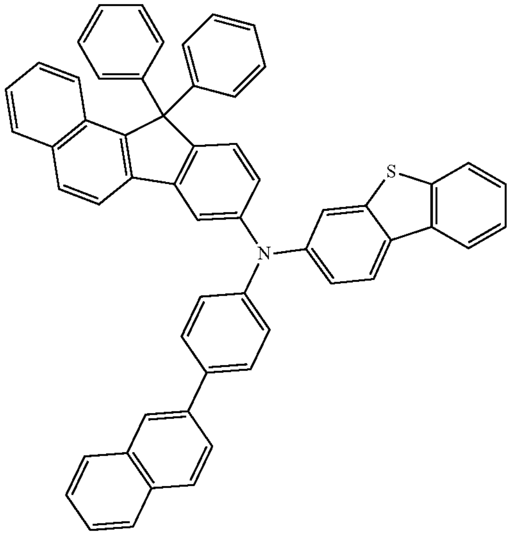

-continued
P-54
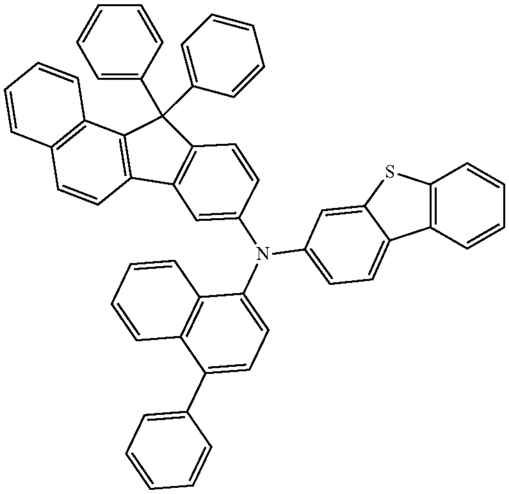
P-55
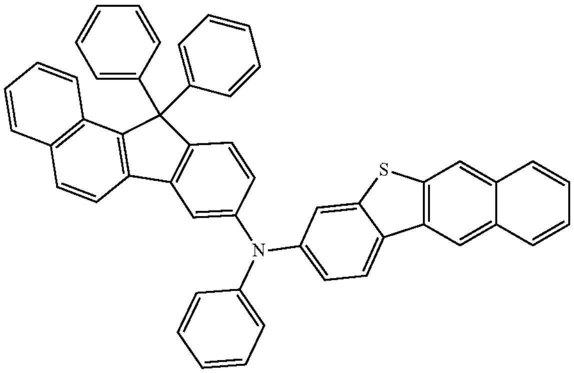
P-56
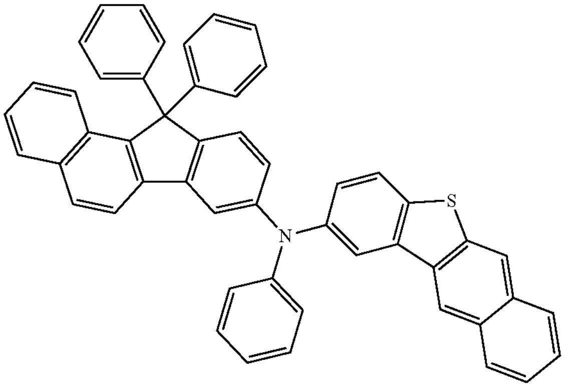
-continued
P-57
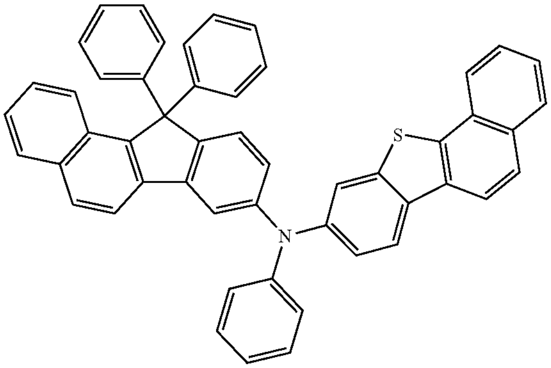
P-58
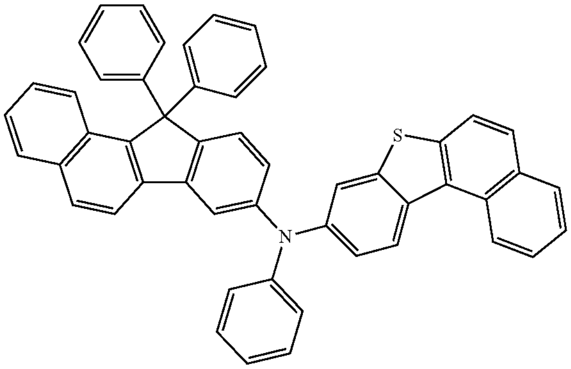
P-59
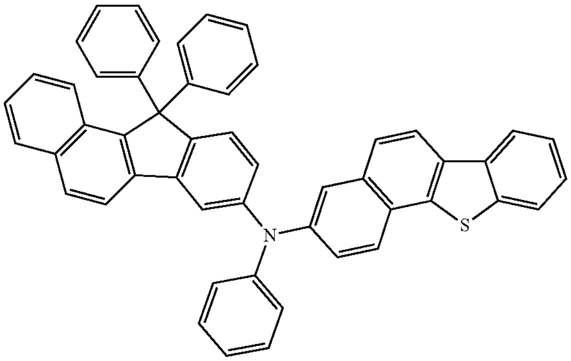
P-60
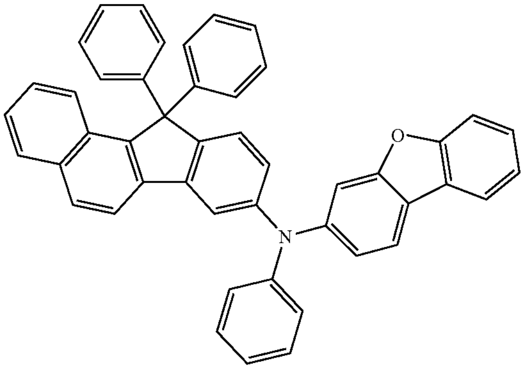

-continued
P-61
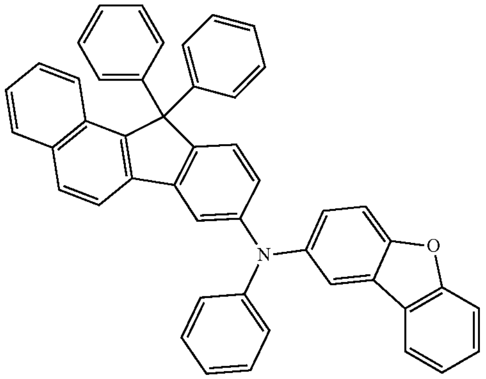
P-62
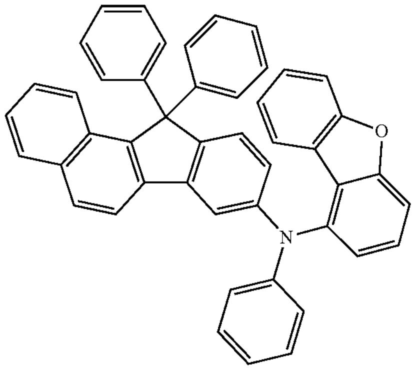
P-63
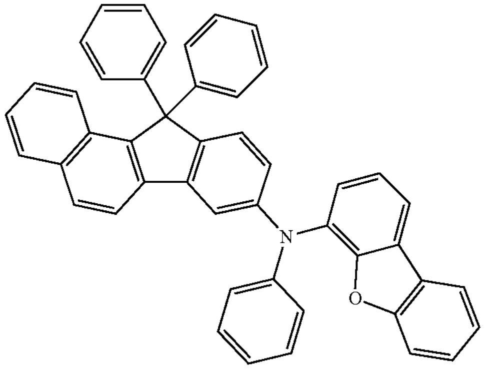
-continued
P-64
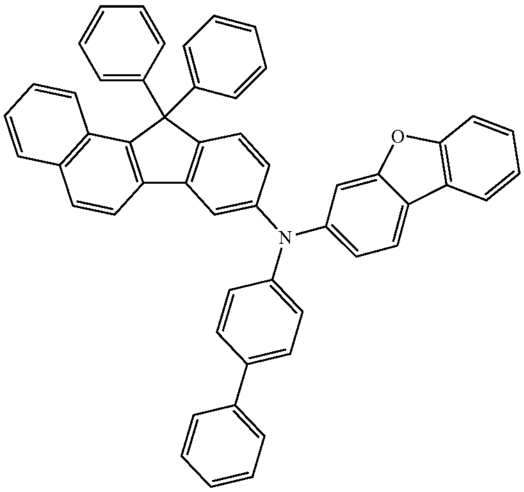
P-65
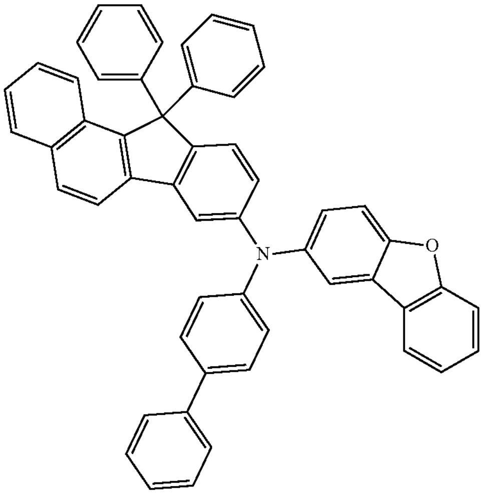
P-66
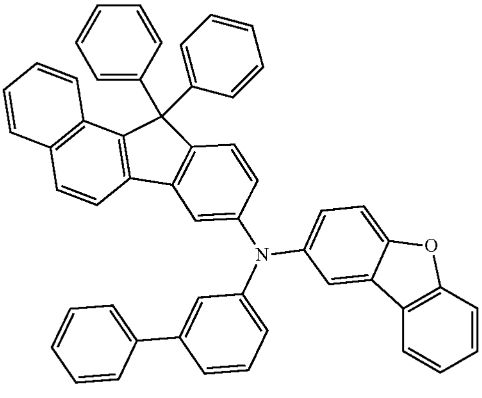

-continued
P-67
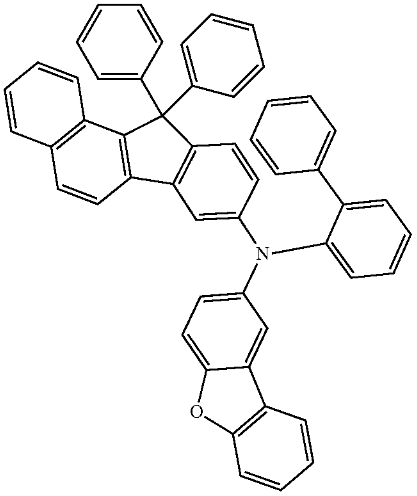
P-68
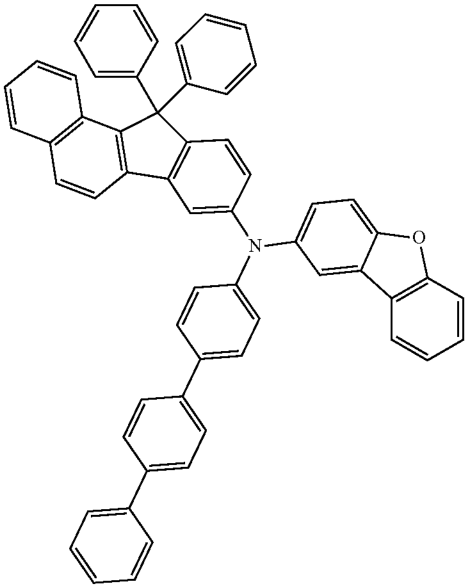
P-69
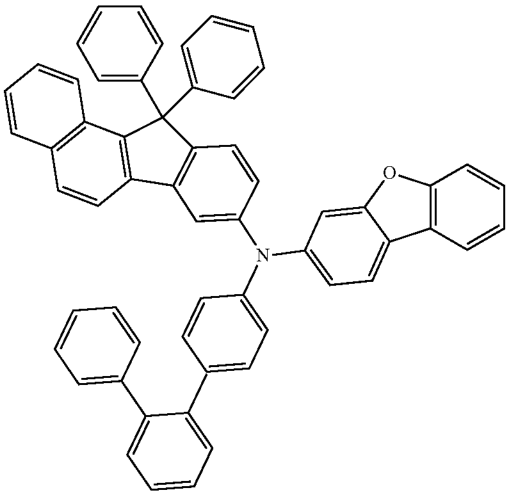
-continued
P-70
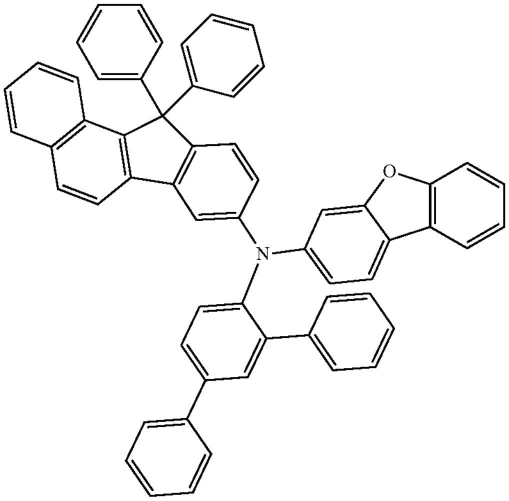
P-71
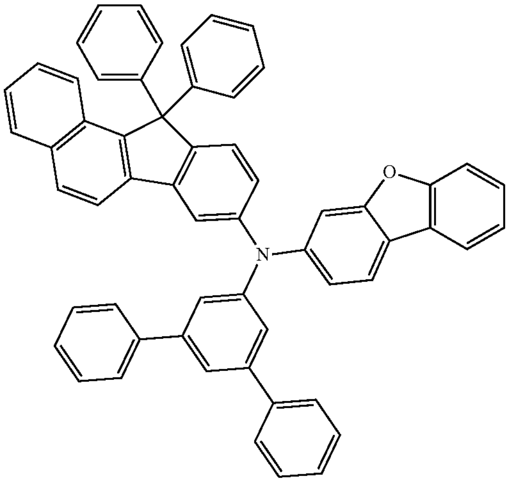
P-72
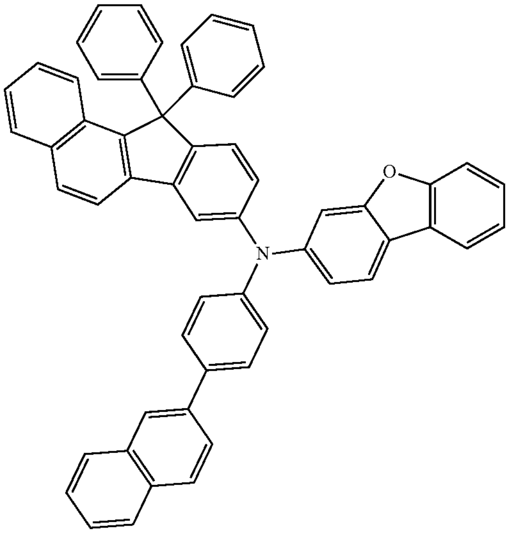

-continued
P-73
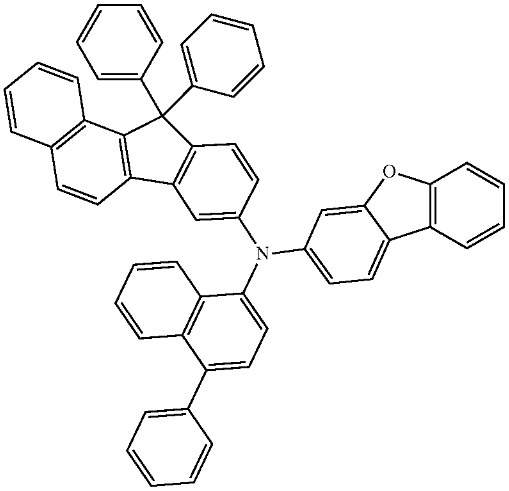
P-74
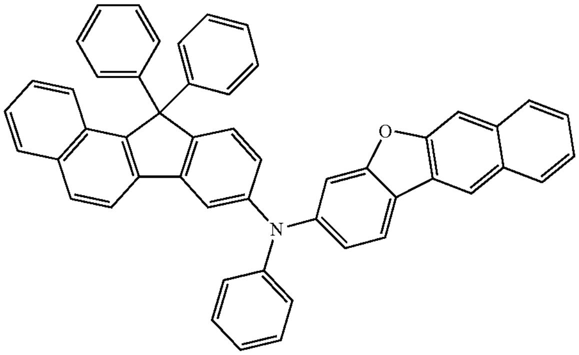
P-75
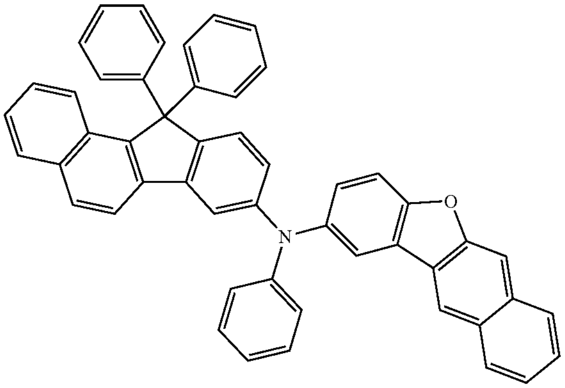
-continued
P-76
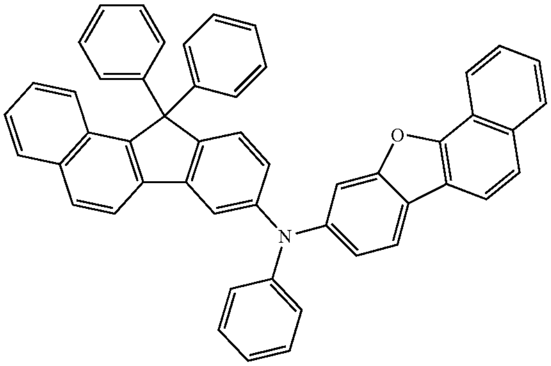
P-77
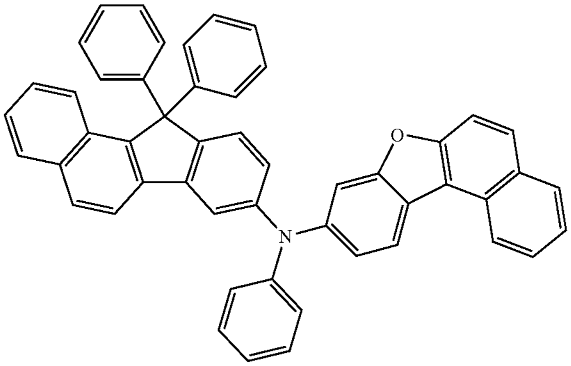
P-78
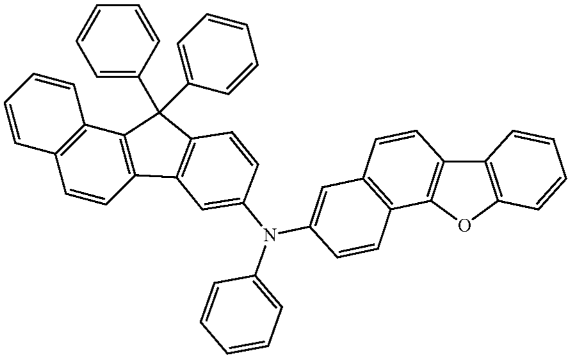

-continued
P-79
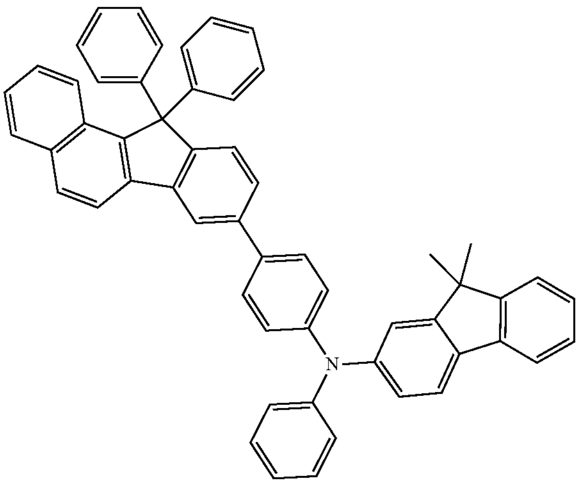
P-80
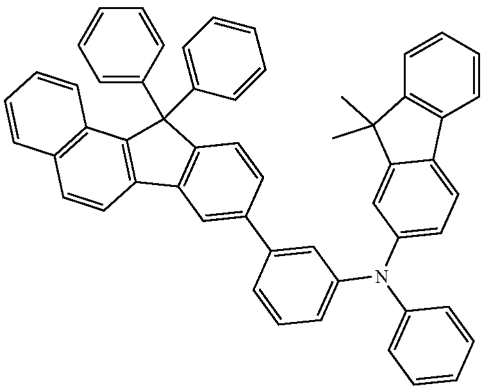
P-81
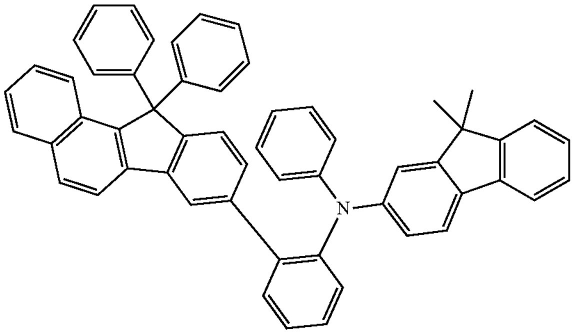
-continued
P-82
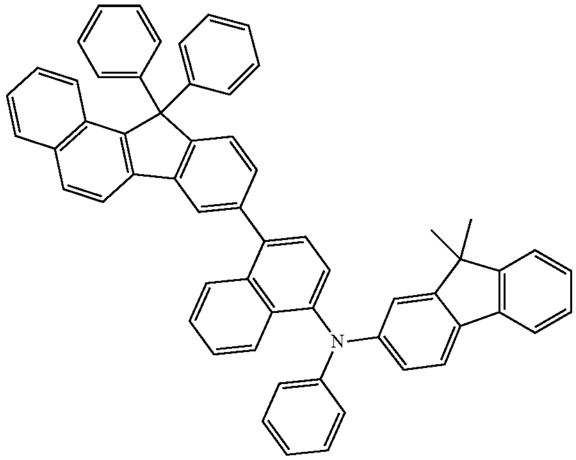
P-83
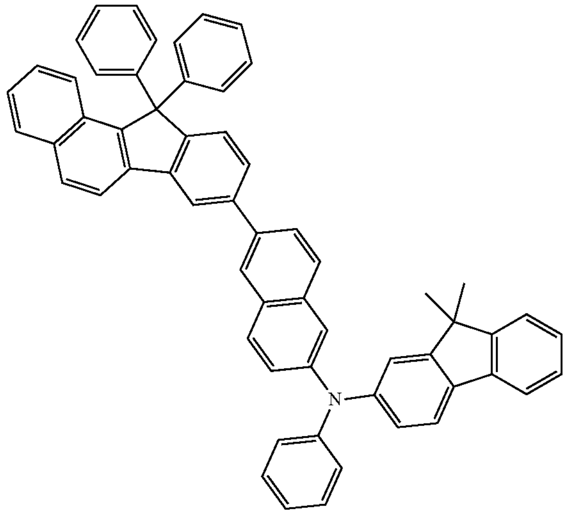
P-84
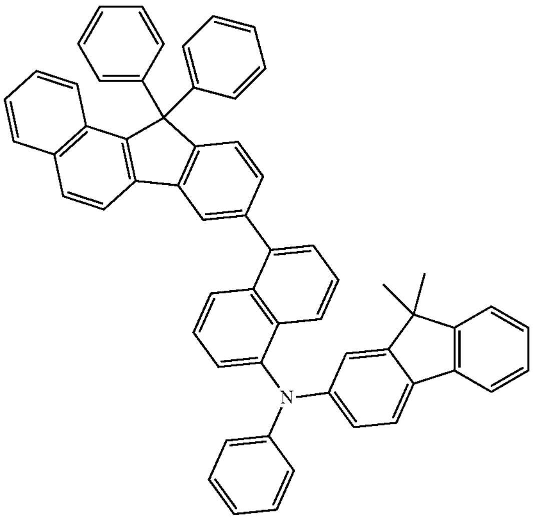

-continued
P-85
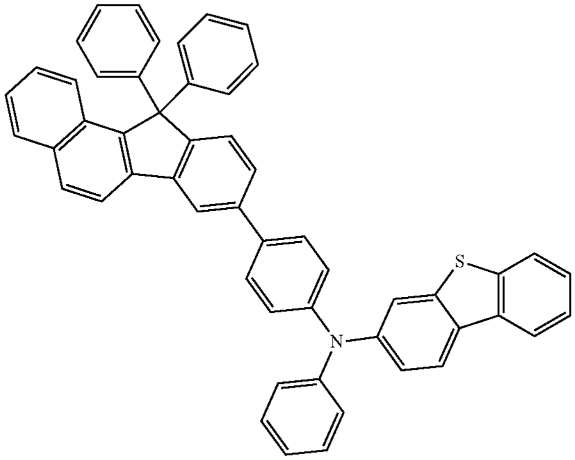
P-86
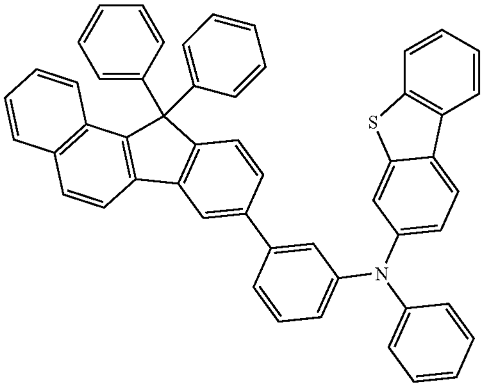
P-87
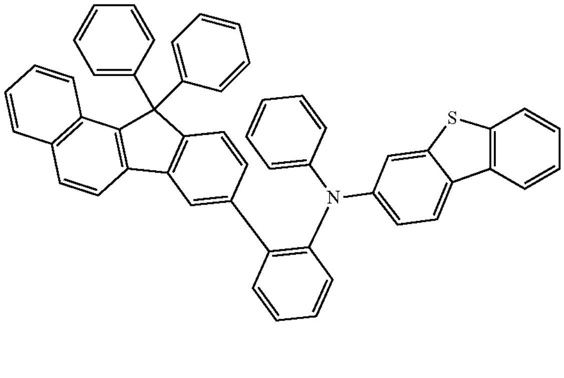
-continued
P-88
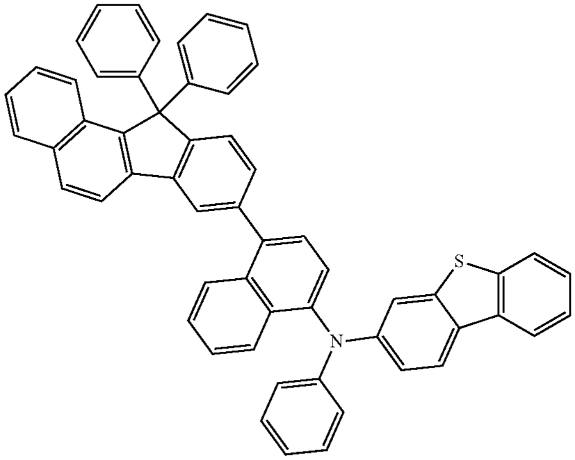
P-89
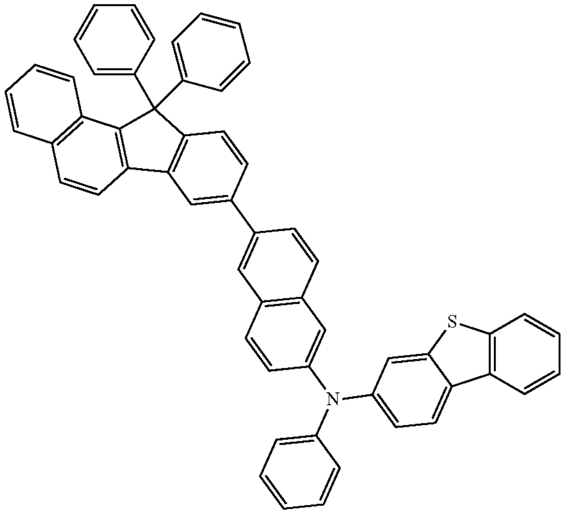
P-90
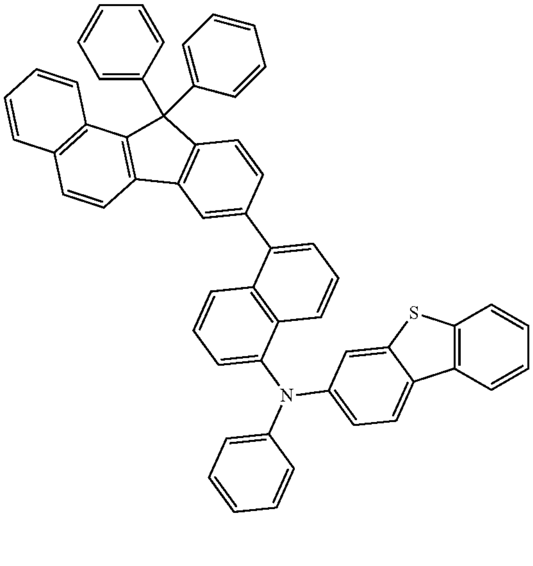

-continued
P-91
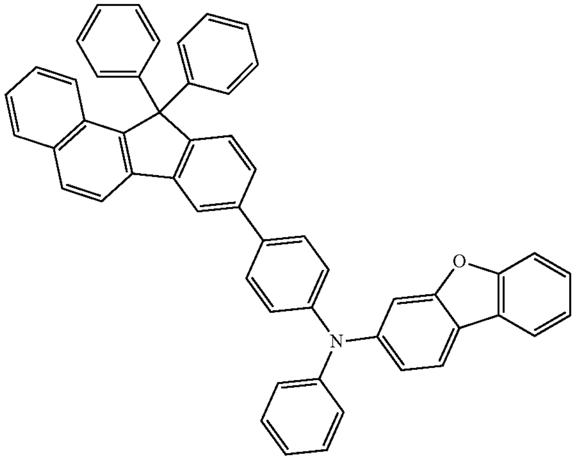
P-92
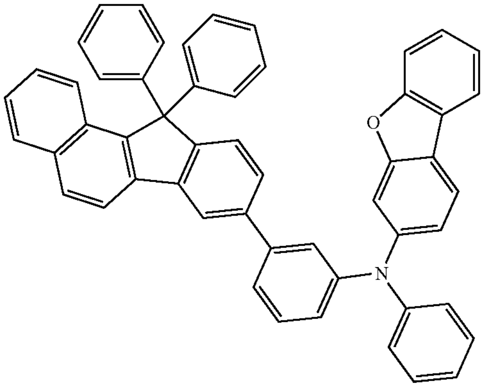
P-93
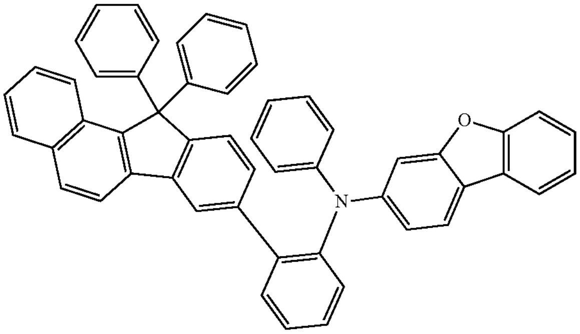
-continued
P-94
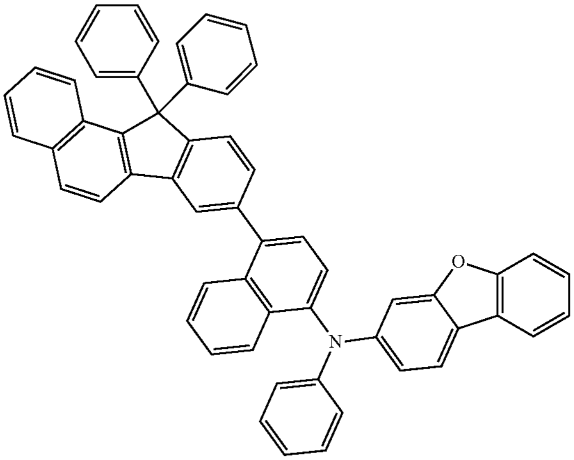
P-95
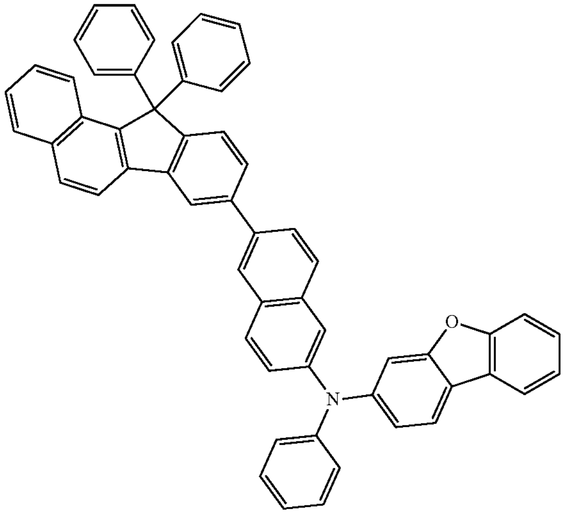
P-96
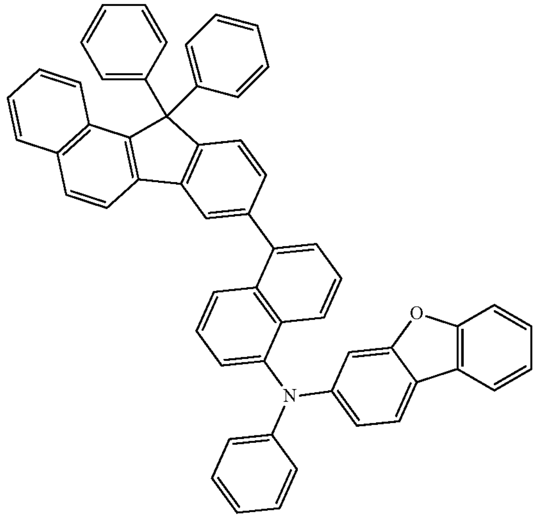

-continued
P-97
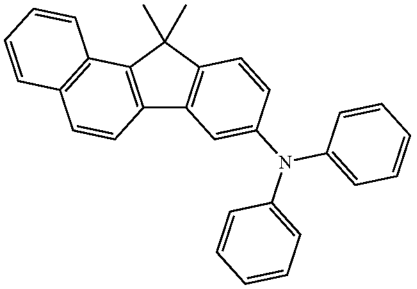
P-98
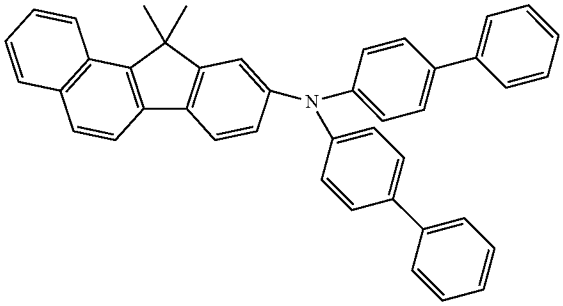
P-99
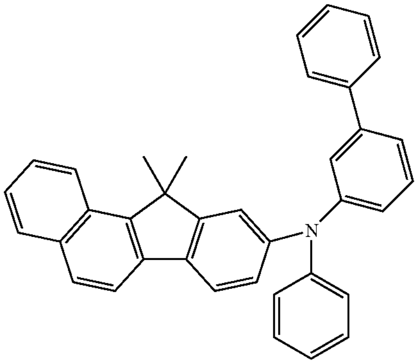
P-100
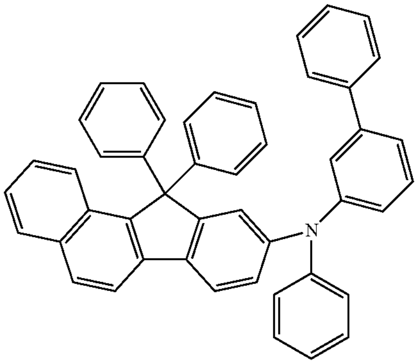
P-101
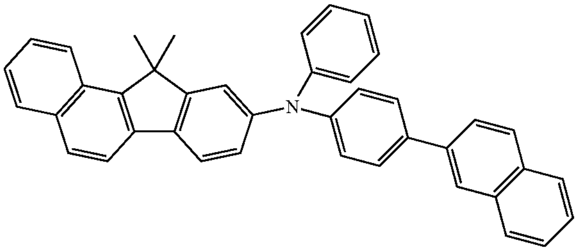
-continued
P-102
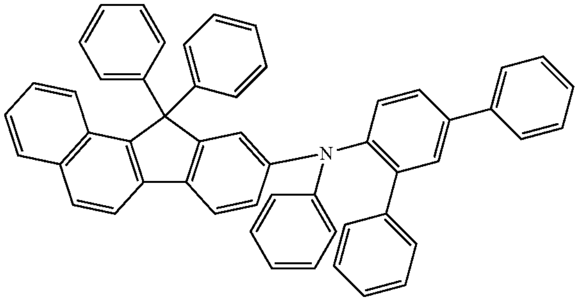
P-103
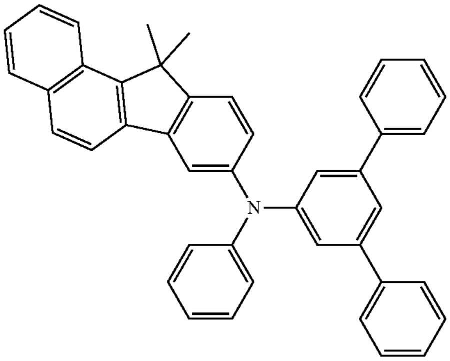
P-104
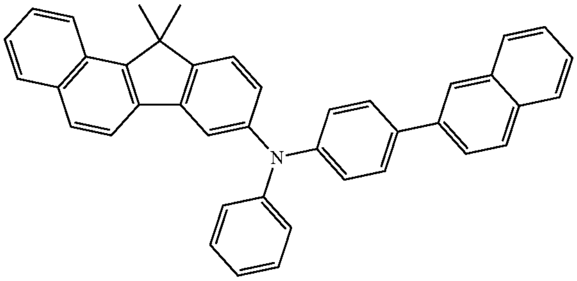
P-105
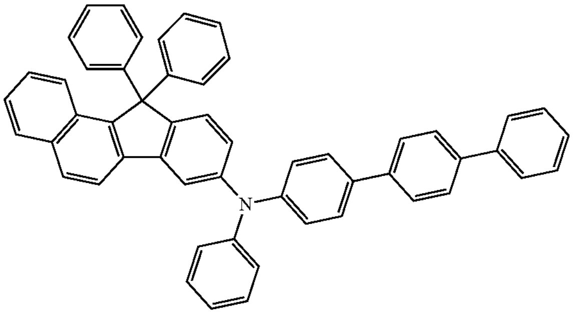

-continued
P-106
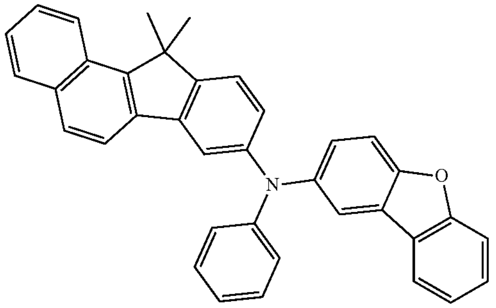
P-107
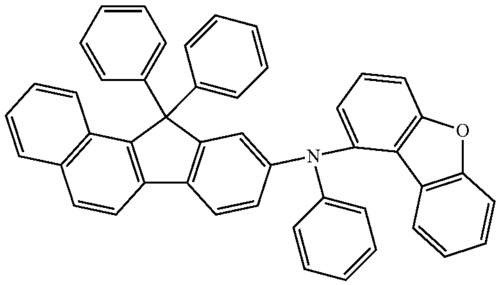
P-108
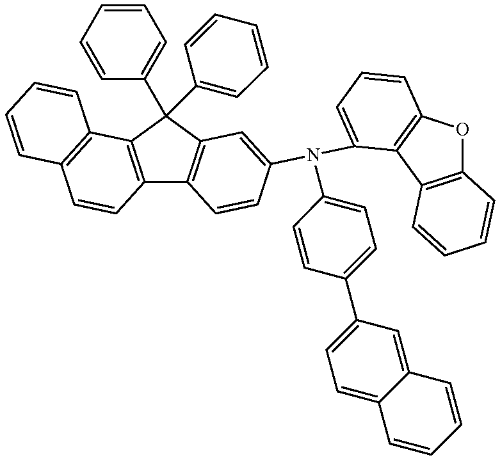
P-109
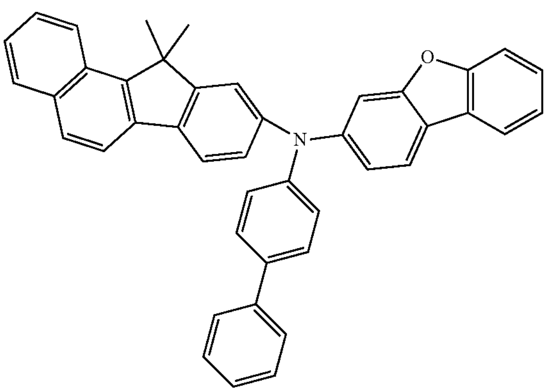
-continued
P-110
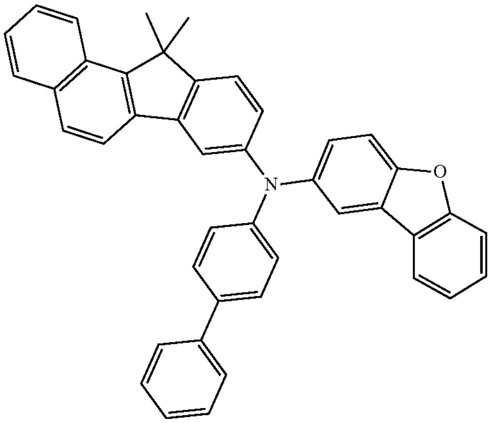
P-111
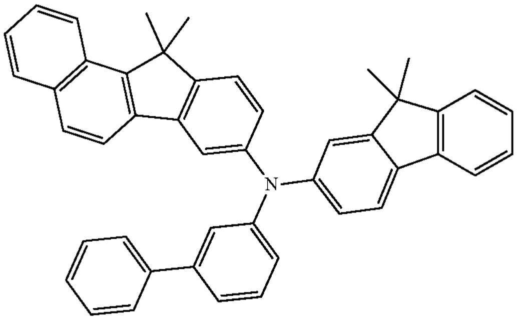
P-112
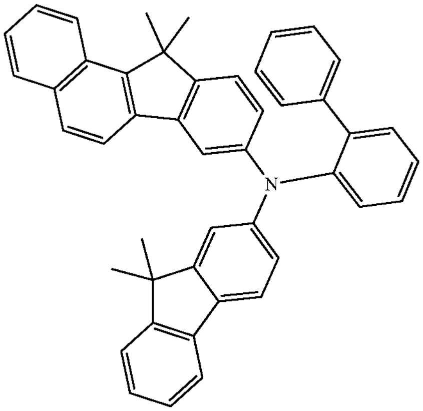

-continued
P-113
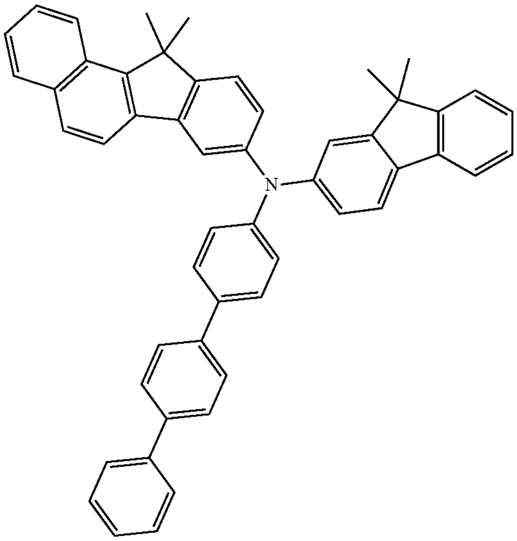
P-114
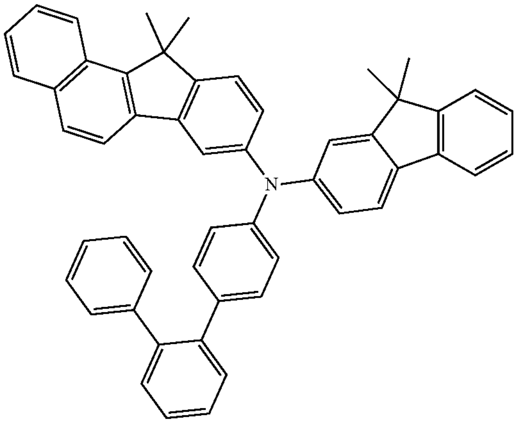
P-115
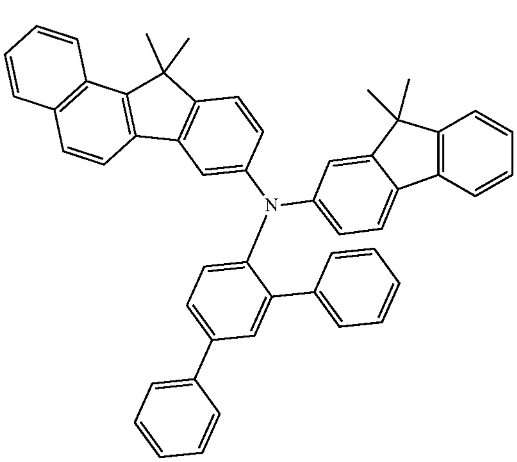
-continued
P-116
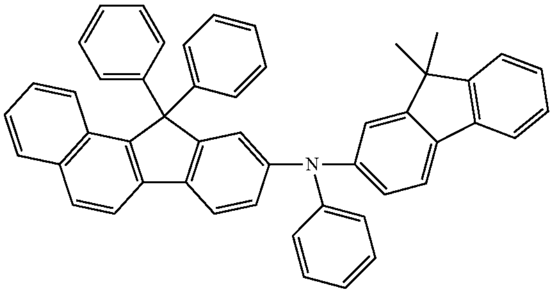
P-117
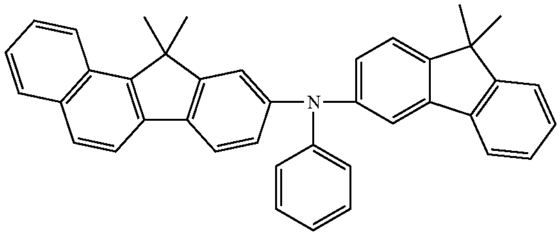
P-118
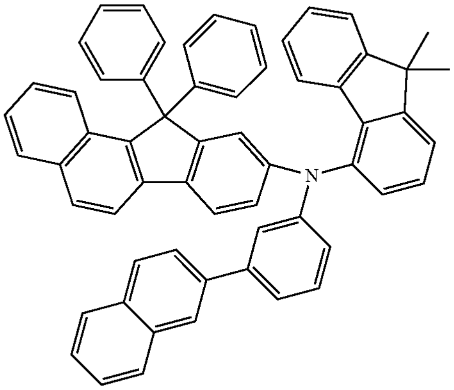
P-119
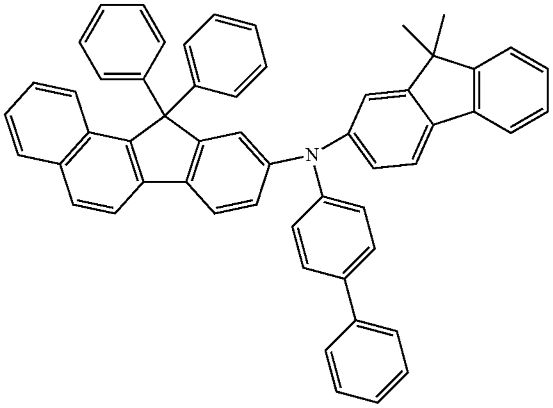

-continued
P-120
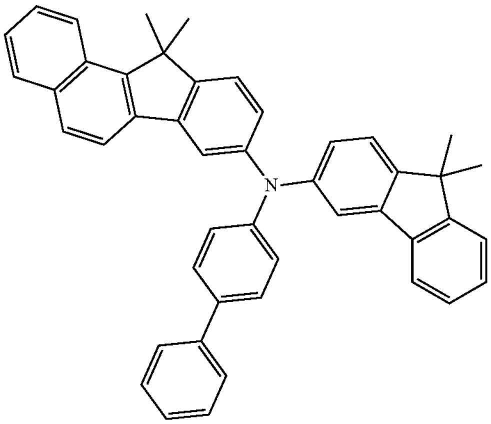
P-121
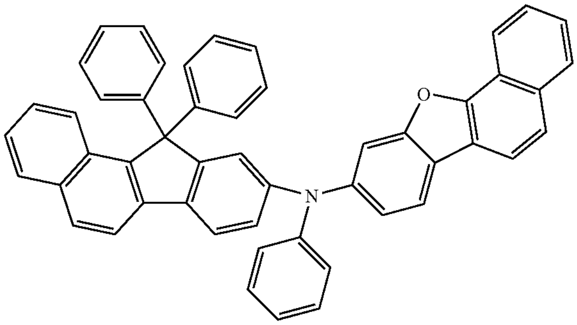
P-122
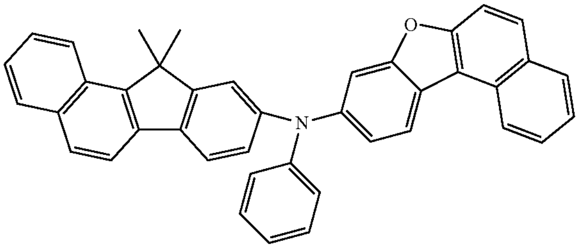
P-123
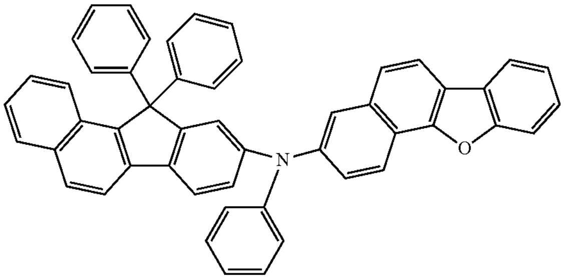
-continued
P-124
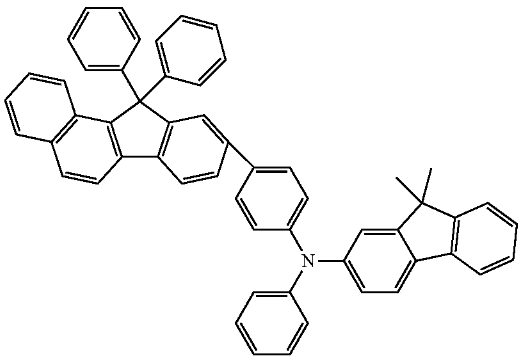
and
P-125
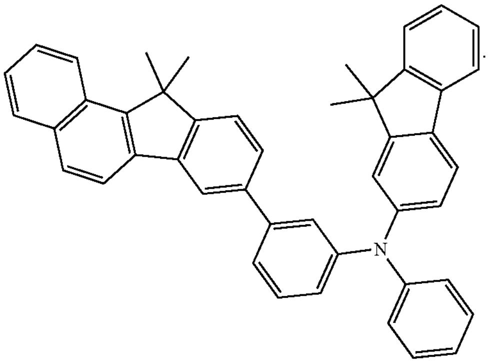
.
4. The organic electroluminescent device according to claim 1, wherein formula 3-1, 3-2 and 3-4 to 3-13 represents at least one selected from the following compounds:
H1-1
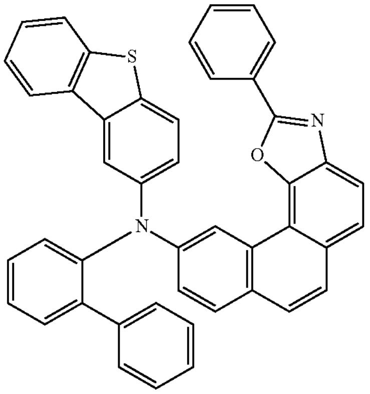

-continued
H1-2
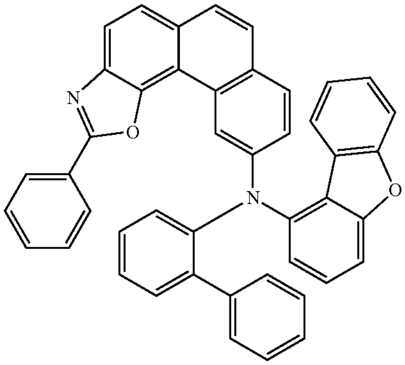
H1-3
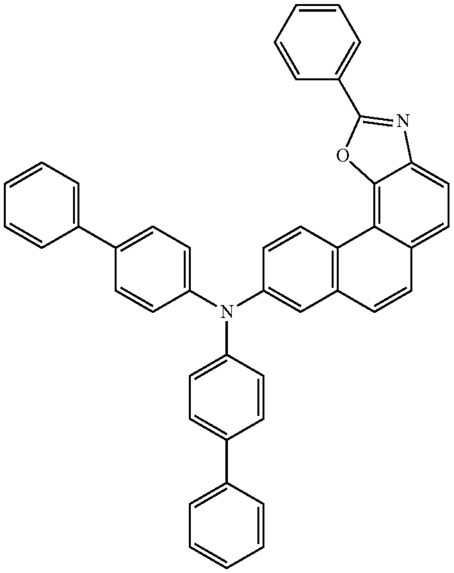
H1-4
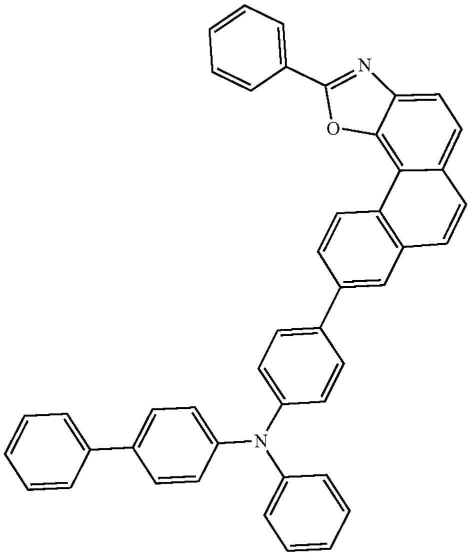
-continued
H1-5
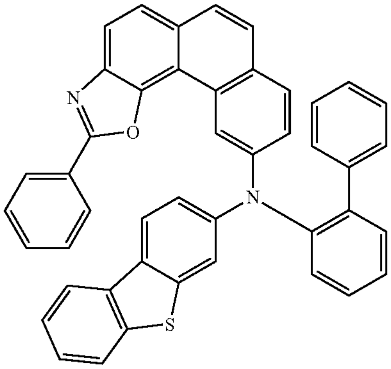
H1-6
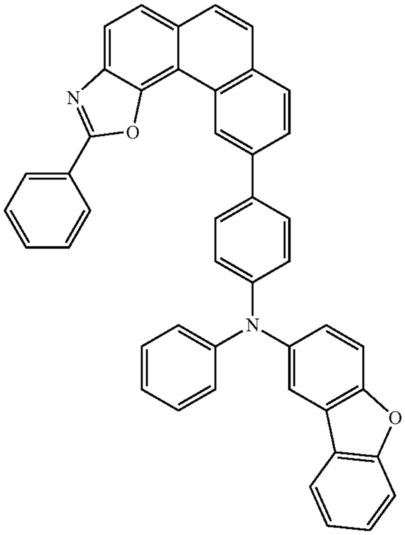
H1-7
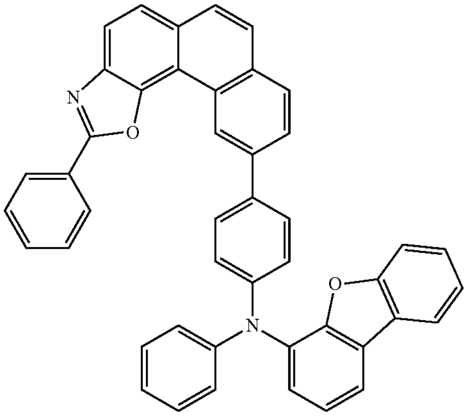

-continued
H1-8
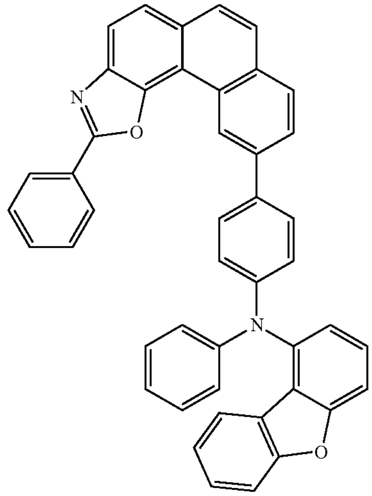
H1-9
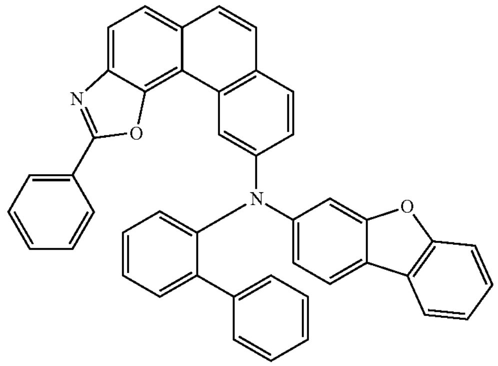
H1-10
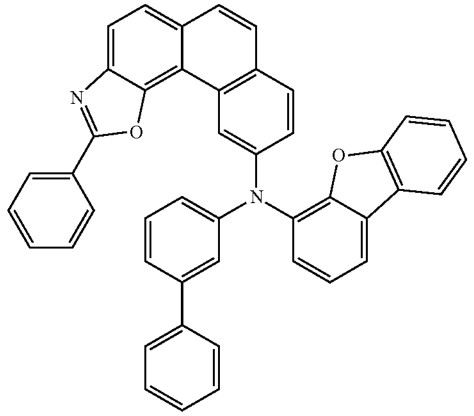
-continued
H1-11
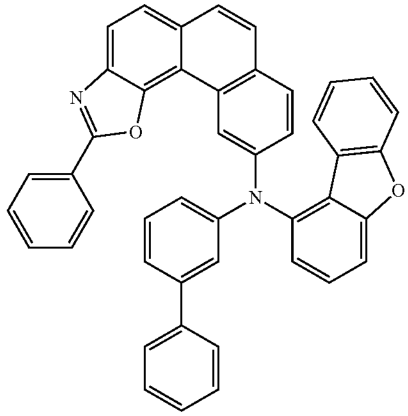
H1-12
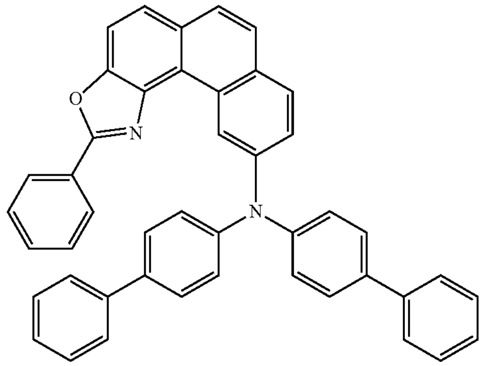
H1-13
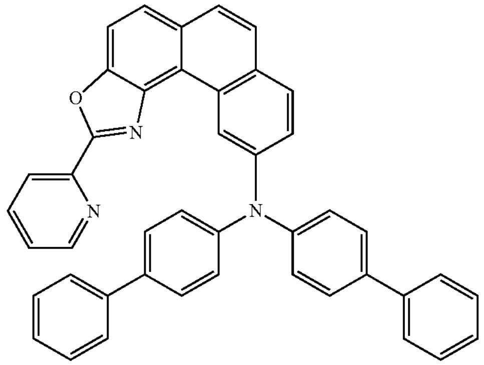
H1-14
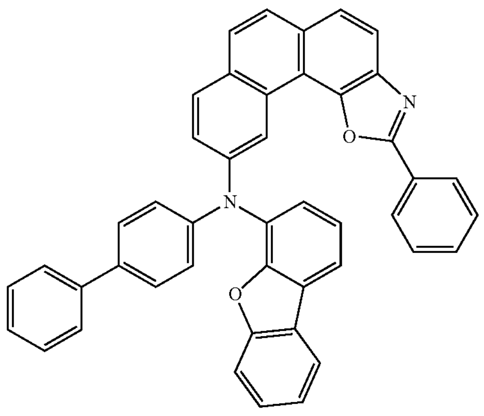

-continued
H1-15
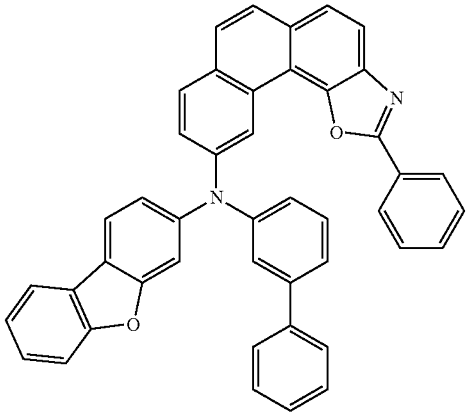
H1-16
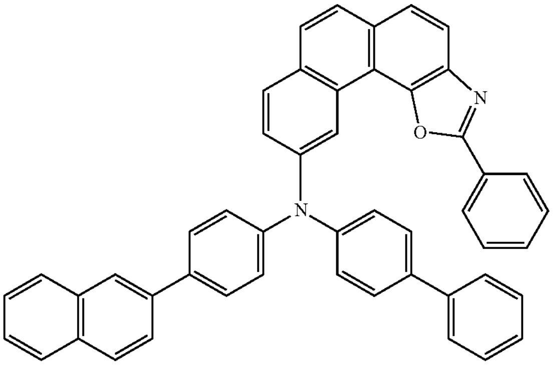
H1-17
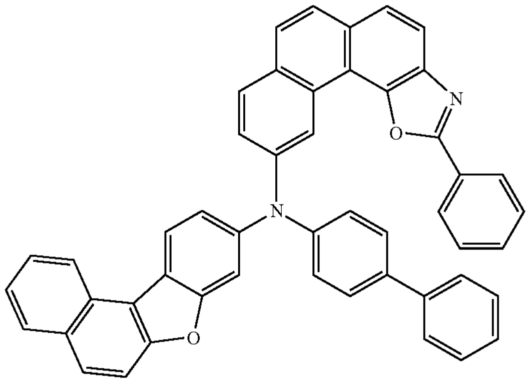
H1-18
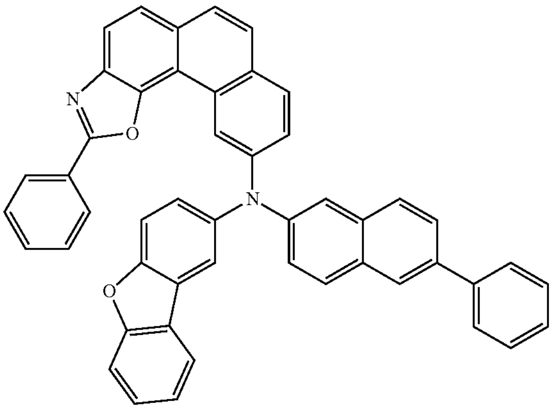
-continued
H1-19
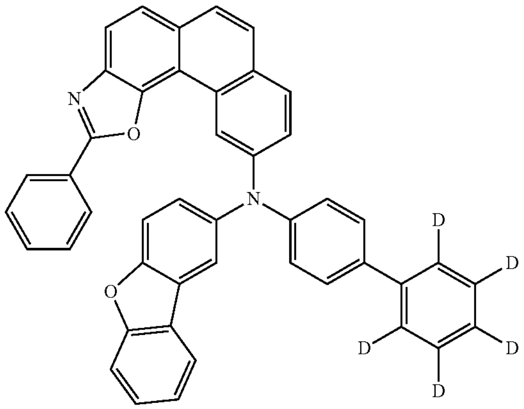
H1-20
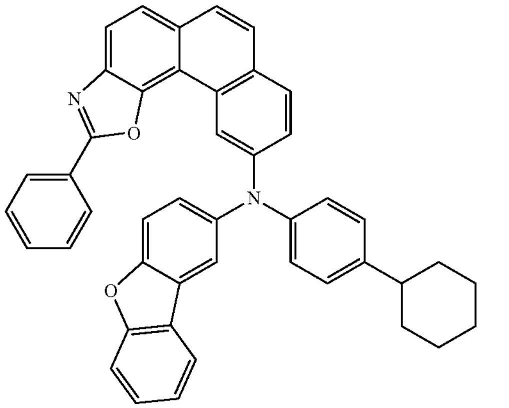
H1-21
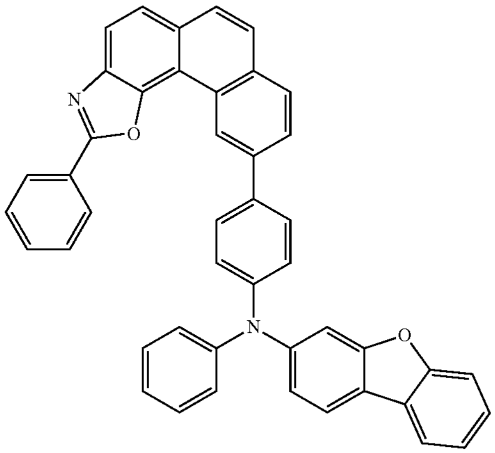

-continued
H1-22
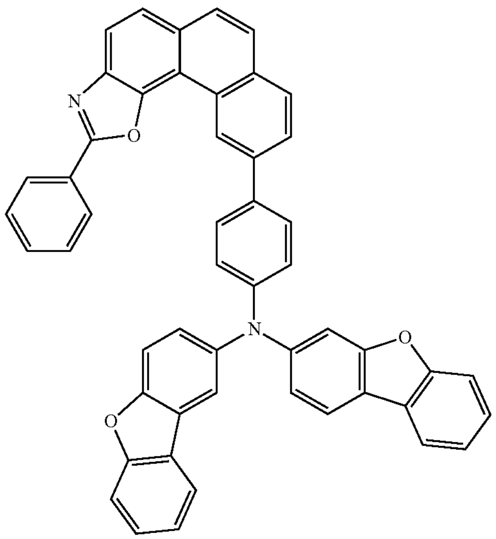
H1-23
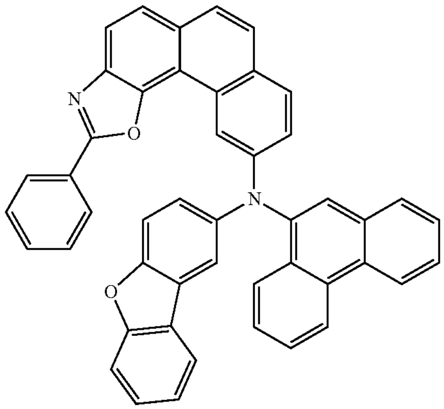
H1-24
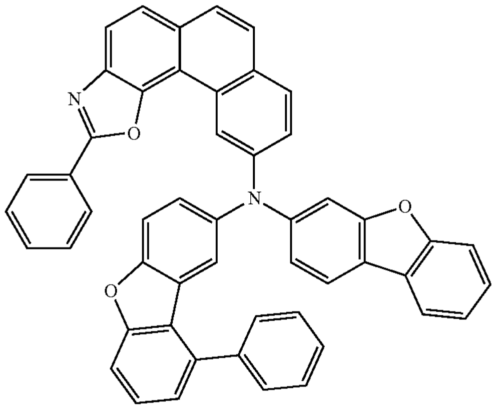
-continued
H1-25
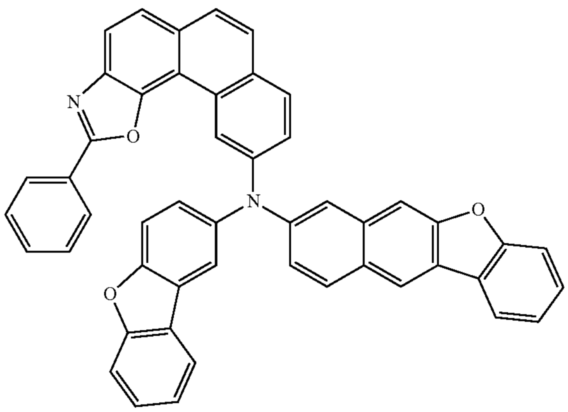
H1-26
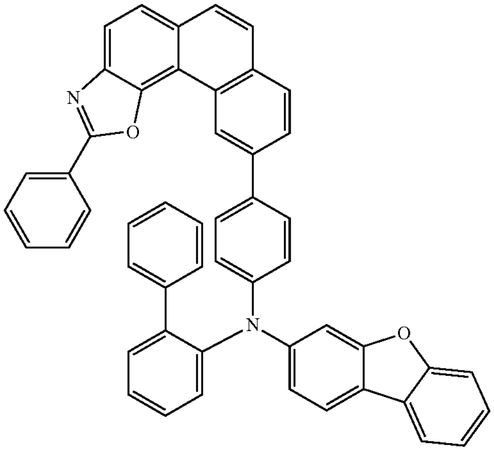
H1-27
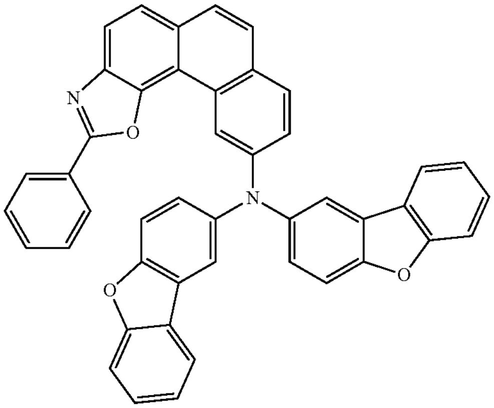

-continued
H1-28
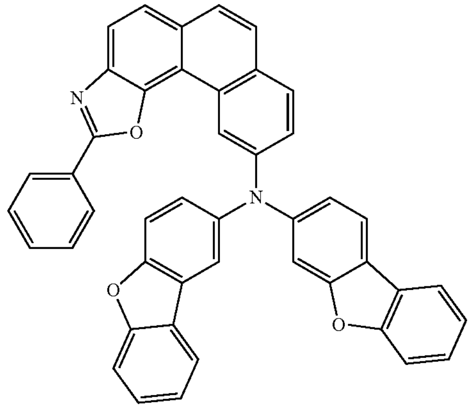
H1-29
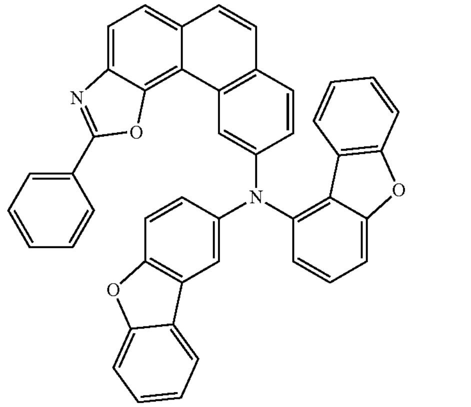
H1-30
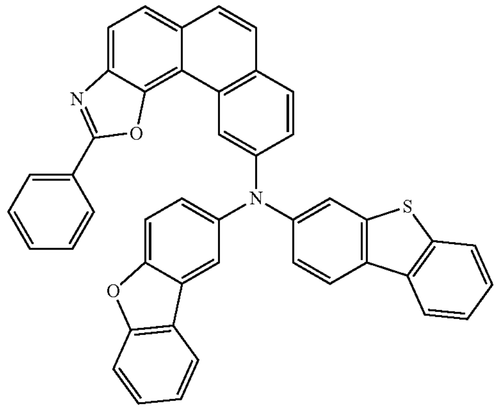
-continued
H1-31
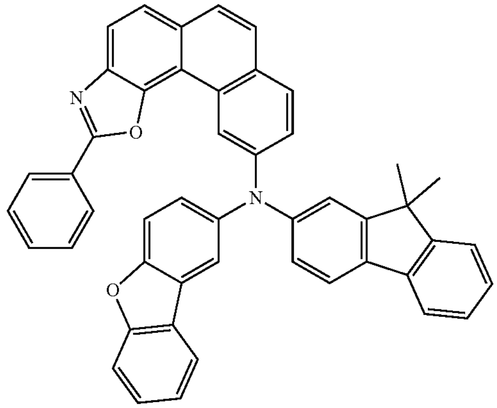
H1-32
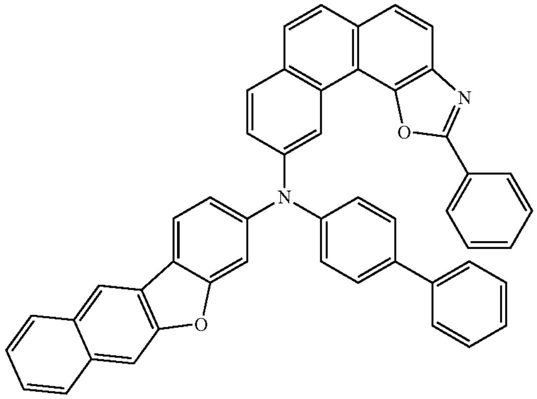
H1-33
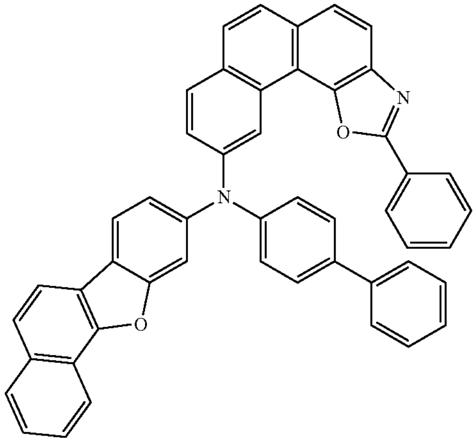

-continued
H1-34
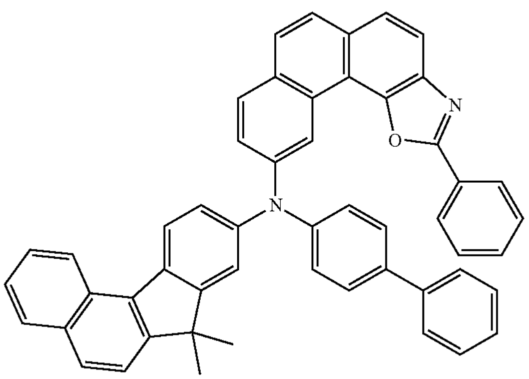
H1-35
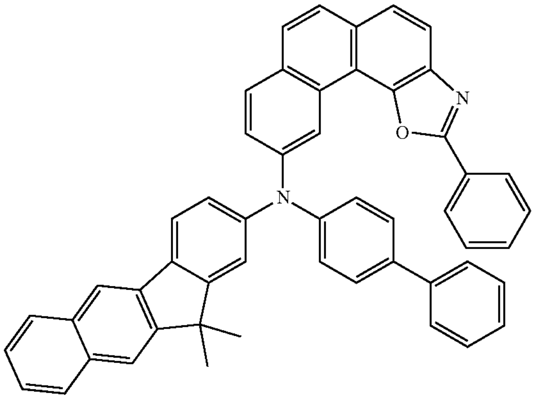
H1-36
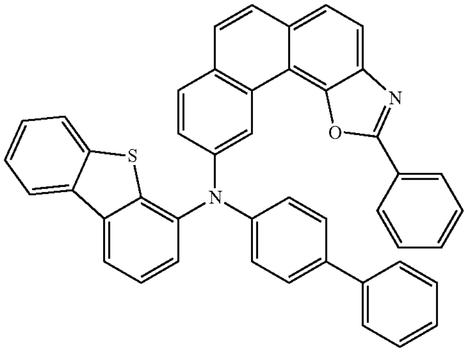
H1-37
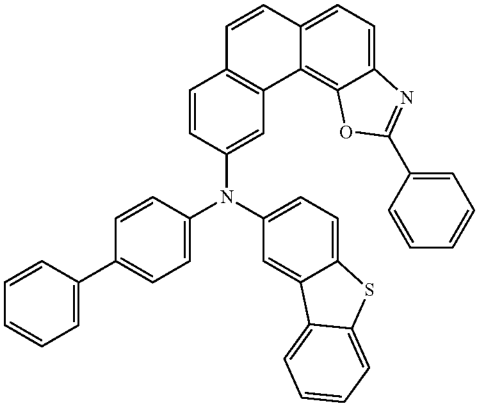
-continued
H1-38
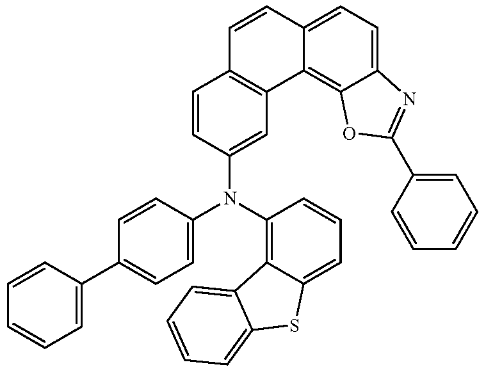
H1-39
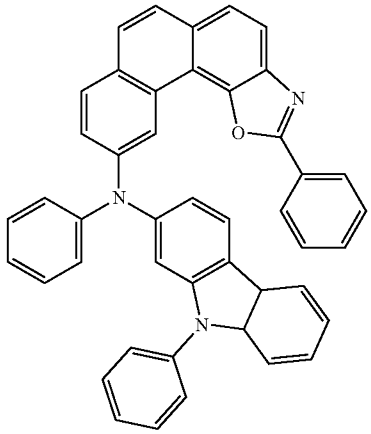
H1-40
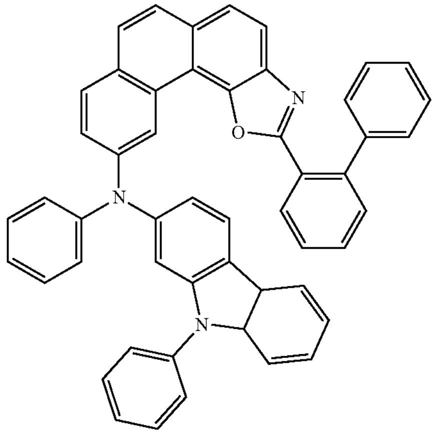
H1-41
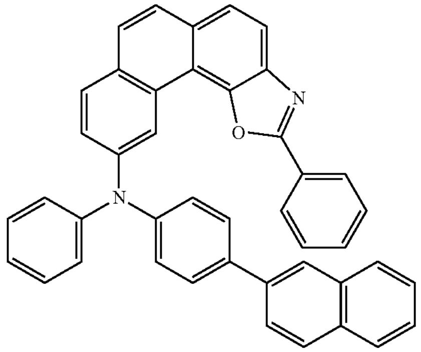

-continued
H1-42
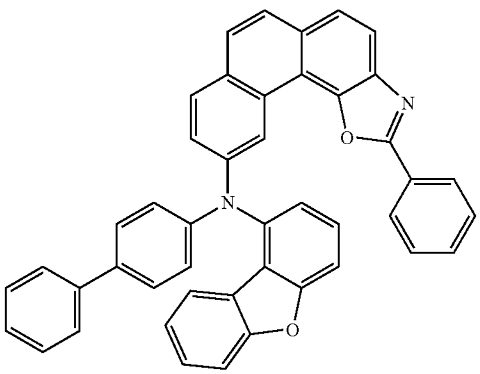
H1-43
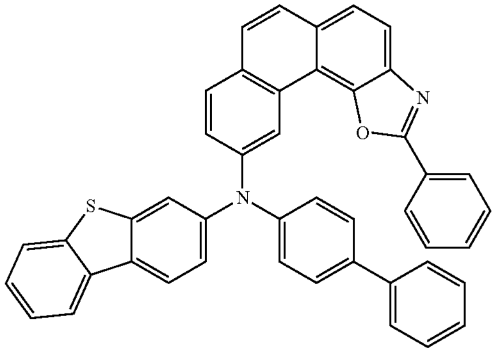
H1-44
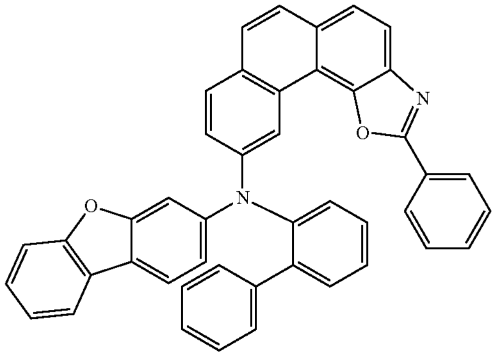
H1-45
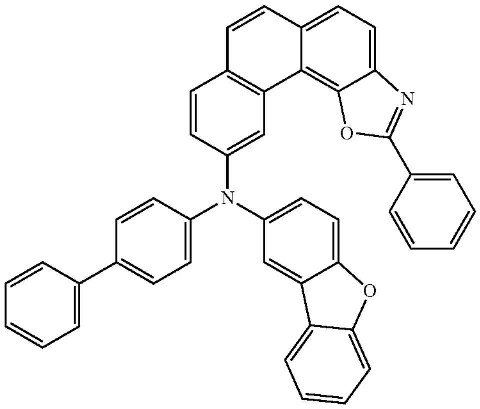
-continued
H1-46
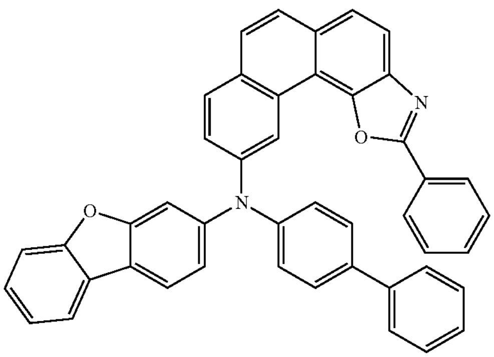
H1-47
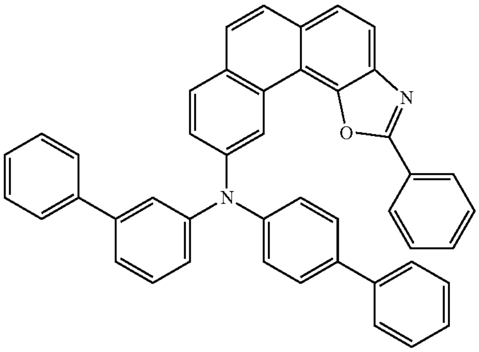
H1-48
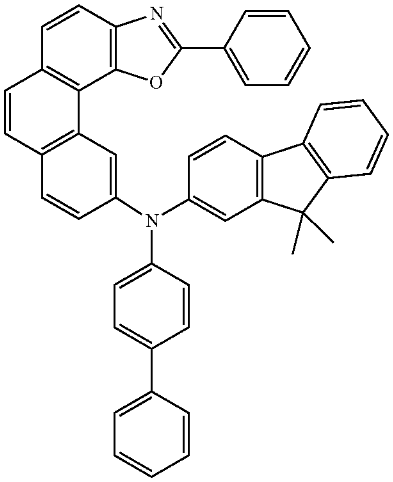
H1-49
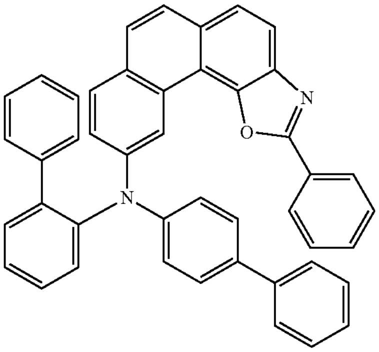

-continued
H1-50
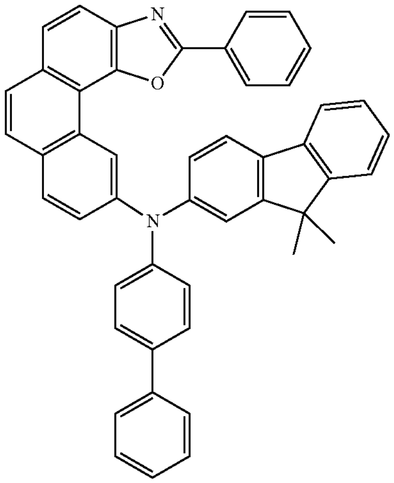
H1-51
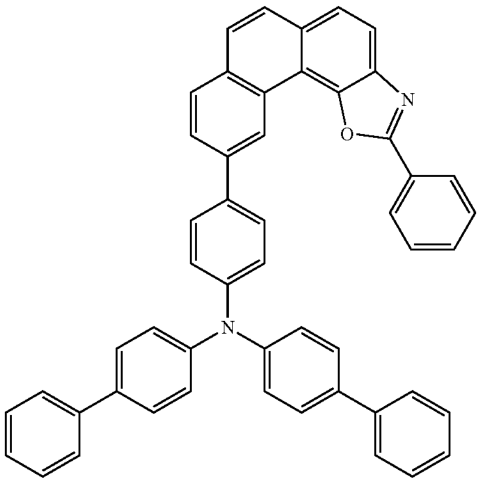
H1-52
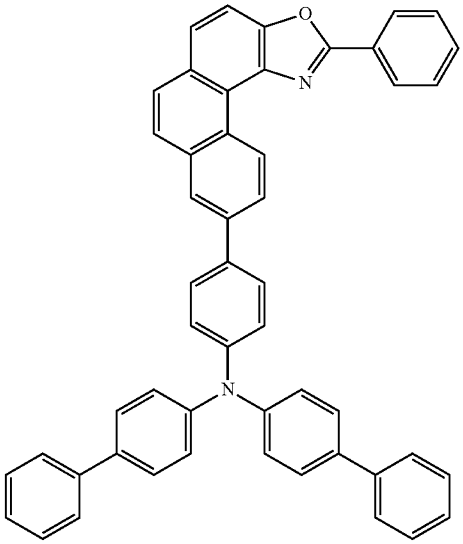
-continued
H1-53
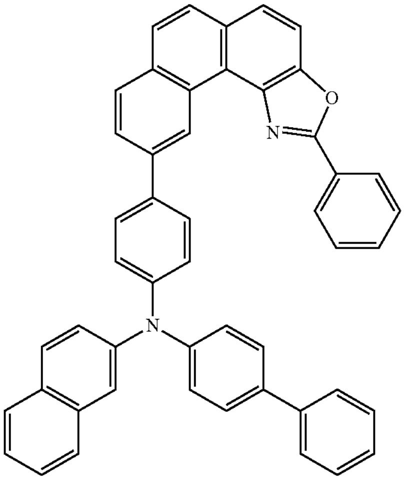
H1-54
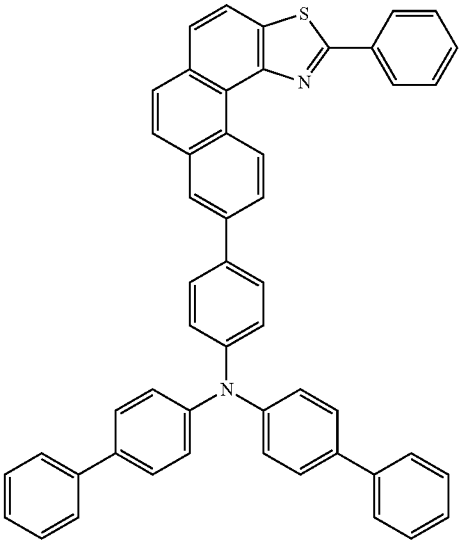
H1-55
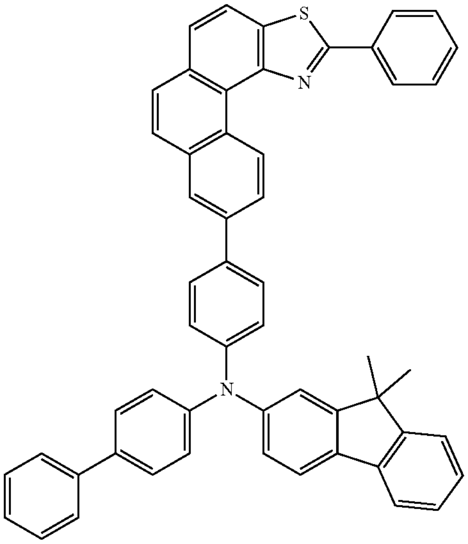

-continued
H1-56
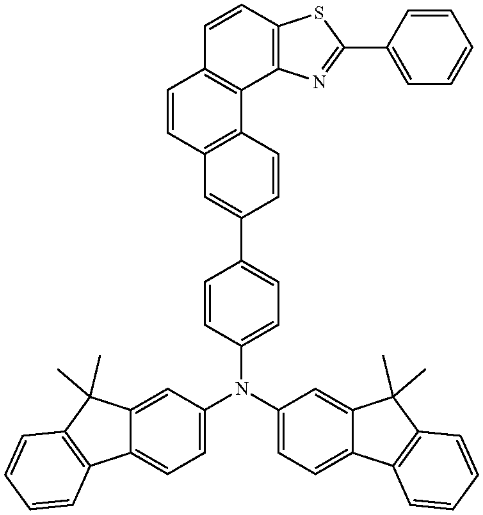
H1-57
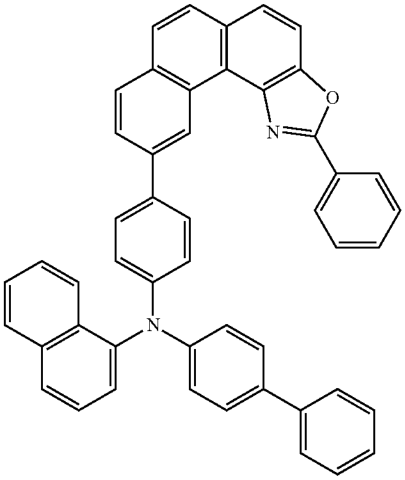
H1-58
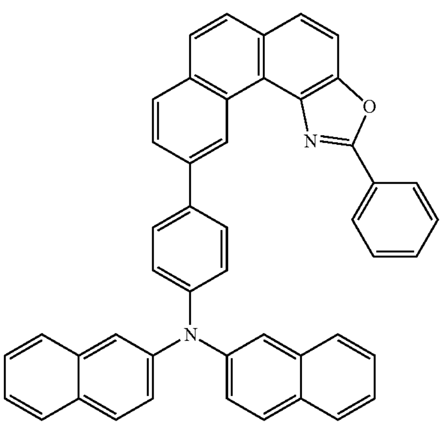
-continued
H1-59
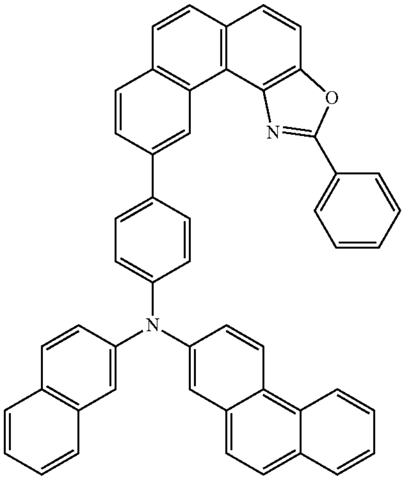
H1-60
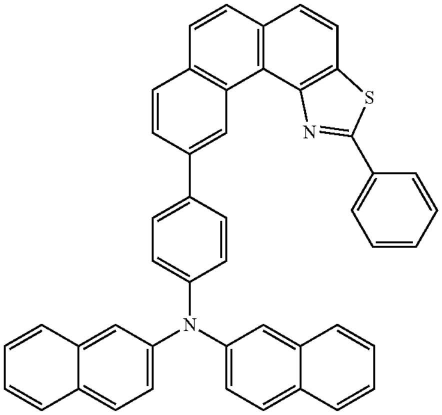
H1-61
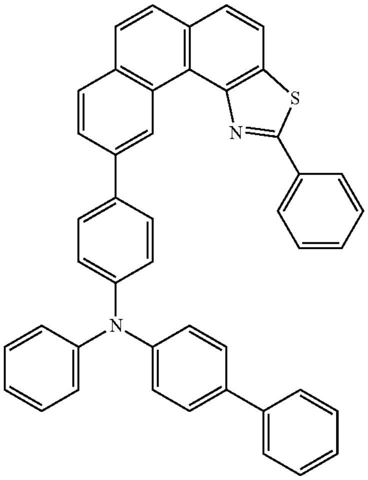

-continued
H1-62
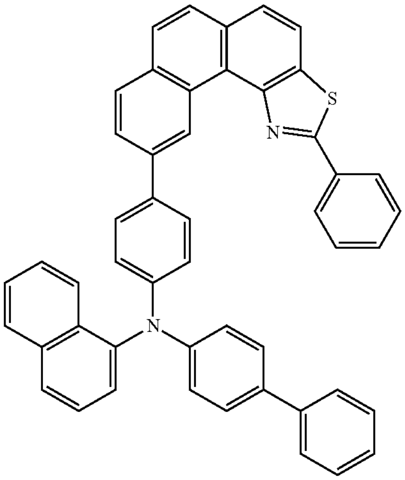
H1-63
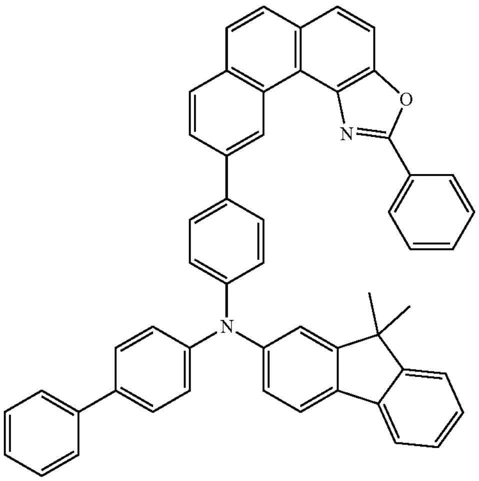
H1-64
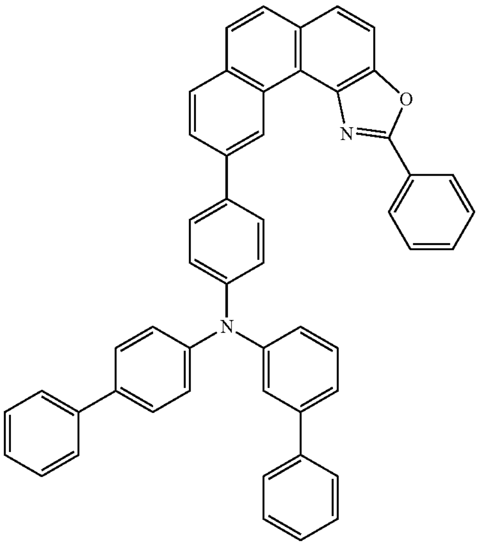
-continued
H1-65
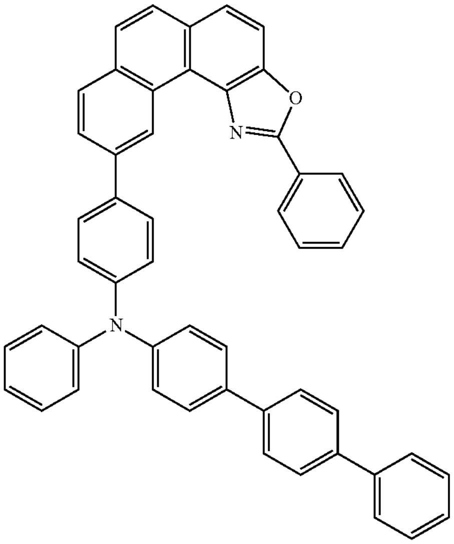
H1-66
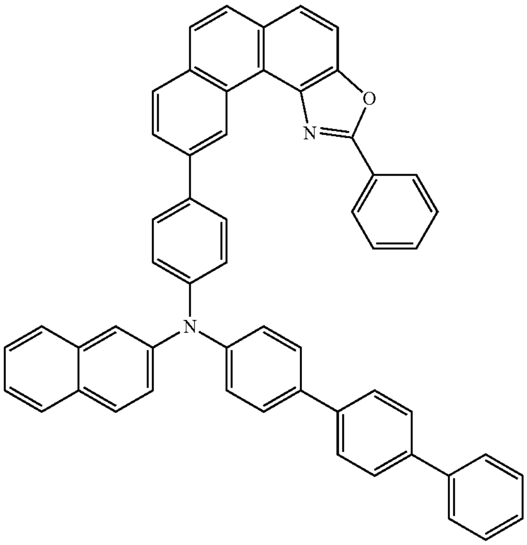
H1-67
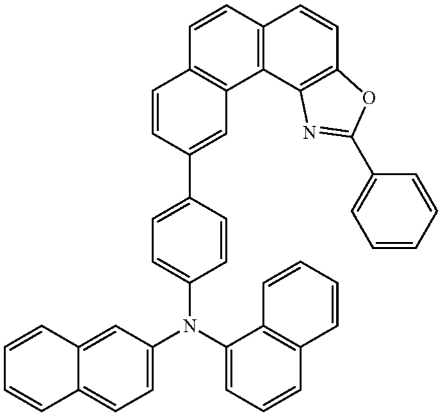

H1-68
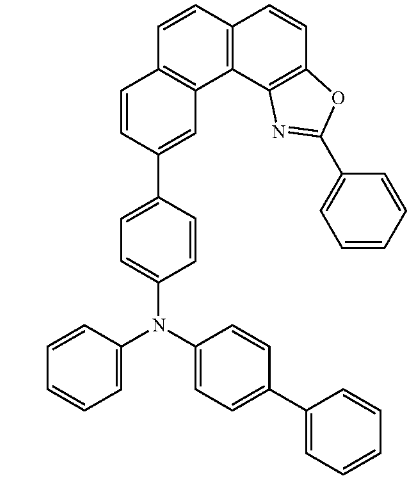
H1-69
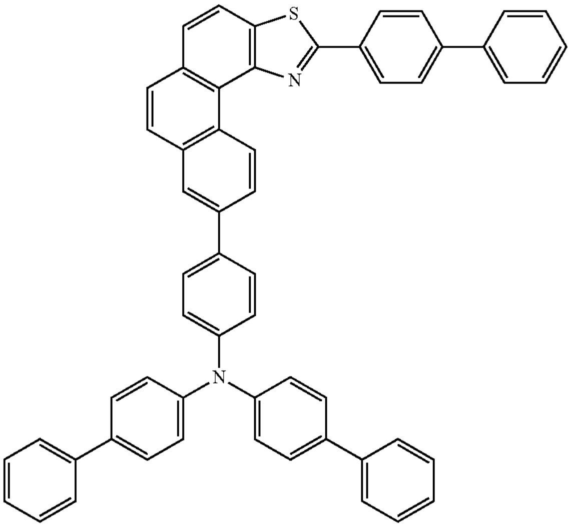
H1-70
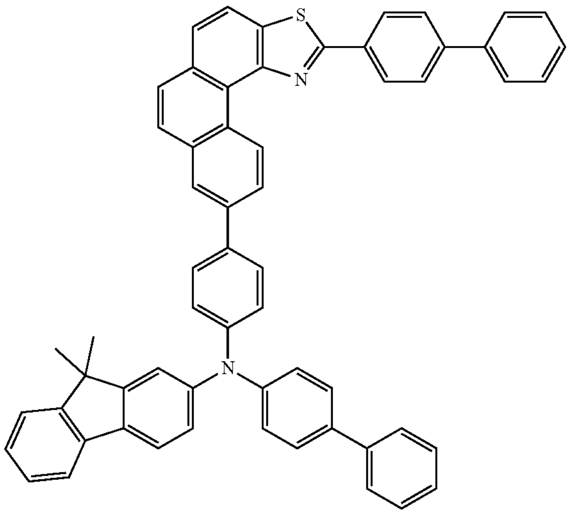
H1-71
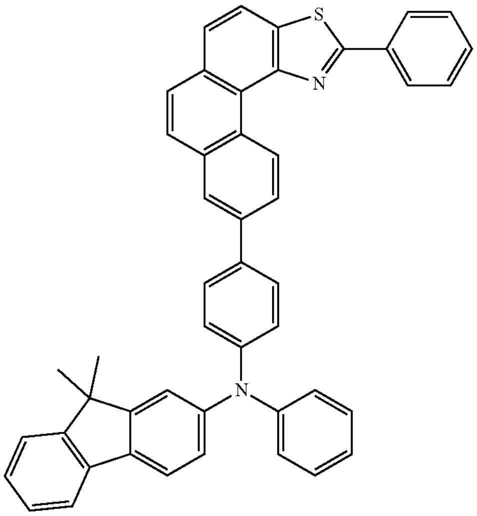
H1-72
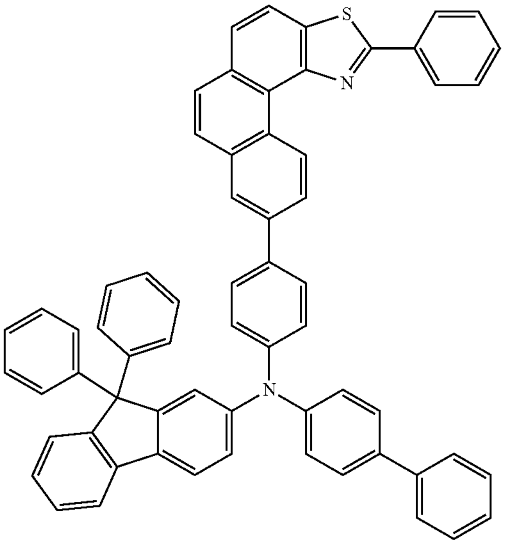
H1-73
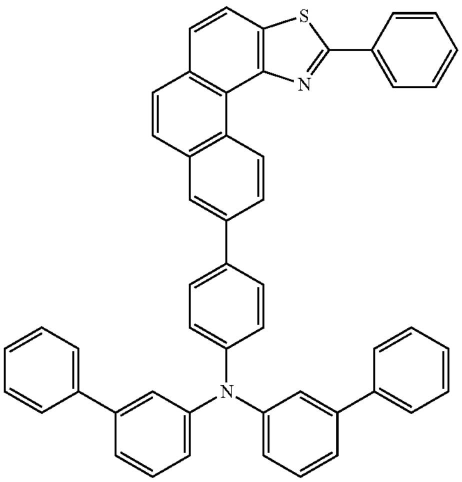

-continued
H1-74
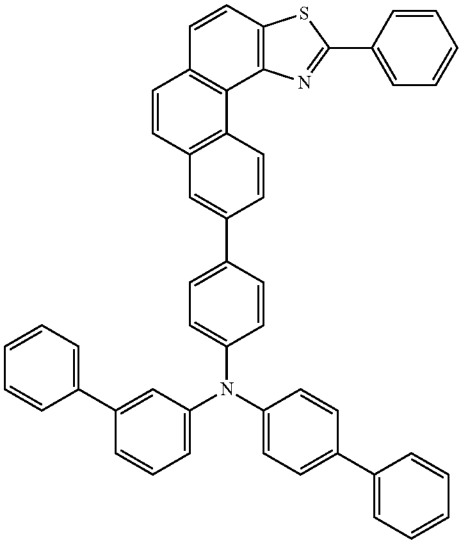
H1-75
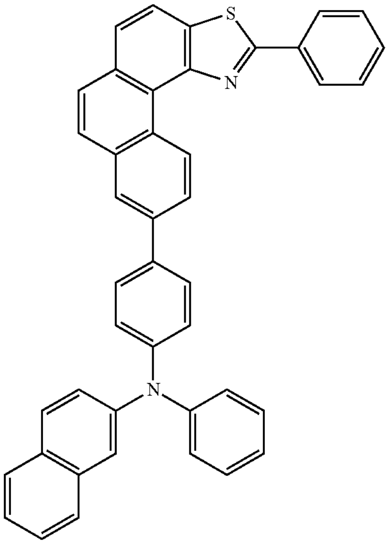
H1-76
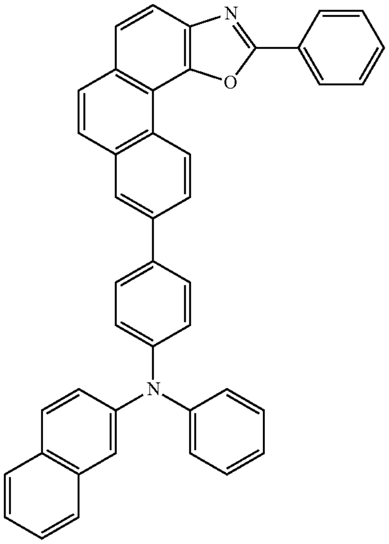
-continued
H1-77
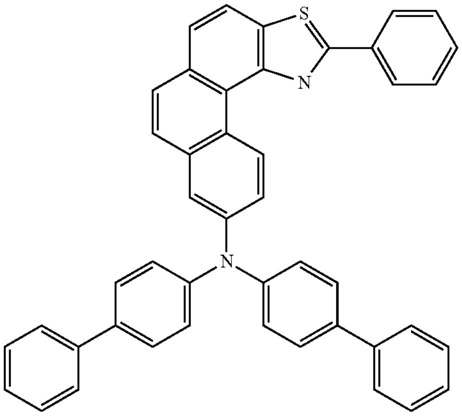
H1-78
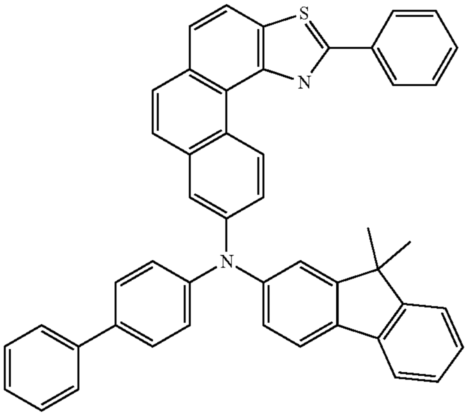
H1-79
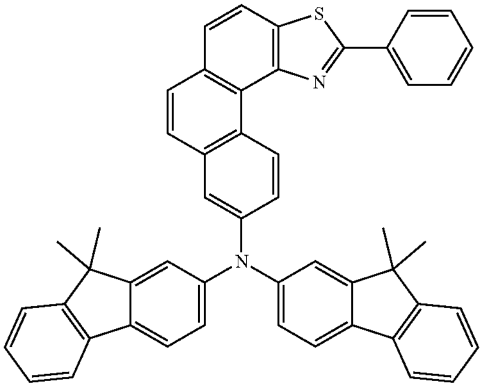

-continued
H1-80
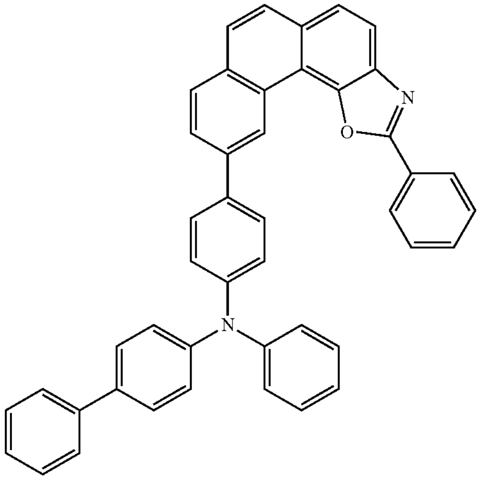
H1-81
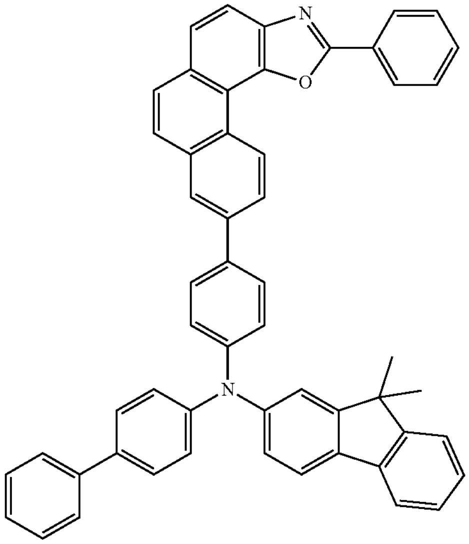
H1-82
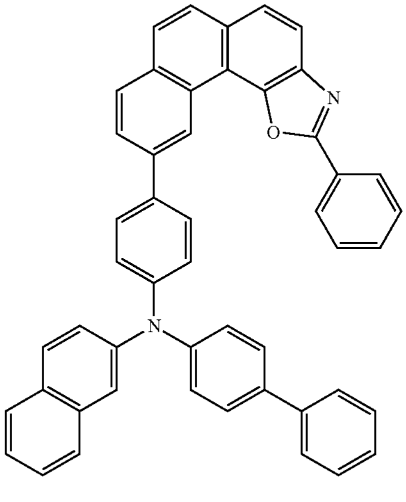
-continued
H1-83
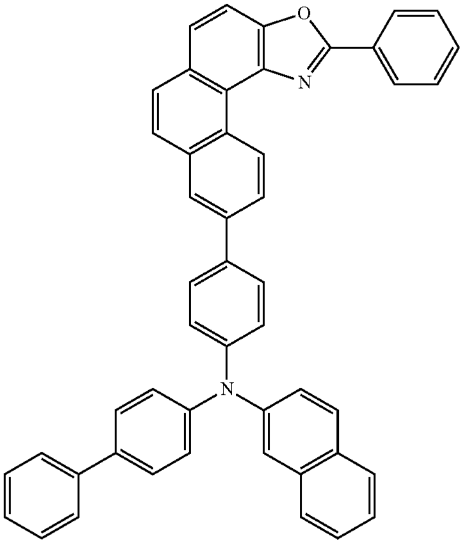
H1-84
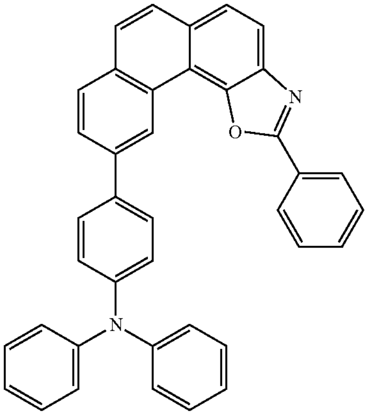
H1-85
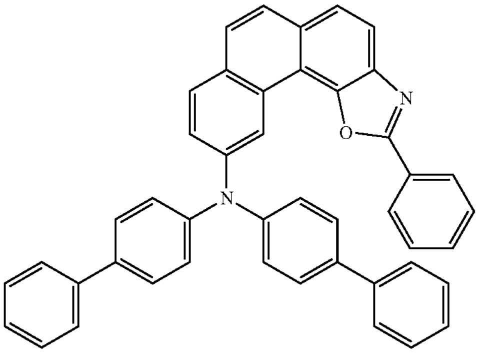

-continued
H1-86
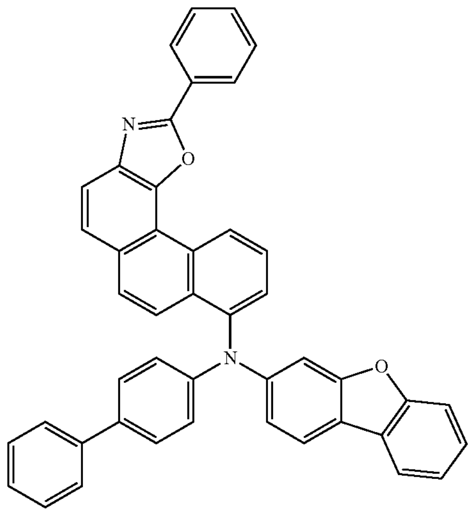
H1-87
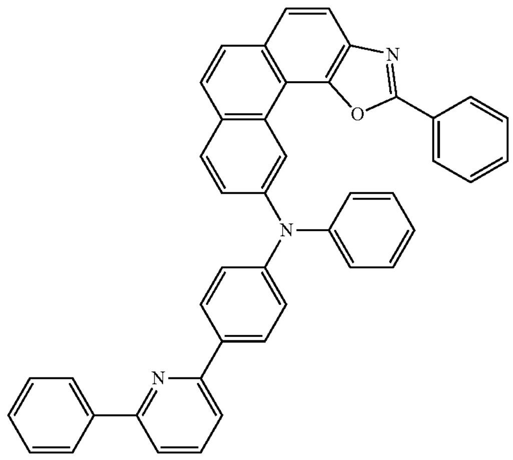
H1-88
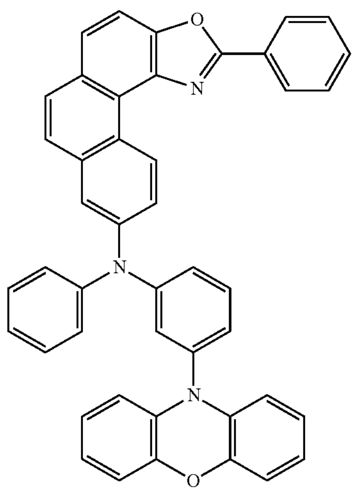
-continued
H1-89
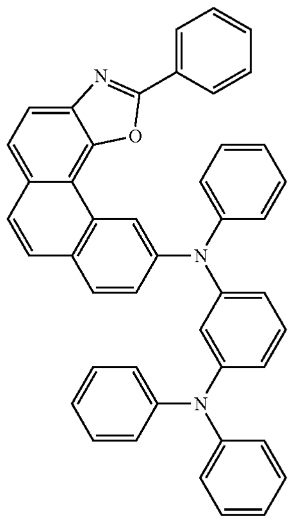
H1-90
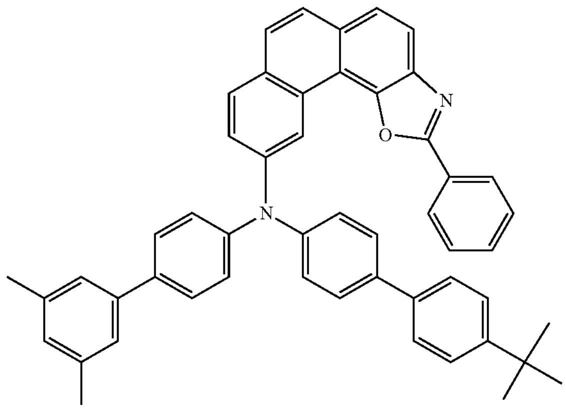
H1-91
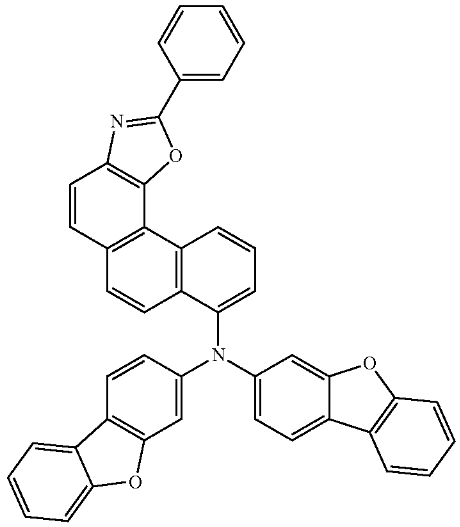

-continued
H1-92
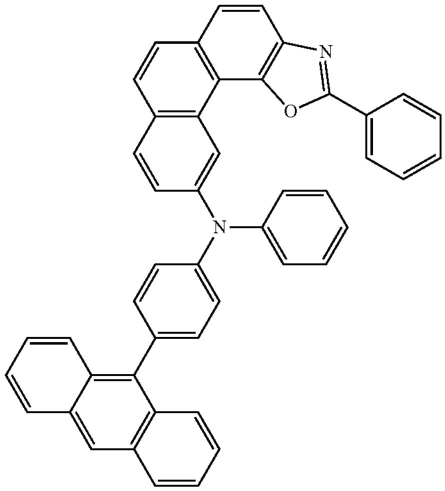
H1-93
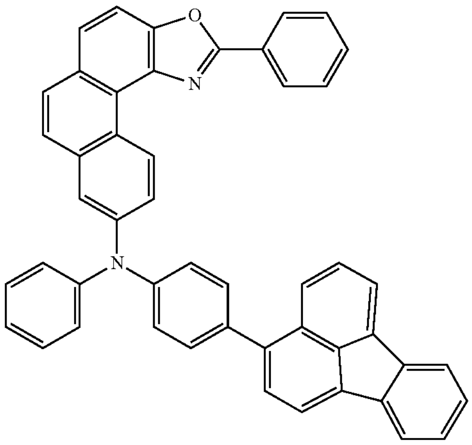
H1-94
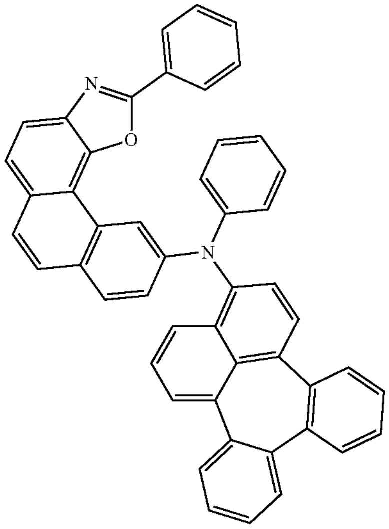
-continued
H1-95
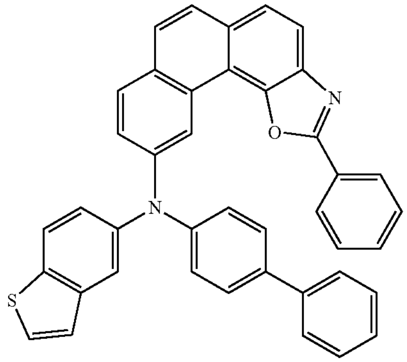
H1-96
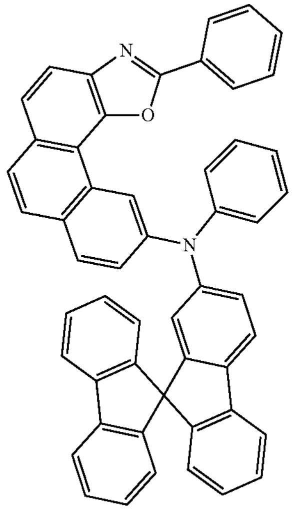
H1-97
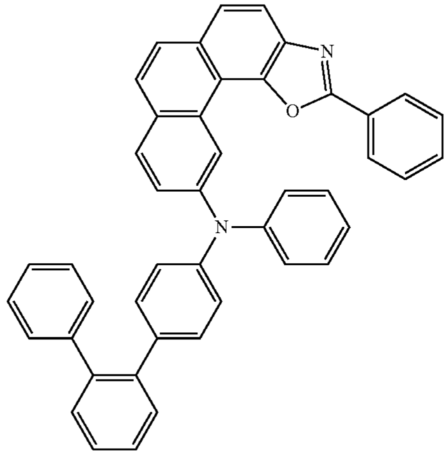

-continued
H1-98
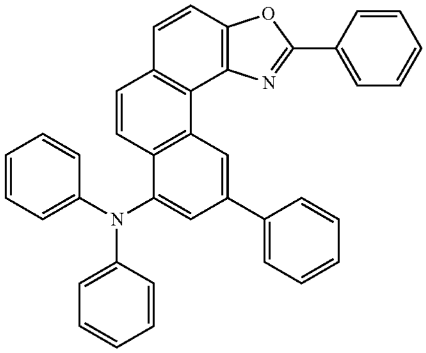
H1-99
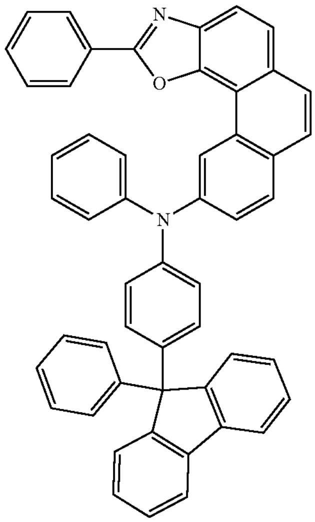
H1-100
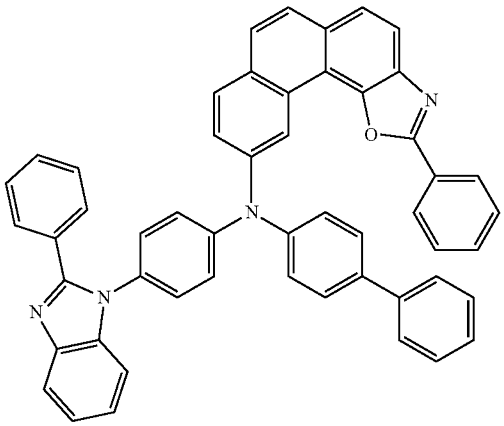
-continued
H1-101
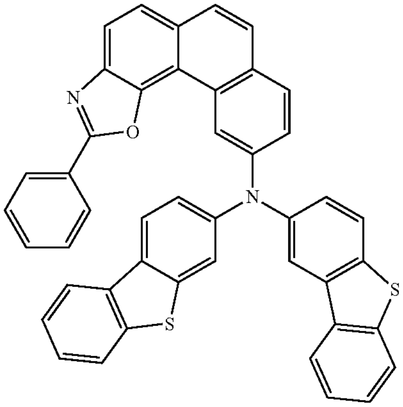
H1-102
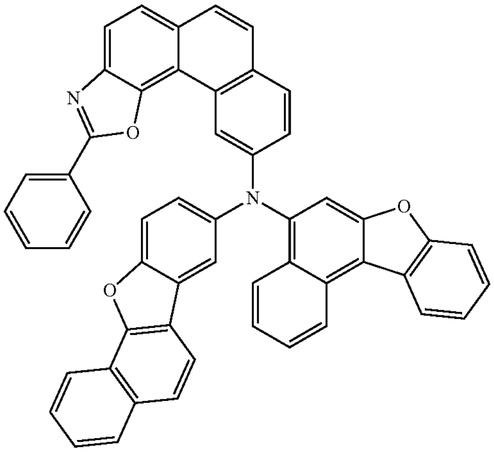
H1-103
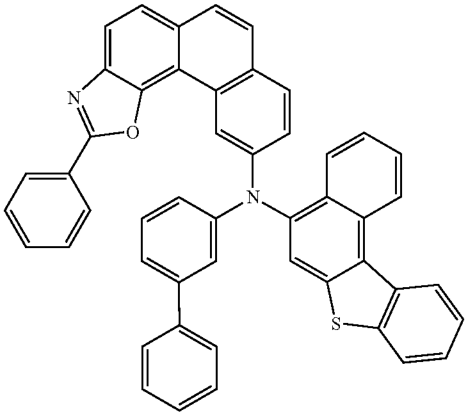

-continued
H1-104
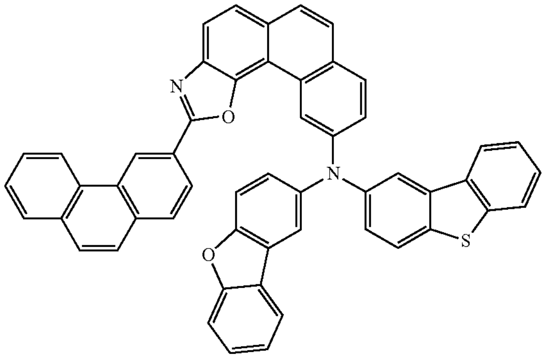
H1-105
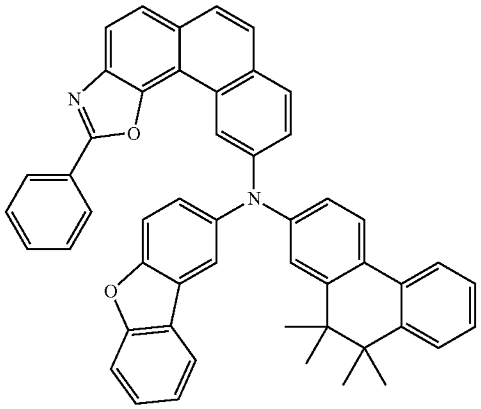
H1-106
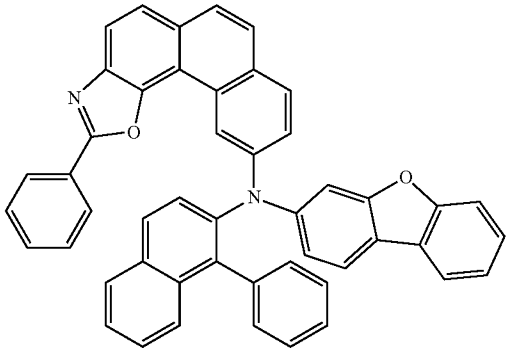
-continued
H1-107
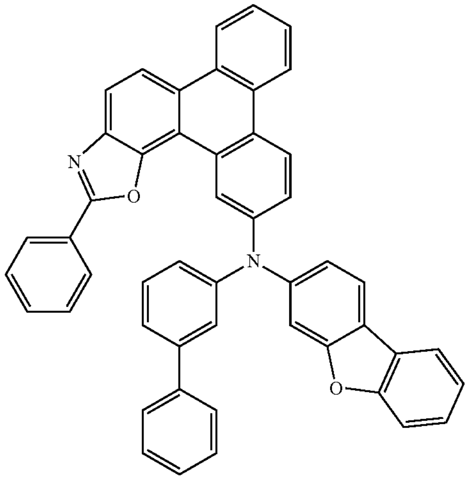
H1-108
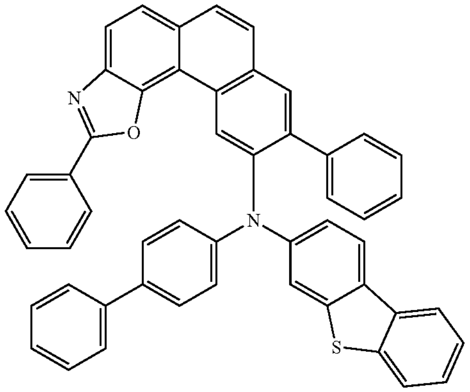
H1-109
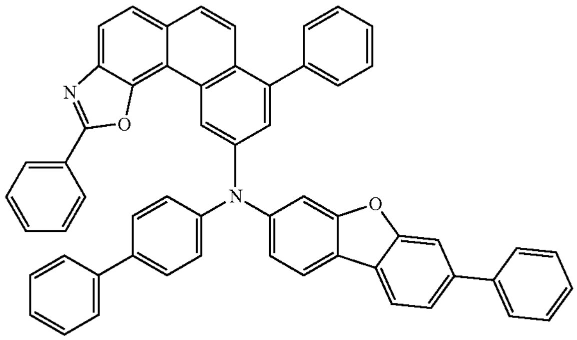

-continued
H1-110
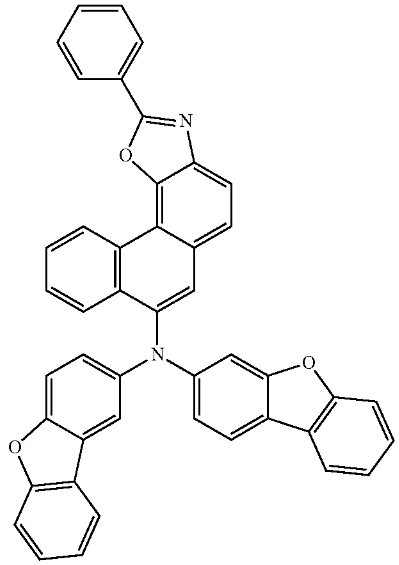
H1-116
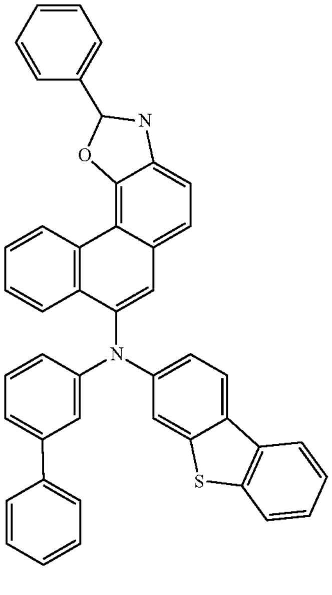
-continued
H1-117
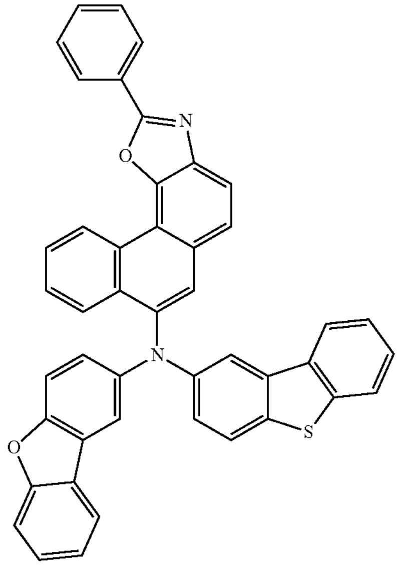
H1-118
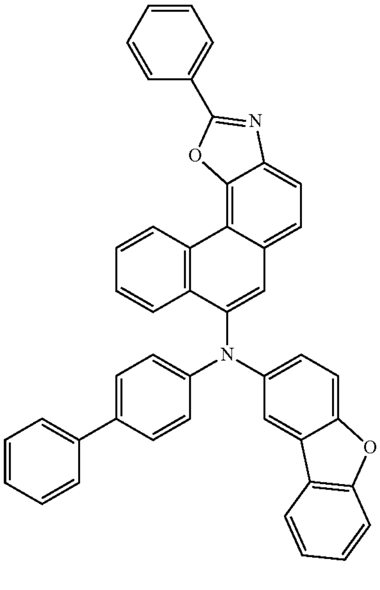

-continued
H1-121
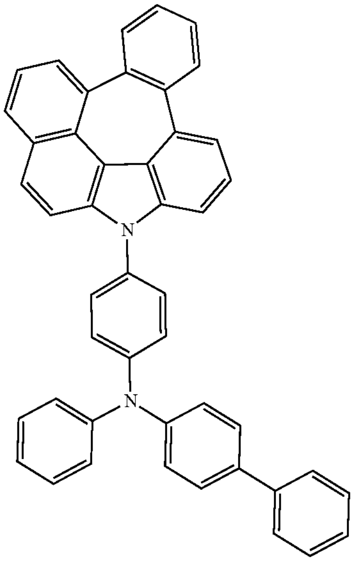
H1-122
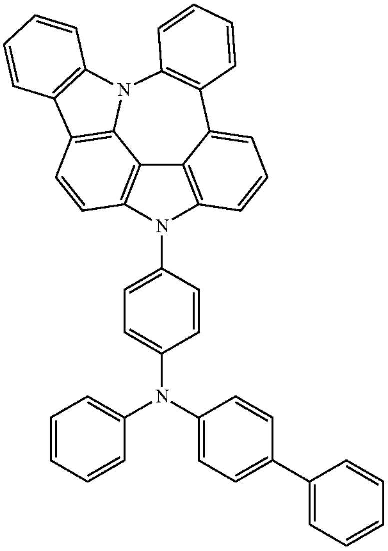
H1-123
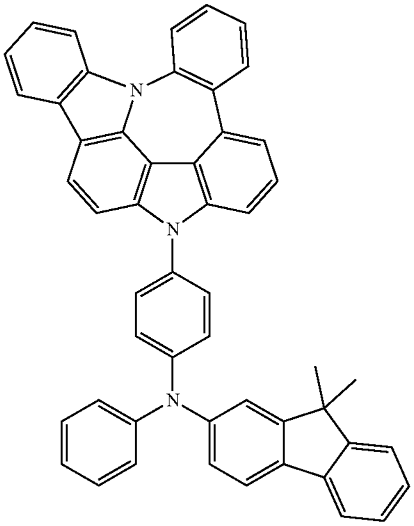
-continued
H1-124
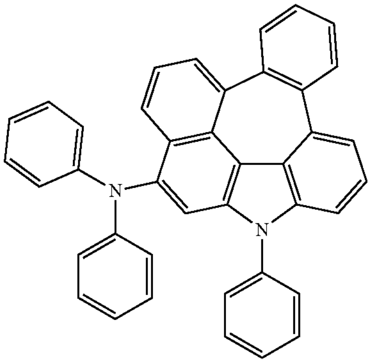
H1-125
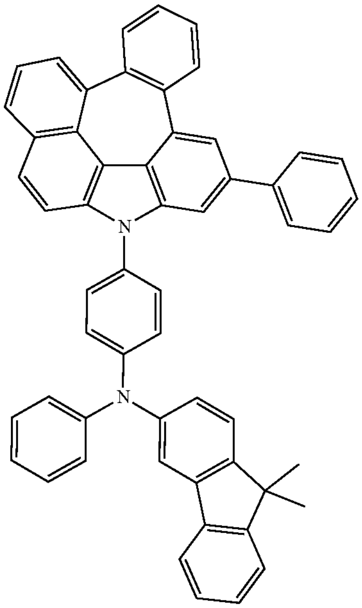
H1-126
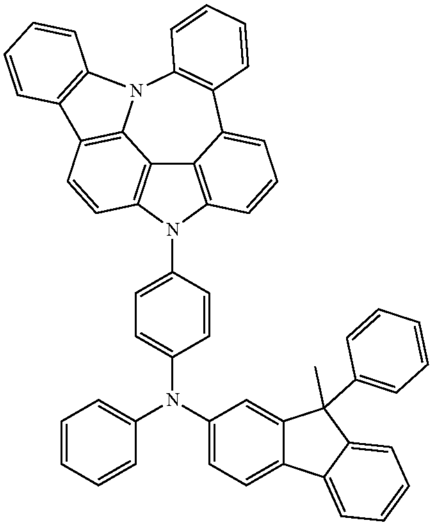

-continued
H1-128
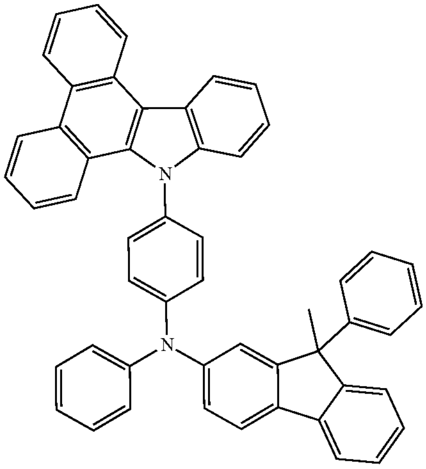
H1-131
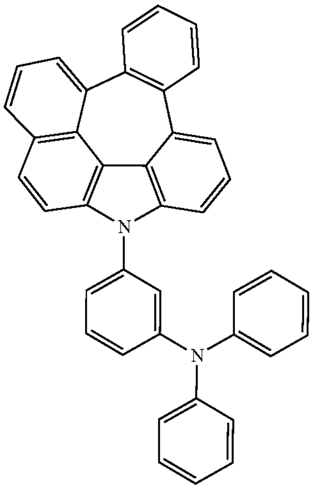
H1-132
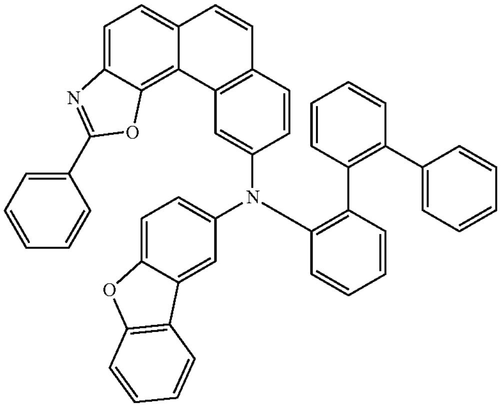
-continued
H1-134
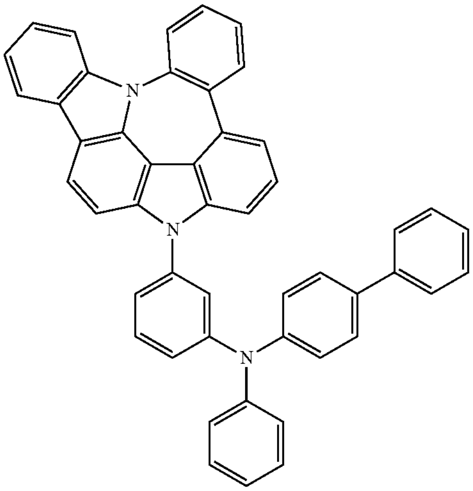
H1-135
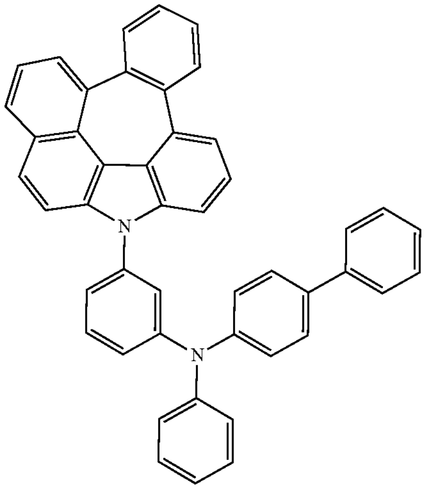
H1-136
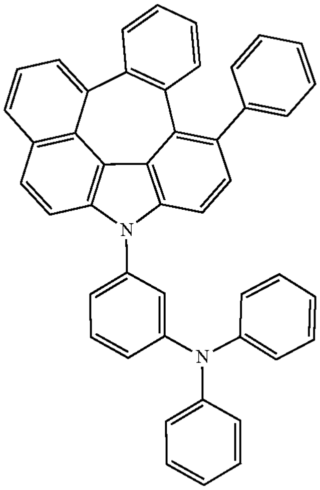

-continued
H1-137
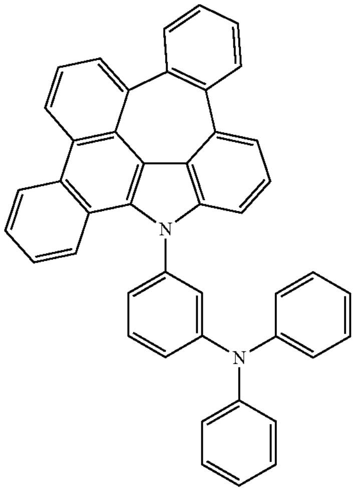
H1-138
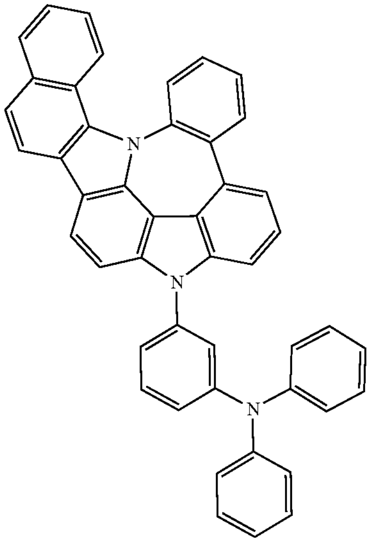
H1-139
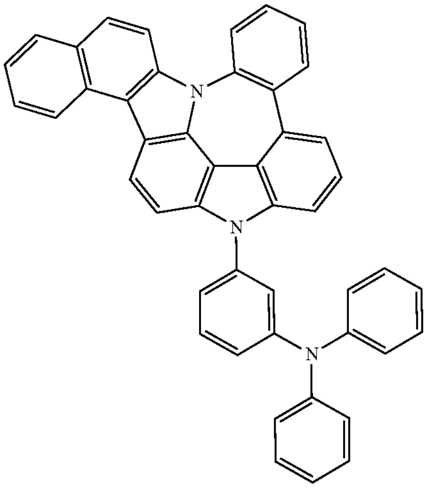
-continued
H1-140
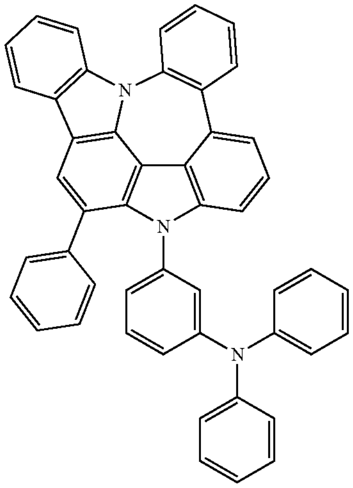
H1-141
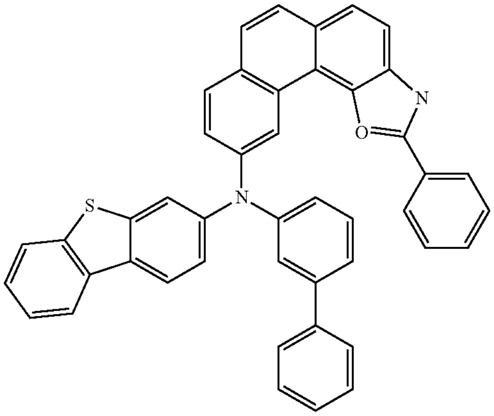
H1-142
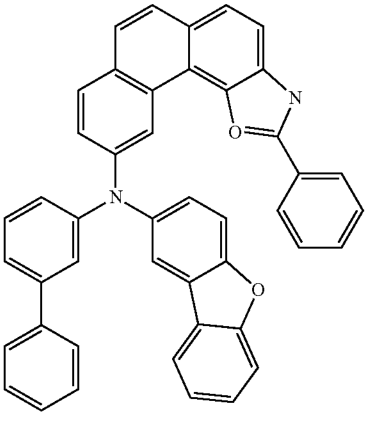

-continued
H1-143
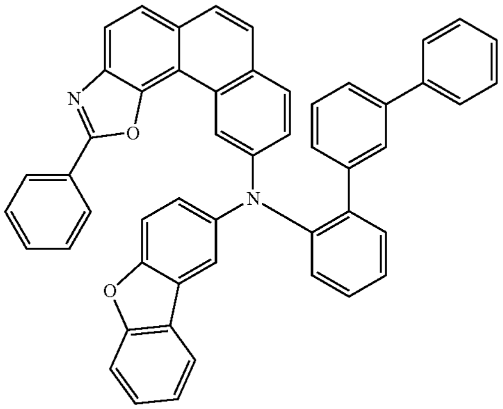
H1-144
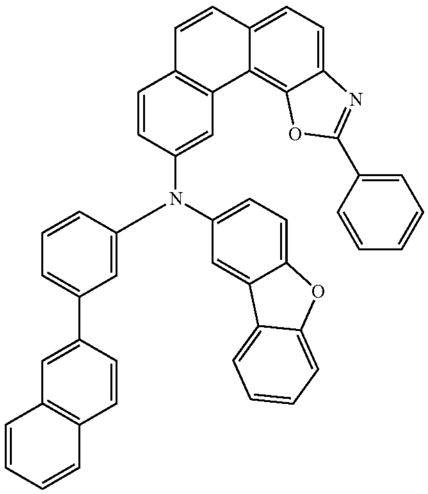
H1-145
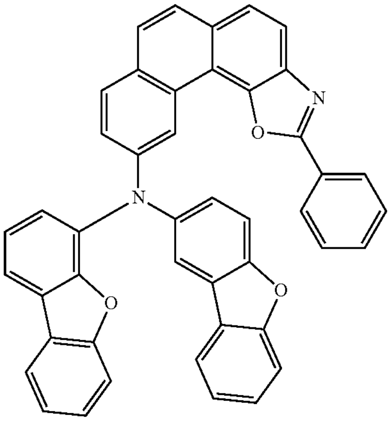
-continued
H1-146
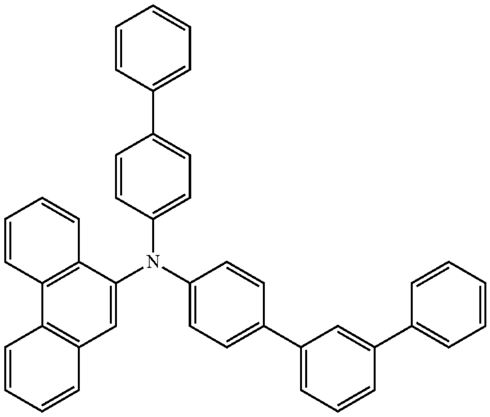
H1-147
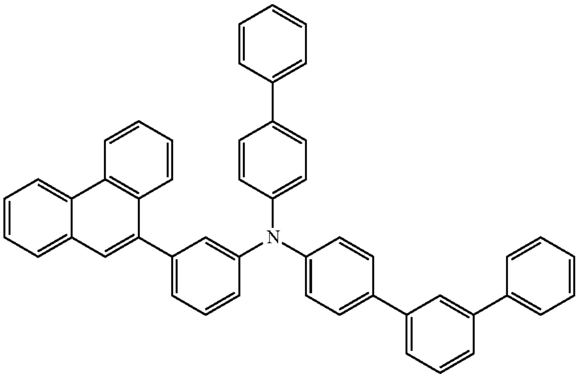
H1-148
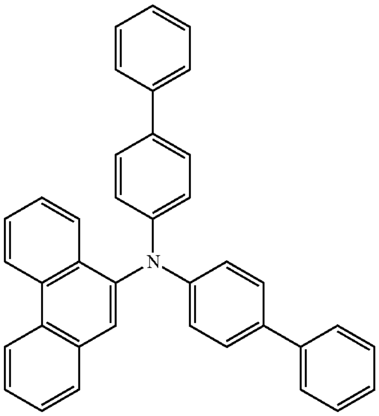
H1-149
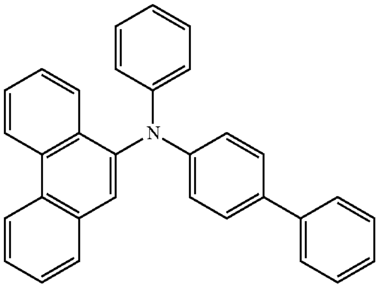

H1-150
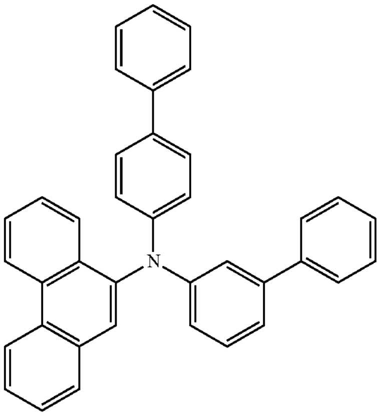
H1-151
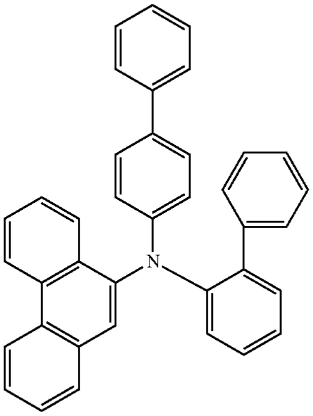
H1-152
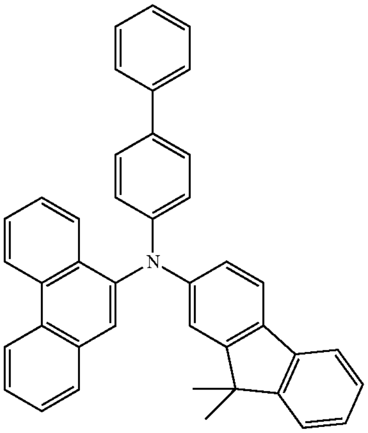
H1-153
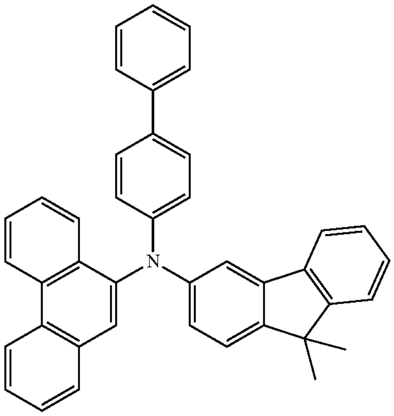
H1-154
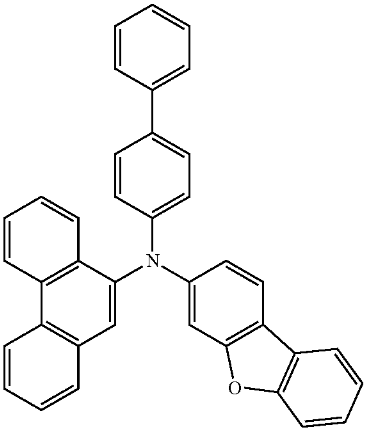
H1-155
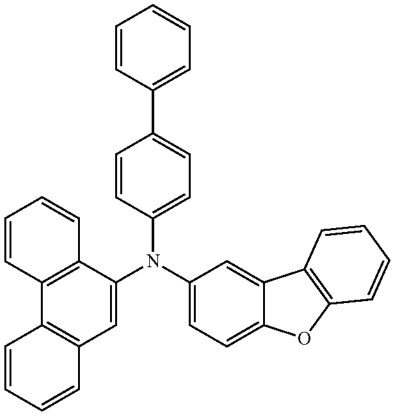

-continued
H1-156
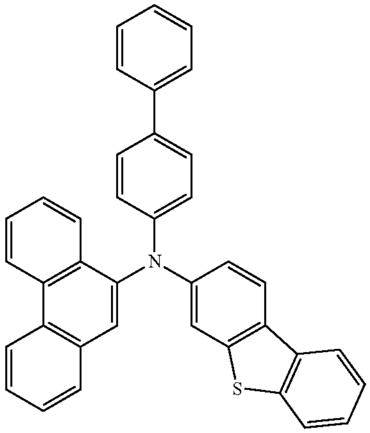
H1-157
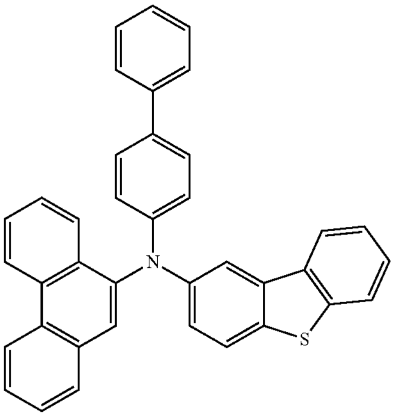
H1-158
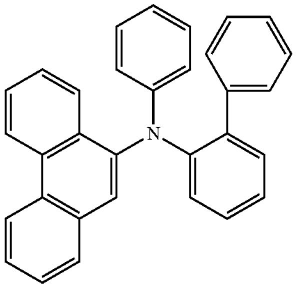
H1-159
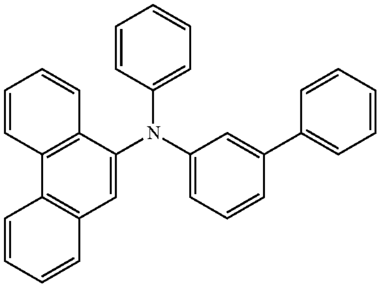
-continued
H1-160
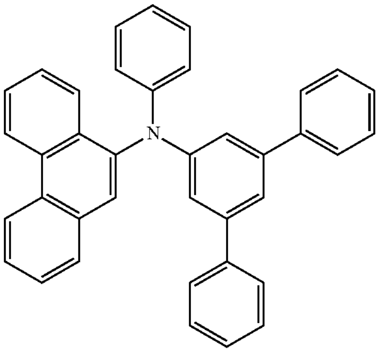
H1-161
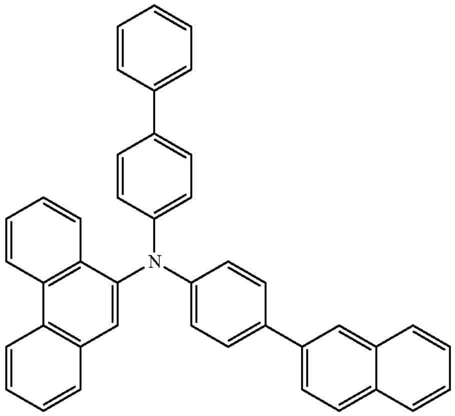
H1-162
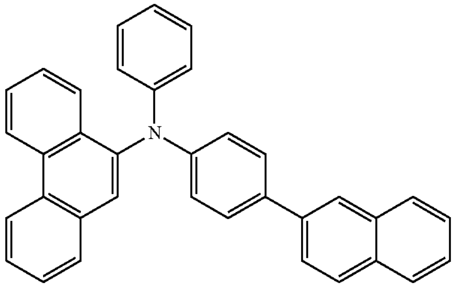
H1-163
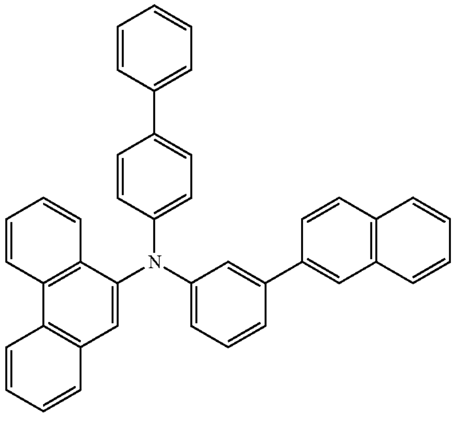

-continued
H1-164
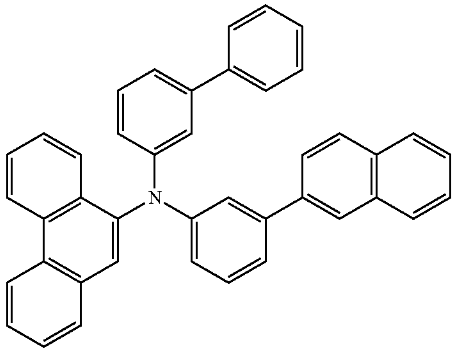
H1-165
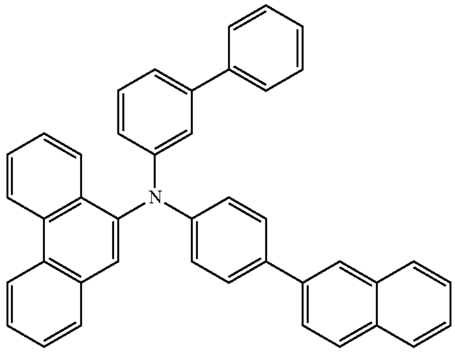
H1-166
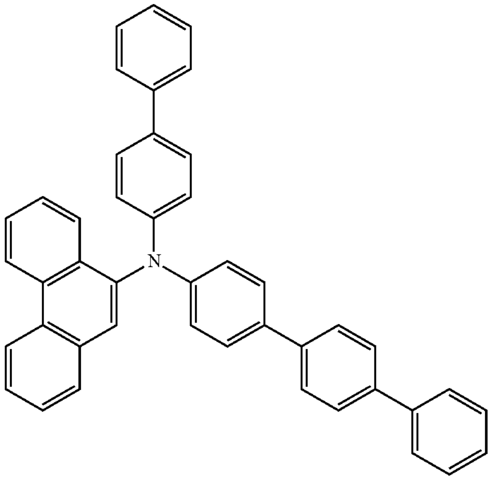
H1-167
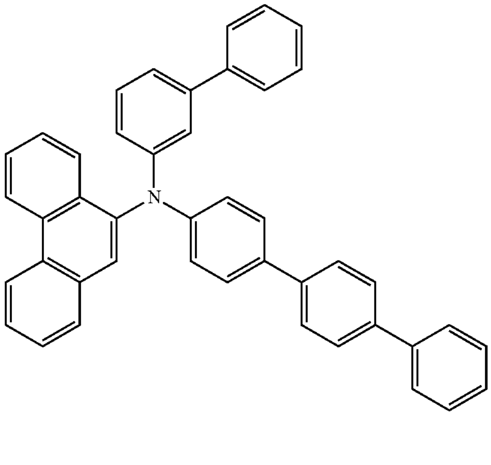
-continued
H1-168
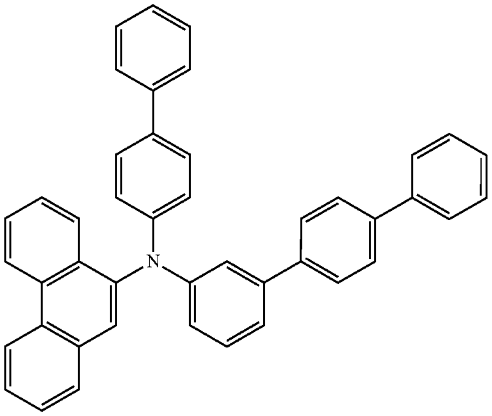
H1-169
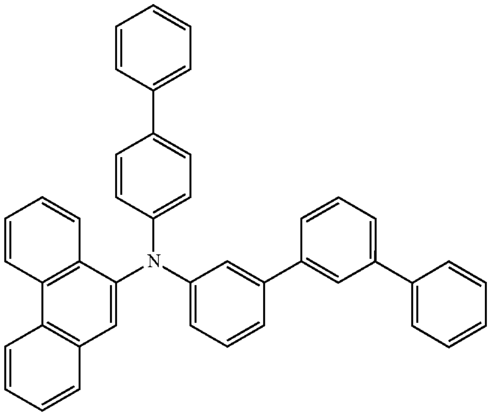
H1-170
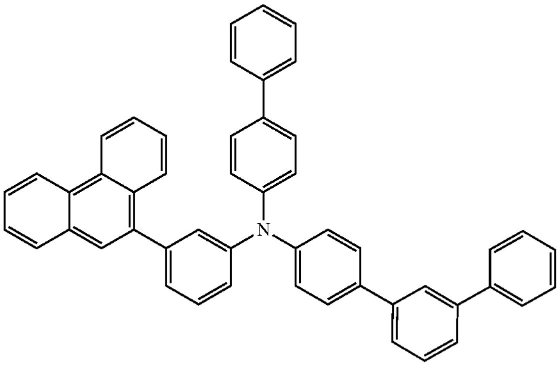
H1-171
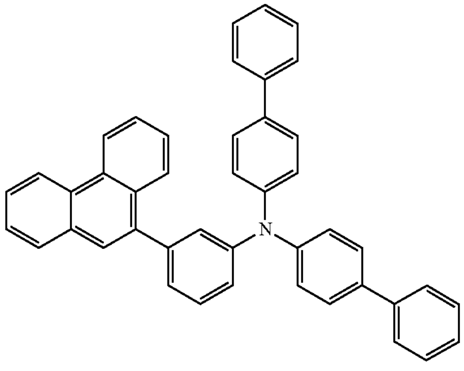

-continued
H1-172
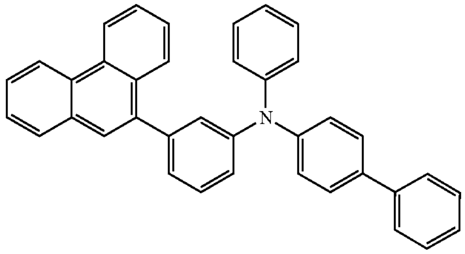
H1-173
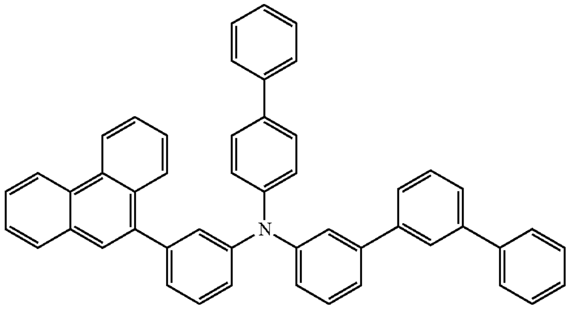
H1-174
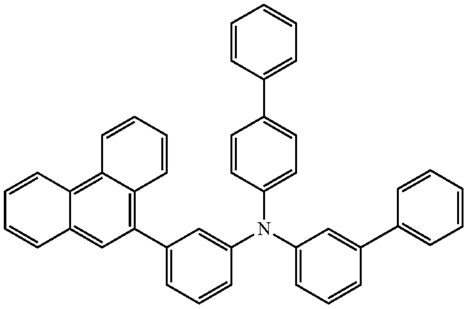
H1-175
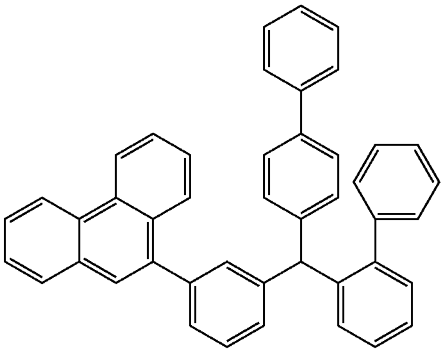
-continued
H1-176
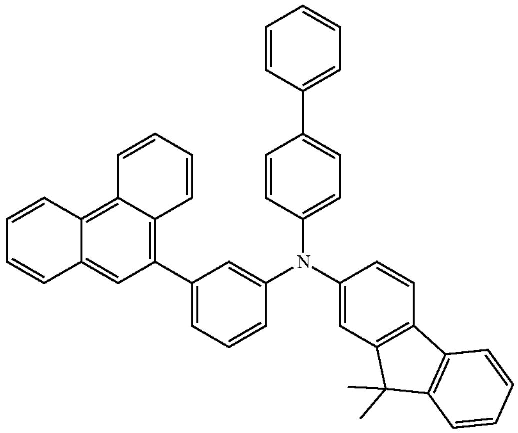
H1-177
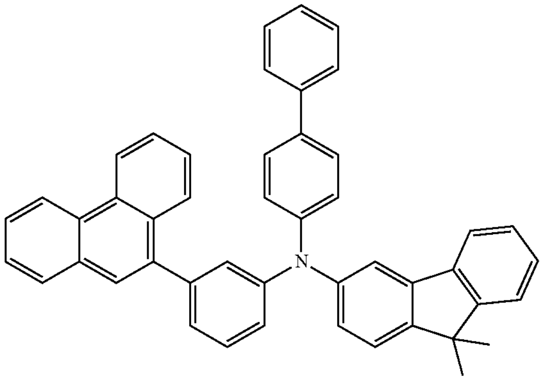
H1-178
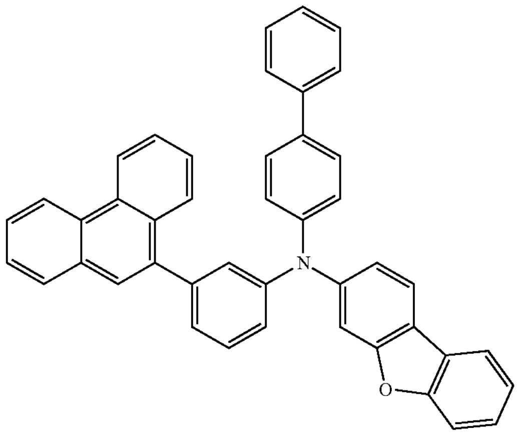

-continued
H1-179
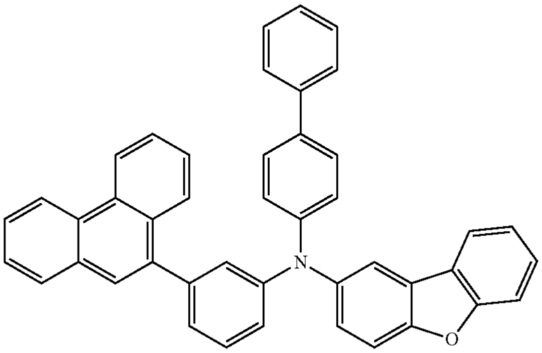
H1-180
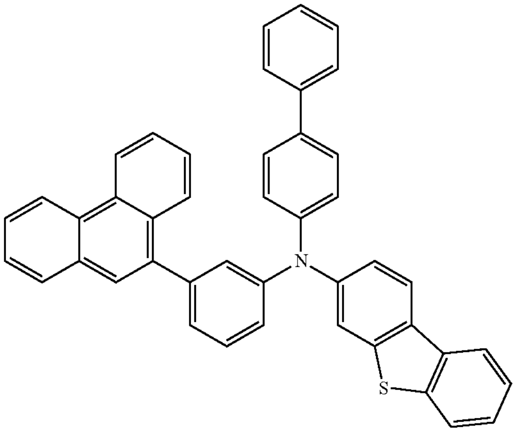
H1-181
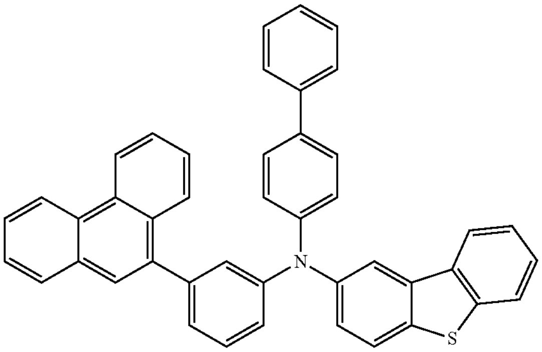
H1-182
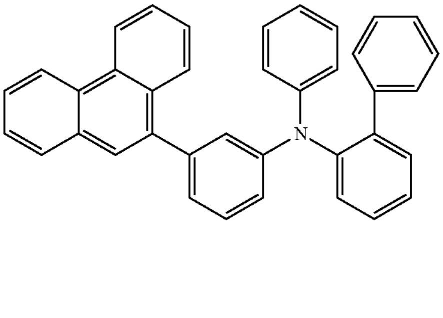
-continued
H1-183
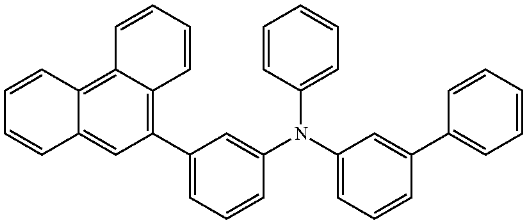
H1-184
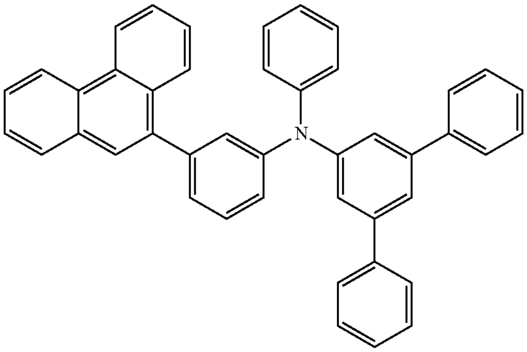
H1-185
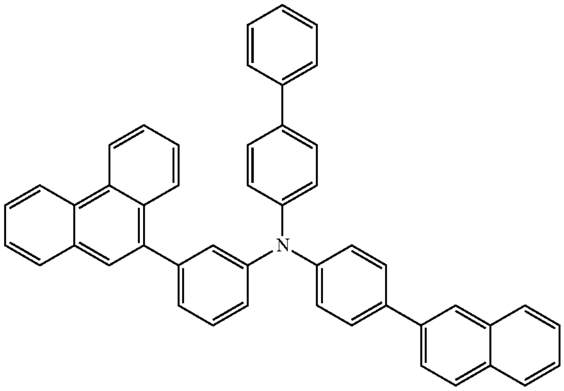
H1-186
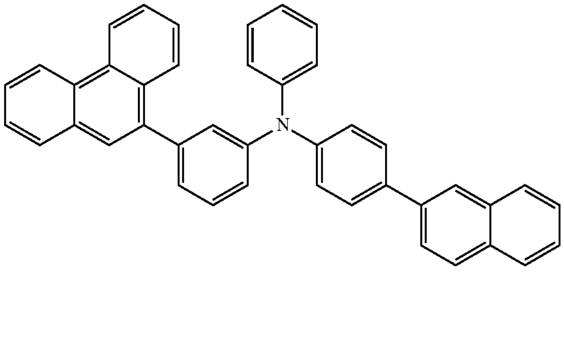

-continued
H1-187
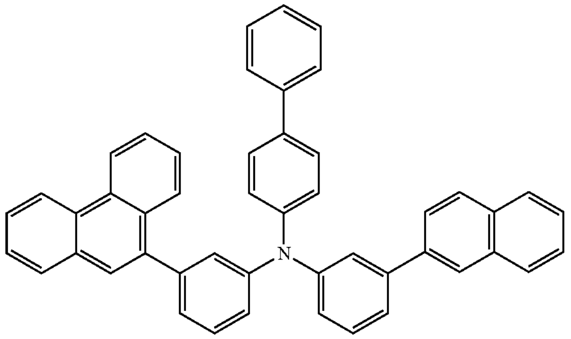
H1-188
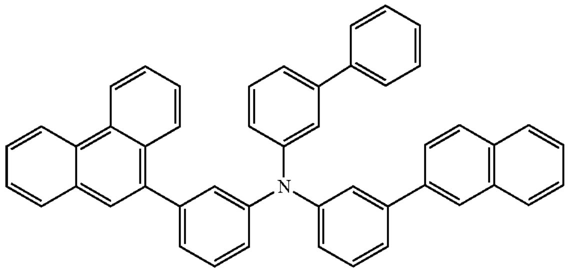
H1-189
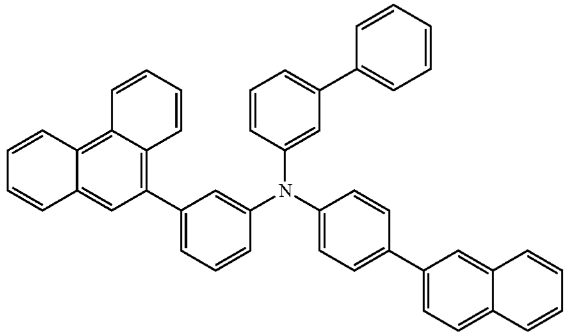
H1-190
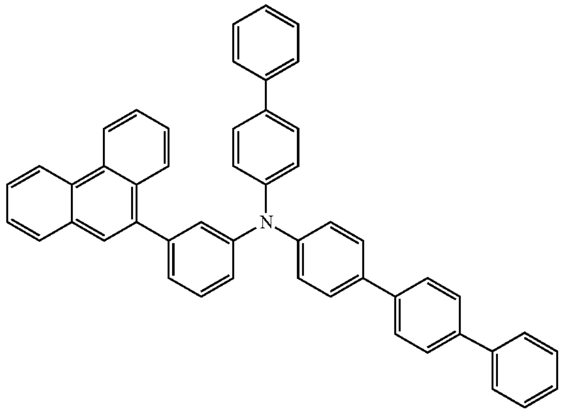
-continued
H1-191
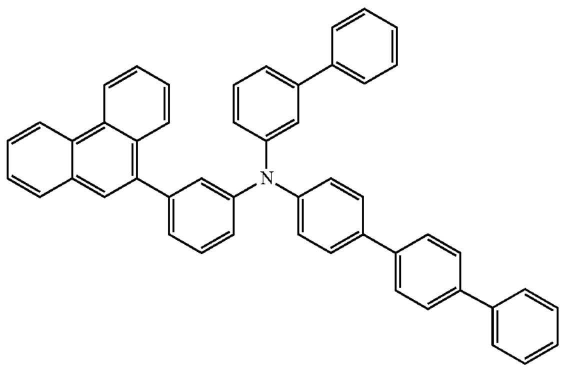
H1-192
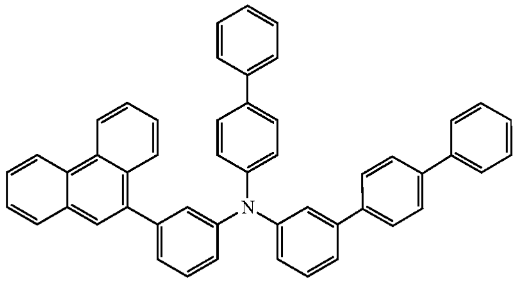
and
H1-193
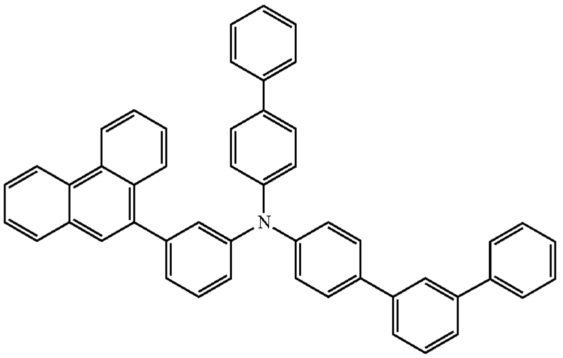
.

5. The organic electroluminescent device according to claim 1, wherein formula 4 represents at least one selected from the following compounds:
H2-1
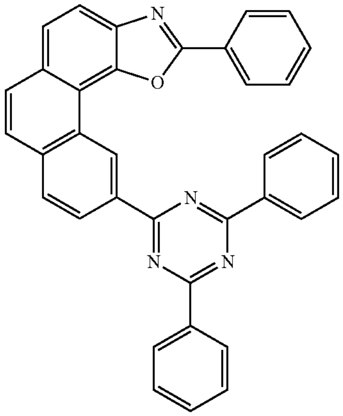
H2-2
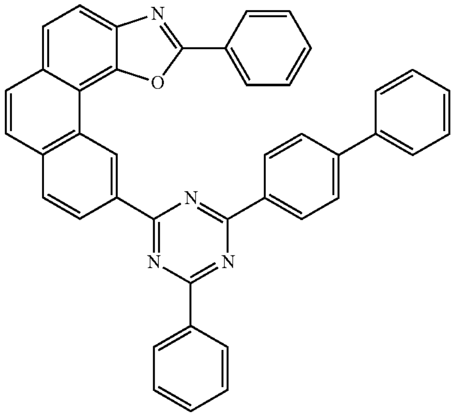
H2-3
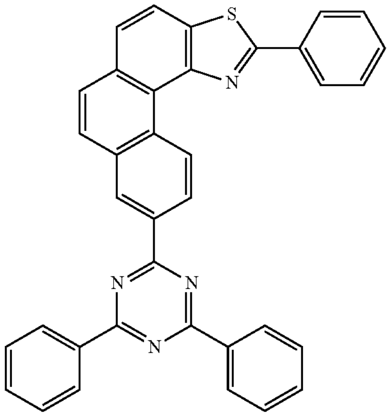
-continued
H2-4
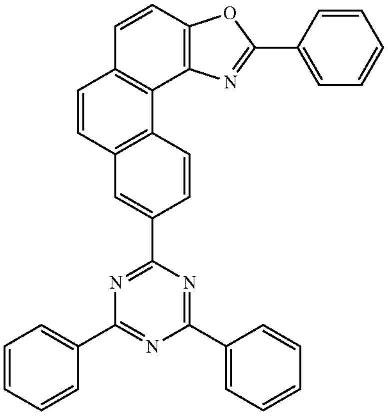
H2-5
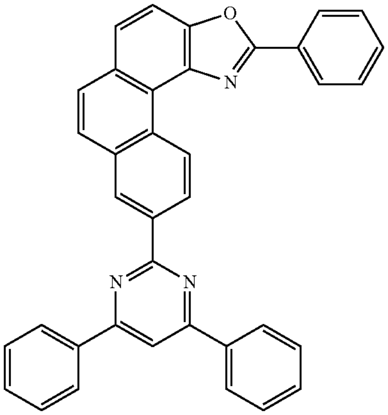
H2-6
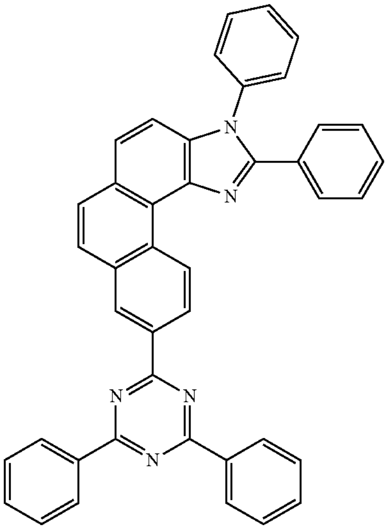

-continued
H2-7
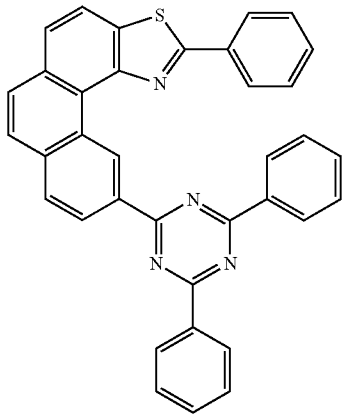
H2-8
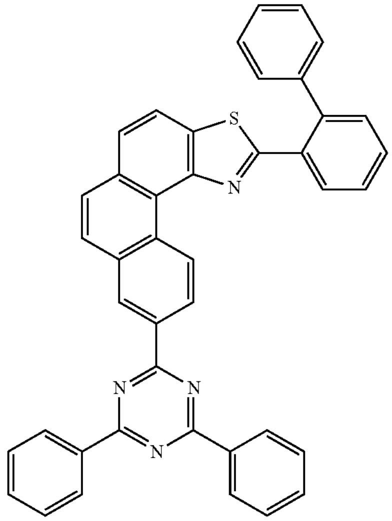
H2-9
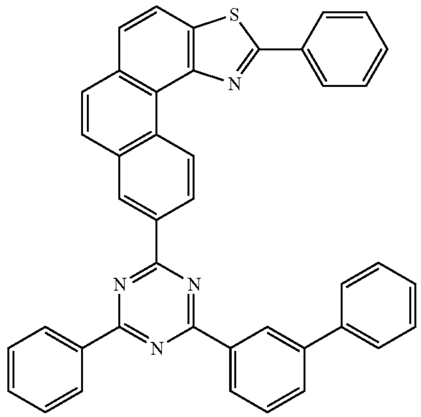
-continued
H2-10
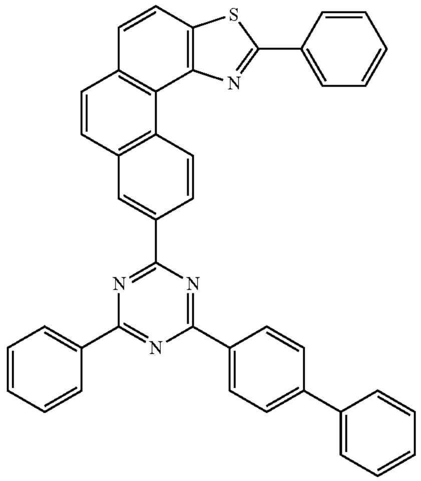
H2-11
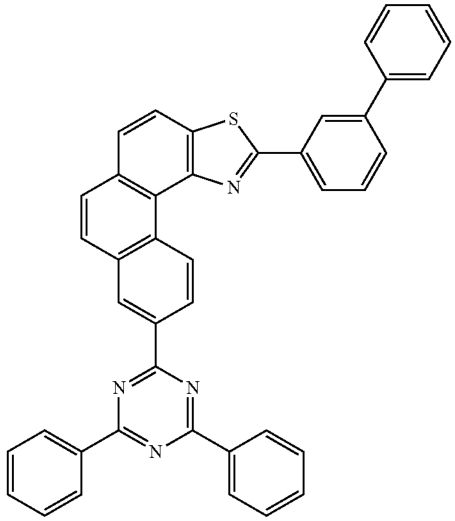
H2-12
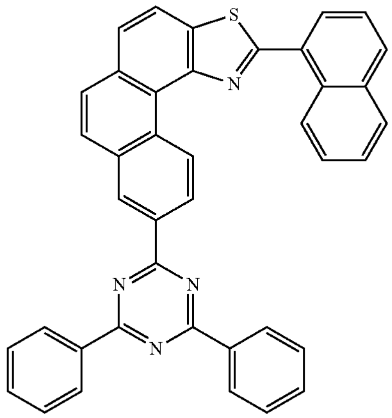

-continued
H2-13
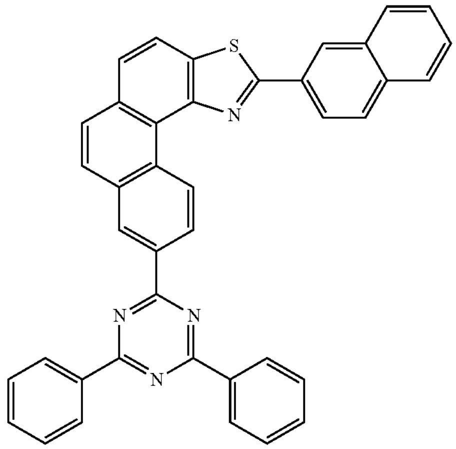
H2-14
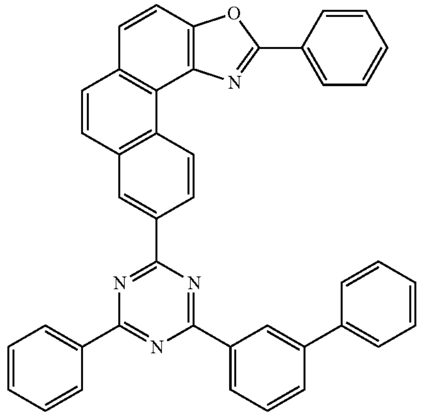
H2-15
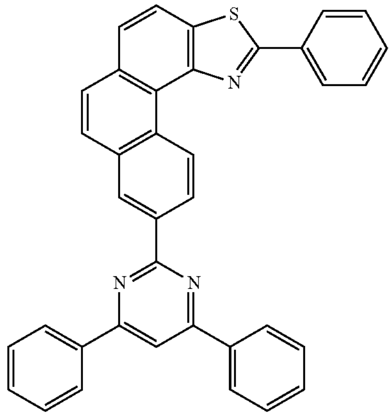
-continued
H2-16
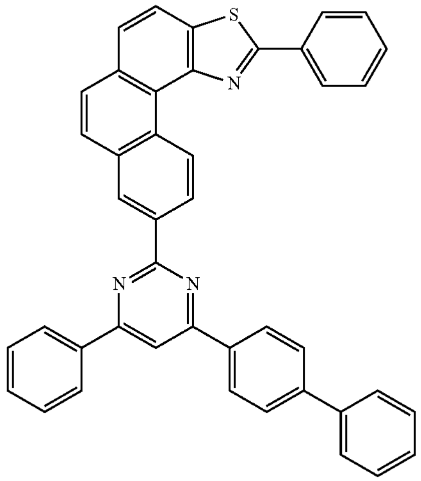
H2-17
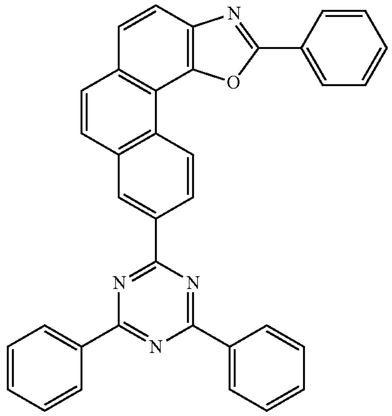
H2-18
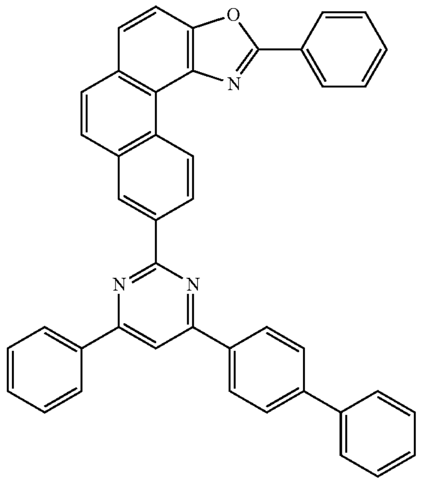

-continued
H2-19
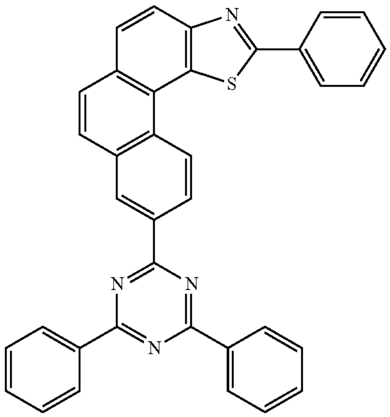
H2-20
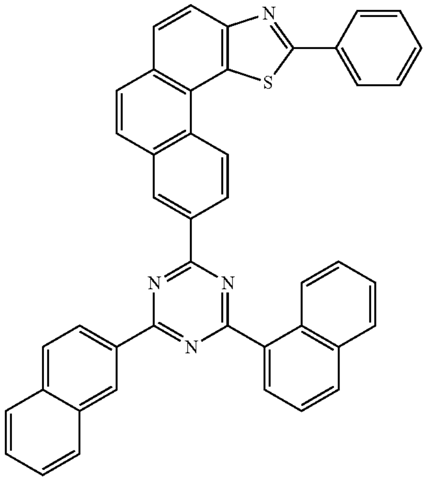
H2-21
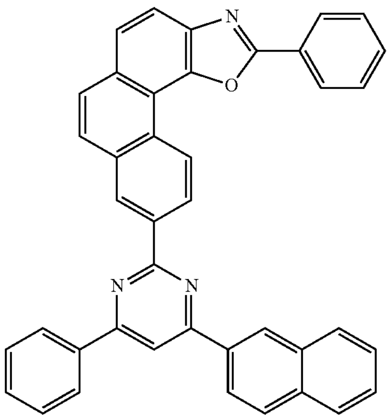
-continued
H2-22
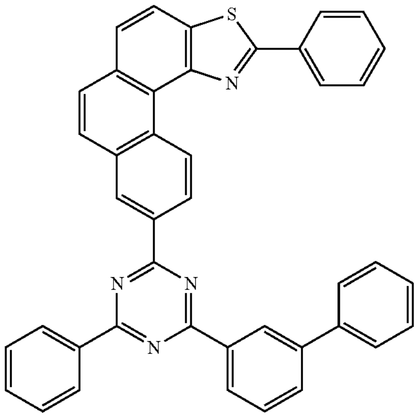
H2-23
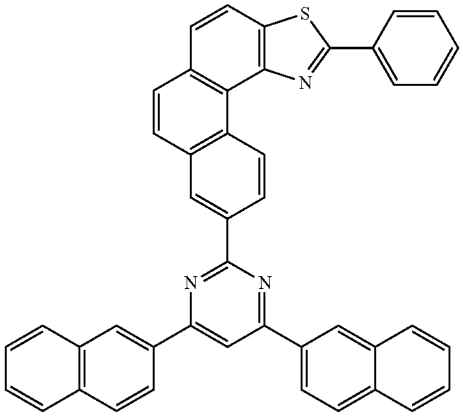
H2-24
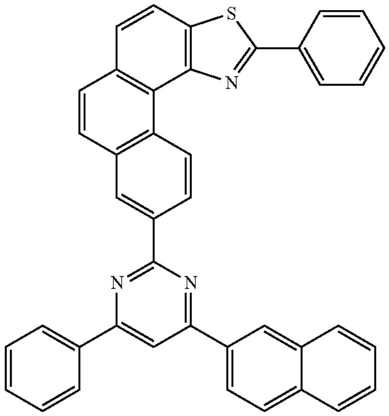

-continued
H2-25
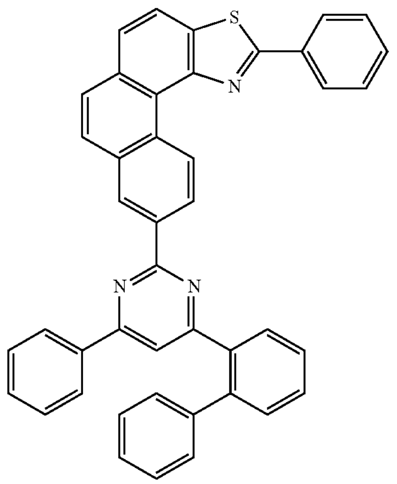
H2-26
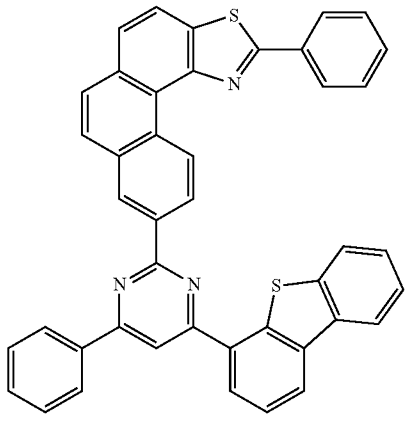
H2-27
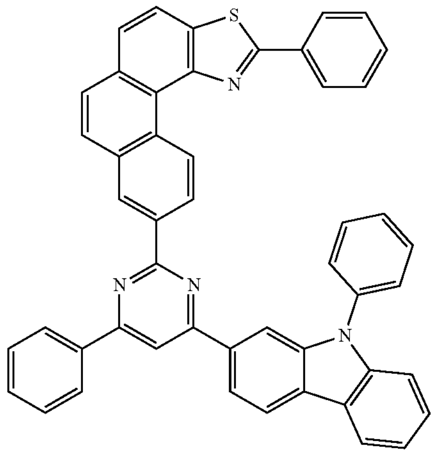
-continued
H2-28
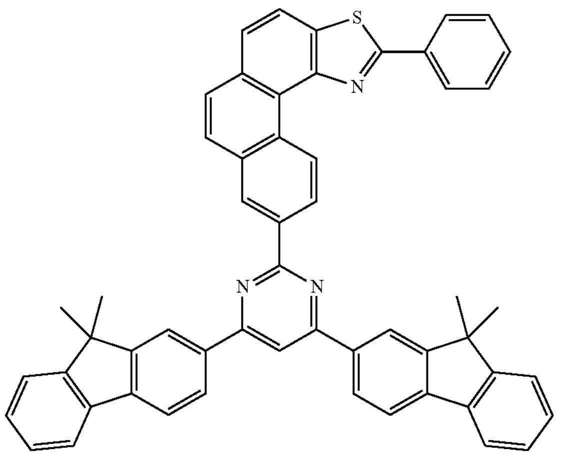
H2-29
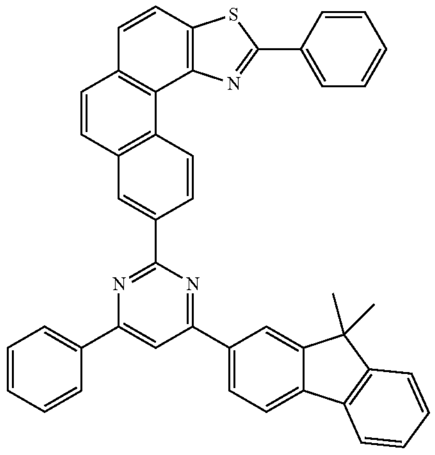
H2-30
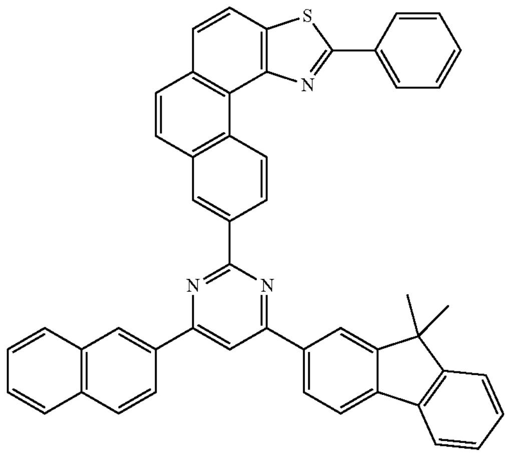

-continued
H2-31
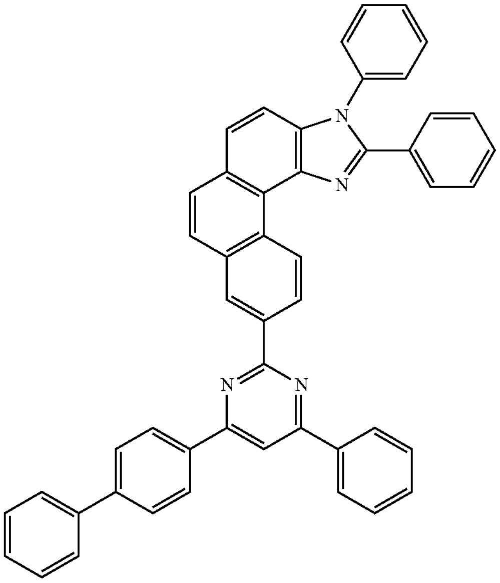
H2-32
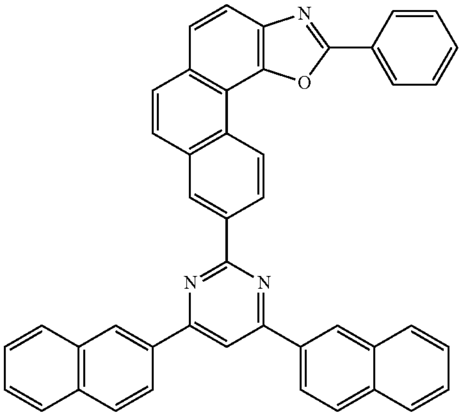
H2-33
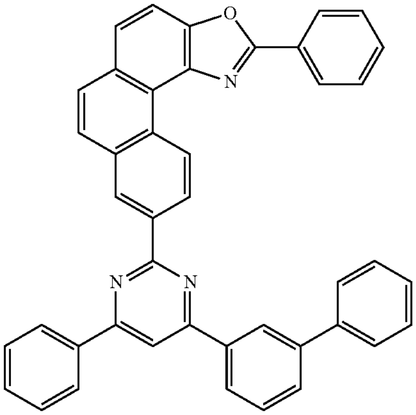
-continued
H2-34
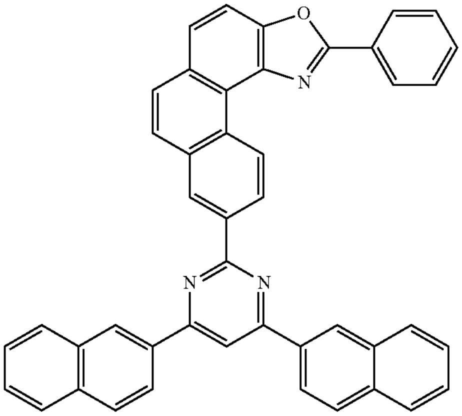
H2-35
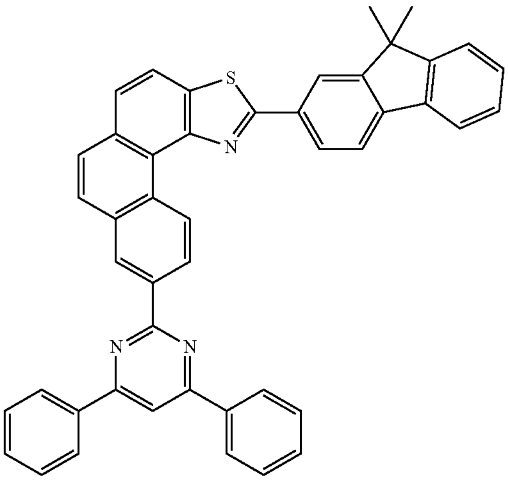
H2-36
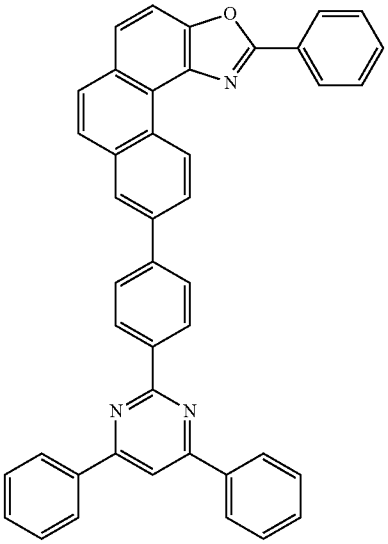

-continued
H2-37
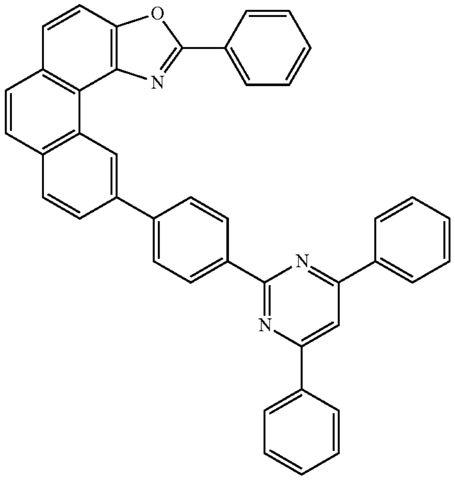
H2-38
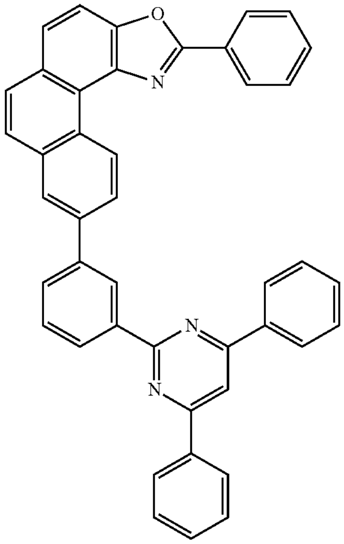
H2-39
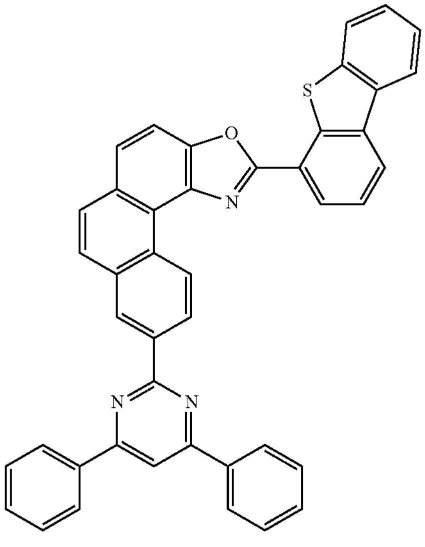
-continued
H2-40
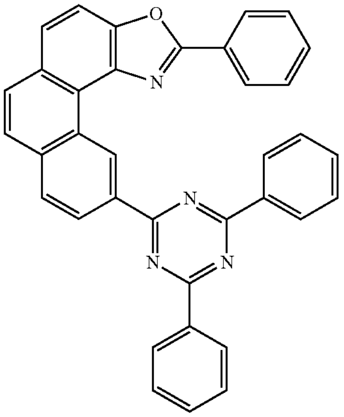
H2-41
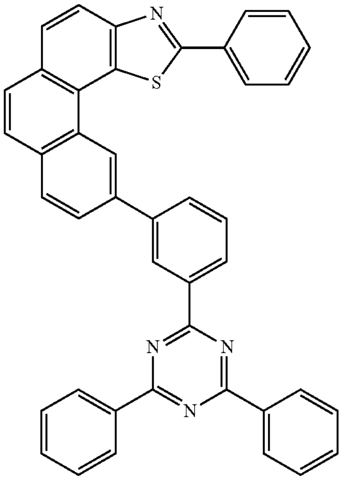
H2-42
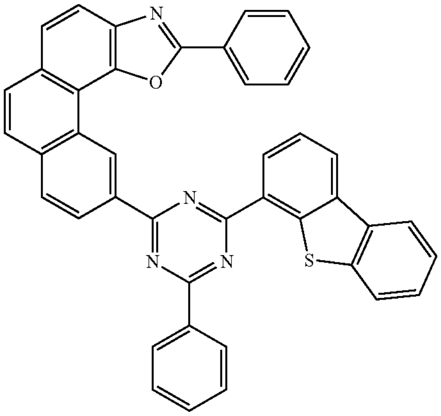

-continued
H2-43
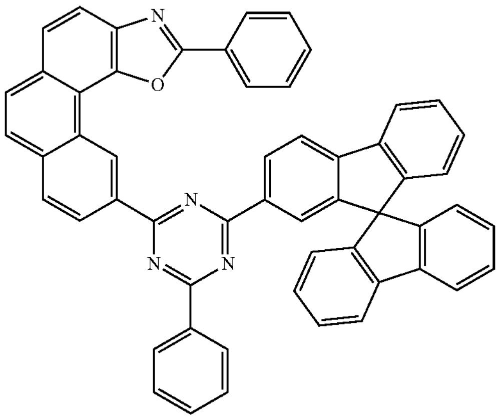
H2-44
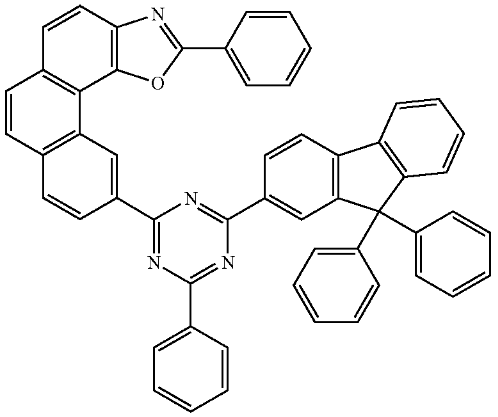
H2-45
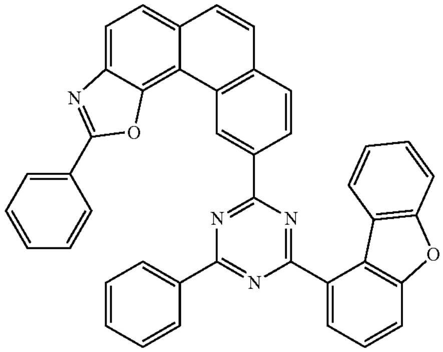
H2-46
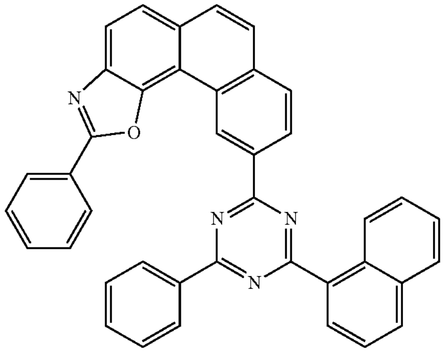
-continued
H2-47
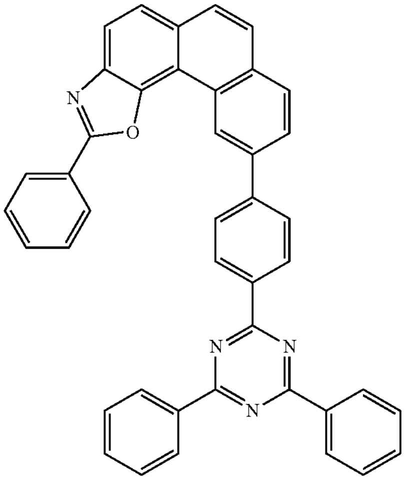
H2-48
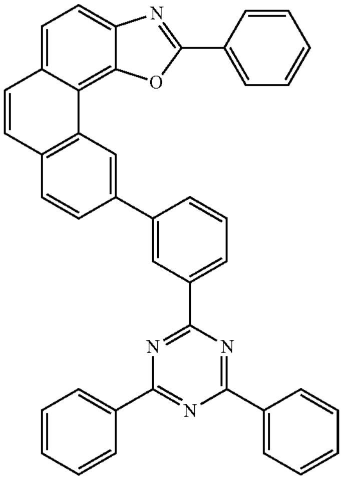
H2-49
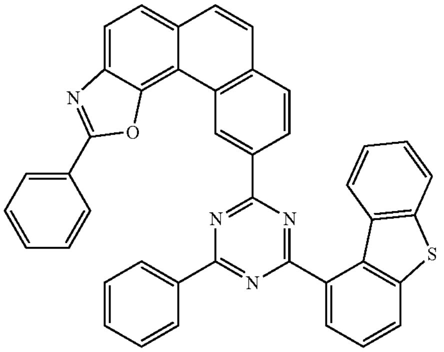

-continued
H2-50
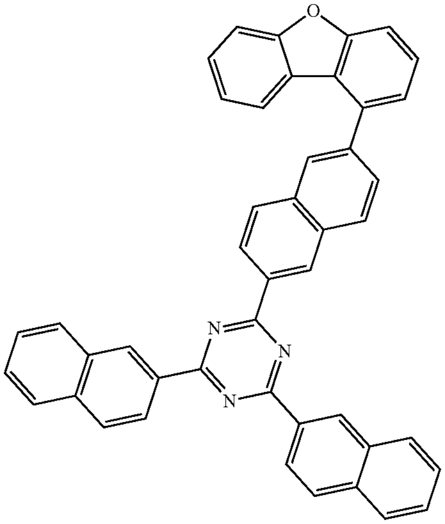
H2-51
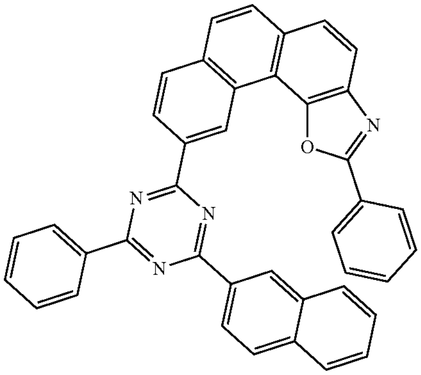
H2-52
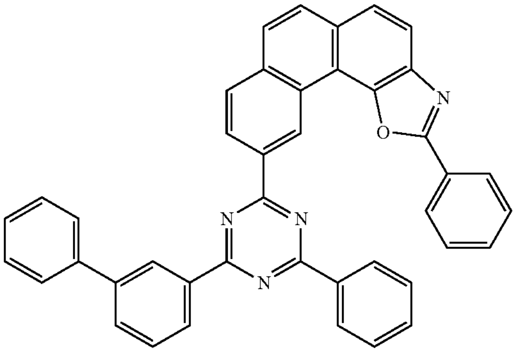
H2-53
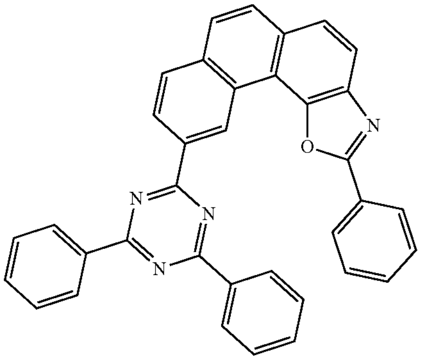
-continued
H2-54
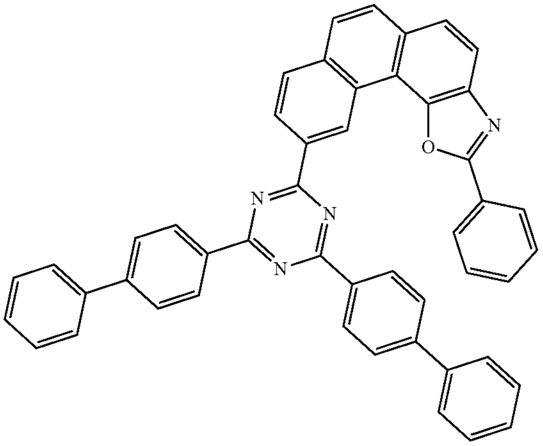
H2-55
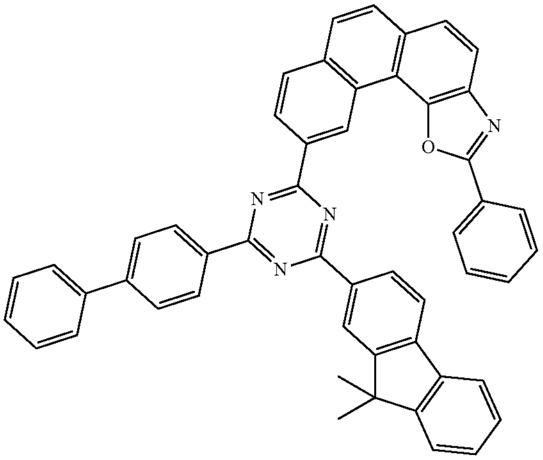
H2-56
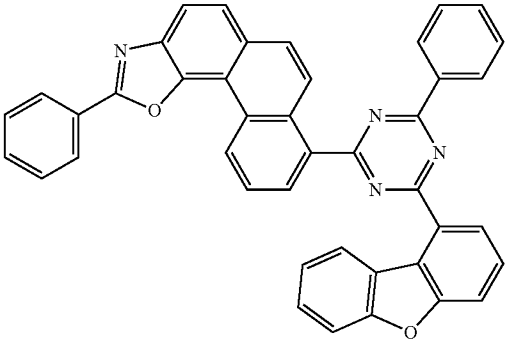

-continued
H2-57
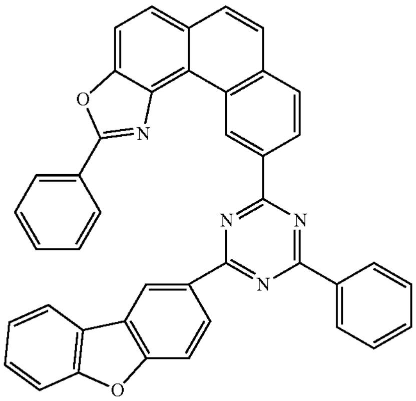
H2-58
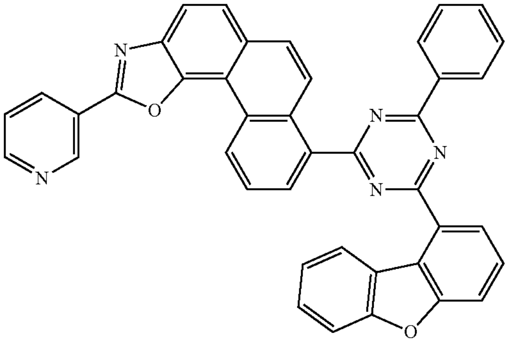
H2-59
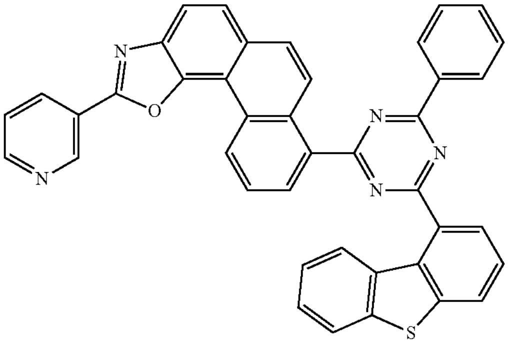
H2-60
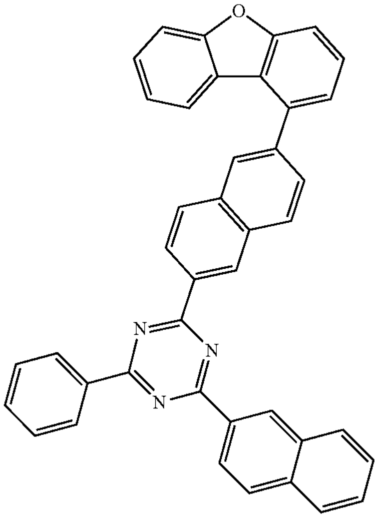
-continued
H2-61
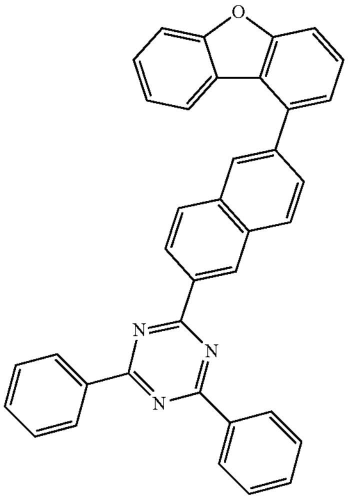
H2-62
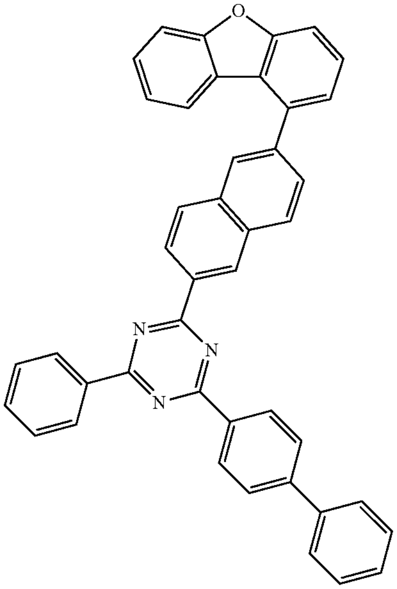
H2-63
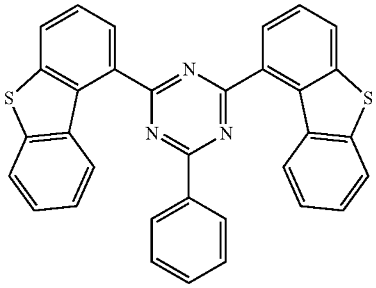

-continued
H2-64
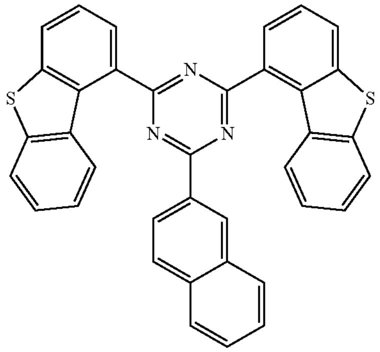
H2-65
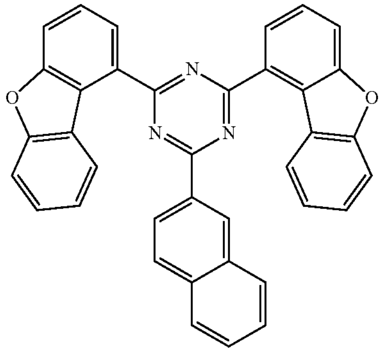
H2-66
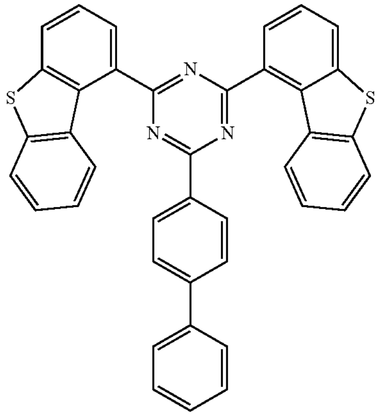
H2-67
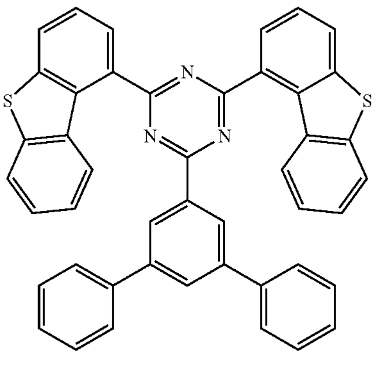
-continued
H2-68
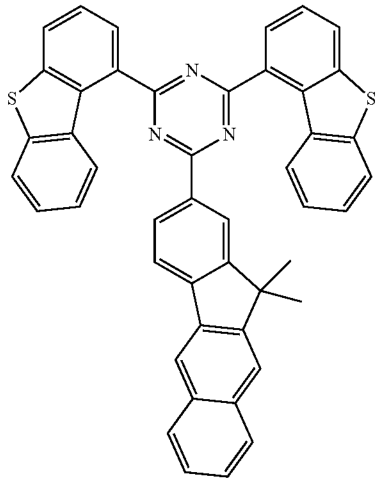
H2-69
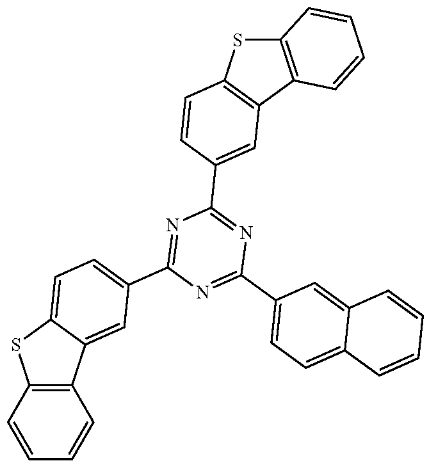
H2-70
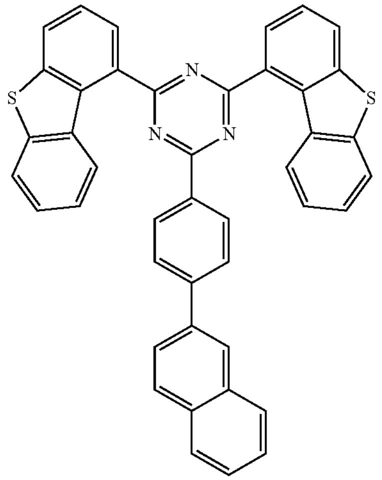

-continued
H2-71
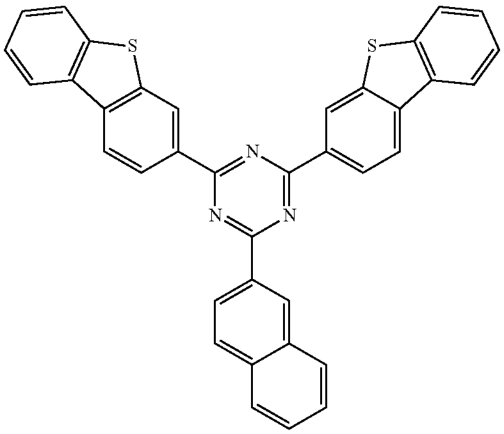
H2-72
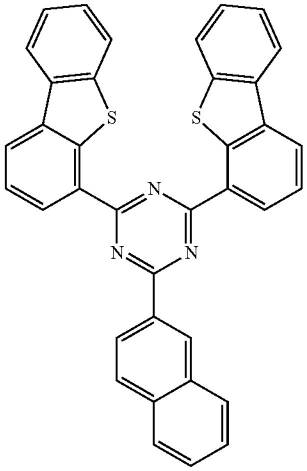
H2-73
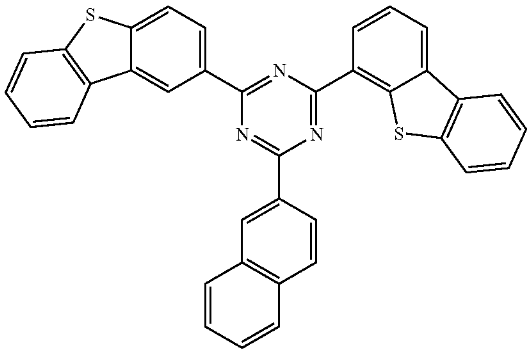
-continued
H2-74
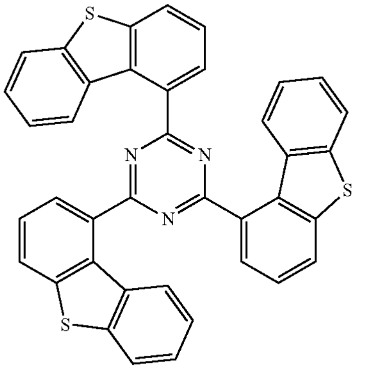
H2-75
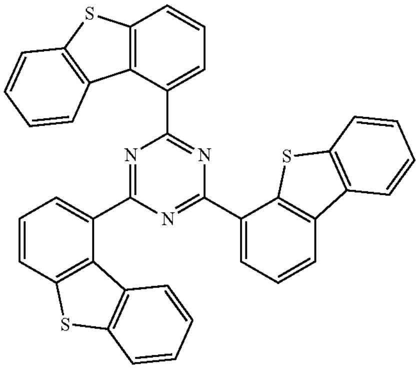
H2-76
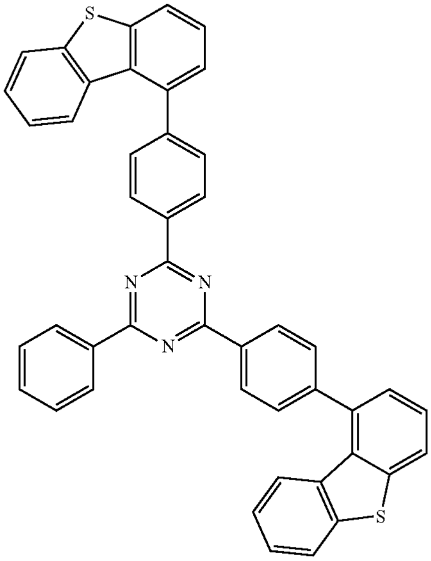

-continued
H2-77
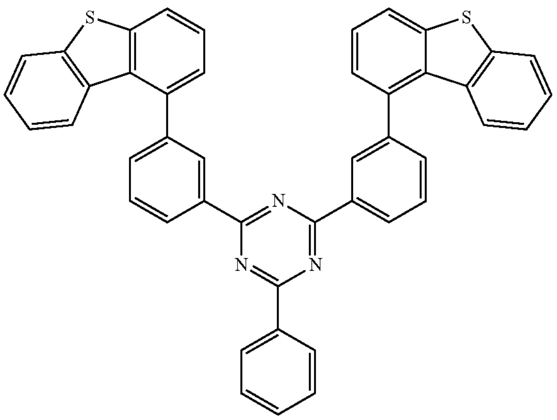
H2-78
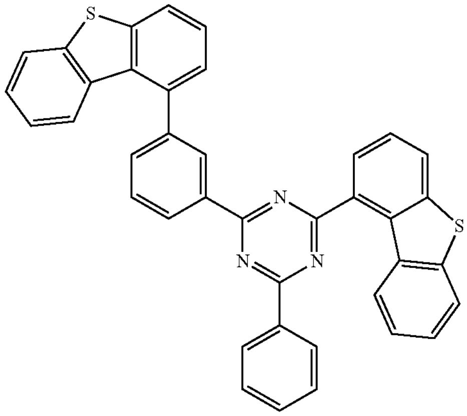
H2-79
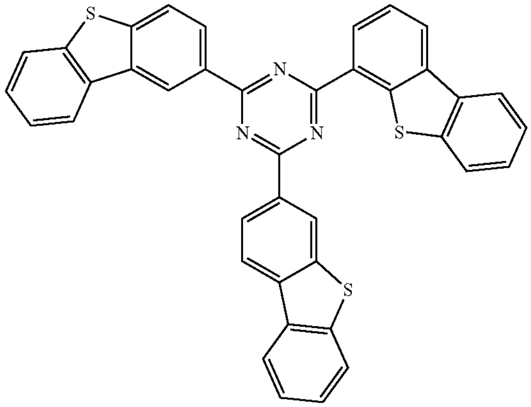
-continued
H2-80
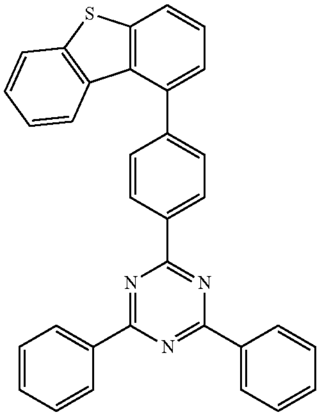
H2-81
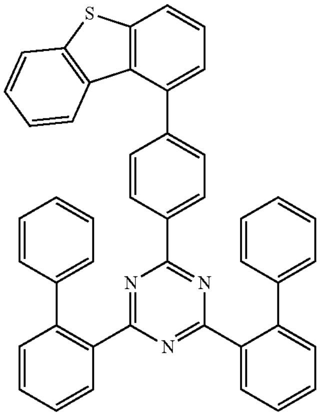
H2-82
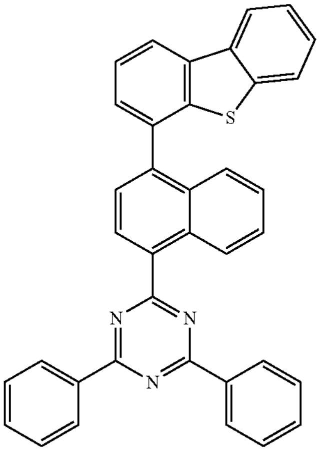

-continued
H2-83
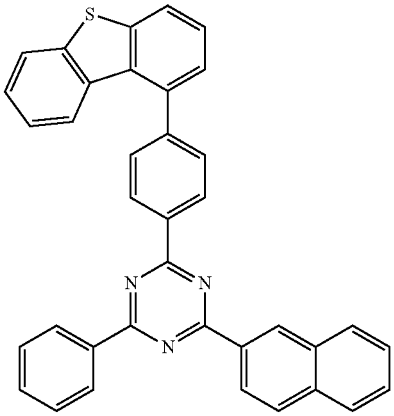
H2-84
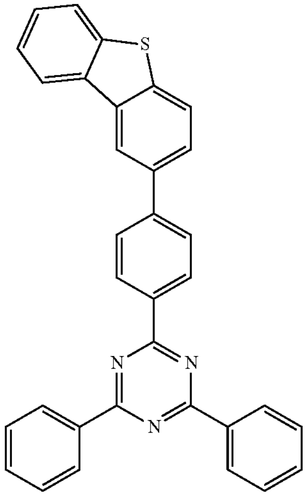
H2-85
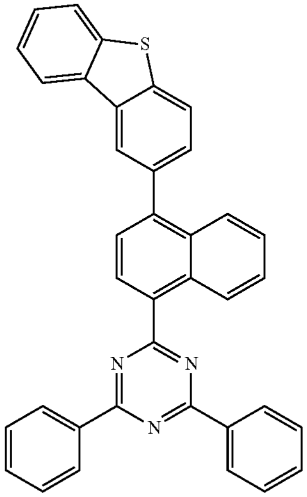
-continued
H2-86
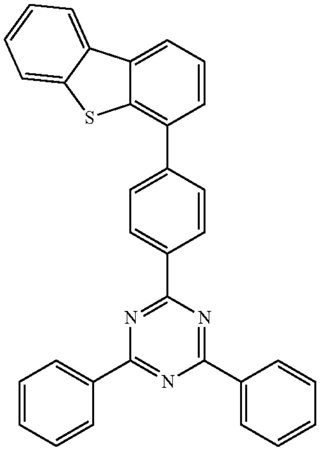
H2-87
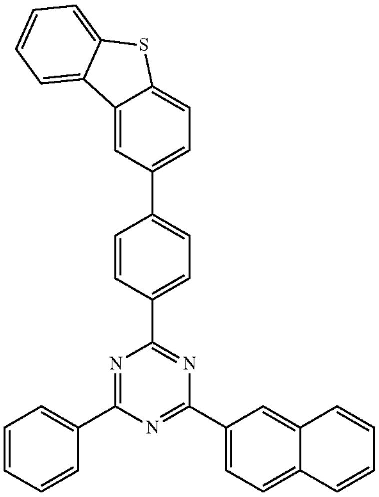
H2-88
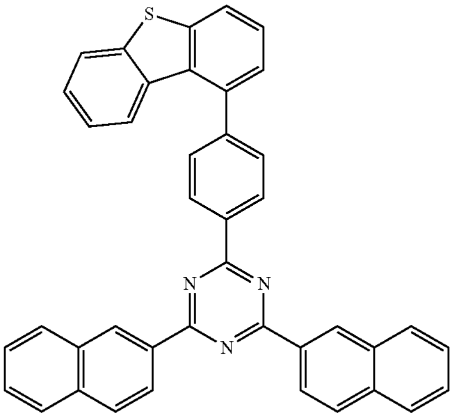

-continued
H2-89
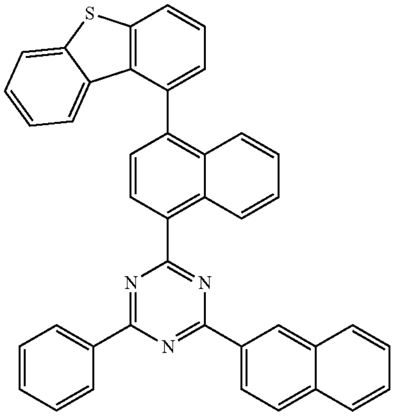
H2-90
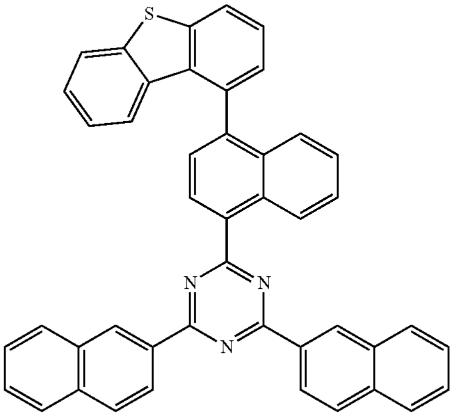
H2-91
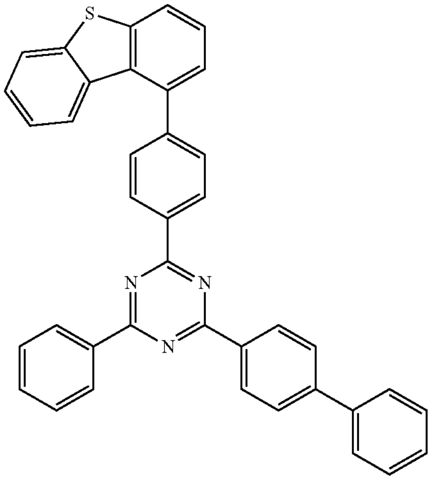
-continued
H2-92
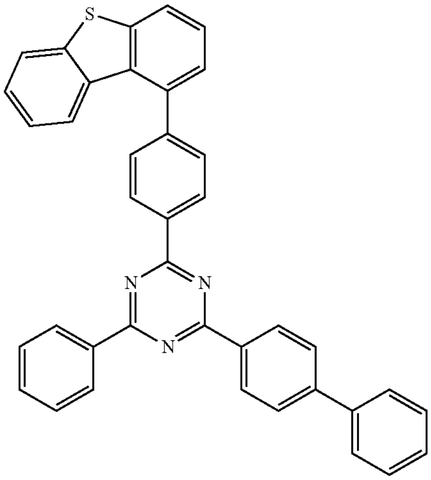
H2-93
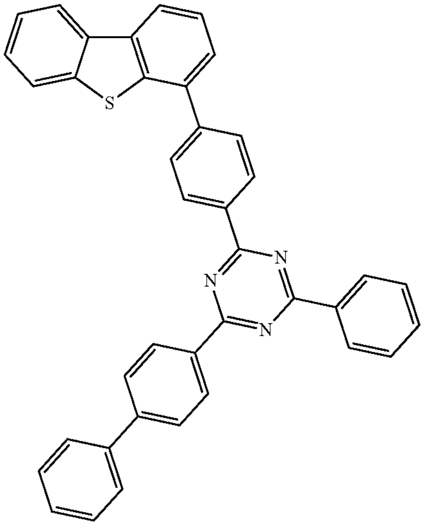
H2-94
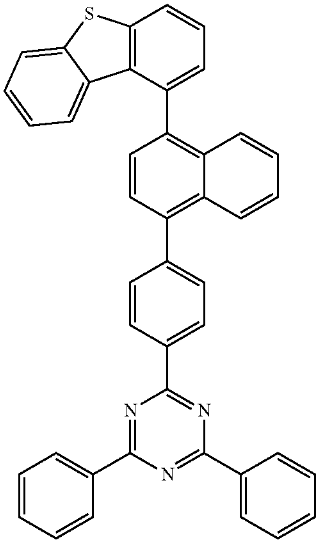

-continued
H2-95
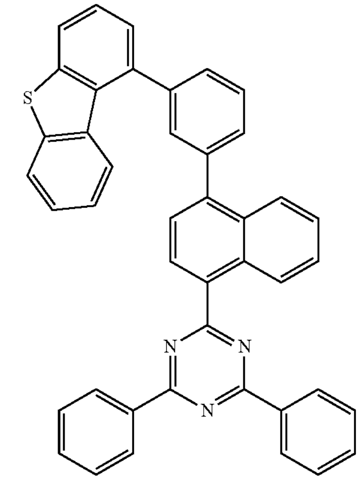
H2-96
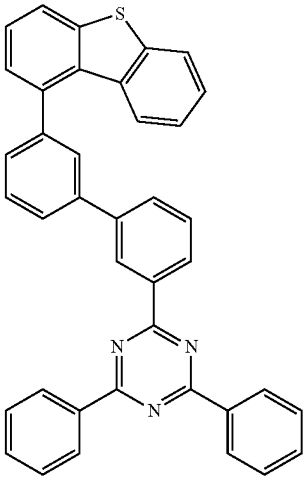
H2-97
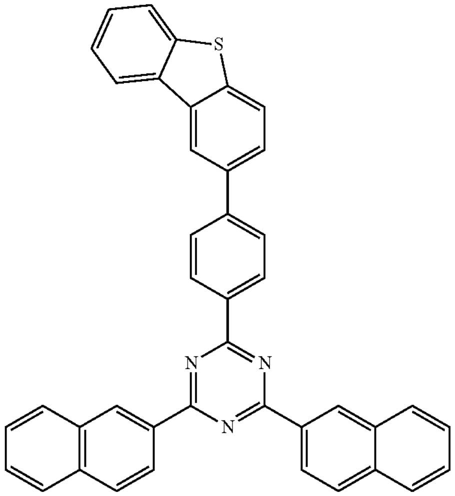
-continued
H2-98
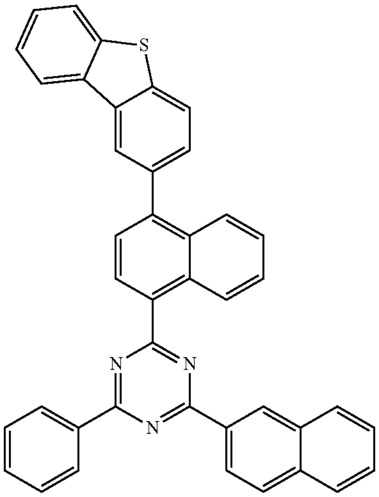
H2-99
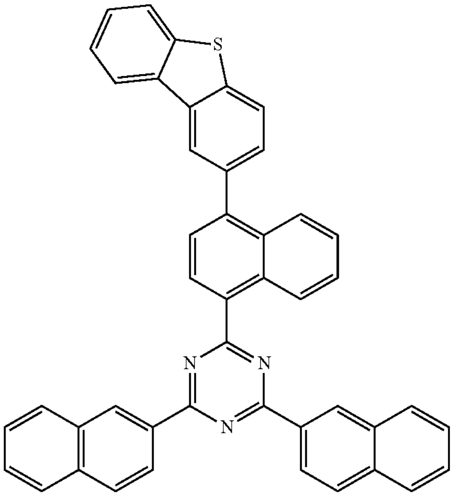
H2-100
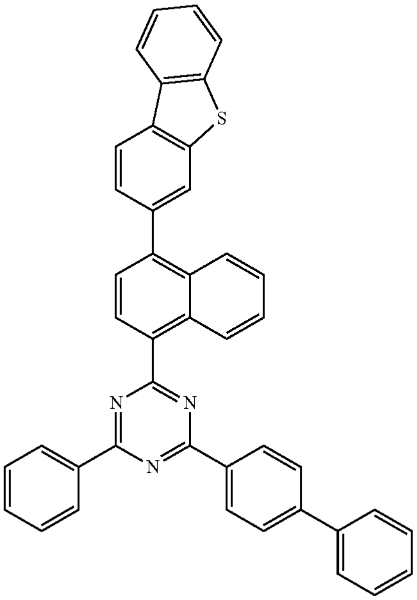

-continued
H2-101
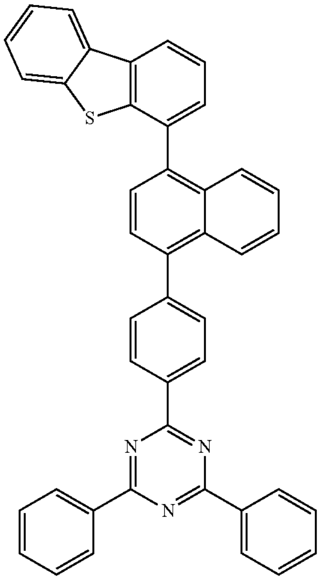
H2-102
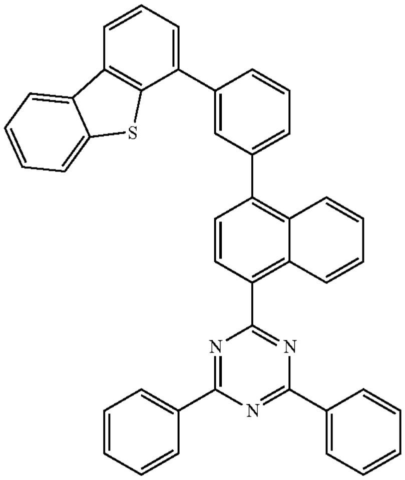
H2-103
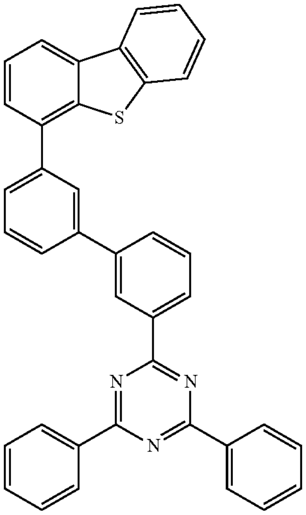
-continued
H2-104
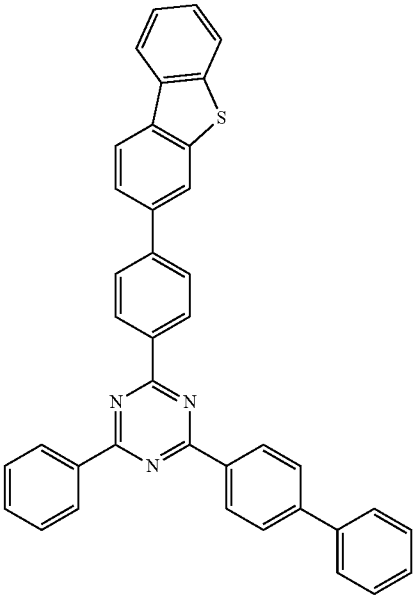
H2-105
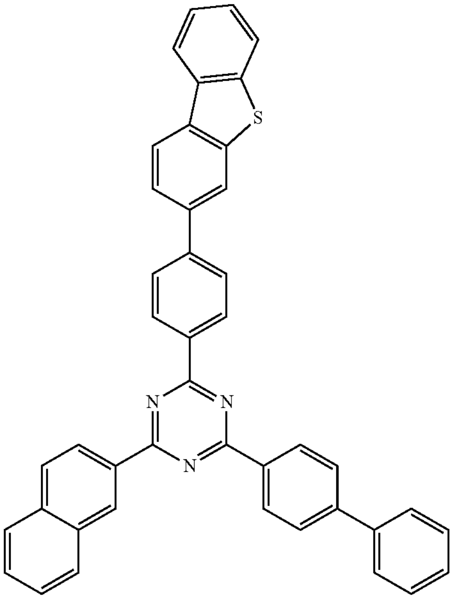
H2-106
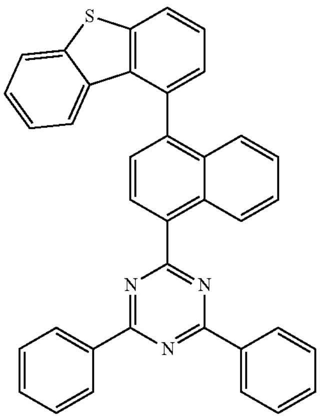

-continued
H2-107
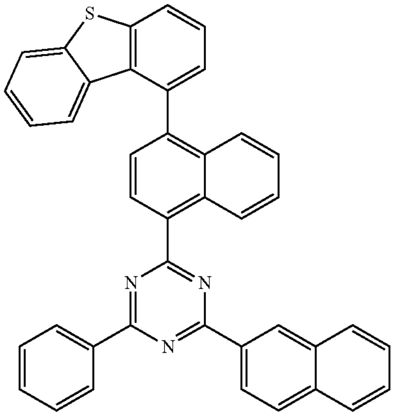
H2-108
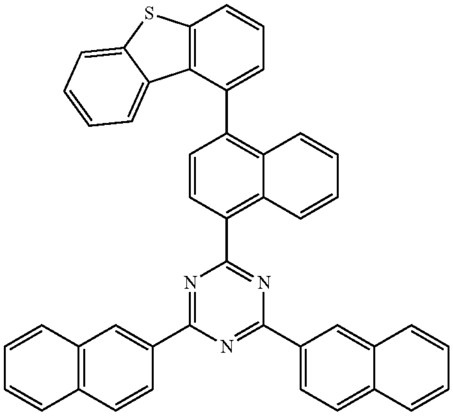
H2-109
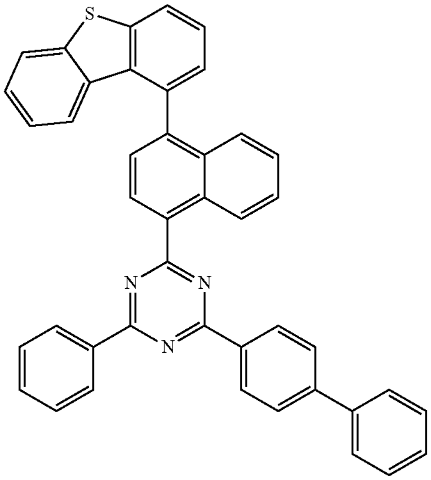
-continued
H2-110
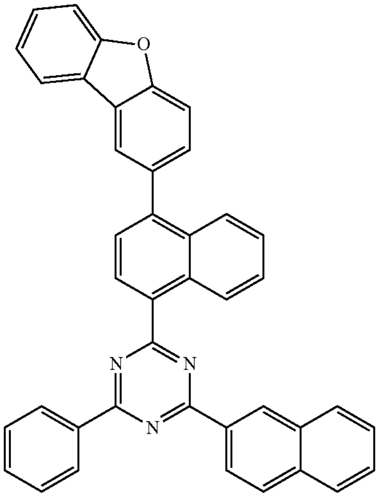
H2-111
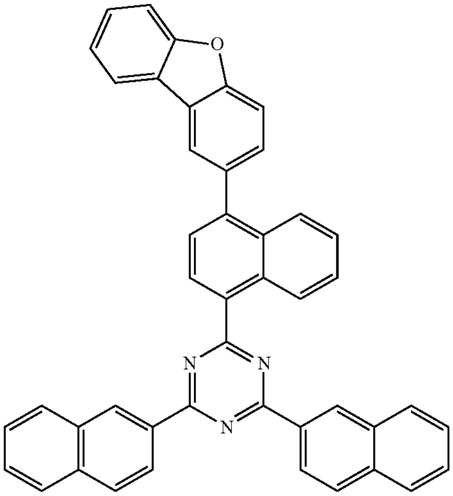
H2-112
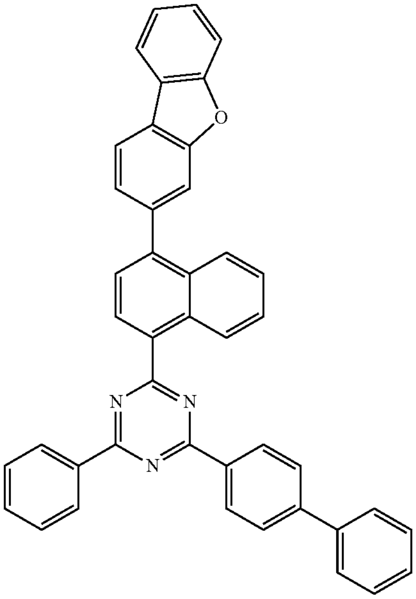

-continued
H2-113
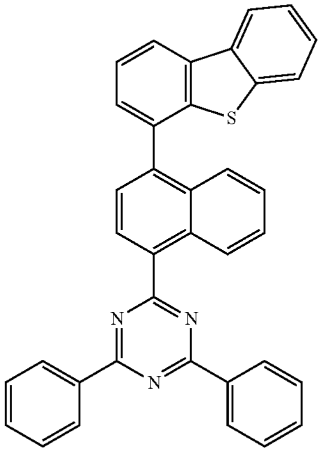
H2-114
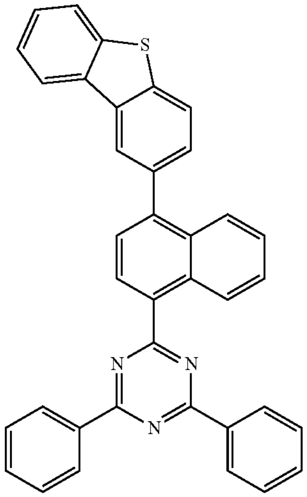
H2-115
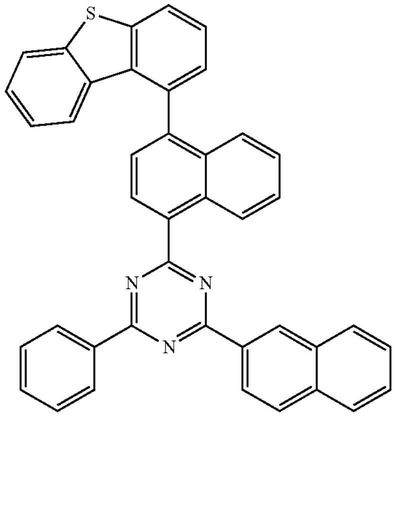
H2-116
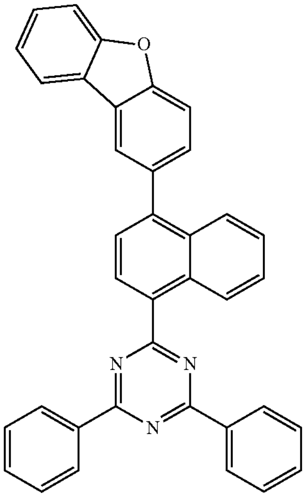
H2-117
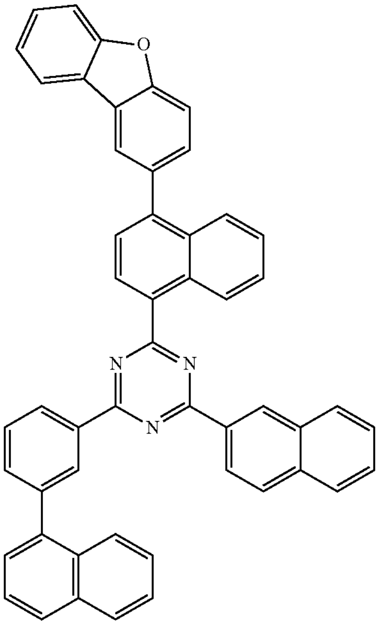
H2-118
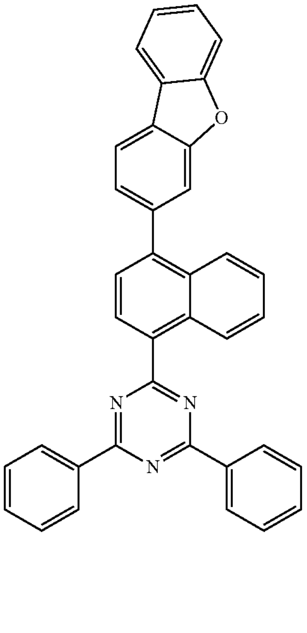

-continued
H2-119
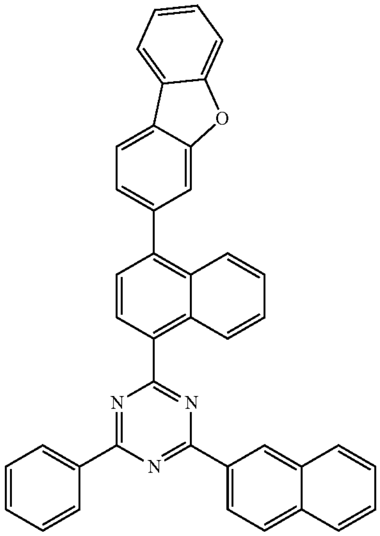
H2-120
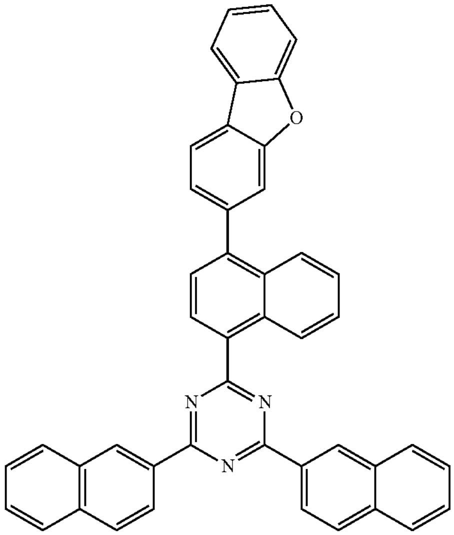
H2-121
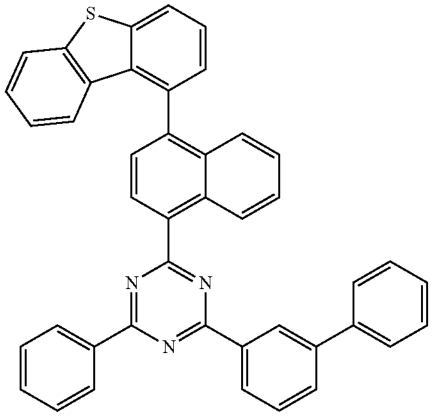
-continued
H2-122
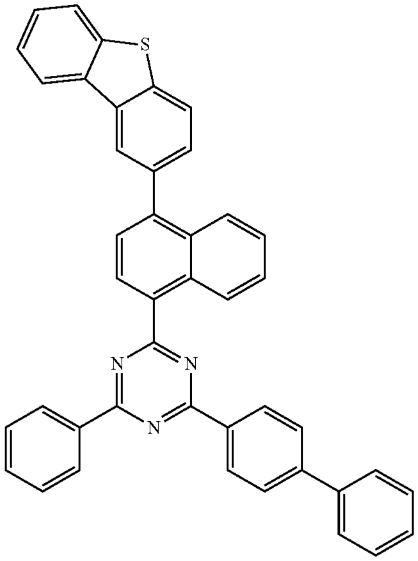
H2-123
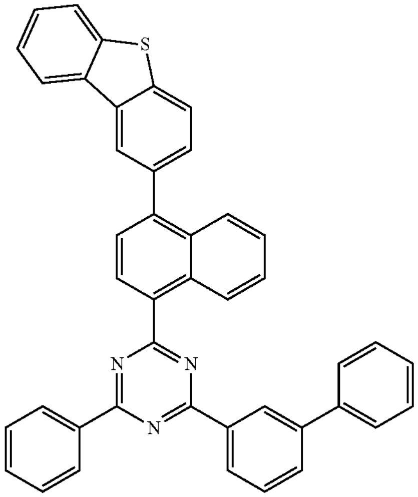
H2-124
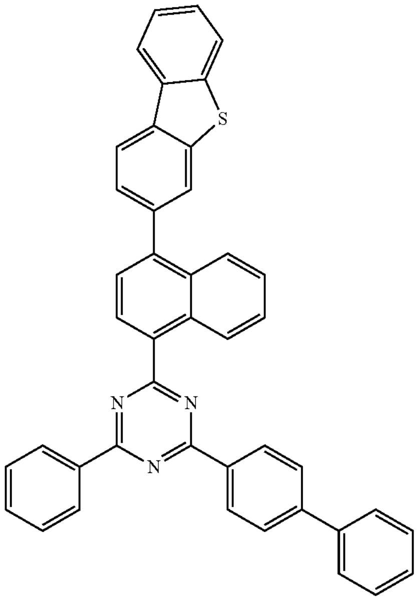

-continued
H2-125
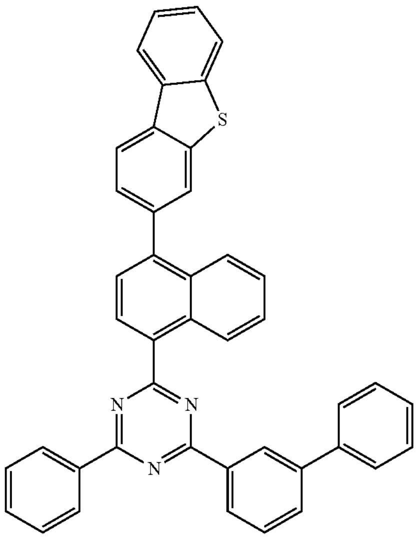
H2-126
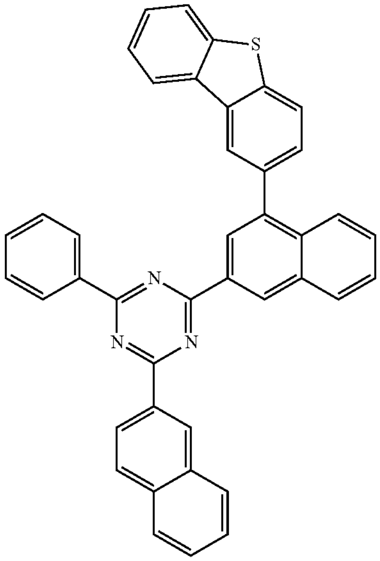
H2-127
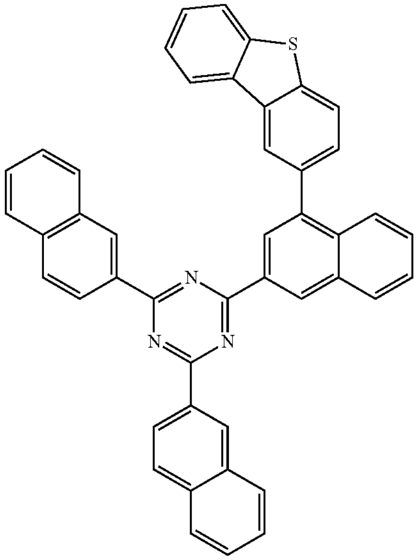
-continued
H2-128
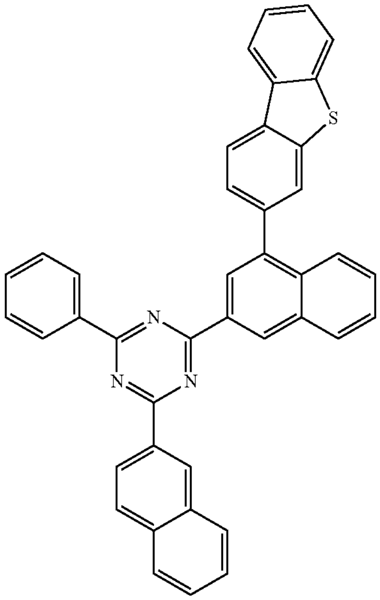
H2-129
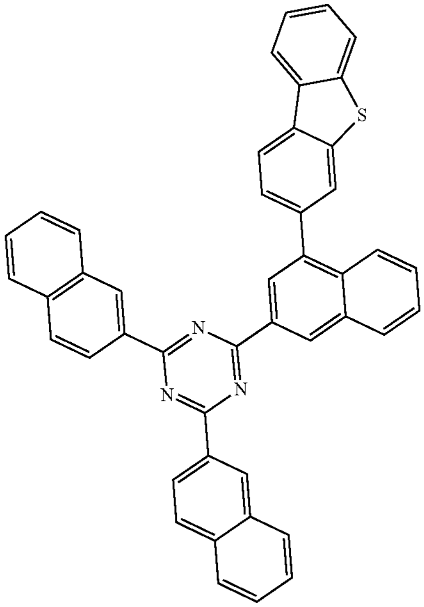

-continued
H2-130
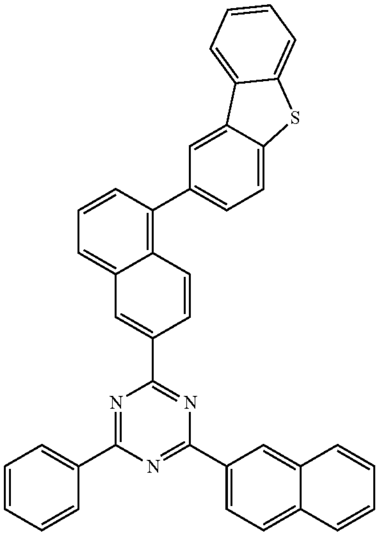
H2-131
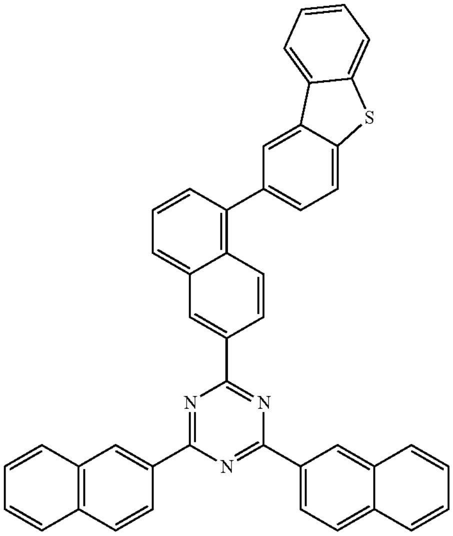
H2-132
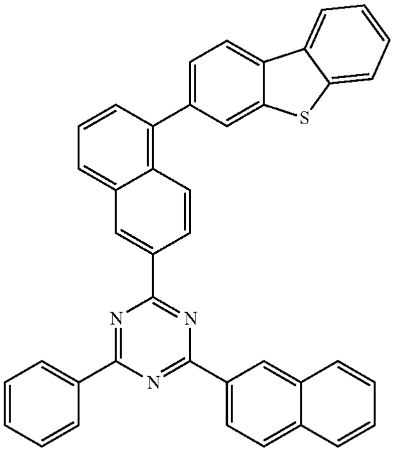
-continued
H2-133
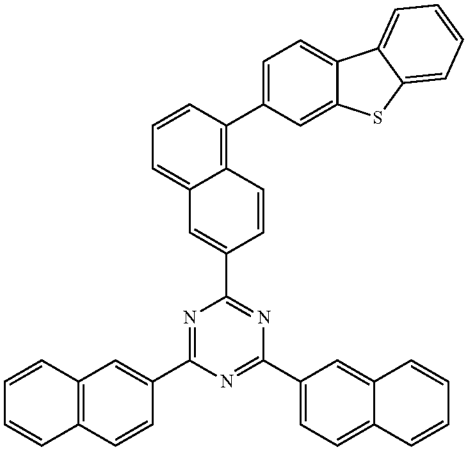
H2-134
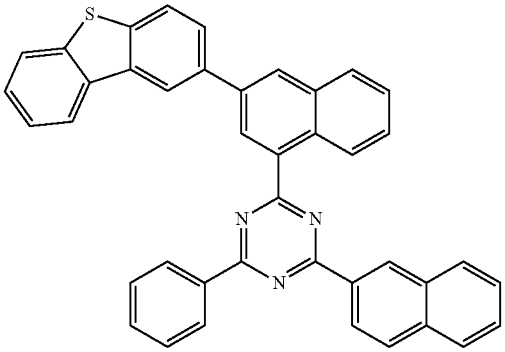
H2-135
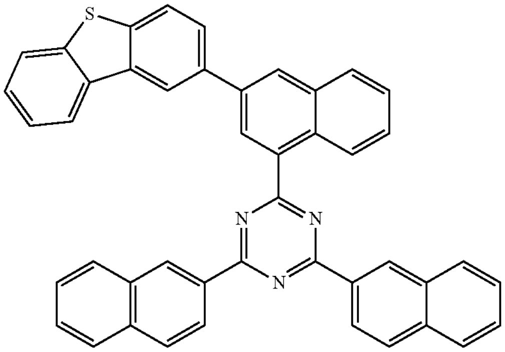

-continued
H2-136
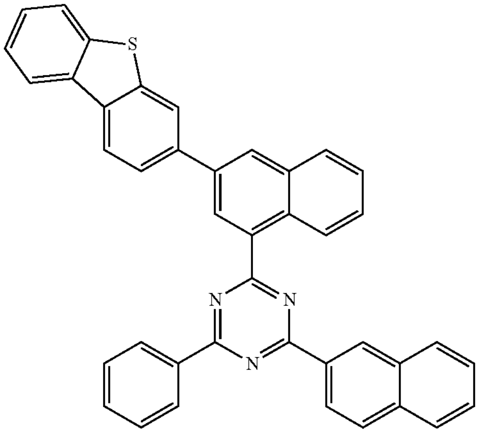
H2-137
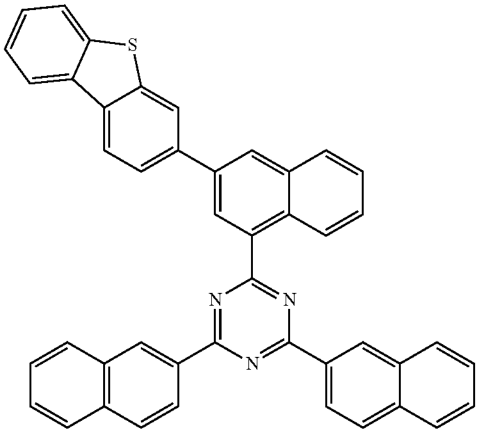
H2-138
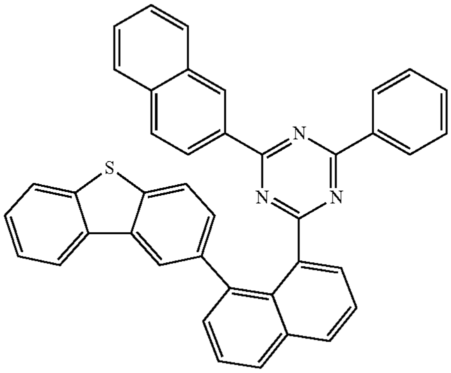
-continued
H2-139
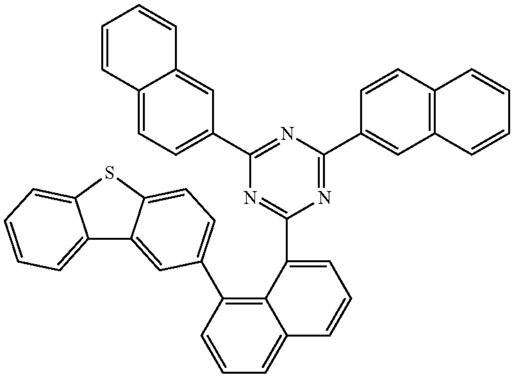
H2-140
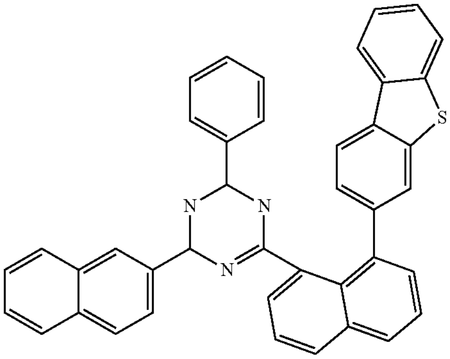
H2-141
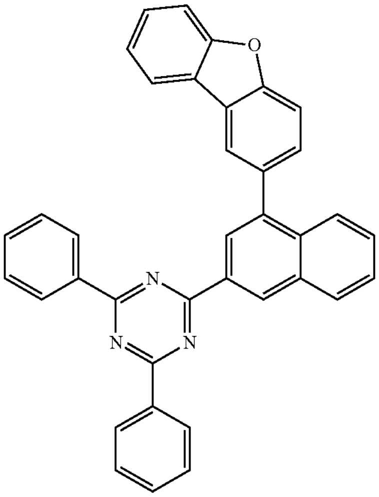

-continued
H2-142
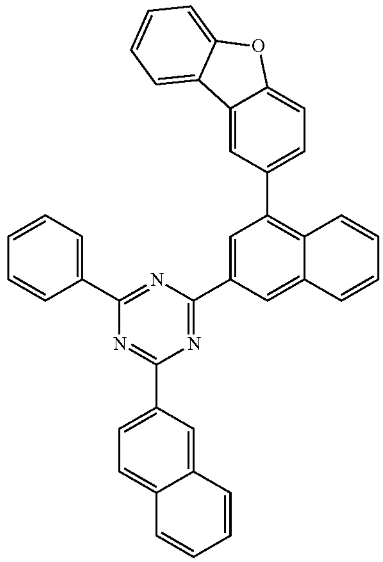
H2-143
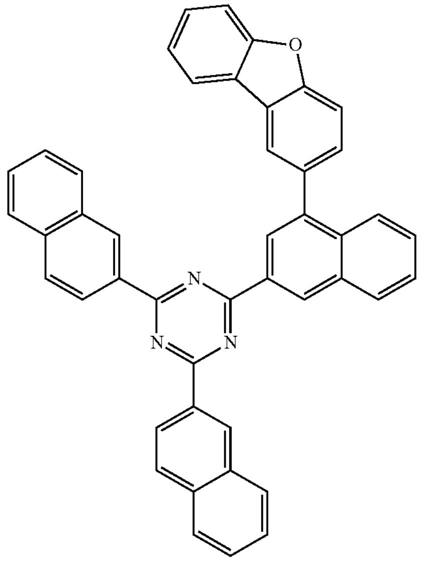
H2-144
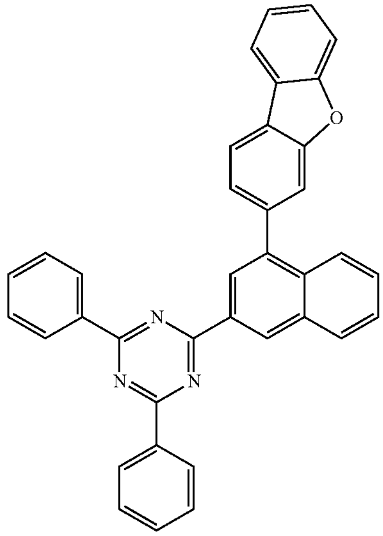
-continued
H2-145
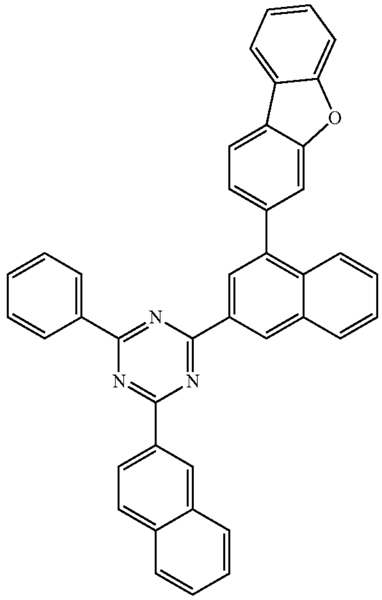
H2-146
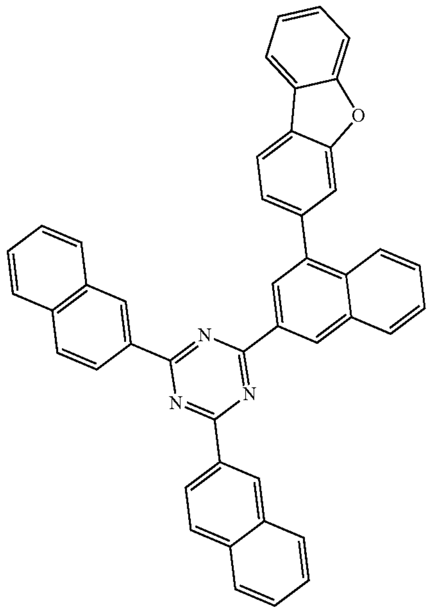

-continued
H2-147
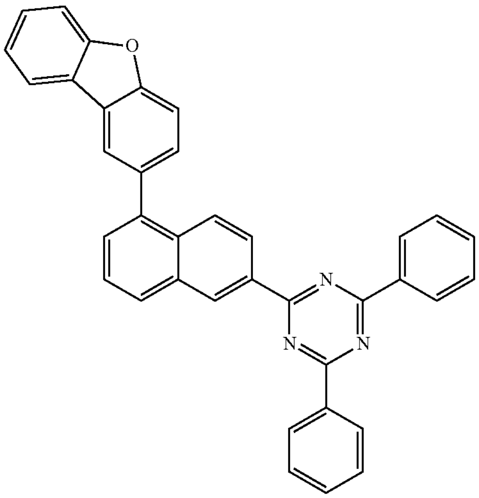
H2-148
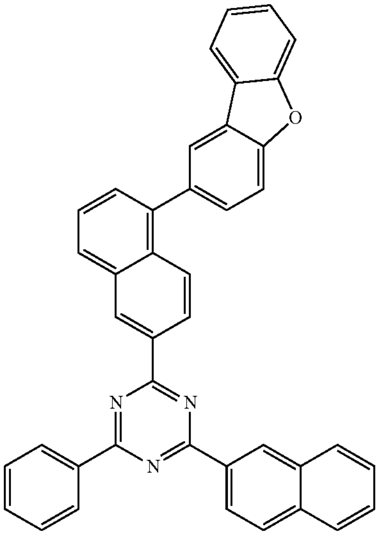
H2-149
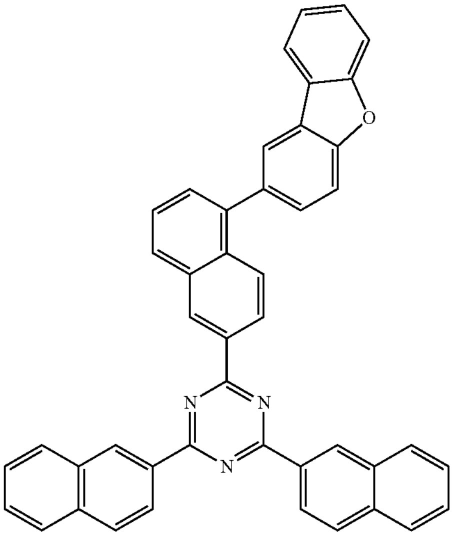
-continued
H2-150
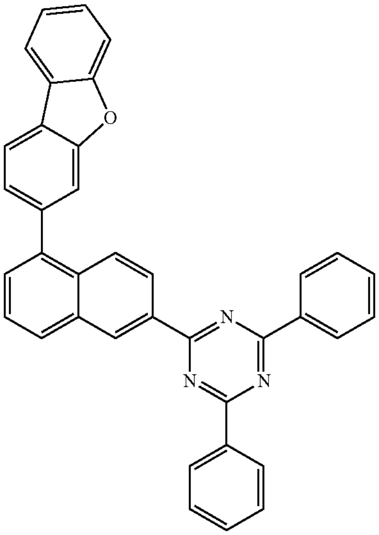
H2-151
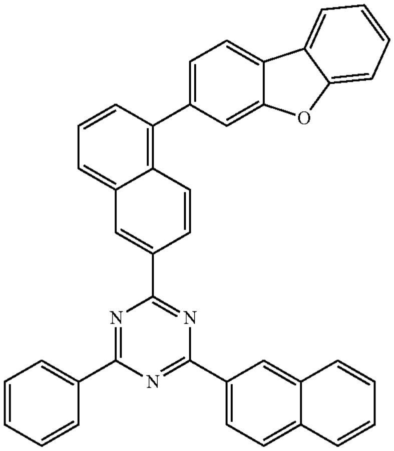
H2-152
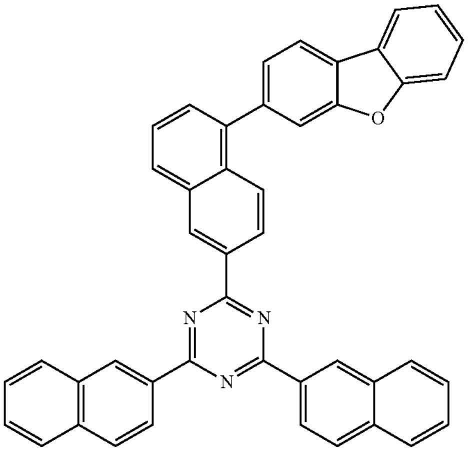

-continued
H2-153
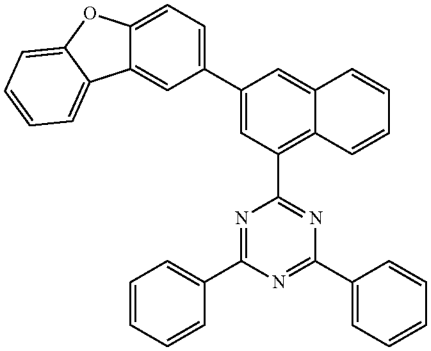
H2-154
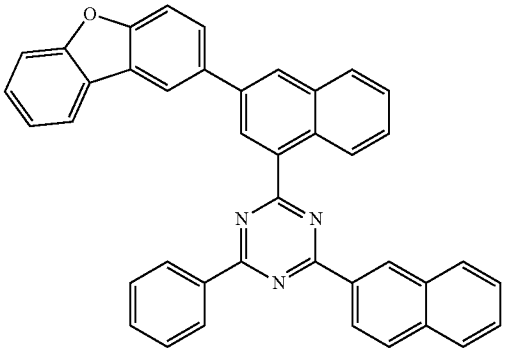
H2-155
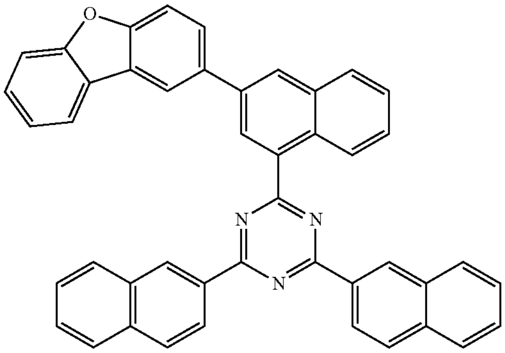
H2-156
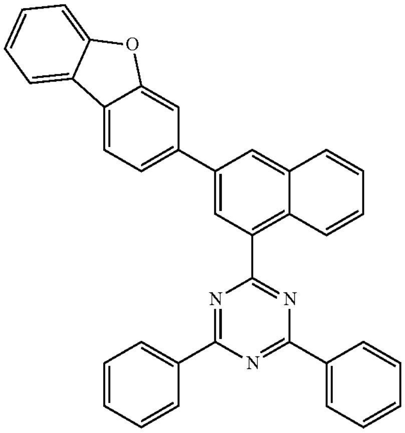
-continued
H2-157
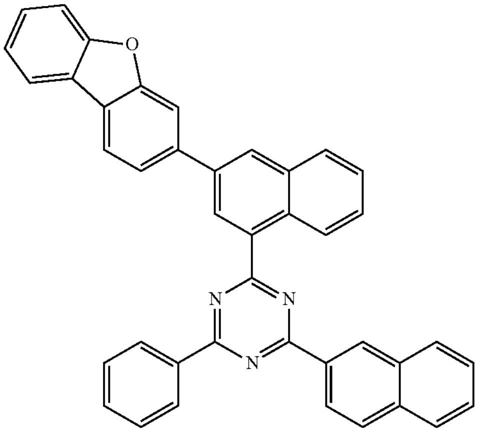
H2-158
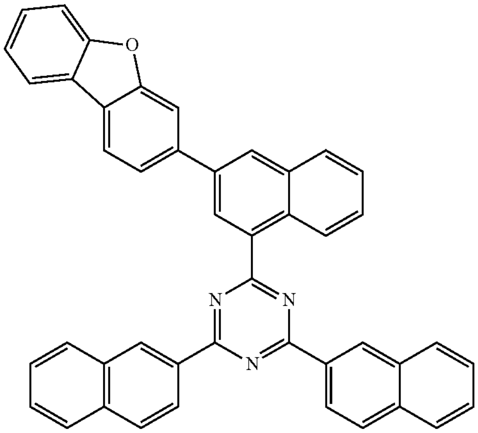
H2-159
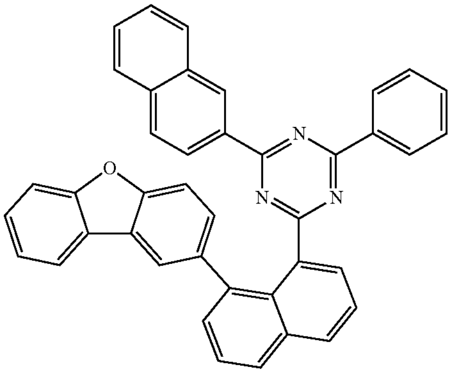

-continued
H2-160
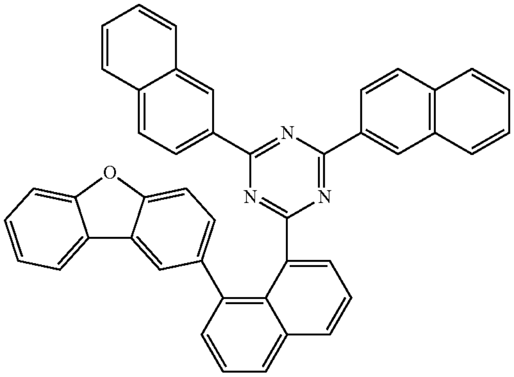
H2-161
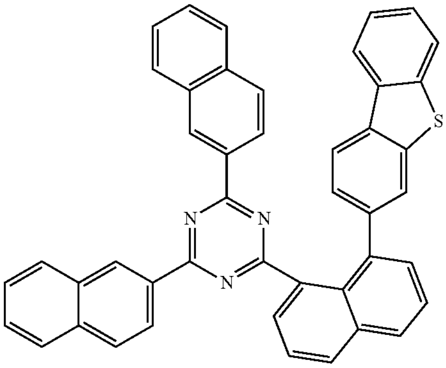
H2-162
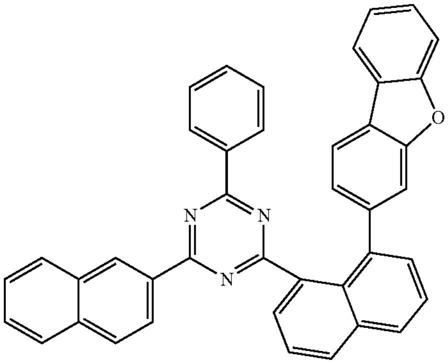
H2-163
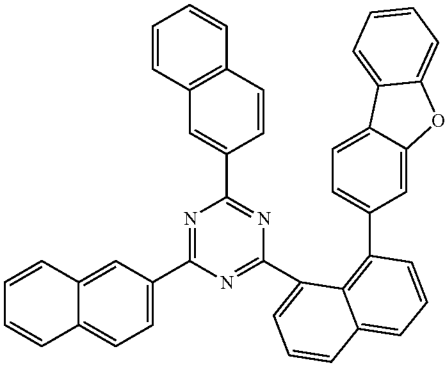
-continued
H2-164
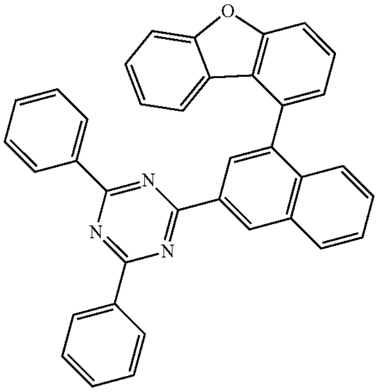
H2-165
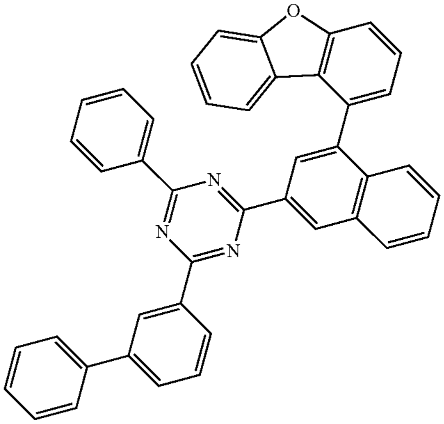
H2-166
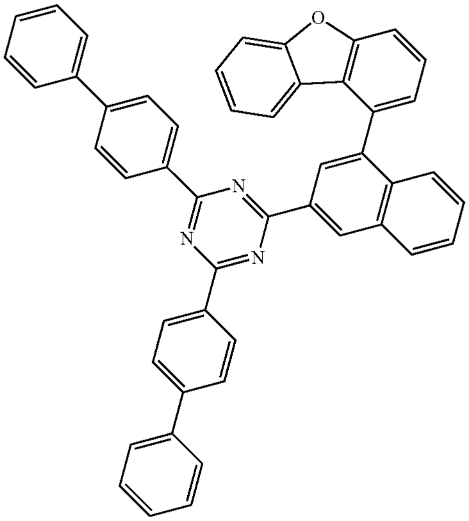

-continued
H2-167
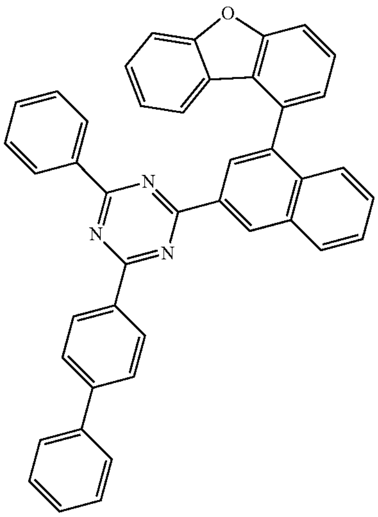
H2-168
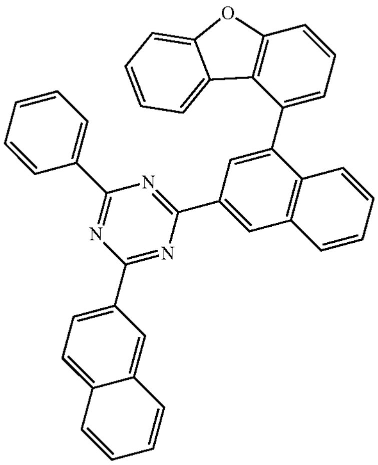
H2-169
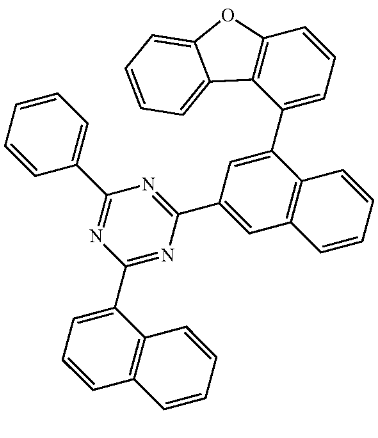
-continued
H2-170
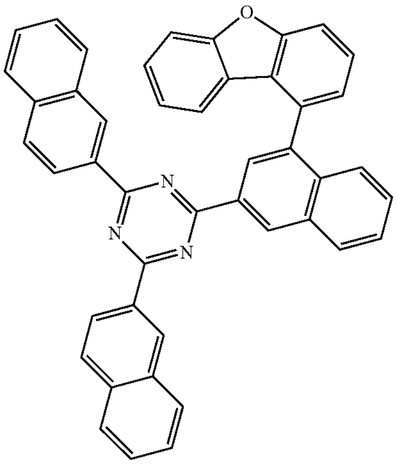
H2-171
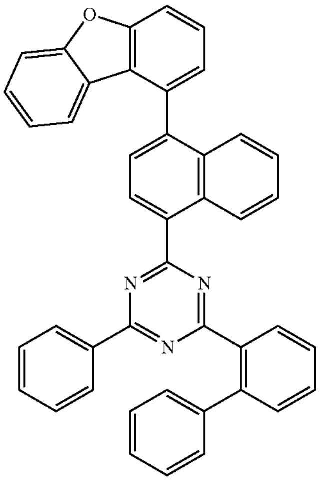
H2-172
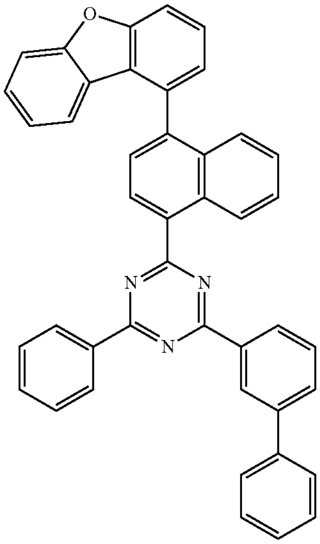

-continued
H2-173
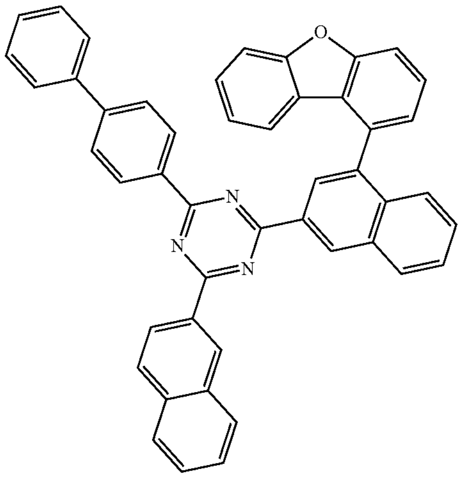
H2-174
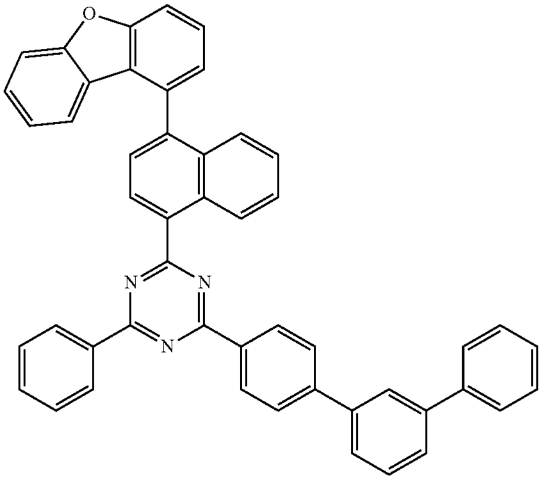
H2-175
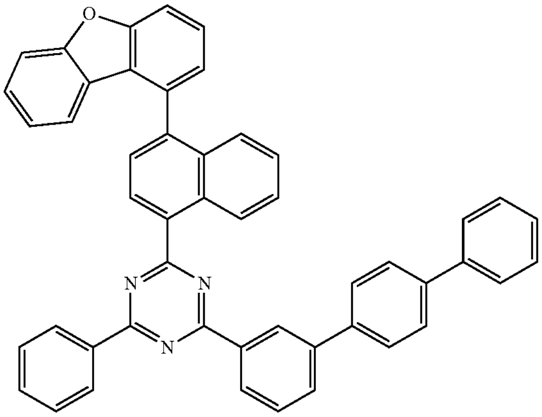
-continued
H2-176
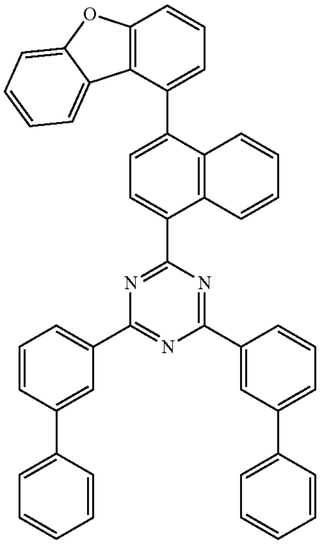
H2-177
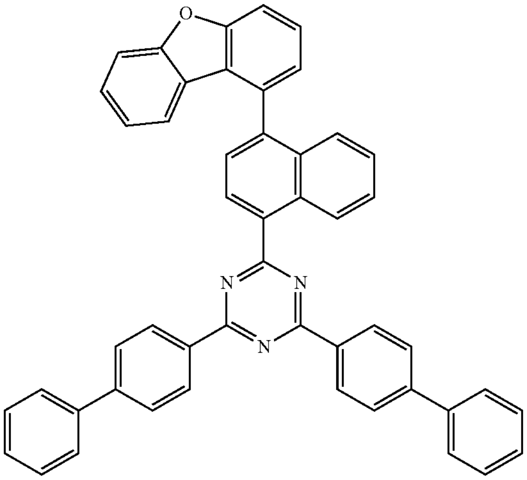
H2-178
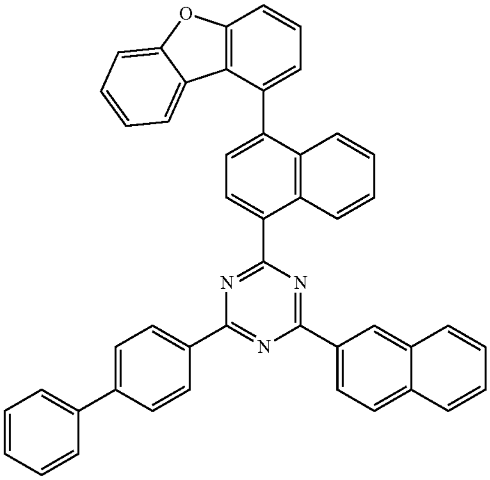

-continued
H2-179
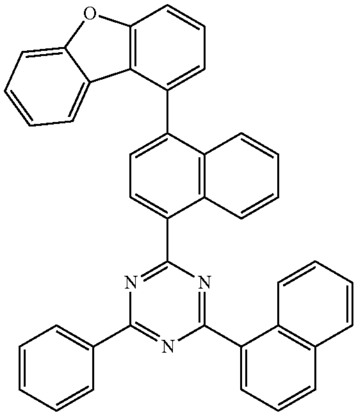
H2-180
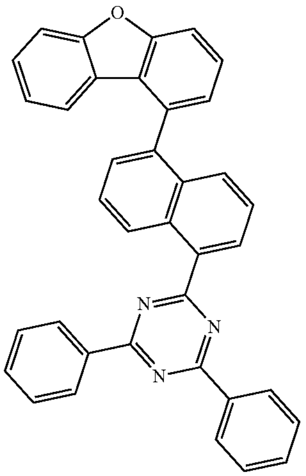
H2-181
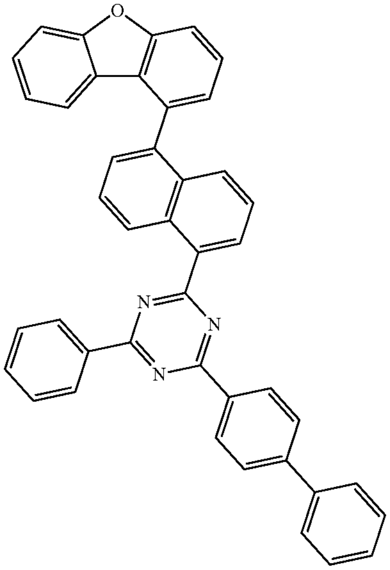
-continued
H2-182
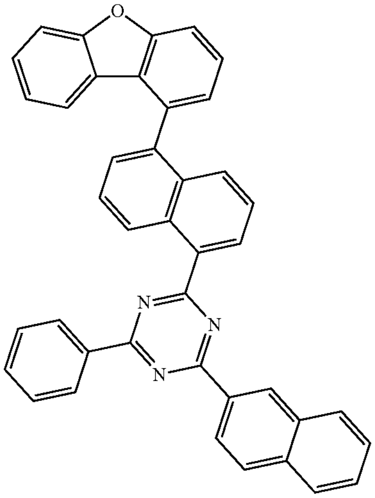
H2-183
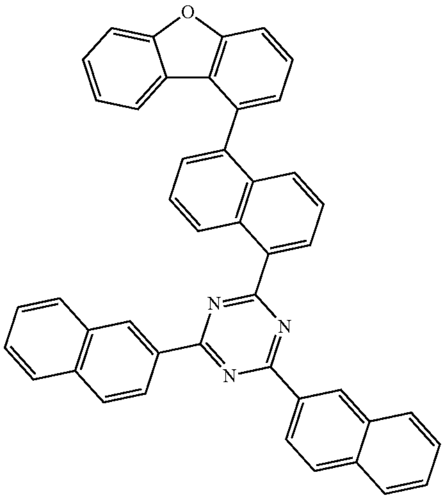
H2-184
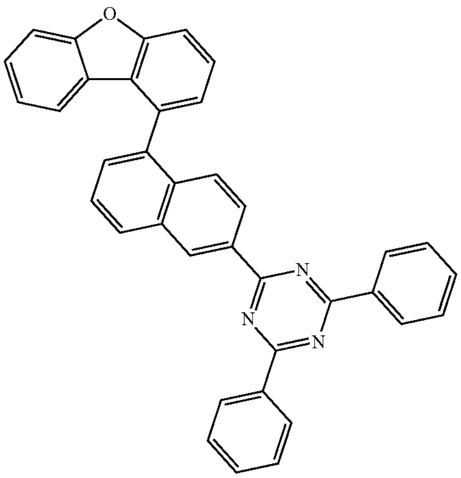

-continued
H2-185
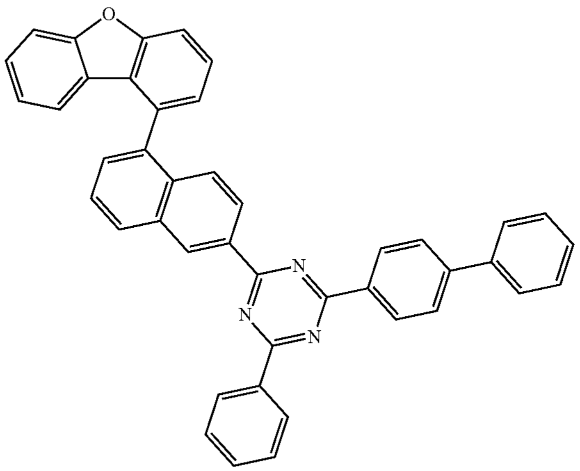
H2-186
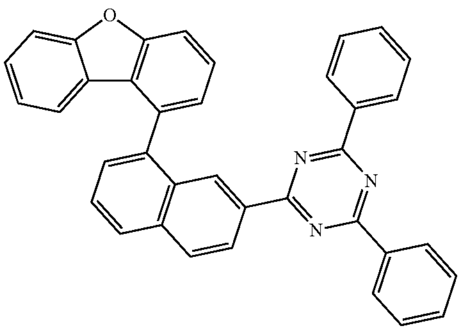
H2-187
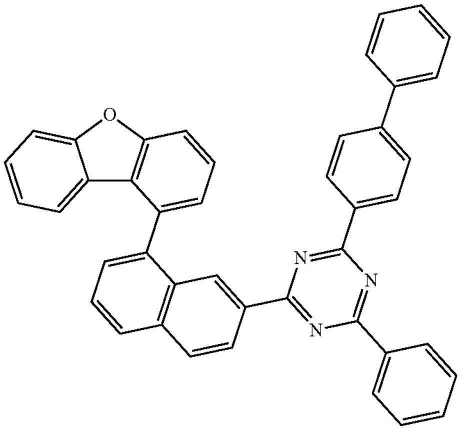
-continued
H2-188
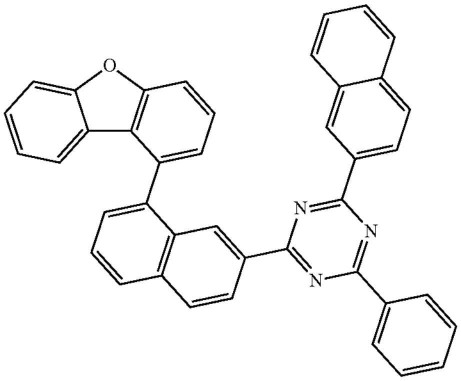
H2-189
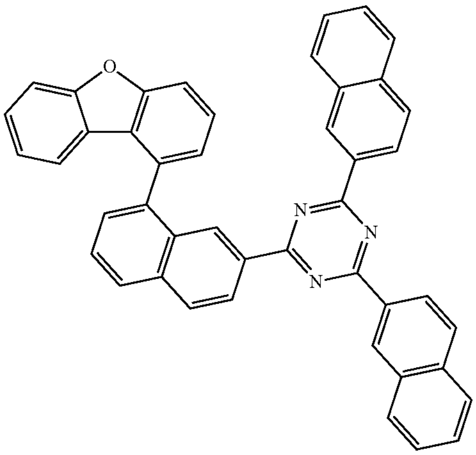
H2-190
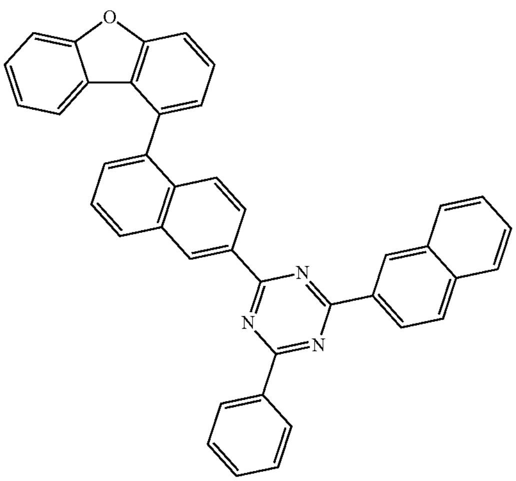

-continued
H2-191
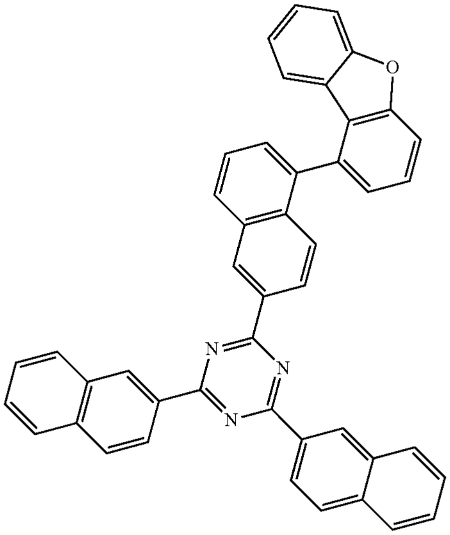
H2-192
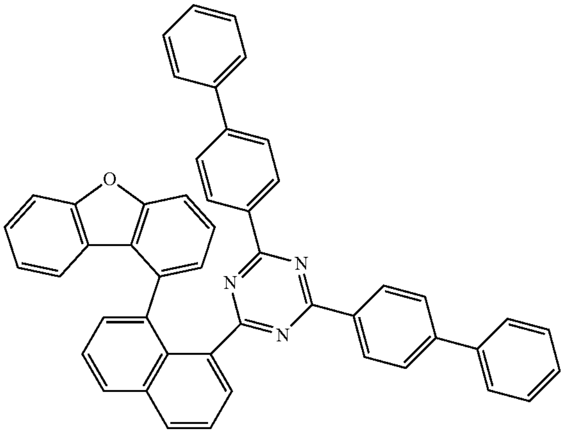
H2-193
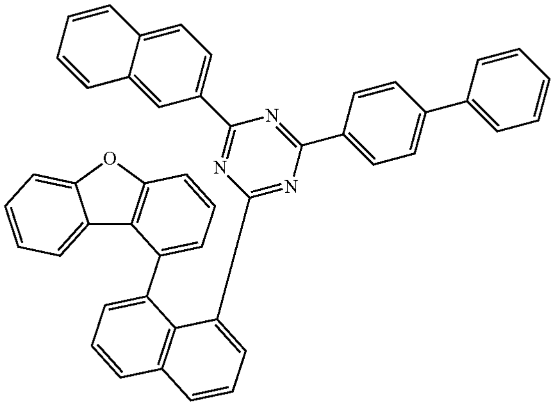
-continued
H2-194
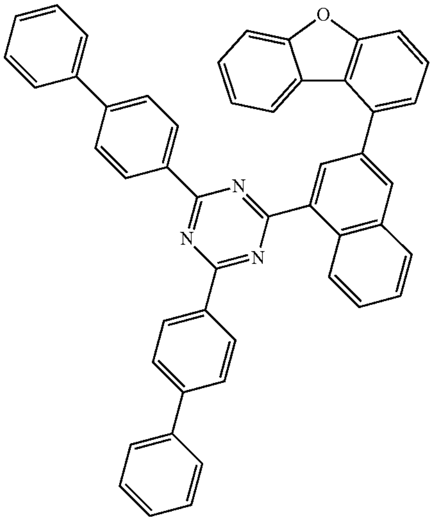
H2-195
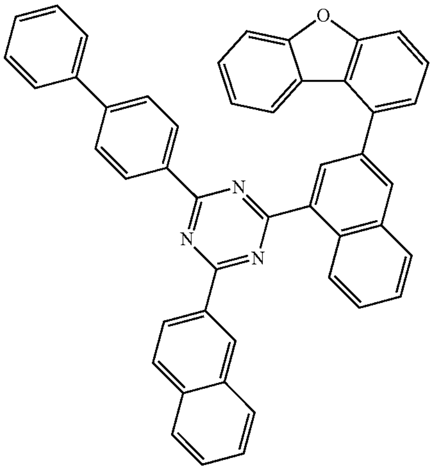
H2-196
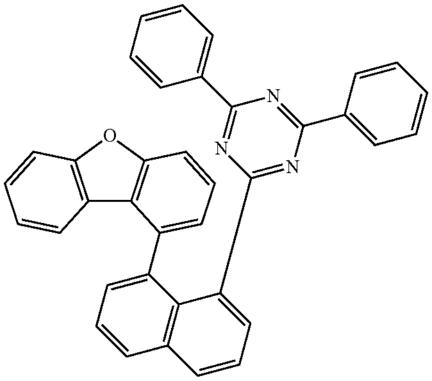

-continued
H2-197
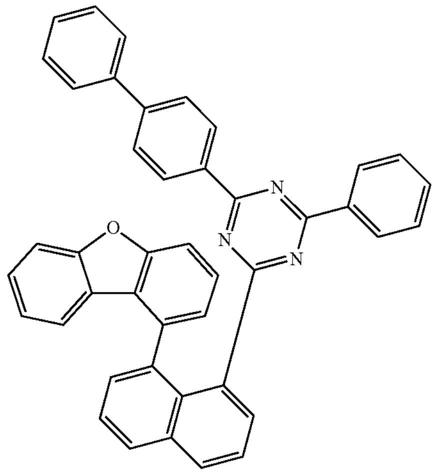
H2-198
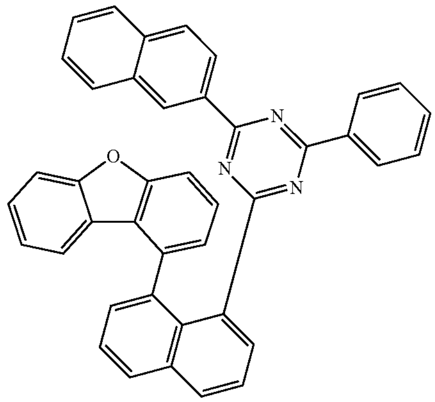
H2-199
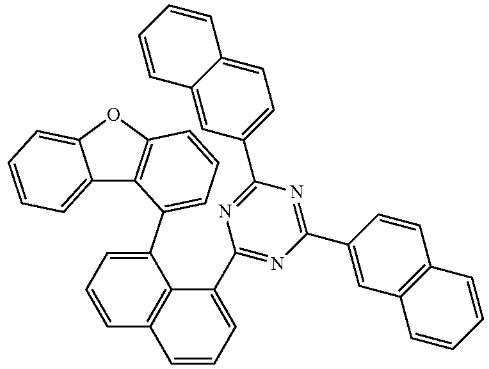
H2-200
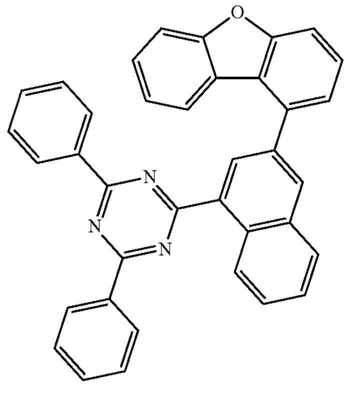
-continued
H2-201
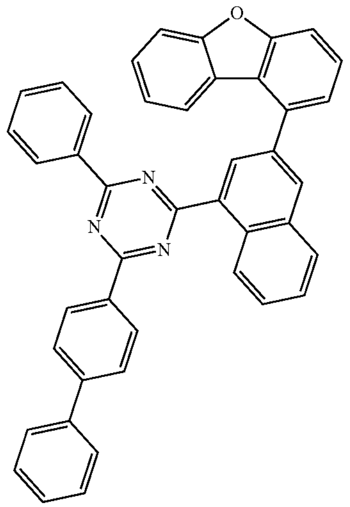
H2-202
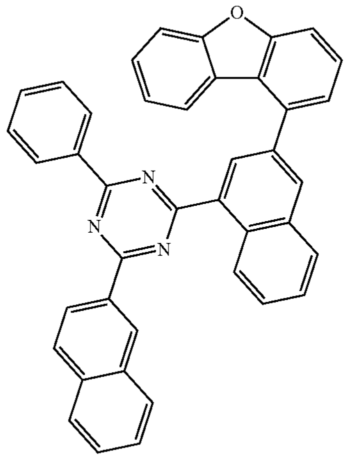
H2-203
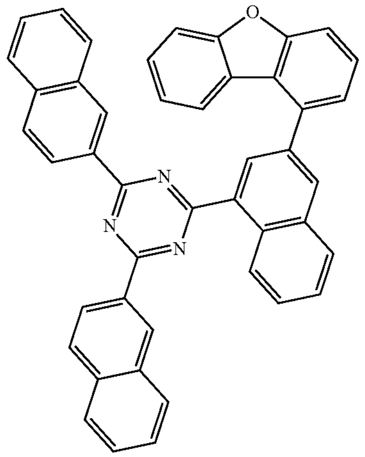

-continued
H2-204
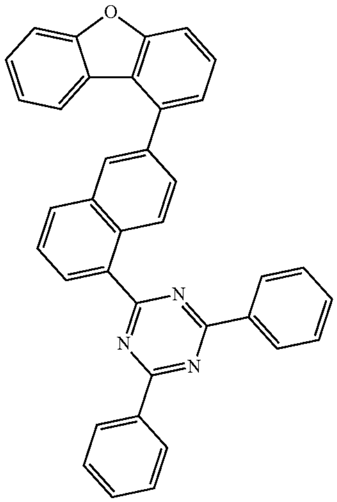
H2-205
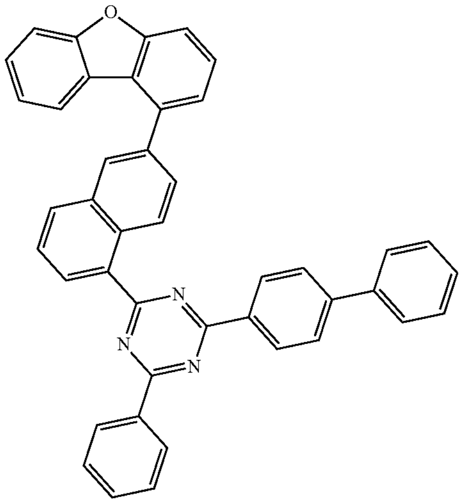
H2-206
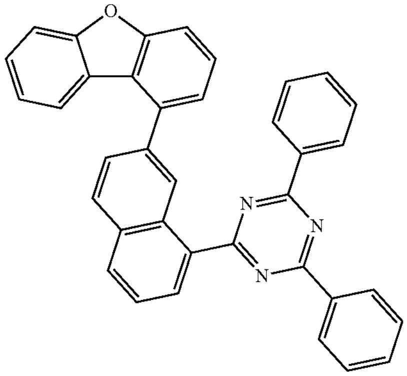
-continued
H2-207
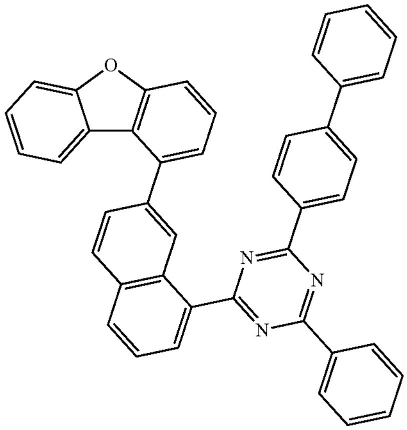
H2-208
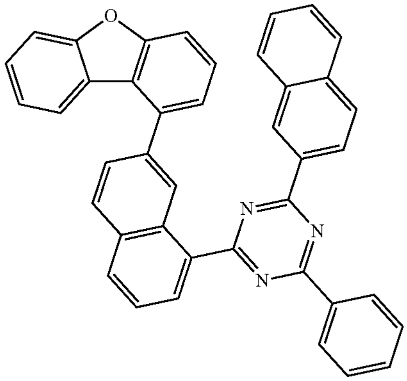
H2-209
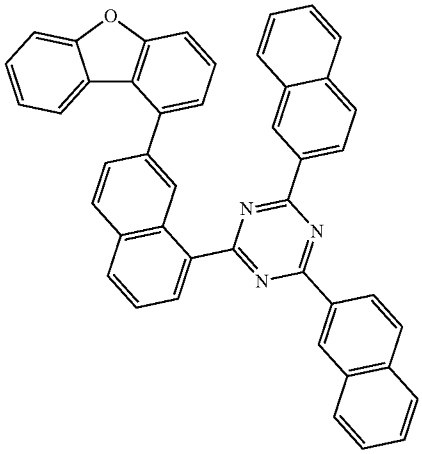

-continued
H2-210
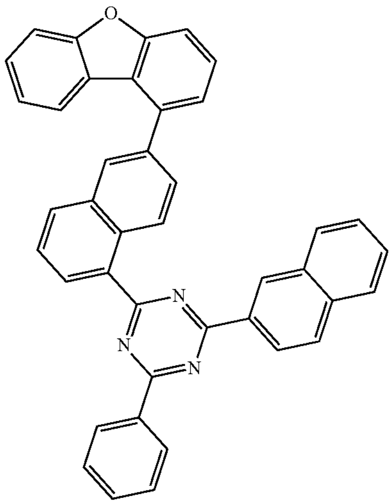
H2-211
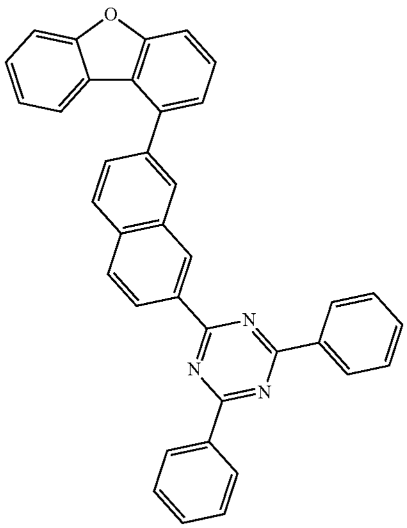
H2-212
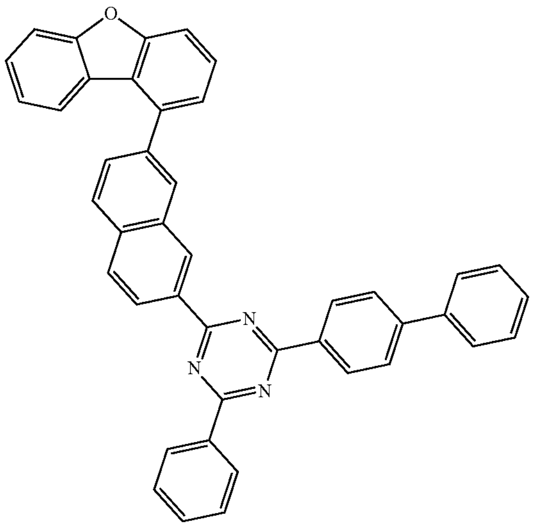
-continued
H2-213
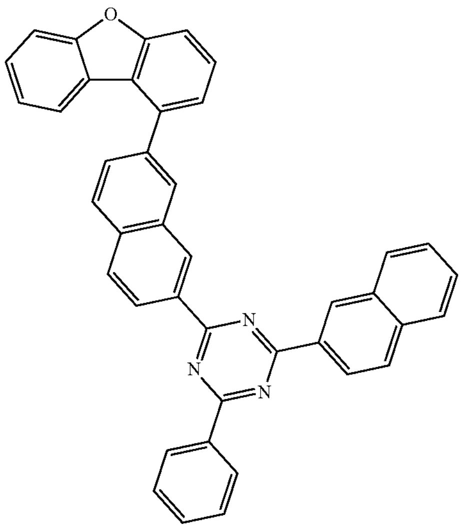
H2-214
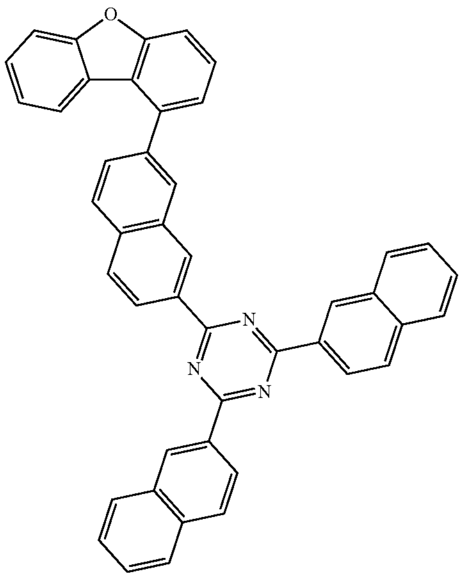

-continued
H2-215
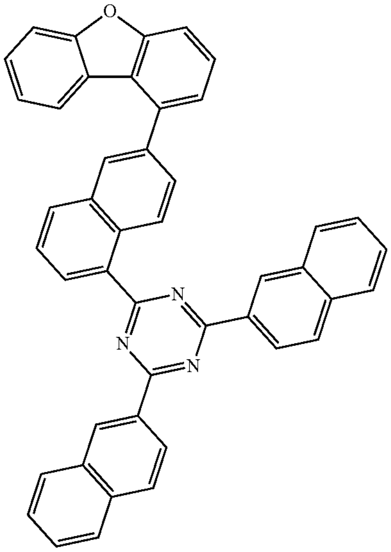
H2-216
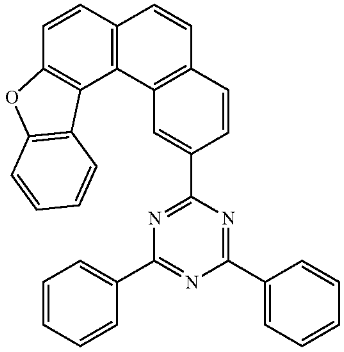
H2-217
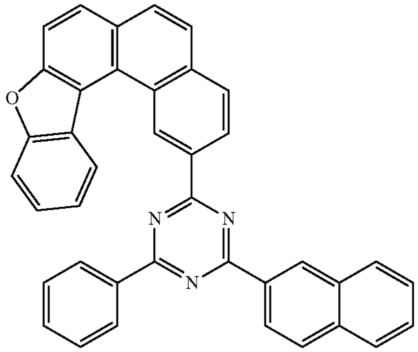
H2-218
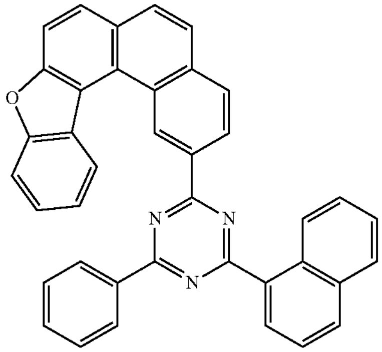
-continued
H2-219
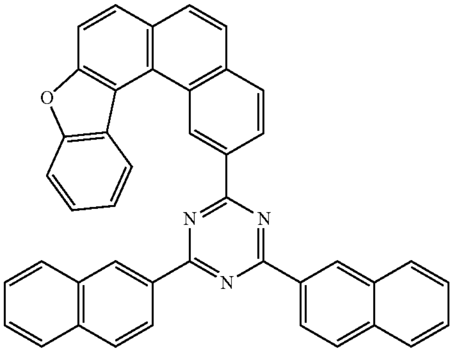
H2-220
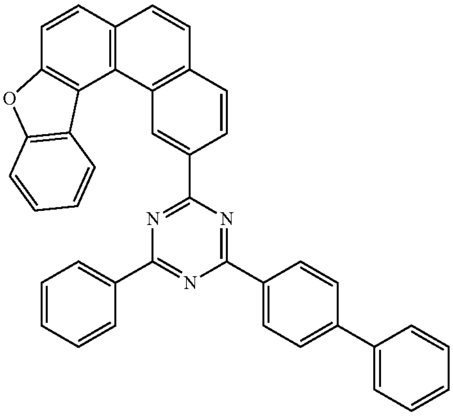
H2-221
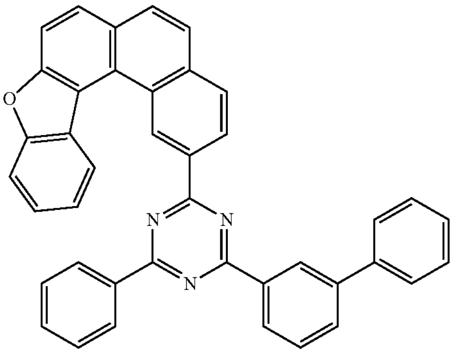
H2-222
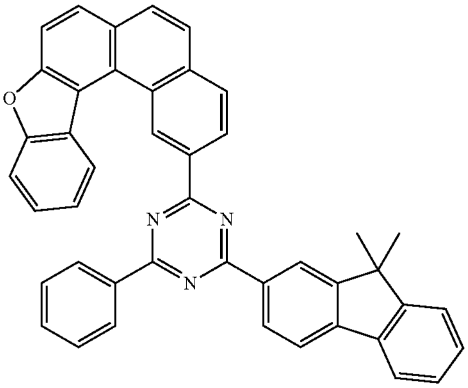

-continued
H2-223
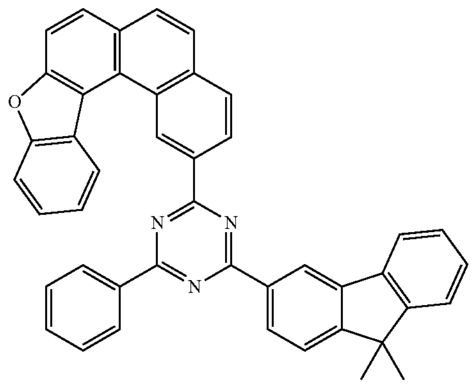
H2-224
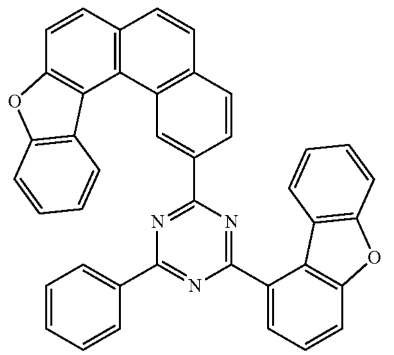
H2-225
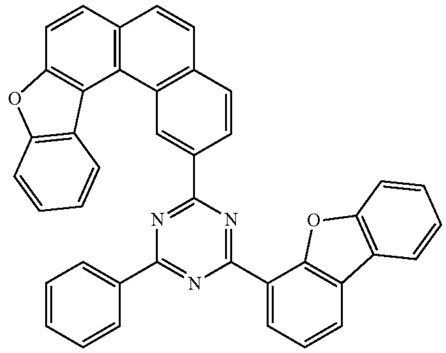
H2-226
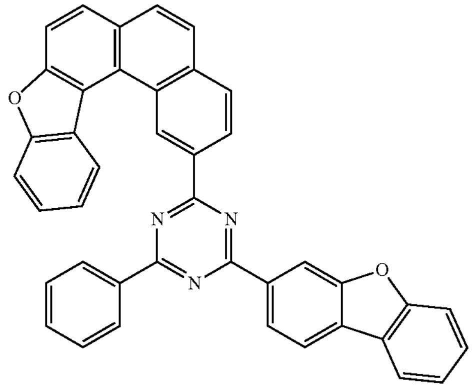
-continued
H2-227
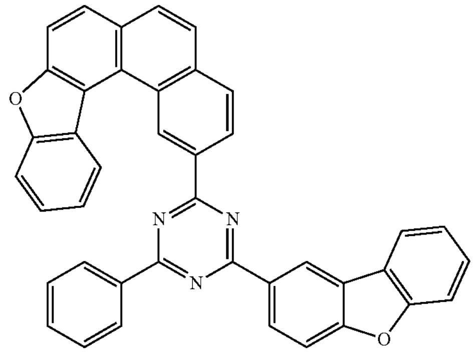
H2-228
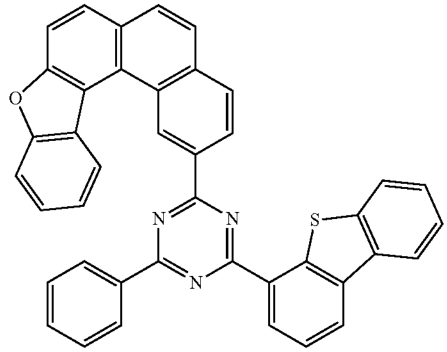
H2-229
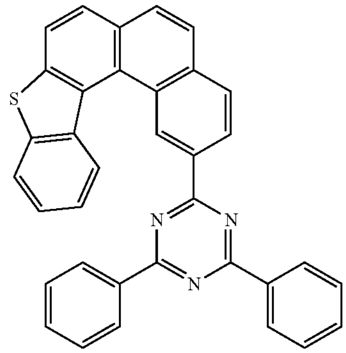
H2-230
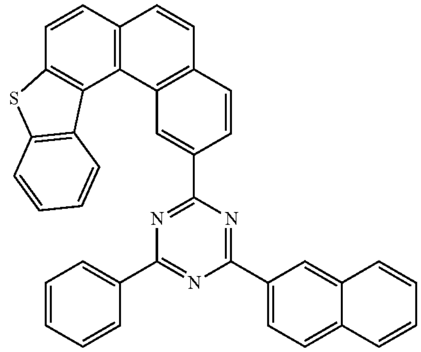

-continued
H2-231
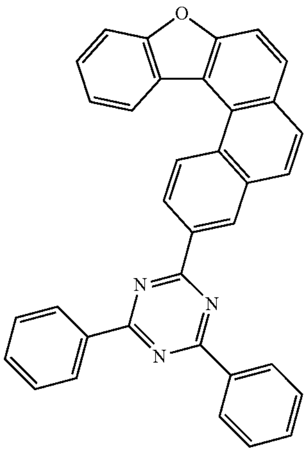
H2-232
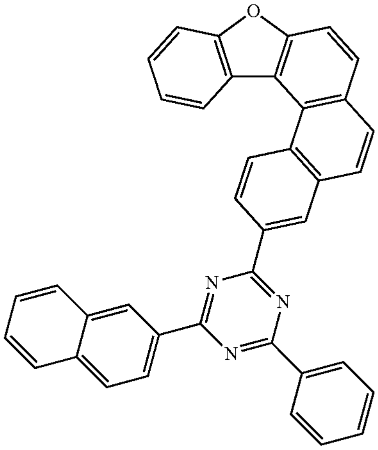
H2-233
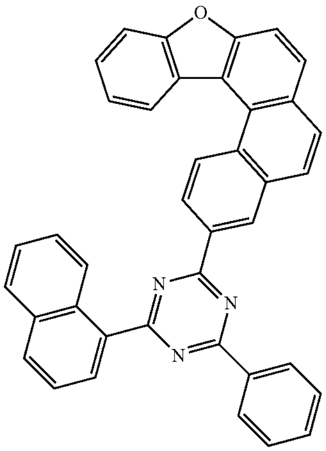
-continued
H2-234
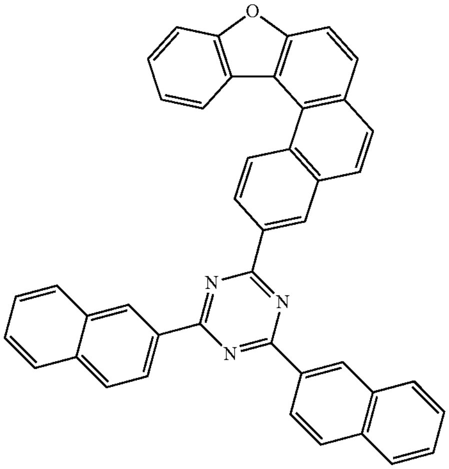
H2-235
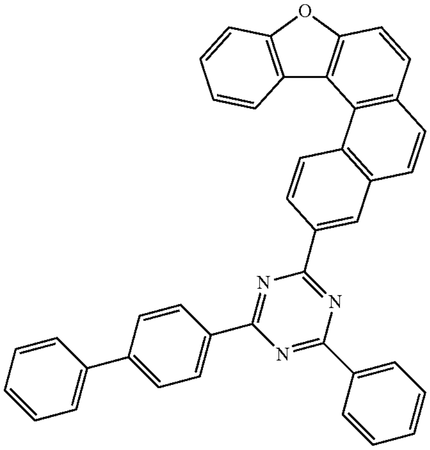
H2-236
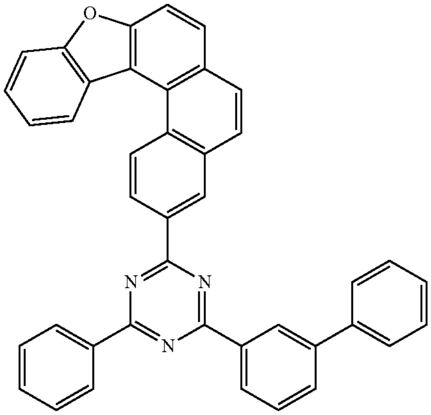

-continued
H2-237
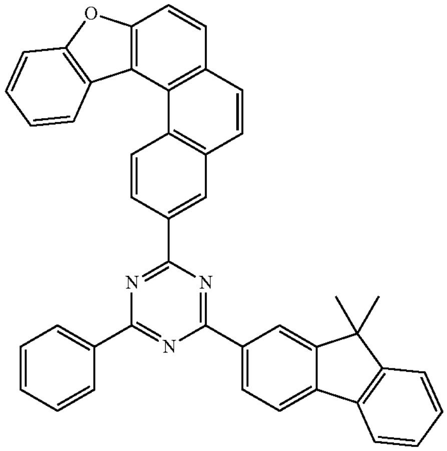
H2-238
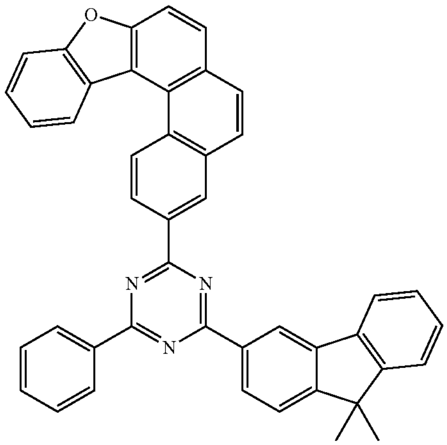
H2-239
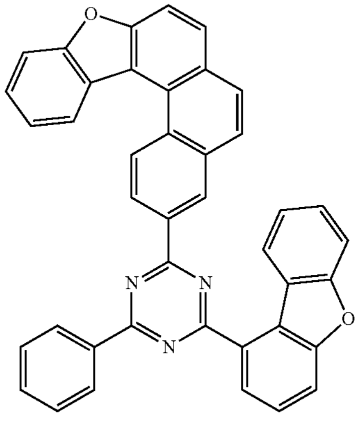
-continued
H2-240
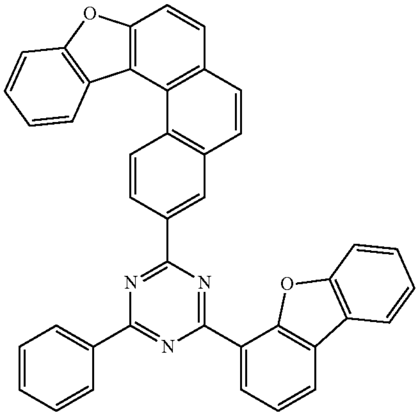
H2-241
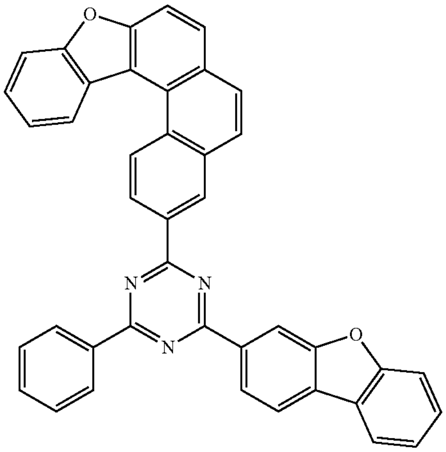
H2-242
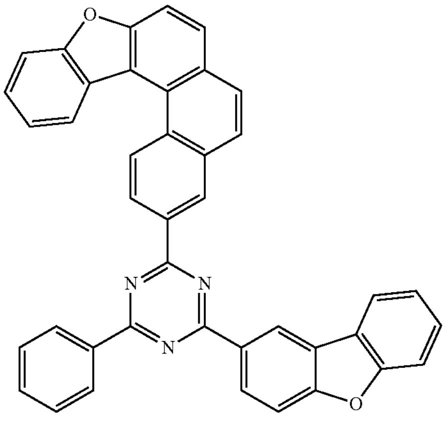

-continued
H2-243
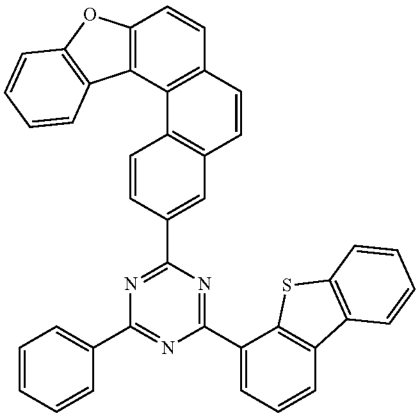
H2-244
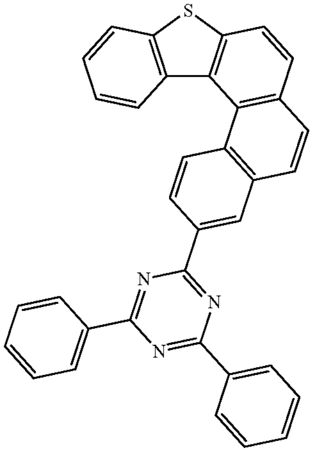
H2-245
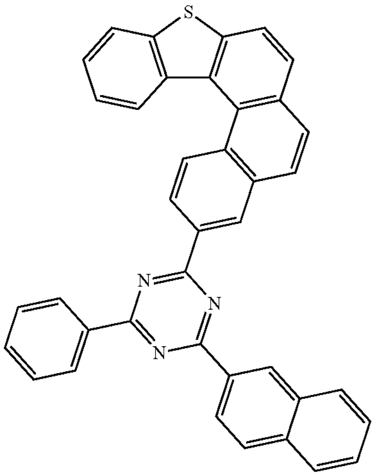
-continued
H2-246
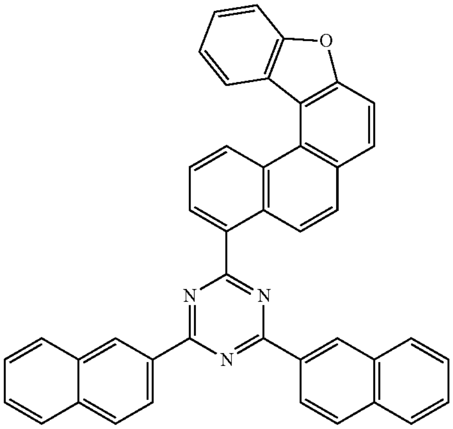
H2-247
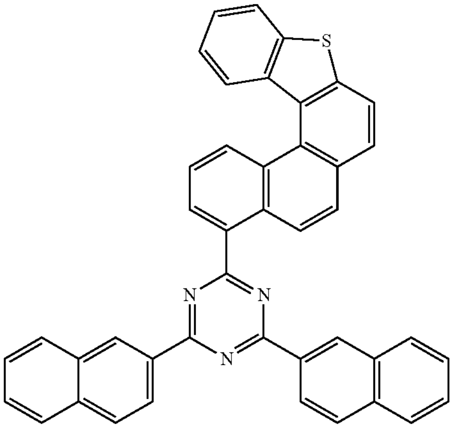
H2-248
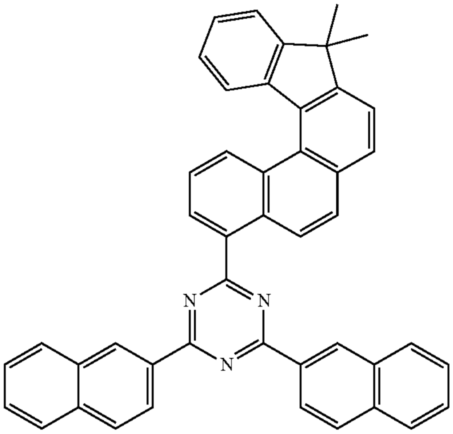

-continued
H2-249
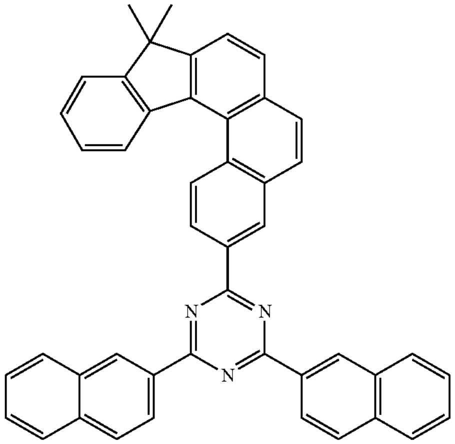
H2-250
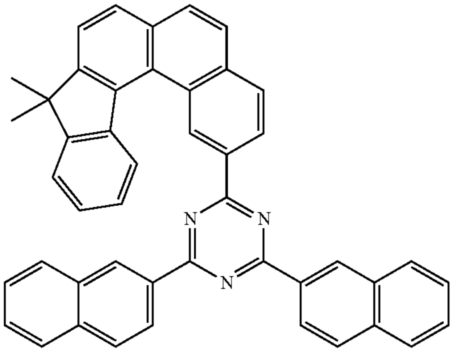
H2-251
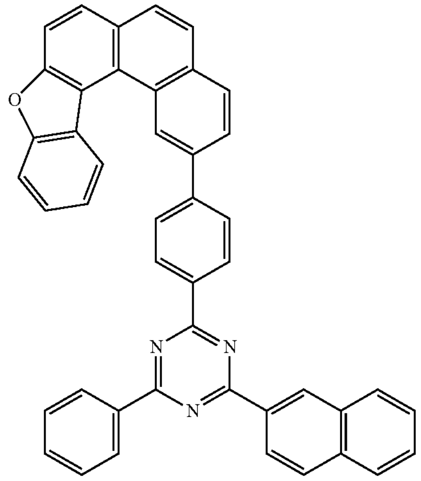
-continued
H2-252
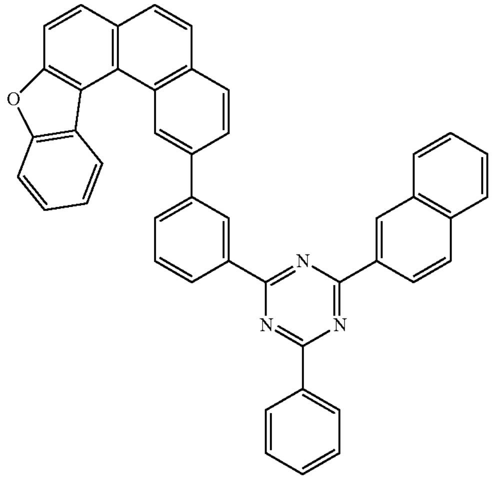
H2-253
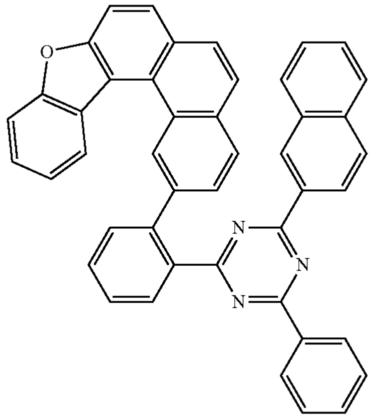
H2-254
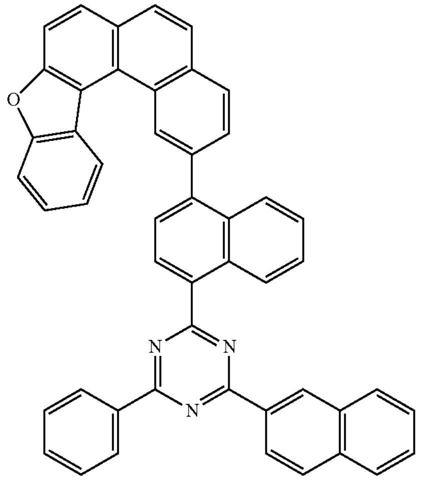

-continued
H2-255
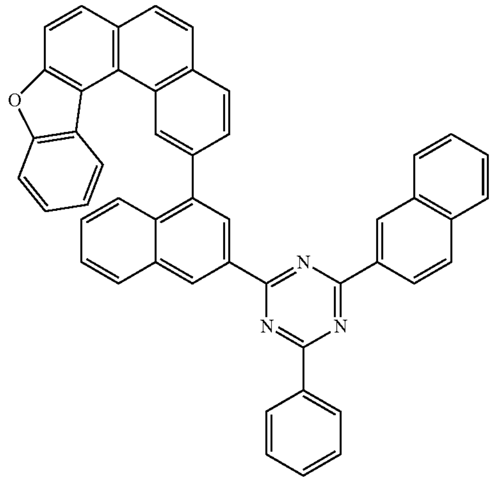
H2-256
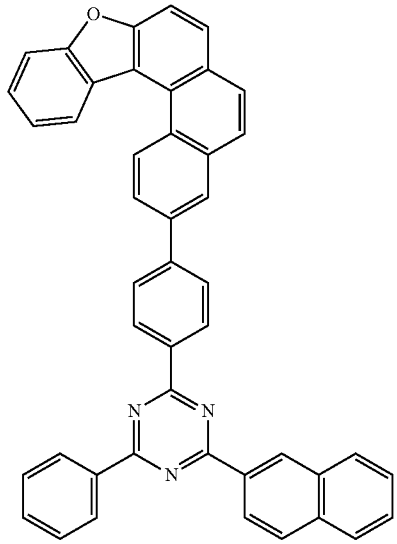
H2-257
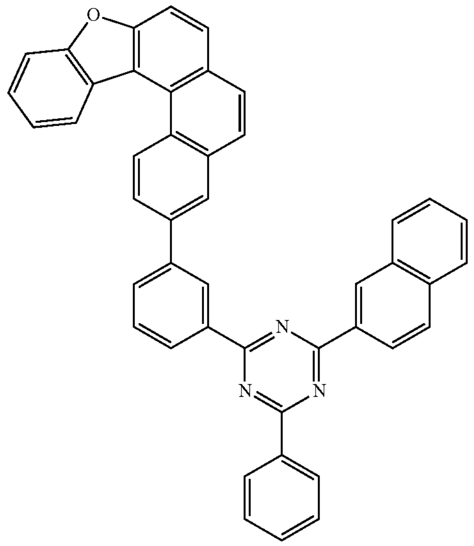
-continued
H2-258
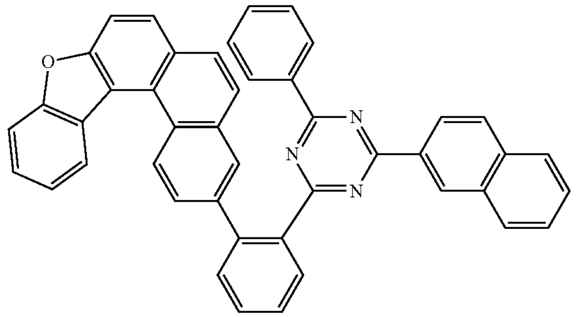
H2-259
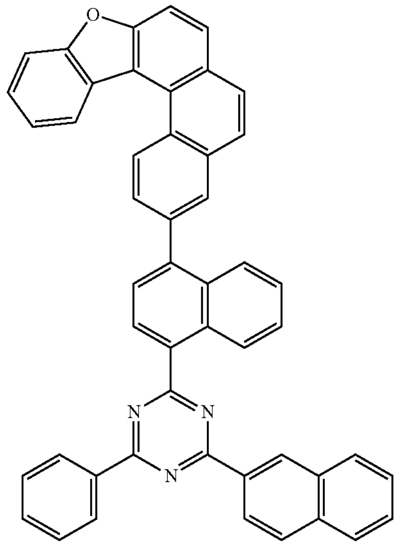
H2-260
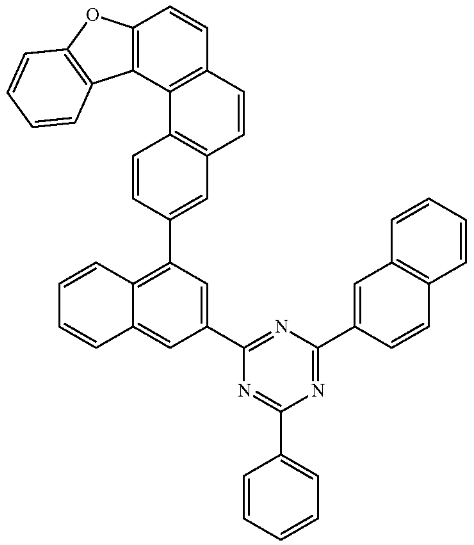

-continued
H2-261
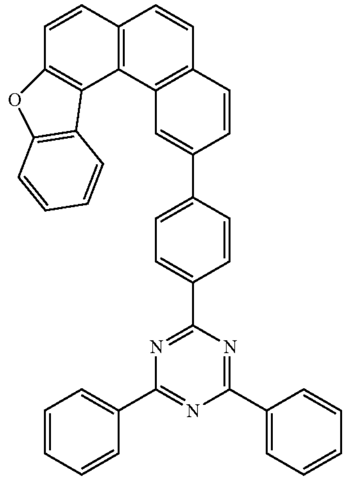
H2-262
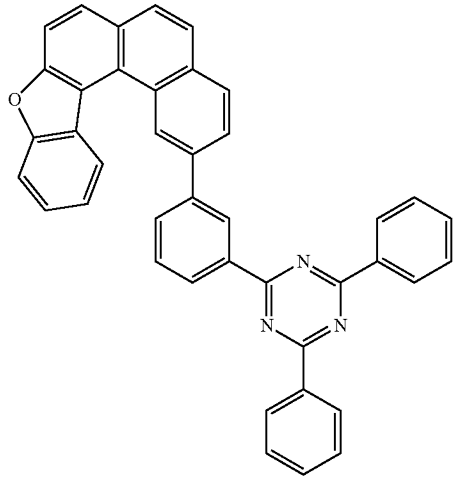
H2-263
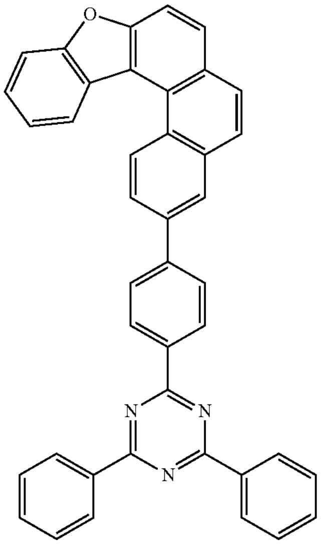
-continued
H2-264
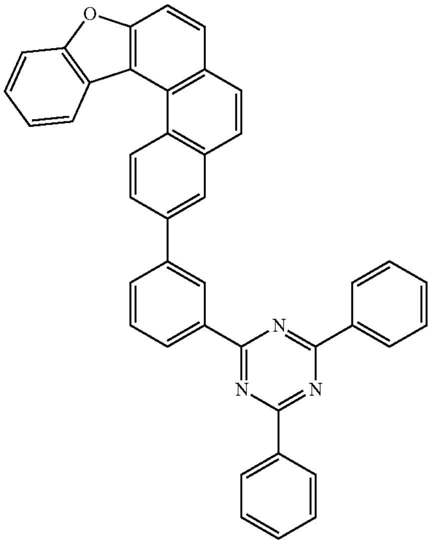
H2-265
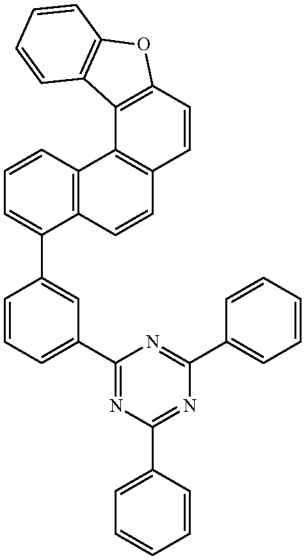
H2-266
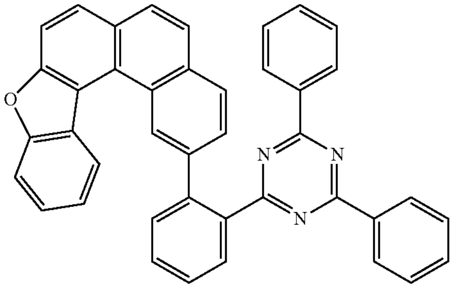

-continued
H2-267
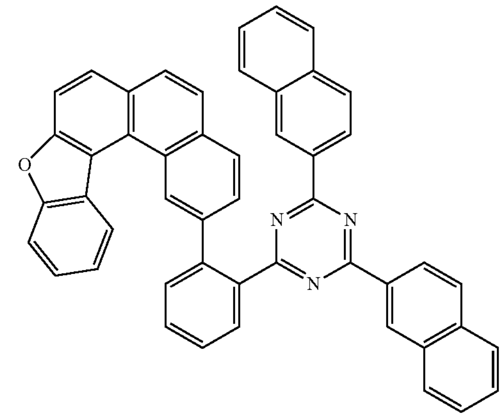
H2-268
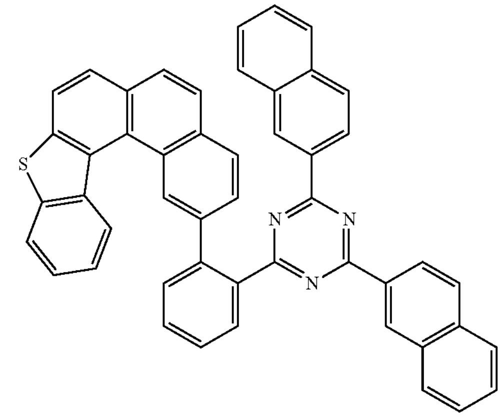
H2-269
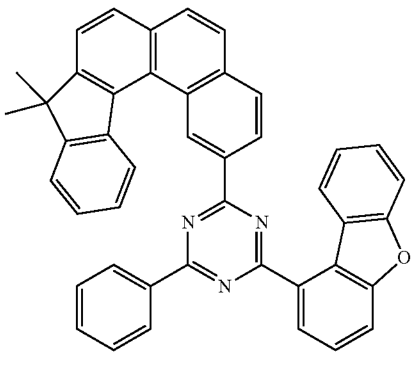
-continued
H2-270
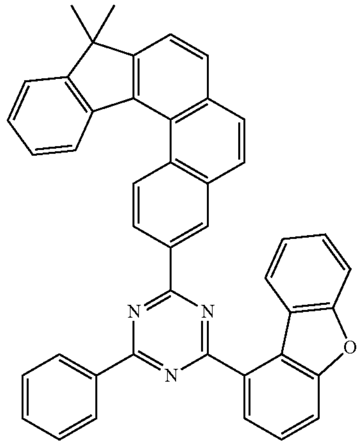
H2-271
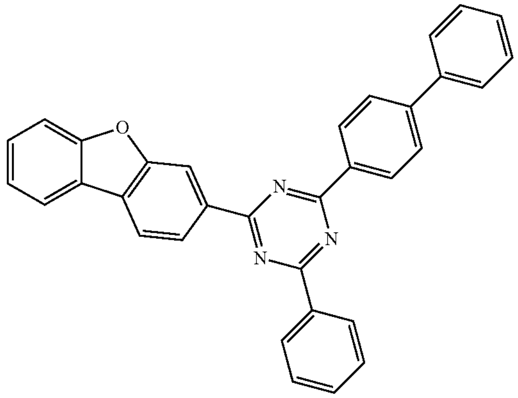
H2-272
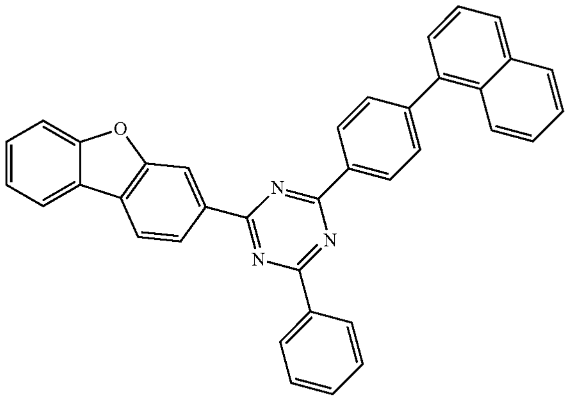

-continued
H2-273
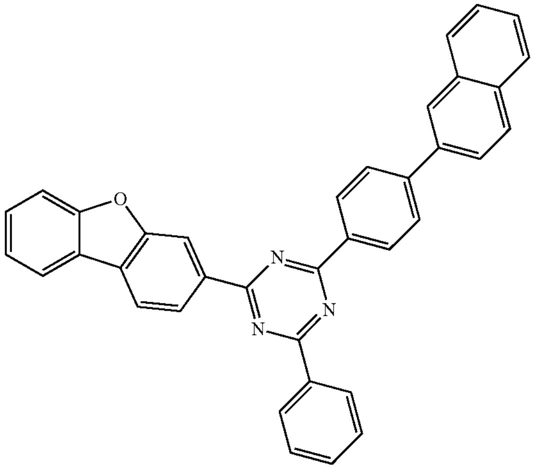
H2-274
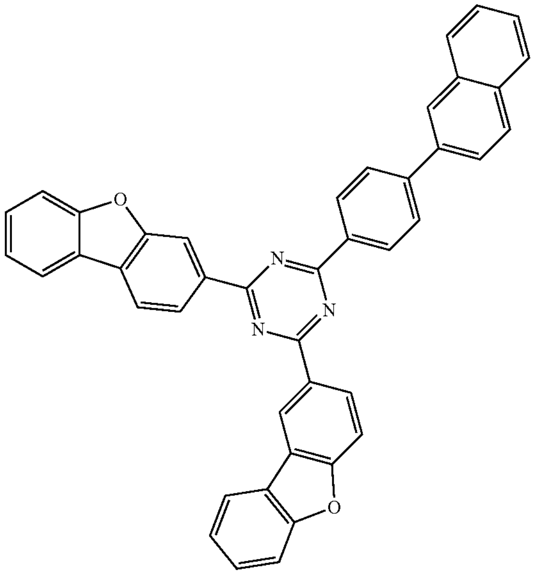
-continued
H2-275
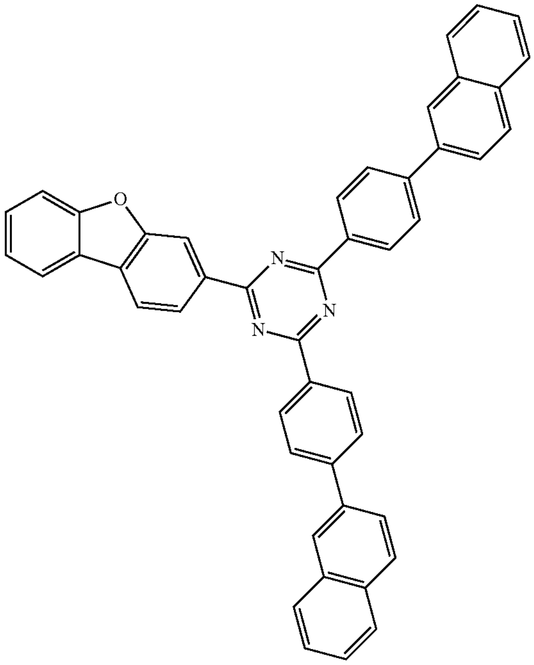
H2-276
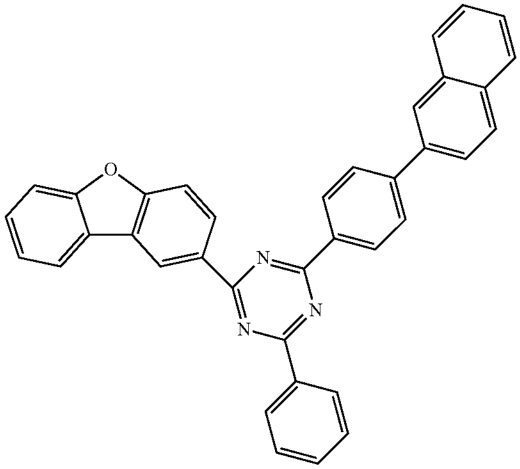
H2-277
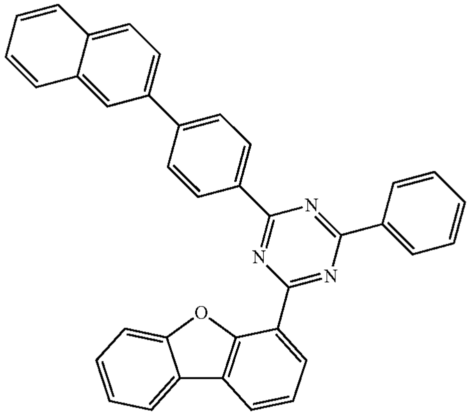

-continued
H2-278
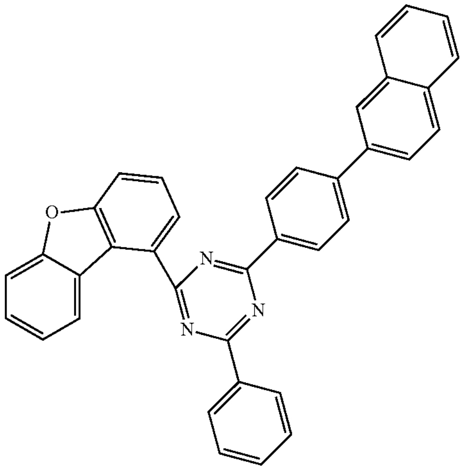
H2-279
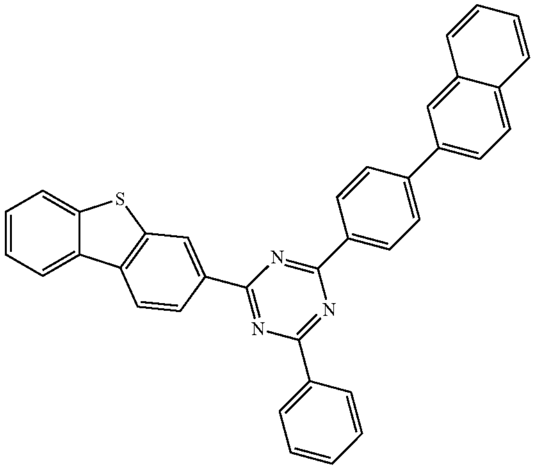
H2-280
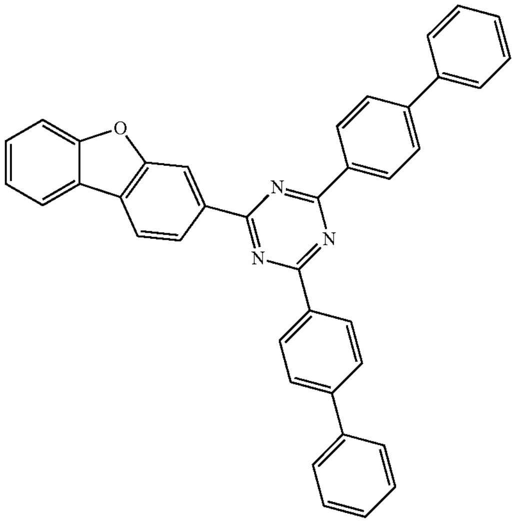
-continued
H2-281
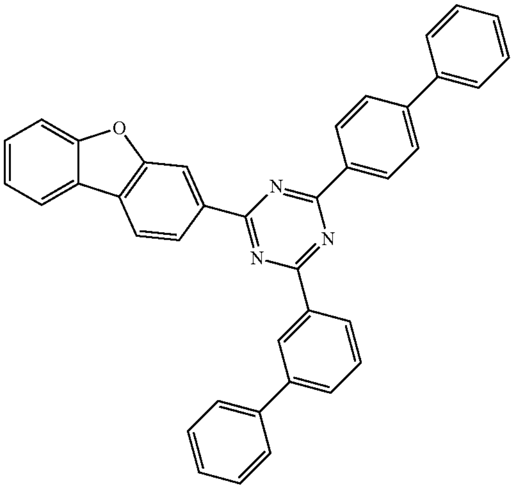
H2-282
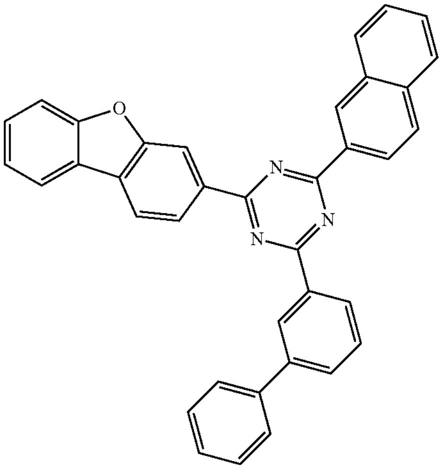
H2-283
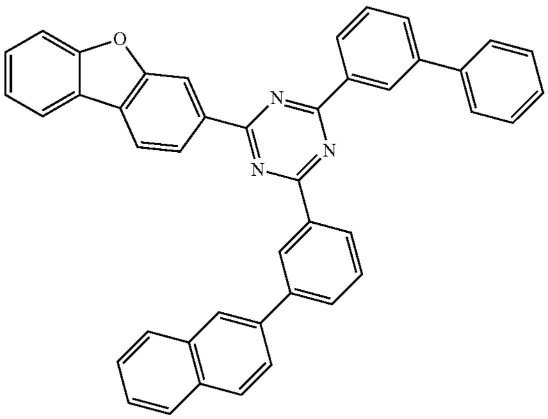

-continued
H2-284
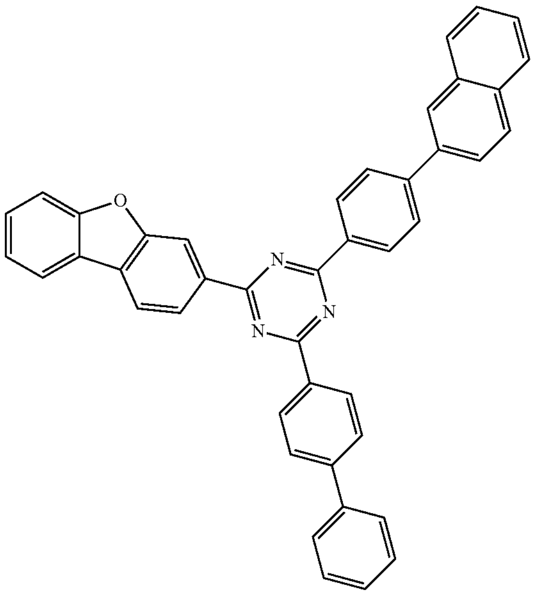
H2-285
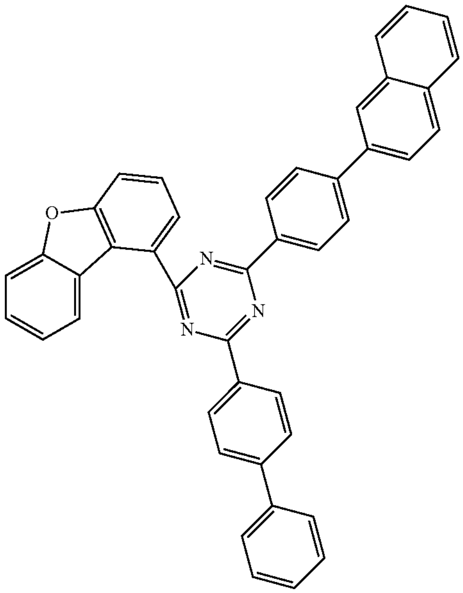
H2-286
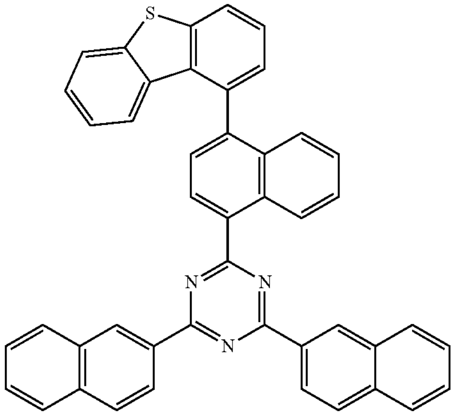
-continued
H2-287
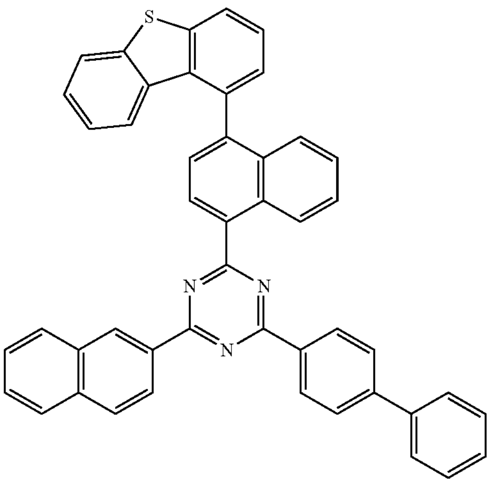
H2-288
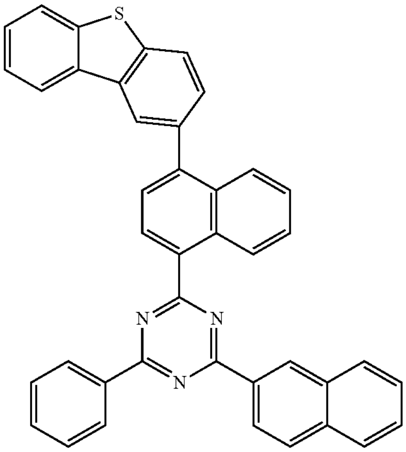
H2-289
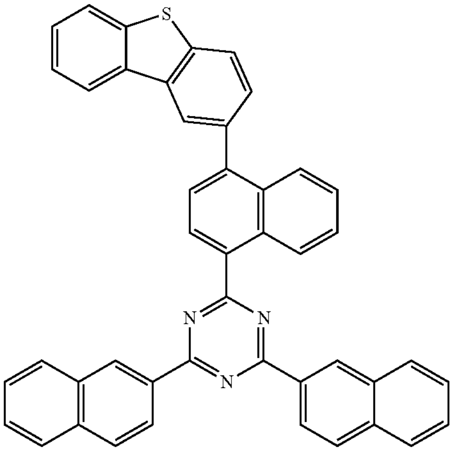

-continued
H2-290
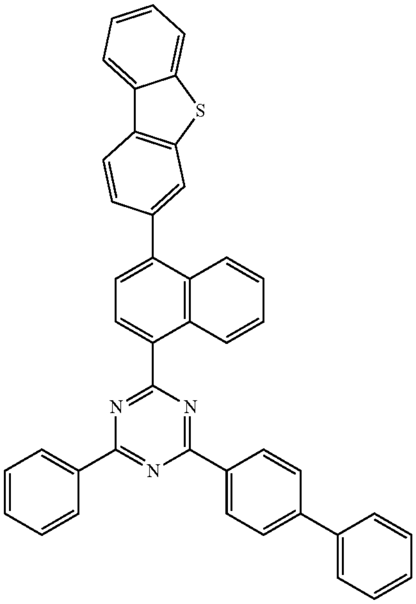
H2-291
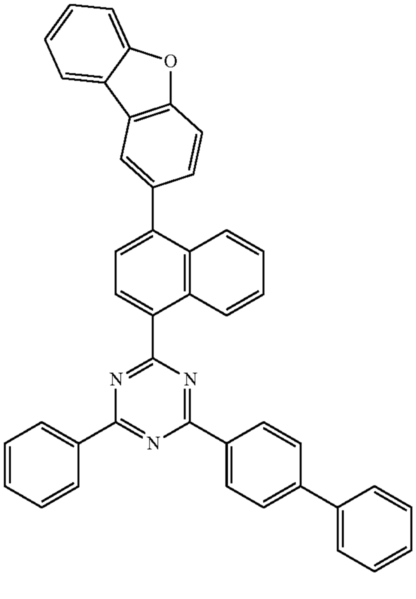
-continued
H2-292
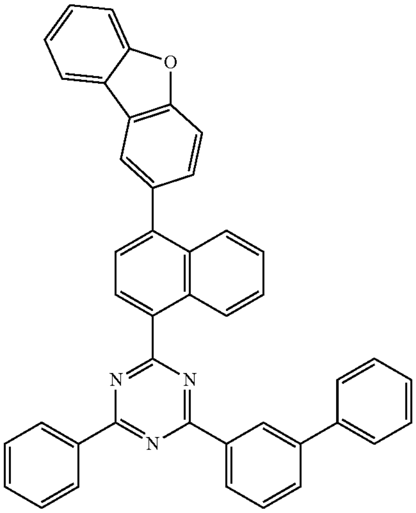
H2-293
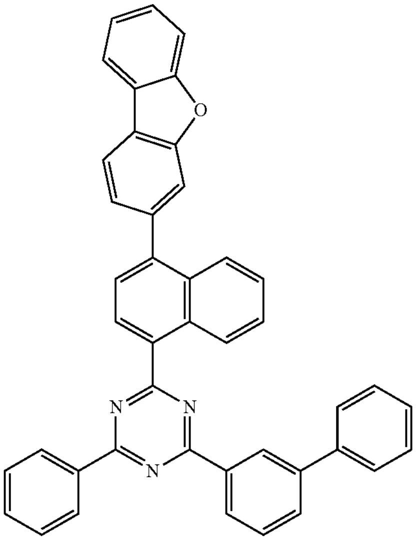
H2-294
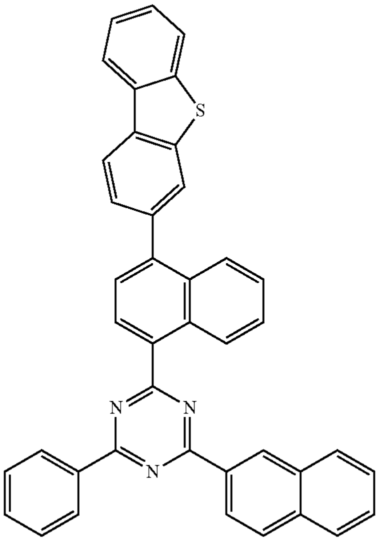
and -continued
H2-295
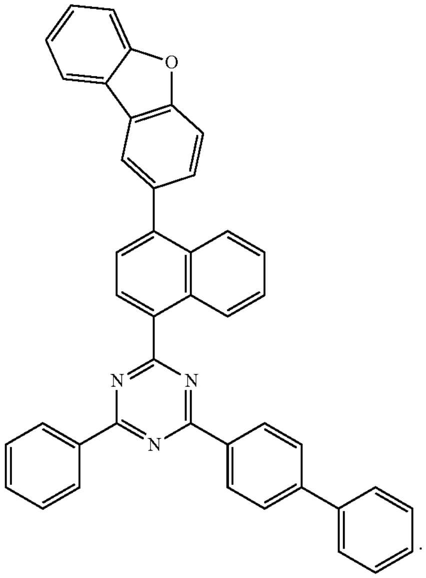
* * * * *